United States Patent [19]

Marzalek et al.

[11] 4,244,024

[45] Jan. 6, 1981

[54] SPECTRUM ANALYZER HAVING ENTERABLE OFFSETS AND AUTOMATIC DISPLAY ZOOM

[75] Inventors: Michael S. Marzalek, Cotati; Lynn M. Wheelwright, Santa Rosa, both of Calif.

[73] Assignee: Hewlett-Packard Company, Palo Alto, Calif.

[21] Appl. No.: 932,691

[22] Filed: Aug. 10, 1978

[51] Int. Cl.[3] .............................................. G01R 23/00

[52] U.S. Cl. .................................. 364/485; 324/77 B; 328/140; 340/700; 364/518; 364/571

[58] Field of Search ............... 364/485, 487, 518, 521, 364/571; 324/77 B, 77 D; 328/138-141, 151, 165, 168; 340/700, 706

[56] References Cited

U.S. PATENT DOCUMENTS

| | | | |
|---|---|---|---|
| 3,427,536 | 2/1969 | Wainwright | 324/77 B |
| 3,786,351 | 1/1974 | Priebe, Jr. | 324/77 B |
| 3,881,097 | 4/1975 | Lehmann et al. | 364/485 |
| 4,072,851 | 2/1978 | Rose | 364/487 |
| 4,097,860 | 6/1978 | Araseki et al. | 364/571 |

OTHER PUBLICATIONS

"A SMHZ Digitally Controlled Spectrum analyzer"; *Texscope* (USA); vol. 7, No. 3, 1975; pp. 3-7.

*Primary Examiner*—Errol A. Krass
*Attorney, Agent, or Firm*—David A. Boone

[57] ABSTRACT

An input signal is mixed with sampling signals from oscillators which vary the frequency of the sampling signal from a first frequency to a second frequency. The resulting Intermediate Frequency (IF) signal is processed and digital values are stored in a memory in response thereto. Waveforms are then displayed which correspond to these frequency and amplitude values. Various input and display circuits facilitate the display and interpretation of these waveforms.

7 Claims, 170 Drawing Figures

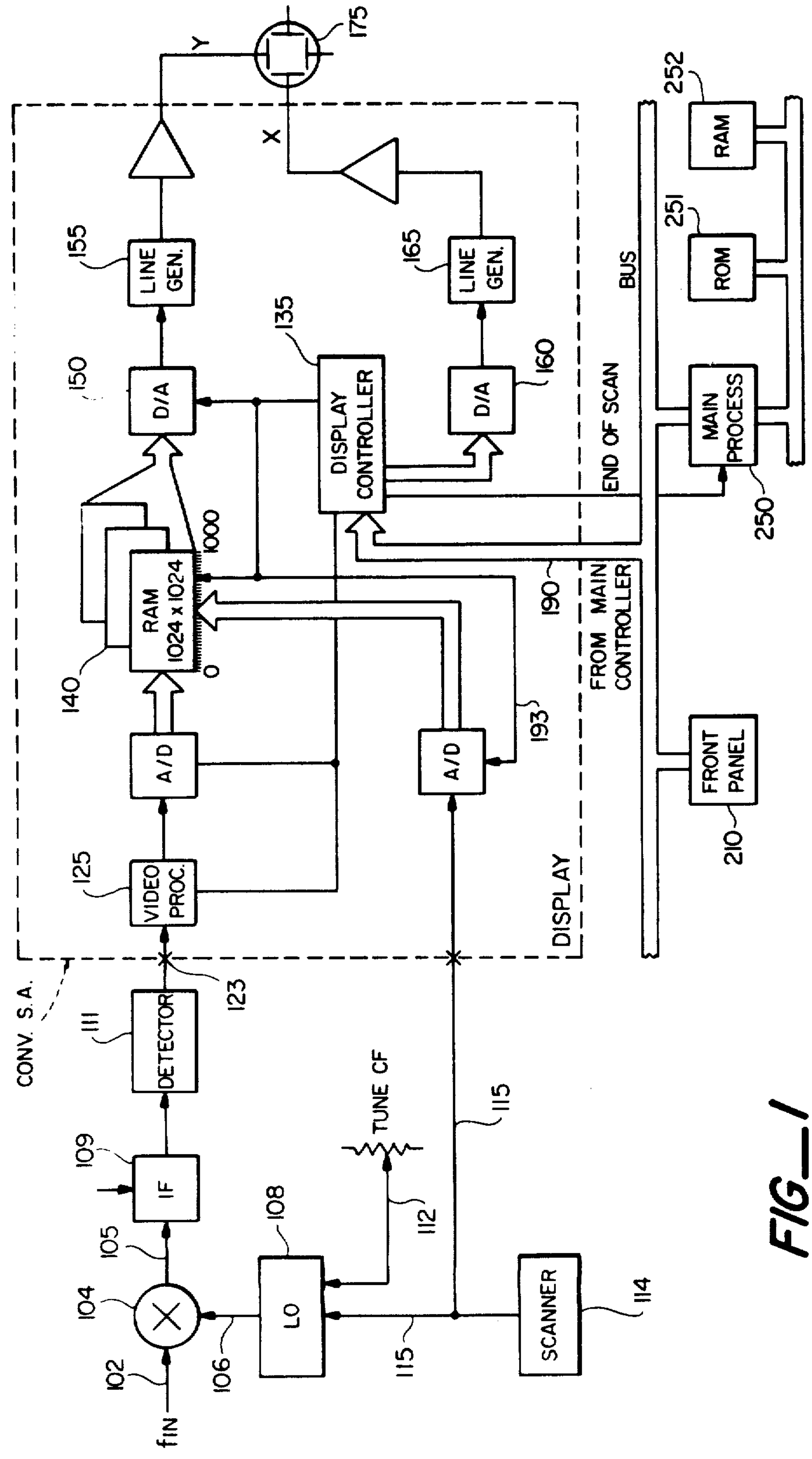
FIG_1

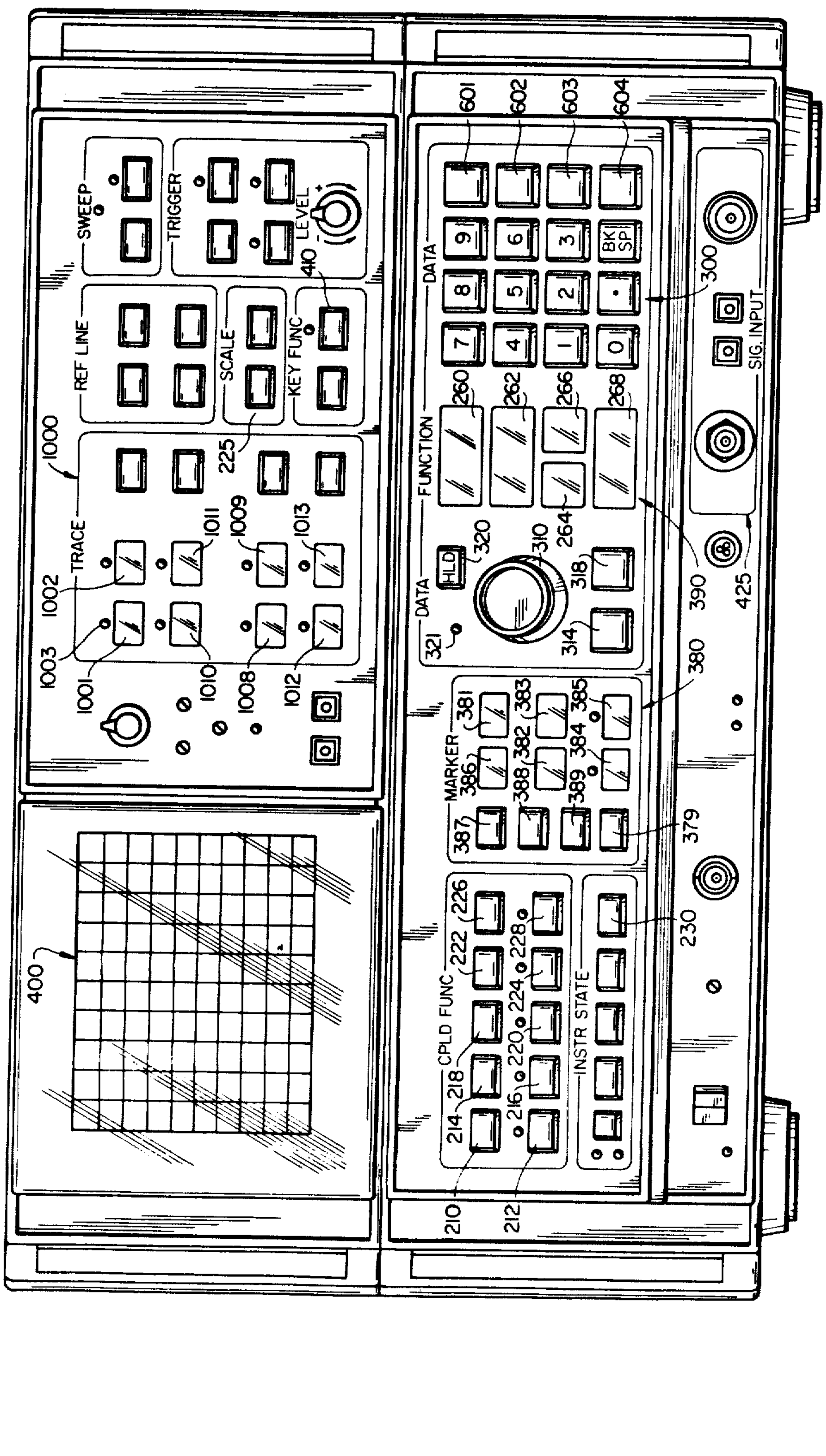
FIG_2

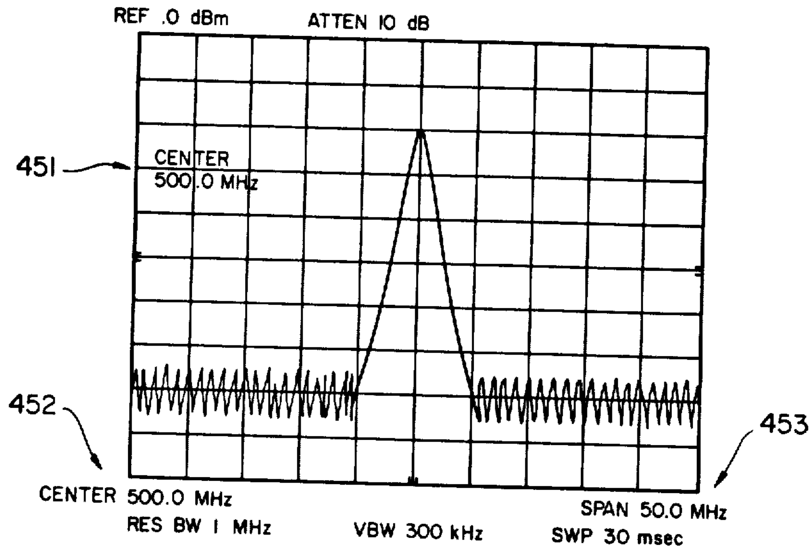
FIG_3
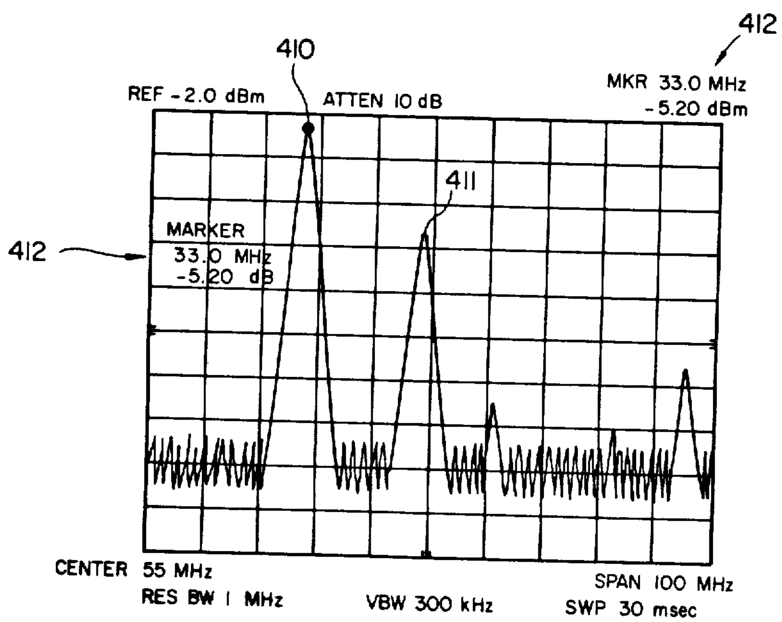
FIG_4

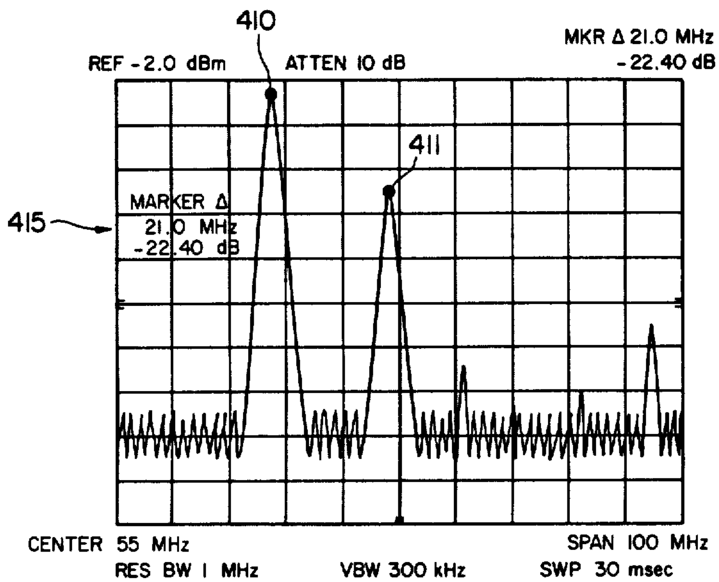
FIG_5
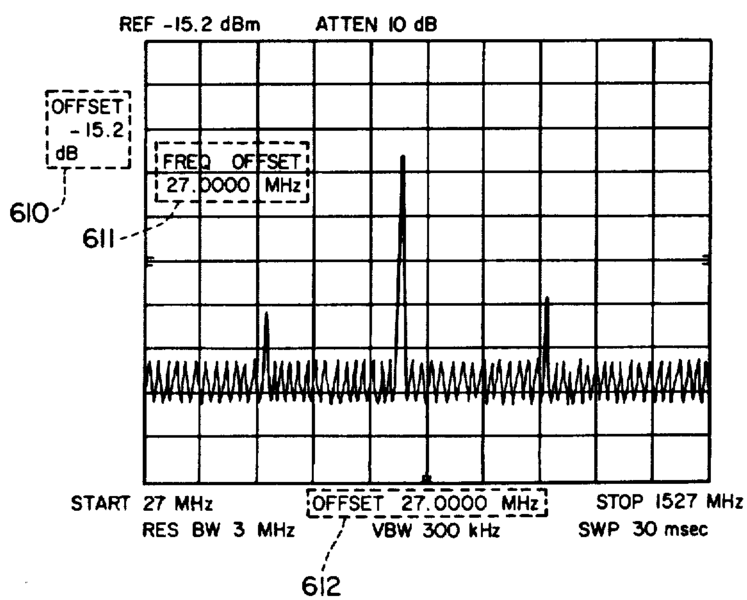
FIG_6

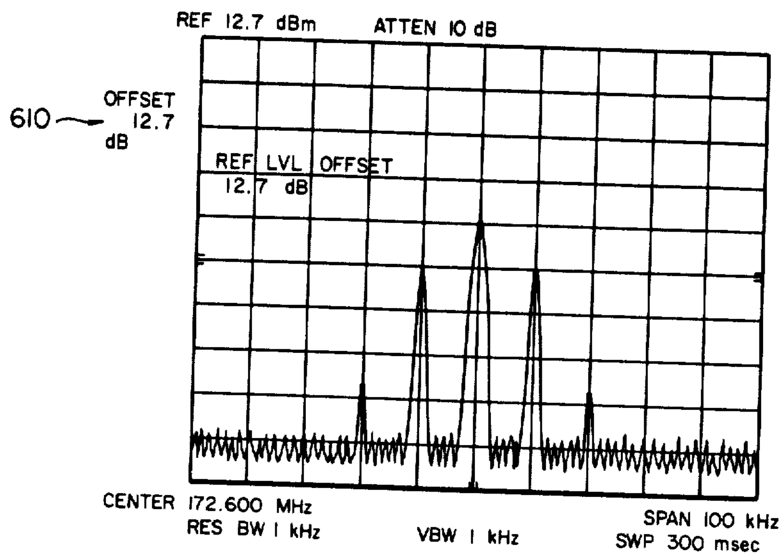
FIG_7
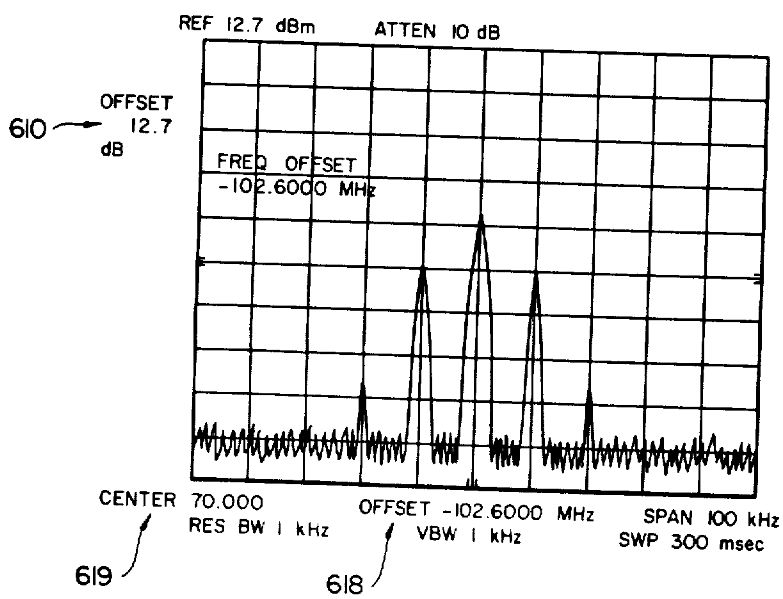
FIG_8

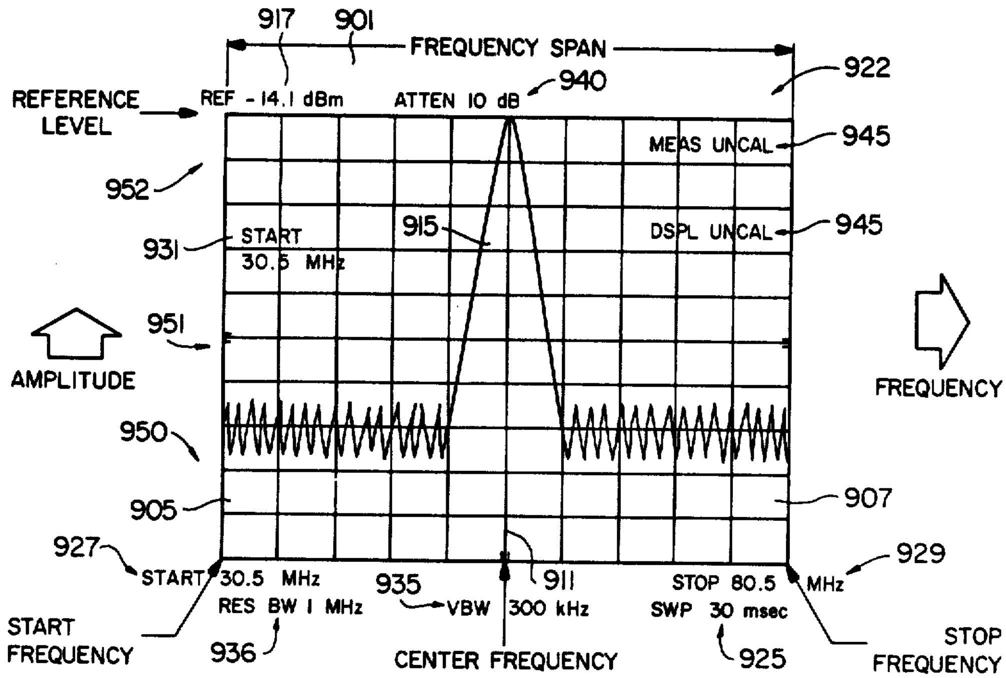
FIG_9
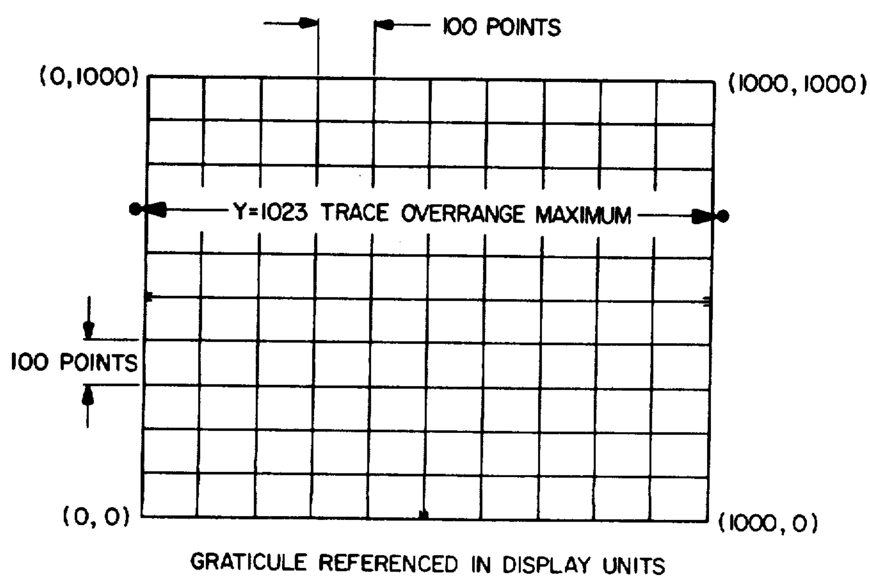
FIG_10

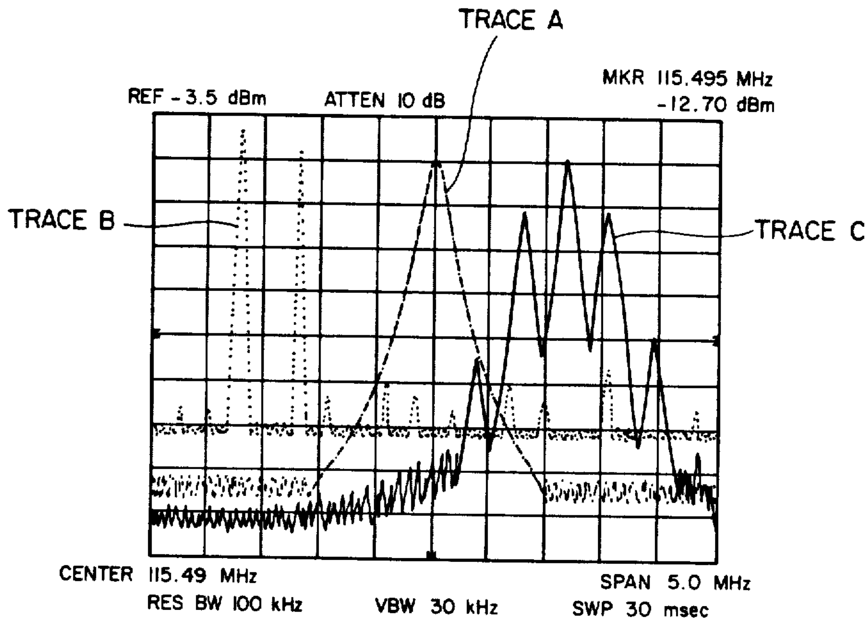
FIG_11
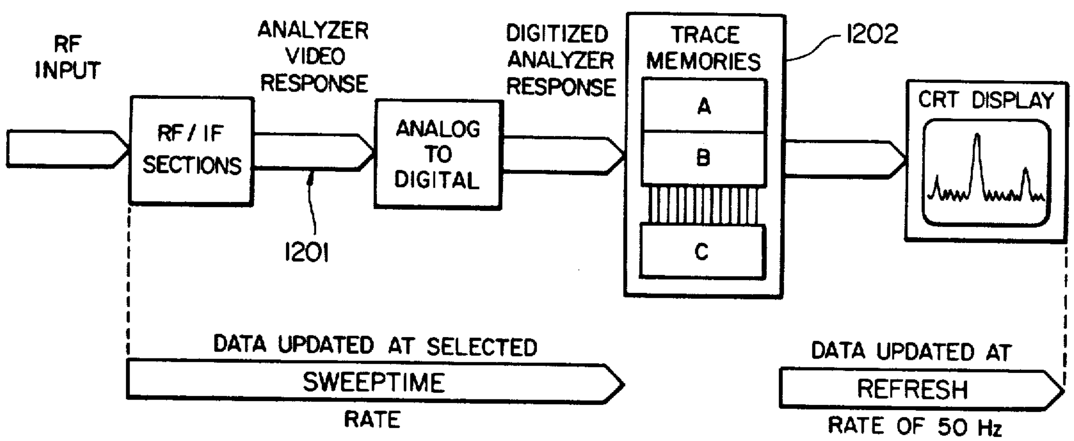
FIG_12

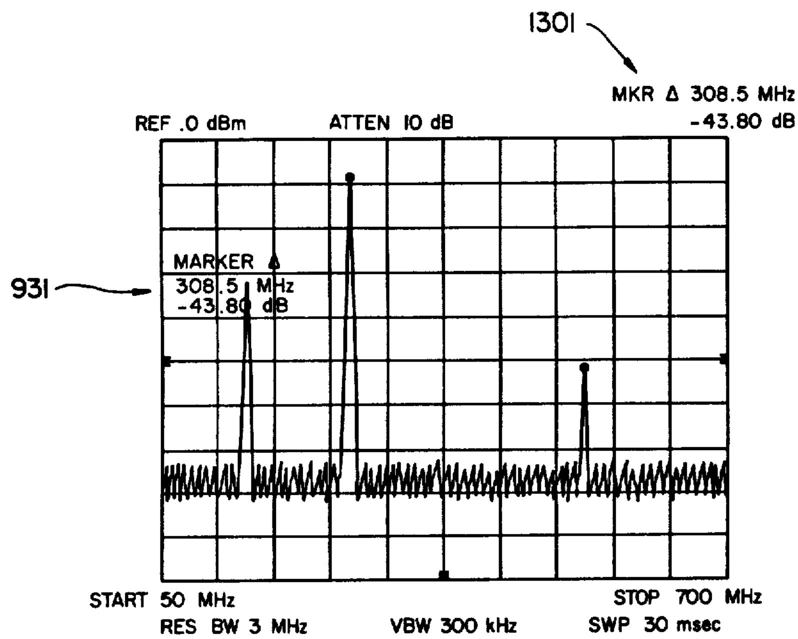
MARKER READOUT LOCATIONS
FIG_13

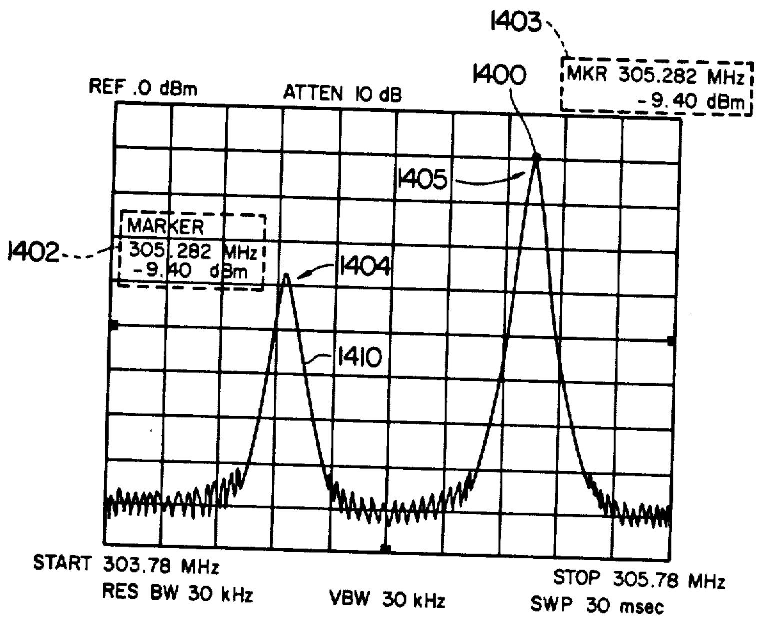
FIG_14A
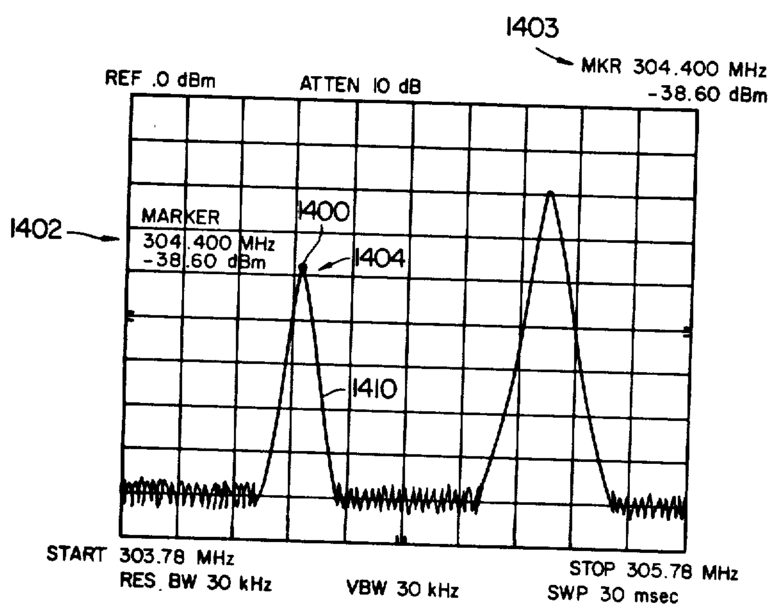
FIG_14B

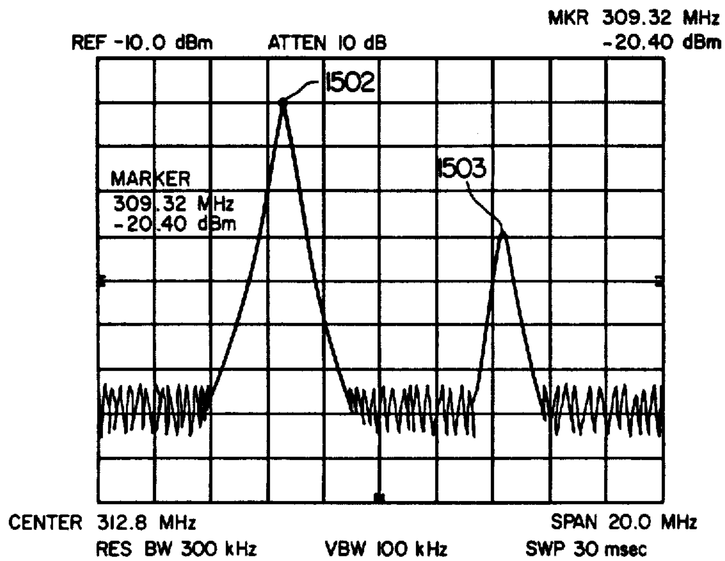
FIG_15A
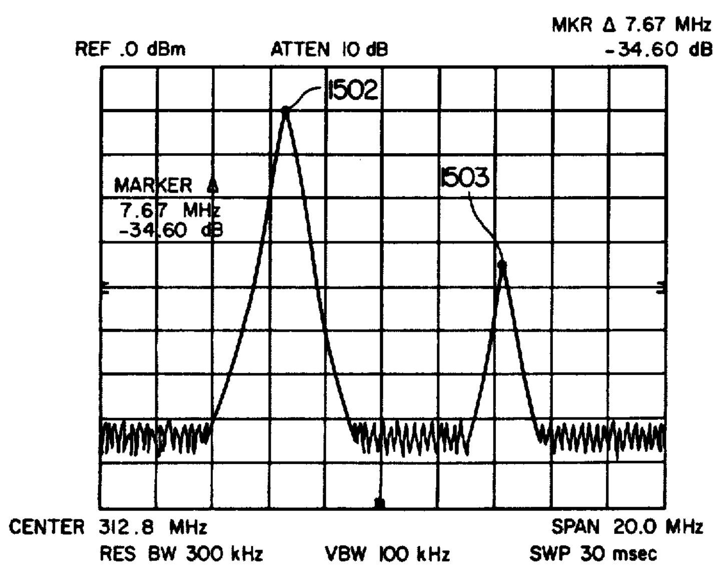
FIG_15B

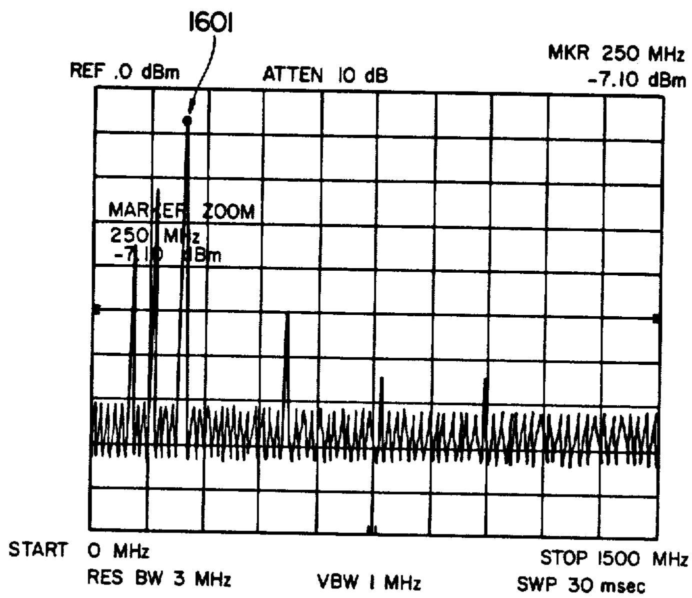
FIG_16A
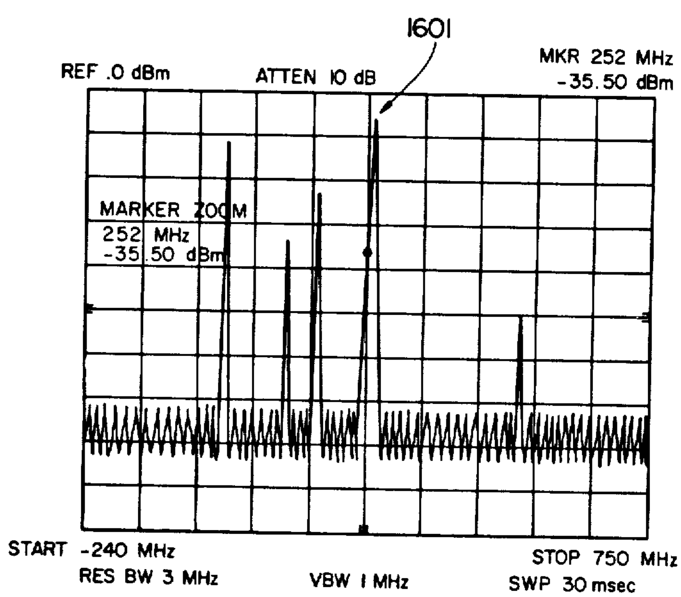
FIG_16B

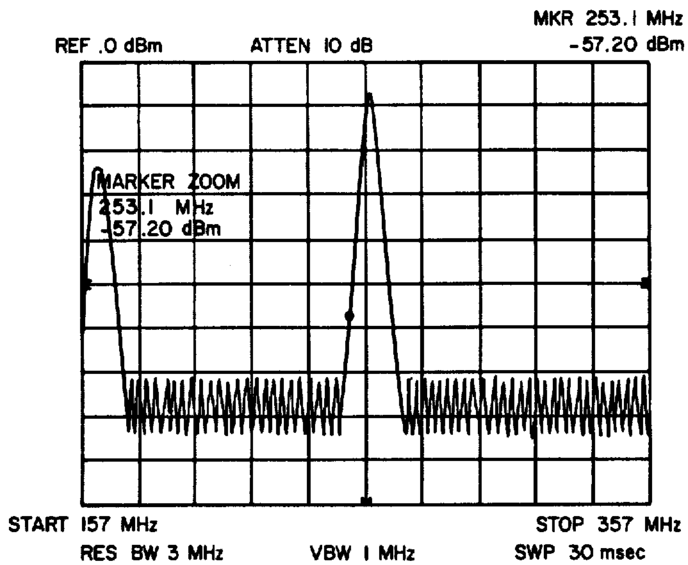
FIG_16C
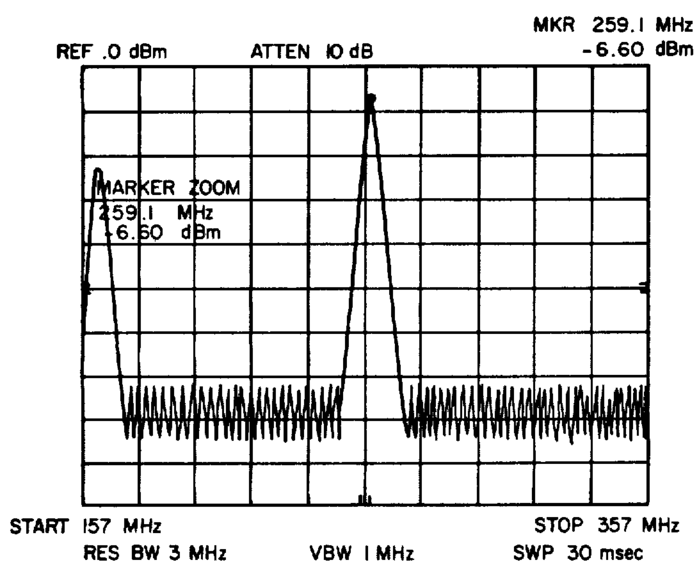
FIG_16D

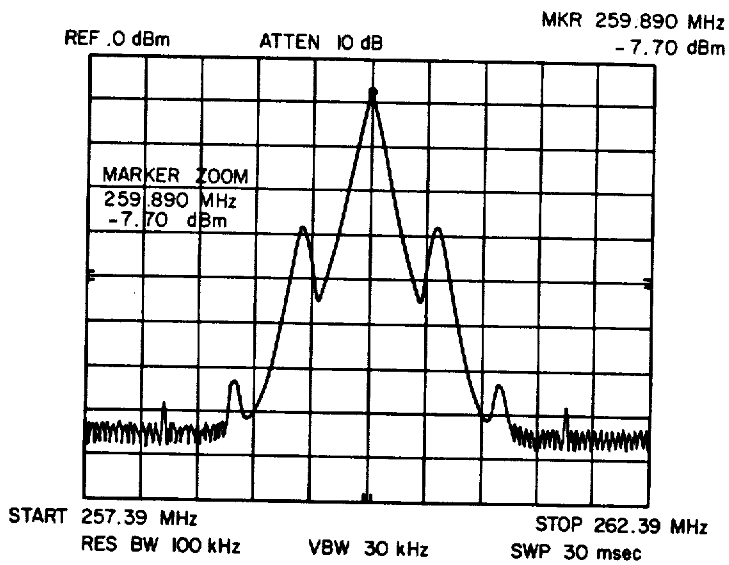
FIG_16E

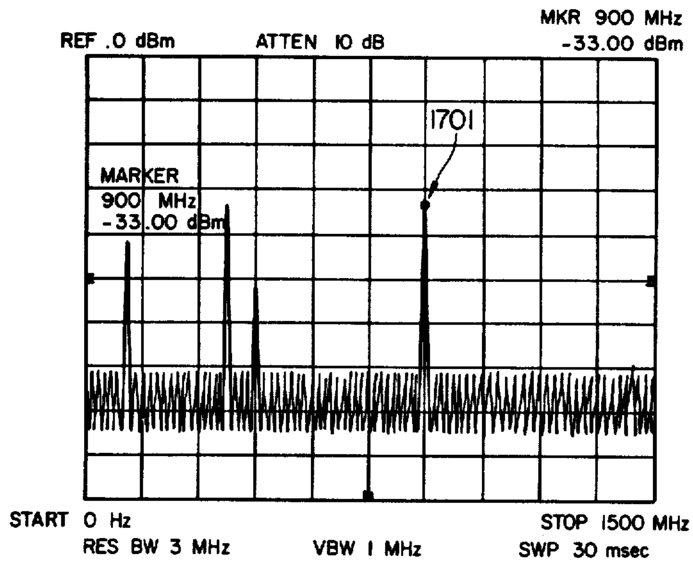
FIG_17A
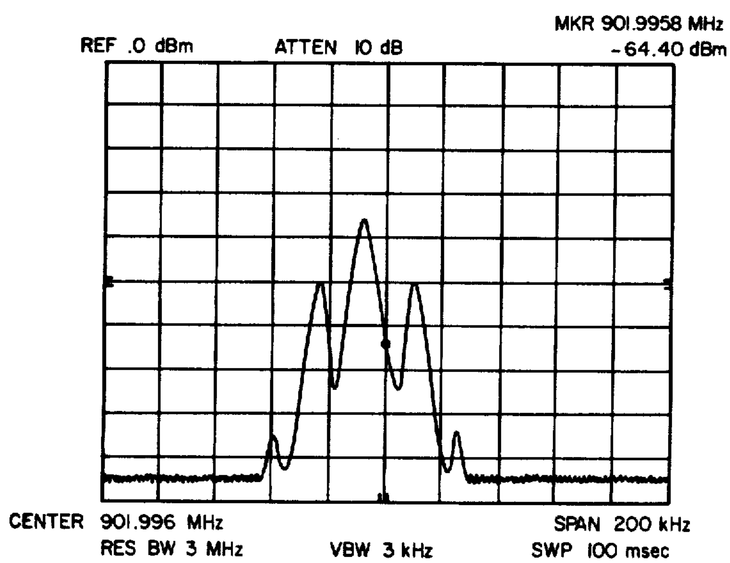
FIG_17B

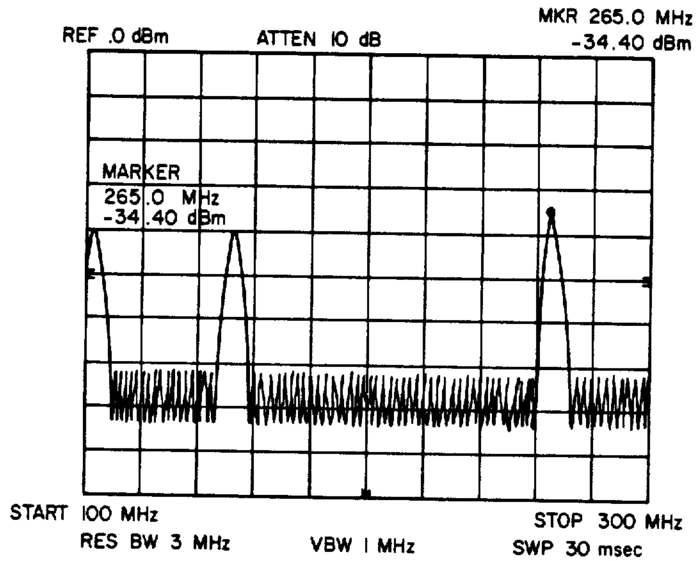
FIG_18A
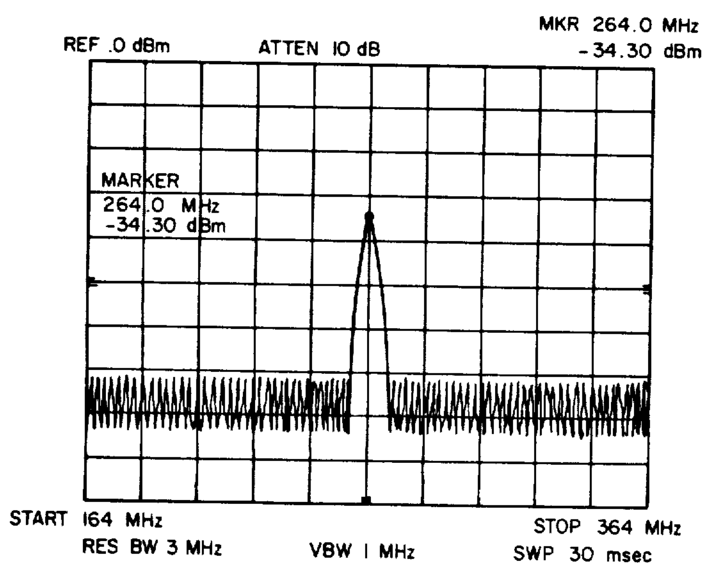
FIG_18B

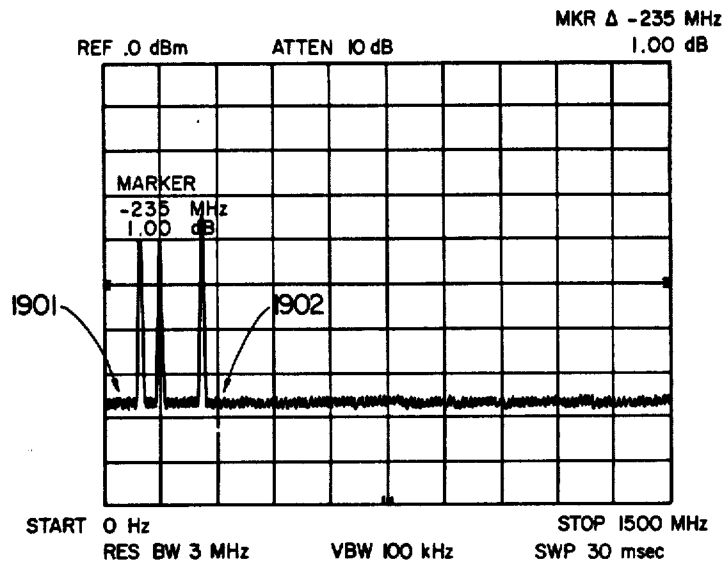
FIG_19A
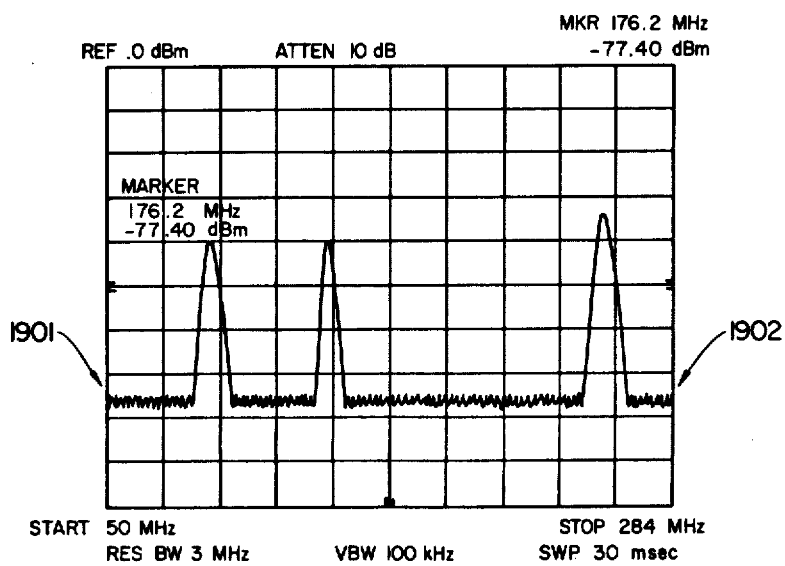
FIG_19B

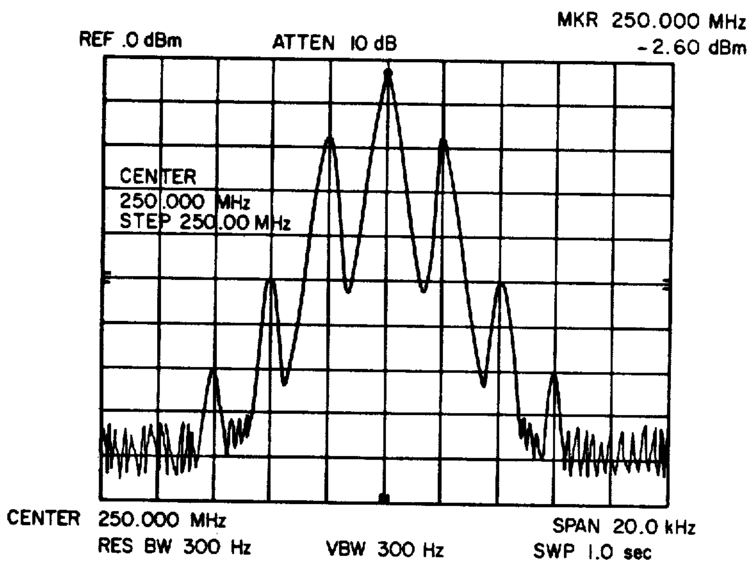
FIG_19C

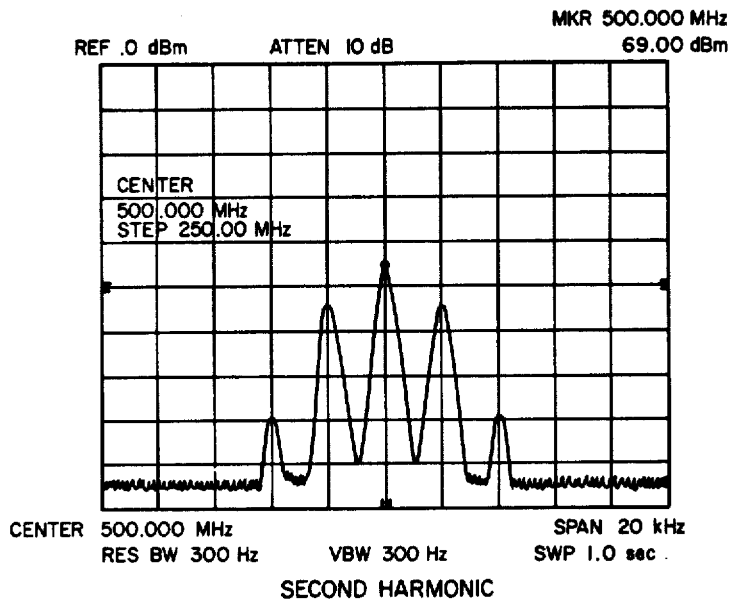
FIG_19D
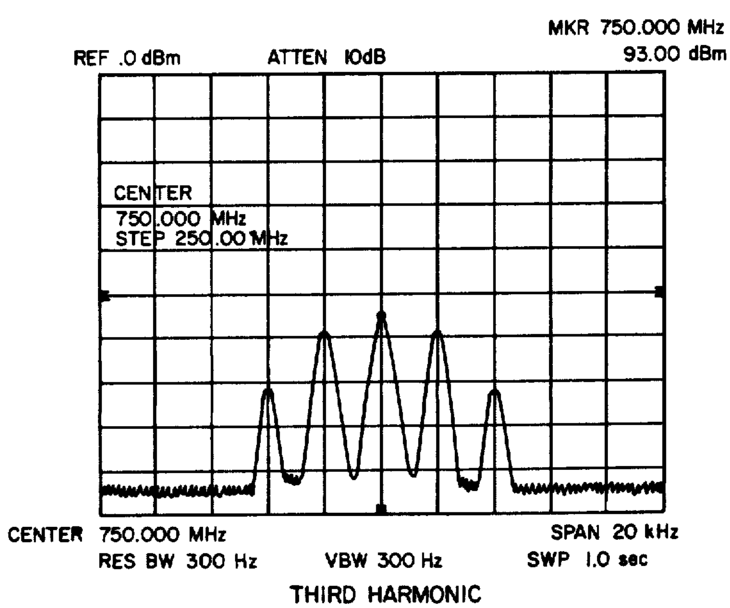
FIG_19E

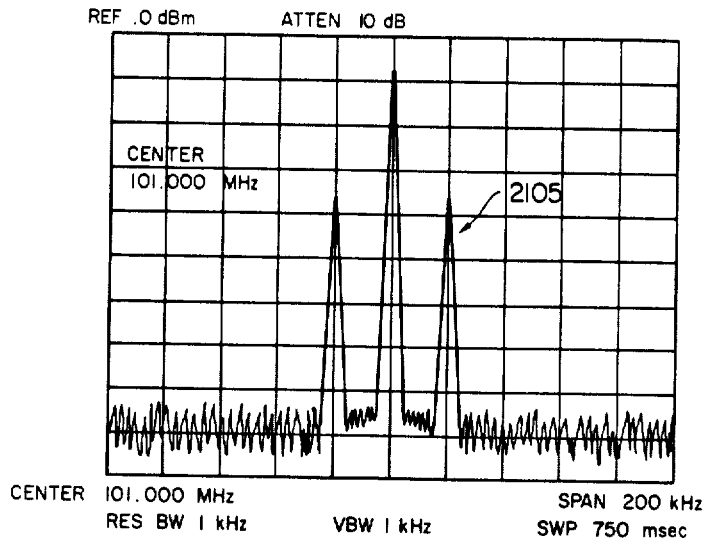
FIG_19F
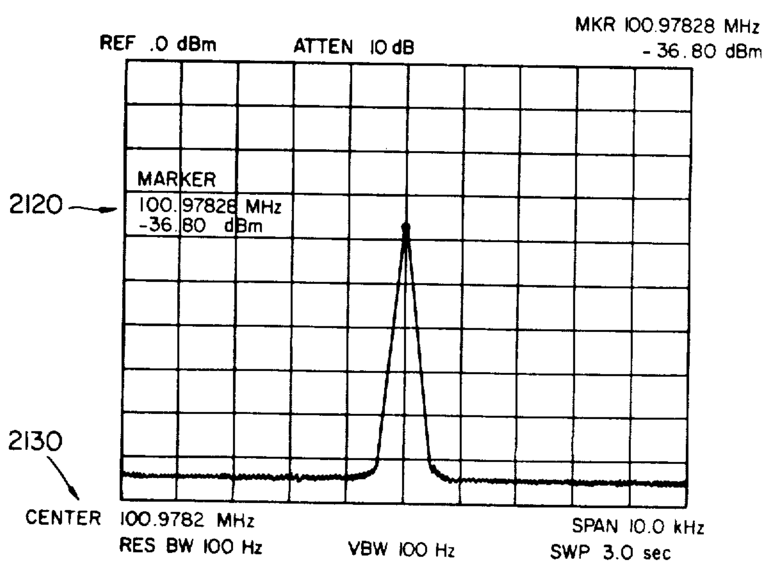
FIG_19G

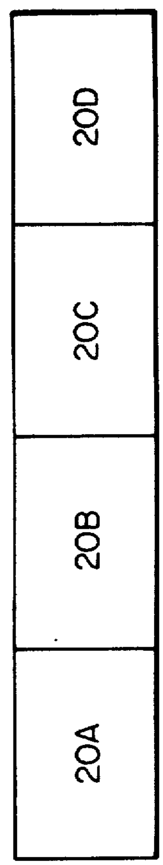
FIG_20

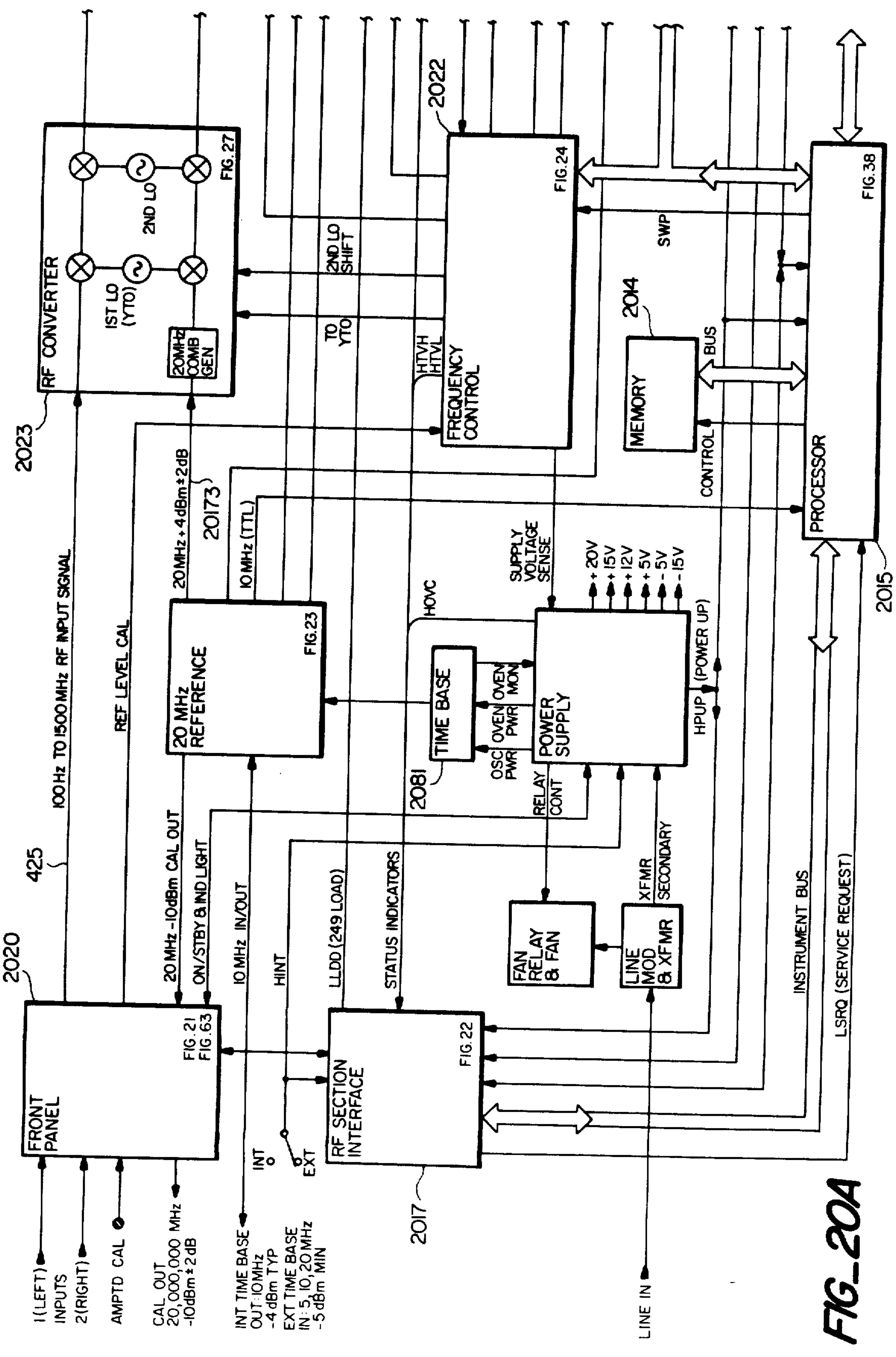
FIG_20A

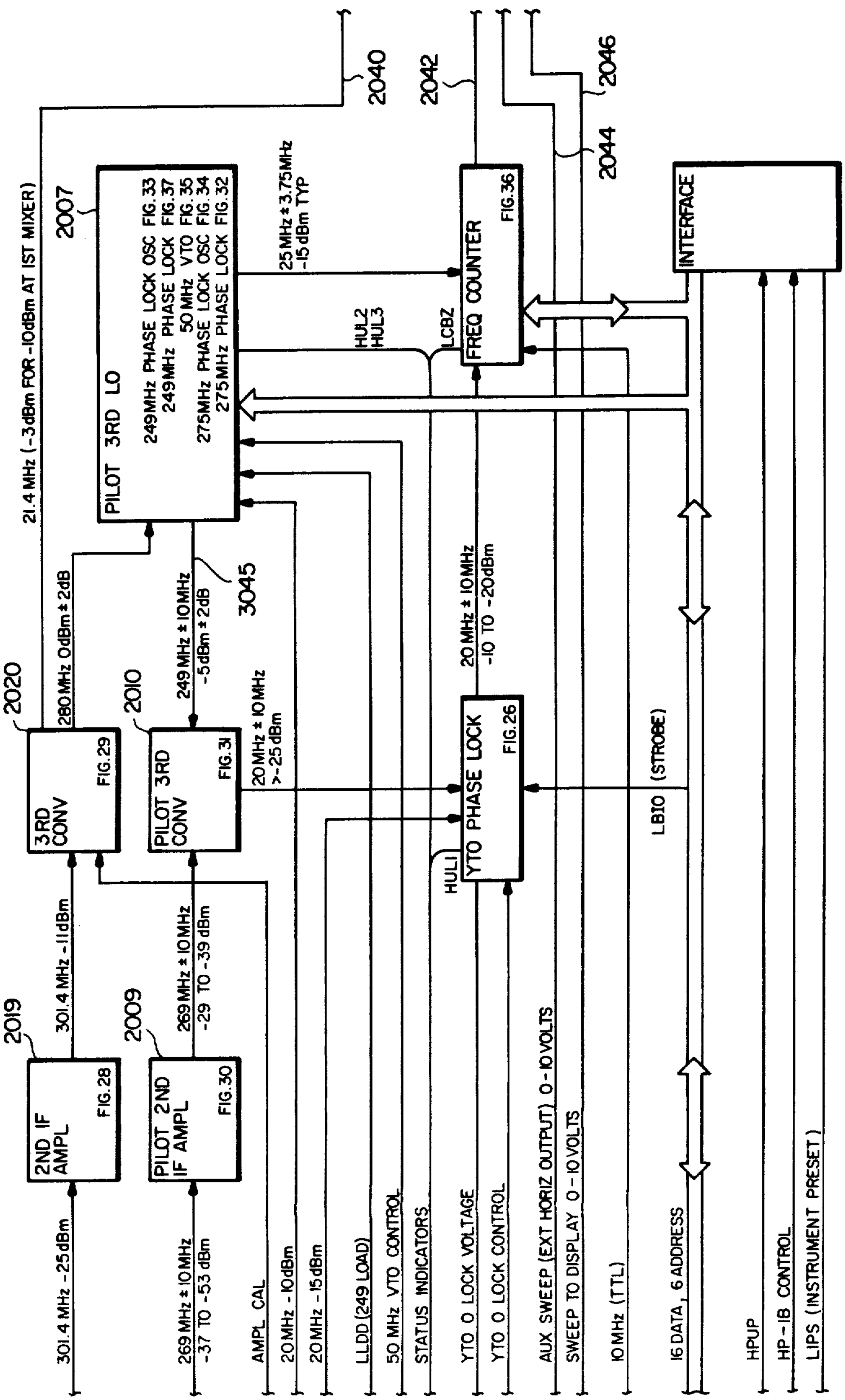
FIG_20B

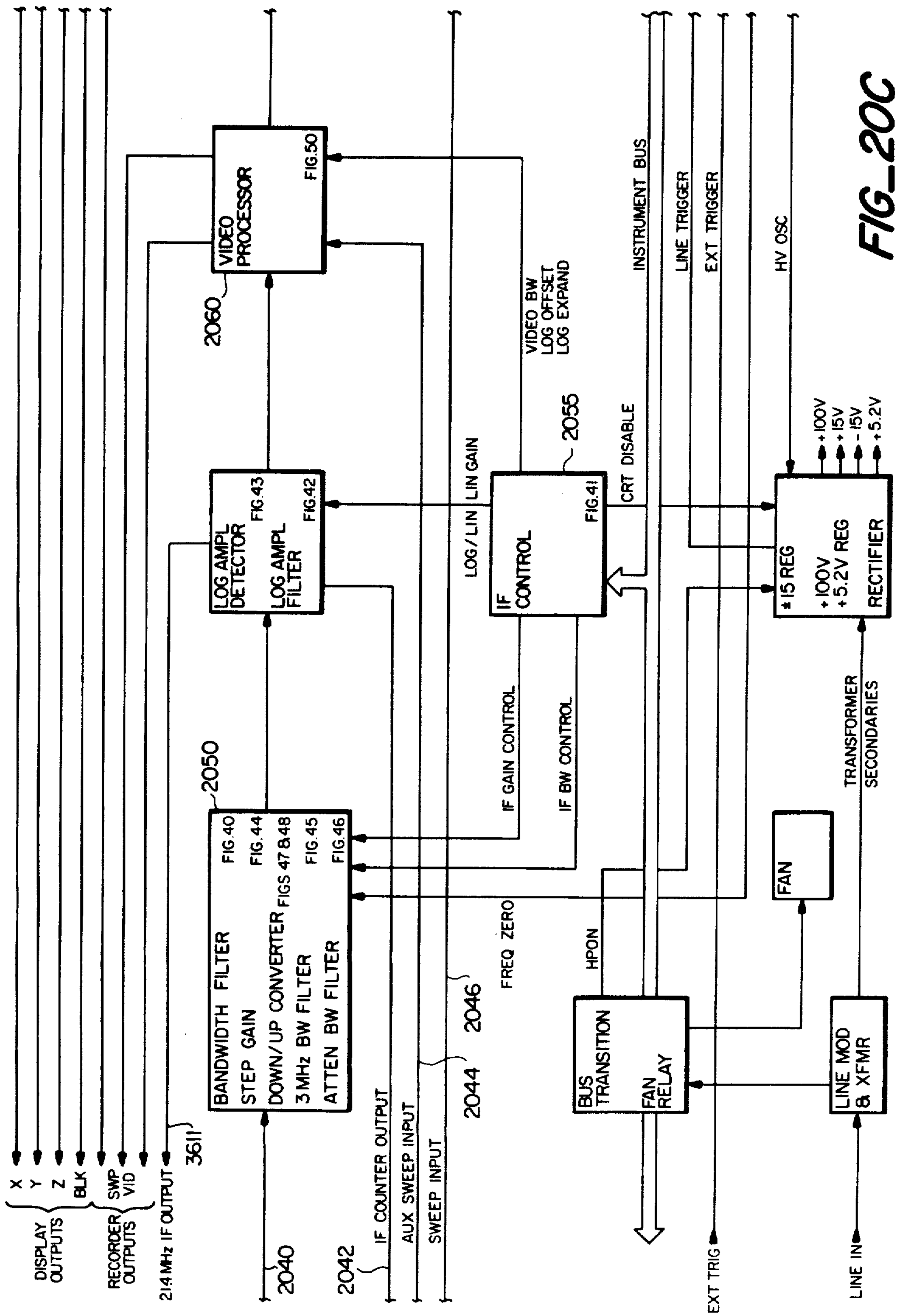
FIG_20C

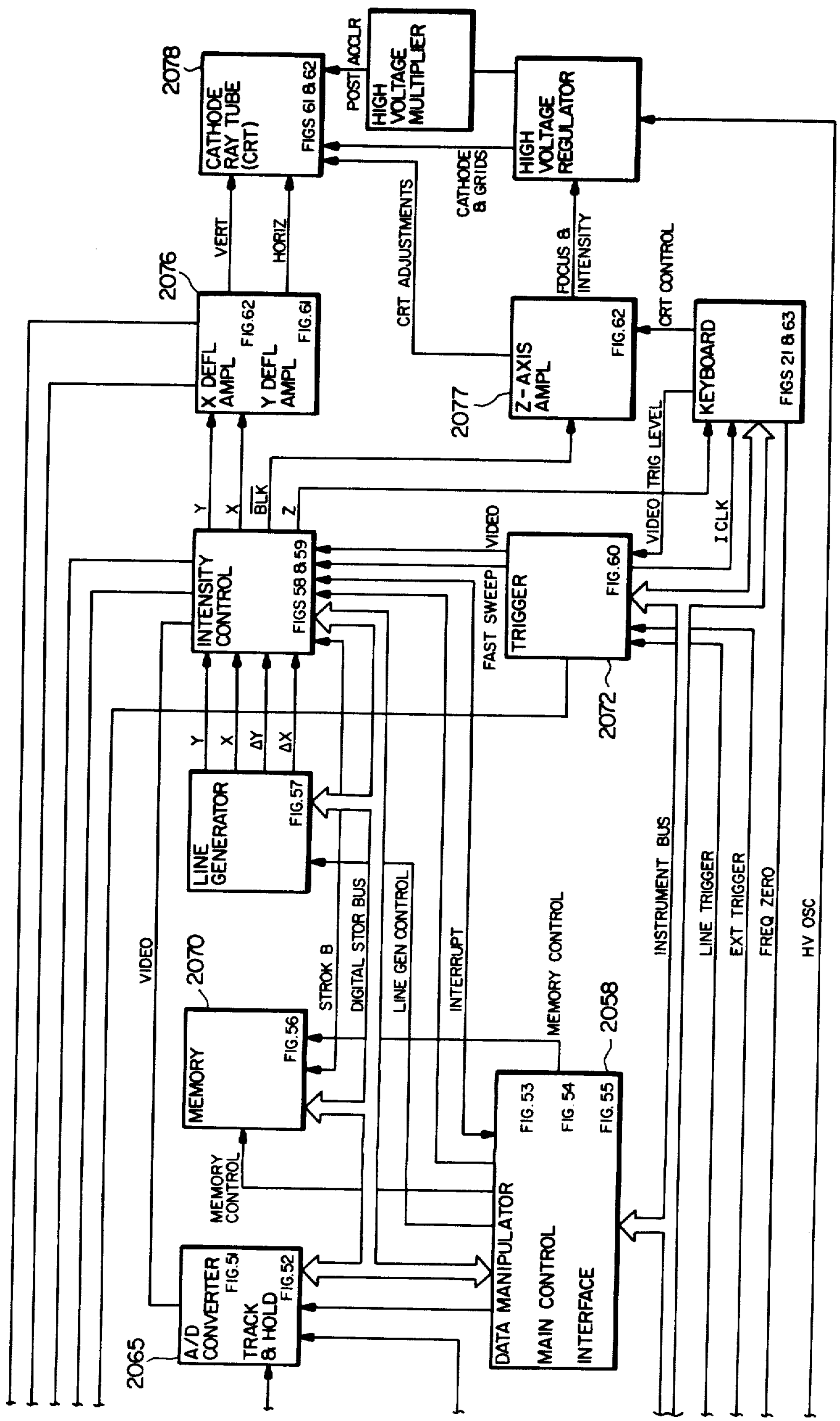
FIG_20D

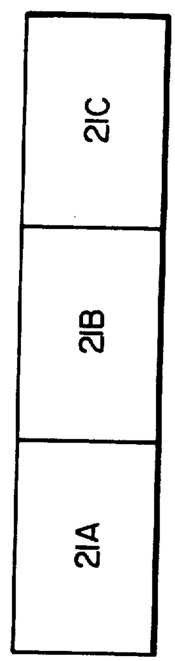
FIG_21

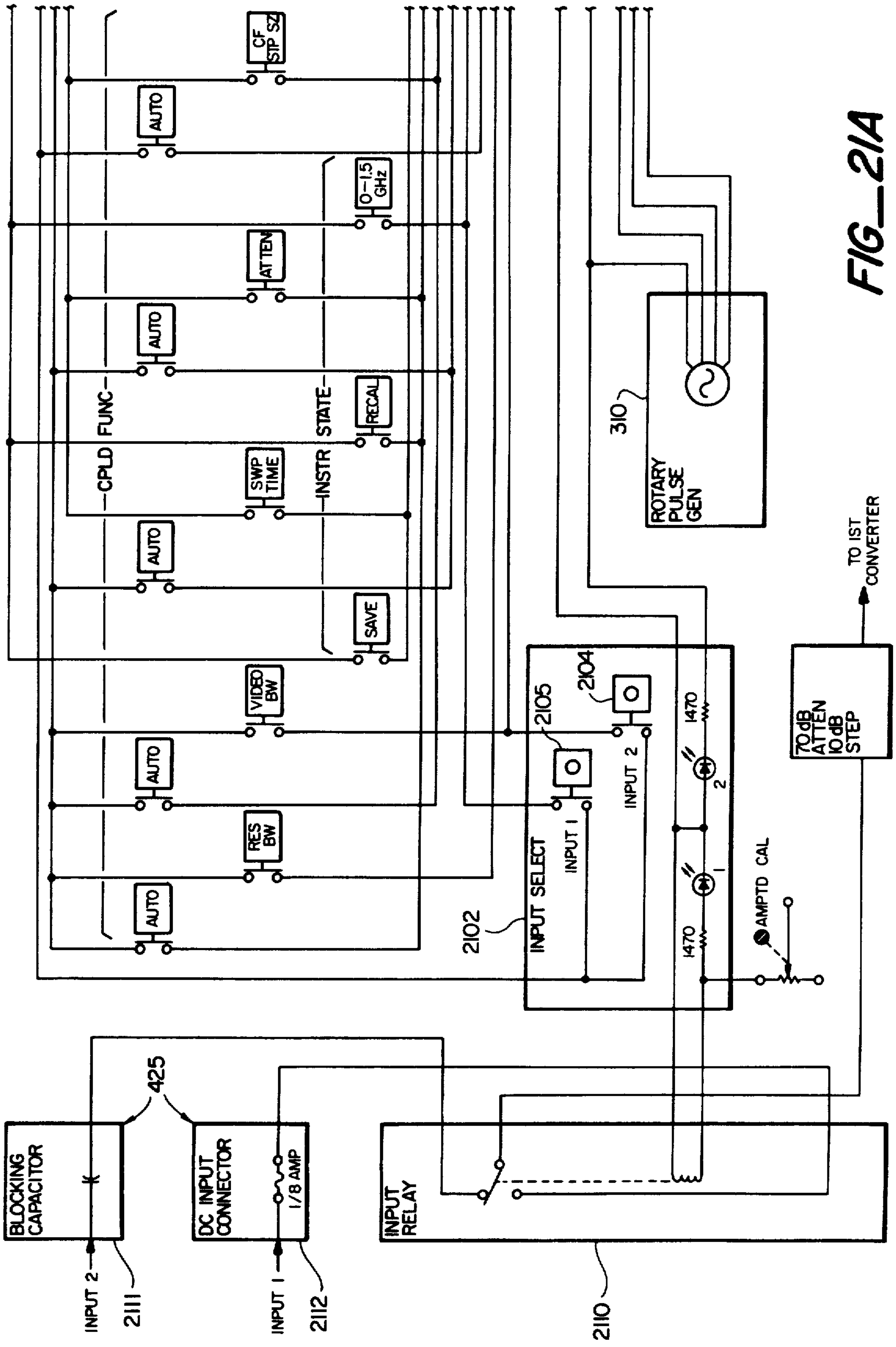
FIG_21A

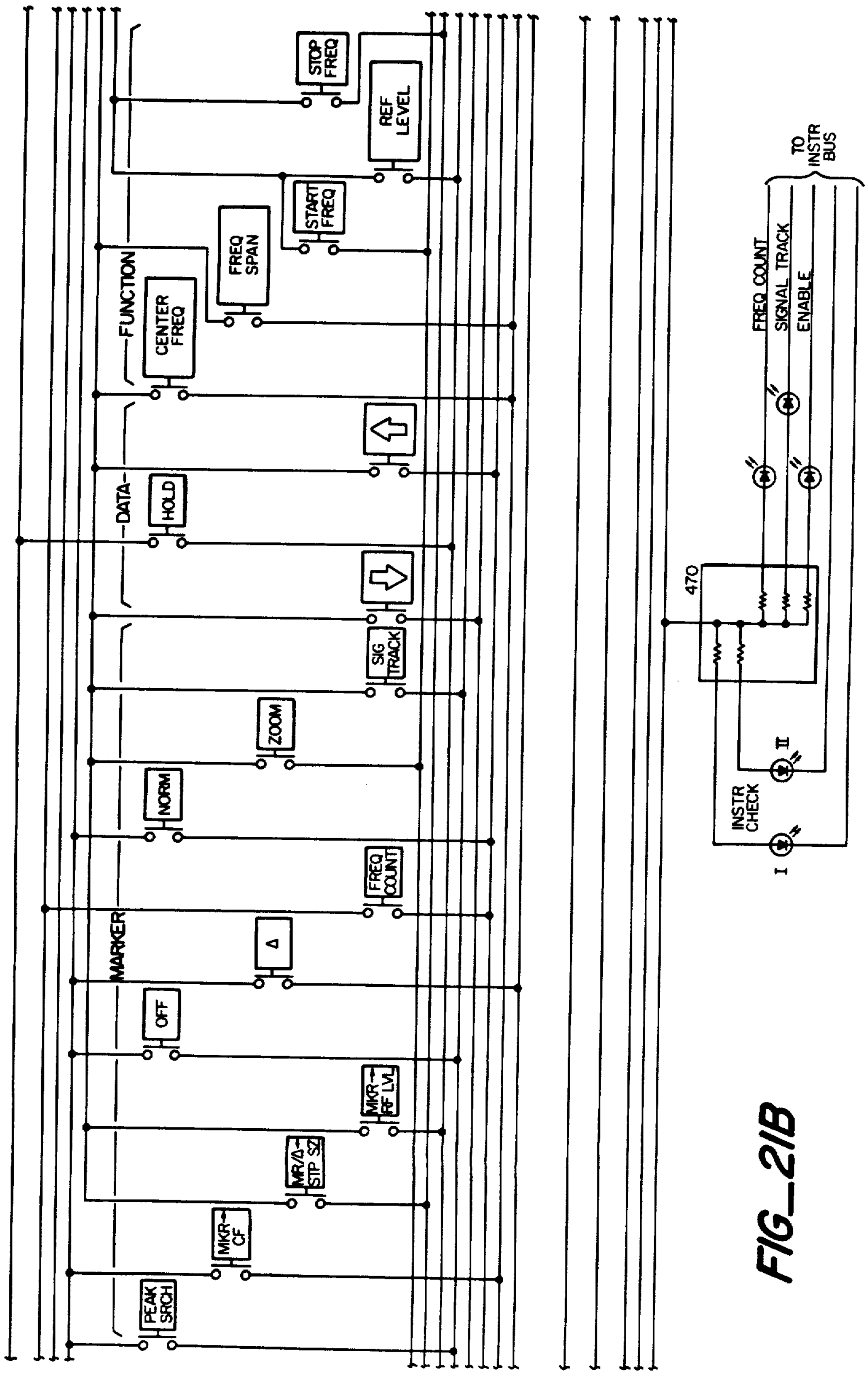
FIG_21B

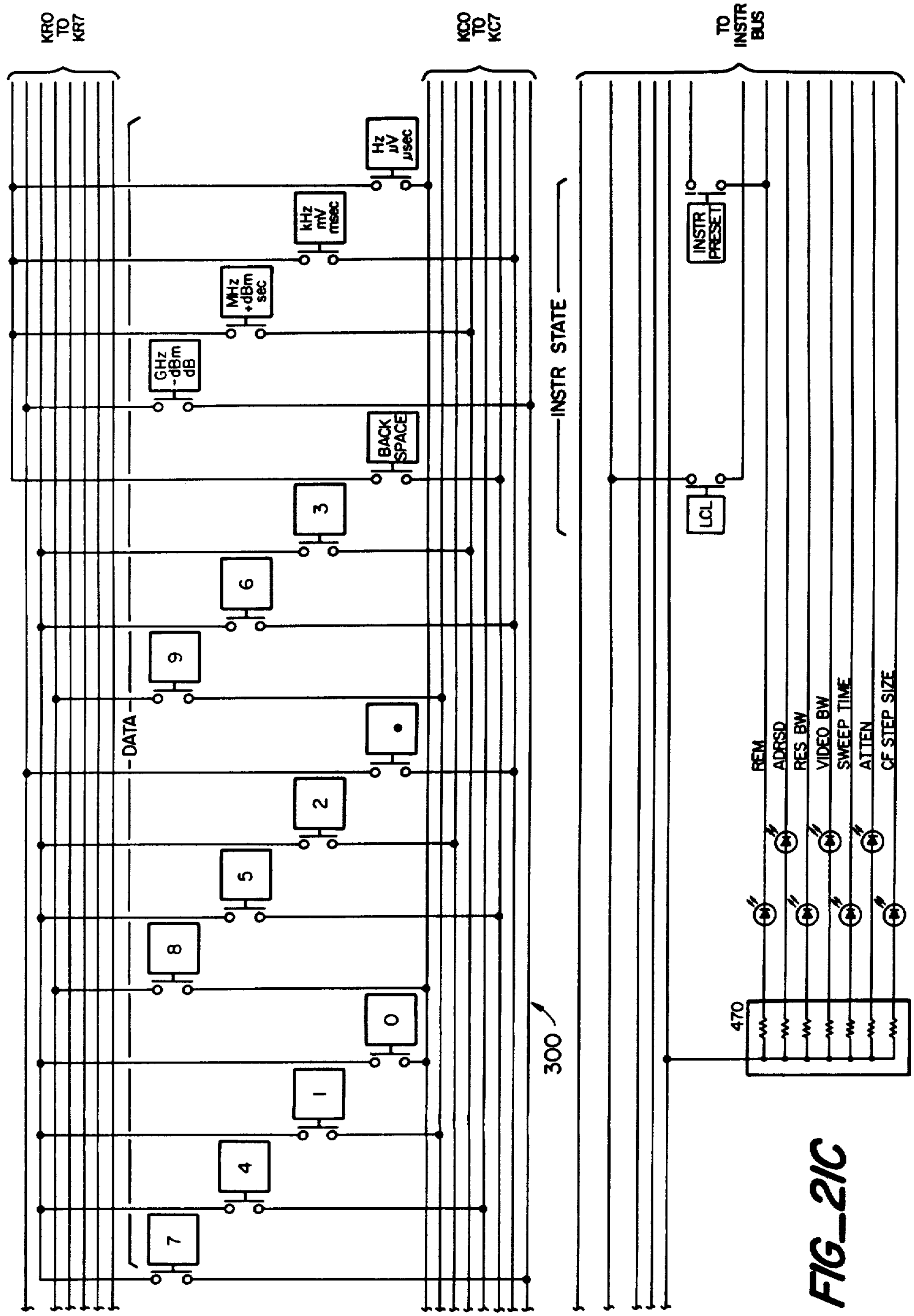
FIG_21C

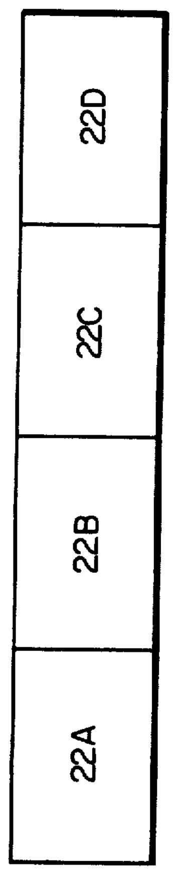
FIG_22

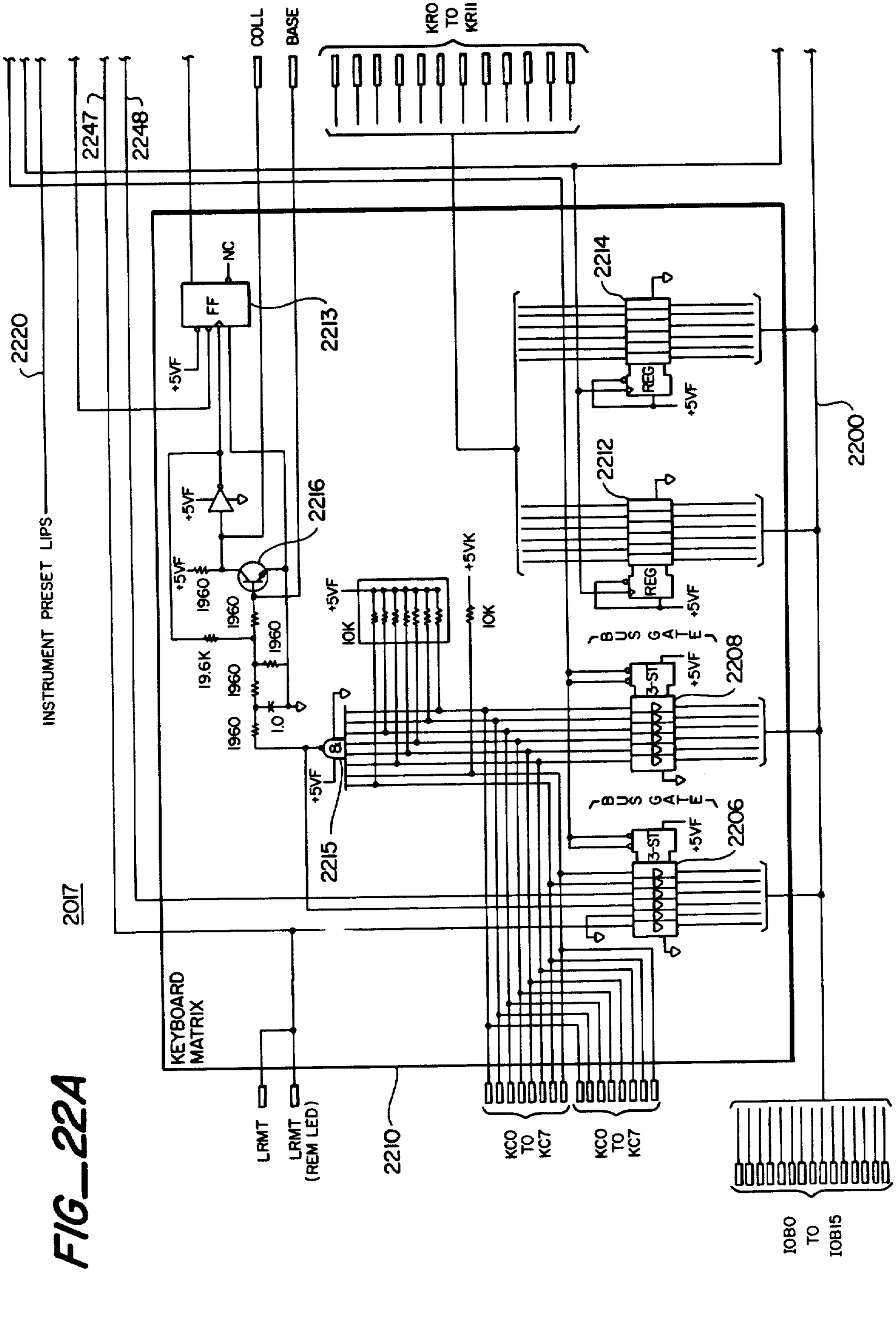
FIG_22A

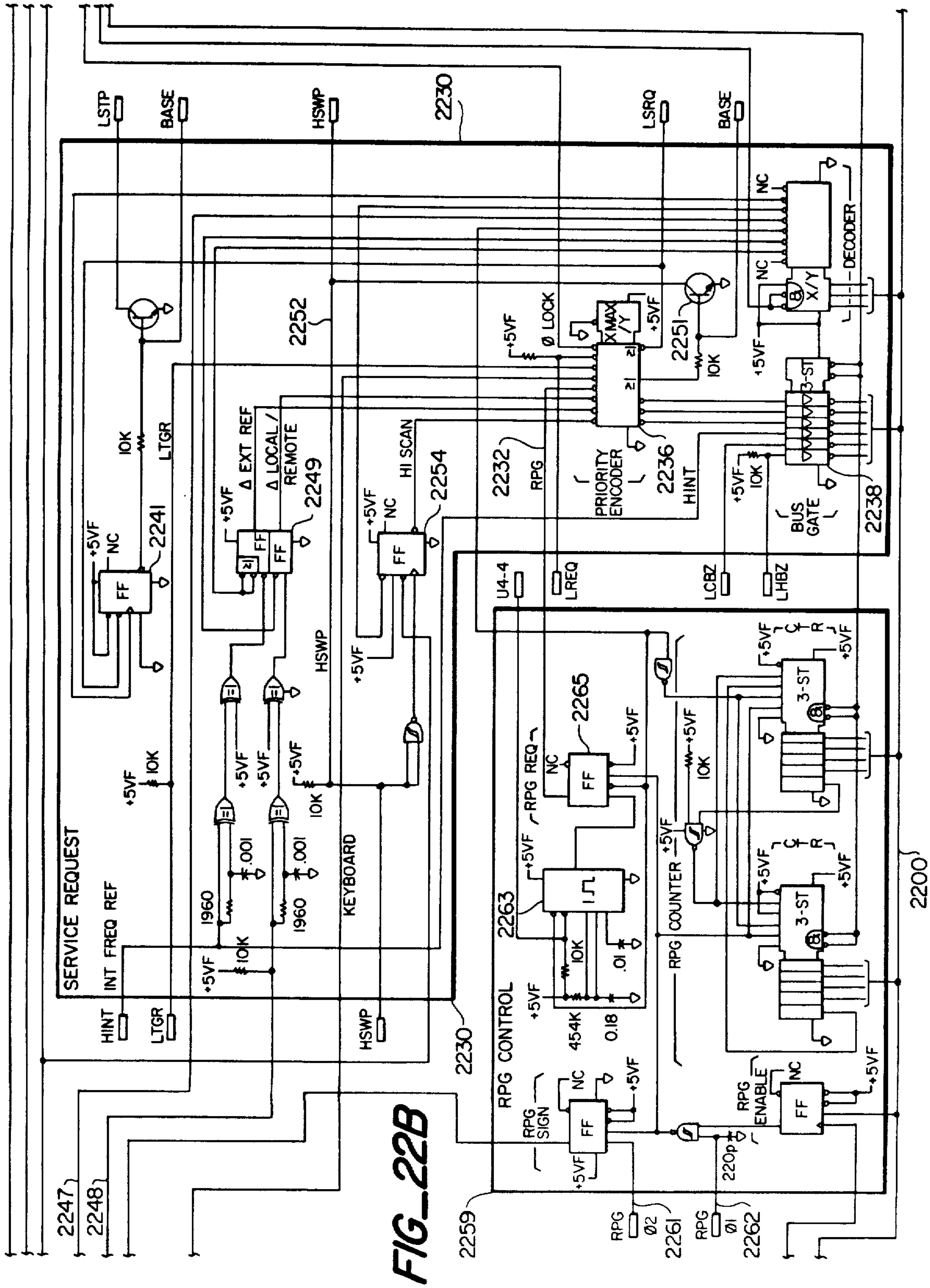
FIG_22B

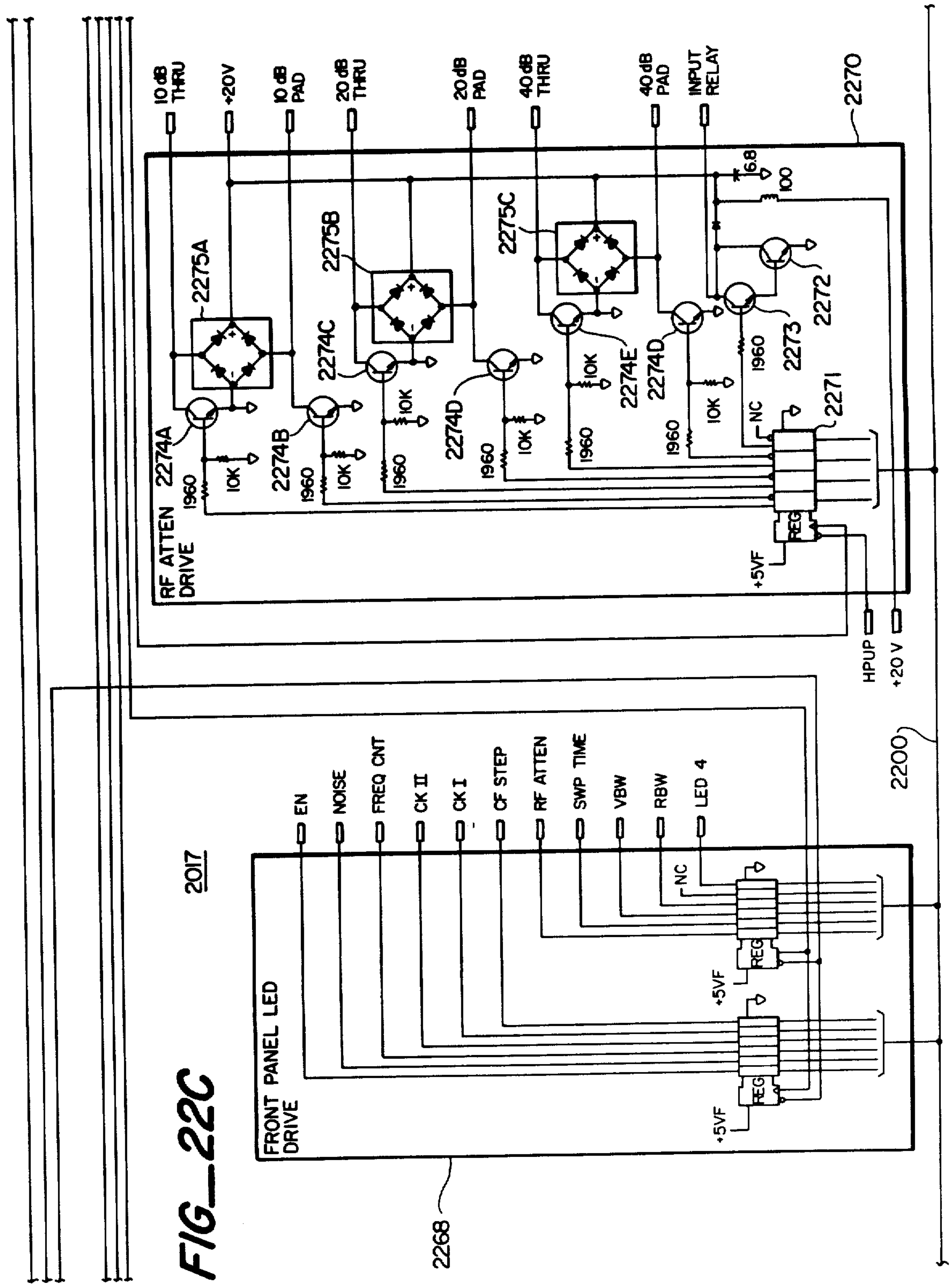
FIG_22C

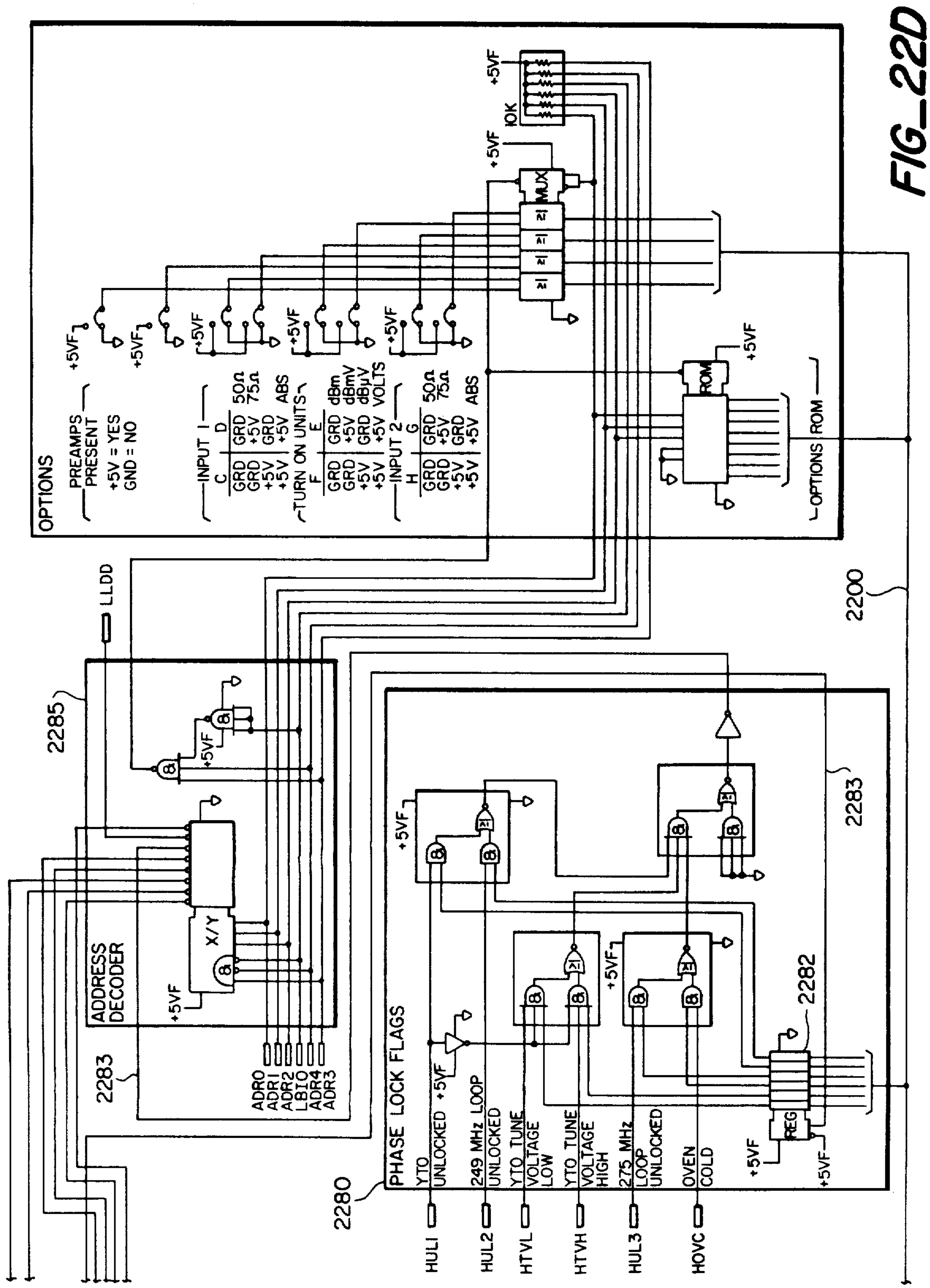
FIG_22D

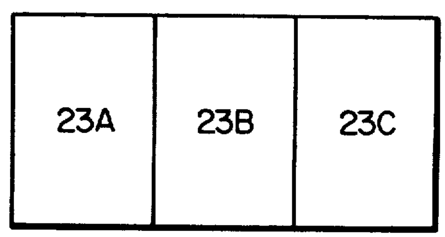
FIG_23

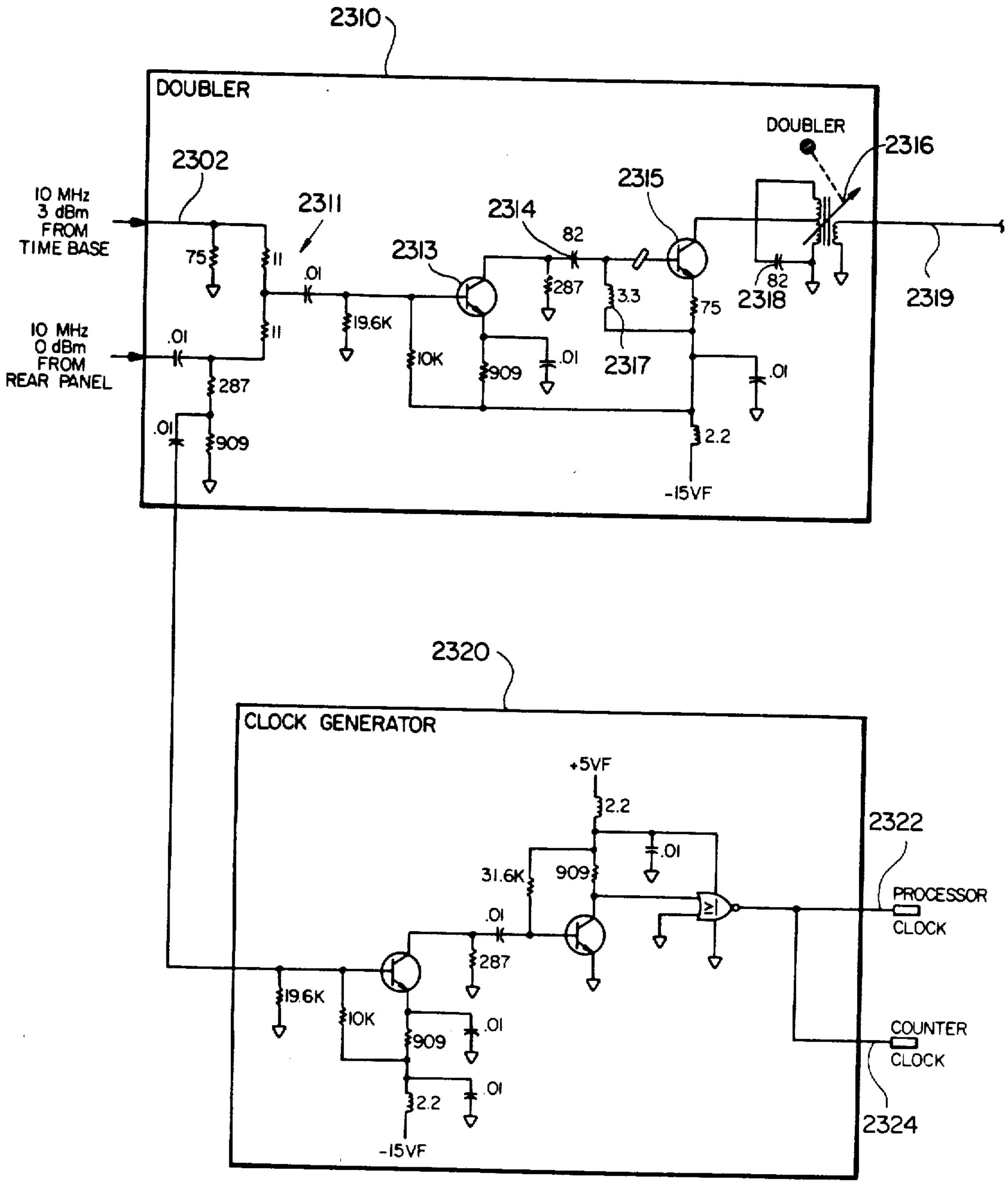
FIG_23A

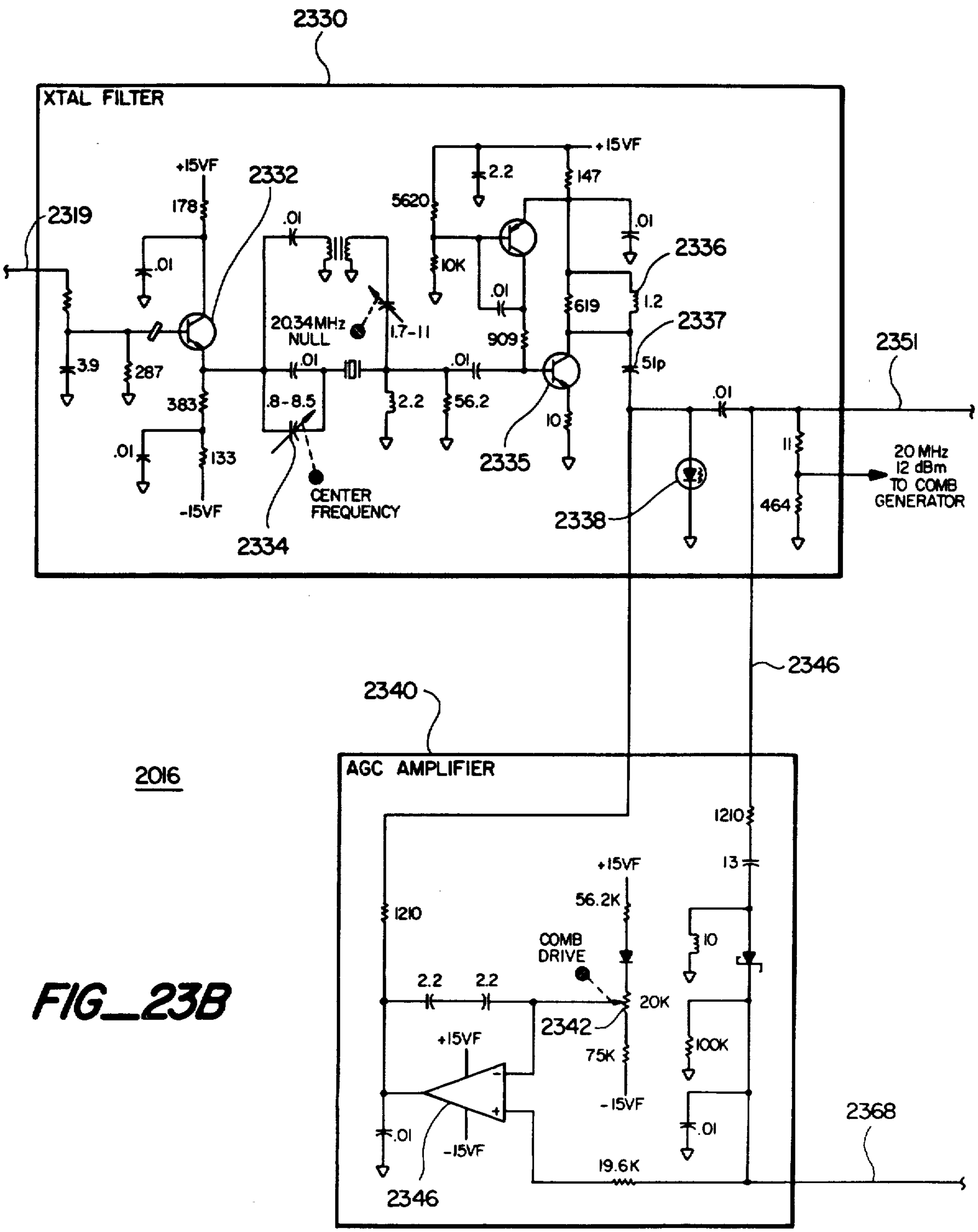
FIG_23B

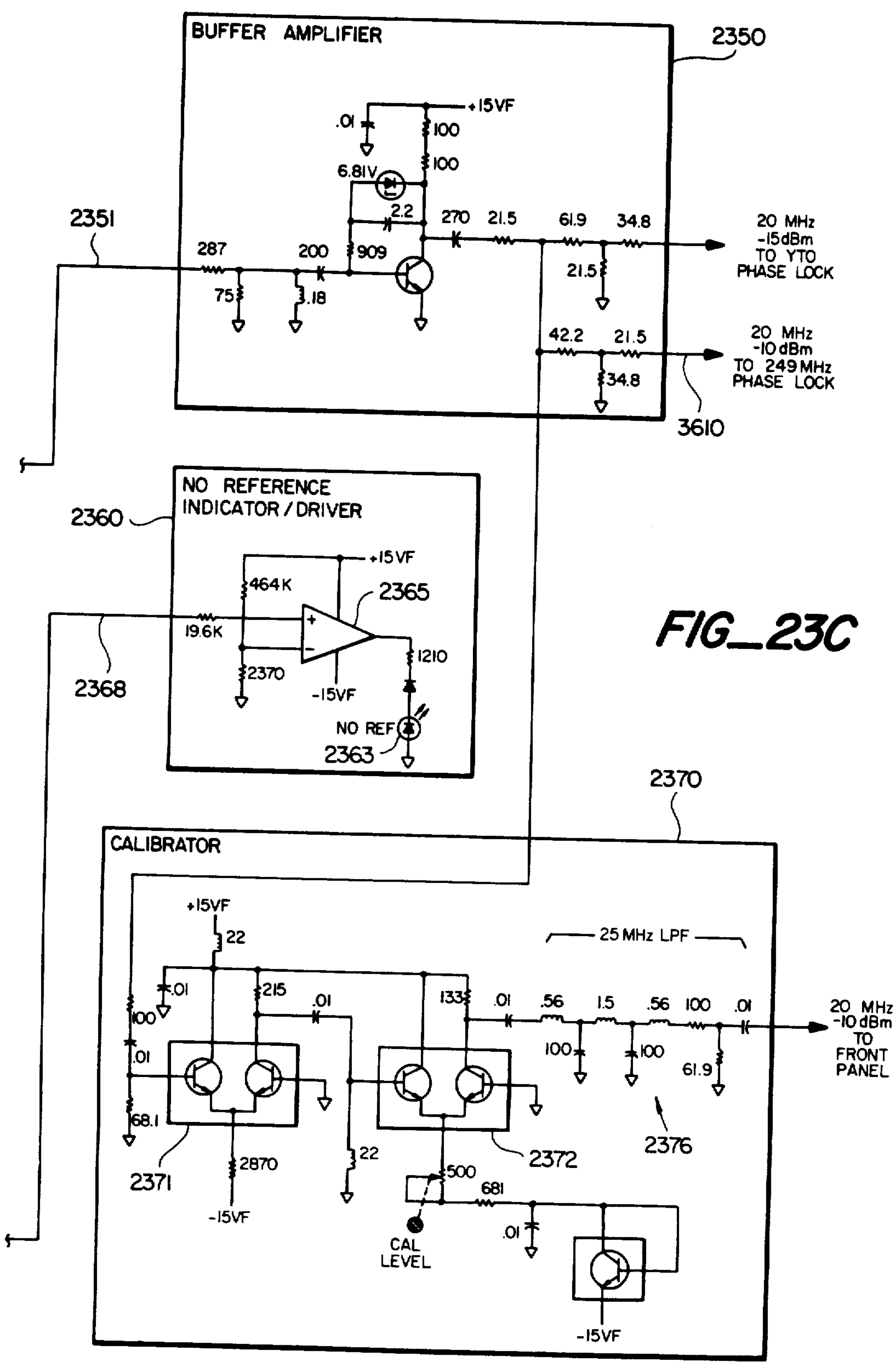
FIG_23C

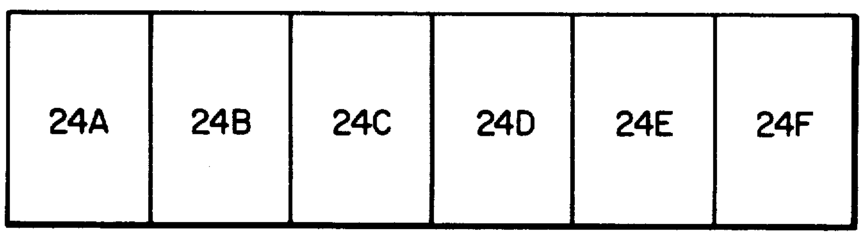
FIG_24

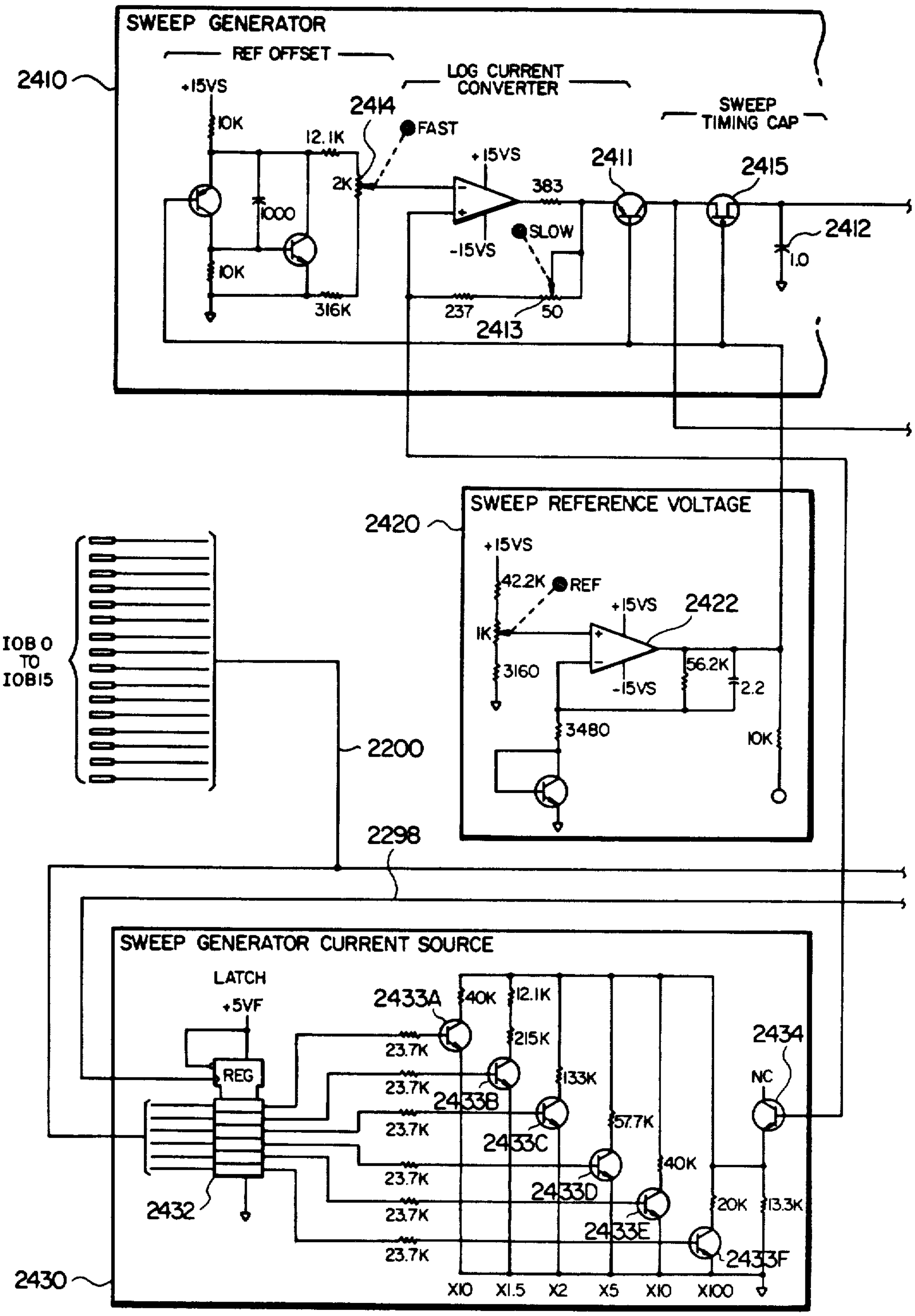
FIG_24A

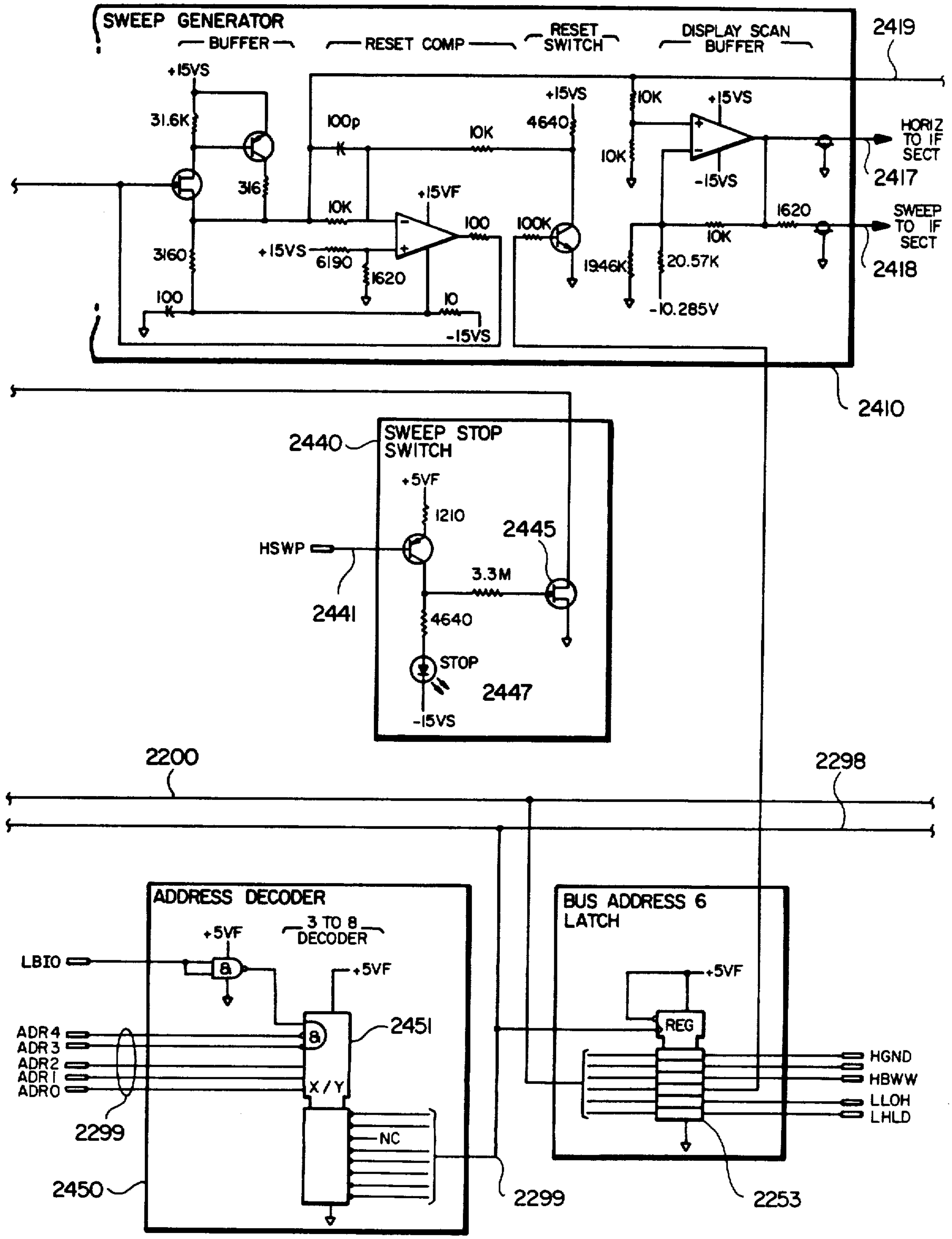
FIG_24B

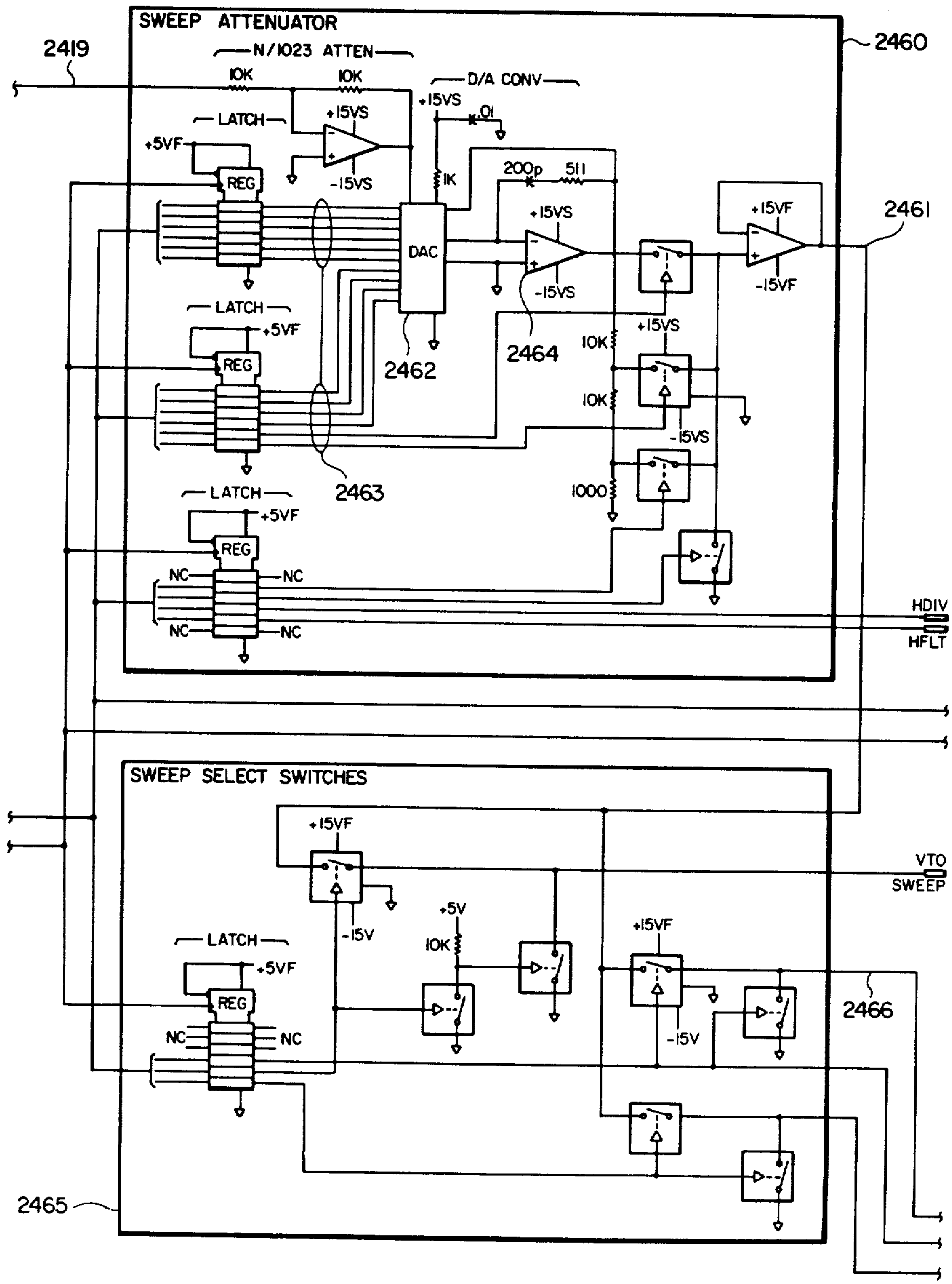
FIG_24C

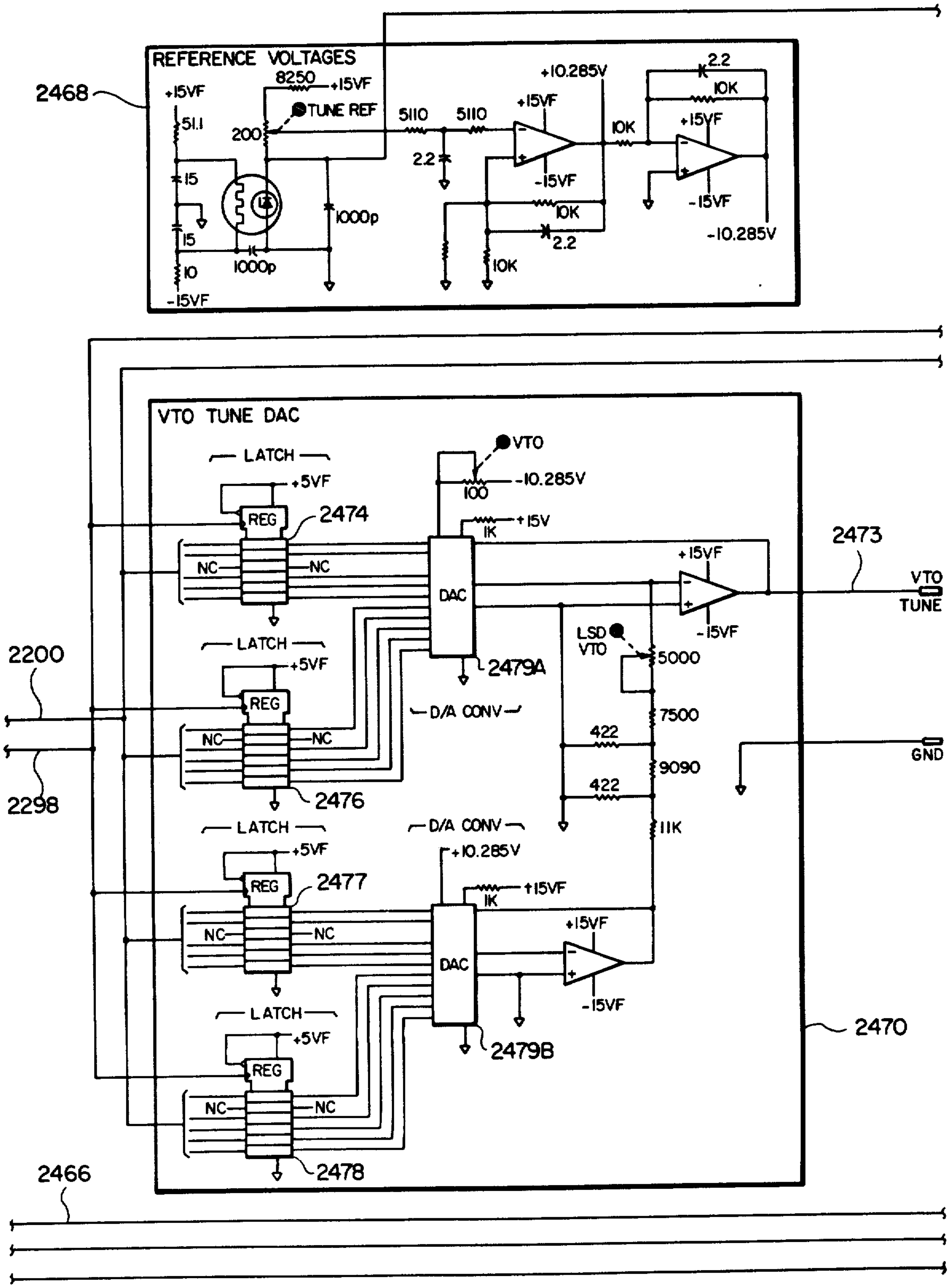
FIG_24D

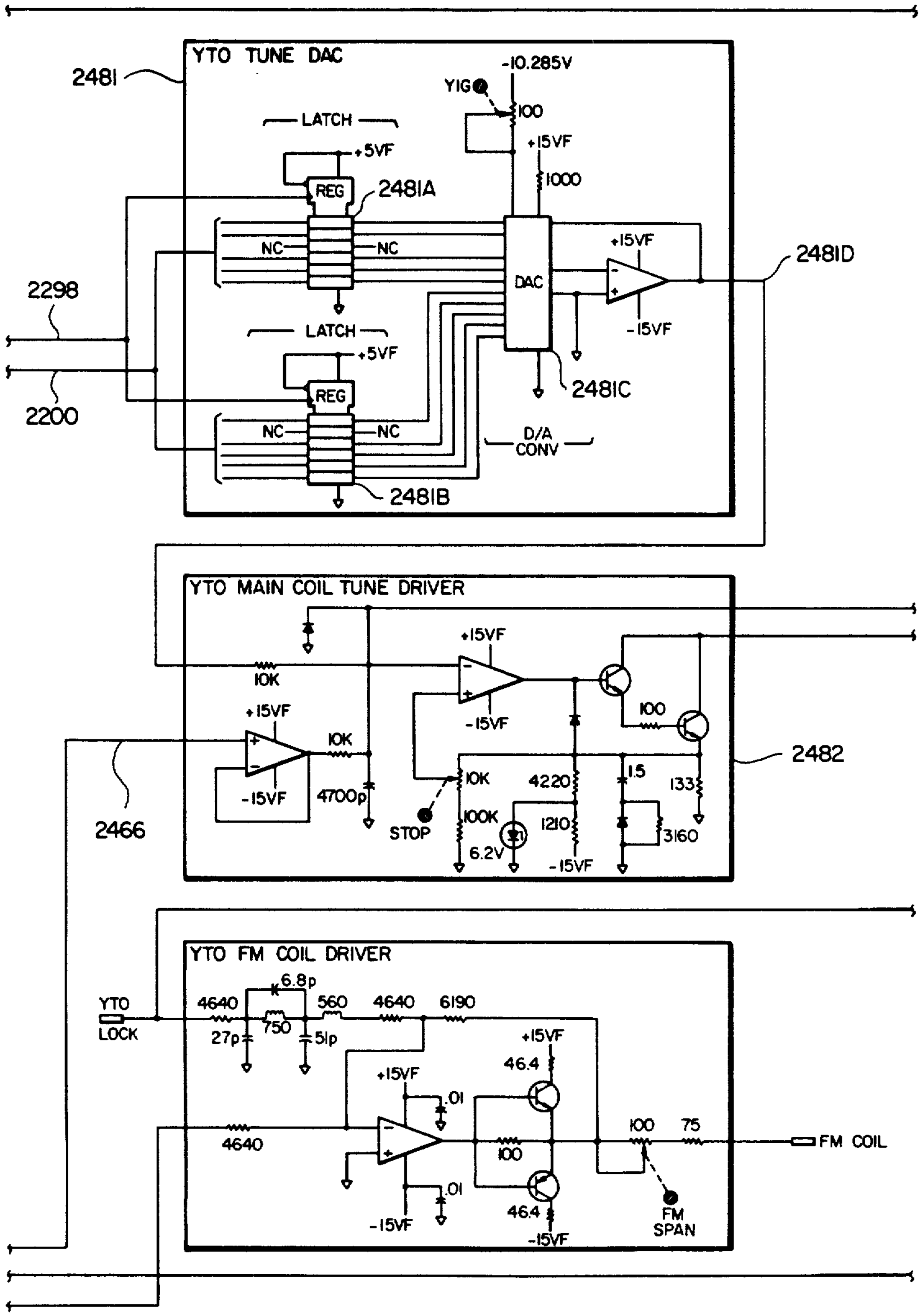
FIG_24E

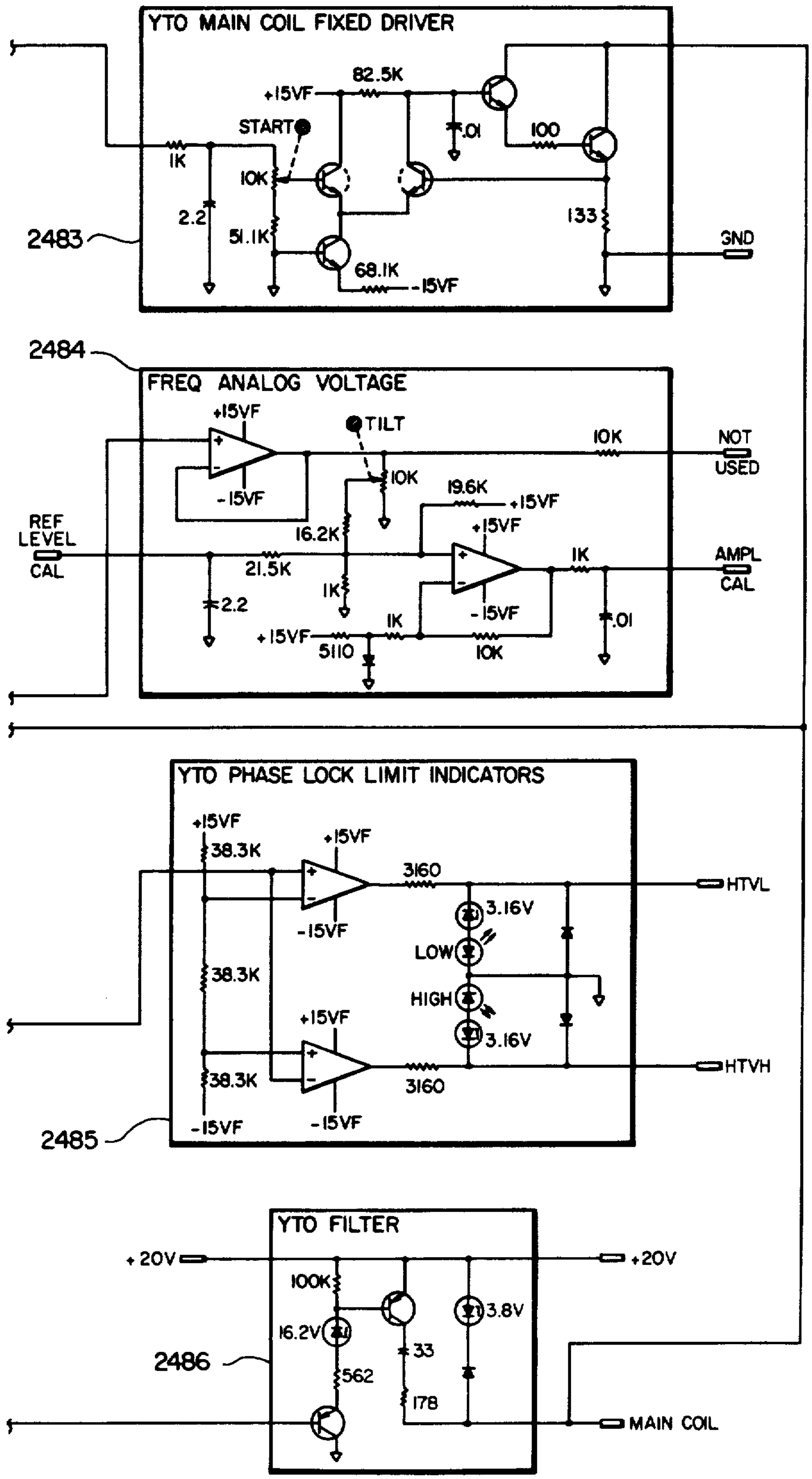
FIG_24F

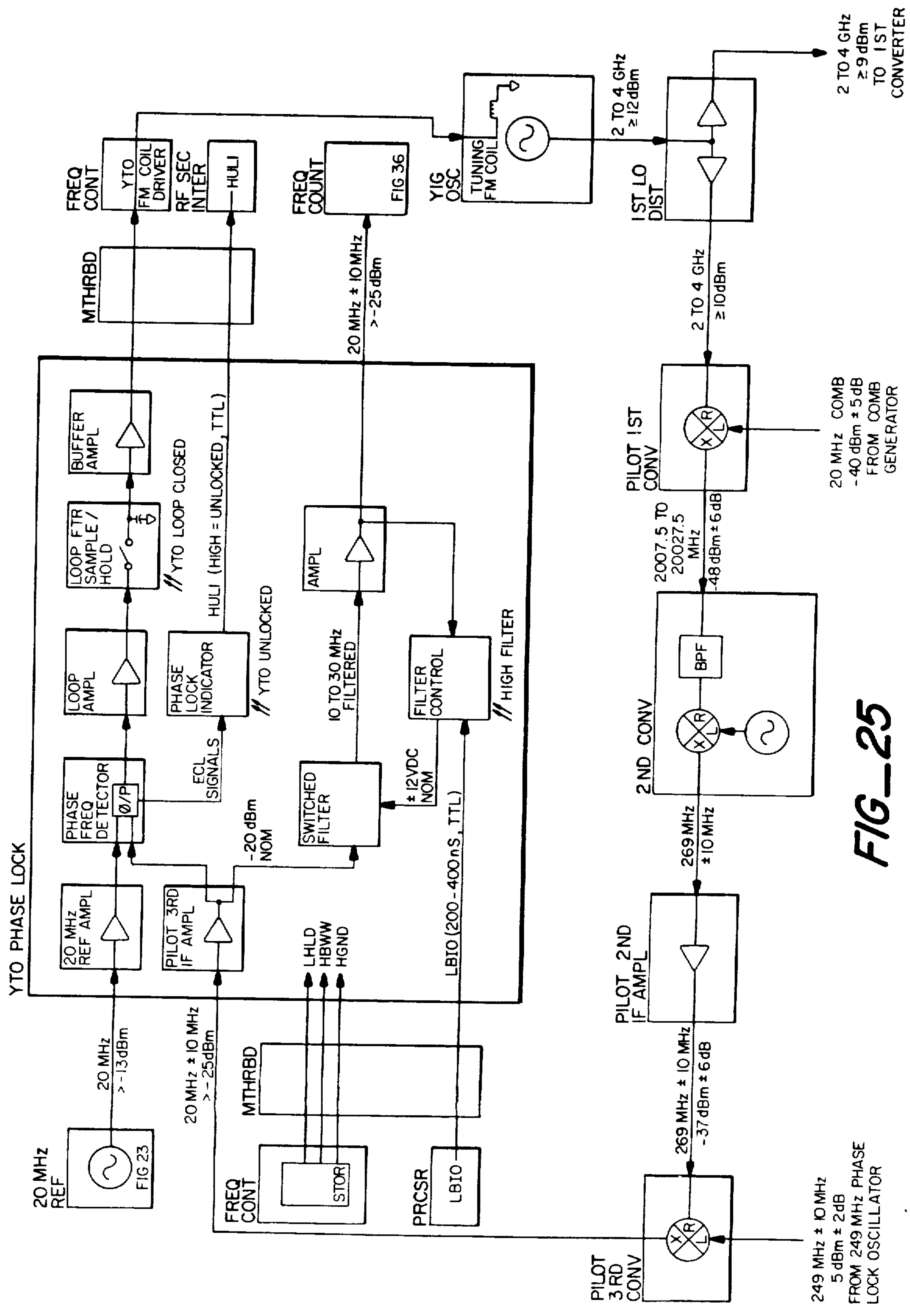
FIG_25

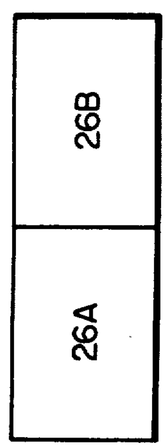
FIG_26

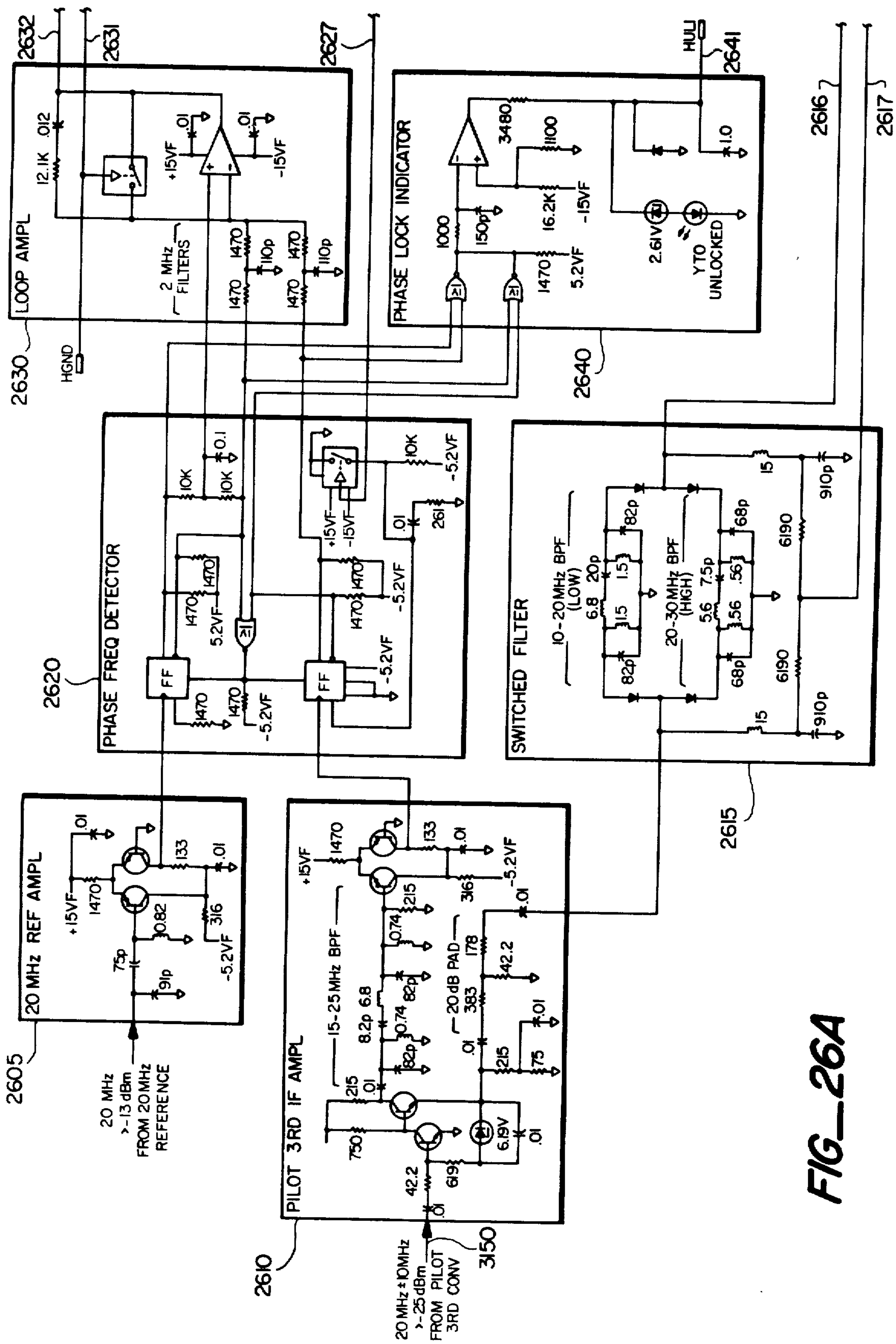
FIG_26A

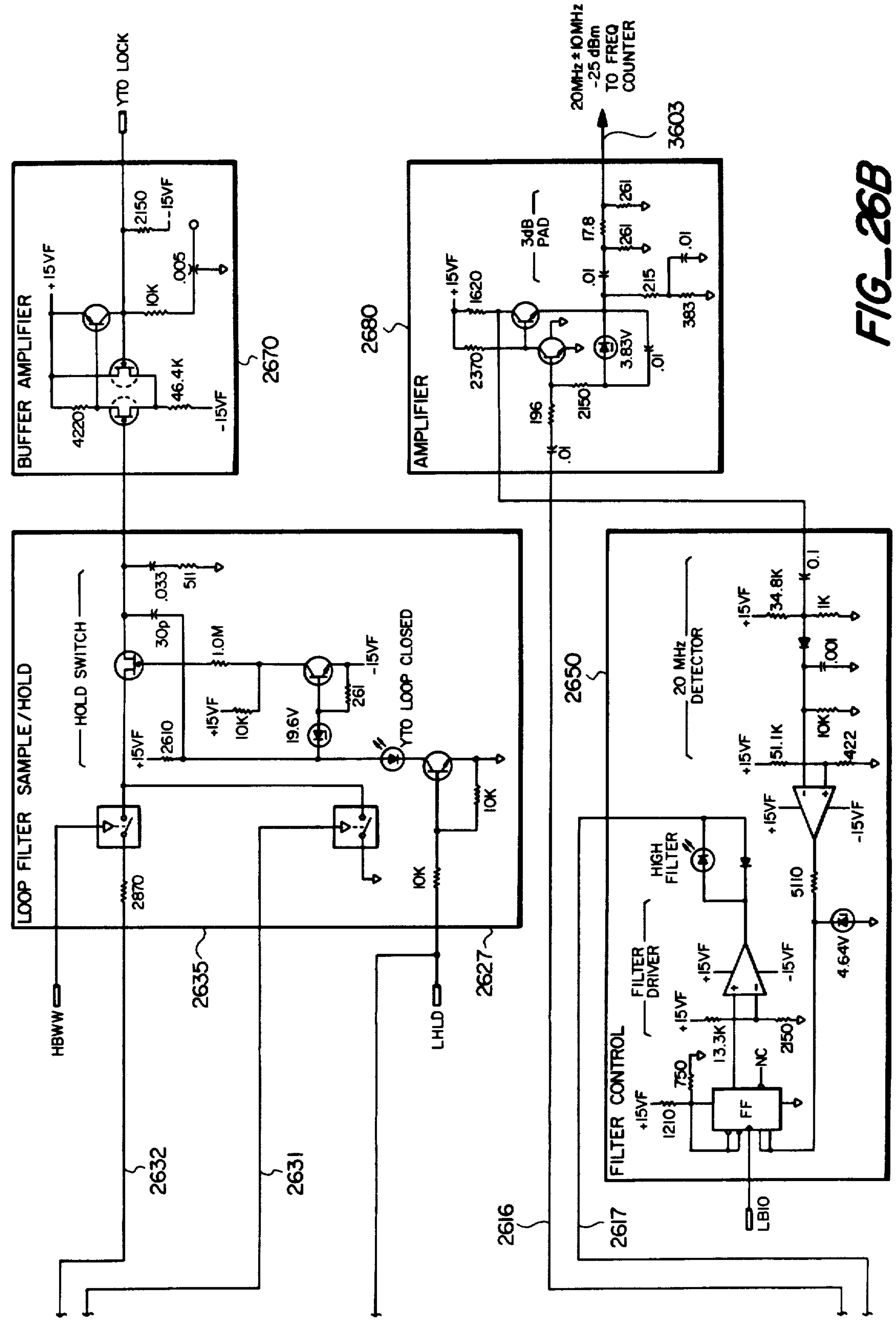
FIG_26B

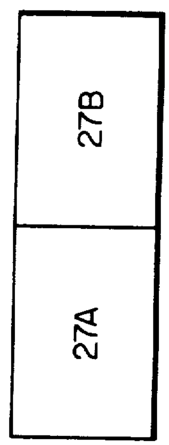
FIG_27

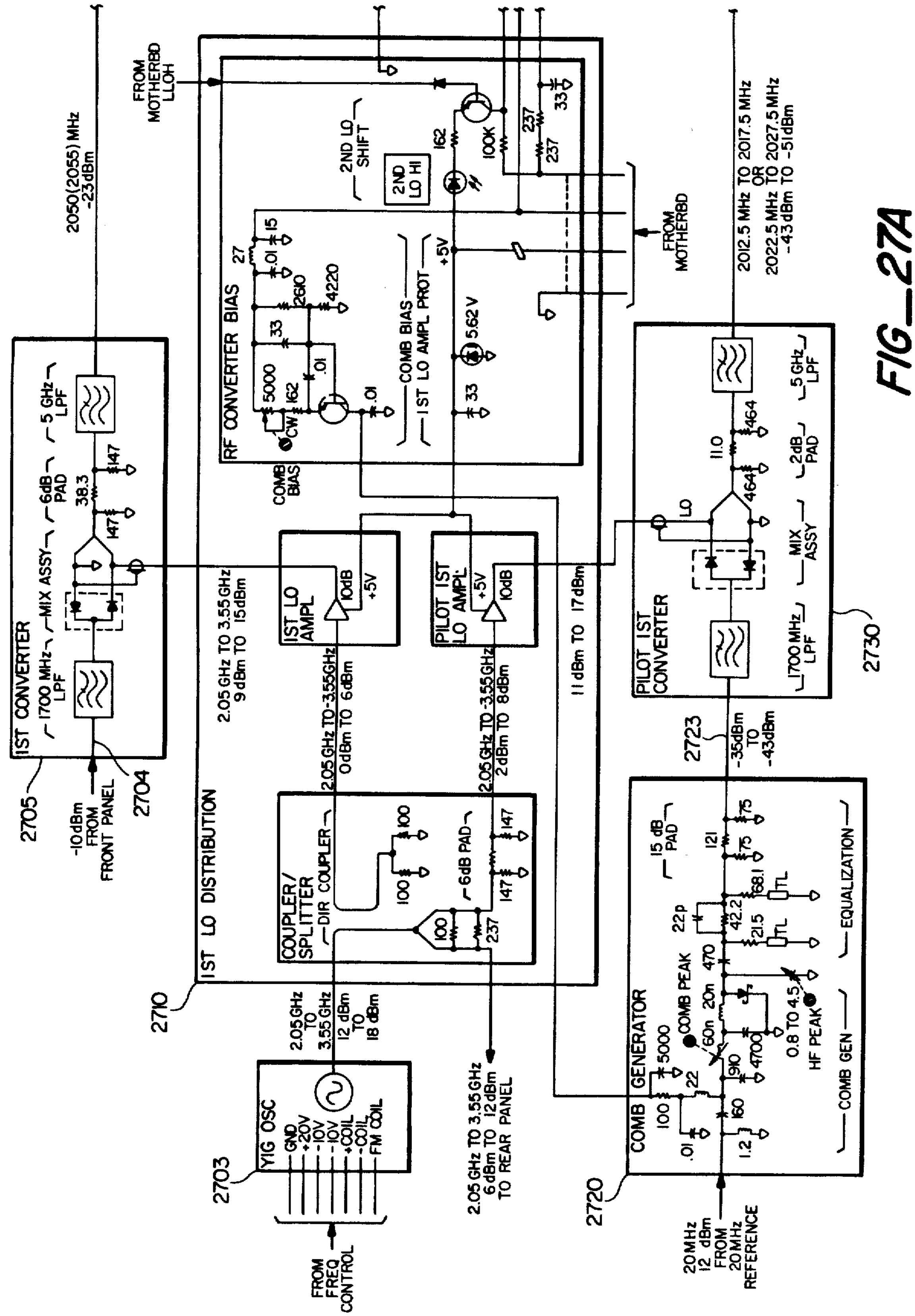
FIG_27A

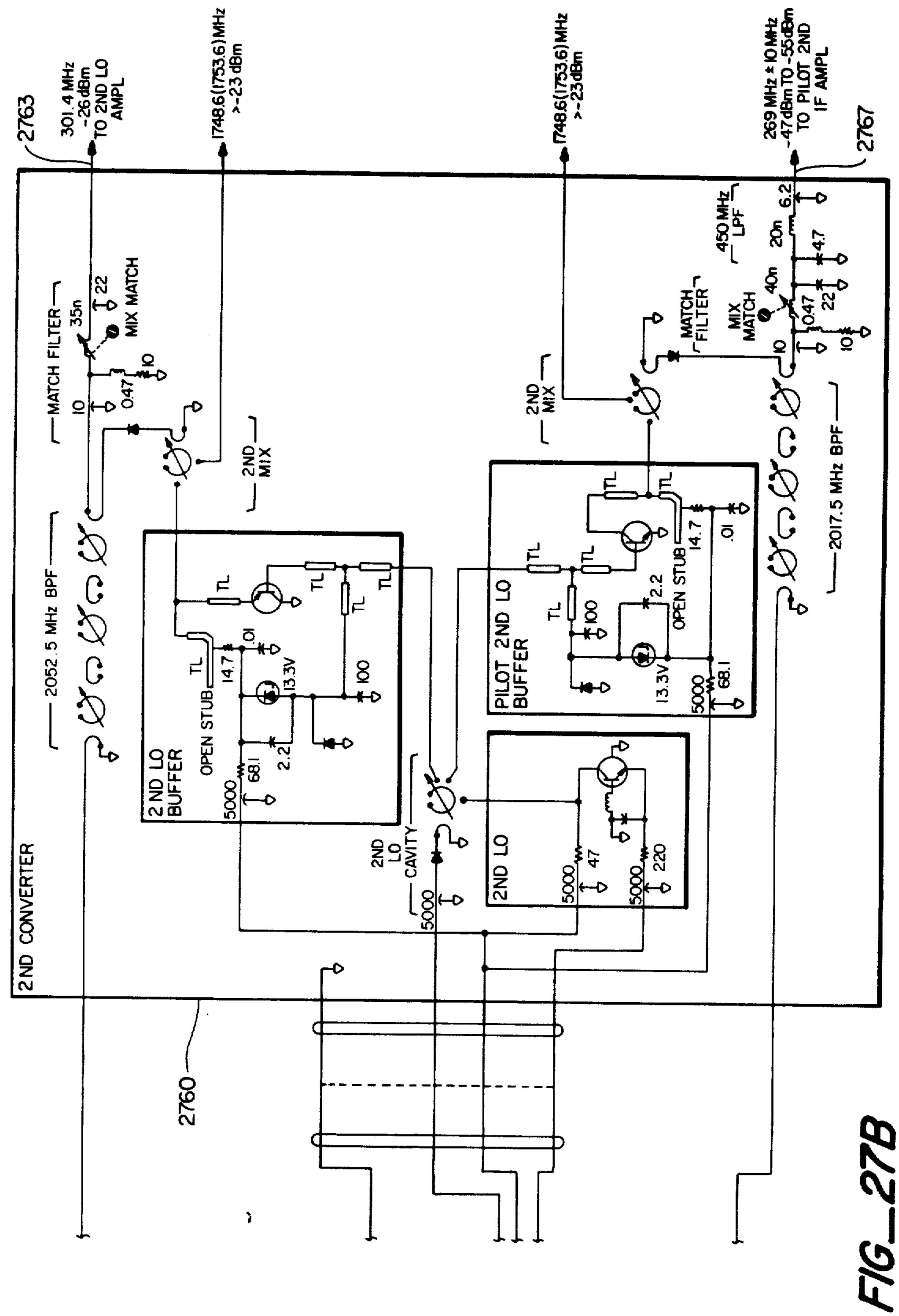
FIG_27B

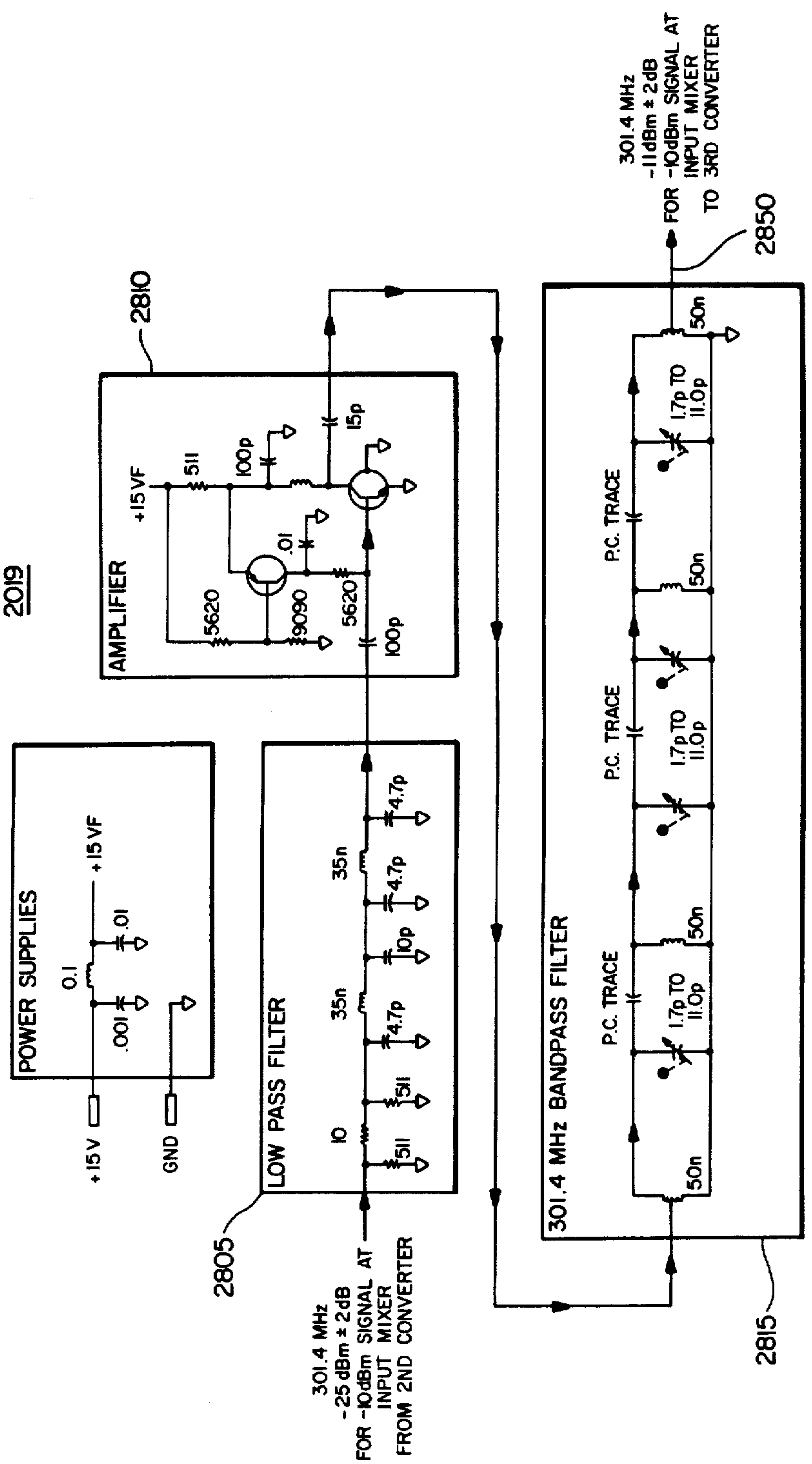
FIG_28

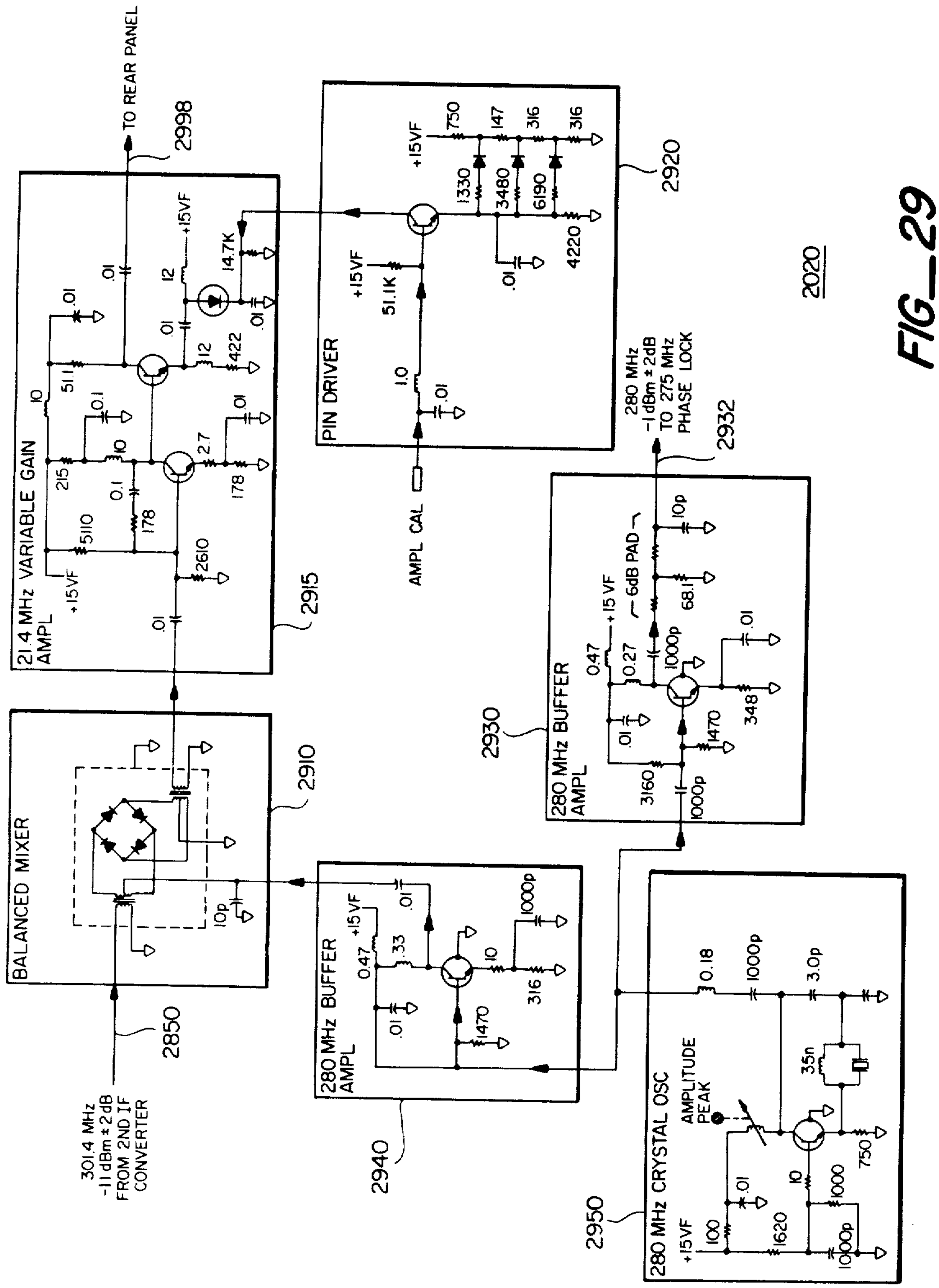
FIG_29

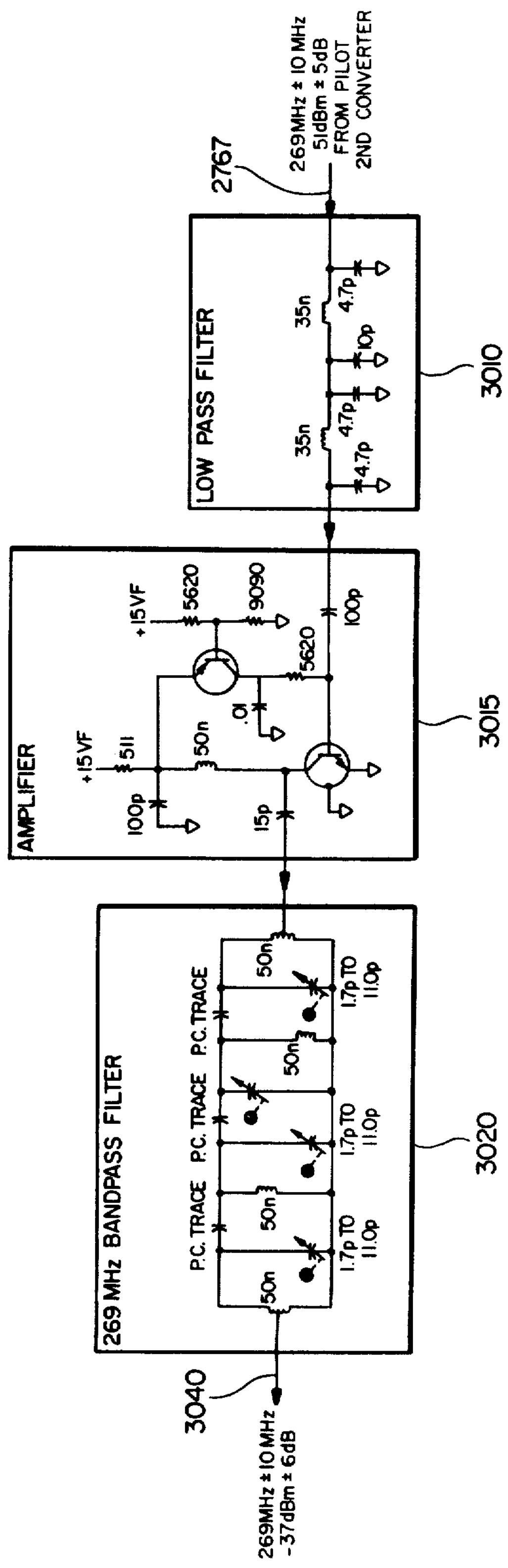
FIG_30

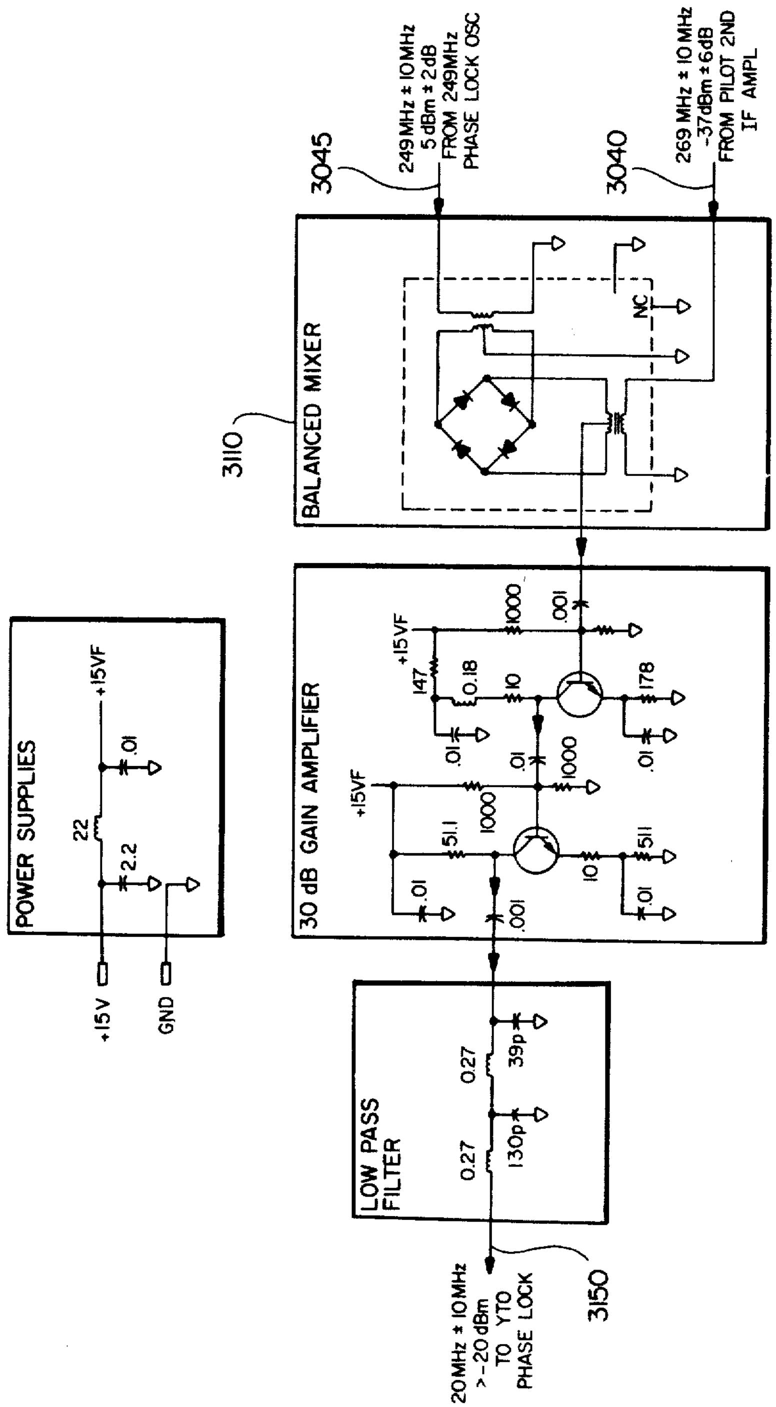
FIG_31

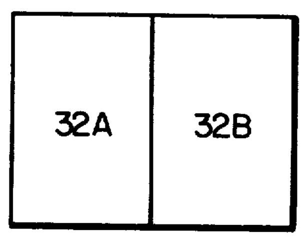
FIG_32

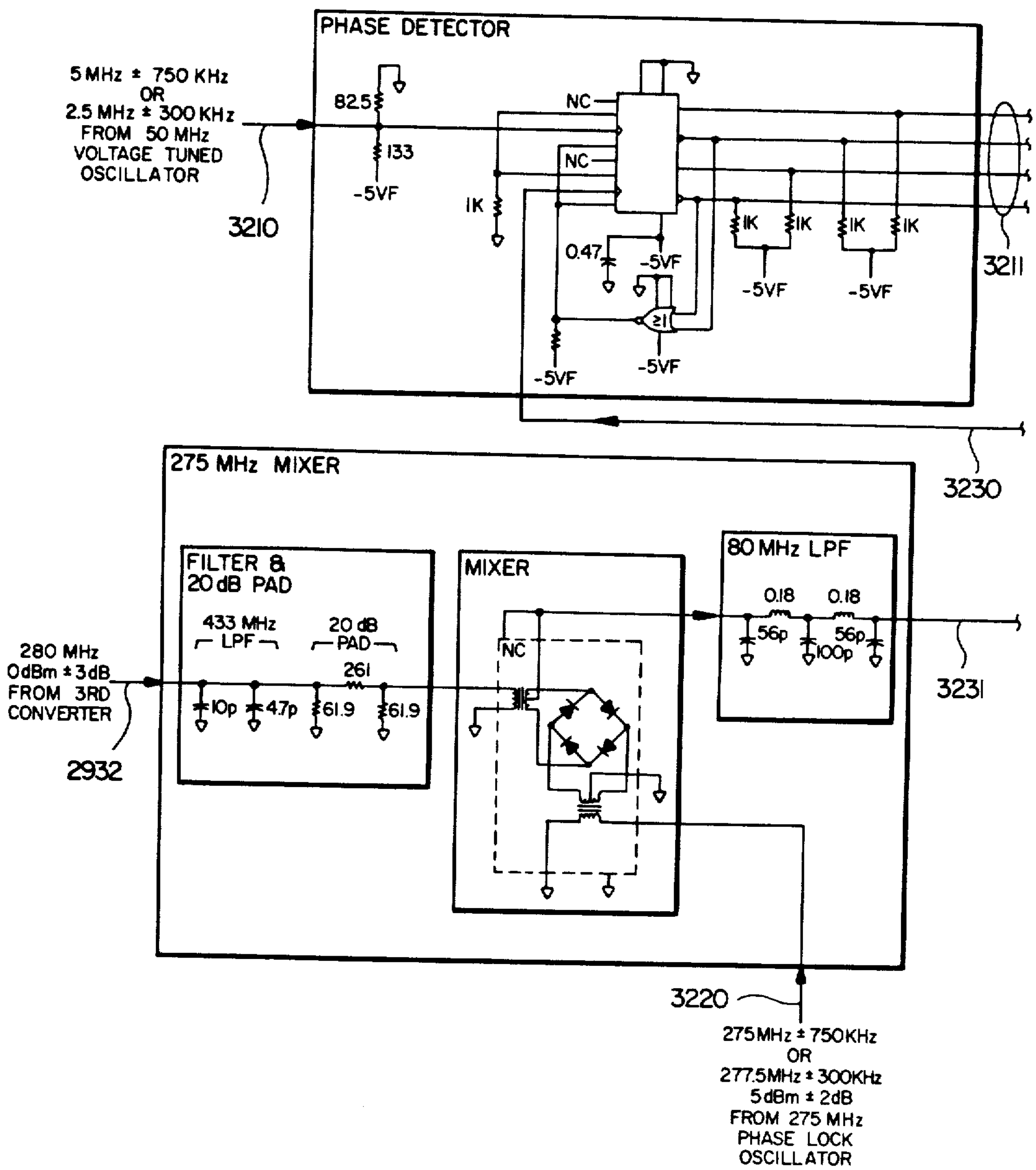
FIG_32A

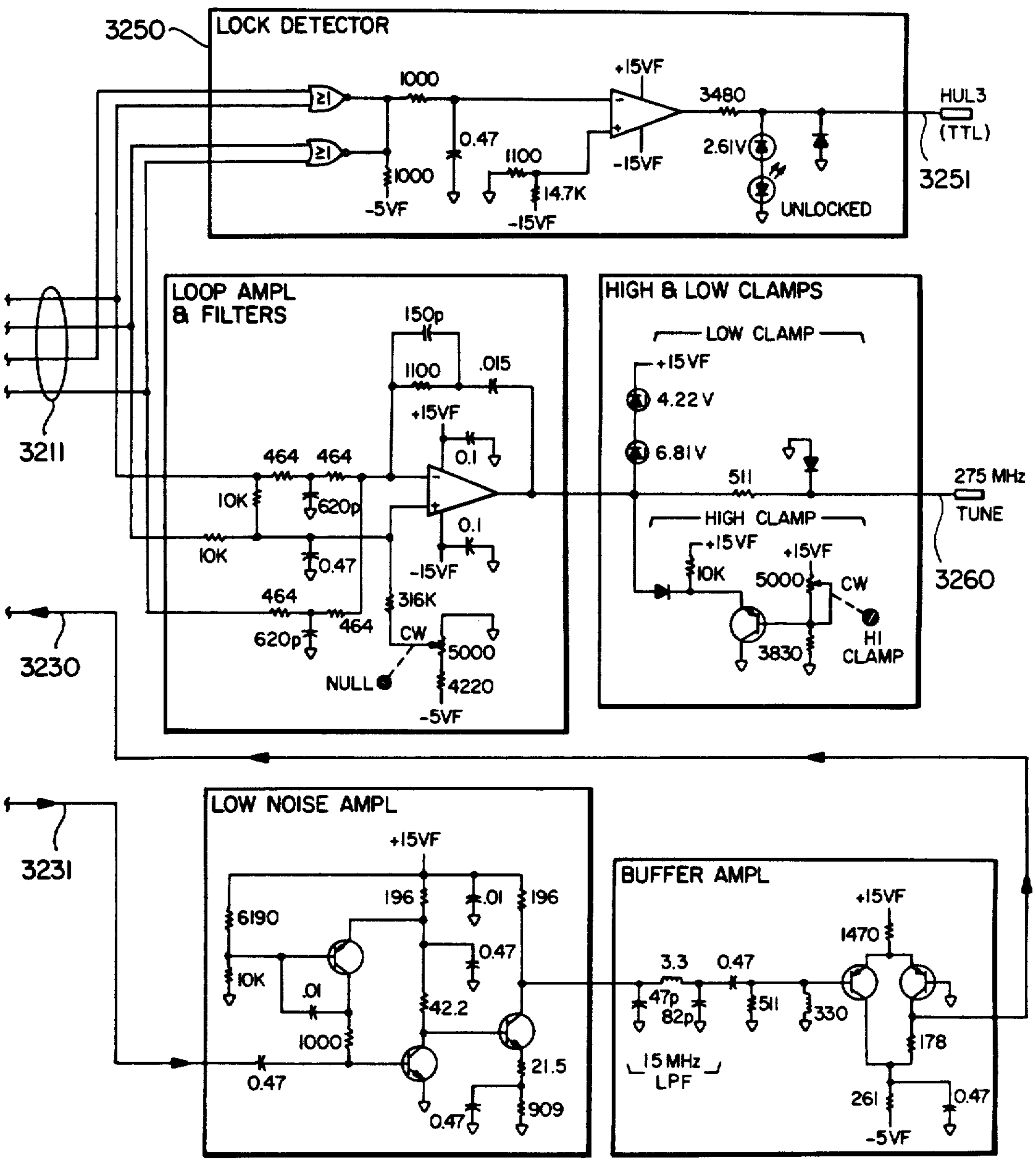
FIG_32B

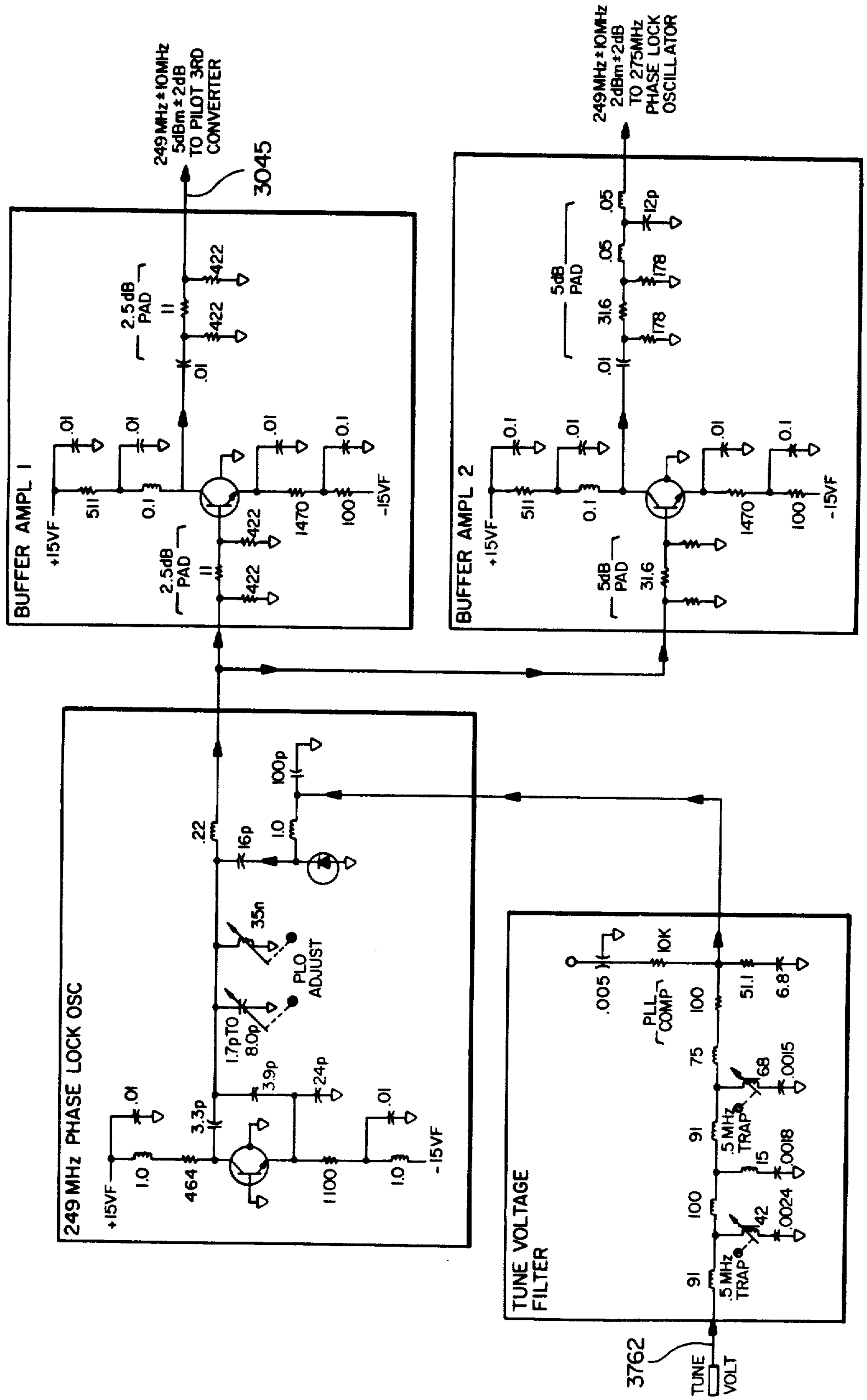
FIG_33

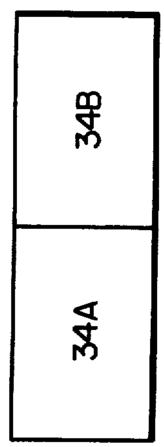
FIG_34

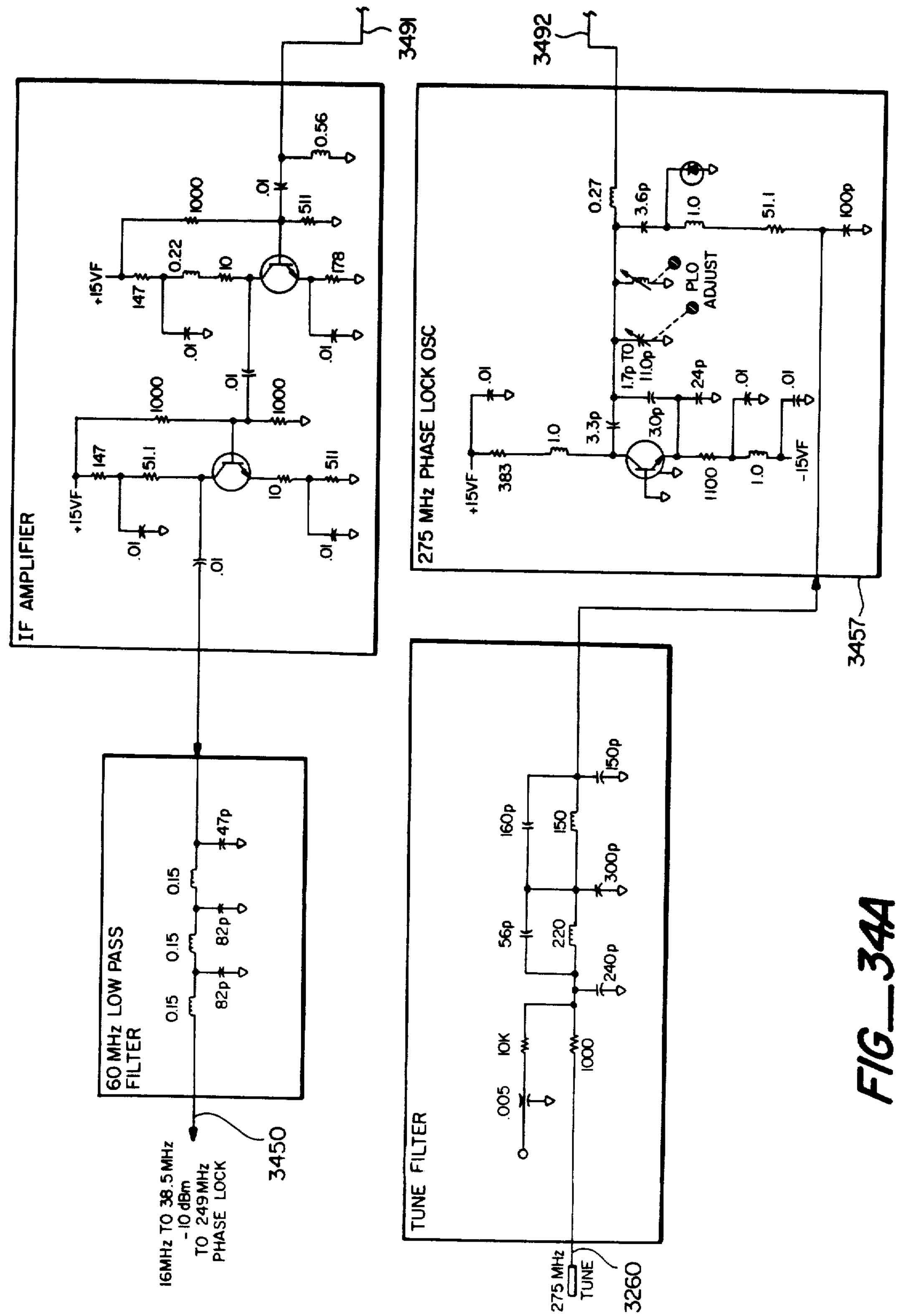
FIG_34A

FIG_34B
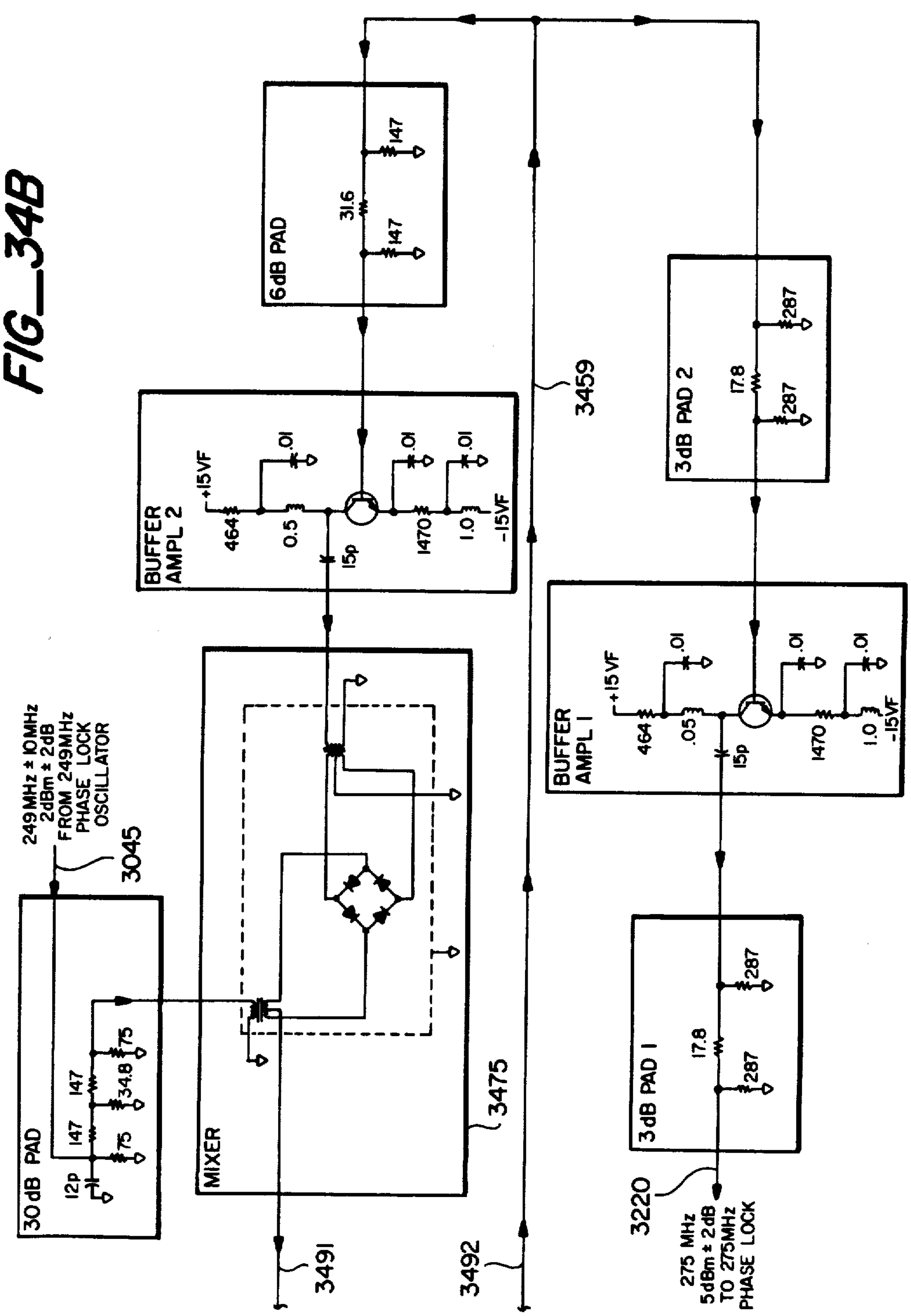

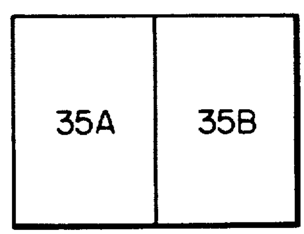
FIG_35

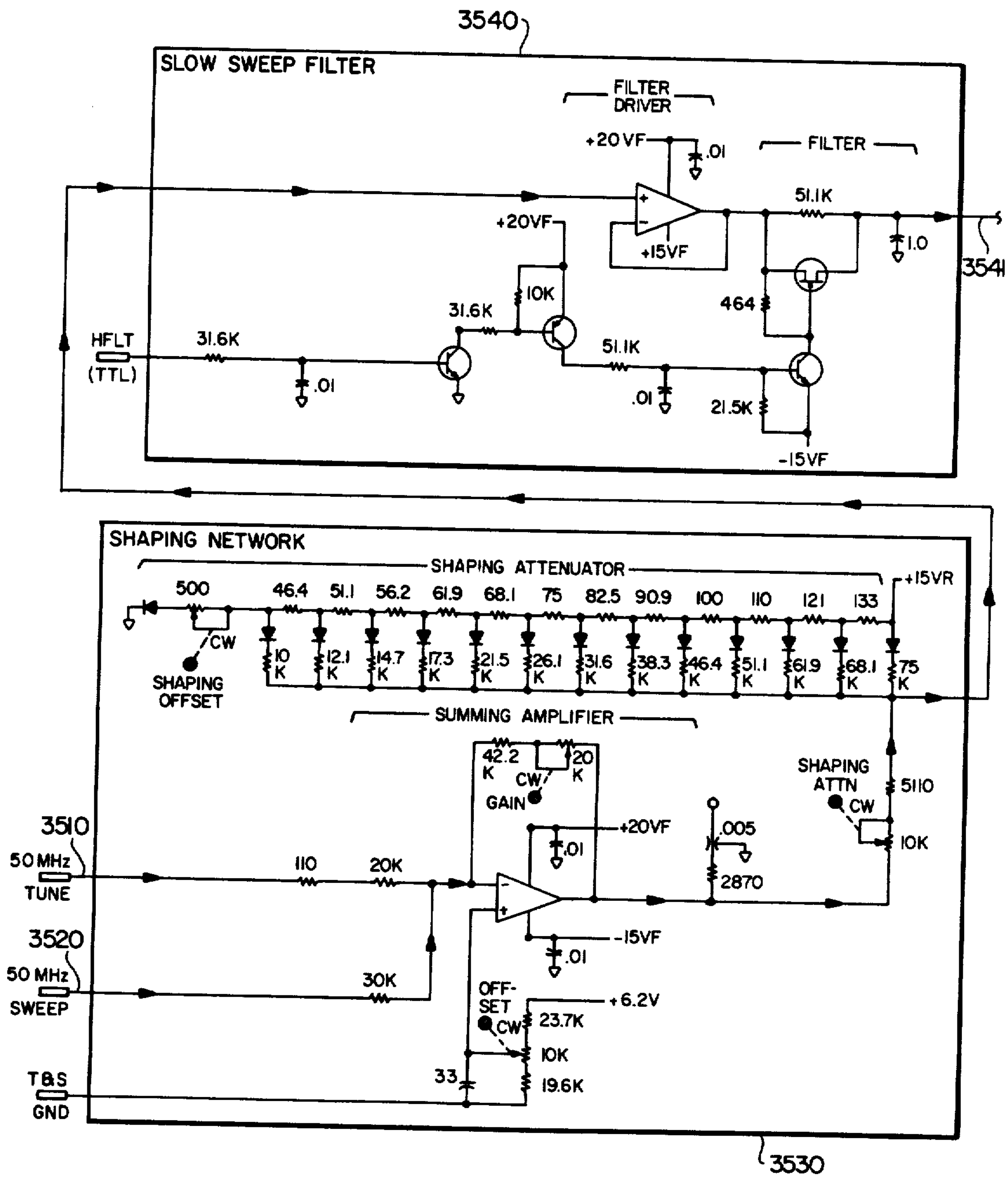
FIG_35A

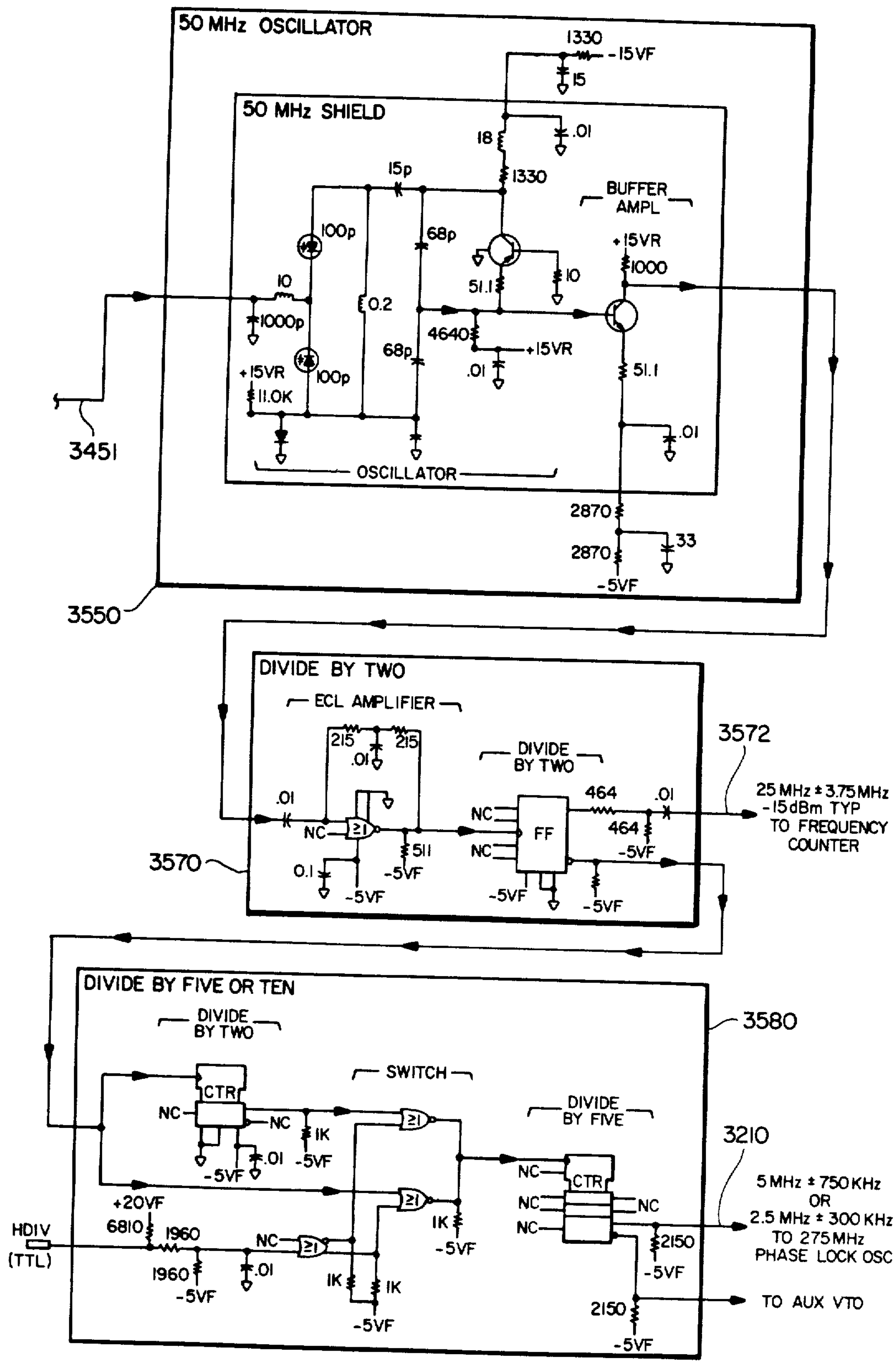
FIG_35B

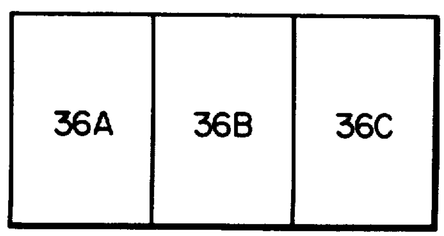
FIG_36

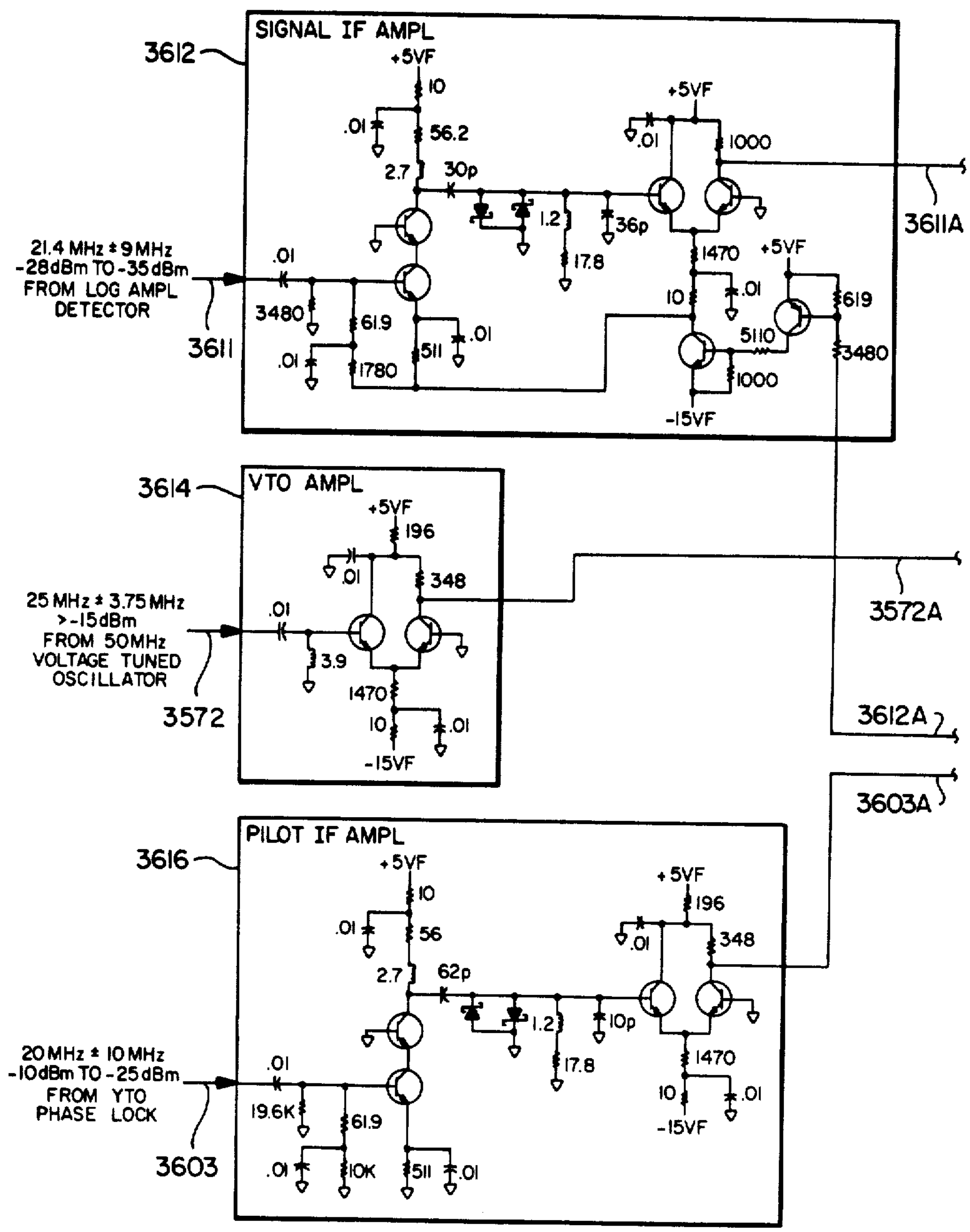
FIG_36A

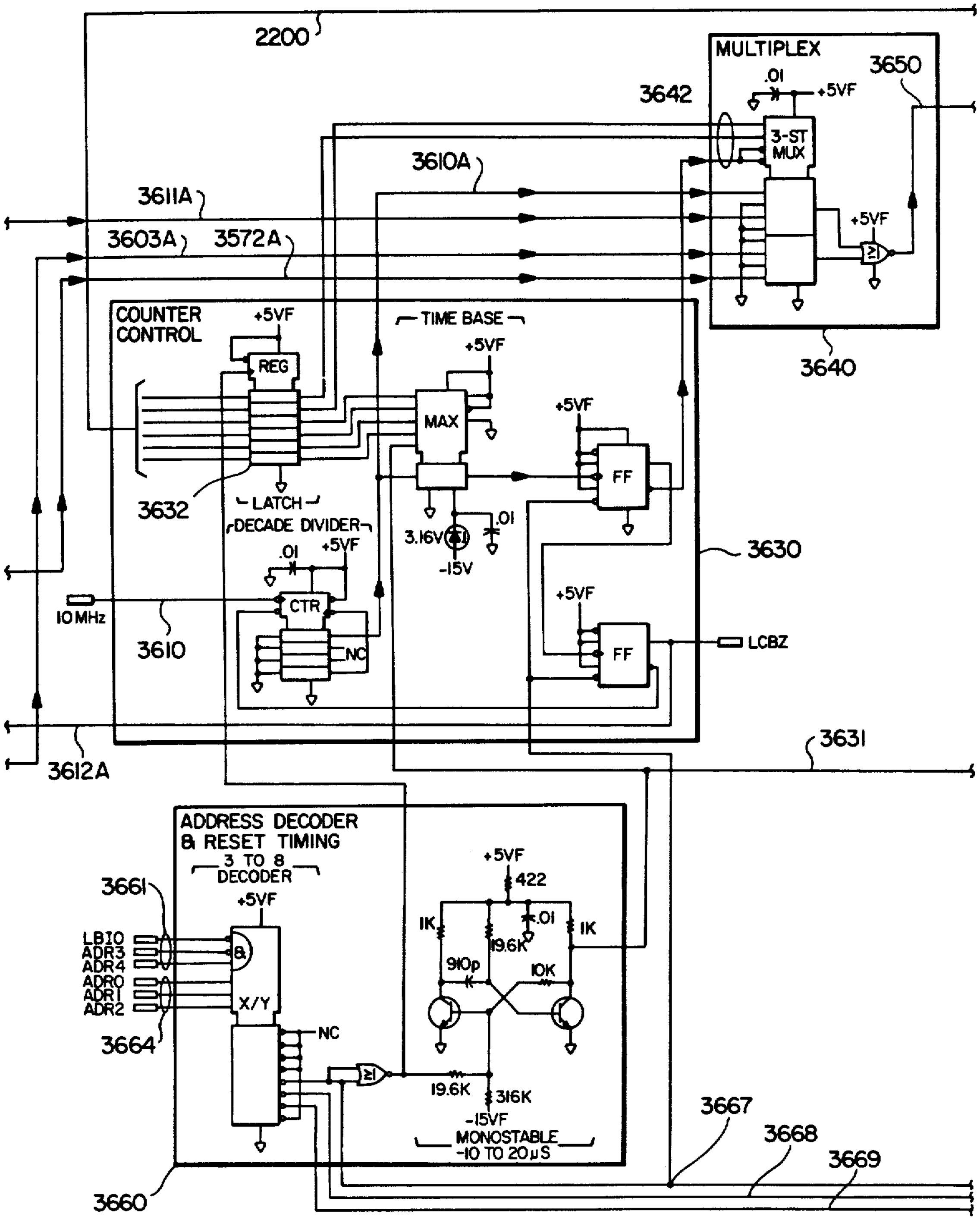
FIG_36B

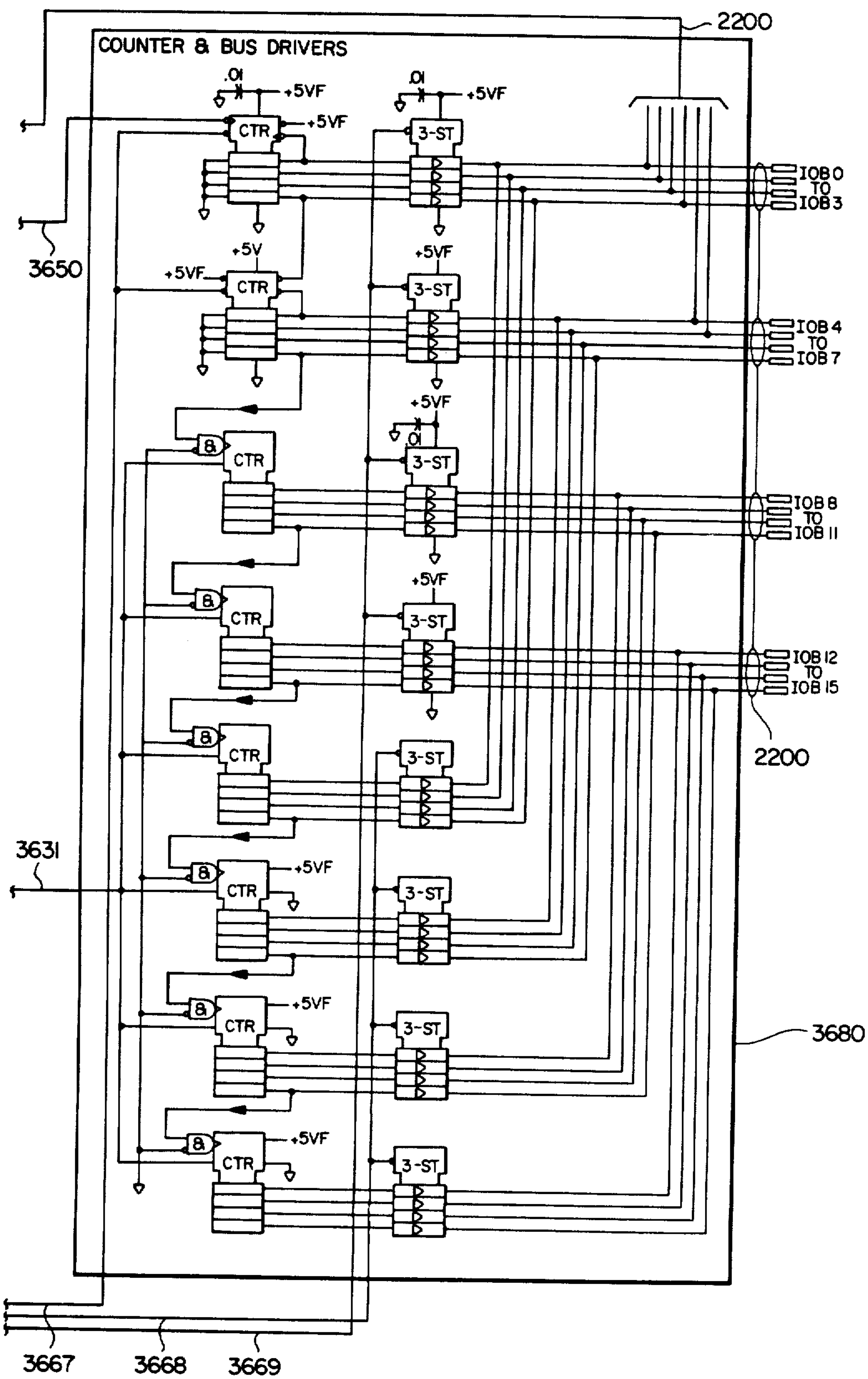
FIG_36C

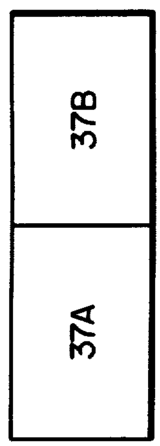
FIG_37

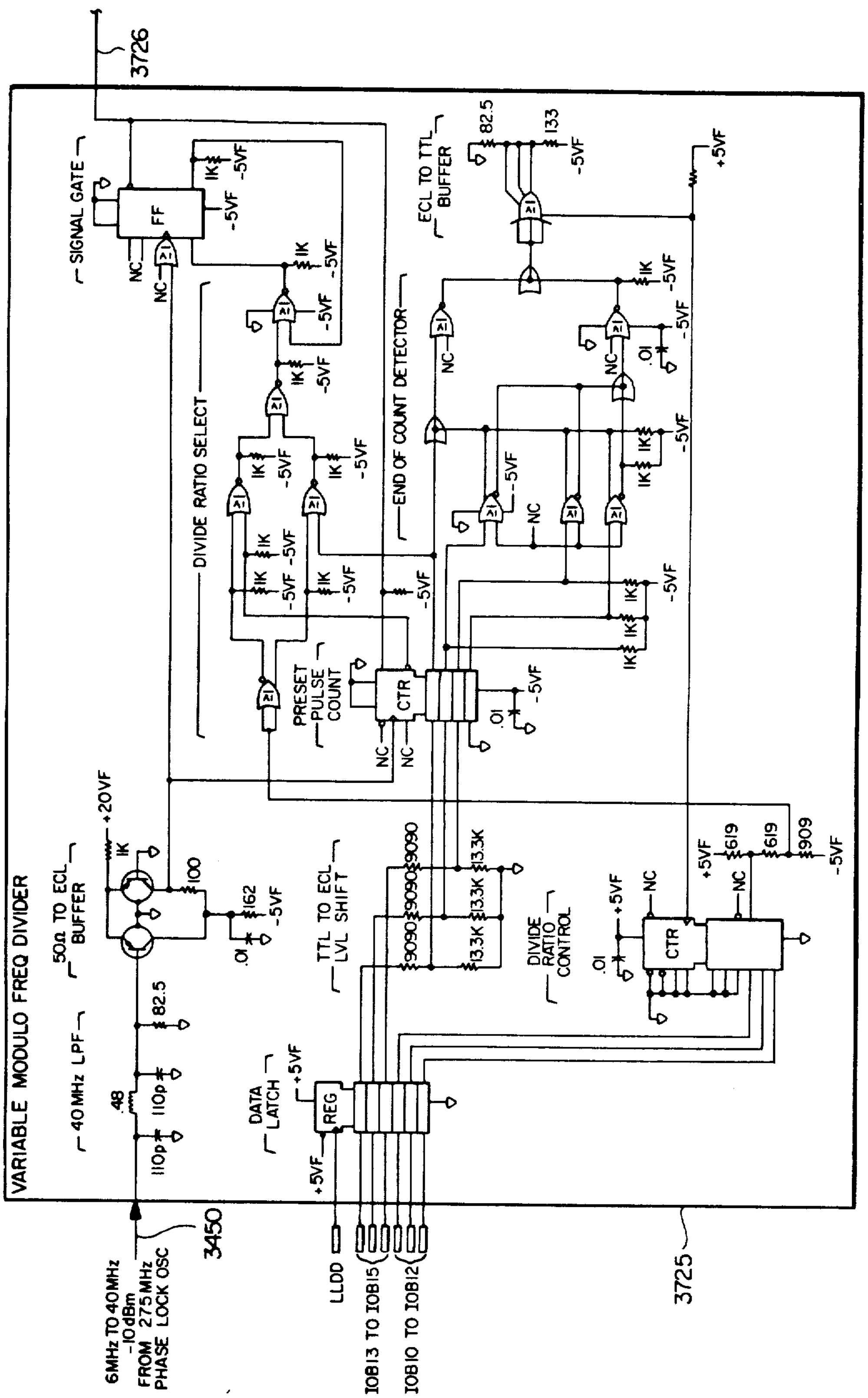
FIG_37A

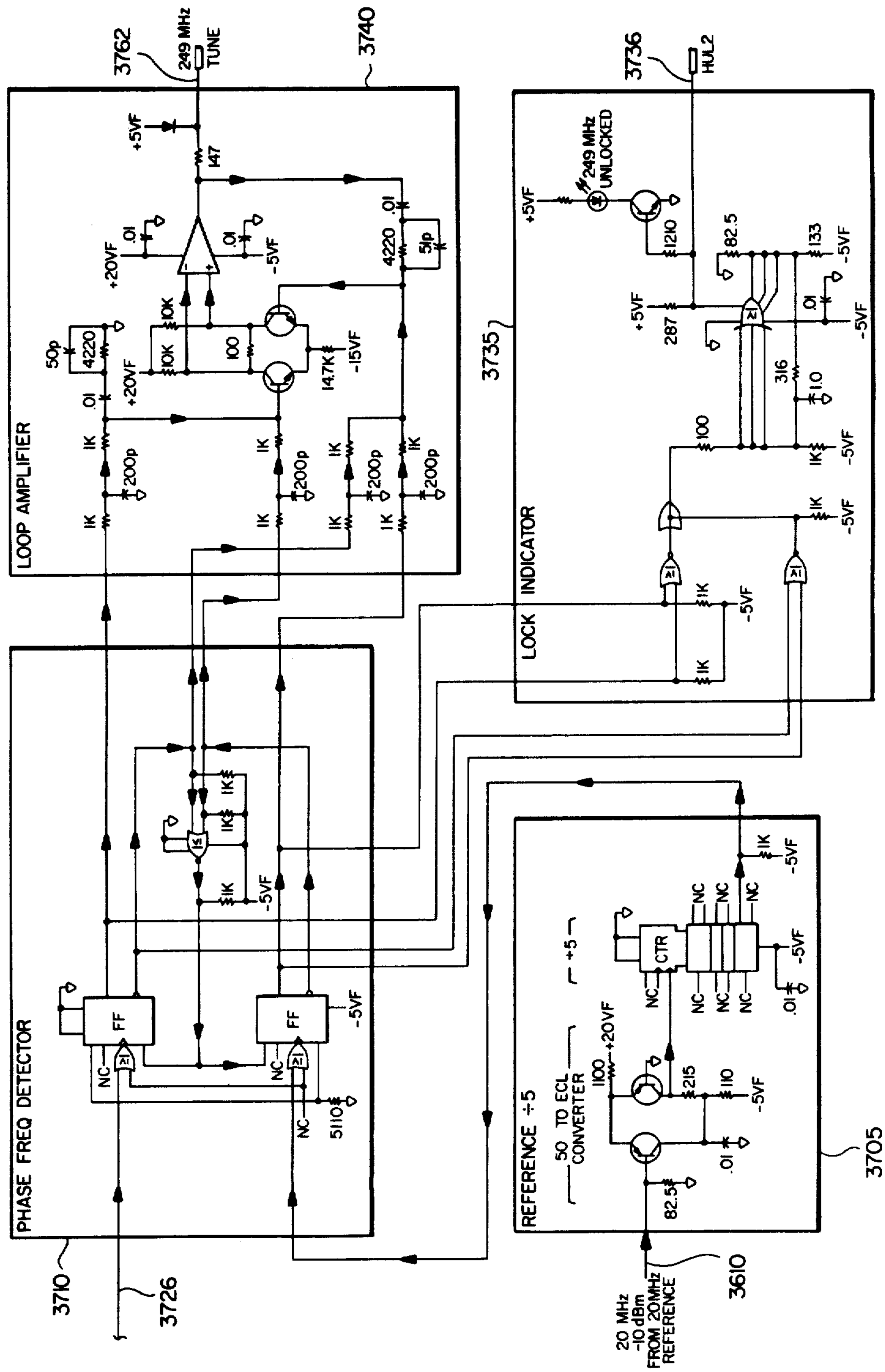
FIG_37B

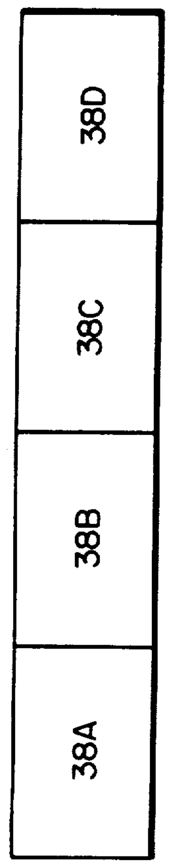
FIG__38

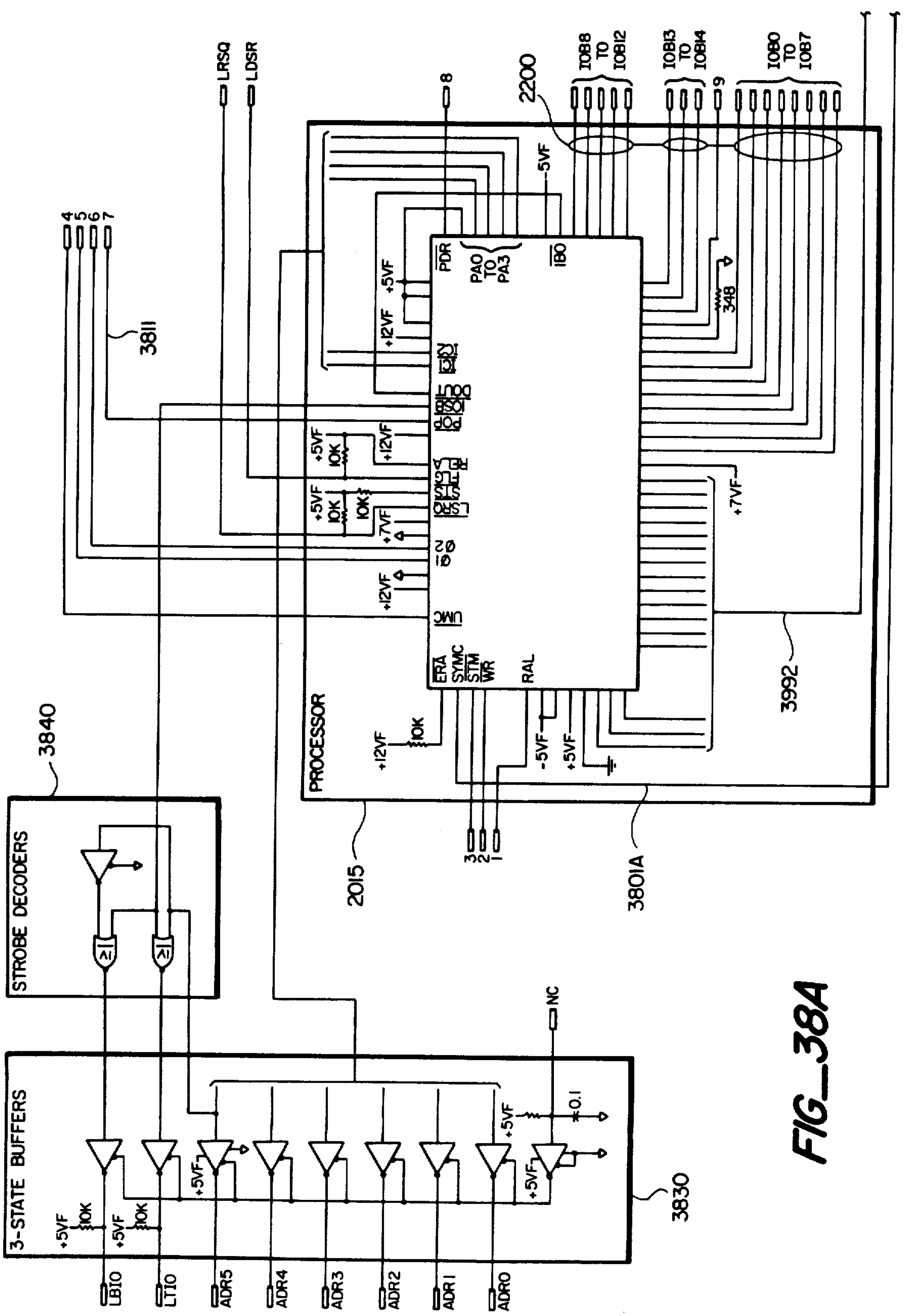
FIG_38A

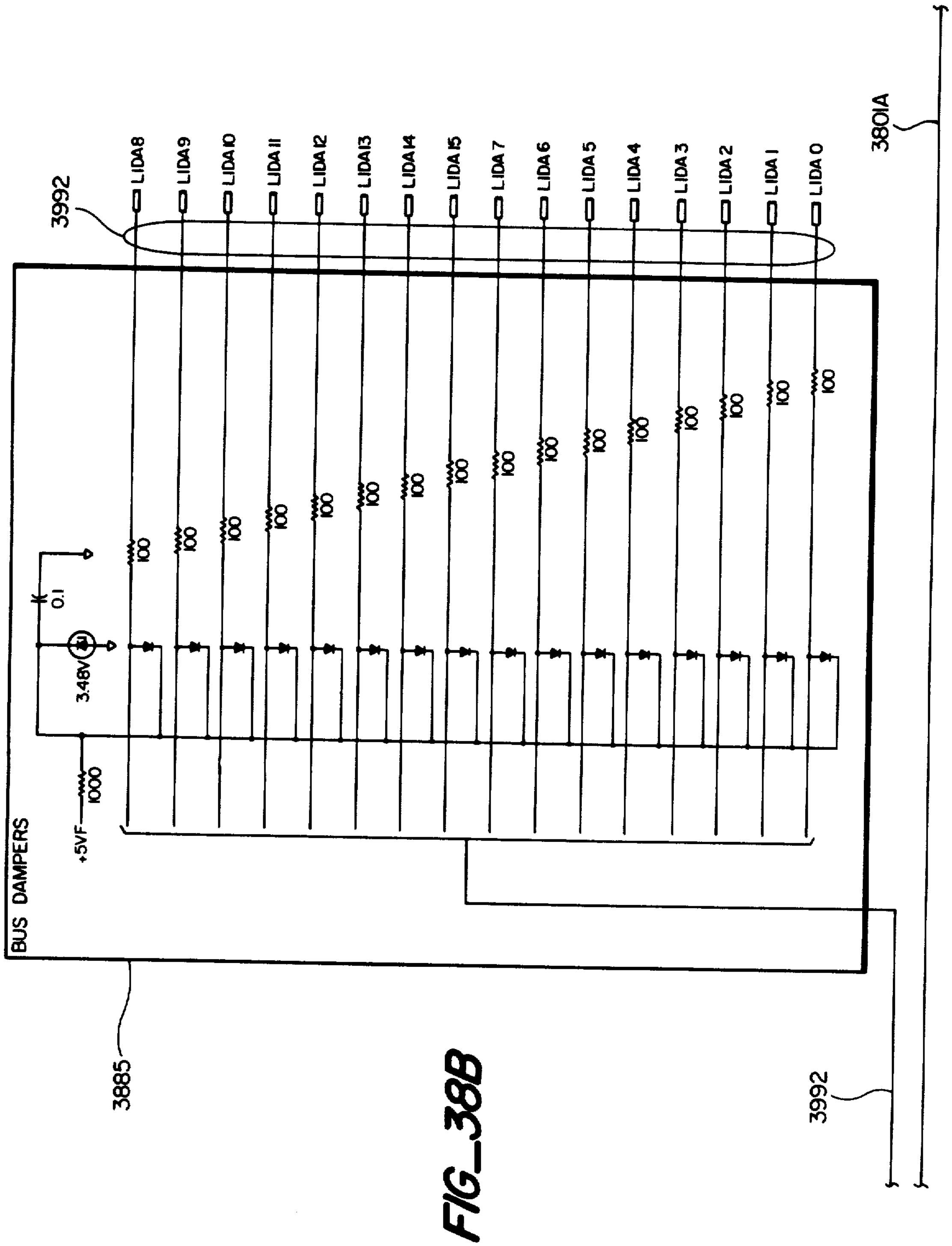
FIG_38B

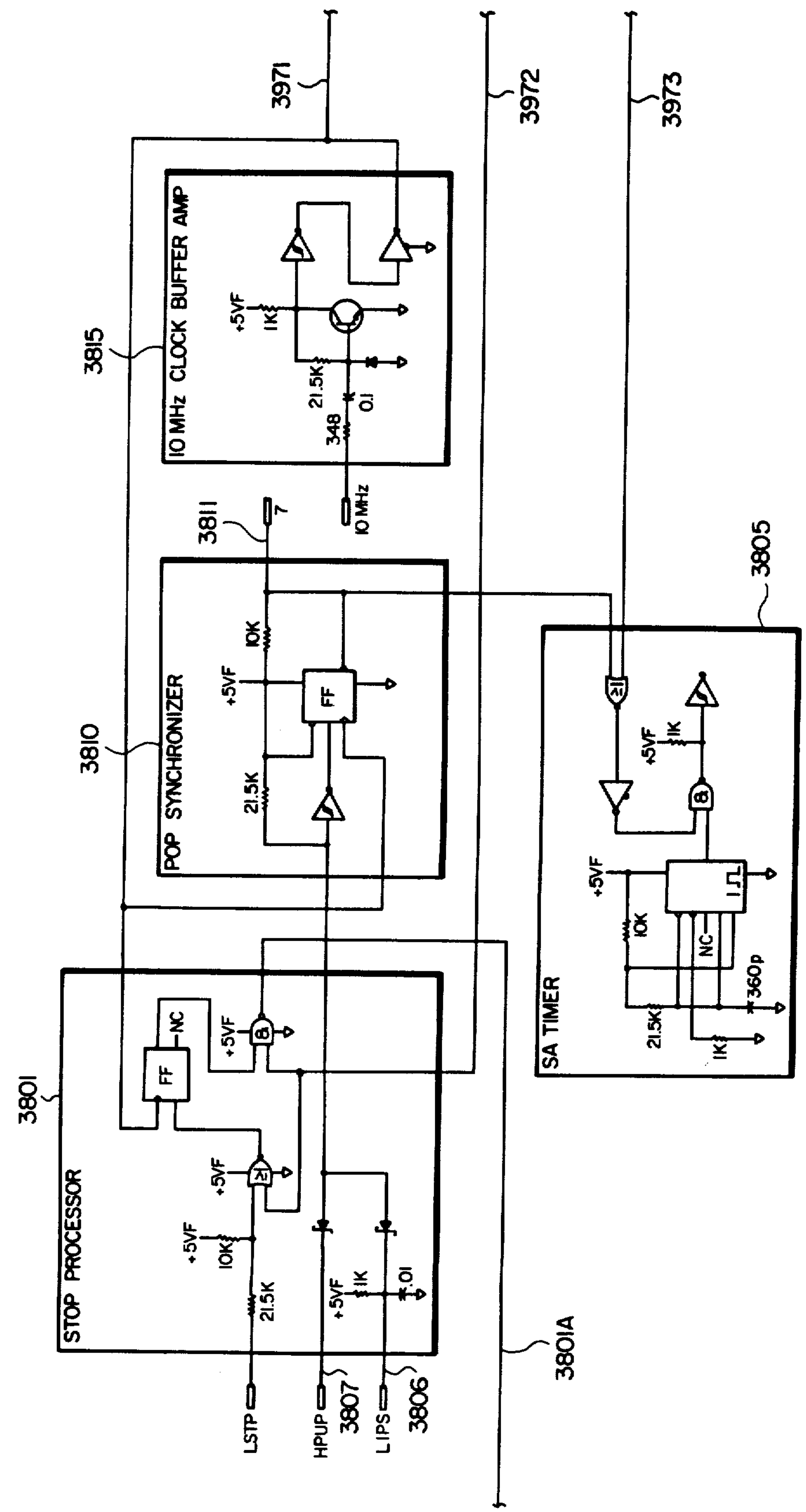
FIG_38C

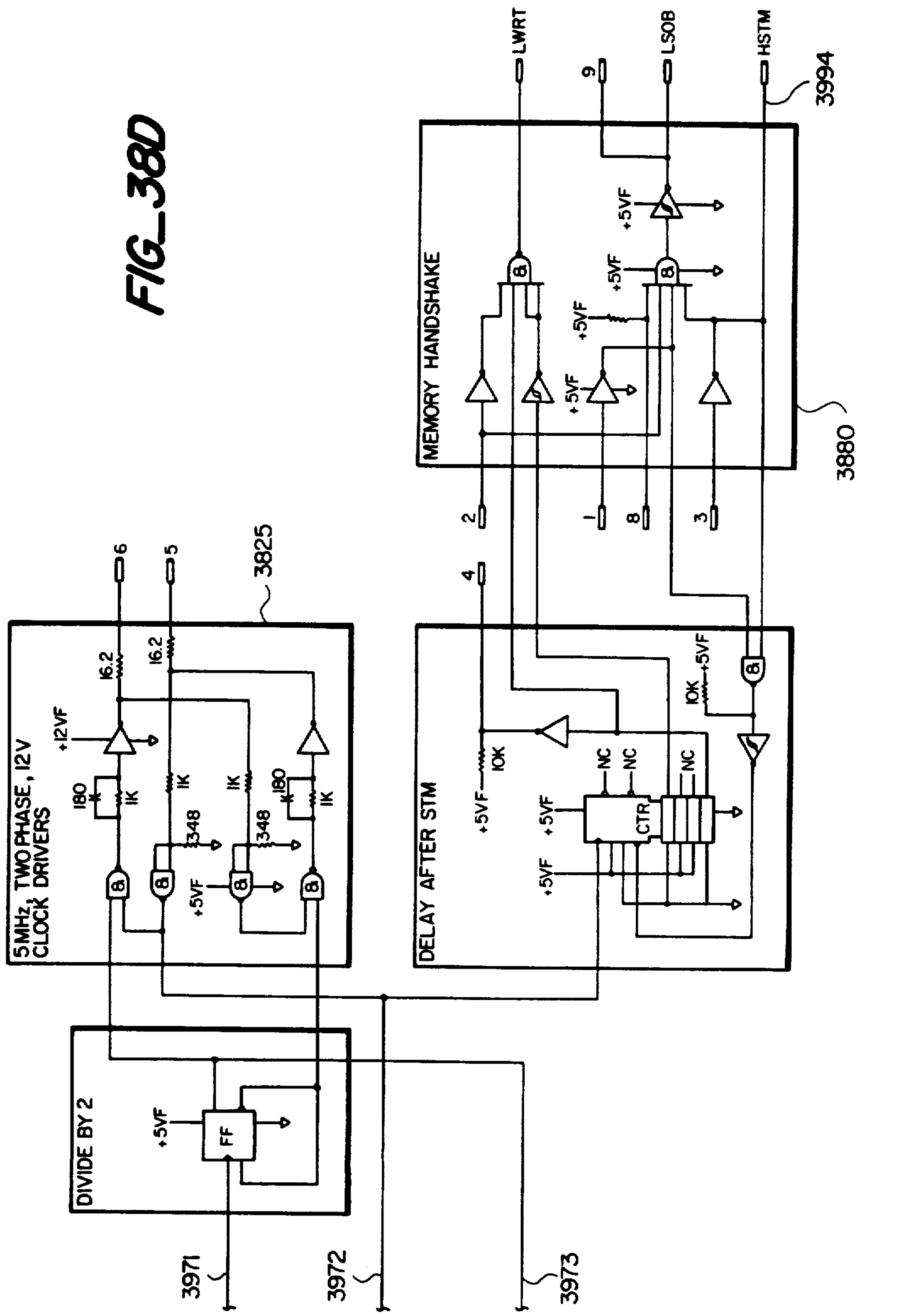
FIG_38D

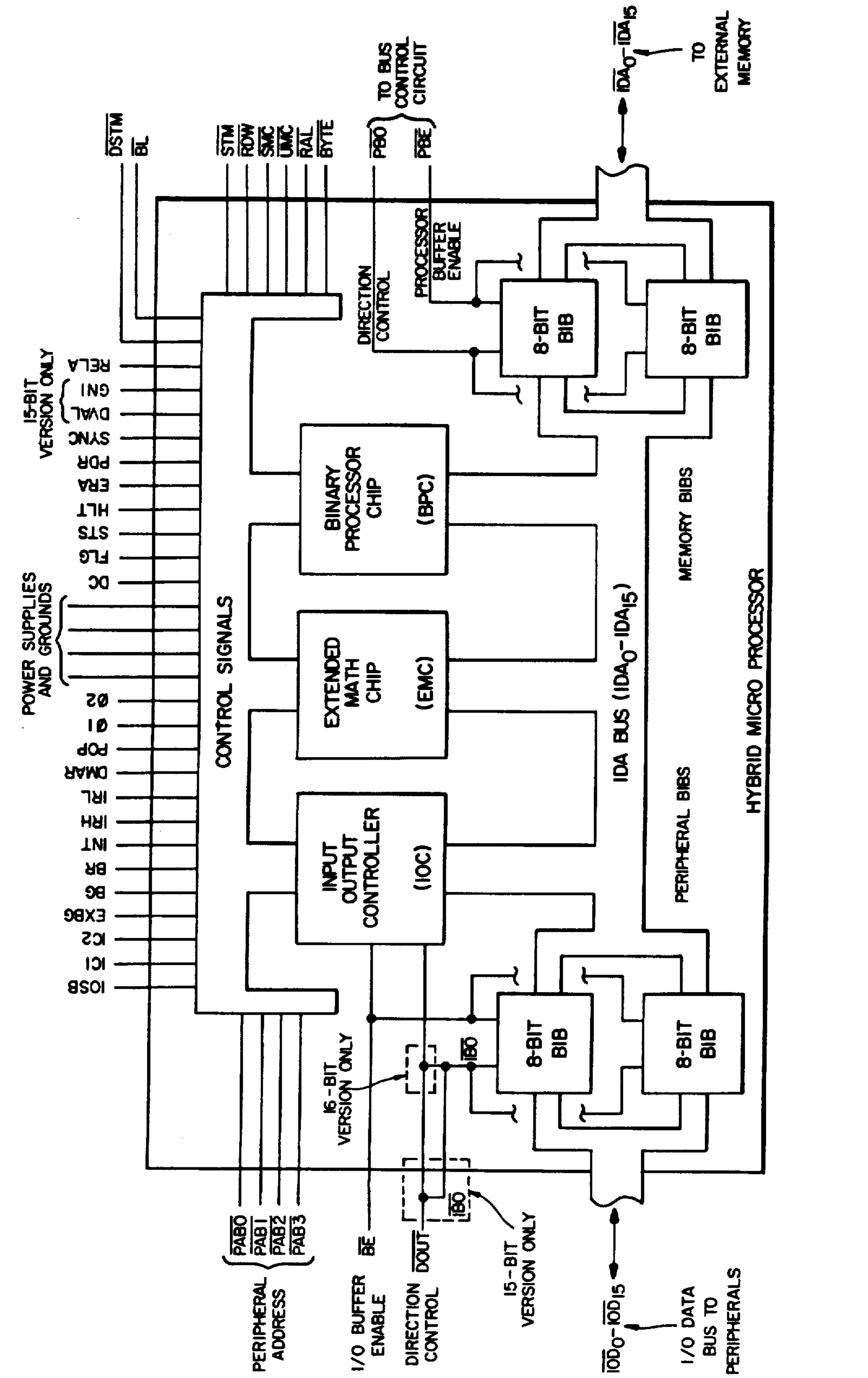
FIG_39

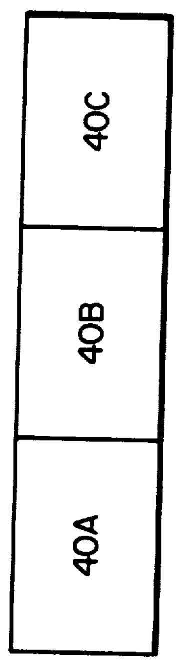
FIG_40

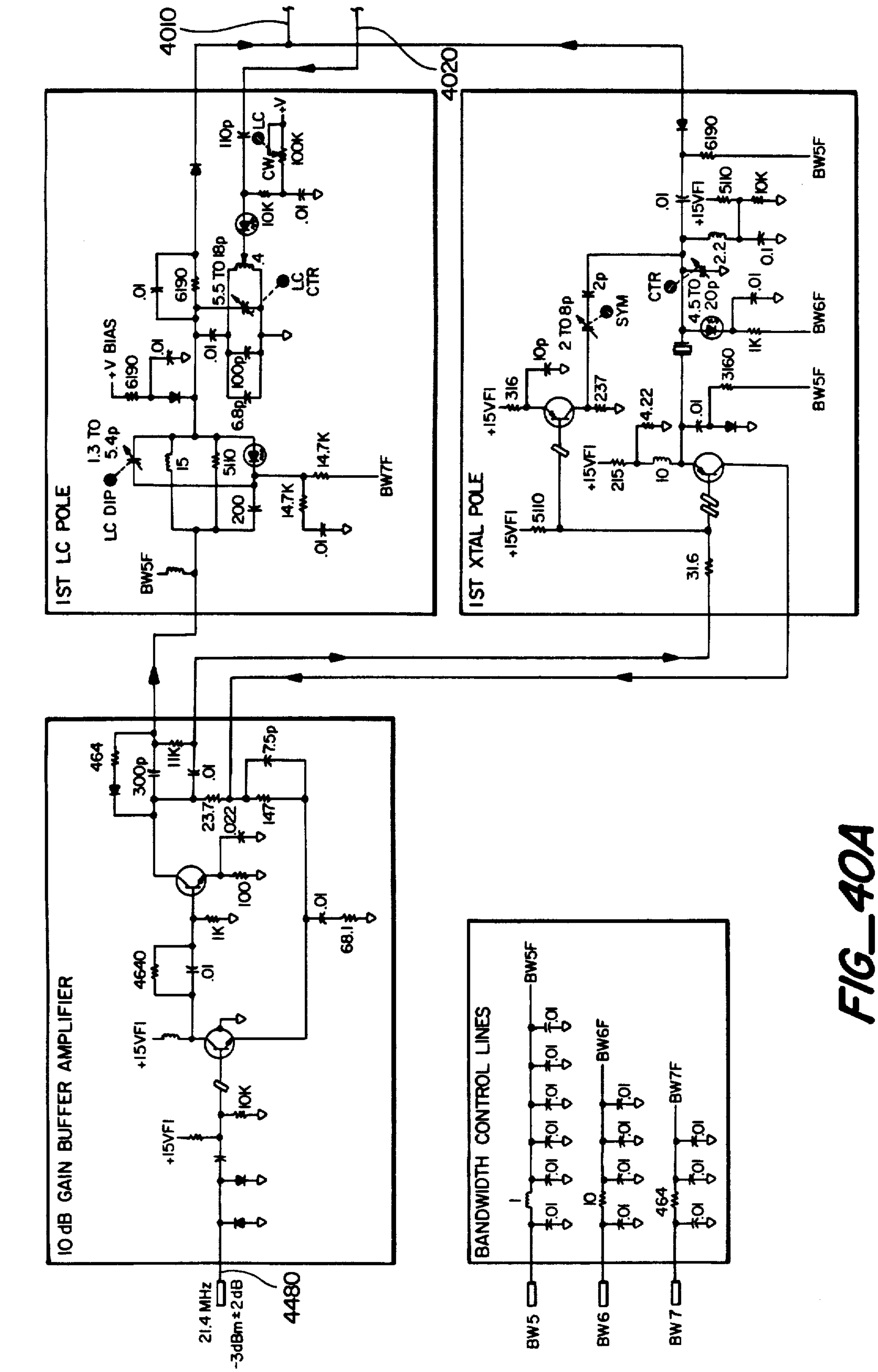
FIG_40A

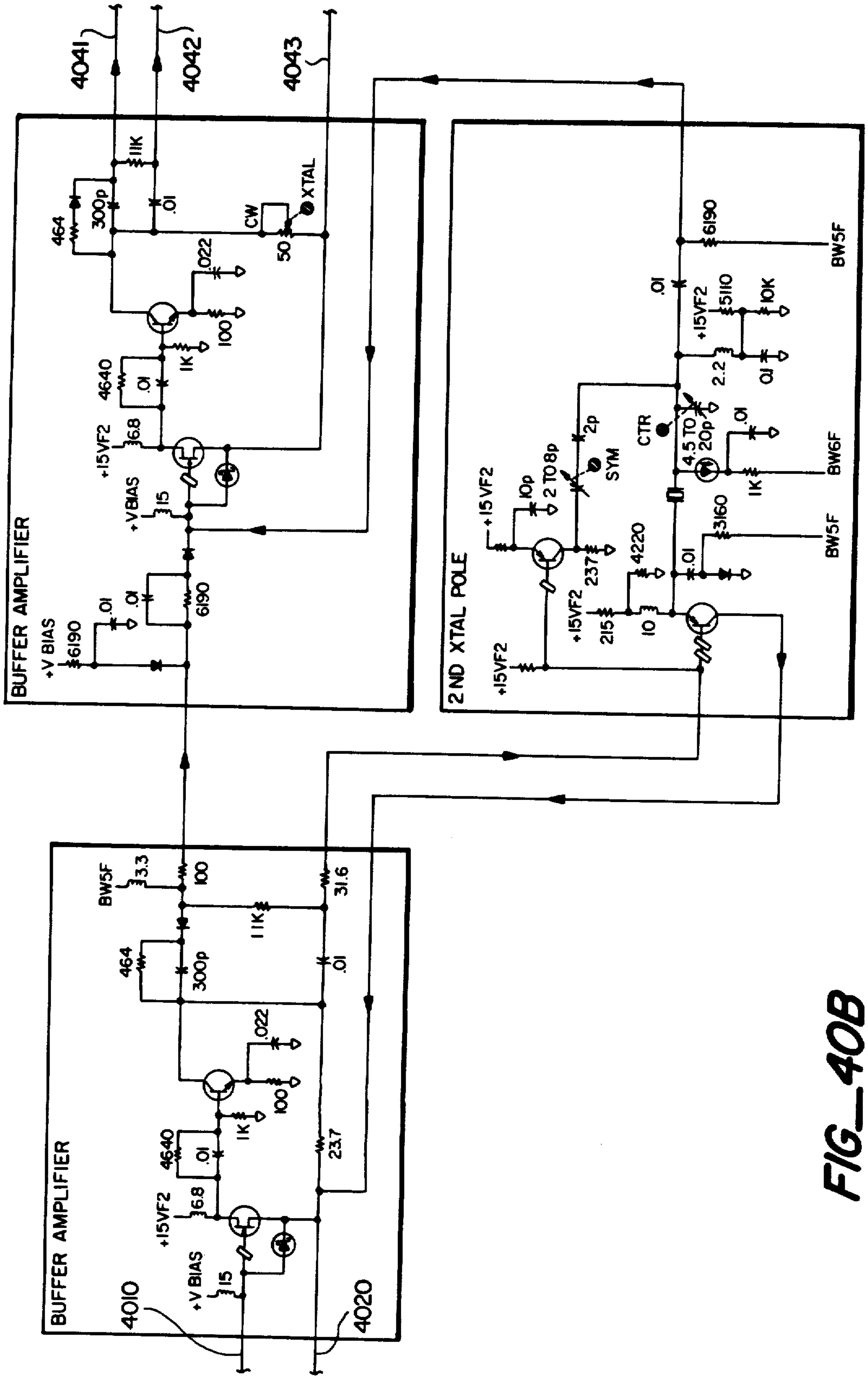
FIG_40B

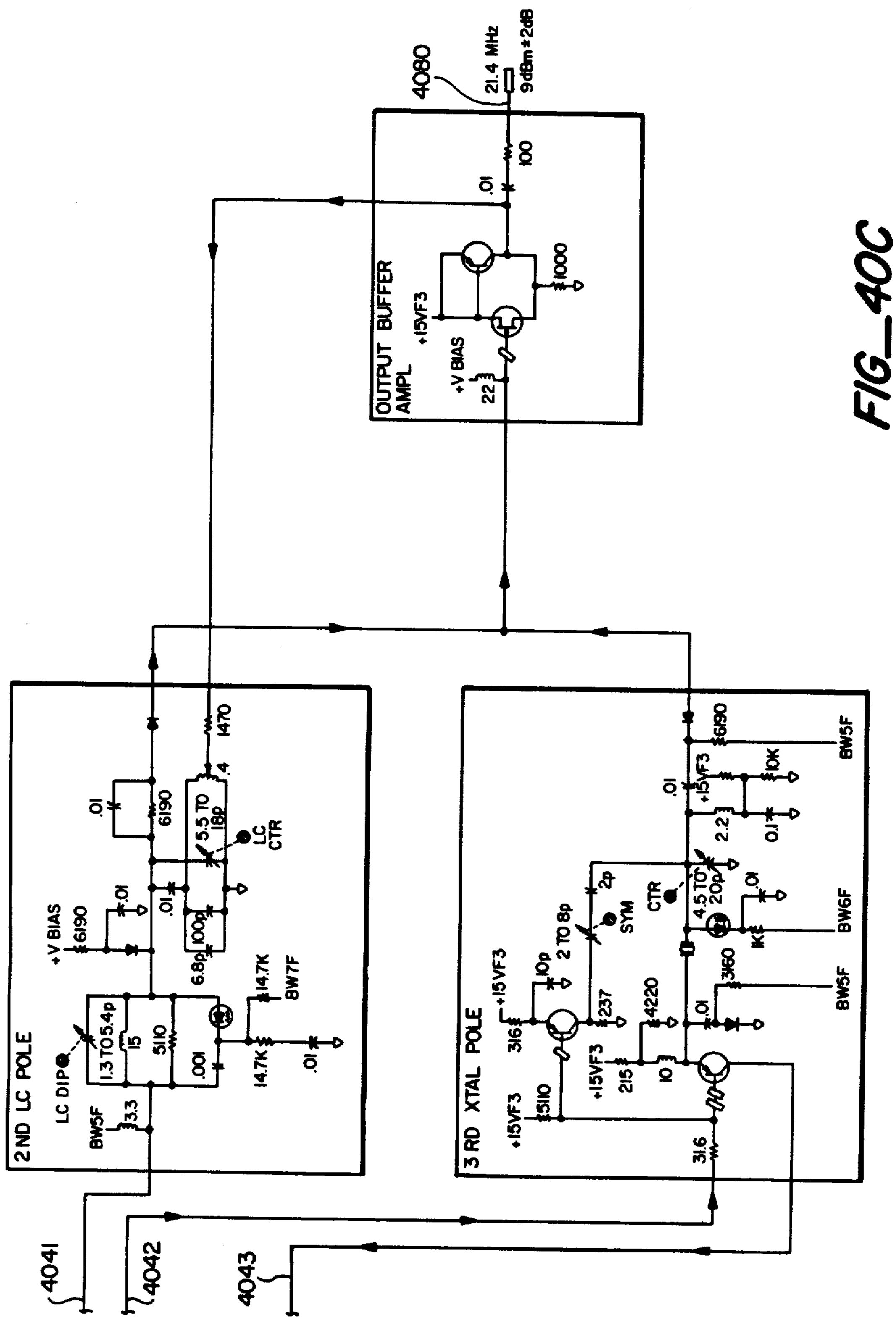
FIG_40C

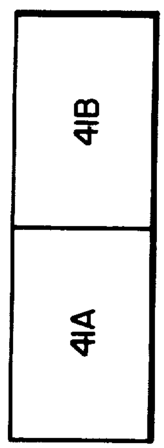
FIG._41

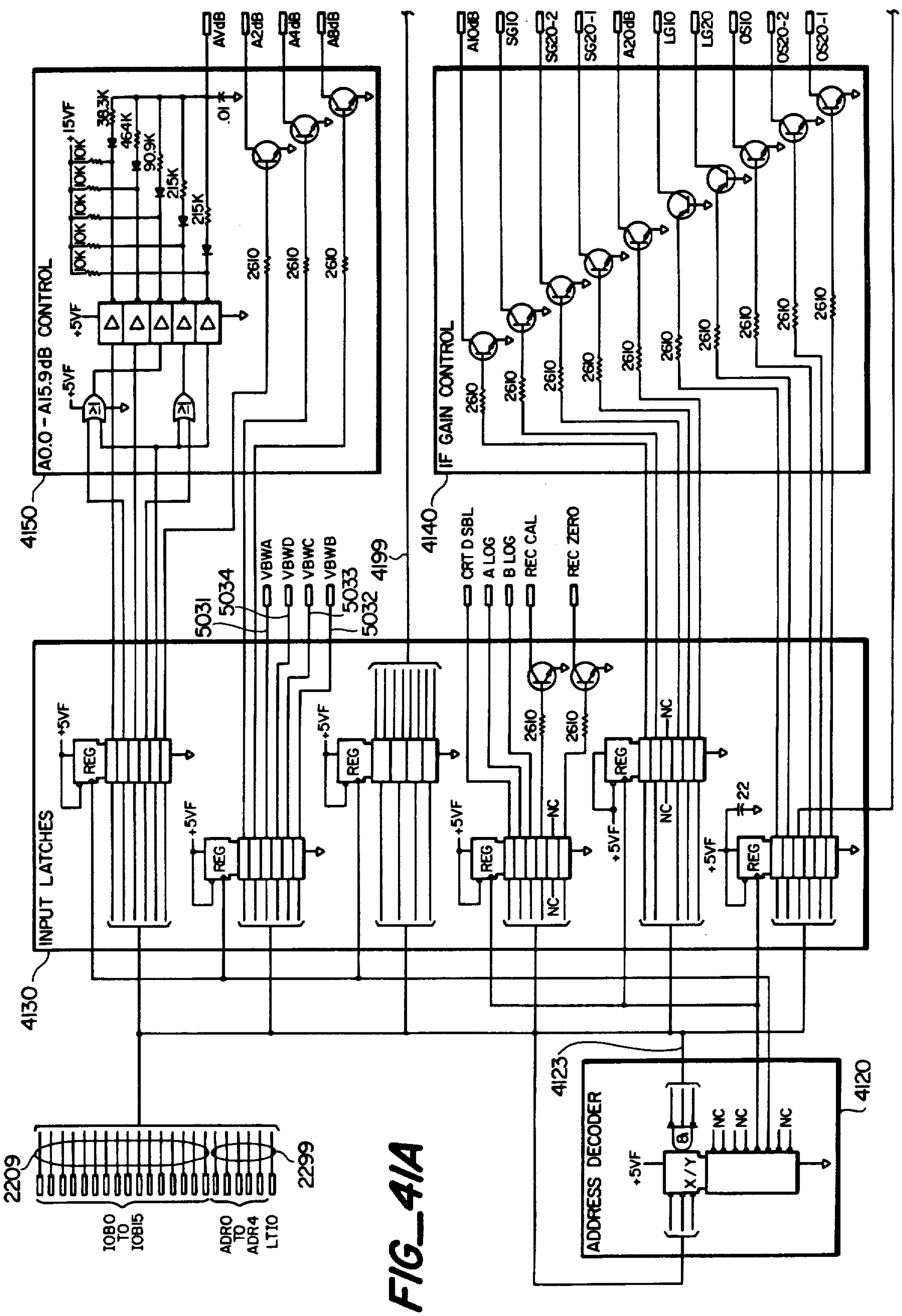
FIG_41A

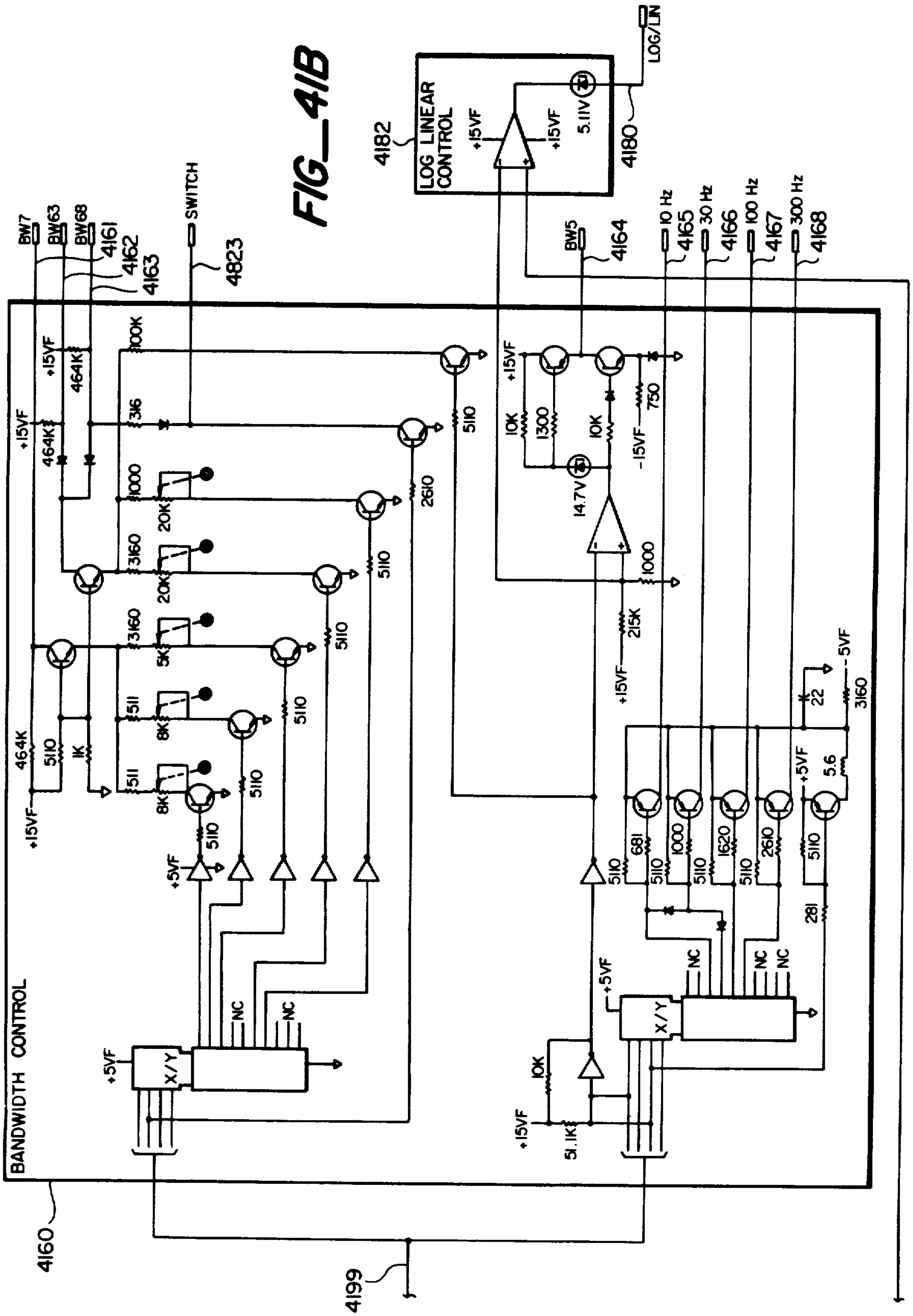
FIG_41B
BANDWIDTH CONTROL
LOG LINEAR CONTROL
LOG/LIN
SWITCH
BW7
BW63
BW68
BW5
10 Hz
30 Hz
100 Hz
300 Hz
X/Y
NC
4160
4161
4162
4163
4164
4165
4166
4167
4168
4180
4182
4199
4823

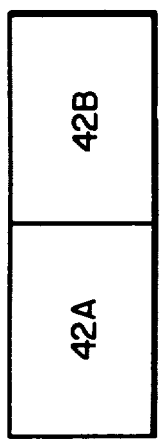
FIG_42

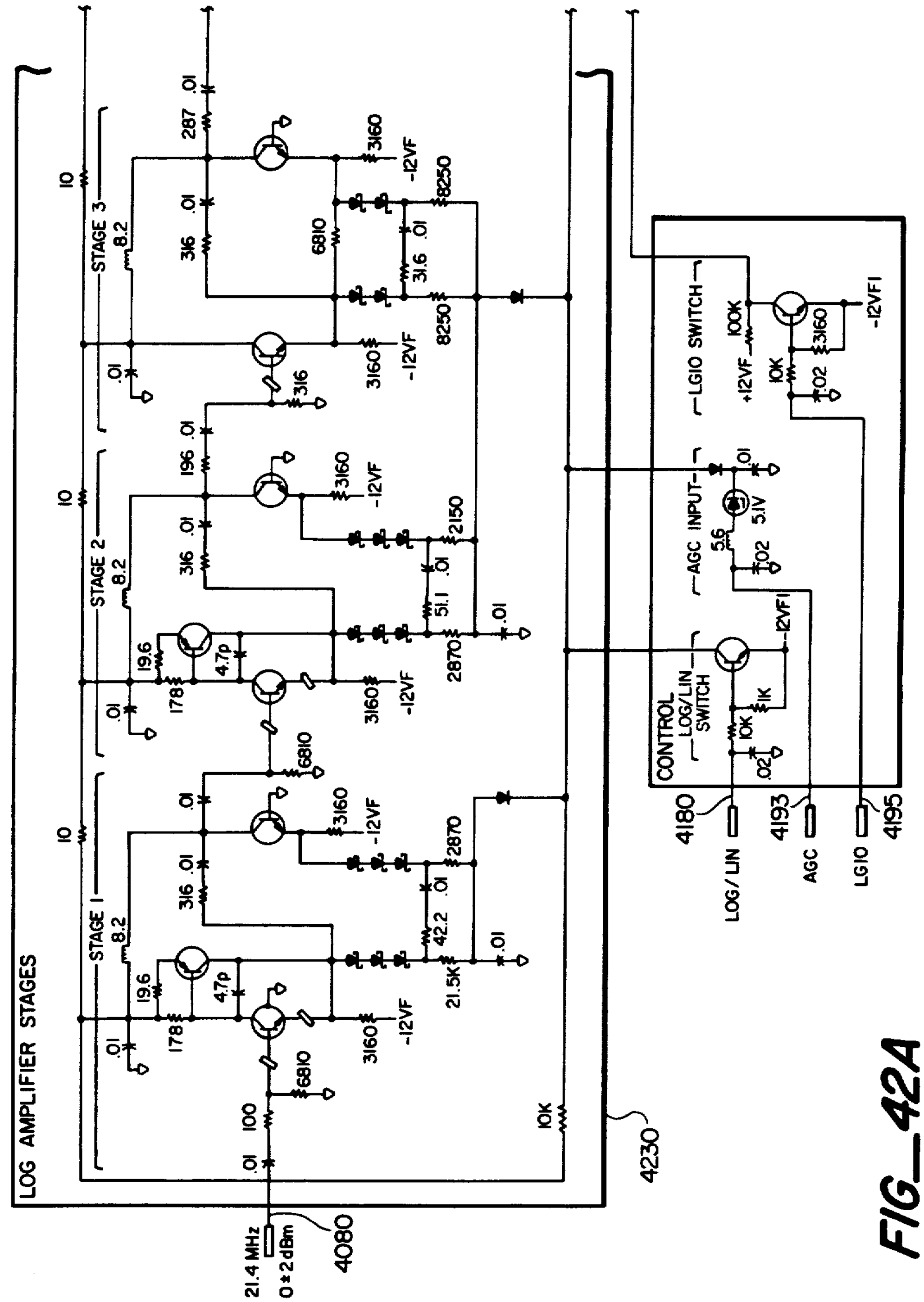
FIG_42A

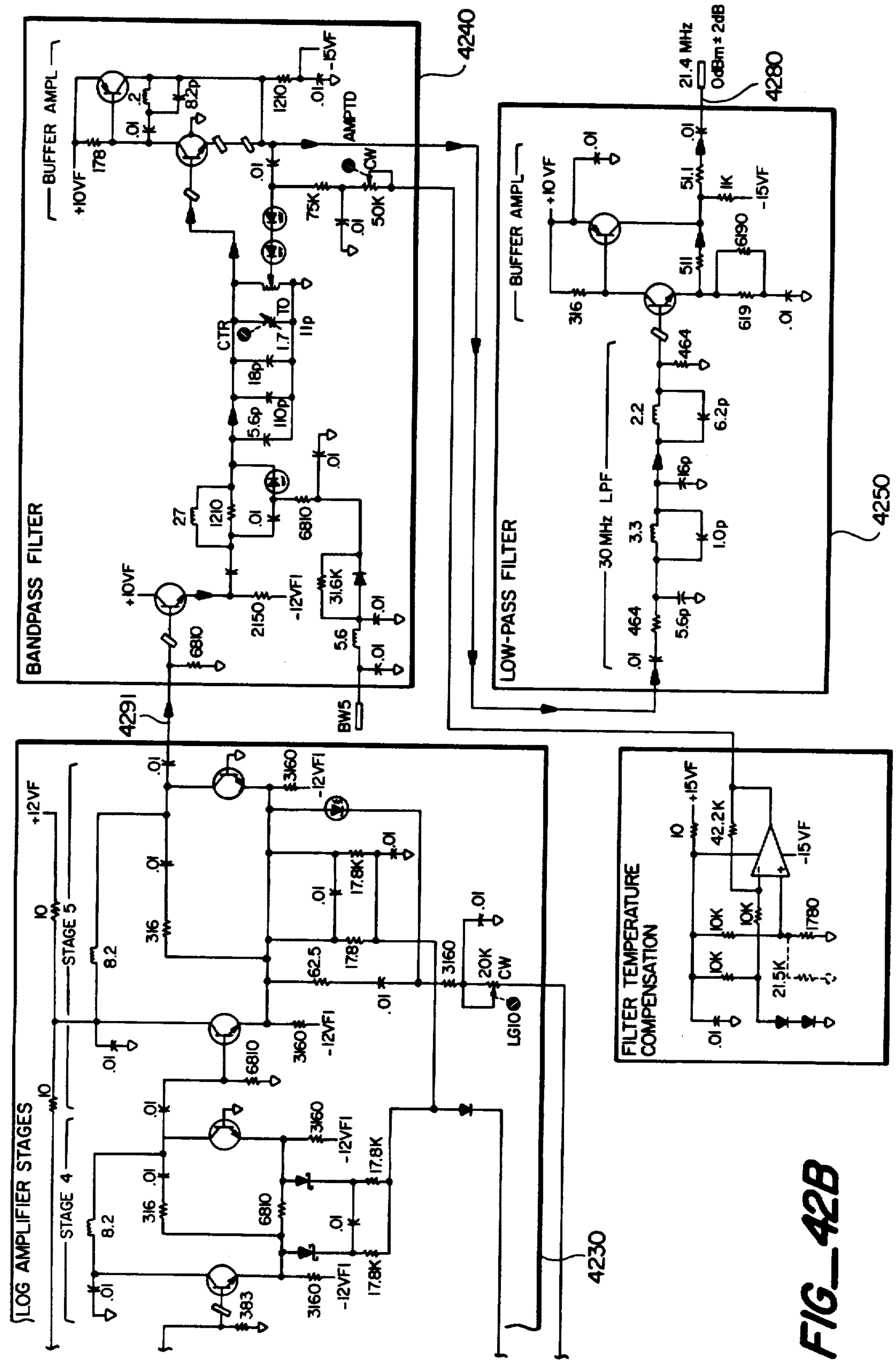
FIG_42B

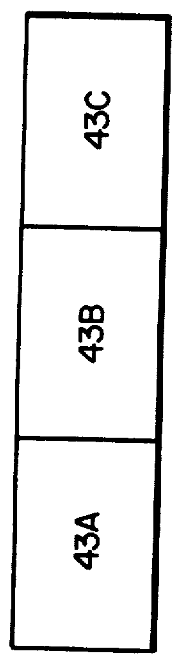
FIG_43

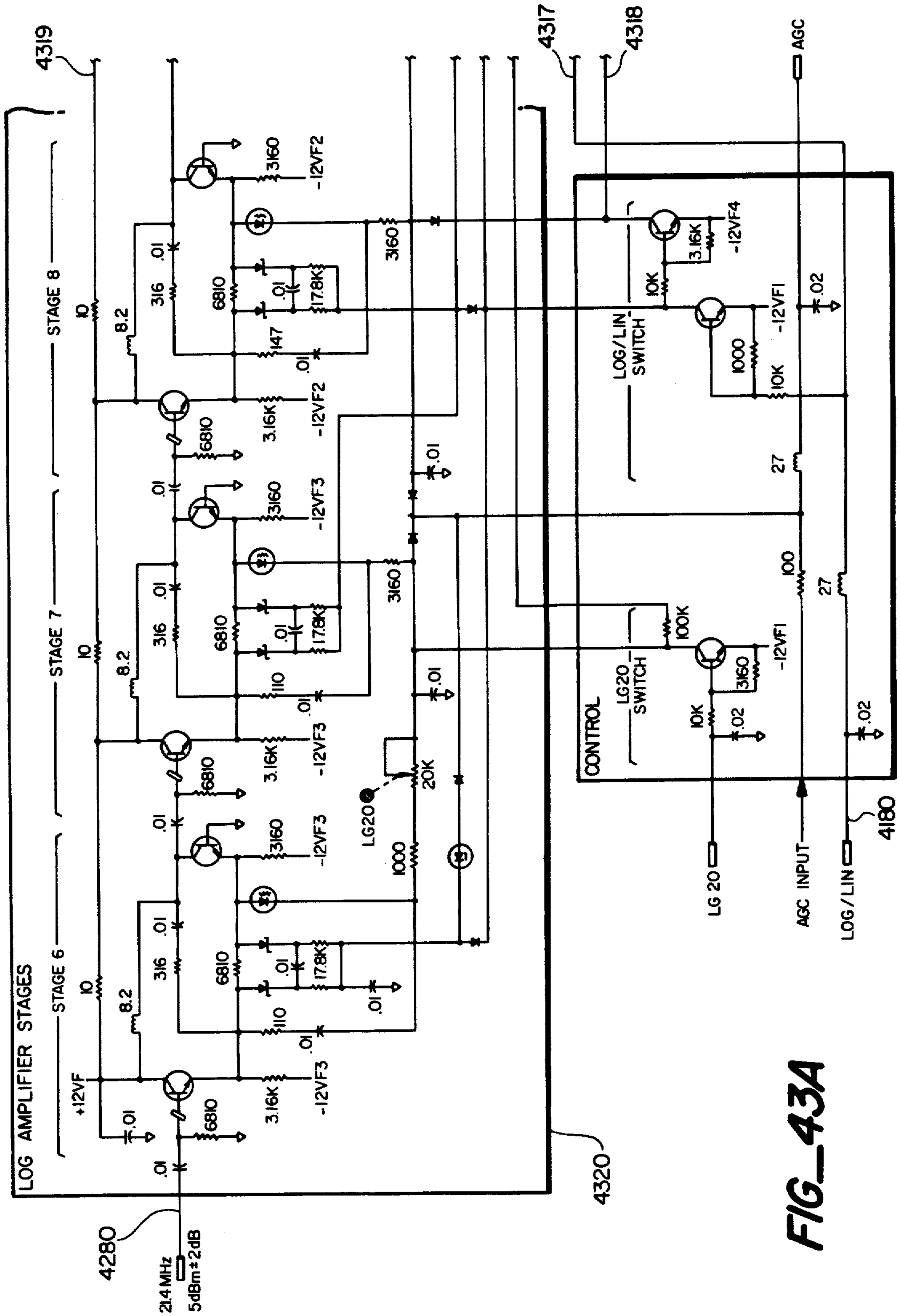
FIG_43A

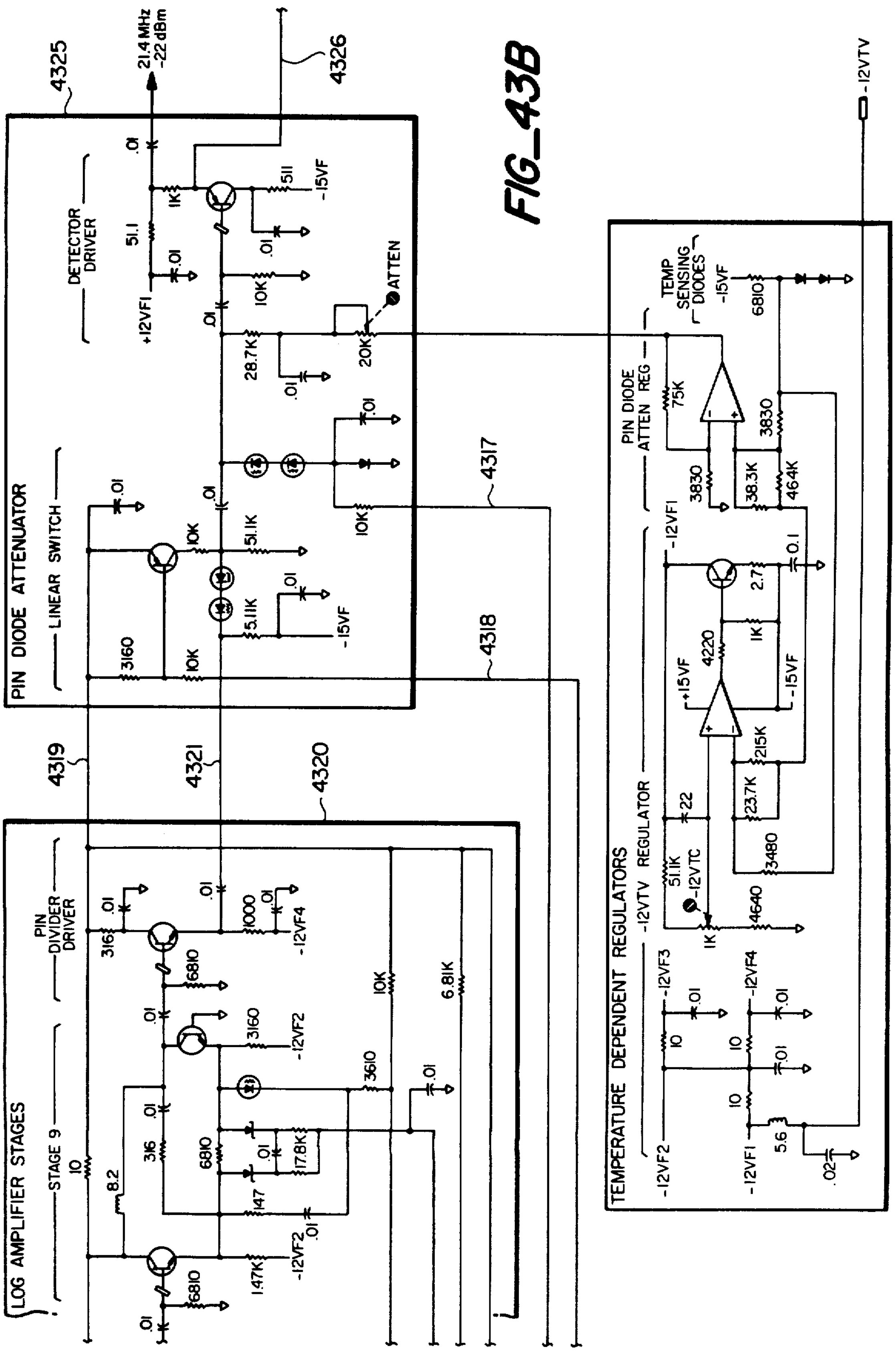
FIG_43B

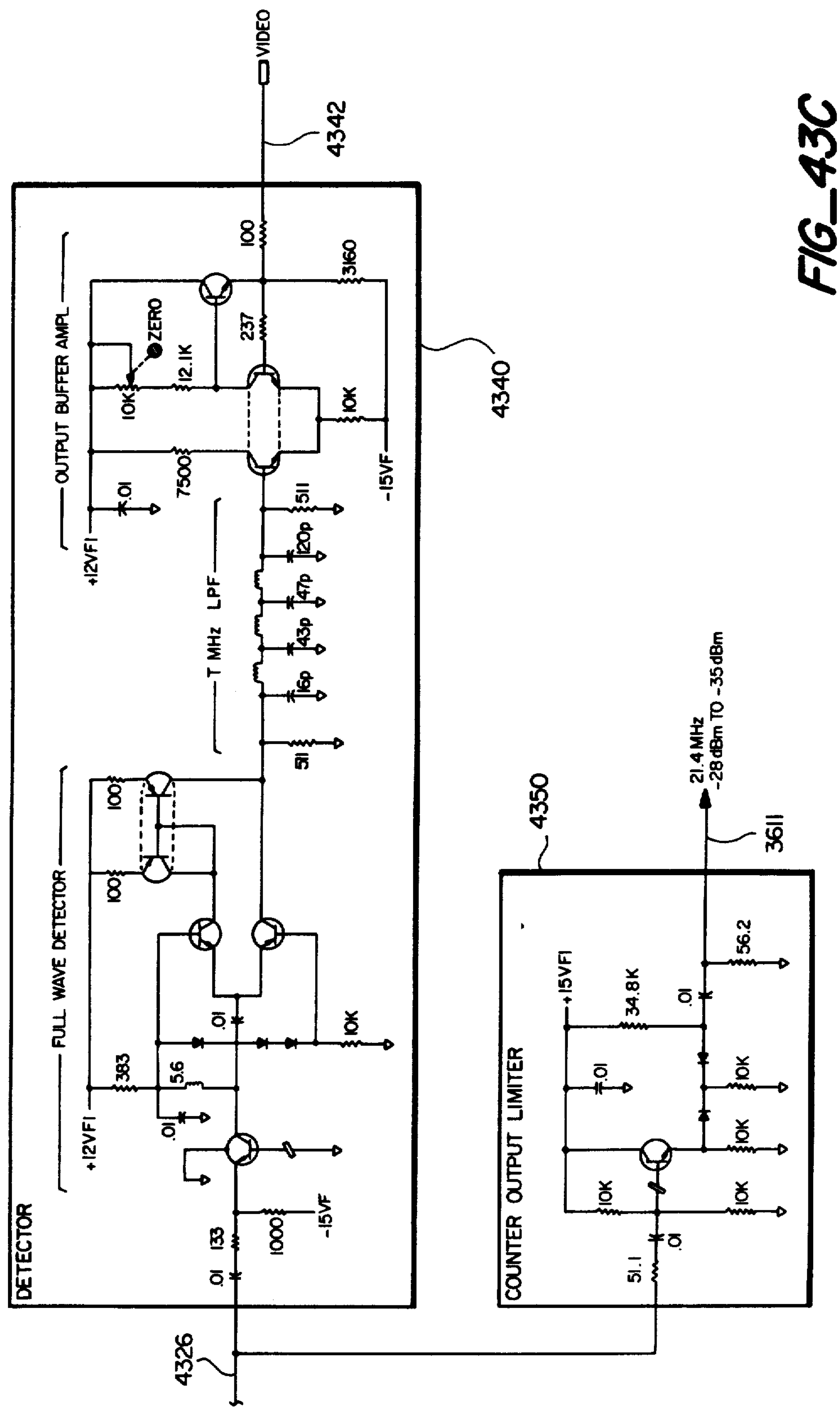
FIG_43C

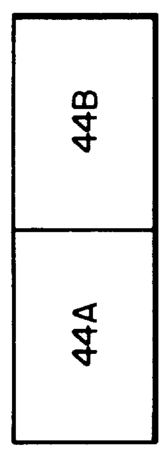
FIG_44

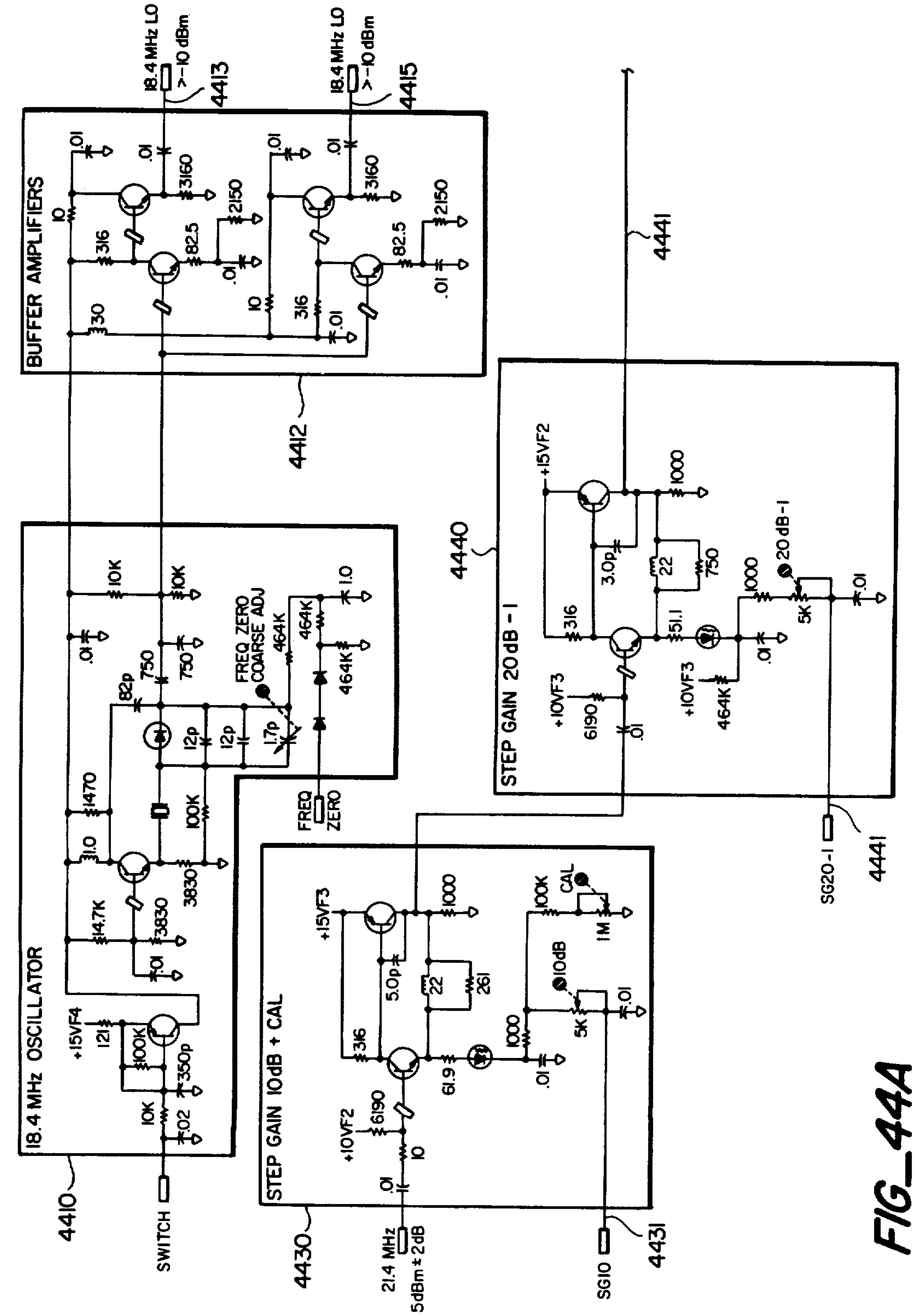
FIG_44A

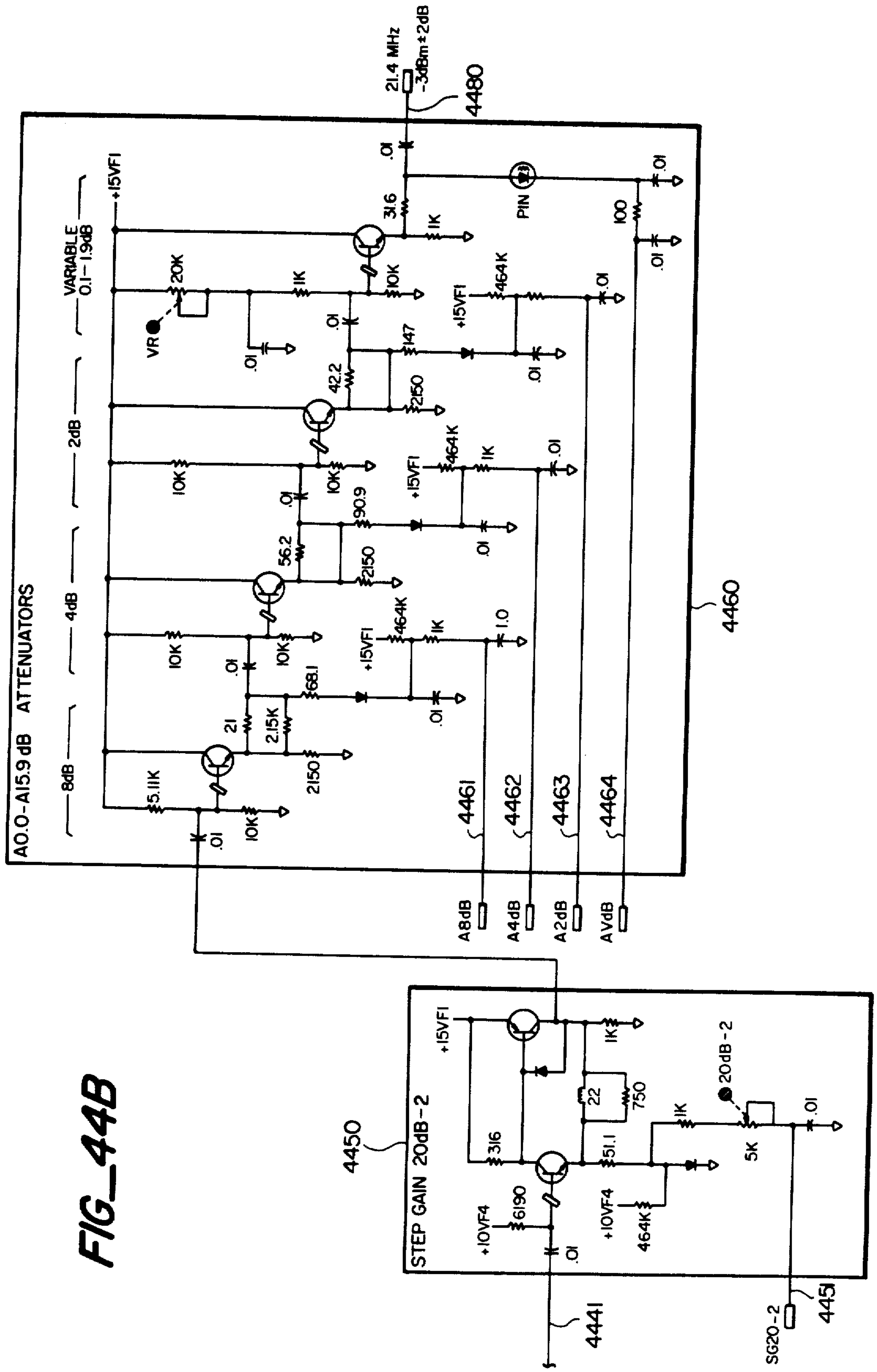
FIG_44B

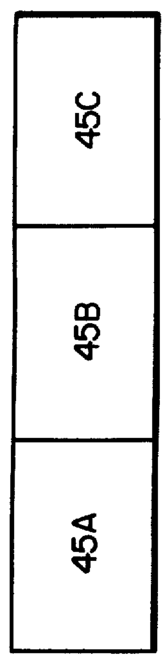
FIG_45

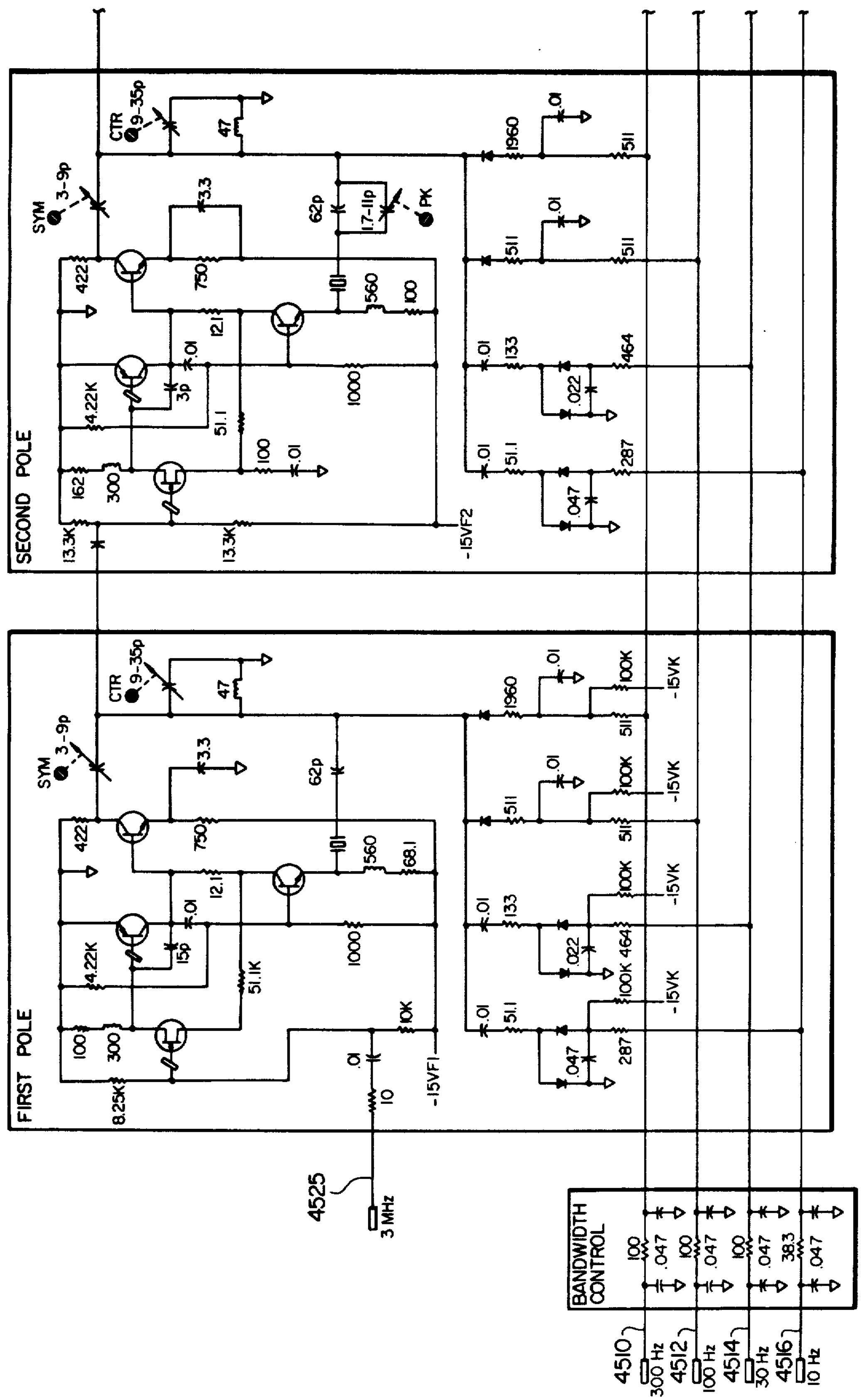
FIG_45A

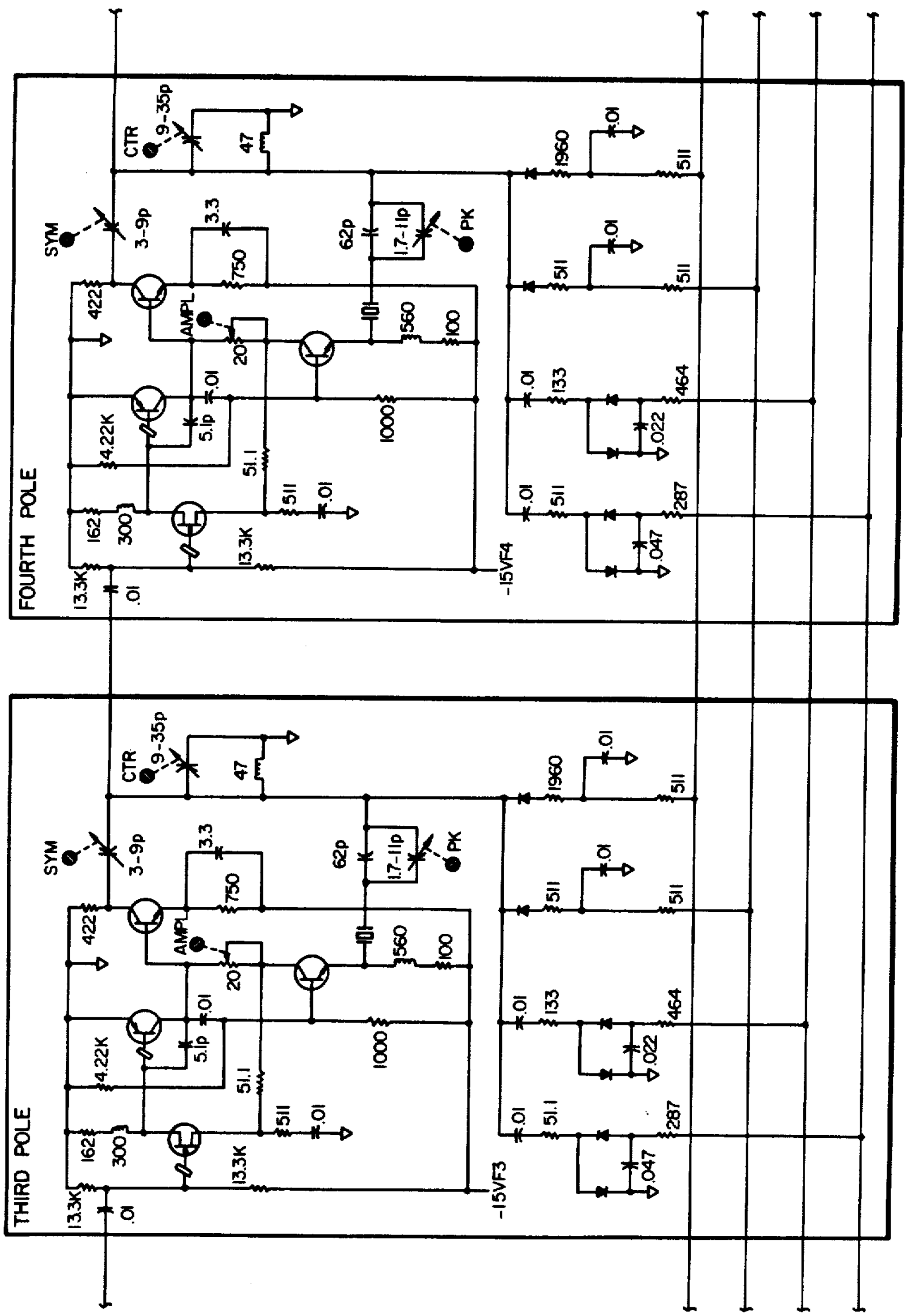
FIG__45B

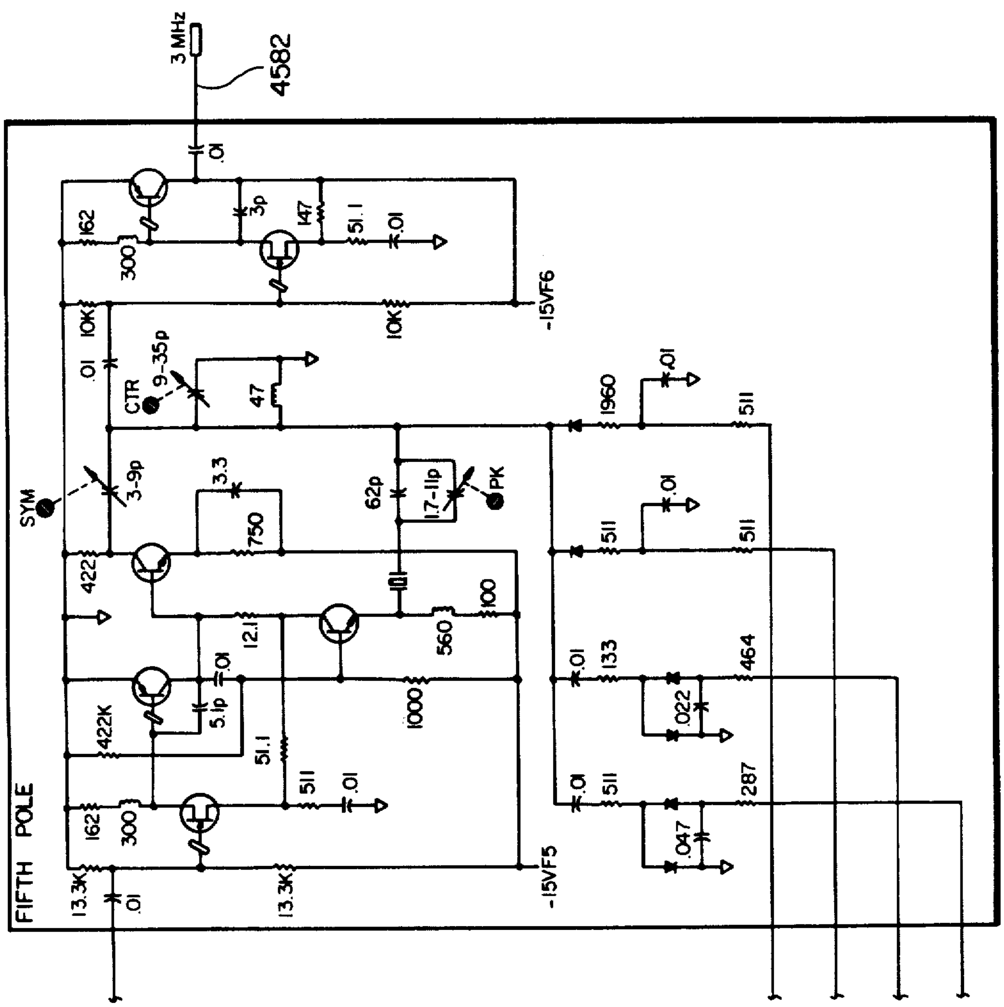
FIG_45C

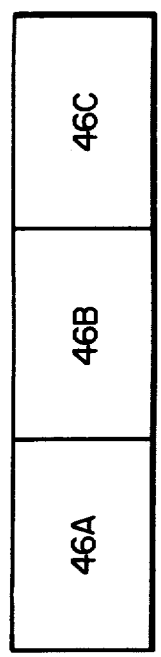
FIG_46

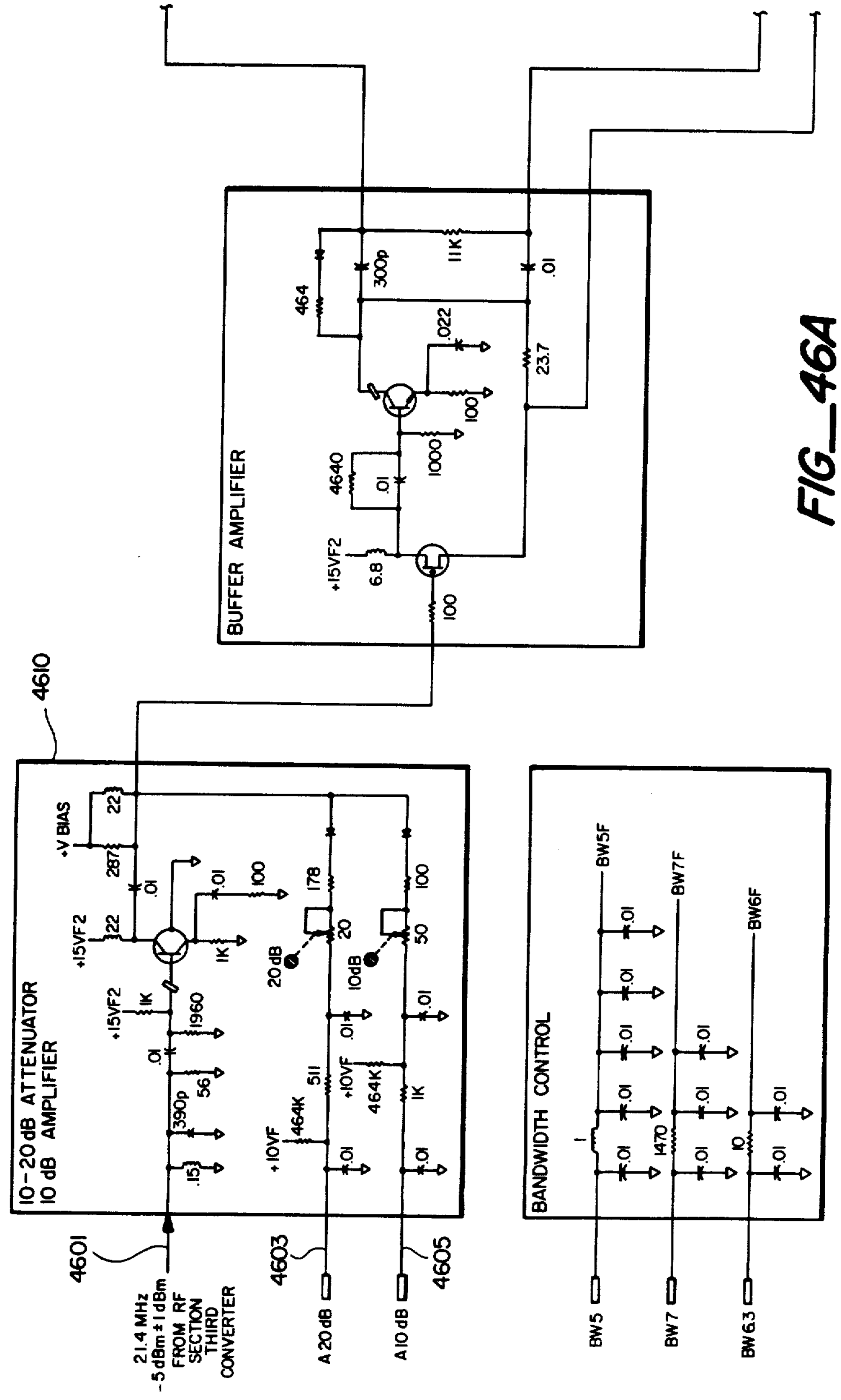
FIG_46A

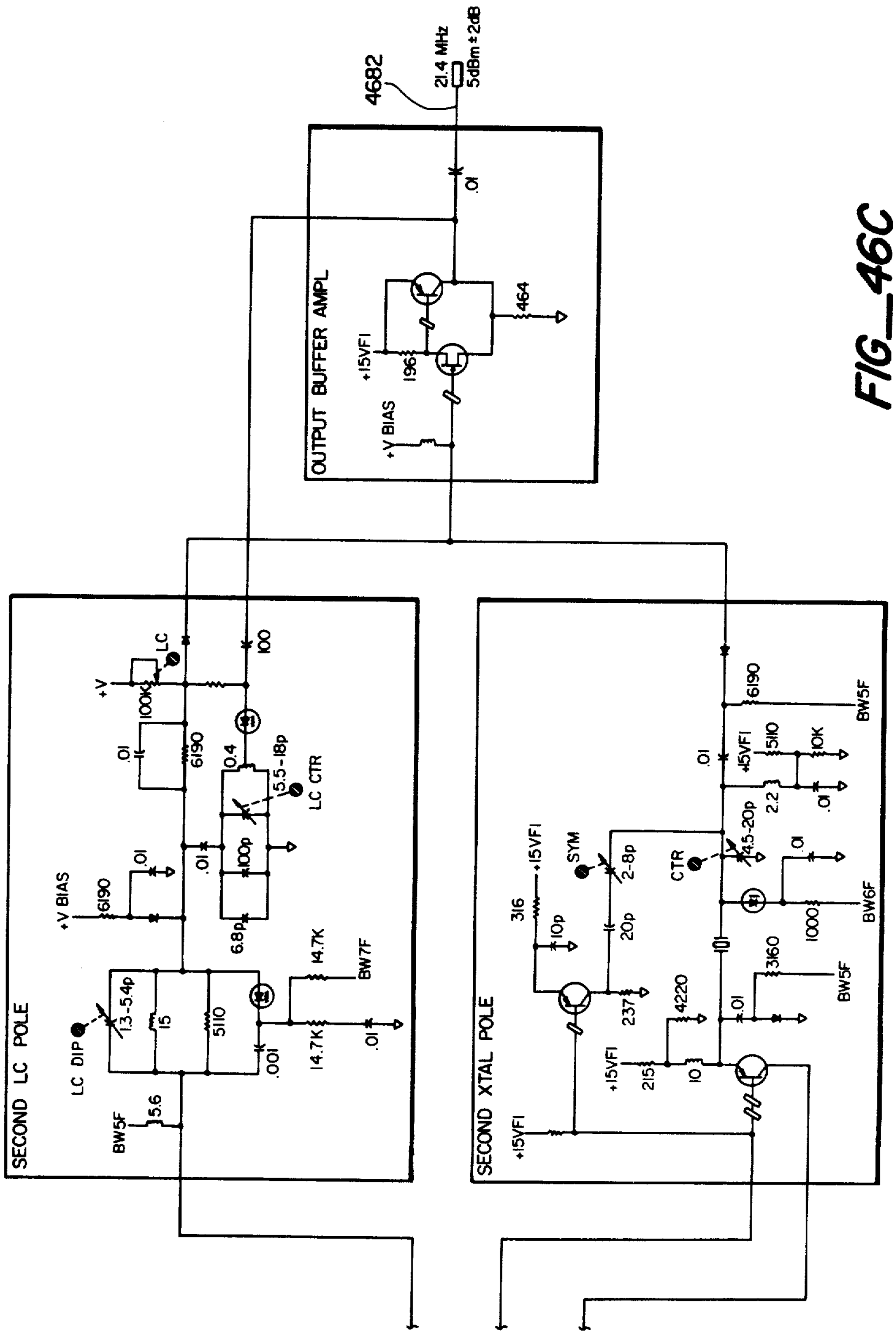
FIG_46C

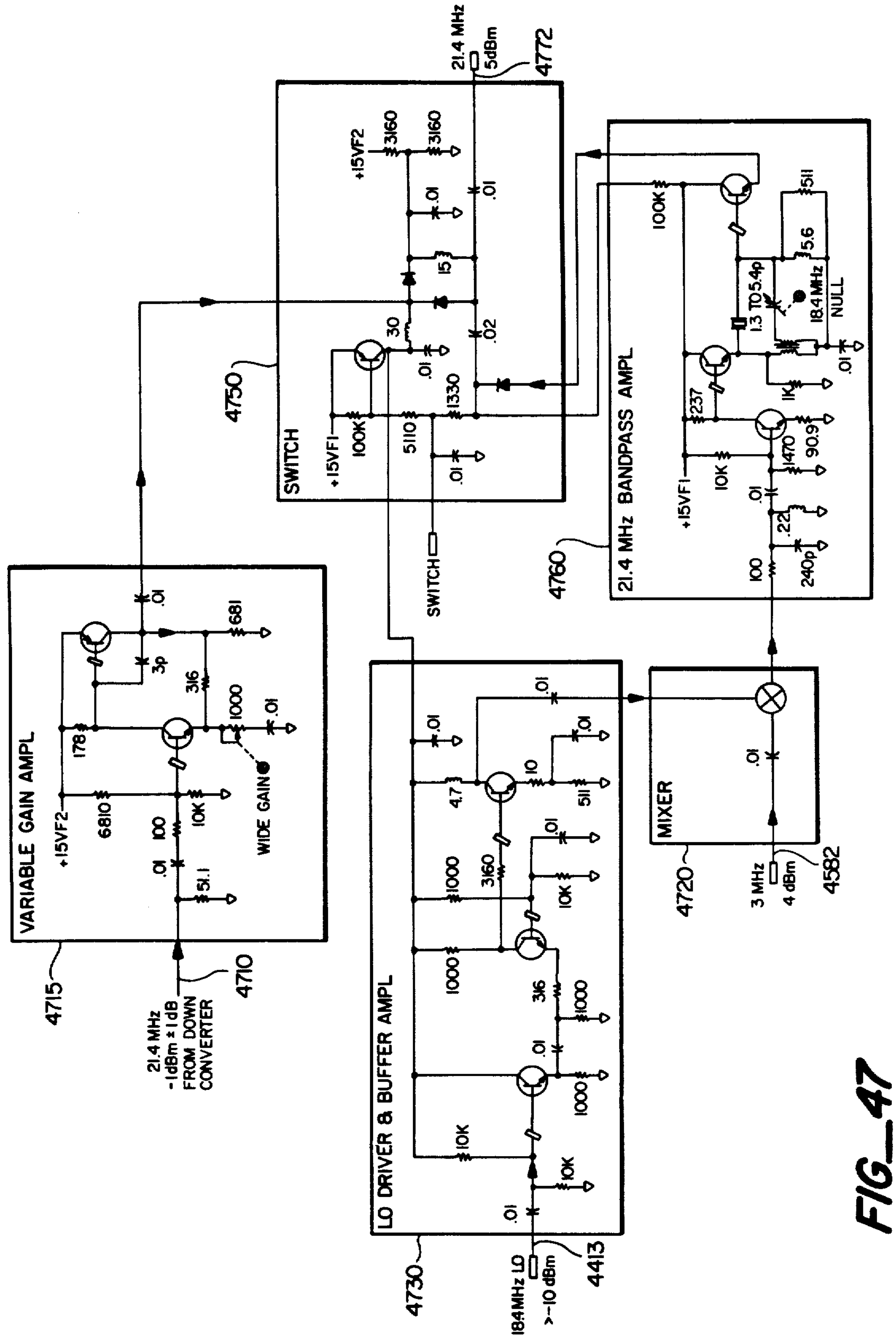
FIG_47

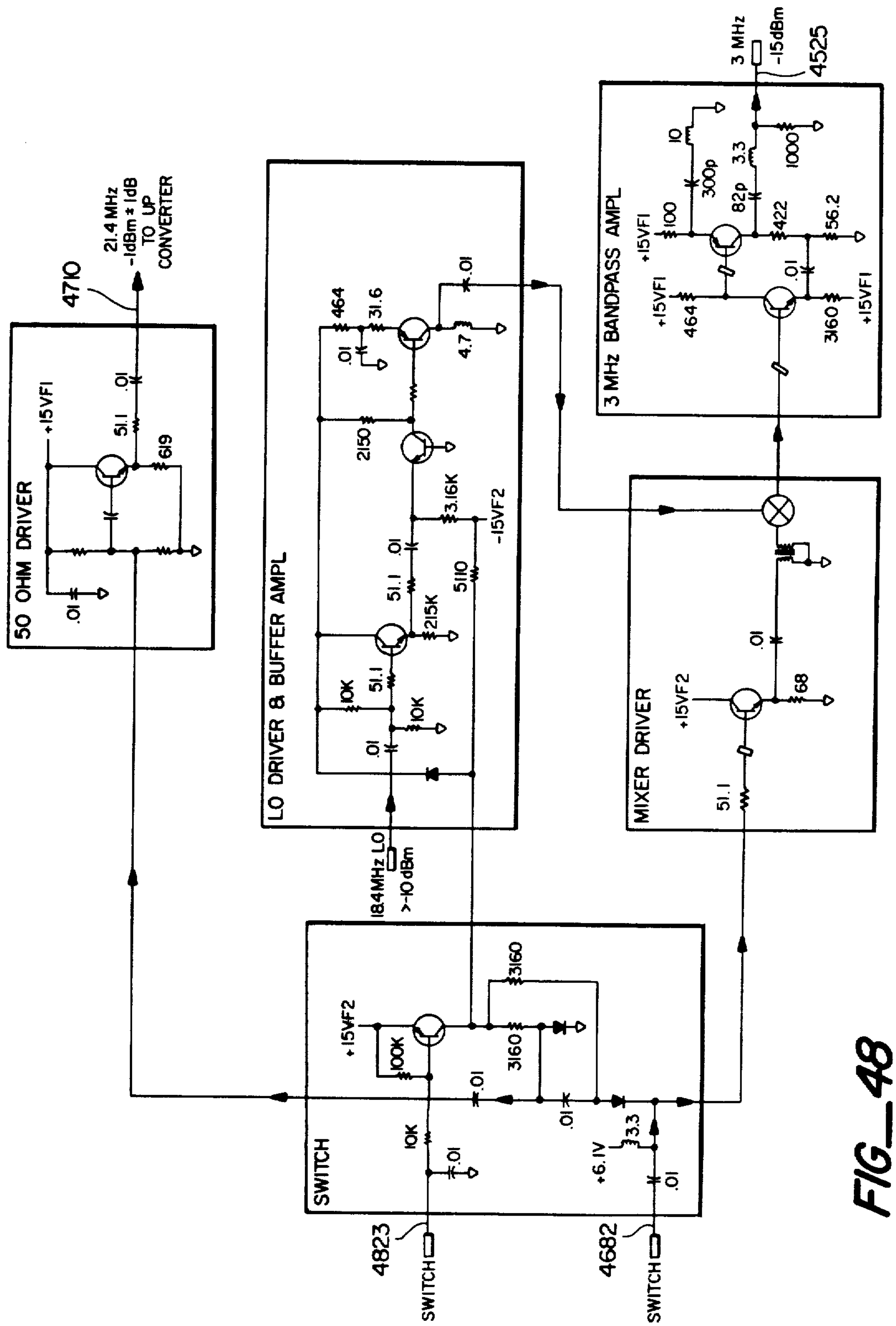
FIG_48

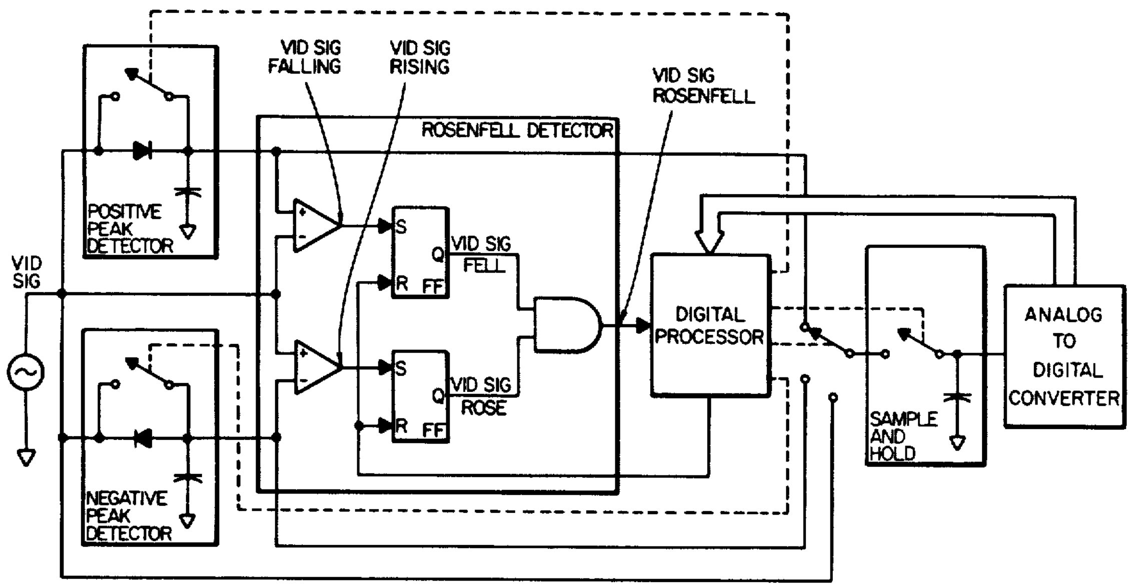
FIG_49A
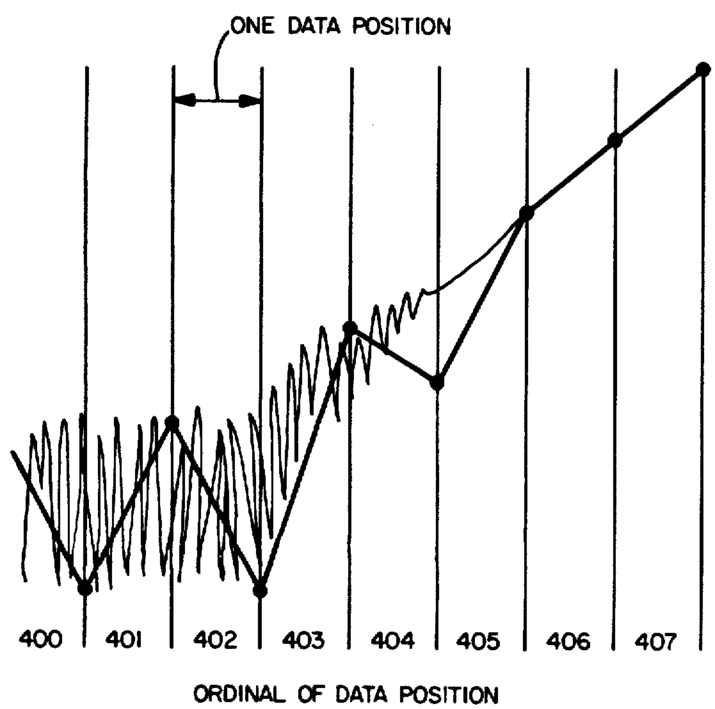
FIG_49B

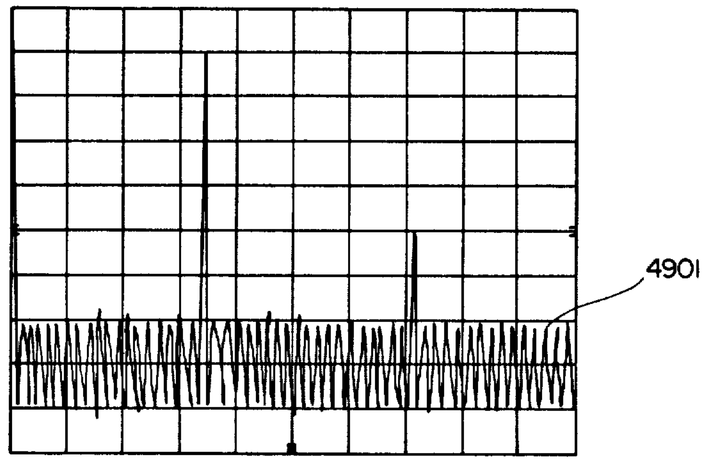
FIG_49C-1
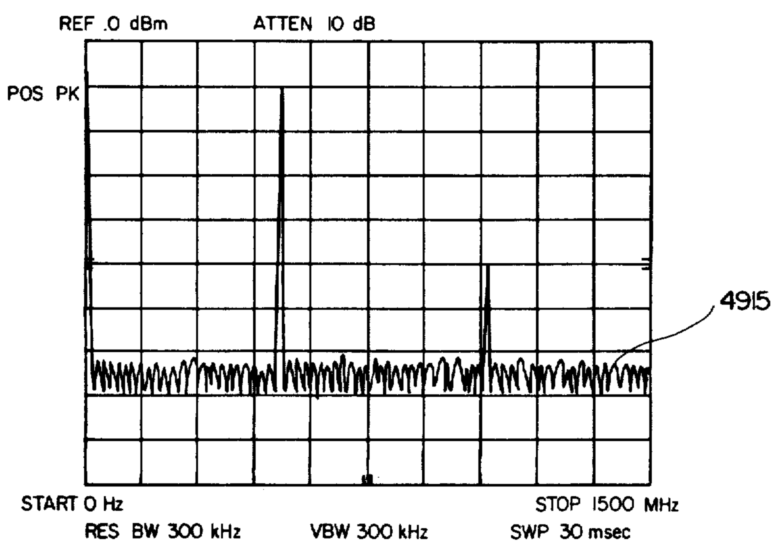
FIG_49C-2

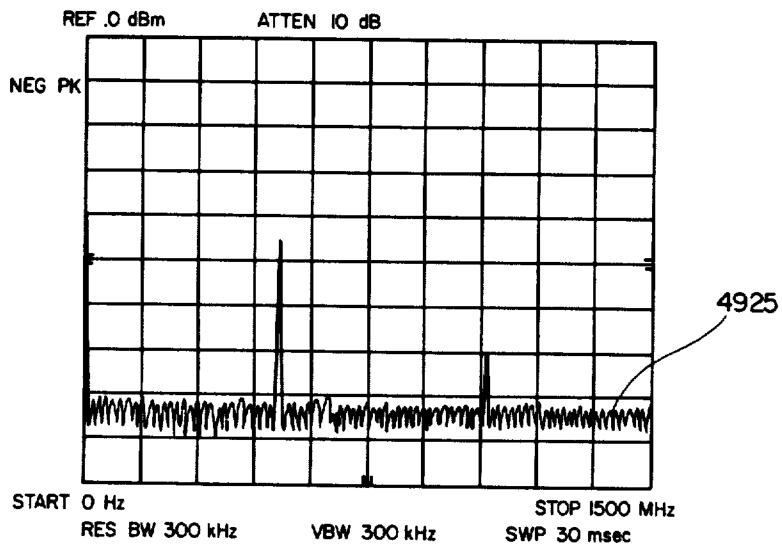
FIG_49C-3
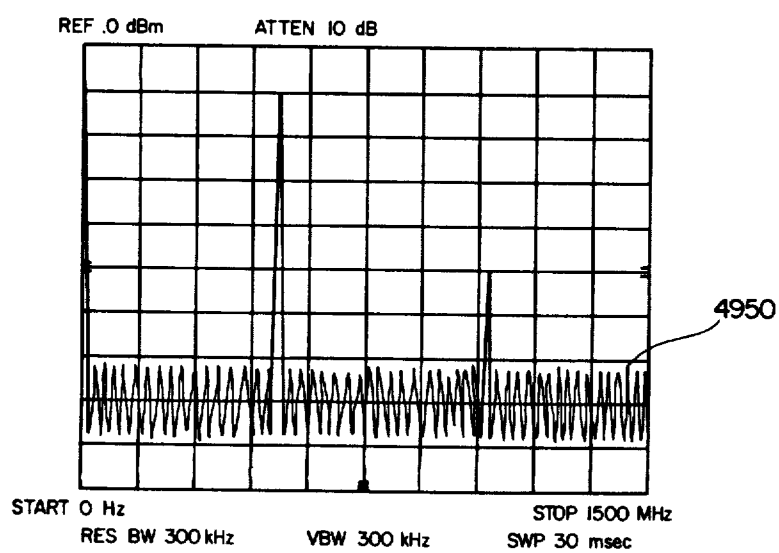
FIG_49C-4

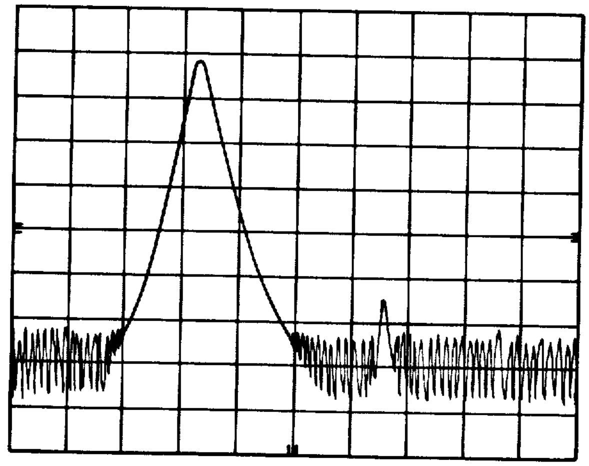
FIG_49D-1
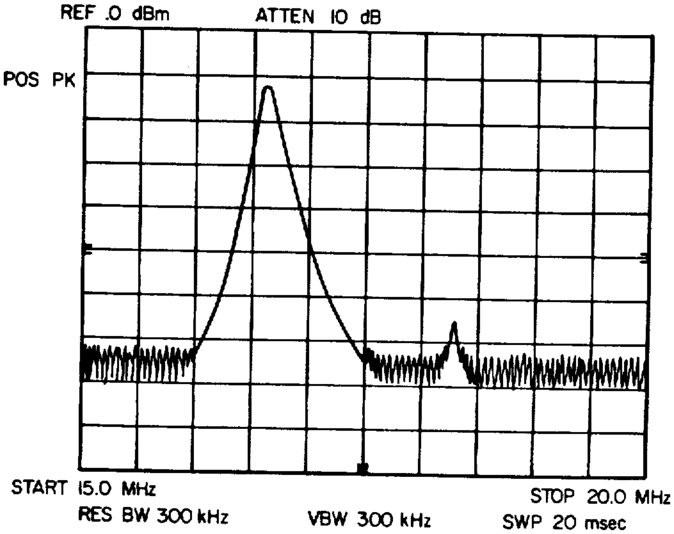
FIG_49D-2

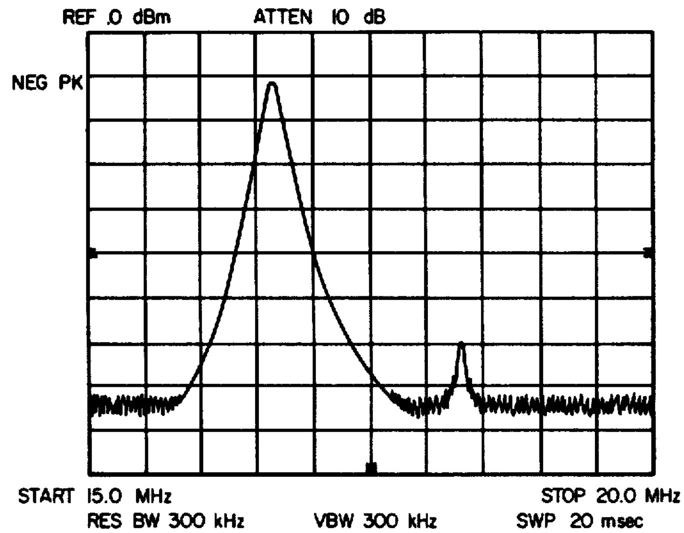
FIG_49D-3
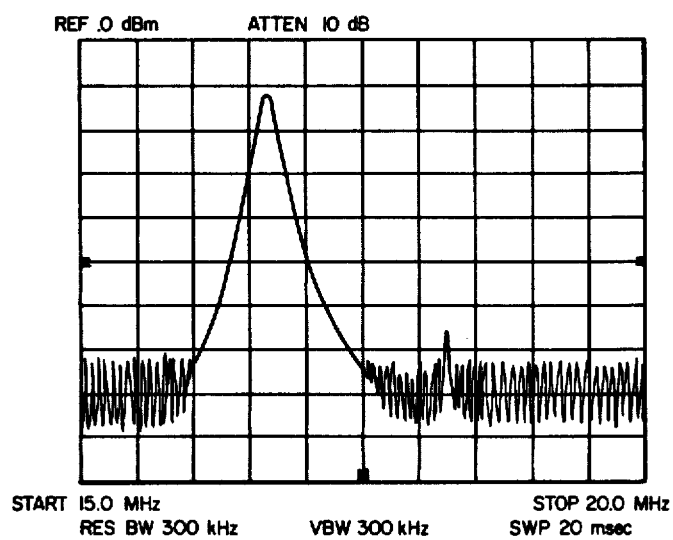
FIG_49D-4

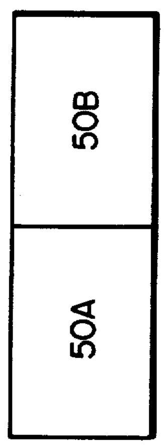
FIG_50

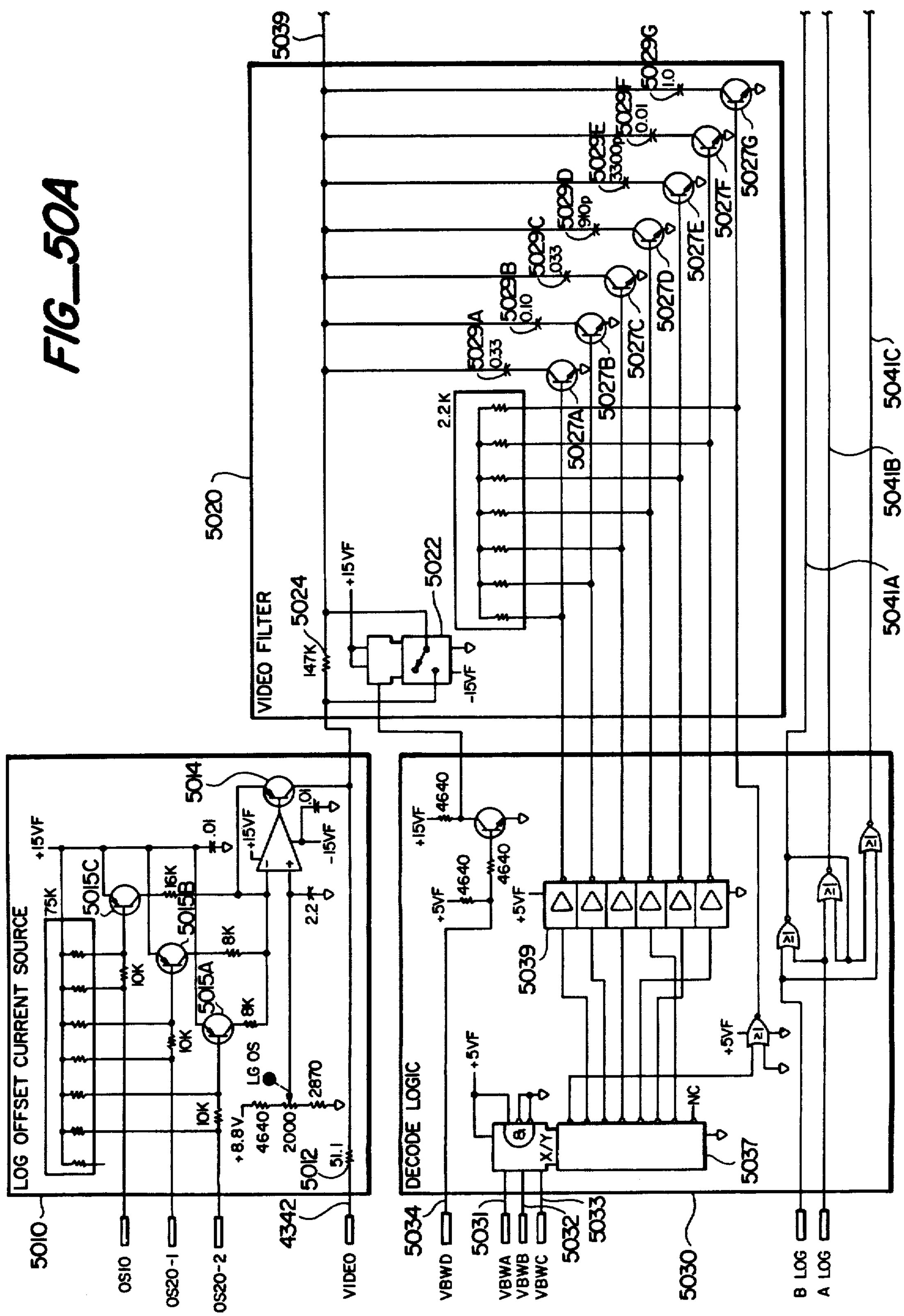
FIG_50A

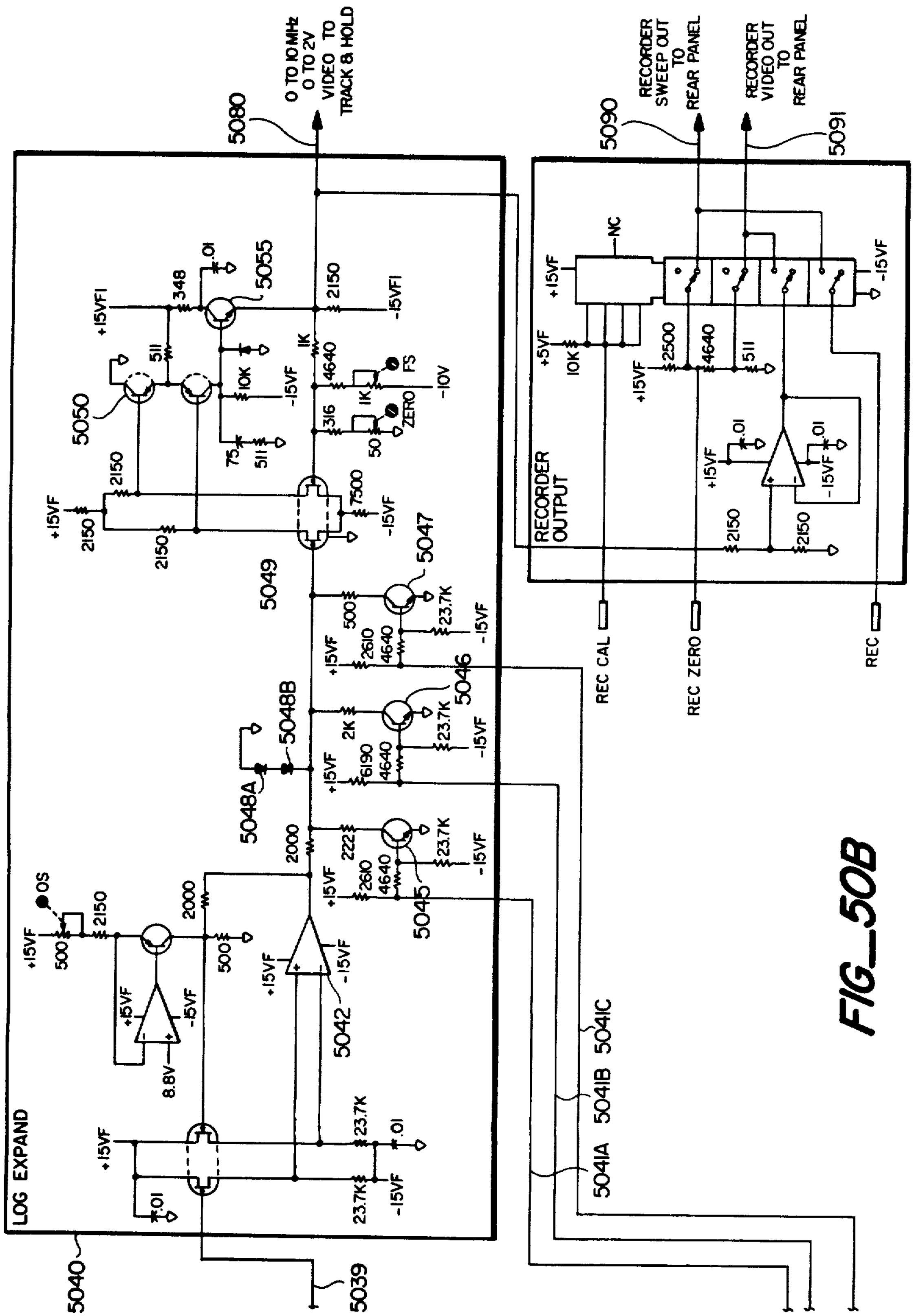
FIG_50B

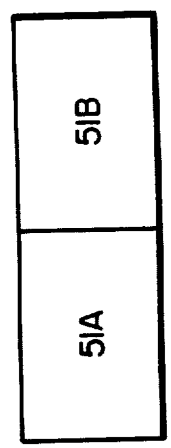
FIG_51

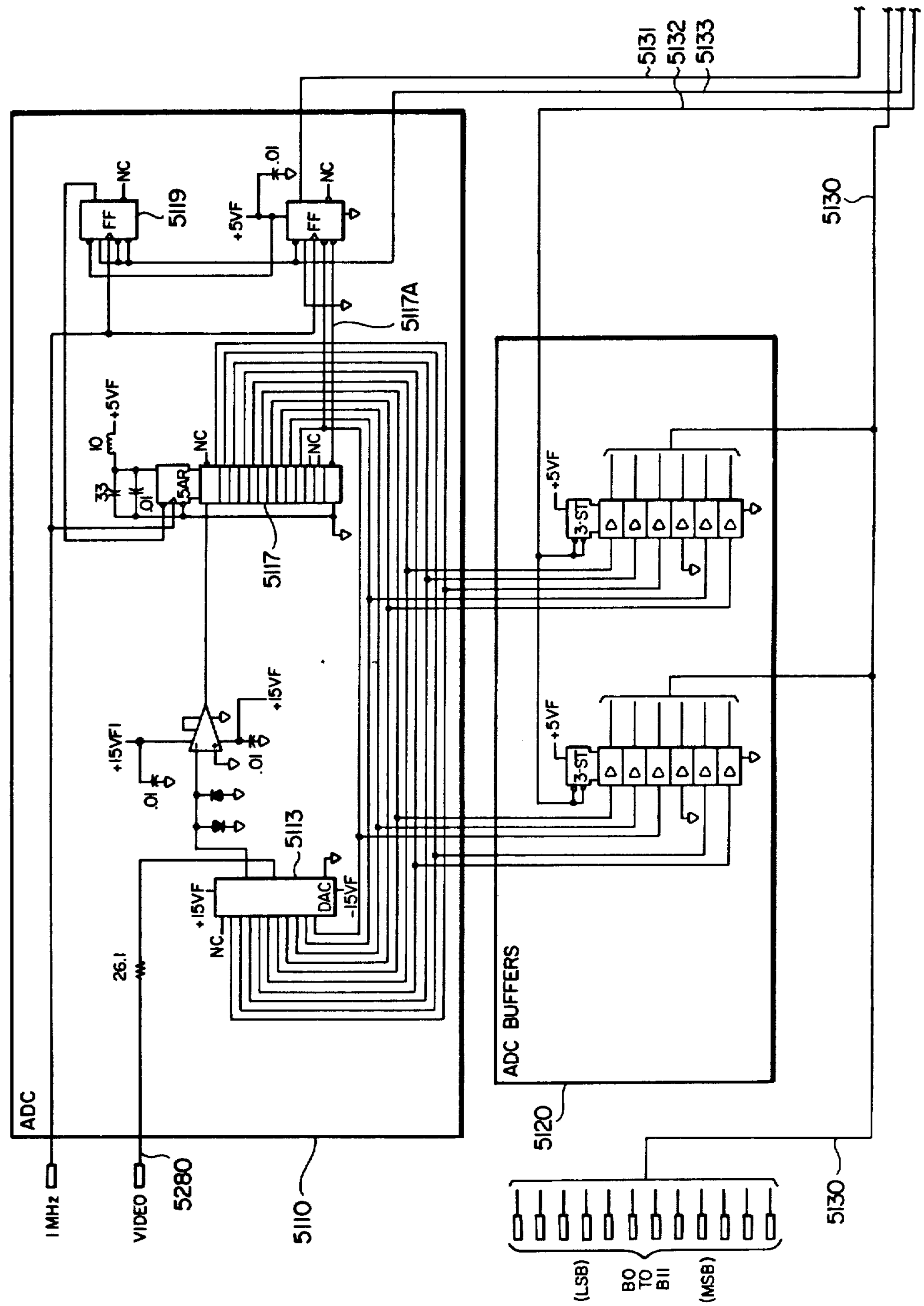
FIG_51A

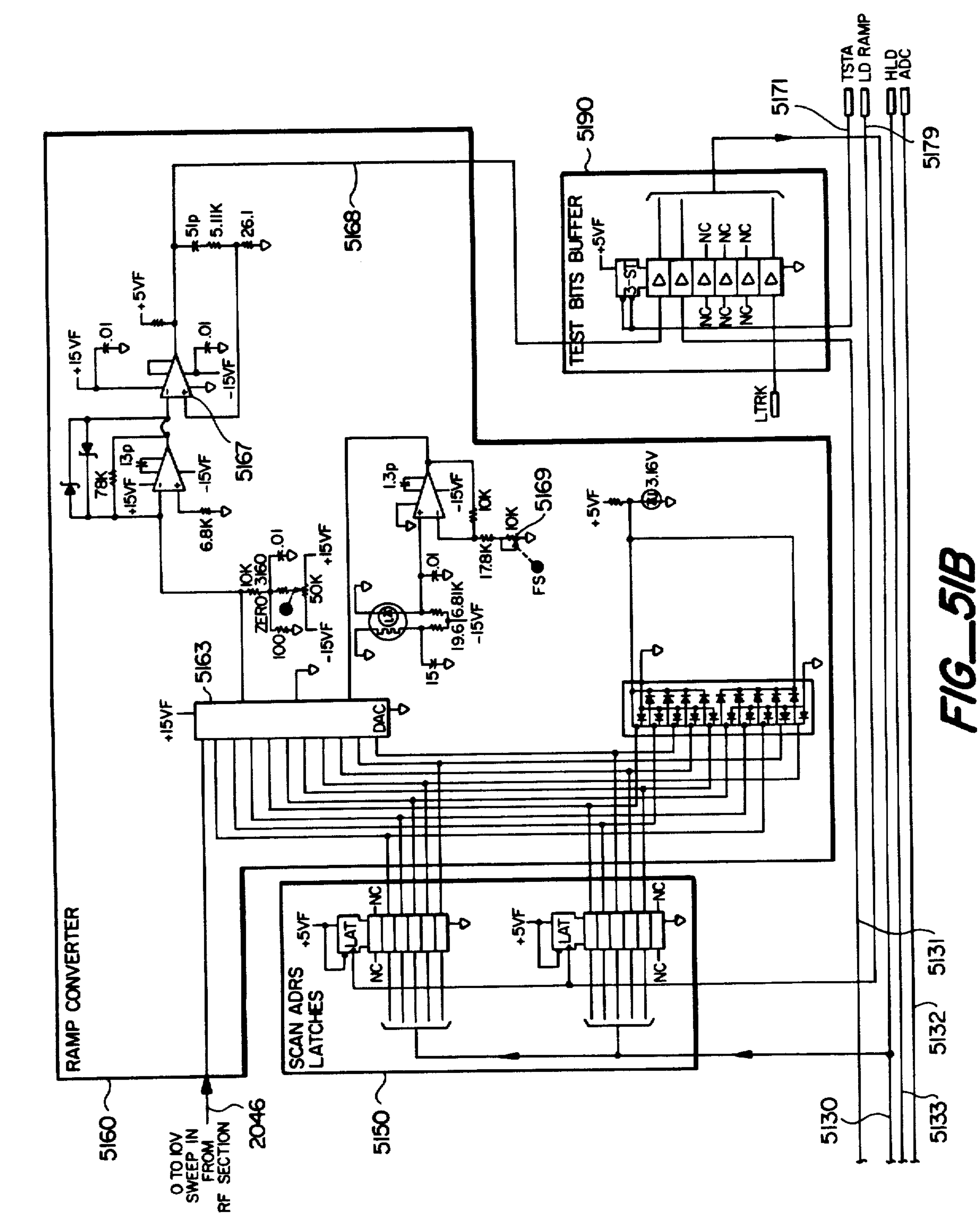
FIG_51B

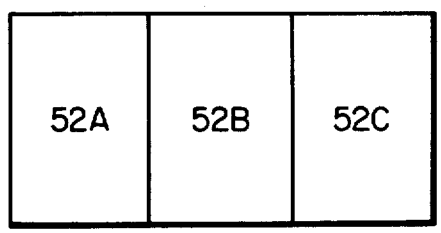
FIG_52

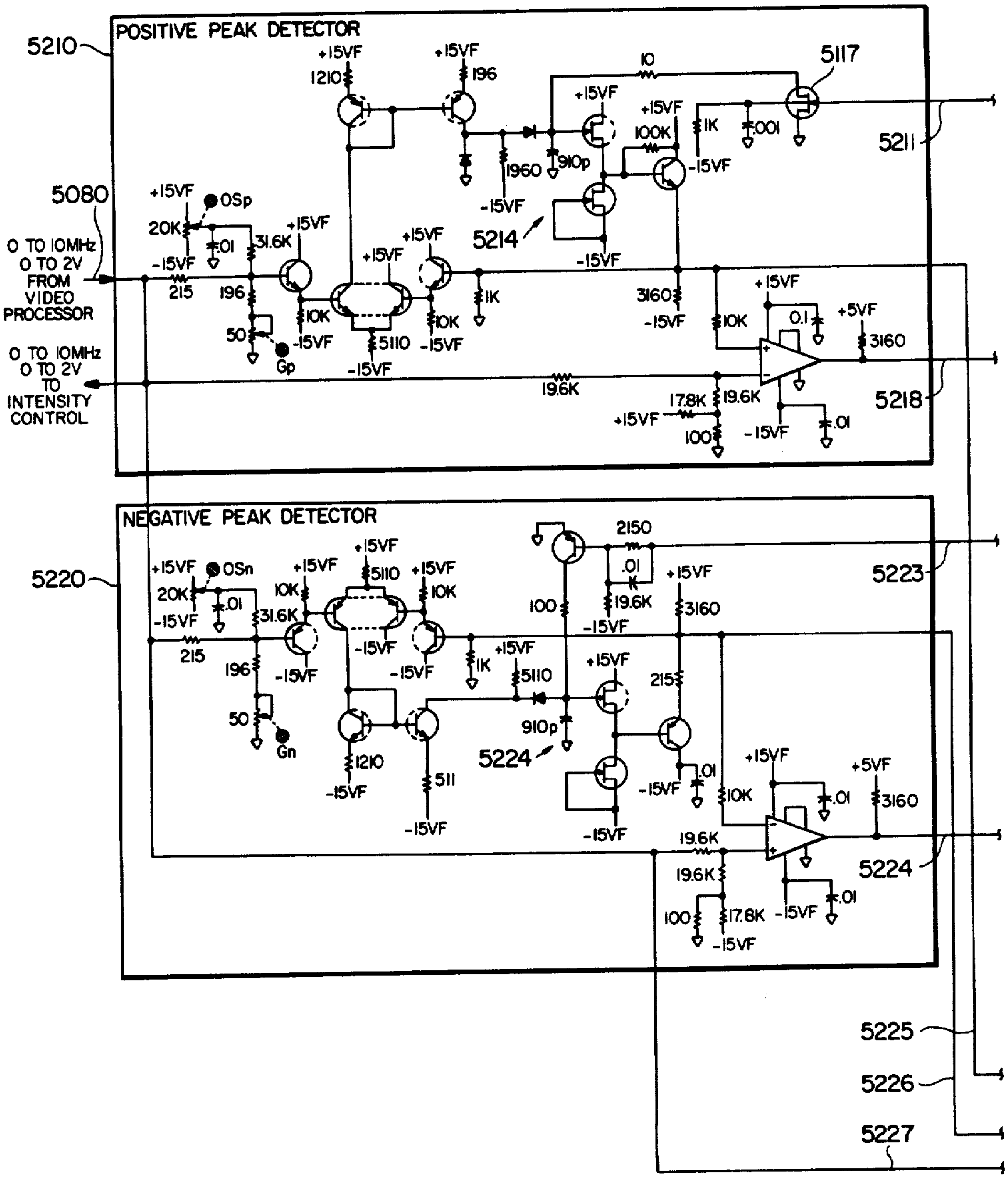
FIG_52A

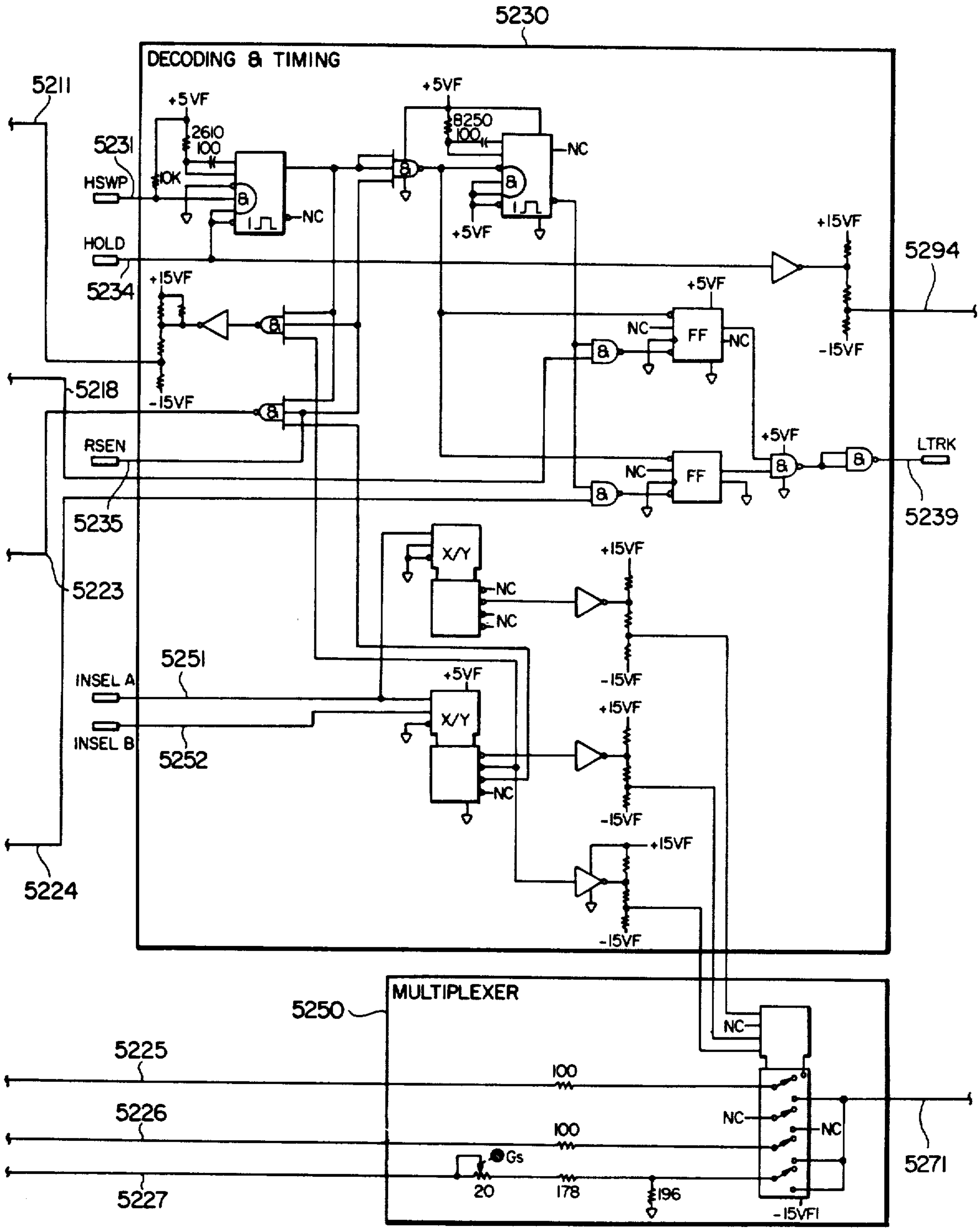
FIG_52B

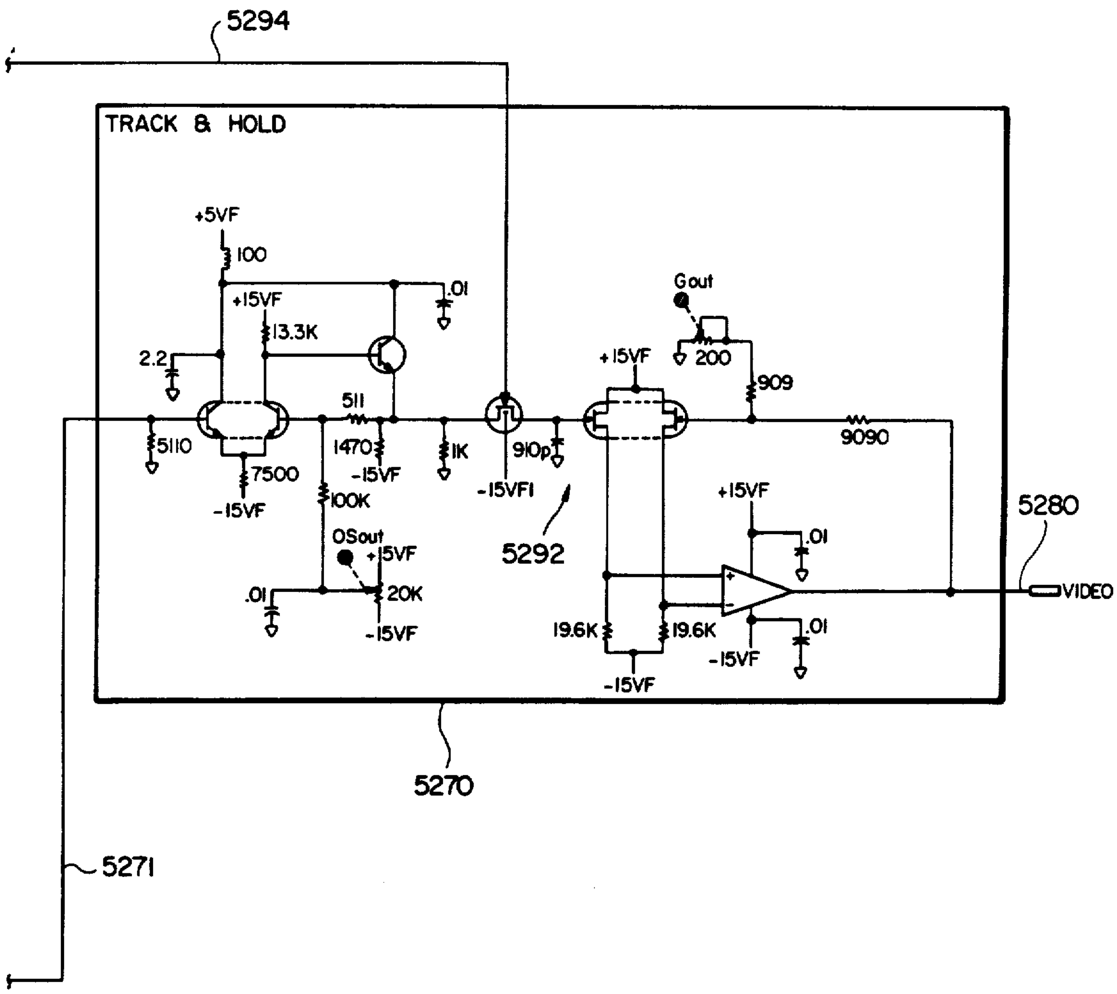
FIG_52C

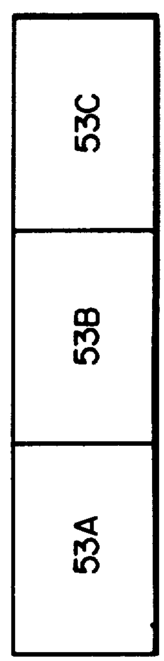
FIG_53

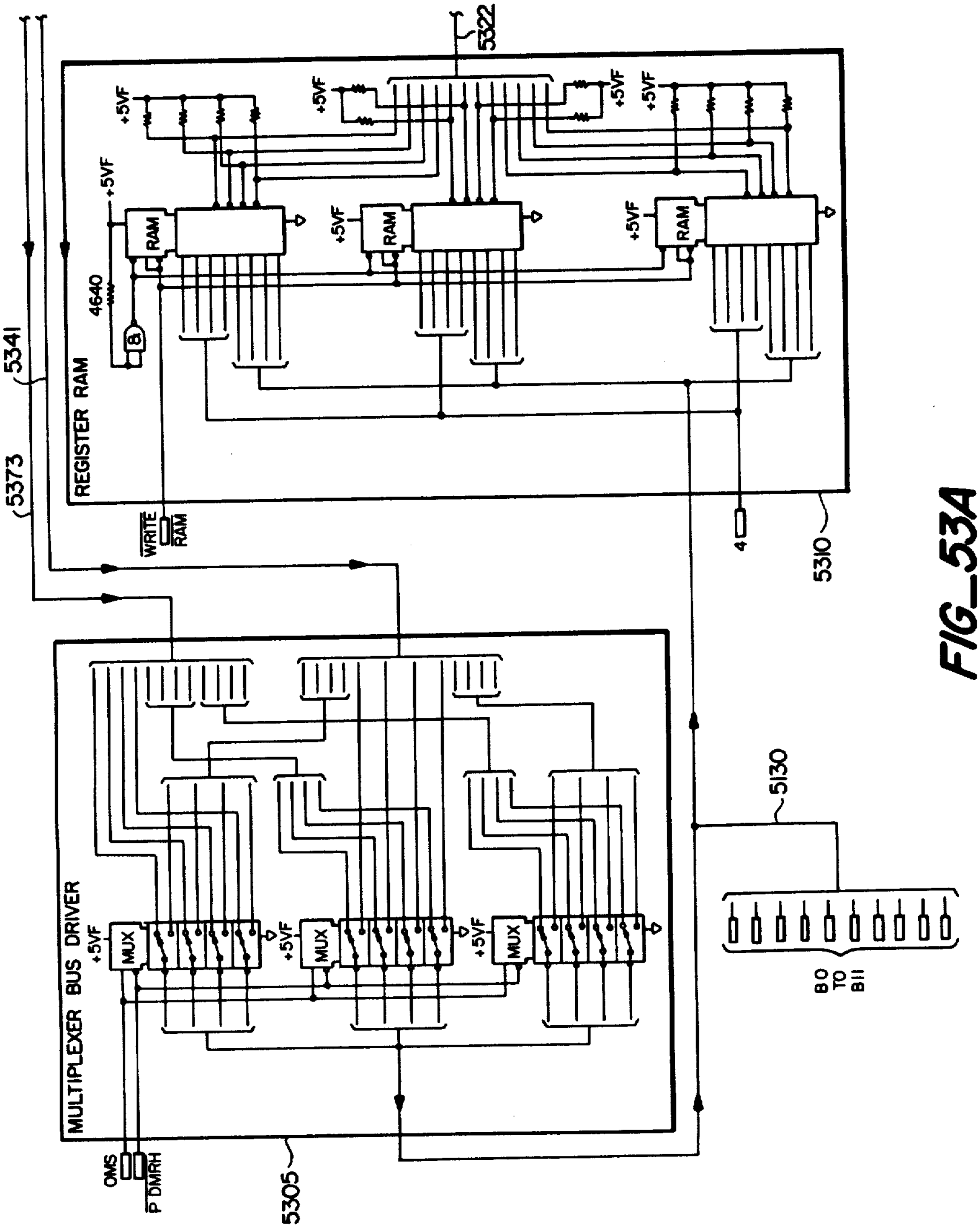
FIG_53A

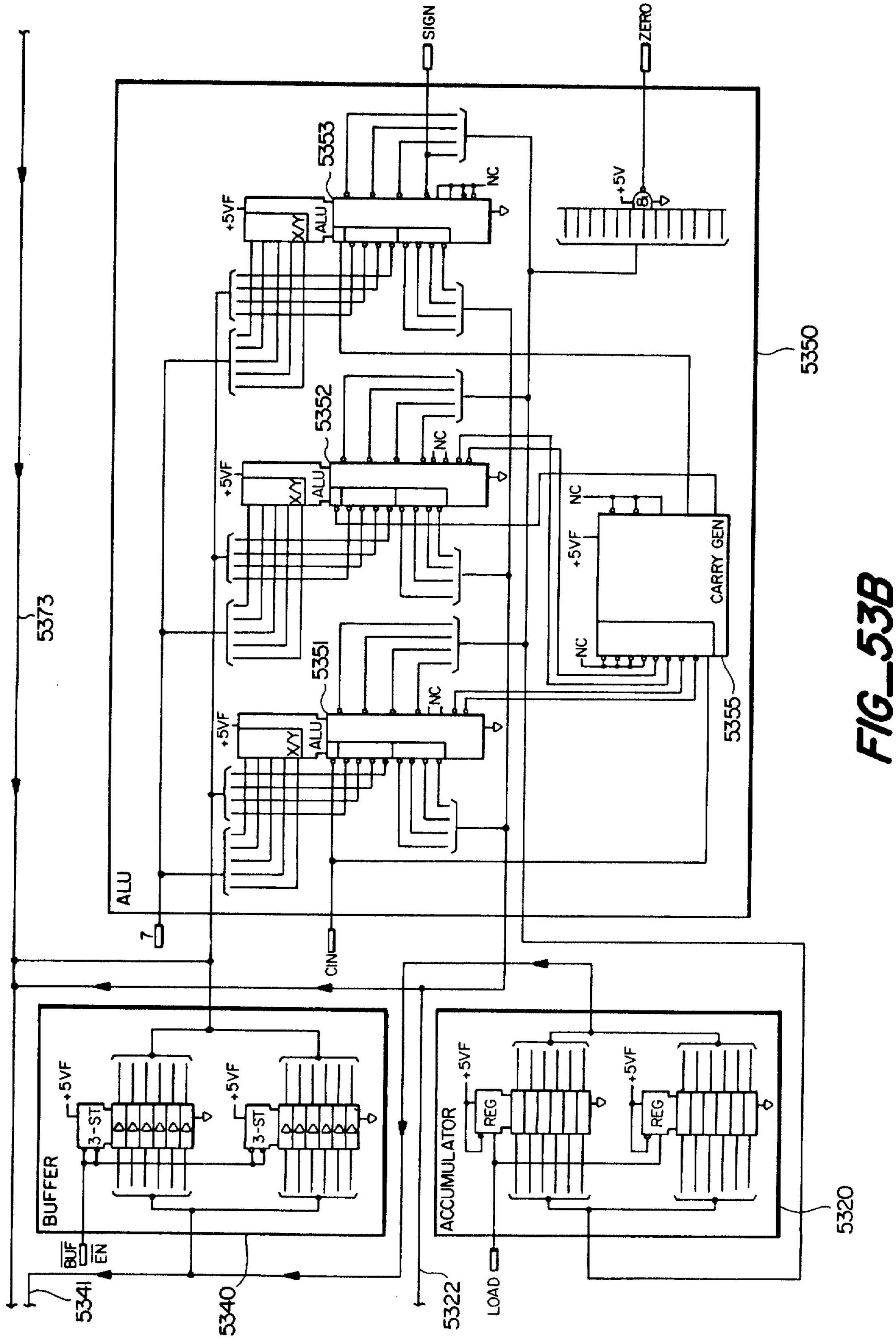
FIG_53B

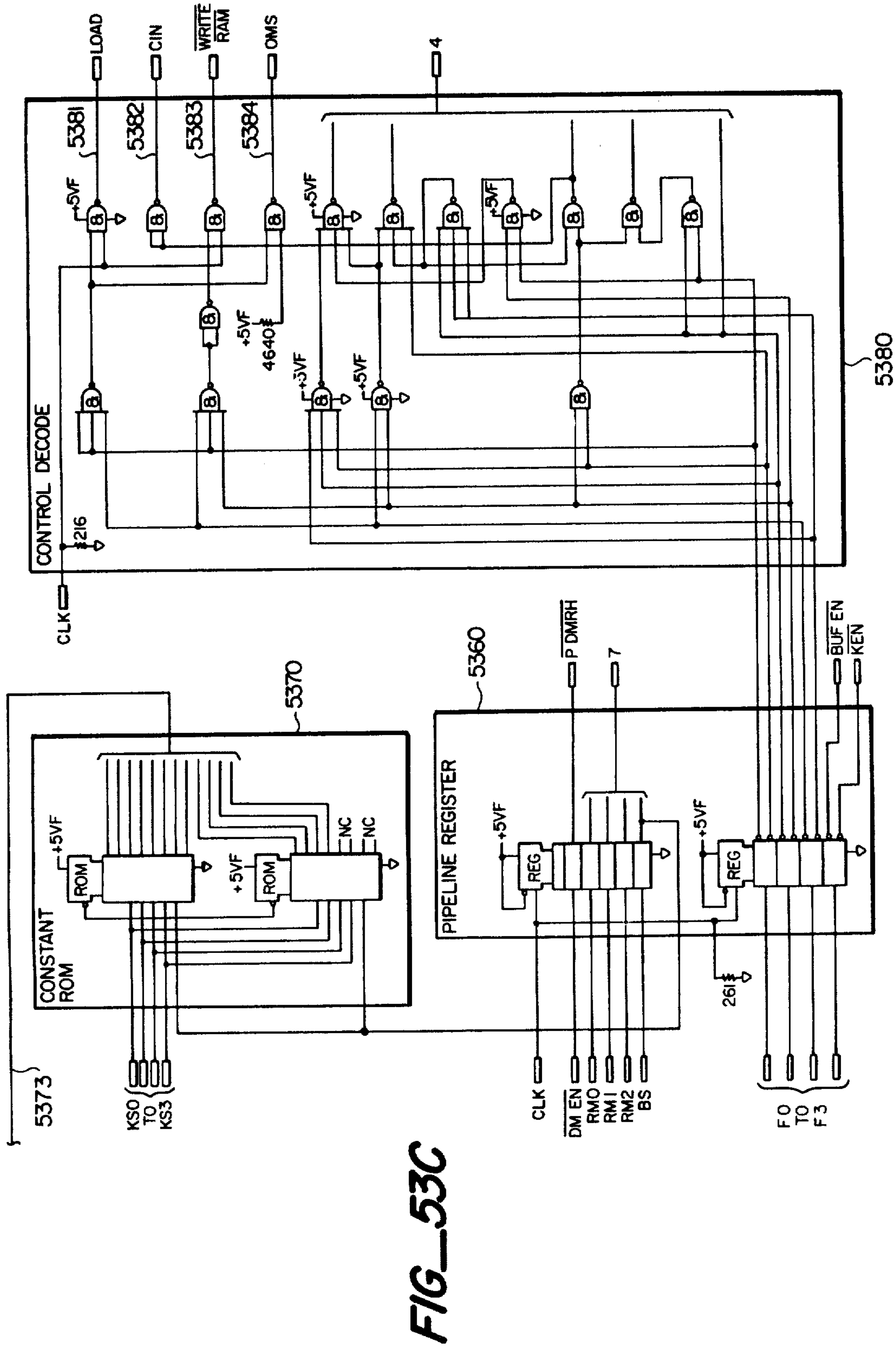
FIG_53C

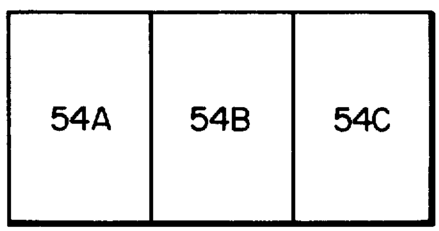
FIG_54

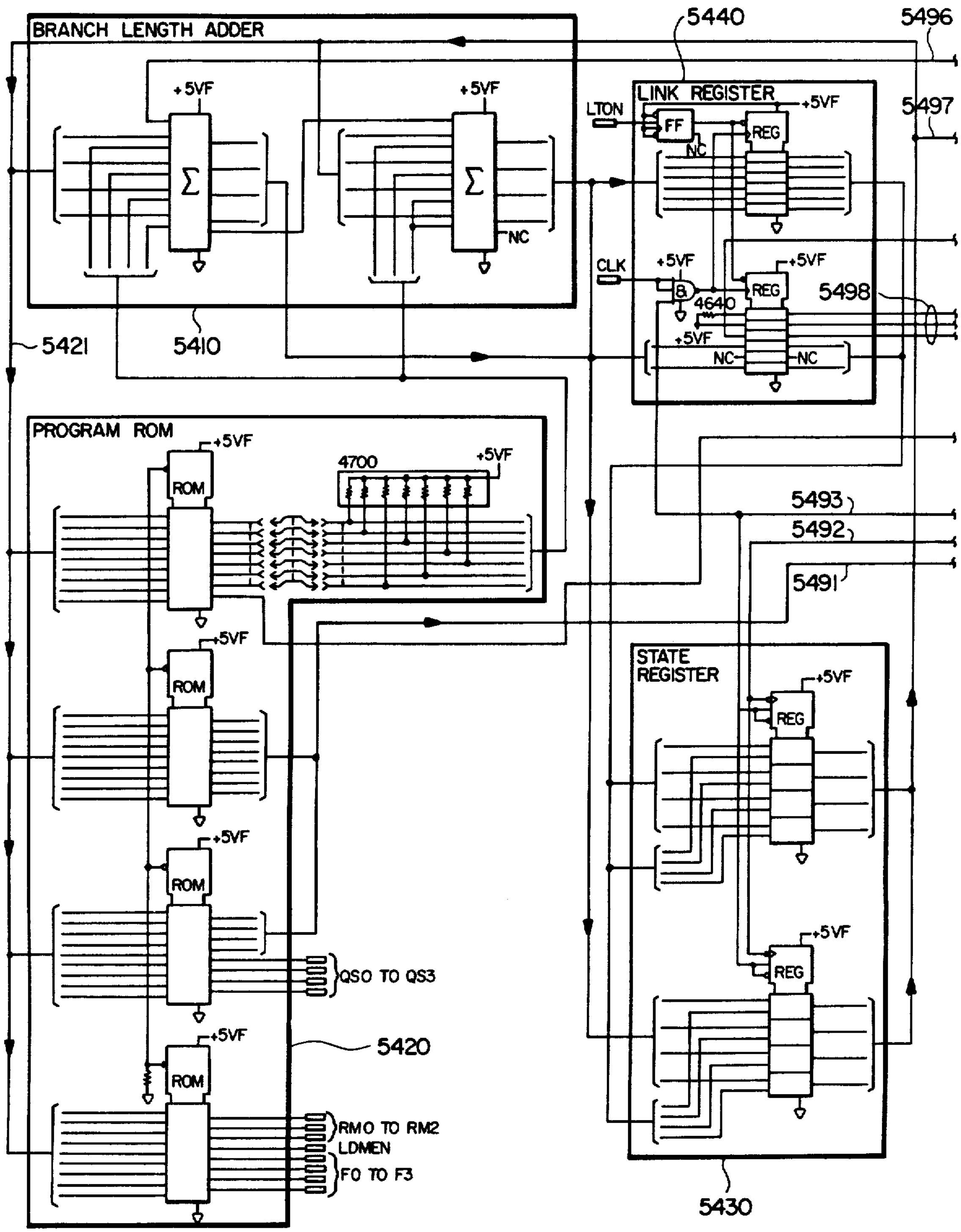
FIG_54A

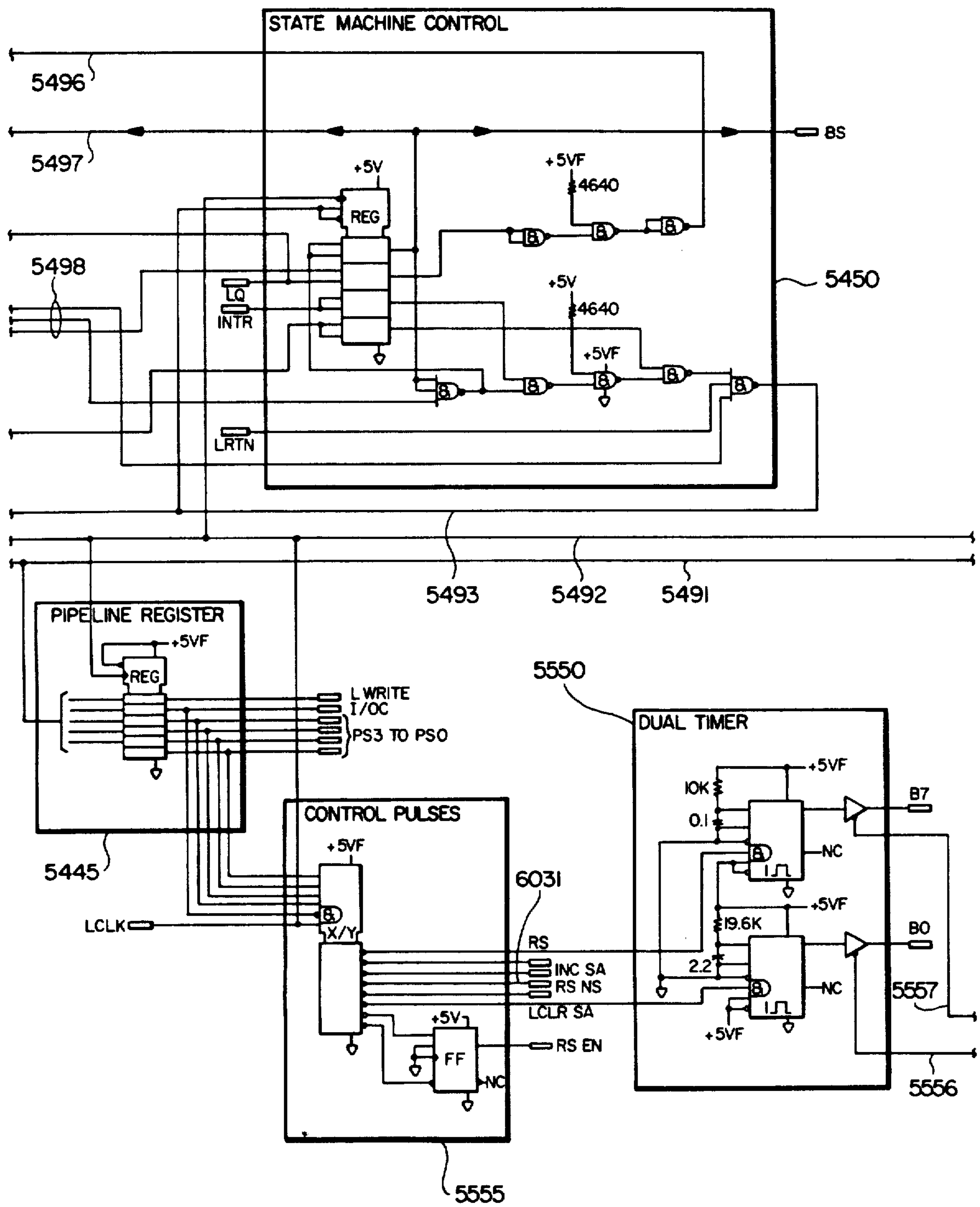
FIG_54B

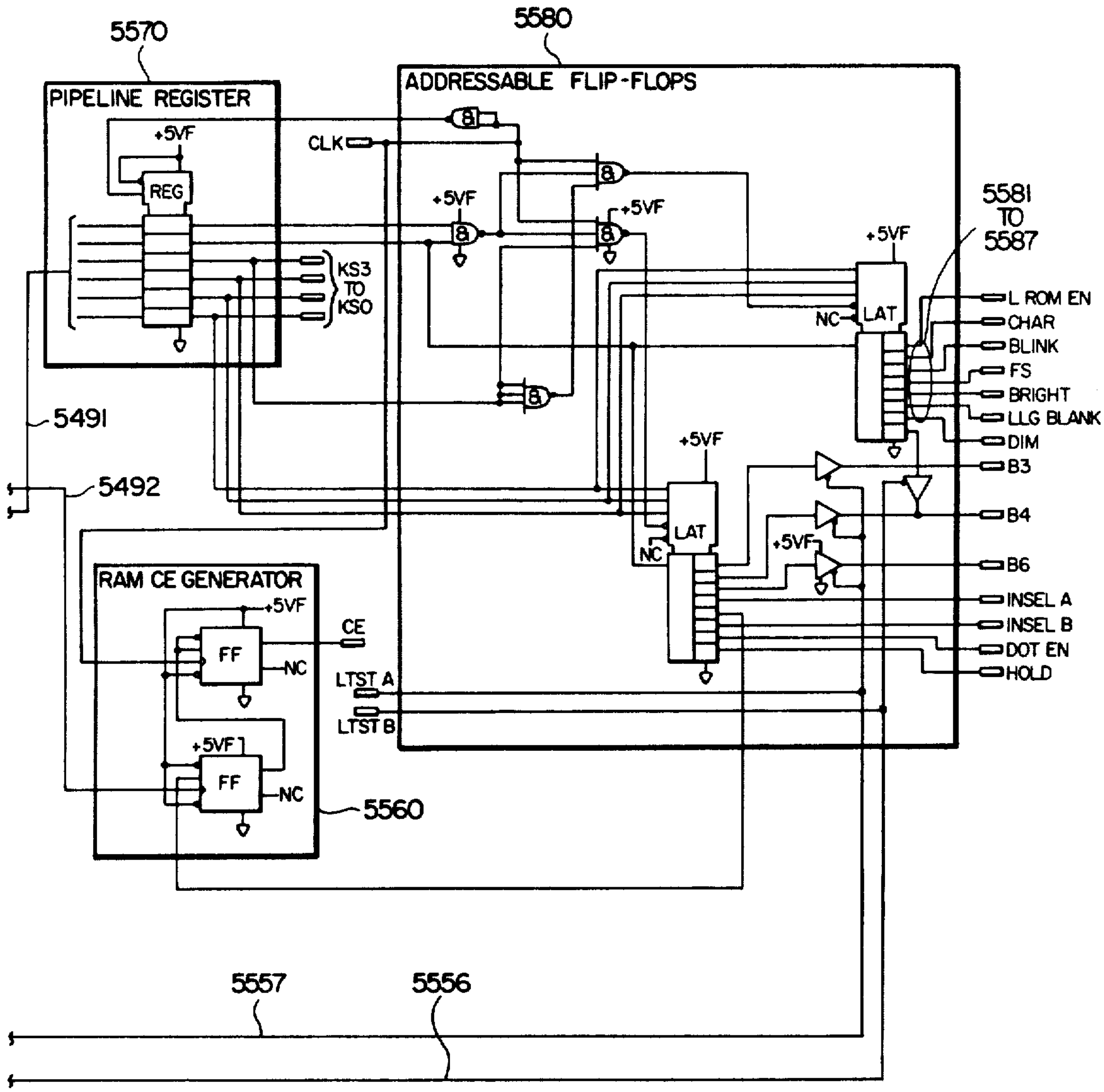
FIG_54C

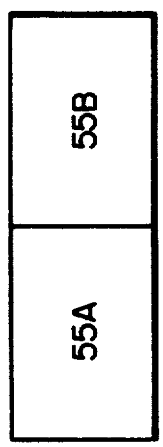
FIG_55

FIG_55A
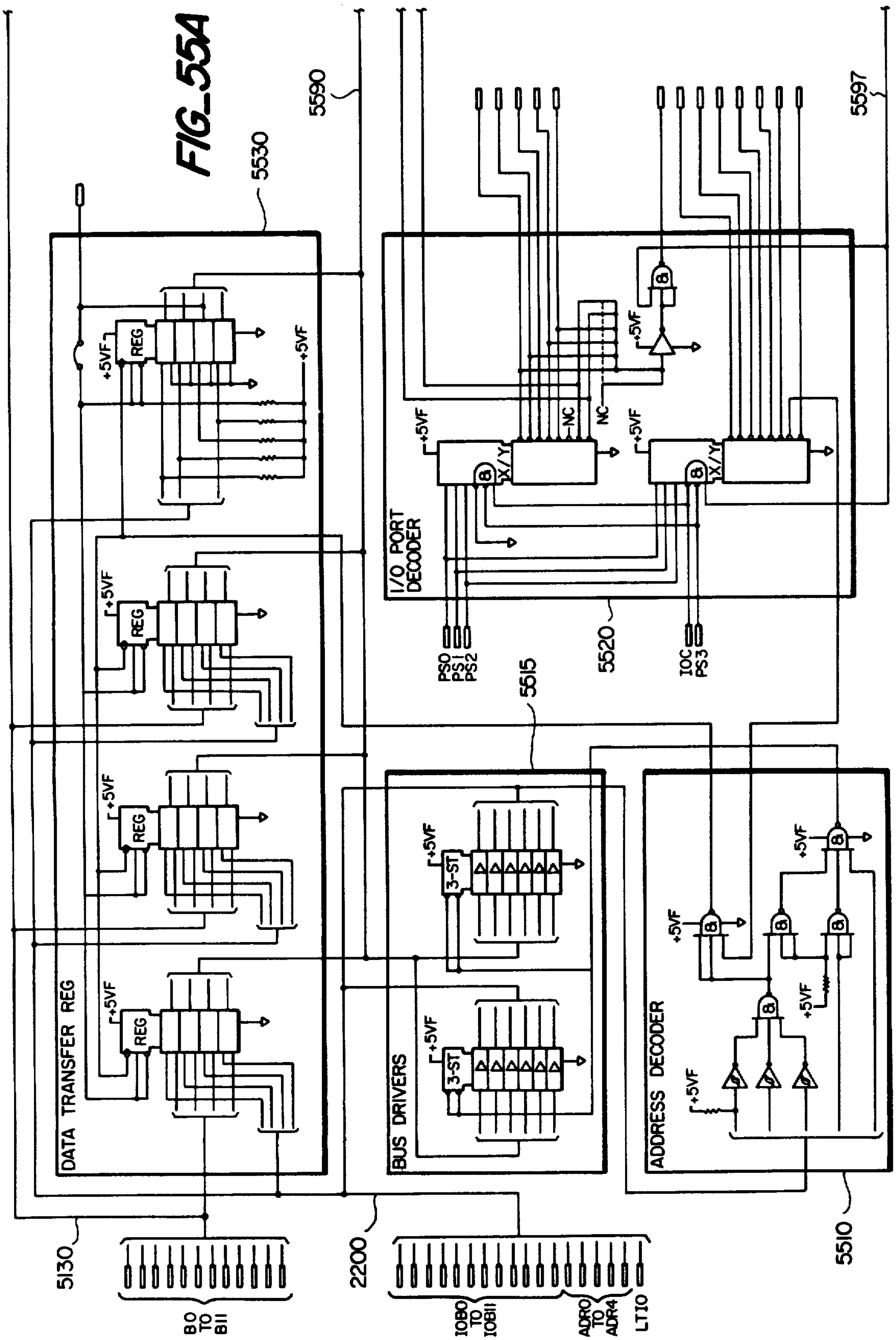

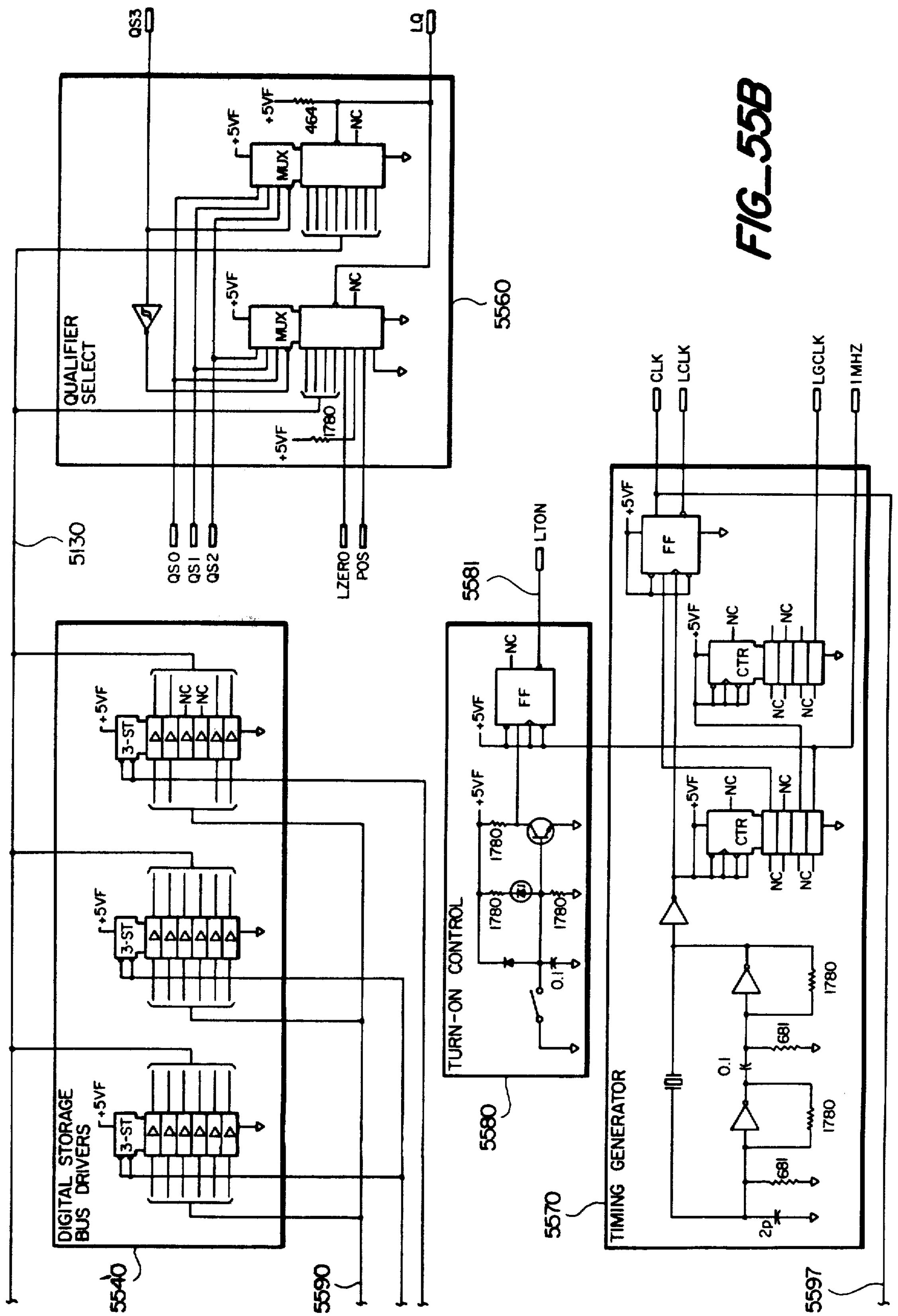
FIG_55B

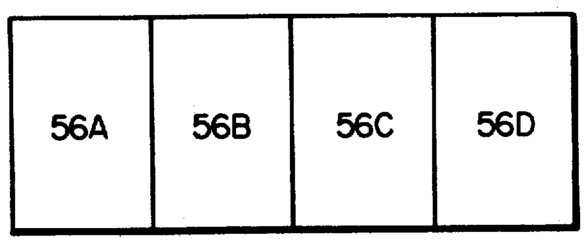
FIG_56

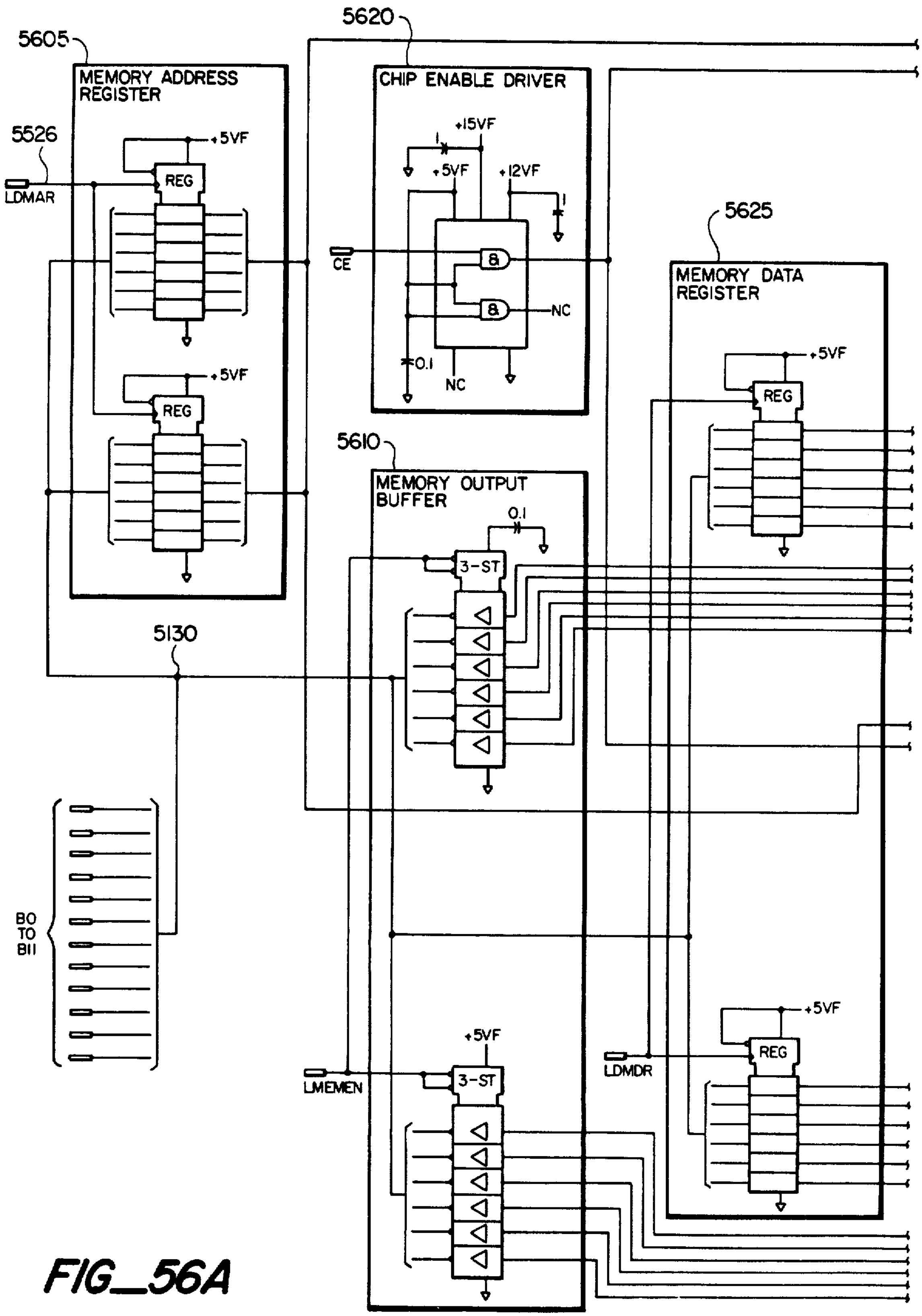
FIG_56A

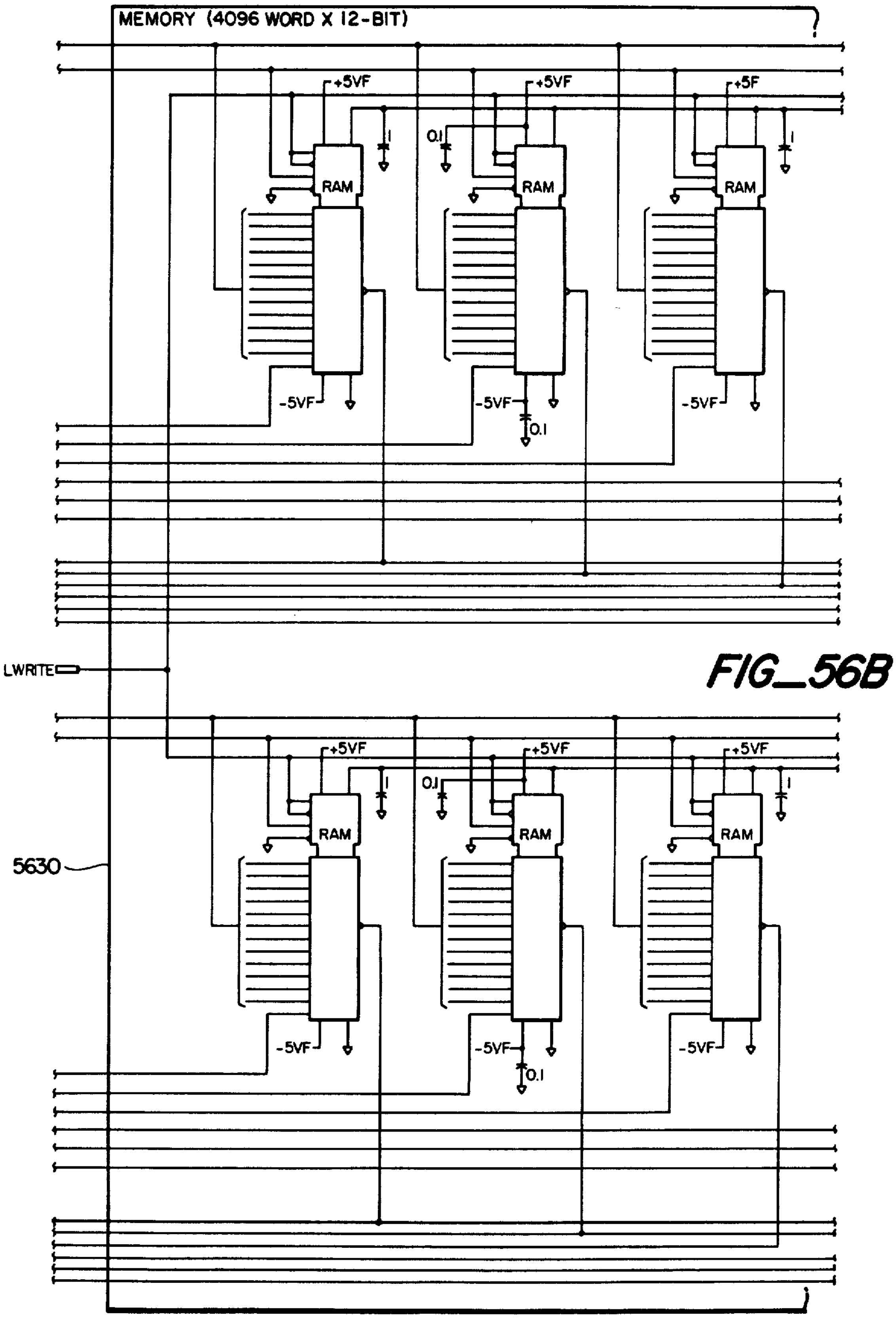
FIG_56B

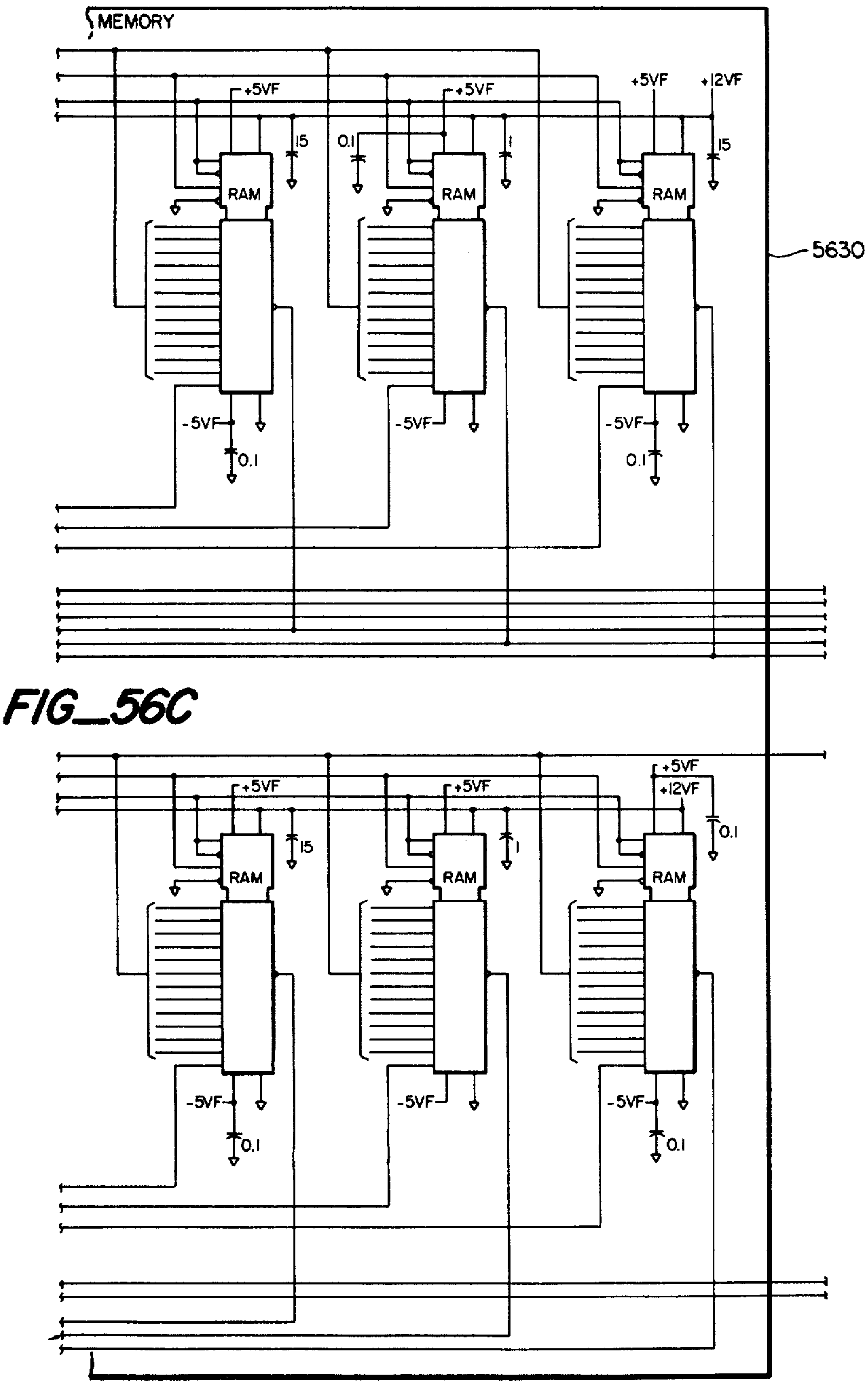
FIG_56C

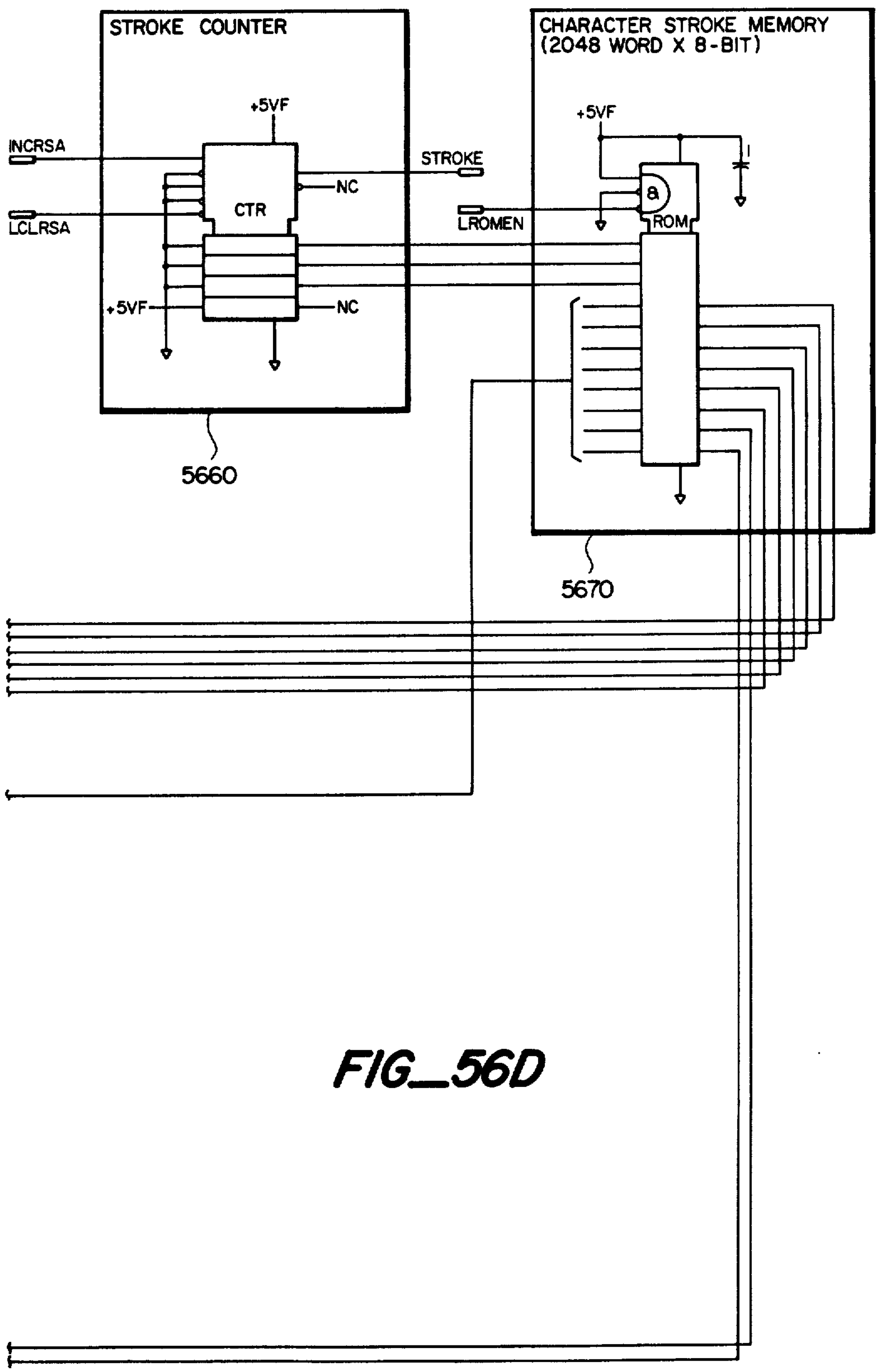
FIG_56D

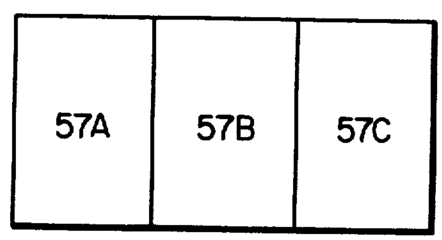
FIG_57

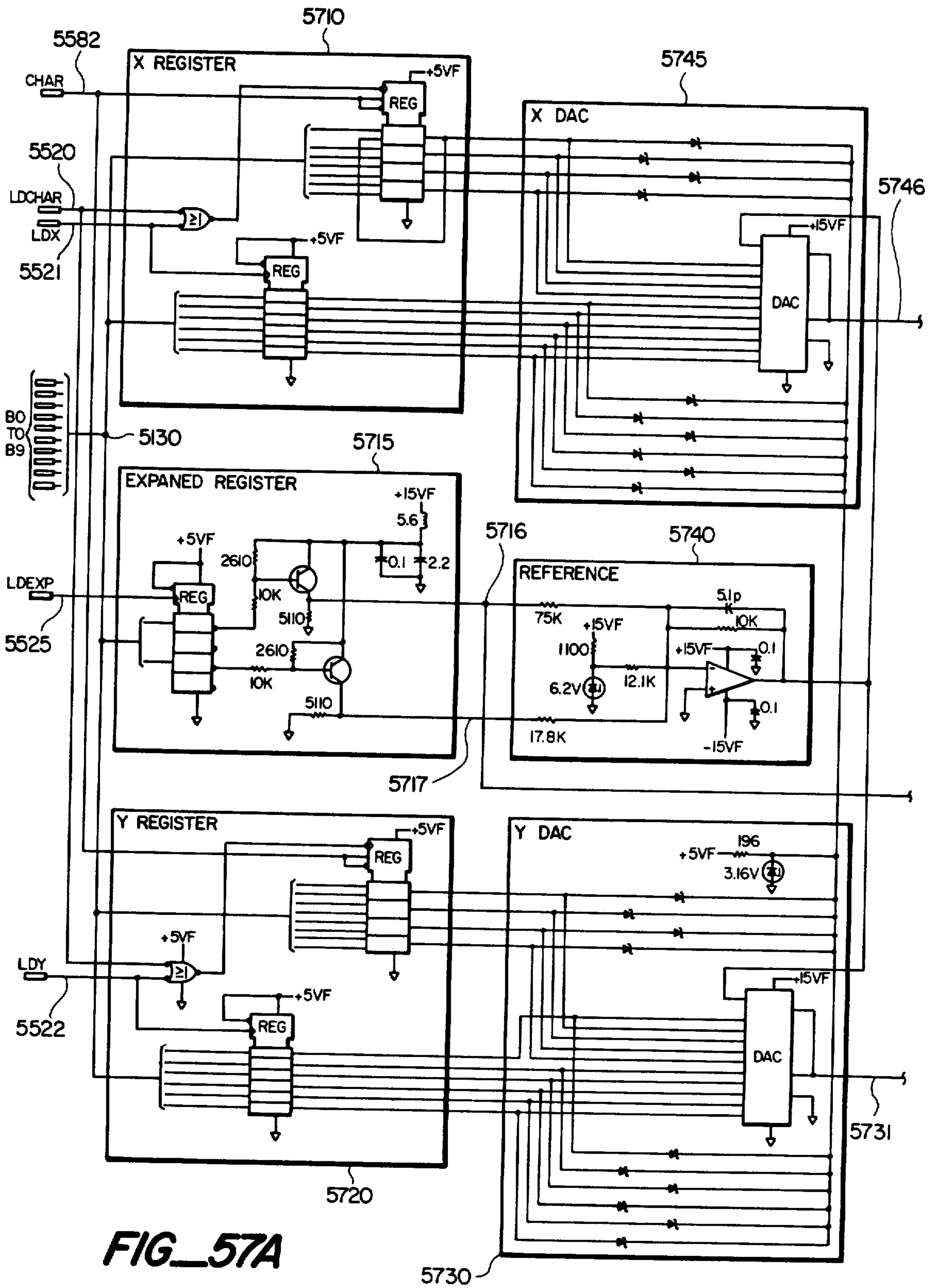
FIG_57A

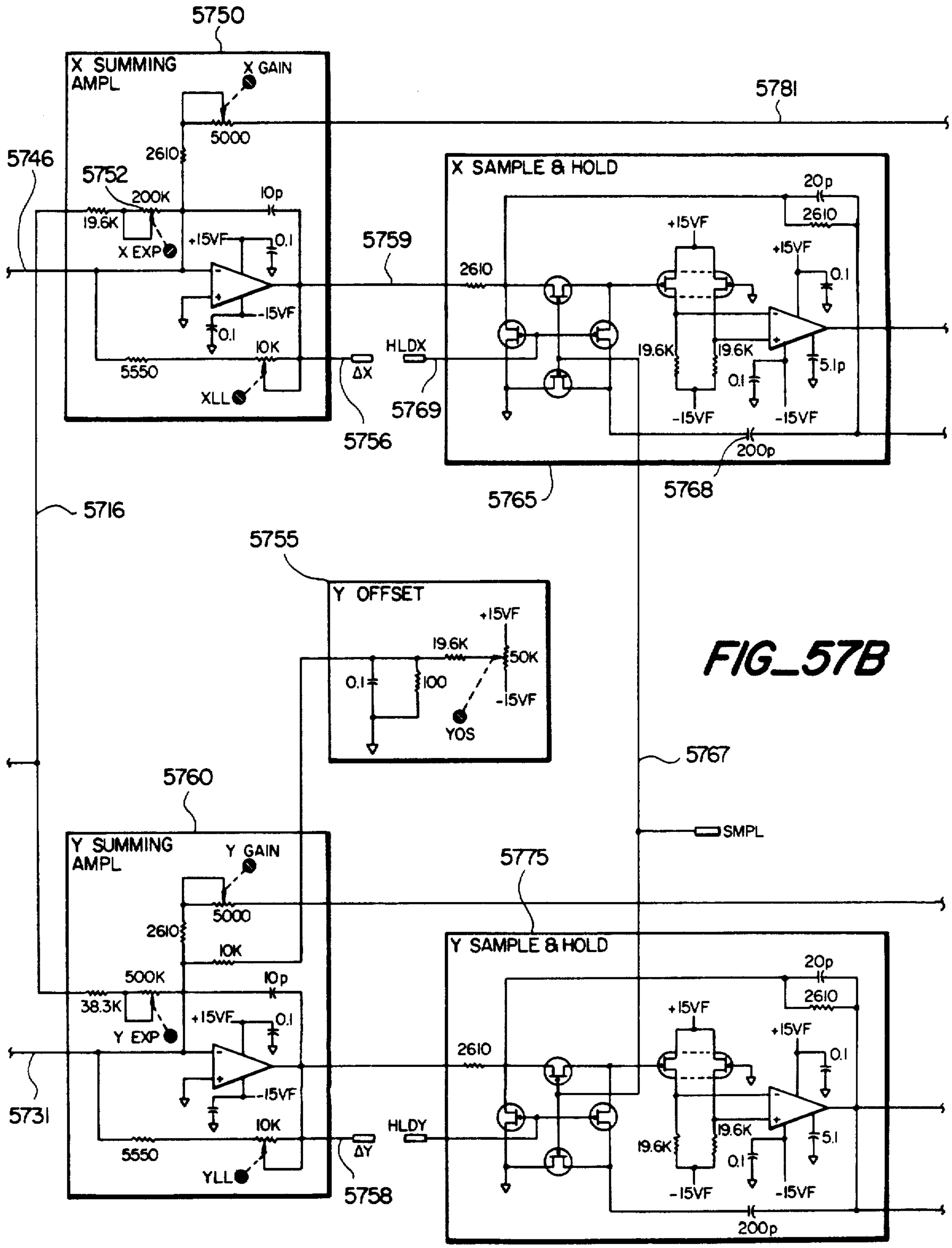
FIG_57B

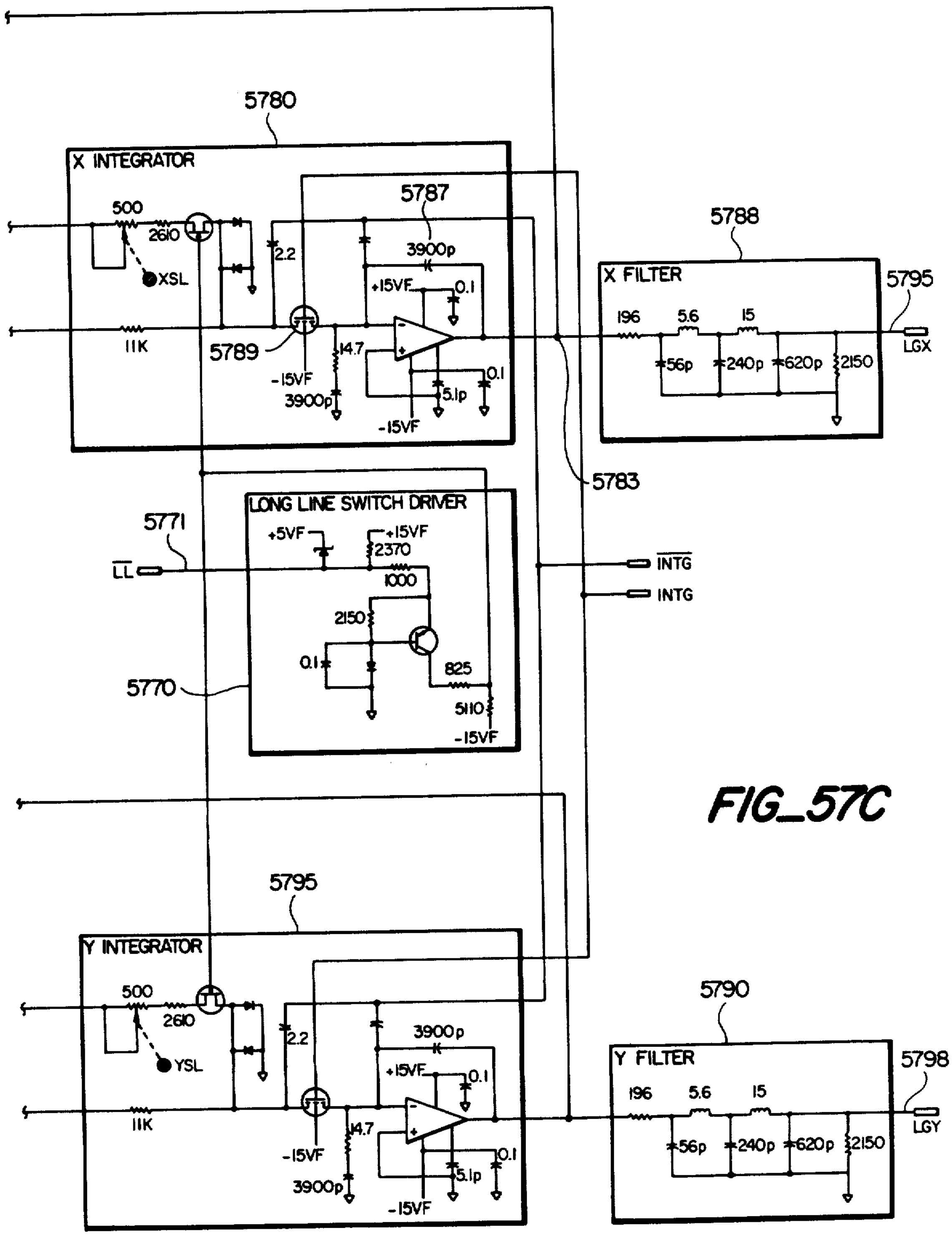
FIG_57C

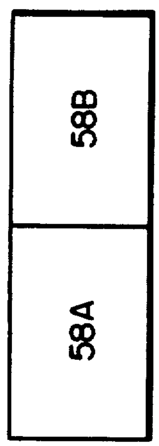
FIG_58

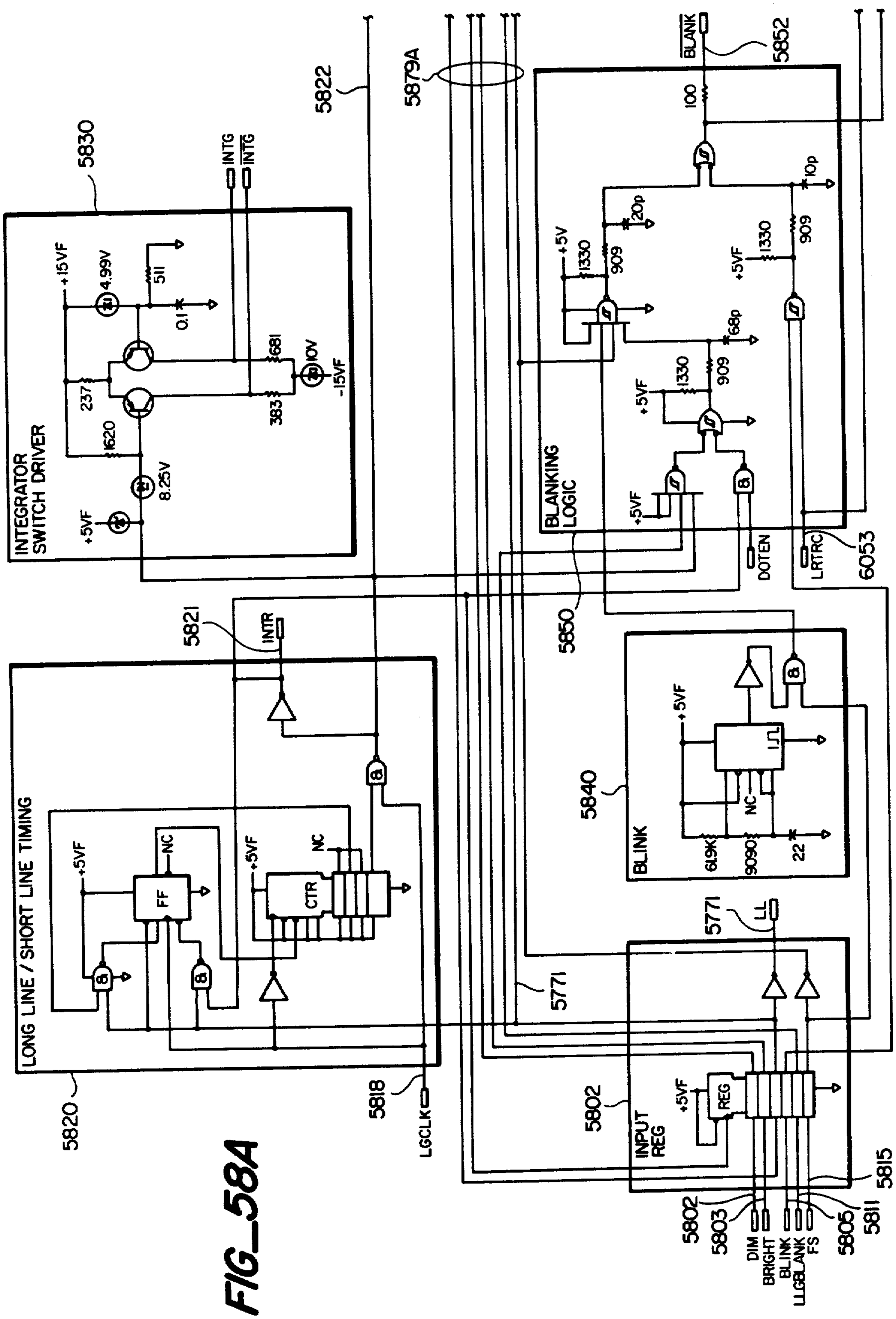
FIG_58A

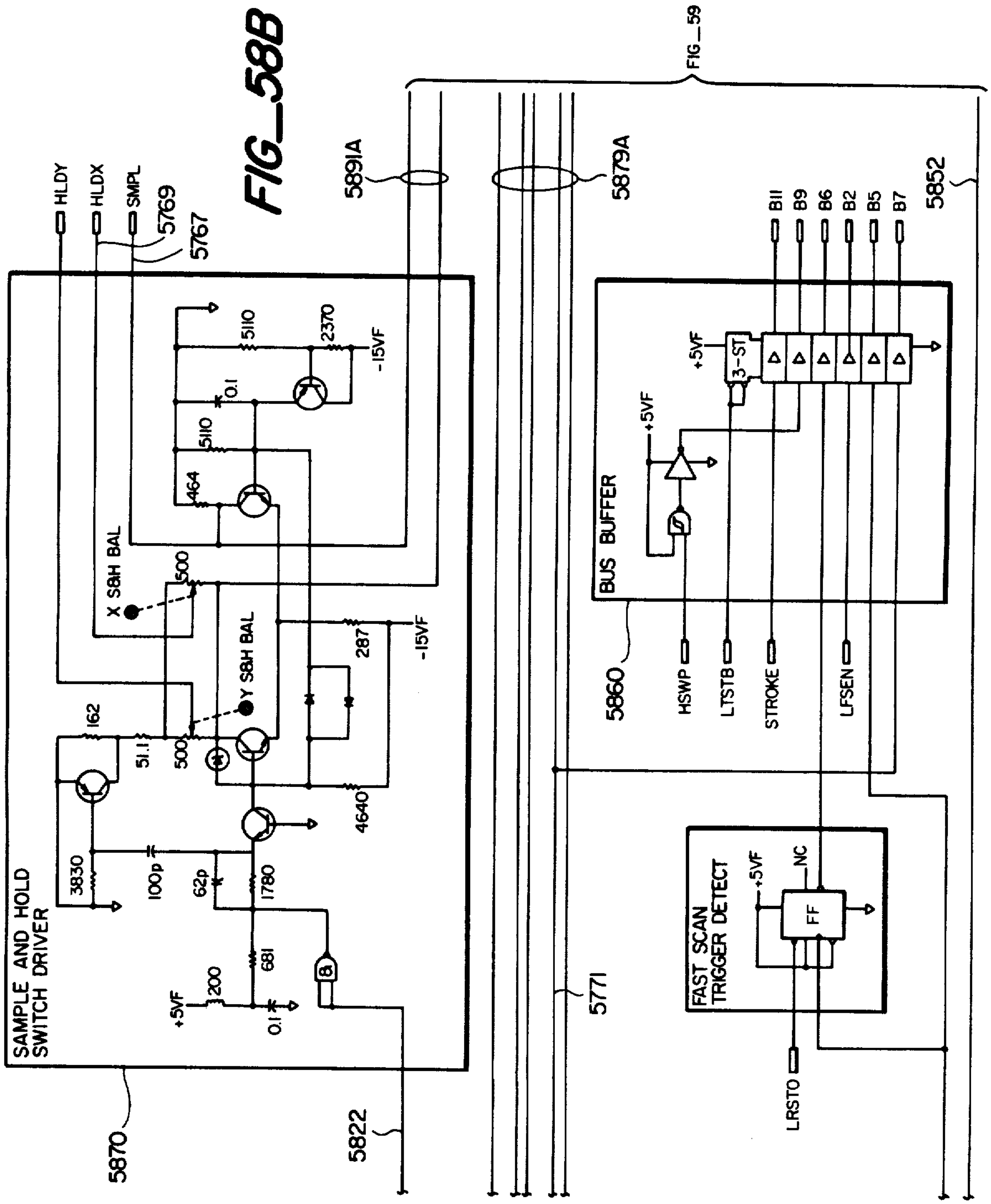
FIG_58B

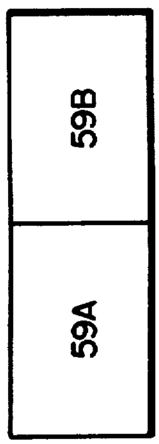
FIG_59

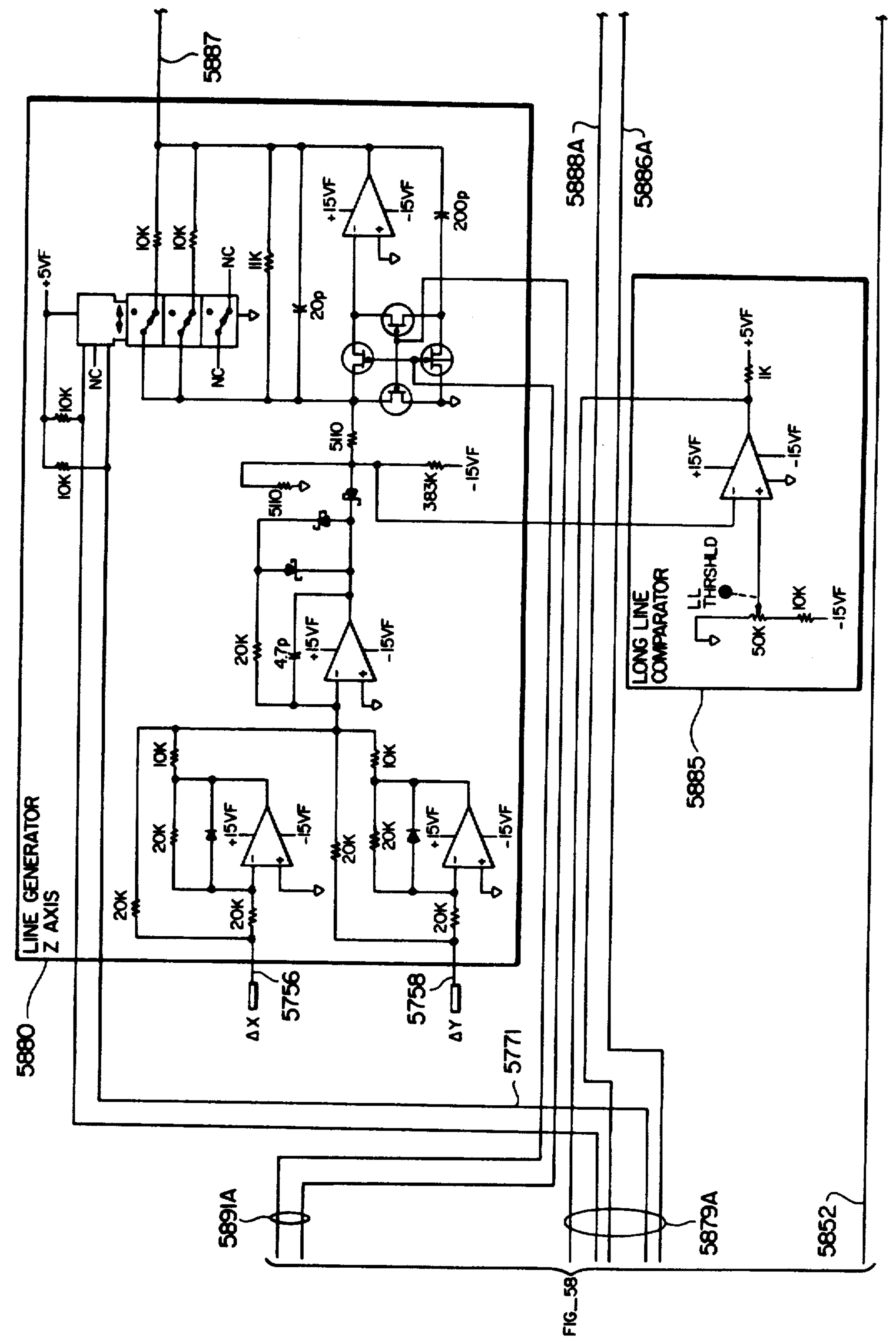
FIG_59A

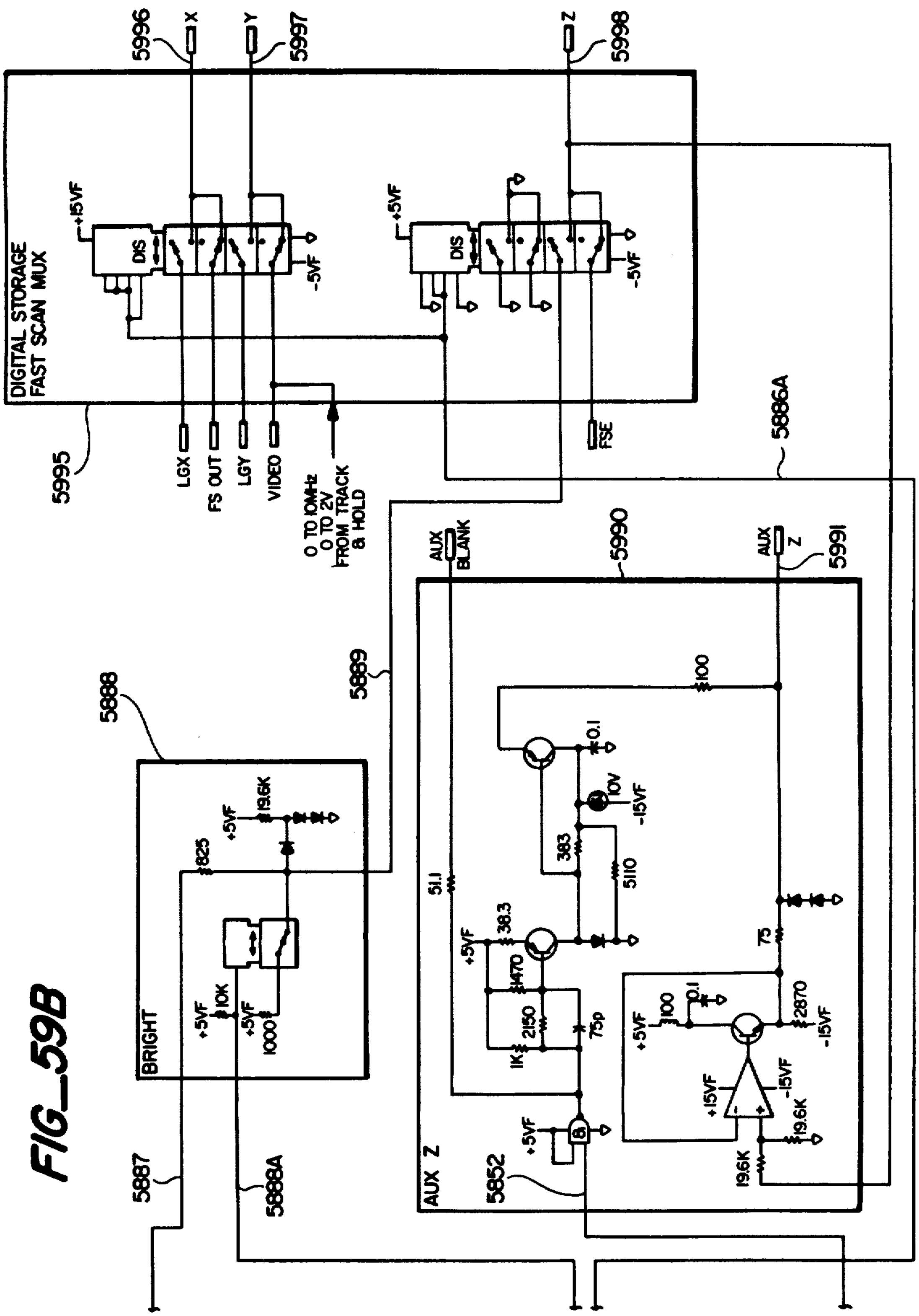
FIG_59B

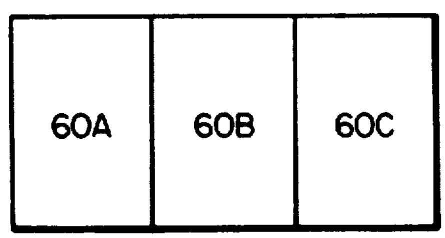
FIG_60

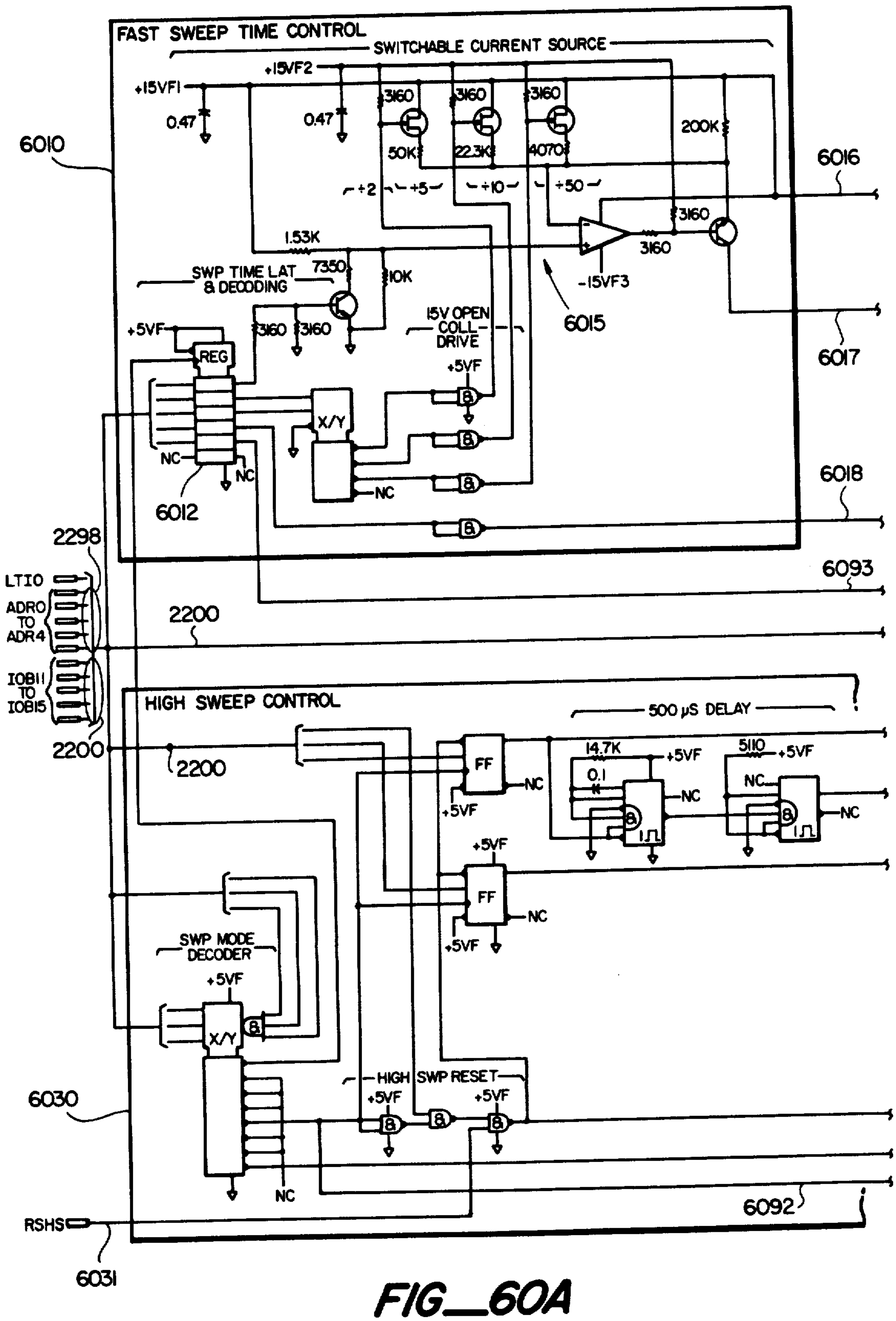
FIG_60A

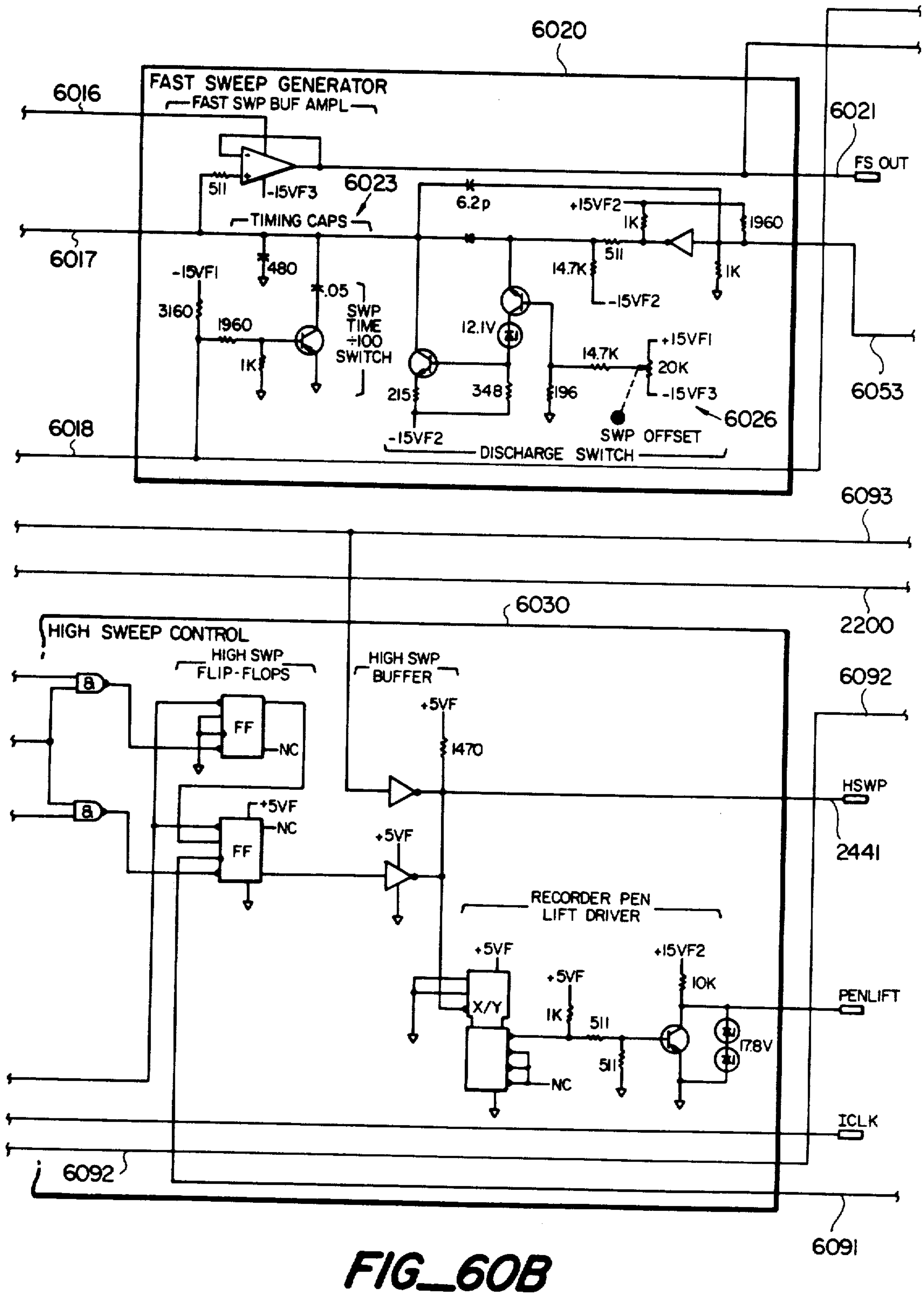
FIG_60B

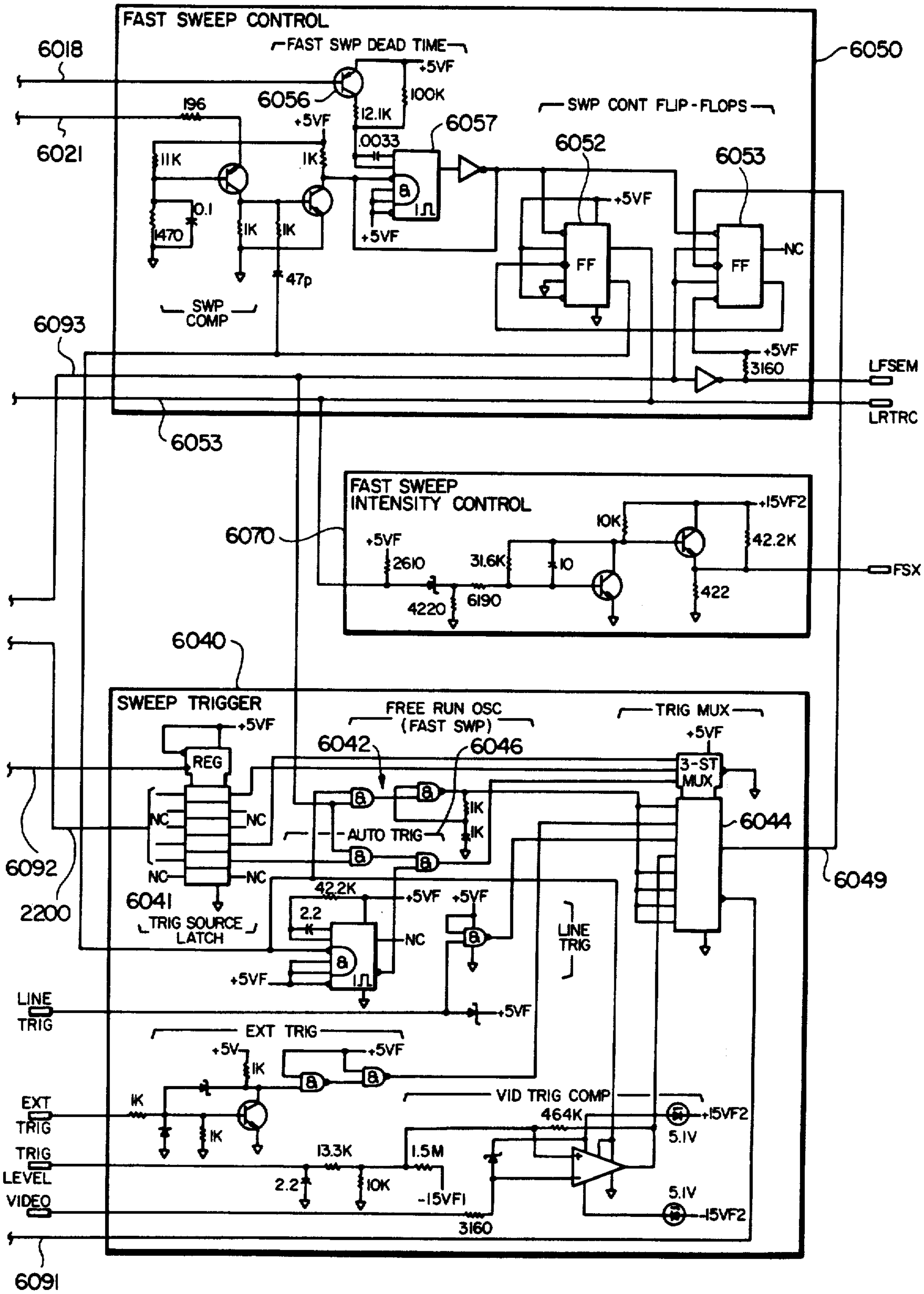
FIG_60C

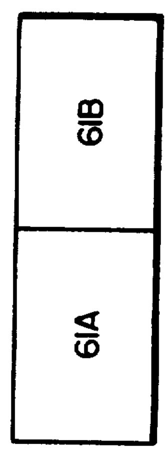
FIG__61

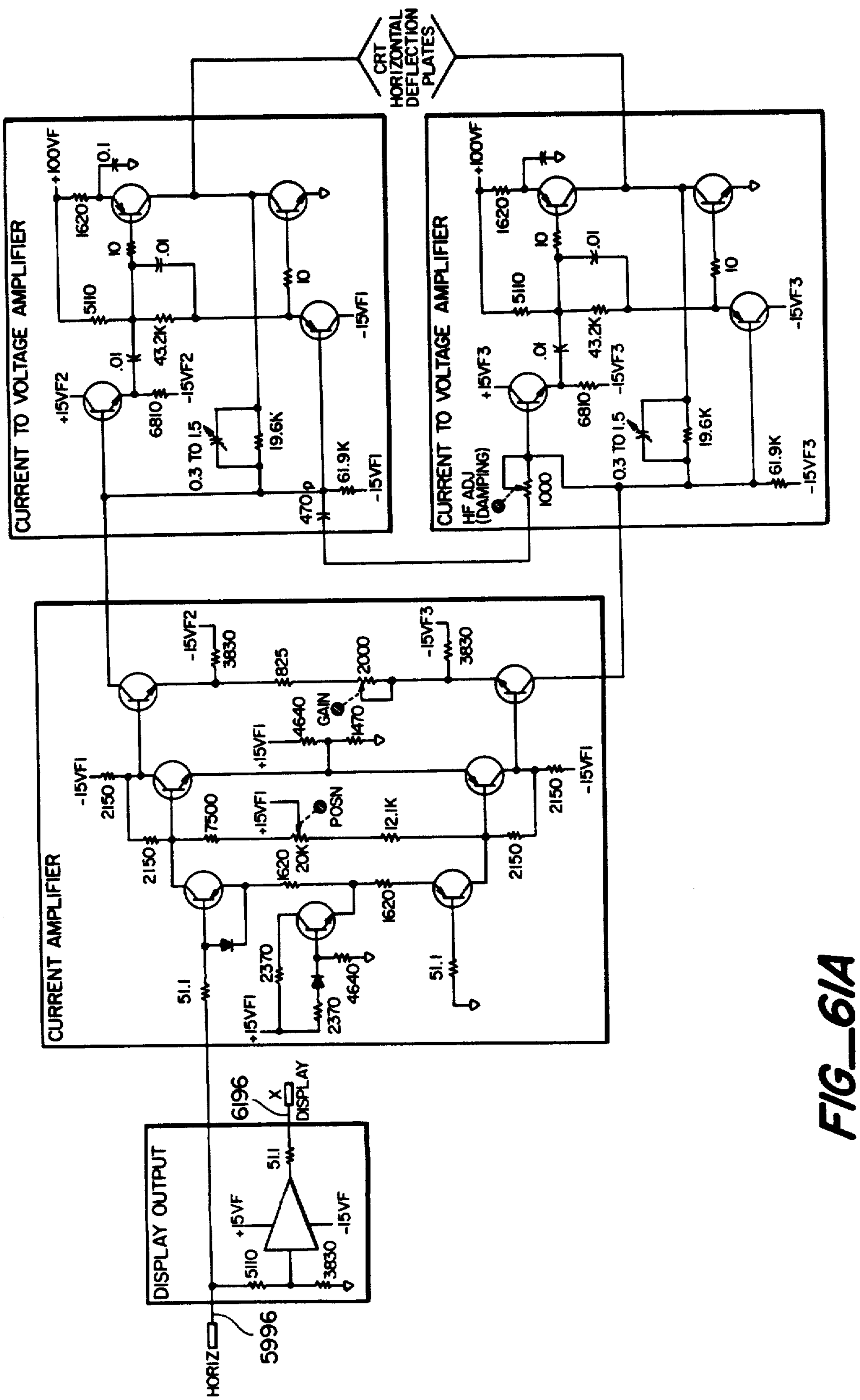
FIG_61A

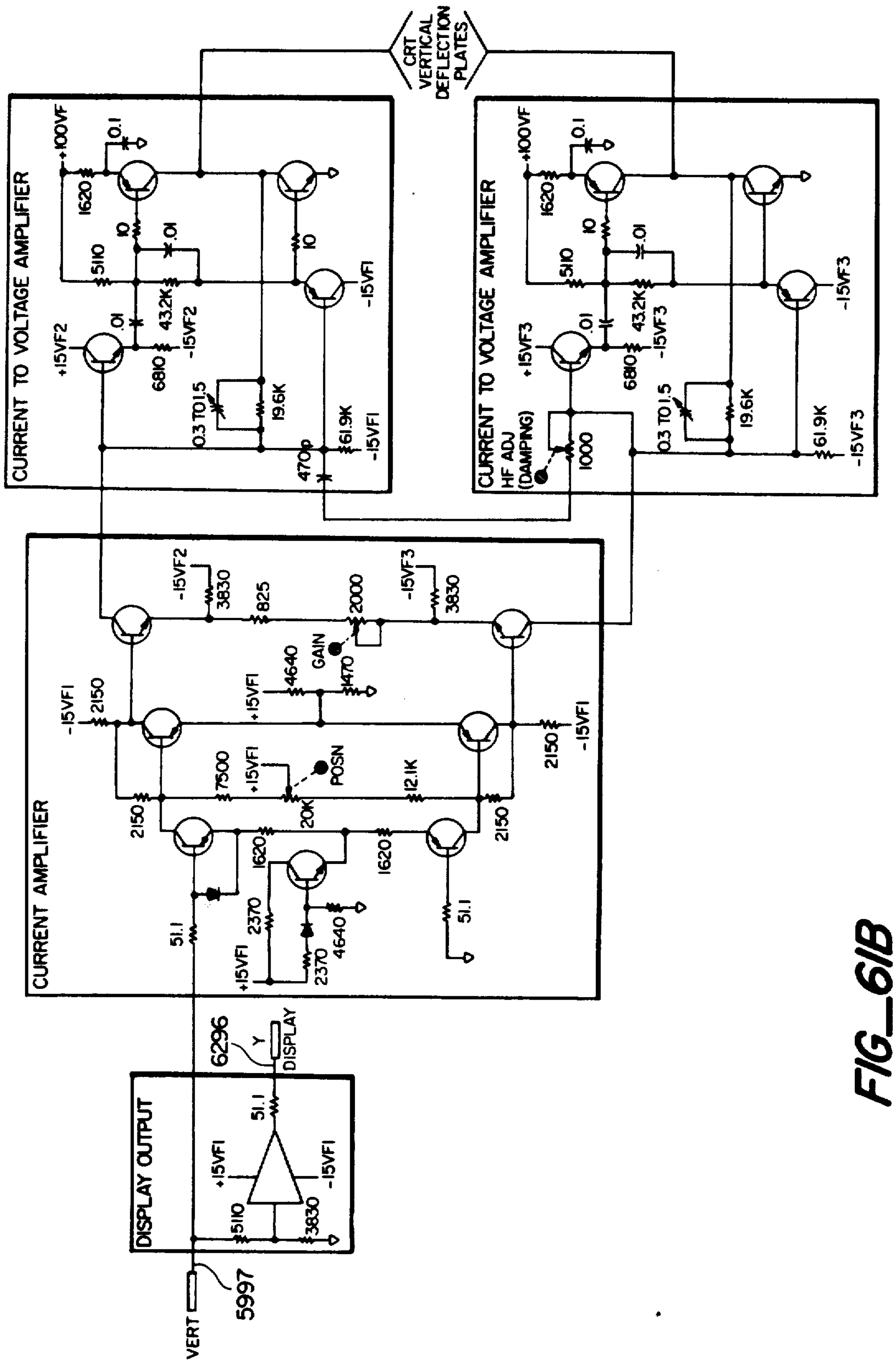
FIG_61B

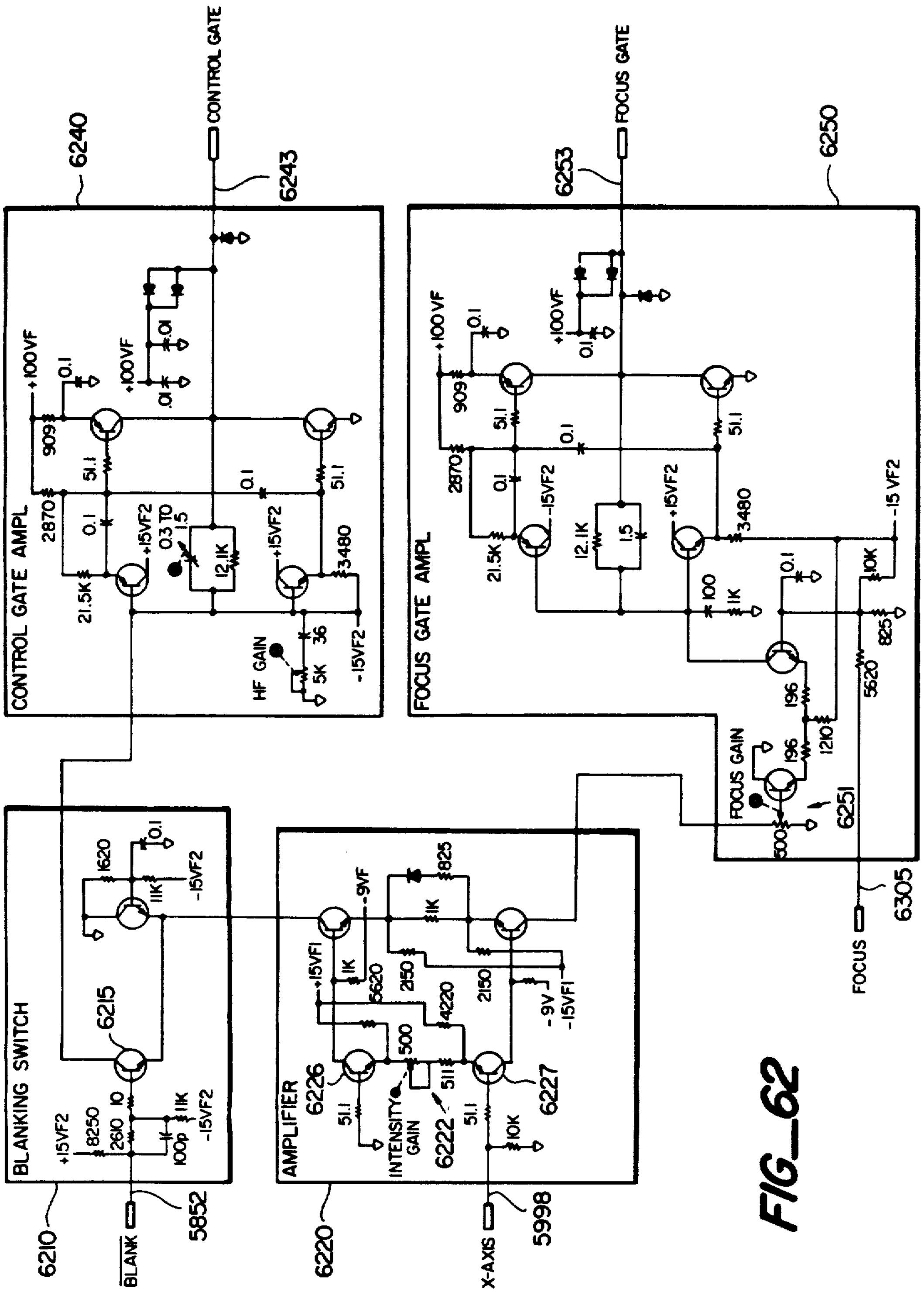
FIG_62

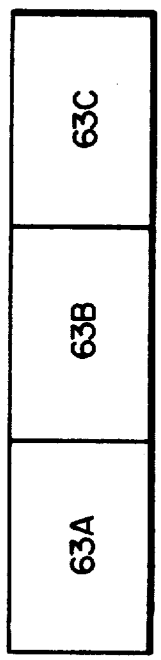
FIG_63

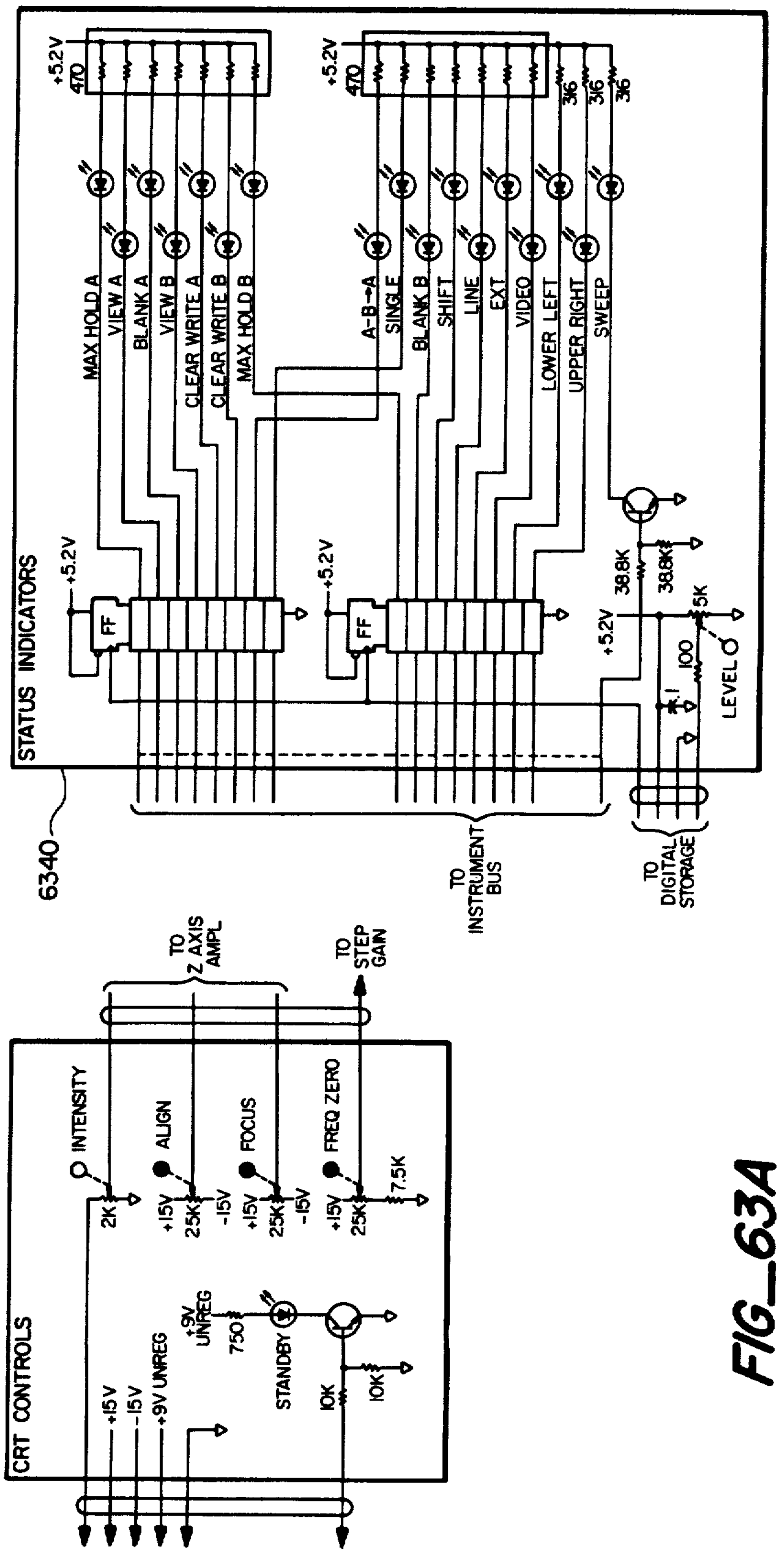
FIG_63A

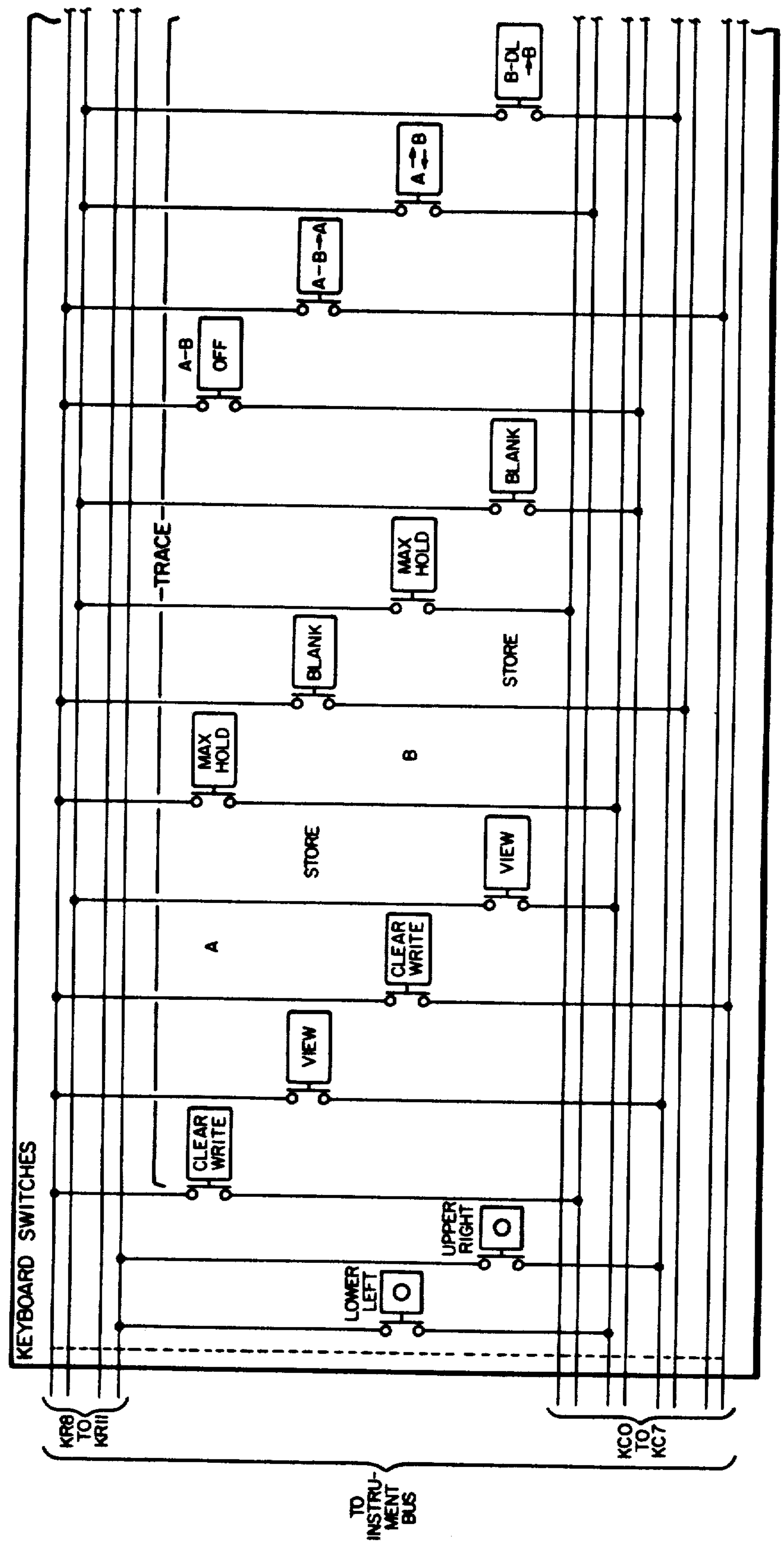
FIG_63B

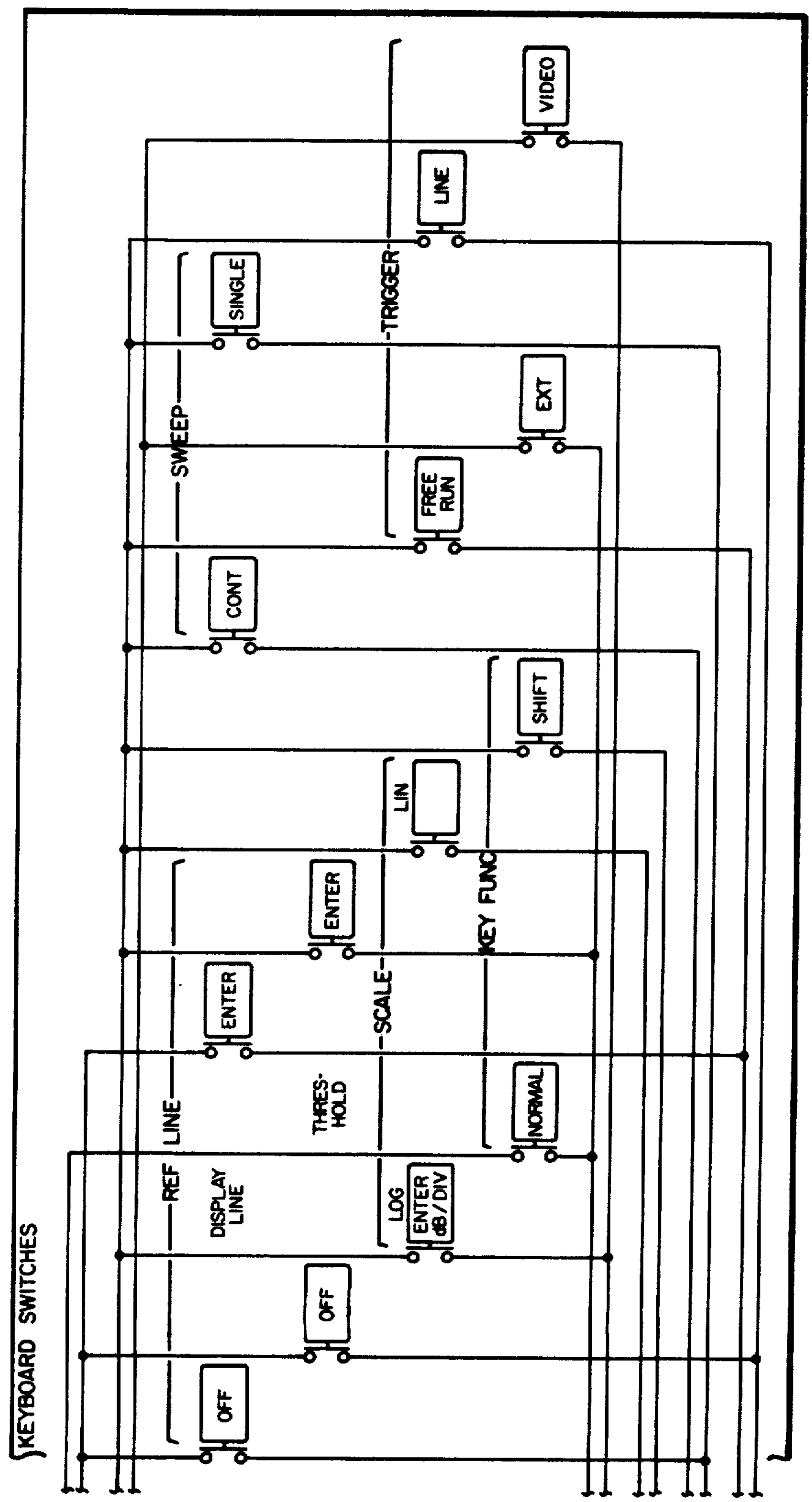
FIG_63C

SPECTRUM ANALYZER HAVING ENTERABLE OFFSETS AND AUTOMATIC DISPLAY ZOOM

BACKGROUND AND SUMMARY OF THE INVENTION

Spectrum Analyzers produce a display of amplitude vs. frequency of an input signal over a user settable frequency range. Typically, the user sets a center frequency and the unit scans over a predetermined band around the center frequency. Also, an amplitude reference is selected.

In previous spectrum analyzers, measurements of different relevant points on the displayed output was difficult to obtain accurately. In contrast, the preferred embodiment of the present invention provides a moveable marker which may be positioned on and moved along the displayed waveform. The frequency and amplitude at the present position of the marker is displayed and updated as the marker is moved. This moveable relative marker may also be used to facilitate the calculation of frequency and amplitude difference between any two selected points on the display. The marker is positioned on a first point. In response to a control button, a second marker is also provided at that point. This second marker image is then moved to the second measurement point. The difference in frequency and amplitude between these two relative positions is read out directly on the display screen itself.

The amplitude and frequency values at the marker position may be used to adjust various parameters in the machine. For example, the marker may be moved to a point on the display and that point may then be entered as a new center frequency, or it may become the amplitude reference level, or it may become the time interval for center frequency stepping, or using both markers, the interval between them may become the span-width for the entire display, i.e., the two marked positions become the start and stop frequencies.

In previous spectrum analyzers, it was difficult to select a particular portion of the displayed signal and then expand about that point as the center frequency. In the preferred embodiment, the marker may be positioned at any signal point, and using step-up and step-down keys, the frequency span-width about that point may be reduced or expanded.

To maintain the selected signal in the center of the display in previous spectrum analyzers, it was necessary to continuously tune the center frequency to coincide with the desired signal to be viewed as the center frequency. In the preferred embodiment, at the end of each scan, the marker may be positioned to coincide with the peak of the signal then being displayed. The frequency of this peak signal is then set to the center frequency, i.e., the center frequency is set to the value of the peak signal. This eliminates the need to reposition the marker as the scale is expanded since minor inaccuracies in positioning the marker are corrected during each expansion of the display. Therefore, as the span is reduced, the signal will remain in the center of the display. Also, if the signal is drifting, this feature will maintain the signal on the screen despite the drift.

Prior spectrum analyzers using rotating controls such as potentiometers and other tuning knobs have typically had fixed sensitivities for changing the control parameter in response to a rotation of the same magnitude, since the sensitivity of these controls was usually designed to accommodate the medium range positions. Therefore, the controls would be too sensitive to comfortably tune the lower bands and would move too slowly when tuning over larger bands. Prior spectrum analyzers have used multiple knobs or complicated clutch mechanisms with gear drives to overcome this problem. In contrast, the preferred embodiment; the sensitivity of the rotating control is controlled by the span-width selected, hence, regardless of the frequency range being displayed, a single rotation will still move the marker or other parameters being displayed the same distance across the display.

Previous spectrum analyzers used rotary controls having detent positions or continuously variable tuning. Each function on the spectrum analyzer was assigned either a detent rotary switch or a continuously variable switch. This had the disadvantage that this was not the optimum mode of entry for values for the most convenient way to enter values into the machine. In contrast in the preferred embodiment, a triple entry mode for data input is provided. Using this system, the parameter to be acted upon, e.g., the center frequency, frequency span, the start or stop frequency, etc. is selected, then the value is entered via a keyboard, step-up and step-down keys, or a rotary tuning control. This has the advantage that one may select the most convenient way to enter values for the mode he is operating in. The rotary knob is most useful when tuning or searching for a signal or specific frequency. The step-up and step-down keys are most convenient when one is progressing forward or backward through a limited set of even increments over a range. of course, the keyboard is most useful for entering the desired value when the exact parameter is known.

In prior spectrum analyzers, if the input signal was preceded by a preamp, a down converter, an up converter, etc., it was necessary to calculate the actual frequency and amplitude for the signal of interest. In contrast the preferred embodiment provides enterable offsets whereby the frequency or amplitude levels can be offset a predetermined amount to calibrate them to take into account the presence of the intervening circuit element.

Also, previous spectrum analyzers were limited to entering a center frequency and span values. In contrast, the preferred embodiment enables the user to input a start and stop frequency and the center frequency and span are automatically determined. In addition, one may enter a new start or stop frequency to increase or decrease the span without having to calculate a center frequency for the band of interest.

In a spectrum analyzer with a digital display, i.e., where the display is produced in response to data representing a discrete number of sampled points, there is the problem that there may not be enough sample points to properly describe the analog signal. The real solutions would be to increase the sampling rate and the number of points displayed, but this is costly and not practical. Other solutions are compromises which sacrifice some information in order to preserve that information which is most useful for spectrum analysis. The preferred embodiment ensures the display of the most important parameter, i.e., correct signal amplitude. It is obtained from a peak detector which precedes the A/D converter. The peak detector holds the max. signal which occurs between samples for the A/D. After sampling the peak detector output, the peak detector is re-set to the input signal level. Thus, no signal peak is lost. Also, the preferred embodiment employs both a positive and negative peak detector circuit to allow a better presentation of signal noise, i.e., give an indication of the amplitude and frequency excursions in the noise signal.

BRIEF DESCRIPTION OF THE DRAWINGS

FIG. 1 is a simple block diagram of the preferred embodiment.

FIG. 2 shows the front panel controls of the preferred embodiment.

FIG. 3 illustrates a typical waveform display in the preferred embodiment.

FIG. 4 illustrates the waveform of the preferred embodiment with the marker in use.

FIG. 5 illustrates the amplitude and frequency difference readouts using the relative marker technique of the preferred embodiment.

FIGS. 6, 7 and 8 illustrate the display which is produced when a frequency or amplitude offset is used.

FIG. 9 illustrates the various active function readouts provided by the preferred embodiment.

FIG. 10 illustrates the X and Y coordinate system used in the display of the preferred embodiment.

FIG. 11 illustrates the display waveforms present when all three traces available in the preferred embodiment are displayed simultaneously.

FIG. 12 is a block diagram of the sweep and refresh operations of the preferred embodiment.

FIG. 13 illustrates the use of the basic marker mode.

FIGS. 14A and 14B illustrate the reading of frequency and amplitude levels of displayed signals using the marker.

FIGS. 15A and 15B illustrate the differential marker technique of the preferred embodiment.

FIGS. 16A, 16B, 16C, 16D and 16E illustrate the marker zoom feature of the preferred embodiment.

FIGS. 17A and 17B illustrate an example of the automatic marker zoom feature of the preferred embodiment.

FIGS. 18A and 18B illustrate the use of the marker and the center frequency control to bring a signal of interest to the center of the display.

FIGS. 19A, 19B and 19C illustrate the changing of the center frequency by selecting start and stop frequencies using the markers.

FIGS. 19C, 19D and 19E illustrate the technique whereby the center frequency may be changed in increments equal to the frequency difference between the two marker positions.

FIG. 19F illustrates the use of the signal tracking feature of the preferred embodiment.

FIGS. 19F and 19G illustrate the signal tracking feature of the preferred embodiment.

FIG. 20 illustrates the relationship of FIGS. 20A and 20B.

FIGS. 20A and 20B taken together are a detailed block diagram of the preferred embodiment.

FIG. 21 illustrates the relationship of FIGS. 21A, 21B and 21C.

FIGS. 21A, 21B and 21C taken together are a circuit diagram of the front panel of the preferred embodiment.

FIG. 22 illustrates the relationship of FIGS. 22A, 22B, 22C, and 22D.

FIGS. 22A, 22B, 22C and 22D taken together illustrate the interface circuitry for the RF section to the processor 2015 of the preferred embodiment.

FIG. 23 is a schematic diagram of the 20 MHz reference circuit of the preferred embodiment.

FIG. 24 illustrates the relationship of FIGS. 24A and 24B.

FIGS. 24A and 24B taken together are a schematic diagram of the frequency control circuitry of the preferred embodiment.

FIG. 25 is a block diagram illustrating the relationship of the YTO, the YTO phase lock circuitry, and other circuits within the preferred embodiment.

FIG. 26 illustrates the relationship of FIGS. 26A and 26B.

FIGS. 26A and 26B taken together are a schematic diagram of the phase lock circuitry of the preferred embodiment.

FIG. 27 shows the relationship of FIGS. 27A and 27B.

FIGS. 27A and 27B taken together are a schematic diagram of the RF converter circuitry of the preferred embodiment.

FIG. 28 is a schematic diagram of the second IF amplifier of the preferred embodiment.

FIG. 29 is a schematic diagram of the third converter circuitry of the preferred embodiment.

FIG. 30 is a schematic diagram of the pilot second IF amplifier of the preferred embodiment.

FIG. 31 is a schematic diagram of the pilot third converter circuitry of the preferred embodiment.

FIG. 32 shows the relationship of FIGS. 32A and 32B.

FIGS. 32A and 32B taken together are a schematic diagram of the 275 MHz phase lock circuitry of the preferred embodiment.

FIG. 33 is a schematic diagram of the 249 MHz phase lock oscillator of the preferred embodiment.

FIG. 34 shows the relationship of FIGS. 34A and 34B.

FIGS. 34A and 34B taken together are a schematic diagram of the 275 MHz phase lock oscillator of the preferred embodiment.

FIG. 35 shows the relationship of FIGS. 35A and 35B.

FIGS. 35A and 35B taken together are a schematic diagram of the 50 MHz voltage tuned oscillator of the preferred embodiment.

FIG. 36 shows the relationship of FIGS. 36A, 36B and 36C.

FIGS. 36A, 36B and 36C taken together are a schematic diagram of the frequency counter circuitry of the preferred embodiment.

FIG. 37 shows the relationship of FIGS. 37A and 37B.

FIGS. 37A and 37B taken together are a schematic diagram of the 249 MHz phase lock circuit of the preferred embodiment.

FIG. 38 shows the relationship of FIGS. 38A, 38B, 38C and 38D.

FIGS. 38A, 38B, 38C and 38D taken together are a schematic diagram of the processor used in the preferred embodiment.

FIG. 39 is a simplified block diagram of the processor used in the preferred embodiment.

FIG. 40 shows the relationship of FIGS. 40A, 40B and 40C.

FIGS. 40A, 40B and 40C taken together are a schematic diagram of the bandwidth filter circuitry of the preferred embodiment.

FIG. 41 shows the relationship of FIGS. 41A and 41B.

FIGS. 41A and 41B taken together are a schematic diagram of the IF control circuitry of the preferred embodiment.

FIG. 42 shows the relationship of FIGS. 42A and 42B.

FIGS. 42A and 42B taken together are a schematic diagram of the log amplifier and filter circuitry of the preferred embodiment.

FIG. 43 shows the relationship of FIGS. 43A and 43B.

FIGS. 43A and 43B taken together are a schematic diagram of the log amplifier and detector circuitry of the preferred embodiment.

FIG. 44 shows the relationship of FIGS. 44A and 44B.

FIGS. 44A and 44B taken together are a schematic diagram of the step gain circuitry of the preferred embodiment.

FIG. 45 shows the relationship of FIGS. 45A and 45B.

FIGS. 45A and 45B taken together are a schematic diagram of the 3 MHz bandwidth filter circuitry of the preferred embodiment.

FIG. 46 shows the relationship of FIGS. 46A and 46B.

FIGS. 46A and 46B taken together are a schematic diagram of the attenuator bandwidth filter circuitry of the preferred embodiment.

FIG. 47 is a schematic diagram of the down converter circuitry of the preferred embodiment.

FIG. 48 is a schematic diagram of the up converter circuitry of the preferred embodiment.

FIG. 49A is a block diagram of the video processing system of the preferred embodiment.

FIGS. 49B, 49C-1 to C-4 and 49D-1 to D-4 show the waveform improvement obtained using the video processing system of the preferred embodiment.

FIG. 50 shows the relationship of FIGS. 50A and 50B.

FIGS. 50A and 50B taken together are a schematic diagram of the video processor circuitry of the preferred embodiment.

FIG. 51 shows the relationship of FIGS. 51A and 51B.

FIGS. 51A and 51B taken together are a schematic diagram of the A/D converter circuitry of the preferred embodiment.

FIG. 52 shows the relationship of FIGS. 52A, 52B and 52C.

FIGS. 52A, 52B and 52C taken together are a schematic diagram of the track and hold circuitry of the preferred embodiment.

FIG. 53 shows the relationship of FIGS. 53A, 53B and 53C.

FIGS. 53A, 53B and 53C taken together are a schematic diagram of the data manipulator circuitry of the preferred embodiment.

FIG. 54 shows the relationship of FIGS. 54A, 54B and 54C.

FIGS. 54A, 54B and 54C taken together are a schematic diagram of the memory main control circuitry of the preferred embodiment.

FIG. 55 shows the relationship of FIGS. 55A and 55B.

FIGS. 55A and 55B taken together are a schematic diagram of the memory interface circuitry of the preferred embodiment.

FIG. 56 shows the relationship of FIGS. 56A, 56B and 56C.

FIGS. 56A, 56B and 56C taken together are a schematic diagram of the memory used in the preferred embodiment.

FIG. 57 shows the relationship of FIGS. 57A and 57B.

FIGS. 57A and 57B taken together are a schematic diagram of the line generator circuitry of the preferred embodiment.

FIG. 58 shows the relationship of FIGS. 58A and 58B.

FIG. 59 shows the relationship of FIGS. 59A and 59B.

FIGS. 58A, 58B, 59A and 59B taken together are a schematic diagram of the intensity control circuits of the preferred embodiment.

FIG. 60 shows the relationship of FIGS. 60A and 60B.

FIGS. 60A and 60B taken together are a schematic diagram of the sweep and video trigger circuits of the preferred embodiment.

FIG. 61 is a schematic diagram of the Y deflection amplifier of the preferred embodiment.

FIG. 62 is a schematic diagram of the X deflection amplifier of the preferred embodiment.

FIG. 63 is a schematic diagram of the status indicators and CRT controls of the preferred embodiment.

DESCRIPTION OF THE PREFERRED EMBODIMENT

Description of Basic Block Diagram

Figure 46B:
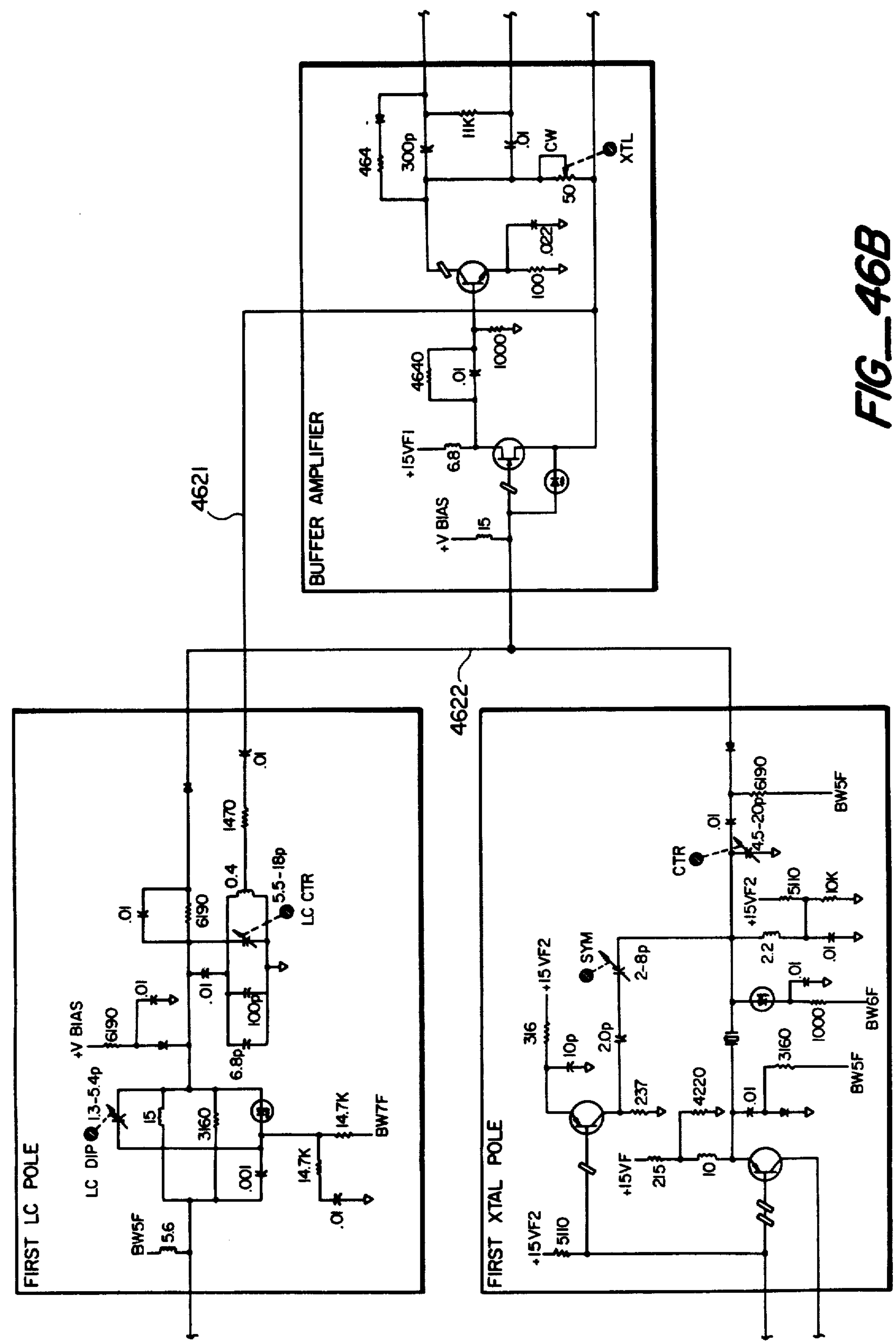

Referring to FIG. 1, there is shown a block diagram of the preferred embodiment. An input signal on line 102 is input to a mixer 104. The signal on line 102 is mixed with the output signals on line 106 from local oscillators 108 to produce intermediate frequency (IF) signals on line 105. These IF signals are then amplified and filtered by IF amplifiers 109. Local oscillators 108 are controlled by tuning control circuits 112 and scan control circuit 114. The output signals from IF amplifiers 109 are input to a detector 111 which generates a video signal on line 123. Under the control of video processor 125 and display controller 135, the output signal is digitized and stored in random access memory 140. The signal on line 115 from scanner 114 is used to determine the address where the digitized values are stored. Other data stored in memory 140 includes special trace constants, display annotations, the graticule, the display marker, and miscellaneous constants and values for other special functions.

The rate of acquisition of the data is controlled by the ramp time of the signal produced by scanner 114. Each ramp is logically divided into 1,000 intervals corresponding to the 1,000 addresses. Likewise, the display screen is divided into 1,000 steps from left to right, each address being one point on the display screen.

The display of the data occurs at a rate determined by display controller 135. Under control of the display controller 135, the data is read out of memory 140 to D to A converter 150 which provides an analog level input to line generator 155 whose output is then coupled to the Y plates on CRT 175. At the same time that display controller 135 is reading the vertical data from memory 140, the horizontal corresponding to the address from which the data came is generated by D to A 160 and output to line generator 165 which is coupled to the X or horizontal plates of CRT 175.

Special display features and input data from front panel 210 are provided over a bus 190. This transfer of data from the front panel 210 to display controller 135 is under the control of the main control processor 250 which has its own ROM 251 and RAM 252 memories.

Activation of keys on front panel 210 which is shown more fully in FIGS. 2 and 63 are serviced by an interrupt type routine which interrogates the front panel to determine what operations have been selected. Once the operation which is selected has been determined, a microprogram corresponding to the operation selected and stored in ROM 251 is executed to perform that operation. Typically, this involves the transfer of data from the main processor to the display controller 135 which operates as a "slave" controller. Slave or display controller 135 then performs the necessary calculations or manipulation of data stored in memory 140 to change the display.

Description of the Front Panel Controls

Referring now to FIG. 2, there is shown the front panel controls of the preferred embodiment. Using the front panel controls shown, the user has convenient control over functions such as center frequency, frequency span, reference level, resolution bandwidth, and sweep time. For example, center frequency is controlled by a switch 260, frequency span is controlled by a switch 262, the start frequency is controlled by a switch 264, the stop frequency is controlled by a switch 266, and the reference level is controlled by a switch 268. Once a function is selected, its value can be changed by using the data control keys 314, 318, 310 and 300. For example, using data keyboard 300, one can enter an exact digital value. Using rotary control 310, one has continuous tuning capability. While using switches 314 and 318, one may change the value of the active function in steps. The changes in values and conditions which are input will also immediately cause the appropriate change in the displayed waveform on display 400.

Basically, the front panel controls are divided into two groups, i.e., function controls and data controls. The type of measurement of the signals input via channels 425 may be selected using the function controls. The data controls and the other miscellaneous functions provided add to the measurement efficiency, convenience and capability of the instrument.

To measure the frequency and amplitude of a signal input via input controls 425, the signal is first moved to the center of display 400 by pressing center frequency control 260 and then rotating rotary control 310 until the part of the signal waveform which is desired to be measured is centered in the display. When the signal is centered, the readout on display 400 will automatically display the signal frequency at positions 451 and 452 as shown in FIG. 3.

For better frequency resolution the frequency span of the display may be narrowed by pressing frequency span control 262 and then pressing step down control 314. The new span value would be displayed in position 453 as shown in FIG. 3. The signal peak would then be brought to the reference level by activating reference level switch 268, control 314 and then adjusting rotary control 310.

The most convenient place to start a new measurement is with a full 1500 MHz frequency span. This is most easily accomplished by pressing instrument preset control 230. This automatically presets all the analyzer functions to a 0 Hz to 1500 MHz display with a 0 dBm reference level. In this way, the entire 1500 MHz span possible with the preferred embodiment may be viewed to facilitate selection of the particular frequency range to investigate.

Signal frequencies and amplitudes as well as differences between various signals can be read out directly using the marker controls 380 and the various data controls described above. The marker is activated by pressing marker normal switch 381. The rotary control knob 310 is then used to position the marker 410 as shown in FIG. 4. The amplitude and frequency of the signal at the marker position are read out continuously at position 412. Therefore, as one moves the marker along the signal waveform by moving rotary control 310, the MHz and dBm displays are continuously updated.

Using this feature of the preferred embodiment it is possible to measure the differences between any two points on the displayed waveform. For example, if the marker was at position 410 and one measured the difference between the marker position 410 as shown in FIG. 4 and the next signal peak, 411, one would press marker control button 382 and use rotary control 310 to move the second marker to peak 411. The amplitude and frequency differences are then read out continuously in position 415 as shown in FIG. 5. More measurement techniques using the marker are discussed in more detail below.

The data controls are used to both enter and change function values for the selected function. Rotary control 310 and the data step keys 314 and 318 are used to make incremental changes to the value of the activated function. To the right of the function keys 390 is the data keyboard 300 which allows the stored value to be changed or an exact value input. Furthermore, these data controls change the activated function value in a manner which depends on the specific function selected and the current value of that function. For example, if the center frequency function has been selected by center frequency switch 260, the center frequency can be changed continuously with rotary control 310 or in steps proportional to the frequency span with the data step keys 314 and 318, or set exactly with the data number units keyboard 300. Resolution bandwidth can be set only to discrete values. An entry from the keyboard which may not coincide with an allowable bandwidth will select the nearest bandwidth. All data entries are displayed on the CRT as they are changed.

If it is desired to prevent data entry, the function can be deactivated by pressing hold switch 320. The active function readout is then blanked and the enabled light 321 goes out, indicating that no data entry can be made. The reenabling of the data controls is accomplished by pressing any function key.

Rotary data control 310 allows the continuous change of center frequency, frequency span, reference level, and the positions of the marker, display line and threshold. It can also change the function values which are only incremented. Clockwise rotation of the rotary control 310 will increase the functional value. For continuous changes, the sensitivity of rotary control 310 is determined by both the measurement range and the speed at which the knob is turned. For example, when the center frequency is activated, control knob 310 increases the value of the center frequency one horizontal division of span per one quarter turn.

Data step keys 314 and 318 allow rapid increase or decrease of the active function value. The step size is dependent either upon the analyzers measurements range, a preset amount, or, for those parameters with fixed values, the next value in a sequence. For example, if center frequency control 260 has been activated, step control 318 will increase the center frequency value by an amount equal to one division of the frequency span, i.e., 1/10 of the frequency span. If the center frequency step size has been preset using control 228, step control 318 will increase the center frequency by that preset amount. If the frequency span function was selected using control 262, step control 314 would change the span to the next lower value in predetermined sequence. If the center frequency is selected, each press of these step buttons results in a single step up or down of the center frequency value equal to the preselected value of 10% or to a preselected step value which has been stored using control 228.

The data keyboard 300 allows exact value entries to center frequency, frequency span, reference level, log scale and the positions of the markers, the display line, threshold and the coupled functions. Coupled functions are those in which selection of one parameter will automatically select certain values for other parameters. This operation occurs whenever machine is in the auto mode as selected by controls 210, 214, 218, 222 and 226. This function can be disabled by placing these controls in the manual position. Function control 268 changes the absolute amplitude level of the top graticule line. The amplitude scale, i.e., the number of amplitude units per division is entered from the scale control group 225. Signal responses below the top graticule are measured by bringing the response to the reference level by activating switch 268. The maximum reference level value available is dependent on the input attenuator setting. Levels to the input mixer which could cause gain compression will be displayed off the top of the reference level graticule. The maximum reference level limit can be extended by activating shift control switch 410 and attenuate control switch 223. The reference level can be changed from +30 dBm to −99.9 dBm in 0.1 dB steps. Reference level dBm units are selected by instrument preset control 230 or with key function shift control 410. Reference level units may be read in dBmV, dBuV and volts. Of course, when a unit change is made, all readouts are converted so as to preserve the absolute power levels of all the readouts on the display.

The display readout of frequency and amplitude can be offset by values entered through using shift control key 410. The offset values are read out on the display. An offset frequency is entered by pressing shift control key 410, center frequency key 260 and then inputting the desired value via the data entry controls. An amplitude offset is entered by pressing shift control key 410, reference level control 268, and then inputting the desired amplitude offset via the data entry controls, i.e., keyboard 300. The amplitude offset can be used to take into effect external R.F. attenuation or gain in the reference level reading so that the signal level measured is the level at the input of the amplitude conversion device which is interposed between the spectrum analyzer and the signal source. For example, frequency offsets can be input such that when the spectrum analyzer of the preferred embodiment is used following a down converter, the frequency parameters can be entered and read out in actual, i.e., high frequency values. In the reverse situation, when an external preamplifier is used, its gain or loss may be taken into account to display the true signal level of the signal of interest before the preamplifier stage. Frequency offset is entered by activating shift control 410 followed by center frequency 260, and then inputting the desired frequency offset via data entry controls 300, 310, 314 and 318. This frequency offset may be used, for example, to provide a base band frequency display scale for a signal which has been converted up or down. Amplitude offset is entered by activating shift key 410 followed by reference level control 268 and then inputting the desired amplitude offset via data keyboard 300, rotary control 310 and/or step control keys 314 and 318. This amplitude offset can be used to take into effect external R.F. attenuation or gain in the reference level reading so that the signal measurement corresponds to the level at the input of the amplitude conversion device.

To eliminate a frequency offset, one simply activates shift control 410, followed by center frequency control 260, and then inputs a data offset value of zero. Also, any frequency or amplitude offset can be eliminated by pressing instrument preset control 230. The frequency or amplitude offset is added to all the frequency or amplitude readouts, respectively, on the CRT display including the marker, the display line, threshhold, and the start frequency and stop frequency values which are displayed.

Data entry from the keyboard may be in Hz, kHz, MHz or GHz for frequency and dBm, −dBm, mV and uV for amplitude. The amplitude offset readout is always in dB. An entry in voltage can be made and will be converted to dB offset. Least significant digits are rounded for frequency inputs and dropped for amplitude offset entries. An example of the display which is produced when a frequency or amplitude offset is used in the preferred embodiment is shown in FIG. 6. Note that the amplitude offset is displayed in position 610 while the frequency offset is displayed in positions 611 and 612.

For example, assume that a 102.6 MHz up converter with 12.7 dB attenuation is placed between a signal source and the preferred embodiment. The offsets can be set so that the CRT display shows the trace reference to the signal as input to the converter. Amplitude offset is entered as a positive value since the amplitude readout must represent a more powerful signal. To enter the offset value in this example, one would press shift control key 410, reference level control 268 and enter 12.7 on data entry keyboard 300 followed by +dBm units key 601. The offset is displayed in position 610 as shown in FIG. 7.

Frequency offset is entered as a negative, since the input to the converter is lower than the value displayed. To enter a frequency offset one would press shift control key 410, followed by hold key 320, followed by center frequency control 390, and then input 102.6 on data entry keyboard 300, followed by MHz units key 602. The frequency offset would be displayed in position 618 on the display and the new value for the center frequency would be displayed in position 619, as shown in FIG. 8.

Referring now to FIG. 9 there is shown the display of the preferred embodiment. The entire frequency span being analyzed is displayed across the horizontal width of the display, the start frequency occurring at the leftmost edge 905 of the display while the stop frequency occurs at the right-most edge 907 of the display. The center frequency is represented by the center vertical line 911 in the middle of the display. Various function readouts are provided to help interpret the waveform 915 which is being displayed. For example, the reference level is displayed in position 917. Marker frequency and amplitude are displayed in position 922 whenever a marker option is selected. Sweep time is displayed in position 925. The start frequency or the center frequency are displayed in position 927, depending upon which function is active, while the stop frequency or frequency span is displayed in position 929, depending upon which function has been selected.

There is also an active function readout for the function which is under current data control. In FIG. 9, the start frequency has been selected to be changed via keyboard 300, rotary control 310 or step control buttons 314 and 318. Therefore, the word start is displayed in position 931. The start frequency was selected by start frequency control switch 264. Similarly, if the center frequency control 260, reference level control 268, stop frequency 266 or frequency span 262 were selected, the display would so indicate in position 931. If the marker functions 380 were selected, the marker frequency and amplitude would be displayed in this position. This display of the frequency and/or amplitude will change dynamically with the manipulation of the data controls.

The full scale sweep speed is indicated in position 925. The video bandwidth is displayed in position 936. The resolution bandwidth is displayed in position 936. The RF attentuation is displayed in position 940 while if the measurement is uncalibrated, this will be indicated in position 945. The threshhold level is displayed in position 950, while the display line parameters are displayed in position 951 and the amplitude offset value is displayed in position 952. It should be noted that the displayed parameters shown in FIG. 9 are not necessarily always displayed together. For example, the measurement uncalibrated message shown in position 945 would only be present if the measurement were uncalibrated. Furthermore, the active function and value in position 931 would depend upon the function selected by the function control keys 390.

Display Traces

Three separate traces referred to as Trace A, Trace B and Trace C can be written onto the display. Each trace is generated from 1,001 points across the graticule, connected by 1,000 point-to-point straight line vectors. The location of each point is designated by an X and a Y location using the graticule as a system of rectangular coordinates. This may be more clearly shown in FIG. 10. In addition, a trace over-range area which is also calibrated is provided which comprises an additional 23 display units above the top reference level graticule.

Trace controls 1,000 as shown in FIG. 2, may be used for controlling the writing, storing and manipulating of trace data. The three different traces are differentiated by their intensity. Trace A is bright, while Trace B and Trace C are comparatively dimmer. However, when there is any doubt, the specific trace can be isolated using view control 1010, blank control 1011, view control 1012 and blank control 1013.

Four mutually exclusive trace modes for Traces A and B determine the manner in which the traces are displayed. Indicator lights such as indicator 1003 indicate the current trace mode. Clear-Write control 1001 causes the display of the input signal response in Trace A. Max hold control 1002 causes the display and holding of the maximum responses of the input signal in Trace A. Both these controls are referred to as write mode controls, since they deal with the trace during a sweeping operation.

Store mode controls such as view control 1010 and blank control 1011 act on the trace information when the preferred embodiment is not in the sweeping mode. The view controls such as view control 1010 causes the storing of the current trace information in memory and displays it on the CRT. The blank controls such as blank control 1011 causes the storing of the current trace information and blanks it from the CRT display. An illustration of the display when all three traces are present is shown in FIG. 11.

Trace Memory

Display traces are not written onto the display directly from the spectrum analyzers IF section. Instead, the analog signal response from the IF section is converted into digital words and stored in a trace memory. The contents of these trace memories is then used to create the display on the CRT display. The way in which this information in the trace memories is displayed depends upon the trace mode selected by trace controls 1,000. A block diagram showing these steps is shown in FIG. 12. The analyzers response is transferred into the trace memories at the sweep rate of the analyzer, i.e., its sweep time. The trace memory is then written onto the display at a refresh rate of about 50 Hz, rapid enough to prevent flickering of the trace on the CRT display. This refresh rate remains constant and therefore, the trace intensities also remain constant, regardless of how the sweep times of the spectrum analyzer are changed. Note that in the specification the word sweep refers to the spectrum analyzer sweeping from a start frequency to a stop frequency while the term refresh refers to the transfer of display memory data to the display.

For the write modes, those selected using the clear write and max hold controls 1001, 1002, 1008 and 1009, the analyzer signal response is written into trace memory during the sweep and the memory contents are then immediately displayed on the CRT. When first activated, the clear write controls of the 1001 and 1008 sets all the values in their respective trace memory to zero, i.e., the trace will sweep along the bottom line graticule if no data is input to the memory. The max hold controls 1002 and 1009 cause the latest analyzer signal response to be written into its respective trace memory only at those data words that correspond to the horizontal positions where the latest signal response is greater than the previously stored signal response values. When both clear write controls 1001 and 1008 are activated, the preferred embodiment will sweep and alternately write into trace memories A and B. Using the store mode controls 1010, 1011, 1012 and 1013, the previous memory data is saved, and no updating of the trace memory is made. The view controls 1010 and 1012 cause the trace data stored in their respective memories to be displayed on the CRT. Blank controls 1011 and 1013 cause the trace data not to be displayed on the CRT.

Marker

There are two basic types of functions which are possible using the marker. Marker modes under the control of controls 381, 382, 383, 384, 385 and 386 are used to enable or disable the markers and their related functions. Marker entry controls 387, 388, 389 and 379 are used to allow the scaling of the display frequency and amplitude using the marker information.

The term markers is used in the preferred embodiment to refer to bright spots which are created directly on the display trace. The horizontal position of an activated marker is controlled by the data controls, i.e., keyboard 300, rotary control 310 and step keys 314 and 318. Using these controls, the marker can be positioned at a specific frequency with the data keyboard moved along the trace using rotary control 310 or caused to move along the trace in predetermined intervals using the step control keys 314 and 318. The readout of the marker amplitude and frequency, i.e., the amplitude and frequency of the trace where the marker is currently located, appears in the upper right of the display outside the graticule. This is as shown in FIG. 13 in position 1301.

When a marker mode is active through the use of controls 381, 382, 383, 384 and 385, the amplitude and frequency will also be displayed in the active function area of the graticule, that is, position 931.

Briefly, the marker controls operate as follows: Control 386 is used to turn the marker function on and off. Normal control 381 causes the direct readout of the amplitude and frequency of the point where the marker is along the trace. To cause the direct readout of the amplitude and frequency differences between two points on the trace, one activates control 382. The present position of the marker on the trace when this control is activated then becomes the reference point for subsequent measurements as the marker is moved along the trace.

An activated marker mode can be deactivated by activating another function such as display line or by data hold control 320. This does not erase the marker itself, nor does it suspend the upper right display readout features. When the marker mode is reactivated, the data controls and active function readouts will simply continue from their last position.

Normal control 381 activates a single marker at the center of the display on the trace of highest priority if multiple traces are being displayed. Trace priority is defined in greater detail below. Once the marker is displayed on the trace, it may be moved along the trace by using the data entry controls 310, 314, 318 and the data entry keyboard 300. Rotation of rotary control 310 moves the marker continuously along the displayed trace at about five horizontal divisions for each full turn. The marker appears to move smoothly along the trace, but it is actually moving in the smallest display unit increments which in the preferred embodiment are 1,000 units for the full horizontal span. Step controls 314 and 318 move the marker along the trace one-tenth of the total width per step. In the preferred embodiment, step control 314 moves the marker to the left while step control 318 moves the marker to the right. For exact positioning of the marker, values entered via keyboard 300 will cause the marker to be placed at the frequency entered. If one enters a frequency which is out of range of the displayed span, the marker will be placed at the graticule edge.

The marker greatly simplifies reading the frequencies and amplitudes of displayed signals. This is explained with respect to FIGS. 14A and 14B. For a given display, the single marker is activated by pressing normal control 381. This causes the frequency and amplitude information to be read out in display areas 1402 and 1403. Assume, for example, that one was interested in determining the frequency and amplitude of the signal peaks 1404 and 1405. To read the frequency and amplitude values at peak 1405, one would move rotary control 310 to move the marker along the waveform until it was positioned at signal peak 1405 as shown in FIG. 14A. To read the information for signal peak 1404, one would move the rotary control 310 counter-clockwise until the marker 1400 was positioned at peak 1404 on waveform 1410. The frequency and amplitude information is read out continuously as the marker is moved. Therefore, as the marker is moved towards the peak, one can be sure when the peak is reached because it will be the highest amplitude displayed in display areas 1402 and 1403. As one moves the marker to either side of the peak of the signal waveform of interest, the amplitude reading would decrease. Thus, exact positioning of the marker is possible.

The differential marker technique using control 382 may be used to measure differences in frequency and amplitude between two points on the signal waveform. Activating control 382 causes a second marker to be generated at the position of the single marker already on the trace. If no single marker has been activated, control 382 will cause two markers to be generated at the center of the display. The first markers position is fixed. The second markers position, however, may be changed using the data controls 310, 314, 318 and keyboard 300. As the second marker is moved along the waveform, the first marker now stationary is used as a reference point. As the second marker is moved along the trace, the difference in frequency and amplitude between that markers position and the reference marker will be displayed in positions 1402 and 1403. An example showing the use of this differential marker technique is shown with respect to FIGS. 15A and 15B.

Referring now to FIG. 15A, assume that one is interested in determining the frequency and amplitude differential between the signal peak 1502 and the signal peak 1503. First, the marker would be set on one of the signal peaks, e.g., signal peak 1502 as shown, by using rotary control 310. Control 382 would then be activated to generate a second marker at this position.

Rotary control 310 would then be moved in the clockwise direction to move the second marker to peak 1503. The differences in the frequency and amplitude at the two signal peaks will then be read directly on the marker display in position 1402. In the example shown in FIG. 15B, the frequency difference is 7.67 MHz and −34.60 dB. As the marker is moved, the display in position 1402 changes dynamically. In this way, one can be sure that one is positioned at the very peak of the signal waveform at point 1503, since it will be the smallest differential displayed as one crosses the peak at point 1503.

Marker Zoom

Control 383 activates a single marker on the trace of highest priority. When the zoom mode is selected by control 383, rotary control 310 and step control keys 314 and 318 change the values of different functions. Rotary control 310 is used to position the marker along the signal waveform. Step controls 314 and 318, however, change the frequency span displayed by the spectrum analyzer and cause the frequency at the current marker position to become the new center frequency for the display. Thus, one moves the marker along the trace with rotary control 310 until a portion of the display is reached which is desired to be the new center frequency. Also, one may press zoom control 383 and then enter in an exact frequency via data keyboard 300. This will cause the marker to be positioned at that exact frequency on the display waveform. If that frequency is not on the display waveform, then the marker will be positioned at the graticule border.

For example, in wide frequency spans, it is often necessary to expand a portion of the frequency span about a specific signal in order to resolve questions regarding modulation sidebands or frequency drift. The use of the marker zoom feature to facilitate the display of the desired waveform and the desired frequency span is shown below with reference to FIGS. 16A, 16B, 16C, 16D and 16E.

Referring now to FIG. 16A there is shown a full span display from zero Hz to 1500 MHz. A specific signal of interest is selected by activating zoom control 383 and using rotary control 310 to position the marker at a waveform peak 1601. To center the marker and the signal peak in the display and also expand the frequency span in one step, one would simply press step control 314 to achieve the display shown in FIG. 16B. For further expansion of the display about this signal, one could simply press step control 314 twice more to achieve the display shown in FIG. 16C. The marker could then be more accurately positioned at the signal peak using rotary control 310 to achieve the display shown in FIG. 16D. This recentering and expanding can be continued until the desired display is achieved. For example, one could continue expanding the display using step control 314 and recentering the marker using rotary control 310 until the display as shown in FIG. 16E was achieved. Note that the frequency span in FIG. 16E is from 257.39 MHz to 262.39 MHz with a center frequency at 259.890 MHz. As with the other marker functions, the marker mode may be disabled using control 386 which will also cause the marker readout to be blanked from the CRT display.

Automatic Zoom

The preferred embodiment can automatically zoom in on a signal peak specified by a marker. The desired frequency span can be directly input via keyboard 300. To use this automatic zoom function of the preferred embodiment, one would press normal marker control 381 and position rotary control 310 to identify the signal to be zoomed in upon. Then one would press signal track control 385 followed by span control 262 and then the desired frequency span would be entered via data keyboard 300. When the selected units key, e.g., key 601, 602, 603 or 604, is activated, the zooming process will begin.

Referring now to FIG. 17A and 17B, there is shown an example using the zooming process. Assume that a single carrier needs to be examined in a 200 KHz span in order to see the side bands present. A marker would be placed on the carrier of interest by pressing normal control 381 and positioning the marker using rotary control 310. One would then press signal track control 385 followed by frequency span control 262. The value of the desired frequency span would be entered via keyboard 300 by pressing digit keys 2,0,0, and the units key for KHz. The auto zoom process would then be completed and a display as shown in FIG. 17B would be displayed.

Peak Search

Activation of peak search control 387 places a single marker at the highest trace position of the highest priority trace. The active function is not changed. Using this control, one may place the marker at the peak of the signal response without using any of the other controls. The marker seeks the maximum trace response.

Marker Entry

Marker to center frequency control 388, marker to reference level control 379 and marker delta control 389 are used to immediately set the corresponding function value equal to the readout of the active marker or markers. When one presses control 388, the frequency at the current position of the marker automatically becomes the center frequency. Similarly pressing marker to reference level control 379 causes the amplitude at the current marker position to become the reference level value. Also, one may use the marker delta control 382 to place a second marker on the screen. Thereafter, control 389 may be used to cause the step size affected by step control 314 and 318 to be equal to the difference between the two marker positions.

One of the fastest and most convenient ways to bring a signal of interest to the center of the display as the center frequency is by using control 388. One simply activates a single marker by, e.g., control 381 and brings it to the desired signal using rotary control 310 or peak search control 387 if it is the largest signal displayed. The signal frequency where the marker is positioned may then become the center frequency by simply pressing control 388. The display before and after pressing of control 388 is shown with reference to FIGS. 18A and 18B, respectively. A single marker is activated and brought to the desired signal point by pressing control 381 to activate a single marker and then using rotary control 310 to bring it to the desired signal point, for example, as shown in FIG. 18A. Note that if this signal point is also the highest trace position on the highest priority trace, peak search control 387 may be used to place the marker at this position. Once a marker is positioned, the center frequency may be changed to the marker frequency by simply pressing control 388.

Control 388 may also be used to change the center frequency if start and stop frequencies are read out. In this way, the markers may be used to tune to a particular portion of a spectrum being displayed. This is shown with respect to FIGS. 19A, 19B, and 19C. A single marker is activated and placed at either end of the desired frequency span using control 381 and rotary control 310. For example, at point 1901 as shown in FIG. 19A, a second marker is activated using control 382 and positioned using rotary control 310. The start and stop frequencies for the displayed frequency span may then be set equal to the left and right marker frequencies, respectively, by shift control key 410 followed by control 382. The frequency difference between the two marker positions then automatically becomes the frequency span for the display.

The data step keys 314 and 318 can also be used to move the center frequency in increments equal to the marker or marker differential frequency. This is illustrated with respect to FIGS. 19C, 19D and 19E wherein there is shown a technique for viewing a fundamental and its harmonics or any other evenly spaced portion of the spectrum with high resolution. First, one would narrow the frequency span displayed about the fundamental frequency of interest as necessary using zoom control 383 as described above, centering the carrier frequency as needed. One then sets the center frequency step size by positioning the markers and pressing control 389. The center frequency is now enabled by pressing control 390. Therefore, with each press of step control key 318, successive harmonics will be displayed. For example, as shown in FIGS. 19D and 19E, the first activation of step control key 318 would show the second harmonic, the next press of step control key 318 would give the third harmonic, and so on. Similar stepping can be accomplished using the marker controls 382 and 389 and step control keys 314 and 318 to locate intermodulation products or other evenly spaced signals such as communication channels.

Signal Tracking Using Automatic Frequency Control

The preferred embodiment is capable of automatically maintaining a drifting signal at the center of the display. This allows narrow band measurements to be made on unlocked oscillators by having the spectrum analyzer track the input signal and allows other measurements which were heretofore extremely difficult.

To operate the signal tracking feature of the preferred embodiment, one would press normal control 381 and place the marker on the signal to be tracked with rotary control 310. Signal track control 385 is then pressed to initiate the tracking operation. As the signal drifts, the center frequency will automatically change to bring the signal and the marker to the center of the display. Marker off control 386 or activation of any other marker mode or instrument preset control 230 will disable the tracking function.

As an example of the use of this feature, there is shown in FIG. 19F a signal of interest. The upper sideband of the transmitter is to be monitored as the carrier frequency is tuned. Therefore, the marker is activated using normal control 381 and positioned using rotary control 310 at the peak of the upper sideband signal 2105. Once signal track control 385 is pressed, the upper carrier sideband 2105 is tracked and may be "zoomed" in to produce the display of FIG. 19G by pressing frequency span control 262 followed by digit keys 1 and 0 and units KHz key 603. As the carrier frequency changes, the sideband response will remain in the center of the display. The center frequency and marker frequency readouts on the display in positions 2120 and 2130, respectively, will read out the sideband's frequency. Therefore, a combination of the features of the preferred embodiment activated by a signal track control 385 and marker control 382 allows the real time signal frequency drift to be read on the display.

Detailed Block Diagram

The detailed circuitry of the preferred embodiment will now be discussed in more detail. Referring first to FIGS. 20A and 20B, there is shown a detailed block diagram of the preferred embodiment. FIG. 20A is primarily a block diagram of the RF section, while FIG. 20B is primarily a block diagram of the IF and display section of the preferred embodiment. Much of the interaction of the circuitry of the preferred embodiment is controlled by a processor 2015 which is described later in more detail. This processor operates under the control of microprograms which are stored in a memory 2014. Operator commands are input via the front panel 2020. The signal to be analyzed is input on line 425 through the front panel controls to the RF converter 2023. There it is converted using the 20 MHz reference signal provided on line 2017 from 20 MHz reference 2016 or from the frequency control unit 2022. Signal thus produced is thereafter processed by IF amplifiers 2019 or 2009 and converters 2020 and 2010. Pilot third local oscillator 2007 produces the precise frequency in the range 238.5 MHz to 259.5 MHz that will allow the preferred embodiment to be tuned to frequencies between the 20 MHz reference combs. This processing results in the providing of a signal on line 2040 to the IF and display sections for further processing and an IF counter output signal on line 2042 as well as sweep signals on line 2044 and 2046 to the video processor 2060 and the track and hold circuitry 2065. Various filters and converters in the circuit 2050 act with IF control 2055, data manipulator and memory control 2058 to cause the digital representations of the sampled signal to be stored in memory 2070. Data manipulator and control circuit 2058 along with trigger circuitry 2072 determine the sweep rate and the trigger level. Representations of the analyzed signal are then displayed on cathode ray tube 2078.

Each one of these circuits shown in FIGS. 20A and 20B is described in more detail with respect to the detailed schematic diagrams and the description below. The numbers in each block refer to the detailed schematic diagrams for the circuitry used in the preferred embodiment to perform the functions of that block.

Referring now to FIGS. 21A, 21B and 21C, there is shown the circuitry of the front panel of the preferred embodiment. In this schematic, various front panel push-button keys, switches, and indicator LEDs as well as the input terminals 425 for the signal to be analyzed are shown. Other switch circuitry is shown in FIG. 63. The input select circuit 2102 includes two push-button switches, each with an LED in its center, i.e., switches 2104 and 2105. When switch 2105 is energized, input relay 2110 selects the input through the DC input connector 2112 for frequencies from 100 Hz to 1.5 GHz. Activation of switch 2104 selects the input through the blocking capacitor 2111 for frequencies from 100 KHz to 1.5 GHz.

Referring now to FIGS. 22A, 22B, 22C and 22D, there is shown the interface circuitry for the RF section to the processor 2015 shown in FIG. 20A and to the front panel controls. The keyboard is organized as a matrix of rows and columns of normally open single pole, single throw switches. This keyboard matrix 2210 includes drivers 2212 and 2214 for driving the rows of the matrix while drivers 2206 and 2208 gate the columns of the matrix onto the data bus. The processor determines which key has been activated by selectively polling the rows and columns through drivers 2206, 2208, 2212 and 2214 and causing them to be selectively read onto the data bus 2200.

The fact that a key has been pressed is determined by gate 2215. The circuit which includes transistor 2216 is used to de-bounce the key switch circuitry. Flip-flop 2213 latches when a key is pressed and is cleared later by the processor.

The instrument preset key generates the signal on line 2220 which presets various circuitry in the preferred embodiment. Also, the instrument preset signal on line 2220 causes the main processor to restart program execution at memory address 32. Service request circuitry 2230 encodes the various requests for service made by the Front Panel circuitry to the main processor 2015. For example, a signal on line 2231 is generated whenever the keyboard requires servicing, i.e., a key has been depressed. Similarly, the rotary pulse generator generates a request by providing a signal on line 2232. These requests are encoded by encoder 2236 and gated onto the data bus 2200 via gates 2238. Gates 2245A, 2245B, 2245C, 2245D detect any change in the signals HINT and LRMT on lines 2247 and 2248. Flip-flop 2249 is latched in response to detection of a change in their state. Transistor 2251 pulls the signal HSWP on line 2252 low whenever a request is pending. Whenever the signal HSWP drops to a low level, the flip-flop 2254 will be latched. Gates 2238 gate the encoded request onto data bus 2200. Gates 2238 also gate LHBZ, LZBZ and HINT onto the bus.

Rotary pulse generator circuit 2259 receives signals RPG1 and RPG2 on lines 2261 and 2262. From these two signals, the RPG circuit 2259 determines whether it should increment or decrement and the rate at which the incrementing or decrementing is to be done. For further description of this type of circuitry, refer to U.S. Pat. No. 4,016,432 issued on Apr. 5, 1977 to Michael S. Marzalek and entitled "Variable Rate Rotary Pulse Generator". The rotary pulse generator is coupled to the rotary control 310 on the front panel as shown in FIG. 2. Note that circuit 2263 provides a hold-off of about 70 milliseconds which prevents flip-flop 2265 from requesting a service request due to the rotation of rotary control 310 for that time period. This gives the preferred embodiment time to respond to the last service request from the rotary pulse generator and to continue or finish a sweep before the next request occurs. This enables the operator to have received visual feedback from the last manipulation of rotary control 310 before another input is acted upon.

Referring now to FIG. 22D, address decoder circuit 2285 decodes the address lines and enables the appropriate circuits to gate or store data onto data bus 2200. In FIG. 22C, phase-lock flag circuit 2280 provides signals or "flags" which indicate the presence or absence of certain preselected conditions in the preferred embodiment. The states of these flags are stored in register 2282 and may be read out onto data bus 2200 when desired through the enabling of the appropriate address decoder signal on a line 2283. Front panel LED drive circuit 2268 latches the state of the front panel LEDs (light emitting diodes) and sinks the current to light them. The signal LIPS clears these registers and causes the lighting of the LEDs anytime the instrument preset key 230 is pressed. RF attenuator drive circuit 2270 comprises register 2271 which latches the state of the RF attenuator at the input relay. Transistors 2272 and 2273 drive the input relay while transistors 2274A-E drive the RF attenuator. The bridge rectifiers 2275A, 2275B and 2275C act as transient suppressors for the RF attenuator solenoids.

Referring now to FIG. 23, there is shown the 20 MHz reference circuit of the preferred embodiment. A 10 MHz signal from a frequency standard is input via line 2302 and processed to provide 20 MHz reference signals to the front panel, the YIG-tuned oscillator phase-lock shown in FIG. 26, the 249 MHz phase-lock shown in FIG. 37, and the comb generator shown in FIG. 27A. During internal time base operation of the instrument, a 10 MHz signal is applied to doubler 2310 from time base circuit 2081. This signal is split by the resistor network 2311. Power is applied to the clock generator circuit 2320 and to the doubler buffer amplifier 2313. The 10 MHz signal input to the doubler is amplified by buffer 2313 and used to drive transistor amplifier 2315 through the impedance matching network comprising capacitor 2314 and inductor 2317. The output pulse produced from transistor 2315 is coupled into the 20 MHz resonator transformer 2316 and capacitor 2318 to produce the 20 MHz output signal on line 2319. The time base signal input on line 2302 is input to the clock generator circuit 2320 which provides a processor clock signal on line 2322 and a counter clock signal on line 2324.

The signal on line 2319 is input to crystal filter circuitry 2330 where it drives the emitter-follower circuit comprising transistor 2332 which in turn provides a low output impedance driver for the crystal filter. Center frequency adjustment 2334 is available to vary the center frequency of the filter. The filtered signal is amplified by the amplifier circuit comprising transistor 2335. Inductor 2336 and capacitor 2337 are used to match the impedance of PIN diode 2338. The current through the PIN diode 2338 sets the attenuation for the desired comb drive level for use in the comb generator circuitry described with respect to FIG. 27A.

A small amount of the comb drive signal is used by AGC amplifier circuitry 2340 to compare the drive level to a reference set by a comb drive adjustment 2342. Op amp 2345 compares the drive level on line 2346 to the reference level set via control 2342. The output from op amplifier 2345 is then set to bias PIN diode 2338 for a value of attenuation that will cause the rectified drive voltage to equal the reference voltage.

Indicator driver circuit 2360 compares the rectified drive voltage received via line 2368 with a fixed voltage. If the drive drops too low, op amp 2365 will turn on the NO REF LED.

Buffer amplifier circuit 2350 receives a small amount of 20 MHz comb drive signal via line 2351. This circuit provides a 20 MHz, minus 15 dBm reference signal to the YIG-tuned oscillator phase lock circuit described with respect to FIG. 26 and a 20 MHz minus 10 dBm signal to the 249 MHz phase lock described with respect to FIG. 33. Also supplied is drive for calibrator circuit 2370.

The 20 MHz reference signal received from buffer amplifier 2350 is amplified by an emitter coupled pair 2371. This signal is clipped by the emitter coupled pair 2372 to set a precise level. The output then goes through a low pass filter 2376 to reduce the harmonic content.

Referring now to FIG. 24A and FIG. 24B, there is shown the frequency control circuitry of the preferred embodiment. This circuitry provides the tuning voltage to the 50 MHz voltage tuned oscillator (VTO) described with respect to FIG. 35, current to the YIG-tuned oscillator (YTO) described with respect to FIG. 26, sweep to the selected oscillator, and bias to the YTO. It also provides latching of data for the RF converter which is described with respect to FIG. 25 as well as latching of data for the above mentioned oscillators. It also indicates to the RF interface circuitry shown in FIG. 23 when there is an over range of the phase lock voltage and it supplies a frequency analog voltage to the third converter described with respect to FIG. 29.

The sweep generator circuit 2410, the sweep reference voltage circuit 2420, and the sweep generator current source 2430 provide the sweep signal for the VTO, shown in FIG. 35, and YTO, shown in FIG. 26. This circuit also provides the horizontal display signal for the IF section.

The processor may stop the sweep at any time via signal HSWP on a line 2441. The timing capacitor 2412 receives a constant drive from transistor 2411 to provide the ramp for the sweeping frequency. The base emitter voltage of transistor 2411 sets the current. This voltage is determined by sweep generator current source circuit 2430 and by the output of operational amplifier 2422 in the sweep reference voltage circuit 2420. "Fast" potentiometer 2414 and "slow" potentiometer 2413 are provided to adjust sweep times to fit the particular characteristic curve of transistor 2411. Transistor 2415 acts as a buffer between transistor 2411 and sweep timing capacitor 2412 and also enables the sweep to be stopped by the sweep stop switch circuitry 2440 whenever the signal on line 2441 is low. The remainder of the sweep generator circuitry 2410 provides amplification to provide a useable sweep voltage. In the preferred embodiment, the sweep voltage provided on lines 2417 and 2418 varies between 0 and 10 volts. Sweep reference voltage circuitry 2420 basically provides temperature compensation of the sweep reference voltage.

Sweep generator current source 2430 comprises transistors 2433A, 2433B, 2433C, 2433D, 2433E and 2433F. These transistors are current switches which are controlled by register 2432. Register 2432 is loaded with a data word from I/O bus 2200 under control of address 5 signal on command bus 2299. The transistors switch resistors to provide appropriate current paths for the selected sweep times. Transistors 2434 is used for temperature compensation and causes a linear increase in the base emitter voltage of transistor 2411 in sweep generator 2410, causing an exponential increase in sweep time. In the preferred embodiment, when all six transistor switches 2433A-F are saturated, a 10 millisecond sweep will result; if transistor 2433A is off a times 10 multiplier is added causing a 100 millisecond sweep. Other multipliers are indicated on the schematic diagram.

The stopping of the sweep is accomplished by circuit 2440. The signal HSWP on line 2441 causes transistor 2445 to divert charging current from timing capacitor 2412 to ground thus stopping the sweep. An LED indicator 2447 is provided to provide an indication that the sweep has been stopped.

Decoder 2451 decodes the signals on address bus 2299 and provides the decoded address bus signals on line 2298. Decoded signals used to control circuitry elsewhere in the preferred embodiment are output by decoder 2253.

Referring now to FIGS. 24B and 24C, sweep attenuator circuit 2460 receives the sweep signal on line 2419 from sweep generator 2410 and provides an attenuated sweep signal on line 2461. D/A converter 2462 is a multiplying digital to analog converter whose input signal sweeps plus and minus five volts while the output signal which is buffered by op amp 2464 sweeps plus or minus five volts times N/1023 where N is the binary number input via lines 2463.

Various sweep options are selected by sweep select switches 2465 while reference voltages are provided by reference voltage circuits 2468.

Digital to analog converter circuits 2470 provide the VTO tune signal on line 2473 in response to the digital words received on data bus 2200. The digital words received from data bus 2200 are latched into registers 2474, 2476, 2477 and 2478. Circuits 2479A and 2479B are ten-bit multiplying digital to analog converters, similar to those manufactured by Analog Devices, Inc., and others.

The tuning signal provided on line 2478 is used to tune the VTO shown as block 2007 in FIG. 20A and described in more detail with respect to FIG. 35.

In a similar manner, circuits 2481, 2482, 2483, 2484, 2485 and 2486 provide control currents and bias voltages to the YIG-tuned oscillator (YTO). Tuning digital to analog converter 2481 receives digital words from data bus 2200 under control of address 3 on decoded address bus 2298. Circuit 2481 comprises a ten-bit digital to analog converter 2481C which responds to the data stored in latches 2481A and 2481B. YTO tuning signal is generated on a line 2481D and input to the YTO main coil tune driver circuit 2482 which sums the YTO tune signal with the sweep signal on line 2466.

The YIG-tuned oscillator is phase-locked to a reference voltage from the 20 MHz reference source 2016 shown in FIG. 20A by the phase lock circuitry shown in FIG. 26. The relationship of the YTO, the YTO phase lock circuitry and various other portions of the preferred embodiment is shown in the block diagram of FIG. 25.

Referring to FIGS. 26A and 26B, the phase lock circuitry phase locks the YTO to the 20 MHz reference voltage received from the circuitry shown in FIG. 23. A lock indication is provided and a filtered output of the pilot third IF amplifier circuit is routed to the frequency counter shown in FIG. 36. For wide sweeps, a sample/hold circuit retains the output voltage. 20 MHz reference amplifier 2605 receives the 20 MHz reference signal and provides such functions as impedance matching as well as setting the current and voltage levels necessary for the operation of phase frequency detector 2620.

Phase frequency detector 2620 is a dual D flip-flop 4-$\pi$-radian type detector consisting of D flip-flops 2621 and 2622. In the preferred embodiment, these are ECL flip-flops similar to 10131P manufactured by Motorola and others. If the signals at PIN 6 and 11 are in phase, outputs at PINS 2 and 14 will cancel when summed. If the signals are out of phase, outputs at PINS 2 and 14 will sum to an offset. When both flip-flops become set with active high (Q) outputs being at a logic high, gate 2623 will reset both flip-flop 2621 and flip-flop 2622. Note also that a low logic signal on line 2627 disables the phase frequency detector 2620.

Loop amplifier 2630 is configured as an integrator. Loop filter sample and hold circuit 2635 can be switched to several configurations, i.e., 10 KHz break point, loop grounded, or sample and hold.

Phase lock indicator 2640 circuit senses flip-flops 2621 and 2622 of phase frequency detector 2620 and provides the signal HUL1 on a line 2641 which indicates an unlocked YTO phase lock loop when in the high logic state.

Referring now to FIGS. 27A and 27B, there is shown the RF converter circuitry of the preferred embodiment. The RF converter circuitry has two conversion paths. In the first, the signal from the front panel is input via a line 2704 to first converter circuit 2705. The output is filtered, converted by converter 2760 and output via line 2763 to the IF amplifier shown in FIG. 28.

The second conversion path starts with the comb generator 2720. The comb generator takes the 20 MHz signal received from the 20 MHz reference 2016 which is shown in FIG. 23 and forms a pulse containing the harmonics of 20 MHz. This pilot signal provided on a line 2723 is input to pilot first converter 2730 which mixes power from circuit 2710 with the pilot signal. The output is filtered down, converted by down converter 2760 and sent to the second IF amplifier shown in FIG. 30.

The first LO distribution circuit 2710 takes power from YIG oscillator 2703 and splits and amplifies it for input to first converter circuit 2705 and pilot first converter 2730. The net result is that the IF signals on line 2763 and 2767 are provided to the second IF amplifier 2019 which is shown in greater detail in FIG. 28 and to pilot second IF amplifier 2009 which is shown in more detail in FIG. 30.

Referring now to FIG. 28, there is shown a second IF amplifier which receives the IF signal from the second converter shown in FIG. 27 which is processed through low pass filter 2805 which has a cutoff of about 500 MHz and filters out the LO frequency and harmonics from the RF converter. It is then amplified by amplifier 2810 which is a common emitter amplifier circuit with approximately 19 dB gain. The signal is then input to band pass filter 2815 which rejects the image frequency from the second converter. The 3 dB bandwidth of the filter is about 9 MHz.

The signal thus produced is input to the third converter circuitry 2020 shown in FIG. 29 where it is input to balance mixer 2910 and mixed with the signal provided by oscillator 2950 and amplified by amplifier 2940. The output from the mixer is then input to variable gain amplifier 2915. The output of oscillator 2950 is also input to buffer amplifier 2930 which provides the signal on line 2932 to the 275 MHz mixer described with respect to FIG. 32.

Referring now to FIG. 30, there is shown the pilot second IF amplifier which receives the signal on line 2767 from the second converter circuit shown in FIG. 27. This signal is processed by low pass filter 3010 which has a cutoff of approximately 500 MHz. It is amplified by common emitter amplifier 3015 which has a gain of approximately 19 dB and is then processed by band pass filter 3020 which has a 3 dB bandwidth of approximately 23 MHz. The filtered amplified signal thus obtained is output on line 3040 to the circuitry shown in FIG. 31. In the circuitry shown in FIG. 31, this signal on line 3040 is mixed by mixer 3110 with the signal received on line 3045 from the phase lock oscillator shown in FIG. 33. This signal thus produced is then amplified and filtered and provided to the YIG tuned oscillator phase lock circuitry shown in FIG. 26 via line 3150.

Referring now to FIGS. 32A and 32B, there is shown the 275 MHz phase lock circuitry of the preferred embodiment. In this circuit, the signal on line 3220 which is received from the circuitry shown in FIG. 34 is mixed with the signal received on line 2932 from the circuitry shown in FIG. 29. The difference frequency signal on line 3230 is then compared with the reference signal received on line 3210 from the 50 MHz voltage tuned oscillator. In response to this comparison, the 275 MHz tune control signal on line 3260 is generated. Detection of the phase lock loop is indicated by lock detector circuit 3250. When the loop is locked, the signal on line 3251 will be low. When it is unlocked, the output level on this line will be high.

Referring now to FIG. 34, there is shown the 275 MHz phase lock oscillator circuit of the preferred embodiment. This circuit provides a variable offset from the nominal 280 MHz signal. The circuit receives the 275 MHz tune signal on line 3260 which determines the frequency of the 275 MHz oscillator 3457. The output of the oscillator on line 3459 is mixed by mixer 3475 with the signal on line 3045 and the resulting signal is amplified and filtered and provided on line 3450 to the 249 MHz phase lock circuitry shown in FIG. 36.

Referring now to FIG. 35, the 50 MHz oscillator 3550 is tuned by the 50 MHz tune signal 3510 and the 50 MHz sweep signal on line 3520. These signals are shaped by shaping network 3530 and filtered by filter 3540 and used to tune the 50 MHz oscillator 3550. The output is divided by dividers 3570 and 3580 and the respective outputs are provided on line 3572 to the frequency counter circuitry shown in FIG. 36 or on line 3210 to the phase lock circuitry shown in FIG. 32.

In FIGS. 36A, 36B and 36C, there is shown the frequency counter circuitry of the preferred embodiment. This circuit counts the following frequencies: the 50 MHz voltage-tuned oscillator signal received on line 3572, the IF signal received on line 3611 and the pilot IF signal from the phase lock circuitry shown in FIG. 26. The respective signals are amplified by amplifier circuits 3612, 3614 and 3616. The amplified signals are then input to multiplexer 3640. Also input to multiplexer 3640 is the 10 MHz reference signal from counter control circuit 3630. The multiplexer gates one of these signals to the output line 3650 in response to the input selected by the code placed in register 3632 from the data bus 2200. Strobing of the data word from the data bus 2200 into register 3632 is accomplished via address decoder circuit 3660. The strobe signal is supplied on line 3661 and the selection of the frequency counter circuitry is determined by decoding the address signals received on lines 3664. The decoding of certain octal addresses is used for specific purposes. For example, the decoding of octal address 24 will result in a signal being produced on line 3667. This will cause the counter and bus registers 3680 and various other circuitry in the frequency counter to be reset. The decoding of address 25 will result in a signal on line 3668, and will cause the high order four digits to be read from counter 3680. In a similar fashion, the decoding of an octal address 26 will cause a signal to be provided on line 3669 and the lower four bits of counter circuit 3680 will be read out onto the data bus 2200.

Referring now to FIGS. 37A and 37B, there is shown the 249 MHz phase lock circuitry. The frequency of the signal received on line 3450 from the 275 MHz phase lock oscillator shown in FIG. 34 is divided by variable modulo frequency divider circuit 3725. Phase frequency detector 3710 then compares the signal provided by circuit 3725 with the signal produced by divider circuit 3705 in response to the 20 MHz reference signal received on line 3610. If the two inputs are out of phase control voltage is generated to force a change in the frequency of the 249 MHz phase lock oscillator shown in FIG. 33 until the inputs are in phase. Also, an indication of the locked or unlocked state of the phase lock loop is provided by circuit 3735. An LED 3735 is illuminated when the loop is unlocked and also a high logic signal is provided on a line 3736 to indicate the unlocked state.

Referring now to FIGS. 38A, 38B, 38C and 38D, there is shown the circuitry of the processor 2015 for the RF section of the preferred embodiment. The interface circuitry connecting the processor to the other circuitry of the preferred embodiment is shown in FIG. 38. Basically, these consist of memory interface 3880, bus circuits 3885, 3840 and 3830 as well as timing and synchronizing circuits such as timer 3805, clock circuit 3815, synchronizing circuit 3810 and clock drivers 3825. The processor executes the instructions shown in Appendix A to control the various operations of the preferred embodiment. A block diagram of the microprocessor used in the preferred embodiment is shown in FIG. 39. An explanation of the notation used in this processor and definitions of all the instructions are contained in Appendix A. The various programs used in the preferred embodiment are contained in Appendices B-1 through B-30. The signals produced by the instructions in the programs are detailed in Appendix B-31. Program execution by the processor is suspended through stop processor circuit 3801. This circuit responds to the controls on the front panel and to various other conditions throughout the machine.

The processor reset signal POP is provided on line 3811. Whenever this line goes low, the processor is reset and forced to begin the execution of the program which begins with the instruction at octal address 40 as soon as the line returns high. This may be caused by the pressing of the instrument preset button 230 on the front panel which causes the generation of the signal LIPS on line 3806 and by when power is first applied to the unit as indicated by the signal on line 3807. Once execution begins at instruction 40, various subprograms are executed which cause specific operations to occur in a predetermined sequence. Some examples of these operations are: phase lock the YIG-tuned oscillator, tune the voltage-tuned oscillator, select the correct scan time, select an appropriate frequency span width, set the IF section to the correct bandwidth and sensitivity, display the appropriate control settings on the CRT, etc. These programs interrogate the settings of the controls on the front panel and are responsive to changes in the circuitry and the front panel controls.

The subprograms which are in Appendices B-1 through B-30 are stored in a read-only memory which is read by the processor using a handshake interface circuit 3880. Any suitable ROM memory may be used. The address is output to the memory on lines 3992 and the signal HSTM on line 3994 is brought high. The positive edge of the signal on line 3994 causes the memory address register to receive the address on lines 3992.

The circuits shown in FIGS. 40A-C and 46A and 46B are bandwidth filters which operate at 21.4 MHz and are variable in bandwidth from 3 KHz to 3 MHz. The narrower bandwidths 3 KHz to 30 KHz are obtained from synchronously tuned crystal filters while the wider bandwidths are obtained from four synchronously tuned LC tank circuits. The IF control circuitry of the preferred embodiment is shown in FIGS. 41A and 41B. Control information for the IF video circuits is transmitted over data bus 2200. Address lines 2299 are monitored and decoded by circuit 4120 which controls the loading of the data on the bus 2200 into the input latches 4130. Data is strobed into the latches in response to the signal LTIO on line 4123 in response to the data word, gain control outputs are produced by circuit 4140, and predetermined attenuation steps are controlled by circuit 4150. In a similar fashion, bandwidth control circuit 4160 provides control signals on lines 4161, 4162, 4163, 4164, 4165, 4166, 4167, 4168. These signals control the crystal filters in LC tank circuits shown in FIGS. 40 and 46. The log linear control signal on line 4180 is provided by op amp circuit 4182. This signal is used in the circuitry shown in FIGS. 42A and 42B.

The log amplifier and filtering circuitry of FIGS. 42A and 42B provides the ability in the preferred embodiment to display signals in either a linear or a logarithmic mode. In the logarithmic mode, the calibrated display range is 90 dB. The circuitry of FIGS. 42A and 42B contains the first five of nine logarithmic stages and the circuitry shown in FIGS. 43A and 43B contains the circuitry for the last four logarithmic stages. After the IF signal received on line 4080 is processed by the five logarithmic amplifier stages of amplifier circuit 4230, the IF signal is processed by bandpass filter circuit 4240 and lowpass filter 4250 to yield the IF signal on lines 4280. All this circuitry is under control of the log/lin control signal on line 4180 and the AGC control signal on line 4193, and the LGIO control signal on line 4195. The AGC signal on line 4193 is used in the linear mode of display. The gain increases as the voltage of this signal becomes more negative. The signal varies between 0 and 15 volts and controls a gain range of approximately 65 dB. The LGIO signal controls circuitry within amplifier 4230 which is used to activate a 10 dB gain step in the linear mode.

The log amplifier detector circuitry shown in FIGS. 43A and 43B contains the last four of the nine logarithmic amplifier stages (the first five stages are in the amplifier/filter circuitry shown in FIG. 42). Stages 6 and 7 of amplifiers 4320 are also used in the linear mode as a switchable 20 dB gain step. The output signal from the amplifiers on line 4321 is applied to the PIN diode attenuator circuit 4325. When in the logarithmic mode, this attenuation is varied with temperature to compensate for bias variations in the logarithmic amplifier stages. The IF signal output on line 4326 is then detected by detector circuit 4340 to produce the vertical video signal on line 4342 which is input to video processor 2060 which is described in greater detail with respect to FIG. 50. The counter output limiter circuit 4350 provides an amplitude/limited signal at the IF frequency which is used for frequency counting. The circuitry shown in FIG. 44 provides three functions: oscillator circuit 4410 provides an 18.4 MHz LO frequency to the up converter and down converter circuitry shown in FIGS. 47 and 48 respectively. These signals are provided on lines 4413 and 4415 after being amplified by amplifier circuit 4412. Also, the circuitry of FIGS. 44A and 44B provides 65.9 dB of gain in discrete 0.1 dB steps (from −15.9 dB to +50 dB). This is accomplished through step gain circuits 4430, 4440 and 4450 as well as attenuators 4460. The level of gain or attenuation is determined by the control signals on lines 4431, 4441, 4451, 4461, 4462, 4463 and 4464. The resulting IF signal is output on line 4480. The control signals received are provided in response to the program control of processor 2015 and the settings of the front panel controls.

The 3 MHz filter circuitry shown in FIGS. 45A and 45B is a variable bandwidth filter centered at 3 MHz. The bandwidths are controlled from 10 Hz to 300 Hz in a 1-3-10 sequence by the control lines 4510, 4512, 4514 and 4516. The signal being filtered is received on line 4525 from the down converter circuitry shown in FIGS. 46A and 46B and the filtered output on line 4582 is input to the up converter circuitry shown in FIG. 47. The filter circuit shown in FIGS. 45A and 45B forms a five pole synchronously tuned bandpass filter. Each amplifier has a negative output impedance to compensate for the series resistance of the crystal resonator.

Referring now to FIGS. 46A and 46B, there is shown attenuator and bandwidth filter circuitry of the preferred embodiment. Attenuation of the input signal received on line 4601 is supplied by attenuator/amplifier circuit 4610 in response to the control signals 4603 and 4605. As in the bandwidth filter circuitry shown in FIG. 40, the narrower bandwidths of the filter are obtained from sychronously tuned crystal filters while the wider bandwidths are obtained from four synchronously tuned LC tank circuits.

In FIG. 47 there is shown the up converter of the preferred embodiment. For the narrow bandwidths, i.e., less than or equal to 1 KHz, this circuitry converts the 3 MHz IF signal received on line 4582 and converts it to a 21.4 MHz IF signal on line 4772. This is accomplished by mixing the 3 MHz signal on line 4582 with the 18.4 MHz signal received on line 4413.

FIG. 48 shows the down converter circuitry of the preferred embodiment whereby the 21.4 MHz IF signal received on line 4682 is converted to a 3 MHz IF signal and output on line 4525.

Video Processor

As mentioned above, in a spectrum analyzer with a digital display, i.e., where the display is produced in response to data representing a discrete number of sampled points, there is the problem that there may not be enough sample points to properly describe the analog signal. For example, assume that the display is made up of 1000 horizontal positions and their corresponding 1000 amplitude levels at those points. In that case, the resolution is 1/1000 of the full scale along the axis. For a 1000 MHz wide scan with an IF-bandwidth $<1$ MHz there would be a good chance of missing a signal or of displaying it with less than its true amplitude, because no sample was taken while the analyzer was sweeping across the signal. To avoid this problem, the ratio of scanwidth to bandwidth cannot exceed a certain ratio.

With 1000 samples per scanwidth, this ratio should be $\leqq 200$ so that at least five samples are taken while the signal is within the 3 dB bandwidth of the IF filter. This would keep the amplitude error to $<0.1$ dB for a 100 dB full screen display.

A problem is the aspect ratio (SW/BW=aspect ratio) limitation of digital storage, as well as the limitation of the absolute speed at which incoming data gets converted into digital. The Nyquist theorem for sampling a band limited signal has to be satisfied ($f_s>2$ BW) in order to retain all the information. With a max. conversion rate of 50 KHz from analog to digital, the widest IF-bandwidth which satisfies Nyquist is $\simeq 10$ KHz. The analyzer has a max. IF-BW of 3 MHz and thus the 50 KHz sampling rate will lead to inaccurate descriptions of signals which have a 3 MHz information bandwidth, such signals as noise and impulse signals like RADAR.

Another problem is the sampling rate limitation. The previous aspect ratio limitation is really another form of sampling rate limitation. It is caused by the fact that there are insufficient numbers of samples to describe the display.

The real solutions would be to increase the sampling rate and the numbers of points displayed, but this is costly and not practical.

Other solutions are compromises which sacrifice some information in order to preserve that information which is most useful for spectrum analysis. In this regard, the most important parameter is correct signal amplitude. It can be obtained from a peak detector which precedes the A/D converter. The peak detector holds the max. signal which occurs between samples for the A/D. After sampling the peak detector output, the peak detector is reset to the input signal level. Thus, no signal peak is lost. Also, the preferred embodiment employs both a positive and negative peak detector circuit to allow a better presentation of signal noise, i.e., give an indication of the amplitude excursions in the noise signal.

A problem using the peak detector is that the displayed signal peak may show one address later than it actually occurred so that there would be an error in frequency. The seriousness of this problem depends on how many horizontal addresses are used.

Also, the peak detector will give a misleading display of noise as it traces out only the peaks of the noise impulses. The user might be misled into thinking that the noise has been smoothed by videofiltering. In that case, he would read the absolute noise level incorrectly, since the peak noise is many dB above the RMS noise level.

Another problem with using a positive peak detector only is that a signal which is just a few dB above the noise will look clean and again the user might not be aware that he is looking at the sum of signal plus peak noise. Measuring the signal level he could get several dB errors.

The preferred embodiment provides a better presentation of the noise which is present by using a negative peak detector in addition to the previously described positive peak detector. The outputs from these two peak detectors are then displayed in a predetermined manner. For example, the display might simply alternate between the outputs from the positive and the negative peak detectors.

Video Signal Conditioning

The video processing technique of the present invention accommodates the requirements of digital storage. During a frequency sweep, 1000 samples of the video signal are taken and stored. However, simply taking and storing 1000 samples does not give adequate results with all combinations of resolution bandwidth, frequency span, and sweep time.

Consider, for example, an often-encountered spectrum analyzer input: short duration RF pulses occurring at a relatively low repetition rate. When the analyzer sweeps across the RF pulse spectrum, the output of the video detector is a series of short pulses. The shape of these pulses corresponds to the impulse response of the spectrum analyzer system (approximately Gaussain) and their rise time is 0.12 μs when the resolution bandwidth is at its widest setting (3 MHz). Representing this signal with sampled data would require a sampling rate higher than 6 MHz but there are other limiting factors, such as CRT resolution.

A high-quality CRT display might have a 10-cm horizontal axis and a resolution of 40 lines/cm. RF spectrum analyzers typically sweep no faster than 20 ms per sweep, so multiple video signal occurring within a 50-μs sweep segment (20 ms×1/400) will not be resolved, but will appear on the display as a single vertical line having the amplitude of the largest video signal and an intensity proportional to the summation of all the signals occurring within that segment. Thus, a peak detector that retains the peak value encountered during each 50-μs period would permit sampling at a 20-KHz rate for the 20-ms sweep. However, the information contained in the intensity modulation would be lost, corresponding to the loss of information resulting from the use of the slower sampling rate (as compared to 6 MHz).

Wideband impulse-type signals are not the only ones that can cause difficulties for the conversion process. CW signals can also be misrepresented when the analyzer is set for a high-aspect-ratio display (aspect ratio is defined as the ratio of frequency span to resolution bandwidth). Because the video signal resulting from a CW signal during a frequency sweep is a replica of the shape of the resolution-bandwidth filter response curve, at least five samples must be taken within the −3-dB points on the response curve to assure that the peak amplitude is captured with less than 0.1-dB error. This would limit the aspect ratio to 200 for a 1000-point display using sampled data.

For larger aspect ratios, a peak detector enables the peak amplitude to be captured by only one sample per data point. The trade-off is a sacrifice in frequency accuracy of 0.1% of the frequency span, but this is well within the visual resolution of the displayed spectrum.

A peak detector can give a misleading representation of noise. With noise as the input signal, the video signal can be considered as a tightly packed random sequence of individual impulse responses. However, a peak detector retains only the noise peaks and information on the variance is lost. Indeed, this can lead to erroneous results in measurements of low-level signals that are barely above the noise level. The peak-detected waveform may look very much like a video-averaged waveform whereas the peak is much higher than the true average because of the noise fluctuations.

For this reason, the preferred embodiment has both a negative peak detector and a positive peak detector driven in parallel by the video detector. The general scheme is to display the positive peak values for the odd-numbered data points and the negative peak values for the even-numbered points, giving a realistic reconstruction of noisy signals. However, this introduces a complication because it is desired to retain only the positive peak values of clean signals so amplitude measurement accuracy is preserved. Therefore, the video processor of the preferred embodiment displays positive and negative peaks alternately only when noise is present. Otherwise, only the positive peaks are displayed. FIG. 49B illustrates the concept.

A block diagram of the video processor is shown in FIG. 49A. The video signal is applied to the positive and negative peak detectors simultaneously. Before the start of a sweep, the switches in the peak detectors are closed and the capacitors charge to the value of the video signal. At the start of the sweep, the display's digital processor opens the switches and the positive peak detector tracks increases in the video signal while the negative peak detector tracks decreases. For example, the output of the positive peak detector increases only when the video signal increases above the value already stored on the capacitor and, of course, it never decreases.

When the processor determines the end of a data position (sampling interval), it selects the output of one of the two peak detectors to represent the signal at the A-to-D converter. If it selected the positive peak detector, it would then close the corresponding switch, reinitializing the capacitor to the present value of the video signal. If it had selected the negative peak detector, it would not reset the positive peak detector, but would retain the value stored on the capacitor for use in the next data position. However, for reasons given later, the negative peak detector is reinitialized at the end of every data position.

Detecting Noise

The most important information the processor needs to decide which peak detector to choose is whether or not the incoming signal contains noise. As shown in FIG. 49B, a noisy video signal is characterized by many variations and large deviations. Noise is present in each of the ordinals 400 through 404 and the signal rises and falls repeatedly. However, in ordinals 405 through 407 there is no noise and the signal increases monotonically. Using these signal properties, it is a relatively simple matter to determine whether or not a data position contains noise.

The "rosenfell" detector of FIG. 49A tells the processor when noise is present. The input stage of the rosenfell detector consists of two comparators. The upper comparator detects when the instantaneous video signal is less than the positive peak detector output, which can only mean that the video signal is falling. In a similar manner, the other comparator indicates when the video signal is rising.

Whenever the video signal falls, it causes the "fell" flip-flop to be set and whenever it rises, it causes the "rose" flip-flop to be set. If the video signal both rose and fell within a data position, the AND gate would send a "rosenfell" indication to the processor, signifying the presence of noise within the data position. Both flip-flops are reset at the beginning of the next data position.

To Reset or Not

The success of the detection technique at reconstructing the video signal hinges on the rules for resetting the peak detectors. Assume that FIG. 49C-1 shows a video signal of interest. FIG. 49C-2 shows the waveform obtained by the preferred embodiment using the positive peak detector only. FIG. 49C-3 shows the waveform obtained by the preferred embodiment using only the negative peak detector. Combining the use of the positive and negative peak detectors allows the reconstruction and accurate display of the video signal. These figures demonstrate the importance of resetting the positive peak detector only when it had been chosen to represent the signal for the data position. The aspect ratio for this case is 3000, so the video signal rises out of the noise, reaches its maximum, and returns to the noise level all within one data position. The rosenfell detector would indicate the presence of noise and, if the ordinal were even, the processor would choose the negative peak detector output. However, since the positive peak detector is not reset on this data position, it holds the maximum signal value for the next data position, where the positive peak value is chosen. Thus, the video signal is reconstructed appropriately.

Again, assume that FIG. 49D-1 shows a video signal of interest. Also, as above, FIG. 49D-2 illustrates the display obtained using only the positive peak detector where FIG. 49D-3 illustrates the display obtained using only the negative peak detector. FIG. 49D-4 shows the reconstructed video signal obtainable using both the positive and negative peak detectors. These figures demonstrate the importance of resetting the negative peak detector at the end of every data position. When a noise-free video signal reverses direction at its peak, the rosenfell detector sees both a rise and a fall and indicates that noise is present within the data position. Then if the processor is also at an even ordinal, the negative peak value would be chosen. But, since the negative peak detector was reset to the value of the signal at the beginning of the data position, its value will be only slightly different from the positive peak detector value and the smooth reconstruction of the video signal is not disturbed perceptibly. At the next data position, the positive peak detector, which retained the maximum value, is chosen.

When the preferred embodiment is used for measuring noise or when it operates in a digital averaging mode, the rosenfell detector is bypassed and the video signal is sampled directly by the A-to-D converter.

The hardware implementation of this detection technique could encounter some practical problems when the analyzer sweeps slowly. The duration of a data position can become as long as 1.5 seconds and a peak value captured by either peak detector could be lost because of gradual discharge of the detector capacitor. This becomes a problem whenever the data position is 75 μs or longer; that is, the sweep time is 75 ms or longer. To avoid the loss of these values, the processor retrieves the values of both peak detectors from the A-to-D converter at least once every 30 μs, obtaining as many as 50,000 positive and negative peak detector values for the 1.5-second data positions. The processor, however, saves only the maximum and minimum values and at the end of the data position, chooses one or the other to represent the signal for that data position according to the same algorithm described above. These peak values, which the processor stores in its registers, are then reset whenever the peak detectors are reset. In effect, the processor simply extends the range of the peak detectors by carrying out the detection process digitally.

The A-to-D converter has 10-bit resolution, equivalent to a resolution of 0.1%. At the end of each data position, the display system processor takes the chosen value, performs any calculations that may be called for (max hold, A-B), and stores the result in memory along with sweep position information. The measurement data can be stored in any one of three areas (A, B, or C) reserved for these data arrays. During the display cycles, the data from any one of these areas can be displayed individually or simultaneously with data from the other areas.

The definitions and method steps used in the preferred embodiment are briefly summarized below:

A "sample" is defined as a video a - d conversion which occurs every 20–50 μsec. A "data position" is defined as 1/1000 of the horizontal display. Each data position has a specific memory address:

Even Data Position = 2, 4, 6, . . . 1000

Odd Data Position = 1, 3, 5, . . . 1001

The time range per data position = 20 μs→1.5 sec. While the number of samples per data position may vary from 1 to 50 thousand, only one sample per data position can be displayed.

Positive and negative peak detectors are used to find maximum deviations. A positive peak is the maximum value within a data position, a negative peak is the minimum value. The reset of a peak detector initializes the peak detector to the present value of the video signal.

"Video signal falling" is defined as the condition when the incoming video signal is less than the value held on the positive peak detector. "Video signal rising" is defined as the condition when the incoming video signal is greater than the value held on the negative peak detector. "Video signal fell" indicates that a condition of "video signal falling" has occurred within a data position. "Video signal rose" indicates that a condition of "video signal rising" has occurred within a data position. "Video signal rosenfell" indicates that the video signal both rose and fell within a data position. The reset of the "rosenfell" detector clears the indication of "video signal rose" and "video signal fell."

In the preferred embodiment, odd data positions will always contain positive peak values. Even data positions will contain negative peak values only if the video signal is defined as "noise." Otherwise, even data positions will contain positive peak values. The presence of "noise" is indicated by the presence of a "video signal rosenfell."

The negative peak detector is reset at the end of every data position. The positive peak detector is reset after the positive peak value has been chosen for the data position. Therefore, when a negative peak is chosen for an even data position, the positive peak detector will not be reset until the end of the following data position. This ensures that any positive peak occurring during the time of the even data position will be retained. The rosenfell detector is reset at the end of every data position.

For data positions of long duration, one or more pairs of positive and negative peak detector values are converted. When more than one pair is converted, the digital processor selects and keeps only the maximum and minimum values. At the end of the data position, the maximum value is assigned to be the positive peak value and the minimum value is assigned to be the negative peak value. The algorithm stated above is then followed, and the rule for resetting the positive and negative peak detectors is applied to resetting the positive and negative peak values.

To make noise density measurements, the peak detectors are bypassed and the video signal is sampled and converted directly. This allows noise computations on direct samples of the video signal.

It should be emphasized that the method used in the preferred embodiment is weighted towards preserving the positive peak excursions of the signal. Since this is the most important parameter for a spectrum analyzer, the negative excursions are preserved only to the extent necessary to indicate the signal variations as for noise. These sequences of variations between using the information from the positive and negative PD could also be effectively used.

Referring now to FIGS. 50A and 50B, there is shown the schematic diagram for the video processor circuit of the preferred embodiment. This circuit filters the detected IF signal received on line 4342 from the circuitry shown in FIG. 43. The circuit also sets the DB/DIV log scale and the reference level offsets. Also, it provides the IF video output signal on line 5080 as well as recorder output control signals on lines 5090 and 5091. Video filter circuit 5020 is an RC low pass filter with selectable R and C elements. The series resistance R is one of two values controlled by switch 5022. When the switch is closed or in the zero position, the 147 K resistor 5024 is short-circuited, and the series resistance is minimum. In this state, video bandwidths from 3 KHz to 3 MHz are attainable. The 3 MHz bandwidth is attained when transistors 5027A, B, C, D, E, F and G are turned off. When switch 5022 is open, the series resistance R is high, approximately equal to resistor 5024, and video bandwidths from 1 Hz to 1 KHz are attainable. The shunt capacitors 5029A through 5029G are selected by switching transistors 5027A through 5027G respectively. Only one of these switching transistors can be on at any one time and each capacitor except capacitor 5029G is used with the high series resistance for the lower bandwidths and the low series resistance for the higher bandwidths.

Log expand circuitry 5040 allows four different amplitude scales, 10, 5, 2 or 1 dB per division. Changes in the amplitude scale are accomplished by first amplifying the video signal and then attenuating it various amounts. Amplification is provided by FET input amplifier 5042 which has a gain of 5. The signal thus produced on line 5043 is then attenuated by voltage divider circuits under control of transistors 5045, 5046 and 5047. Diodes 5048A and 5048B clamp this attenuated signal at about minus 1.2 volts to prevent forward biasing any of the transistor 5045, 5046 and 5047 switch circuits in the forward state. A final amplifier consisting of transistor circuits 5049, 5050 and 5055 amplifies the attenuated signal by 4 and offsets the output plus 2 volts (a plus 2 volt output corresponds to a full scale signal). Log offset current source 5010 simulates log gain for reference levels below minus 60 dBm. This is achieved by offsetting the zero volt to 1 volt video input signal by driving current through the source resistance 5012. This current is changed by supplying different currents into the emitter of transistor 5014, the transistor current source. Currents are controlled by switching transistors 5015A, 5015B and 5015C.

The decode logic circuit 5030 performs additional decoding on control lines received from the IF control circuitry described with respect to FIG. 41. The signals VBWA, VBWB, VBWC and VBWD are received on lines 5031, 5032, 5033 and 5034 respectively. They are then decoded by a 1 of 8 decoder 5037 and the signals are then inverted by inverters 5039. In this way, the control signals are produced which control the capacitors in the video filter circuit 5020. The signals A LOG and B LOG are also decoded by decoding circuit 5030 which produces the control signals on lines 5041A, 5041B and 5041C which drive the switches that vary the attenuators in the log expand circuit 5040.

Referring now to FIGS. 51A and 51B, there is shown the analog/digital converter circuit of the preferred embodiment. This circuit is used to produce storable graph data. It converts analog data received from the track and hold circuitry shown in FIG. 52 on line 5280 and transfers this data to the digital storage bus 5130. The digital storage bus 5130 is used for all data input and output. The signal ADC on a line 5173 controls the loading of the digitized signals from ADC buffers 5120 onto data bus 5130. The signal HLD on a line 5177 is used to reset the ADC circuits 5110 and 5120 and to initiate the next analog to digital conversion. The signal LD RAMP on a line 5179 causes the updating of the ramp digital to analog converter 5160 by causing the loading and updating of the scan address latches 5150 with a new scan address. The signal TSTA on line 5171 enables the test bits from buffer 5190 onto the digital storage bus 5130.

The ADC circuit 5110 converts analog data into 10 bits of binary data which is placed in ADC buffers 5120 through the technique of successive approximation. The circuit comprises digital to analog converter 5113 and successive approximation register 5117. To begin a conversion, the ADC is first reset to all zeros by the signal HLD on line 5177 going low. When the signal HLD goes high, each bit is individually tried in a "trial" conversion starting with the most significant bit. A decision is made to retain or drop the bit based on the comparator output. Once the decision has been made for each of the 10 bits, a conversion complete signal on line 5117A sets flip-flop 5119. This signal called BUSY can be transferred onto the digital storage bus through test bits buffer circuit 5190.

Ramp converter circuit 5160 makes a comparison between the analog sweep signal received on line 2046 and the scan address (X axis) received on the digital storage bus 5130 and input to latches 5150. Comparator 5167 makes the comparison and provides a signal RAMP on a line 5168. When this signal is high, it indicates that the scan address needs to be updated. When an update occurs, a new address is loaded into scan address latches 5150 and a new data point is sampled for A/D conversion. When a new address is placed in scan address latches 5150, an updated comparison between the sweep signal on line 2046 and the scan address in latches 5150. The signal SWP IN thus sets the sample rate. Minor adjustment can be made using variable potentiometer 5169.

Referring now to FIGS. 52A-C, the track and hold circuitry shown is used to insure that the true peak of the RF signal and a true representation of noise are displayed on the CRT display. This is accomplished by positive and negative peak detection circuits. The positive peak detector circuit 5210 acquires the most positive voltage to appear at its input on line 5080 and holds that voltage on holding capacitor 5214 until the circuit is reset by a pulse from the decoding and timing circuits 5230. C26 is discharged when the reset pulse turns on transistor 5117.

Negative peak detector circuit 5220 also receives the signal on line 5080 and acquires the most negative voltage to appear and holds that voltage on holding capacitor 5224 until reset by the reset pulse from decoding and timing circuits 5230.

Decoding and timing circuits 5230 provide the reset pulses to the peak detectors and the control signals to multiplexer circuit 5250. Signals received on lines 5251 and 5252 are used to control multiplexer circuit 5250. Signals HSWP on line 5231 and signal HOLD on line 5234 and signal RSEN on line 5235 control the providing of the reset pulses to positive and negative peak detectors 5210 and 5220. The status of the track and hold circuitry can be monitored by the control processor by monitoring status signal LTRK on line 5239. Track and hold circuit 5270 monitors the positive and negative peak detector output signals which are multiplexed through multiplexer 5250 onto line 5271. Track and hold circuit 5290 samples the signal on line 5271 and holds the sampled voltage on capacitor 5292. The output of the track and hold circuit on a line 5280 is then used by the analog to digital converter circuitry shown in FIG. 51 which converts it into Y axis graph data.

FIGS. 53A-C are a schematic diagram of the data manipulator circuitry of the preferred embodiment. This circuit contains 16 random access memory registers 5310 which are used for data storage during data manipulation. Thirty-two 12-bit ROM registers 5370 are used to store constants used during calculations. The arithmetic and logic unit 5350 is used to perform various arithmetic and logic functions upon the stored data. ALU circuits 5351, 5352 and 5353 are similar to the 74S181 circuits or the like manufactured by Texas Instruments and others. Circuit 5355 is a high-speed, look-ahead carry circuit similar to the 74S182 or the like manufactured by Texas Instruments and others. A pipeline register 5360 holds instructions received from the processor in sequential order. These instructions are then decoded by circuit 5380 and the appropriate arithmetic or logical functions are performed upon the stored data. Also, data words may be input and output to other areas of the circuitry of the preferred embodiment over I/O bus, i.e., digital storage bus 5130.

Referring now to FIGS. 54A-C, there is shown the main control circuitry or state machine which controls the digital storage processor. The digital storage processor includes the control circuitry shown in FIG. 54, the interface circuitry to the remainder of the spectrum analyzer of the preferred embodiment shown in FIG. 55, the data manipulating circuitry shown in FIG. 53 and the memory circuitry shown in FIG. 56.

State register 5430 indicates the present state and the position in the sequence of operations being performed. This present state data is supplied to program ROMs 5420 on lines 5421 where it causes the program ROMs to read out the appropriate memory contents. The digital storage processor alternates between two programs. One is the main program shown in Appendix C1; the other is the interrupt program shown in Appendix C2. Link register 5440 is used to store the respective returning positions and store multiplexed qualifier to the respective programs as they are being executed and interrupts and other monitored machine conditions cause the processor to switch from one program to the other. Thus, each program resumes at the correct state when the other is completed or temporarily suspended. Control signals for the input section and the CRT display section are provided by control pulse circuit 5555 and addressable flip-flop circuit 5580. The instruction definitions for the program stored in program ROM 5420 are shown in Appendix C3.

In FIGS. 55A and 55B, there is shown the interface circuitry which provides data transfer between processor 2015 which is described with respect to FIG. 20 and the digital storage processor which is described with respect to FIGS. 53, 54, 55 and 56. Basically, this circuit provides for the inputting and outputting of circuitry via the two processors and through the preferred embodiment using instrument bus 2200 and digital storage bus 5130.

The memory circuitry shown in FIGS. 56 A-C contains 4,096 12-bit words of random access memory storage in memory circuits 5630 and also contains 2,048 8-bit words in memory 5670. In memory circuits 5630 are stored all the data that may be displayed on the CRT including the display annotation data such as center frequency, reference level, the graticule, all characters and complete data for traces A, B and C. Character stroke memory 5670 contains the stroke description of each character, the length and direction of each stroke required to draw a character, i.e., all the alphabetic characters as well as all the numerals and other indicia used on the display.

Referring now to FIGS. 57A and 57B, there is shown the line generator circuitry of the preferred embodiment. This circuit receives a series of digital X and Y values which are loaded into X register circuit 5710 and Y register 5720. These values are received via bus 5130 and are clocked into the respective registers under control of the signals LDX and LDY. If signal LDX on line 5521 is present, the value on data bus 5130 will be loaded into the X register. If the signal LDY on line 5522 is present, then the digital word on data bus 5130 will be loaded into Y register 5720. The values placed in the X register 5710 and Y register 5720 are then converted to analog values by X digital to analog converter 5745 and Y digital to analog converter 5730. The successive X and Y values are connected with straight lines by a process called line generation which is similar to that of connecting dot-to-dot drawings on paper. Two independent line generators are required. The line generator circuit for the X values comprises summing-amplifier 5750, sample and hold circuit 5765, X integrator 5780 and filter 5785. The Y line generator circuit comprises summing-amplifier 5760, sample and hold circuit 5775, Y integrator 5795 and Y filter 5790. for each line drawn, there is a set up period followed by a drawing period. During the set up period, i.e., the conversion to analog values for each set of X and Y data, the display is blanked by the intensity control circuitry shown in FIG. 58 under control of the signal LLGBLANK on line 5811 and INTR on line 5821. X summing-amplifier 5750 receives the analog value for the next position on line 5746. It also receives an input indicating the present X value from integrator 5780 on line 5781 and it receives a shift value on line 5716 from expand register 5715. The three signals are summed to give a delta X equal to "next X" plus X shift minus present X. The X shift signal on line 5716 is a binary signal of zero volts or plus 5 volts and the amount of shift is adjusted by the potentiometer 5752.

Sample and hold circuit 5765 receives the new X value provided on line 5759 and holds it for input to the integrator 5780. Sample and hold circuit 5765 samples for 1 microsecond during the set up period and then holds the value during the drawing period which is either 4 microseconds or 19 microseconds. The sample mode is controlled by the signal SMPL on line 5767 while the hold mode is controlled by the signal HLDX on line 5769. Capacitor 5768 is the holding capacitor.

X integrator 5780 includes amplifier 5785, capacitor 5787 and transistor 5789 which form an integrate and hold circuit whose output is an analog signal on line 5783 which is the X display position. X filter 5788 is a 2.5 MHz low pass filter which smooths out transients from the X integrator and provides the signal LGX on line 5795. The Y circuitry works in a similar fashion and provides the signal LGY on line 5798. Y offset circuit 5755 supplies a signal to the Y summing amplifier 5760 such that the output of the Y line generator on line 5798 will be zero volts when the Y register contains all zeros and no origin shift for the display is present.

Referring now to FIGS. 58A and 58B, there is shown the intensity control circuitry of the preferred embodiment. This circuitry receives the delta X and delta Y signals on lines 5756 and 5758 respectively. It then approximates the line length and controls the Z axis level to the display. This circuitry also sets and controls the duration of the line generator drawing period which is either 4 microseconds or 19 microseconds depending on the approximate line length. The drawing period is controlled by providing the signal LL on line 5771. This circuitry also provides the drive signals to the line generator switches, and through the blanking logic 5850, it controls all display blanking.

The intensity level is modulated as a function of both delta X and delta Y signals received on lines 5756 and 5758. Line generator Z-axis circuit 5880 receives these signals and the magnitudes of these two signals are summed together to approximate line length. The output of this summing operation is provided to bright circuit 5888 on a line 5887. Bright circuit 5888 sets the Z-axis signal to maximum when bright lines are drawn. The signal LGZ on a line 5889 is output by bright control circuit 5888 and is input to multiplexer 5995 where it is multiplexed with the FSZ signal from the trigger circuitry shown in FIG. 60 and becomes the Z signal to the display. The Z signal also goes to the auxiliary Z circuit 5990 which provides the auxiliary Z signal on line 5991.

The line length approximation from the line generator Z-axis circuit 5880 also goes to the long line comparator circuit 5885 which decides whether the line should be drawn as a long line (19 microsecond drawing time) or a short line (4 microsecond drawing time). This decision is stored at the input register and sent to the line generator as the signal LL on line 5771. The long line/short line timing circuit 5820 uses the signal LL and the signal LGCLK on line 5818 to control the line generator set up and drawing periods. It provides the signal INTR on a line 5821 which is used by the main control circuitry shown in FIG. 54 to determine when to send new X and Y values to the line generator circuitry. It also provides timing signals to the integrator switch driver 5830 and the sample and hold switch driver 5870. These two circuits form the drive signals needed for the line generator.

The control of display blanking begins at the input register 5802. Blinking and blanking information are held in this register during the line drawing period. The blanking logic circuit 5850 controls the display blanking. It unblanks, blanks or blinks lines as required by input register 5802. It multiplexes the digital storage blanking with the fast sweep retrace blanking.

Referring now to FIG. 60 there is shown the trigger circuitry of the preferred embodiment. The most important function of the circuitry is to provide the HSWP signal on line 2441. This signal is generated by high sweep control circuit 6030. This signal is used by the A3 digital storage circuitry shown in FIG. 56 to control signal tracking and conversion. It is also used by the frequency control circuitry shown in FIG. 24 to control the sweep generator in that circuit (the sweep is in progress when the signal HSWP is high and is stopped immediately at any point during the sweep when the signal HSWP goes low). Several circuits in the RF section sweep under certain conditions. For example, when a front panel key is pressed the A15 processor described with respect to FIGS. 38A-D pulls HSWP low to immediately stop the sweep. The signal HSWP is caused to go high by the occurrence of a sweep trigger or by a command which is input over instrument bus 2200.

The fast sweep generator circuit 6020 produces a linear ramp voltage from zero volts to approximately plus 2.2 volts which is used as a horizontal sweep for the CRT display. This signal is provided on line 6021. Data on instrument bus line 2200, lines 11 through 14 specify the fast sweep generator sweep time. The data is latched into register 6012 in fast sweep time control circuit 6010. The data on bus 2200 is strobed into register 6012 when the address line on address bus 2298 is address 51 and strobe signal LTIO occurs. Once the value is loaded into register 6012, switchable current sources 6015 provide the control signals on line 6016 and 6017 which are used along with the most significant bit signal on line 6018 by fast sweep generator 6020 to provide the fast sweep ramp signal on line 6021.

Fast sweep control 6050 contains circuitry for the end of sweep detection and controls fast sweep dead time as well as fast sweep triggering. End of sweep detection is determined as follows: When the sweep ramp signal on line 6021 reaches about 2.2 volts, flip-flop 6052 is set and generates the signal on line 6053. This causes discharge switch 6026 to discharge timing capacitors 6023. This signal LRTRC on line 6053 is high during the sweep and supplies the retrace blanking signal to the intensity control circuitry shown in FIG. 59.

Multivibrator circuit 6057 controls the sweep dead time. The multivibrator is triggered at the end of the fast sweep ramp and holds flip-flop 6052 and 6053 reset for a time which is determined by the RC network 6056. In the preferred embodiment, the dead time is about 15 microseconds for sweep times and from one microsecond through 100 milliseconds and about 120 microseconds for sweep times from 200 microseconds through 10 milliseconds. Sweep trigger circuit 6040 produces triggers for all sweep times. It contains the video, external and line trigger circuits. The fast sweep free run oscillator 6042 triggers multiplexer circuit 6044 which provides the desired trigger signal on line 6049 and the fast sweep auto trigger circuit 6046. A valid trigger signal is provided on line 6049 when a negative going transition at the selected input of trigger multiplexer 6044 occurs. This trigger signal will start a sweep only if the fast sweep control circuit 6050 and the high sweep control circuit 6030 are in the proper states. Note that the trigger source desired is latched into trigger register 6041 and is received via data bus 2200.

In fast sweep mode, the X output of the line generator circuitry of FIG. 57 on line 5795 and the fast sweep ramp must be multiplexed to the X deflection amplifier shown in FIG. 61 to produce the display consisting of the graticule and characters with the fast sweep ramp and the analog video signal. The video signal from the video processor shown in FIG. 50 is multiplexed to the Y deflection amplifier shown in FIG. 60, when the fast sweep ramp is multiplexed to the X deflection amplifier. In fast sweep mode, the output from the line generator circuits of FIG. 57 is applied to the CRT deflection amplifiers following the completion of at least one fast sweep ramp.

To provide uniform intensity between the fast sweep trace and the other information displayed on the CRT, the fast sweep intensity control circuit 6070 generates a voltage to control the CRT beam intensity (Z-axis) when the fast sweep ramp is being multiplexed with the other signals. The FSZ signal is dependent on the duty cycle of the fast sweep ramp, i.e., the ratio of time during which the ramp is in progress to the sum of dead time and sweep time. In the preferred embodiment, this signal FSZ varies from about 150 millivolts for low beam intensity for high duty cycle operation to about 2 volts (high beam intensity for very low duty cycle operation). The signal LRTRC on line 6053 high during the fast sweep ramp provides a digital waveform which is averaged and inverted by transistors 6071 and its associated circuitry. This provides an output voltage to transistor 6072 that is dependent on the average value of the LRTRC signal.

Note that the signal HSWP on line 2441 may be cleared by setting instrument bus 2200 bit 13 high, selecting address 50 which will cause HSWP to be cleared at the next occurrence of strobe signal LTIO. Note that the signal HSWP may also be cleared by the digital control circuitry of FIG. 54 which provides the signal RSHS on line 6031.

FIGS. 61A and 61B show the X and Y deflection amplifiers which provide the drive signals to the CRT horizontal and vertical deflection plates.

Referring now to FIG. 62, there is shown the Z-axis circuitry of the preferred embodiment. This circuit receives two control signals from the intensity control circuitry shown in FIG. 58. One of these is a Z-axis signal on line 5998 which is a zero to 2 volt signal which is proportional to the CRT writing rate; the other is the blanking signal BLANK on line 5852. The Z signal after attenuation by the front panel intensity potentiometer 6222 drives the input stage of an amplifier comprising transistors 6226 and 6227. This amplifier supplies a differential current output to the focus gate amplifier circuitry 6250 and through the blanking switch circuitry 6210 to the control gate amplifier 6240.

The control gate amplifier 6240 is a virtual ground current summing junction. When the signal BLANK on line 5852 is low, transistor 6215 is off and the output of the control gate amplifier 6240 on line 6243 drops to a few volts blanking the CRT display.

The focus gate amplifier supplies a correction voltage on line 6253 to the focus grid of the CRT to compensate for defocusing effects which occur with varying intensity levels. The magnitude of this correction voltage is set by focus gain adjustment 6251.

FIG. 63 shows the schematic diagram of the keyboard switches of the preferred embodiment. Also shown is the circuitry for the status indicators which are activated as described in more detail above.

APPENDIX A

PROCESSOR 2015 MACHINE INSTRUCTIONS

NOTATION

Assembly language machine instructions are three-letter mnemonics. Each machine instruction source statement corresponds to a machine-operation in the object program produced by the assembler. Notation used is representing source statements is explained below:

| | |
|---|---|
| label | Optional statement label. Labels must begin with an alphabetic character, period, or certain other non-numeric characters. Labels may be one through five characters in length. If present, a label must begin in column 1. A space terminates a label. If a statement does not have label, then column 1 must be a blank. |
| m | Memory location. This can be an octal or decimal integer, a symbol used as a label elsewhere, or, an expression composed of a combination of these combined through + and − operators. Parentheses are not permitted in expressions. |
| n (lower case) | Numerical quantity. A numeric value that is not an address, but represents a shift or skip amount. |
| N (upper case) | Octal or decimal constant whose value is restricted to the range: $1 \leqq N \leqq 20_8 = 16_{10}$ ASMA allows N to also be any expression, provided that the value of the expression is within the stated range. |
| I | Indirect addressing indicator for memory reference instructions. Also indicates an automatic increment for place and withdraw instructions. |
| D | Decrement indicator for place and withdraw instructions. |
| P | Indicator used in Return instructions to instruct the IOC to pop its peripheral address stack. |
| reg. 0–7 | Register location. This can be an octal or decimal integer, or an assembler-pre-defined symbol. It might even be an expression. Regardless of what it is, it must have a value of $0_8$ through $7_8$, inclusive. |
| reg. 4–7 | Register location. Same rules as for reg. 0–7 above, except the value must be $4_8$–$7_8$, inclusive. |
| .../... | The slash indicates the item on either side (but not both) may be used at this place in the source statement. |
| comments | Optional comments. Comments must be separated by at least one space from the material to the left of the comment. |
| [ ] | Brackets indicate that the item contained within them is optional. |

Memory Reference Group

Each of the 14 memory reference instructions performs some operation based upon the contents of a referenced memory location. Unless the reference is to a location on the base page, it must be on the same current page as the instruction. The assembler determines which type of page-reference is used, and sets the B/C bit (bit 10) of the instruction accordingly. The least ten significant bits of the address of the referenced location are enclosed in bits 0–9 of the instruction. A memory reference may be indirect. In the source this is indicated with a, I after the operand. This is assembled by making bit 15 of the instruction be a one.

| label | LDA | m[,I] | comments |
|---|---|---|---|

Load A from m. The A register is loaded with the contents of the addressed memory location.

| label | LDB | m[,I] | comments |
|---|---|---|---|

Load B from m. The B register is loaded with the contents of the addressed memory location.

| label | CPA | m[,I] | comments |
|---|---|---|---|

Compare the contents of m with the contents of A; skip if unequal. The two 16-bit words are compared bit by bit. If they differ the next instruction is skipped, otherwise it is executed next.

| label | CPB | m[,I] | comments |
|---|---|---|---|

Compare the contents of m with the contents of B; skip if unequal. The two 16-bit words are compared bit by bit. If they differ the next instruction is skipped, otherwise it is executed next.

| label | ADA | m[,I] | comments |
|---|---|---|---|

Add the contents of m to A. The contents of the addressed memory location are added to those of A. The binary sum remains in A whle the contents of m remain unchanged. If a carry occurs from bit 15 the E register is set to a one, otherwise, E is left unchanged. If an overflow occurs the OV register is set to a one, otherwise the OV register is left unchanged. The overflow condition occurs if there is a carry from either bits 14 or 15, but not both together.

| label | ADB | m[,I] | comments |
|---|---|---|---|

Add the contents of m to B. Otherwise identical to ADA.

| label | STA | m[,I] | comments |
|---|---|---|---|

Store the contents of A in m. The contents of the A register are stored into the addressed memory location, whose previous contents are lost.

| label | STB | m[,I] | comments |
|---|---|---|---|

Store the contents of B in m. The contents of the B register are stored into the addressed memory location, whose previous contents are lost.

| label | JSM | m[,I] | comments |
|---|---|---|---|

JSX is JSM to External Name

Jump to subroutine. JSM permits jumping to subroutines in either ROM or R/W memory. The value of the pointer in the return stack register (R) is incremented by one and the value of P (the location of the JSM) is stored in R,I. Program execution resumes at m.

| label | JMP | m[,I] | comments |
|---|---|---|---|

JMX is JMP to External Name

Jump to m. Program execution continues at location m.

| label | ISZ | m[,I] | comments |
|---|---|---|---|

Increment m; skip if zero. ISZ adds one to the contents of the referenced location, and writes the sum into that location. If the sum is zero, the next instruction is skipped. ISZ does not alter the contents of E and OV.

| label | DSZ | m[,I] | comments |
|---|---|---|---|

Decrement m, skip if zero. DSZ subtracts one from the contents of the referenced location, and writes the difference into that location. If the difference is zero, the next instruction is skipped. DSZ does not alter the contents of E and OV.

| label | AND | m[,I] | comments |
|---|---|---|---|

Logical and of A and m. The contents of A and m are and'ed, bit by bit, and the result is left in A.

| label | IOR | m[,I] | comments |
|---|---|---|---|

Inclusive or of A and m. The contents of A and m are or'ed, bit by bit, and the result is left in A. The inclusive or is the "ordinary or" operation.

| label | RET | m[,I] | comments |
|---|---|---|---|

Return. The R register is a pointer into a stack of words in R/W memory containing the addresses of previous subroutine calls. A read R,I occurs. That produces the address (P) of the latest JSM that occurred. The BPC then jumps to address P+n, and R is decremented. The value of n may range from −32 to 31, inclusive. The value of n is encoded into bits 0 through 5 of the instructions as a 6 bit, two's complement, binary number.

| label | CLA | comments |
|---|---|---|

Clear A.

of clearing the A register.

| label | CLB | comments |
|---|---|---|

Clear B.

of clearing the B register.

| label | NOP | comments |
|---|---|---|

Null operation.

Shift-Rotate Group

The shift-rotate instructions perform re-arrangements of the bits of the A and B registers. Each shift-rotate instruction includes a four-bit field in which the shift or rotate amount is encoded. The number to be encoded in the field is represented by n. In the source text n may range from 1 to 16, inclusive. The four-bit field (bits 0 through 3) will contain the binary code for n-1.

| label | AAR | n | comments |
|---|---|---|---|

Arithmetic right shift of A. The A register is shifted right n places with the sign bit (bit 15) filling all vacated bit positions; the n+1 most significant bits become equal to the sign bit.

| label | ABR | n | comments |
|---|---|---|---|

Arithmetic right shift of B. The B register is shifted right n places with the sigh bit (bit 15) filling all vacated bit positions; the n+1 most significant bits become equal to the sign bit.

| label | SAR | n | comments |
|---|---|---|---|

Shift A right. The A register is shifted right n places with all vacated bit positions cleared; the n most significant bits become zeros.

| label | SBR | n | comments |
|---|---|---|---|

Shift B right. The B register is shifted right n places with all vacated bit positions cleared; the n most significant bits become zeros.

| label | SAL | n | comments |
|---|---|---|---|

Shift A left. The A register is shifted left n places; the n least significant bits become zeros.

| label | SBL | n | comments |
|---|---|---|---|

Shift B left. The B register is shifted left n places; the n least significant bits become zeros.

| label | RAR | n | comments |
|---|---|---|---|

Rotate A right. The A register is rotated right n places, with bit 0 rotating into bit 15.

| label | RBR | n | comments |
|---|---|---|---|

Rotate B right. The B register is rotated right n places, with bit 0 rotating into bit 15.

Alter-Skip Group

The alter-skip instructions each contain a six bit field which allows a relative branch of any of 64 locations. The distance of the branch is represented by a displacement, n; n may be within the range of −32 to 31, inclusive.

The arguments for the instructions of this group are shown as *±n, or, m. An argument of n by itself will generally cause an error. Internally, the assembler subtracts the current value of * from the argument as part of the evaluation process. So *±n−* is simply ±n, and m−* becomes a relative displacement rather than an actual address. This business of subtracting * was done to allow symbols and addresses (these are m's) as arguments. Thus it is possible to write SZA HOOK. All that is required is that HOOK be within the allowable skip distance of the instruction.

Bits 0 through 5 are coded with the value of n (or m−*) as follows: if the value is positive or zero, bit 5 is zero, and bits 0 through 4 receive the straight binary code for the value of n− if the value is negative, bit 5 is a 1, and bits 0 through 4 receive a complemented and incremented binary code.

| For n or m−* = | bits 5-0 | meaning: |
|---|---|---|
| −32 | 100000 | if skip, next instruction is *−32 |
| −7 | 111001 | if skip, next instruction is *−7 |
| −1 | 111111 | if skip, next instruction is *−1 |
| 0 | 000000 | if skip, repeat this instruction |
| 1 | 000001 | do next instruction, regardless |
| 7 | 000111 | if skip, next instruction is *+7 |
| 31 | 011111 | if skip, next instruction is *+31 |

All instructions in the alter-skip group have the "skip" properties outlined above. Some of the instructions also have an optional "alter" property. This is where the general instruction form "skip if <some one bit condition>" is supplemented with the ability to alter the state of the bit mentioned in the condition. The alteration is to either set the bit, or clear it. If specified, the alteration is done *after* the condition is tested, never before.

To indicate in a source statement that an instruction includes the alter option, and to specify whether to clear or to set the tested bit, a comma-C or comma-S follows *±n/m. The C indicates clearing the bit, while an S indicates setting the bit.

The "alter" information is encoded into the 16 bit instruction word with 2 bits. For such instructions, bit 7 is called the H/$\overline{H}$ (Hold/Don't Hold) bit, and bit 6 is the C/S (Clear/Set) bit. If bit 7 is a zero (specifying H) the "alter" option is not active; neither S nor C followed n in the source statement of the instruction, and the tested bit is left unchanged. If bit 7 is a 1 (specifying $\overline{H}$), then "alter" option is active, and bit 6 specifies whether it is S or C.

| label | SZA | * ± n/m | comments |
|---|---|---|---|

Skip if A zero. If all 16 bits of the A register are zero, skip the amount indicated by n, or, to m.

| label | SZB | * ± n/m | comments |
|---|---|---|---|

Skip if B zero. If all 16 bits of the B register are zero, skip the amount indicated by n, or, to m.

| label | RZA | * ± n/m | comments |
|---|---|---|---|

Skip if A not zero. If any of the 16 bits of the A register are set, skip the amount indicated by n, or, to m.

| label | RZB | * ± n/m | comments |
|---|---|---|---|

Skip if B not zero. If any of the 16 bits of the B register are set, skip the amount indicated by n, or, to m.

| label | SIA | * ± n/m | comments |
|---|---|---|---|

Skip if A zero, and then increment A. The A register is tested, and then incremented by one. If all 16 bits of A were zero before the increment, skip the amount indicated by n, or, to m. SIA does not affect the contents of E or OV.

| label | SIB | * ± n/m | comments |
|---|---|---|---|

Skip if B zero, and then increment B. The B register is tested, and then incremented by one. If all 16 bits of B were zero before the increment, skip the amount indicated by n, or, to m. SIB does not affect the contents of E or OV.

| label | RIA | * ± n/m | comments |
|---|---|---|---|

Skip if A not zero, and then increment A. The A register is tested, and then incremented by one. If any bits of A were one before the increment, skip the amount indicated by n, or, to m. RIA does not affect the contents of E or OV.

| label | RIB | * ± n/m | comments |
|---|---|---|---|

Skip if B not zero, and then increment B. The B register is tested, and then incremented by one. If any bits of B were one before the increment, skip the amount indicated by n, or, to m. RIB does not affect the contents of E or OV.

In connection with the next four instructions, Flag and Status are controlled by the peripheral interface addressed by the current select code. The select code is the number that is stored in the register named PA, located in the IOC. Both Status and Flag originate such that when a missing interface is addressed Status and Flag will appear to be false, or not set.

| label | SFS | * ± n/m | comments |
|---|---|---|---|

Skip if Flag line set. If the Flag line is true, skip the amount indicated by n, or, to m.

| label | SFC | * ± n/m | comments |
|---|---|---|---|

Skip if Flag line clear. If the Flag line is false, skip the amount indicated by n, or, to m.

| label | SSS | * ± n/m | comments |
|---|---|---|---|

Skip if Status line set. If the Status line is true, skip the amount indicated by n, or, to m.

| label | SSC | * ± n/m | comments |
|---|---|---|---|

Skip if Status line clear. If the Status line is false, skip the amount indicated by n, or, to m.

| label | SDS | * ± n/m | comments |
|---|---|---|---|

Skip if Decimal Carry set. Decimal Carry (DC) is a one-bit register in the EMC. It is controlled by the EMC, but connected to the decimal carry input of the BPC. If DC is set, skip the amount indicated by n, or, to m.

| label | SDC | * ± n/m | comments |
|---|---|---|---|

Skip if Decimal Carry clear. Decimal Carry (DC) is a one-bit register in the EMC. It is controlled by the EMC, but connected to the decimal carry input of the BPC. If DC is clear, skip the amount indicated by n, or, to m.

| label | SHS | • ± n/m | comments |
|---|---|---|---|

Skip if Halt line set. If the Halt line is true, skip the amount indicated by n, or, to m.

| label | SHC | • ± n/m | comments |
|---|---|---|---|

Skip if Halt line clear. If the Halt line is false, skip the amount indicated by n, or, to m.

| label | SLA | • ± n/m [,S/,C] | comments |
|---|---|---|---|

Skip if the least significant bit of A is zero. If the least significant bit (bit 0) of the A register is a zero, skip the amount indicated by n, or, to m. If either S or C is present, bit 0 is altered accordingly after the test.

| label | SLB | • ± n/m [,S/,C] | comments |
|---|---|---|---|

Skip if the least significant bit of B is zero. If the least significant bit (bit 0) of the B register is a zero, skip the amount indicated by n, or, to m. If either S of C is present, bit 0 is altered accordingly after the test.

| label | RLA | • ± n/m [,S/,C] | comments |
|---|---|---|---|

Skip if the least significant bit of A is non-zero. If the least significant bit (bit 0) of the A register is a one, skip the amount indicated by n, or, to m. If either S or C is present, bit 0 altered accordingly after the test.

| label | RLB | • ± n/m [,S/,C] | comments |
|---|---|---|---|

Skip if the least significant bit of B is non-zero. If the least significant bit (bit 0) of the B register is a one, skip the amount indicated by n, or, to m. If either S or C is present, bit 0 is altered accordingly after the test.

| label | SAP | • ± n/m [,S/,C] | comments |
|---|---|---|---|

Skip if A positive. If the sign bit (bit 15) of the A register is a zero, skip the amount indicated by n, or, to m. If either S or C is present, bit 15 is altered accordingly after the test.

| label | SBP | • ± n/m [,S/,C] | comments |
|---|---|---|---|

Skip if B positive. If the sign bit (bit 15) of the B register is a zero, skip the amount indicated by n, or, to m. If either S or C is present, bit 15 is altered accordingly after the test.

| label | SAM | • ± n/m [,S/,C] | comments |
|---|---|---|---|

Skip if A minus. If the sign bit (bit 15) of the A register is a one, skip the amount indicated by n, or, to m. If either S or C is present, bit 15 is altered accordingly after the test.

| label | SBM | • ± n/m [,S/,C] | comments |
|---|---|---|---|

Skip if B minus. If the sign bit (bit 15) of the B register is a one, skip the amount indicated by n, or, to m. If either S or C is present, bit 15 is altered accordingly after the test.

| label | SOS | • ± n/m [,S/,C] | comments |
|---|---|---|---|

Skip if overflow set. If the one-bit overflow register (OV) is set, skip the amount indicated by n, or, to m. If either S or C is present, the OV register is altered accordingly after the test.

| label | SOC | • ± n/m [,S/,C] | comments |
|---|---|---|---|

Skip if overflow clear. If the one-bit overflow register is clear, skip the amount indicated by n, or, to m. If either S or C is present, the OV register is altered accordingly after the test.

| label | SES | • ± n/m [,S/,C] | comments |
|---|---|---|---|

Skip if extend set. If the extend register (E) is set, skip the amount indicated by n, or, to m. If either S or C is present, E is altered accordingly after the test.

| label | SEC | • ± n/m [,S/,C] | comments |
|---|---|---|---|

Skip if extend clear. If the extend register (E) is clear, skip the amount indicated by n, or, to m. If either S or C is present, E is altered accordingly after the test.

Complement-Execute Group

| label | CMA | comments |
|---|---|---|

Complement A. The A register is replaced by its one's (bit by bit) complement.

| label | CMB | comments |
|---|---|---|

Complement B. The B register is replaced by its one's (bit by bit) complement.

| label | TCA | comments |
|---|---|---|

Two's complement A. The A register is replaced by its one's (bit by bit) complement, and then incremented by one. The E and OV registers are updated according to the results of the increment, in the same fashion as for the ADA instruction.

| label | TCB | comments |
|---|---|---|

Two's complement B. The B register is replaced by its one's (bit by bit) complement, and the incremented by one. The E and OV registers are updated according to the results of the increment, in the same fashion as for the ADB instruction.

| label | EXE | $0 \leq m \leq 37_8$ [,I] | comments |
|---|---|---|---|

Execute register m. The contents of any register can be treated as the current instruction, and executed in the normal manner. The register is left unchanged unless the instruction code causes it to be altered. The next instruction executed will be the one following the EXE m, unless the code in m causes a branch.

Indirect addressing is allowed. An EXE m, I causes the contents of m to be taken as the address of the place in memory whose contents are to be executed; this can be anywhere in memory, and need not be another register. In 15-bit versions of the processor, multi-level indirect addressing with EXE instruction is possible. Only one level is possible with the 16-bit processor.

Stack Group

The stack group manages first-in, last-out firmware stacks. The "place" instructions put a word or byte into a stack pointed at by C or D.* The item that is placed is reg. 0–7. The "withdraw" instructions remove a word or a byte from a stack pointed at by C or D. The removed item is written into reg. 0–7.

*C and D are registers in the IOC; addresses $16_8$ and $17_8$, respectively.

By the end of each place or withdraw instruction the stack pointer is either incremented or decremented, as specified by the optional I or D, respectively. In the absence of either an I or a D, the assembler defaults to I for place instructions, and D for withdraw instructions.

Place instructions increment or decrement the stack pointer prior to the placement, and withdraw instructions do it after the withdrawal. In this way the pointer is always left pointing at the top of the stack.

For byte operations using 15-bit version of the processor bit 15 of the pointer register (C or D) indicates left or right half (1=left, 0=right). Stack instructions involving bytes toggle bit 15 at each increment or decrement; but the lower bits of the pointer increment or decrement only during the zero-to-one transition of bit 15.

In the 16-bit version of the processor, the least-significant bit of the pointer register indicates left or right half (1=left, 0=right). Full 16-bit addressing is maintained by a most-significant bit (for each pointer register) in the form of the CB and DB registers. The C and CB registers, and D and DB registers, act as 17-bit registers, during the automatic increment or decrement to the pointer registers.

The values of C and D for place-byte instructions must not be the address of any internal register for the BPC, EMC, or IOC. The place and withdraw instructions can also initiate I/O operations, so they are also listed under the I/O group.

| label | PWC | reg. 0–7 [,I/,D] | comments |
|---|---|---|---|

Place the entire word of reg. into the stack pointed at by C.

| label | PWD | reg. 0–7 [,I/,D] | comments |
|---|---|---|---|

Place the entire word of reg. into the stack pointed at by D.

| label | PBC | reg. 0–7 [,I/,D] | comments |
|---|---|---|---|

Place the right half of reg. into the stack pointed at by C.

| label | PBD | reg. 0–7 [,I/,D] | comments |
|---|---|---|---|

Place the right half of reg. into the stack pointed at by D.

| label | WWC | reg. 0–7 [,I/,D] | comments |
|---|---|---|---|

Withdraw an entire word from the stack pointed at by C, and put it into reg.

| | | | |
|---|---|---|---|
| label | WWD | reg. 0–7 [,I/,D] | comments |

Withdraw an entire word from the stack pointed at by D, and put it into reg.

| | | | |
|---|---|---|---|
| label | WBC | reg. 0–7 [,I/,D] | comments |

Withdraw a byte from the stack pointed at by C, and put it into the right half of reg.

| | | | |
|---|---|---|---|
| label | WBD | reg. 0–7 [,I/,D] | comments |

Withdraw a byte from the stack pointed at by D, and put it into the right half of reg.

| | | |
|---|---|---|
| label | CBL* | comments |

Set the CB register to a zero. This specifies the lower block of memory pointed at by C and CB.

| | | |
|---|---|---|
| label | CBU* | comments |

Set the CB register to a one. This specifies the upper block of memory pointed at by C and CB.

| | | |
|---|---|---|
| label | DBL* | comments |

Set the DB register to a zero. This specifies the lower block of memory pointed at by D and DB.

| | | |
|---|---|---|
| label | DBU* | comments |

Set the DB register to a one. This specifies the upper block of memory pointed at by D and DB.

*Part of the 16-bit processor's instruction set only.

I/O Group

The states of $\overline{IC1}$ and $\overline{IC2}$ during the I/O Bus Cycles initiated by the instructions below depend upon which register is the operand of the instruction:

| | $\overline{IC1}$ | $\overline{IC2}$ |
|---|---|---|
| R4 | 1 | 1 |
| R5 | 1 | 0 |
| R6 | 0 | 1 |
| R7 | 0 | 0 |

-continued

| | | | |
|---|---|---|---|
| label | mem. ref. inst. | reg. 4–7 [,I] | comments |

Initiate an I/O Bus Cycle. Memory reference instructions 'reading' from reg. cause input I/O Bus Cycles; those 'writing' to reg. cause output I/O Bus Cycles. In either case the exchange is between A or B and the interface addressed by the PA register (Peripheral Address Register - $11_8$); reg. 4–7 do not really exist as physical registers within any chip on the IDA Bus.

| | | | |
|---|---|---|---|
| label | stack inst. | reg. 4–7 [,I/,D] | comments |

Initiate an I/O Bus Cycle. Place instructions 'read' from reg., therefore they cause input I/O Bus Cycles. Withdraw instructions 'write' into reg., therefore they cause output I/O Bus Cycles. In either case the exchange is between the addressed stack location and the interface addressed by PA.

Interrupt Group

| | | |
|---|---|---|
| label | EIR | comments |

Enable the interrupt system. This instruction cancels DIR.

| | | |
|---|---|---|
| label | DIR | comments |

Disable the interrupt system. This instruction cancels EIR.

DMA Group

| | | |
|---|---|---|
| label | SDO* | comments |

Set DMA outwards. This instruction specifies the read-from-memory, write-to-peripheral direction for DMA transfers.

| | | |
|---|---|---|
| label | SDI* | comments |

Set DMA inwards. This instruction specifies the read-from-peripheral, write-to-memory direction for DMA transfers.

| | | |
|---|---|---|
| label | DMA | comments |

Enable the DMA mode. This instruction cancels PCM and DDR.

| label | PCM | comments |
|---|---|---|

Enable the Pulse Count Mode. This instruction cancels DMA and DDR.

| label | DDR | comments |
|---|---|---|

Disable Data Request. This instruction cancels the DMA Mode and the Pulse Count Mode.

The Four-Word Group

| label | CLR | N | comments |
|---|---|---|---|

Clear N words. This instruction clears N consecutive words, beginning with location <A>. Remember: $1 \leqq N \leqq 16_{10}$.

$$0 \rightarrow \text{location } <A>$$
$$0 \rightarrow \text{location } <A> + 1$$

$$0 \rightarrow \text{location } <A> + N - 1$$

| label | XFR | N | comments |
|---|---|---|---|

Transfer N words. This instruction transfers the N consecutive words beginning at location <A> to those beginning at <B>. Remember: $1 \leqq N \leqq 16_{10}$.

$$\text{location } <A> \rightarrow \text{location } <B>$$
$$\text{location } <A> + 1 \rightarrow \text{location } <B> + 1$$

$$\text{location } <A> + N - 1 \rightarrow \text{location } <B> + N - 1$$

The Mantissa Shift Group

| label | MRX | comments |
|---|---|---|

Mantissa right shift of AR1 r-times, $r = <B_{0-3}>$, and $0 \leqq r \leqq 17_8 = 15_{10}$.

1st shift: $<A_{0-3}> \rightarrow D_1; \ldots <D_i> \rightarrow D_{i+1}; \ldots D_{12}$ is lost jth shift: $O \rightarrow D_1; \ldots <D_i> \rightarrow D_{i+1}; \ldots D_{12}$ is lost rth shift: $O \rightarrow D_1; \ldots <D_i> \rightarrow D_{i+1}; \ldots <D_{12}> \rightarrow A_{0-3}$; $O \rightarrow DC$; $O \rightarrow A_{4-15}$ Notice:

(1) The first shift does not necessarily shift in a zero; the first shift shifts in $<A_{0-3}>$.

(2) The last digit shifted out ends up as $<A_{0-3}>$.

(3) If only one digit-shift is done, (1) and (2) happen together.

(4) After (2), SE is the same as $<A_{0-3}>$.

(5) Any more than eleven shifts is wasteful.

| label | MRY | comments |
|---|---|---|

Mantissa right shift of AR2 $<B_{0-3}>$-times. Otherwise identical to MRX.

| label | MLY | comments |
|---|---|---|

Mantissa left shift of AR2 one time.

$$<A_{0-3}> \rightarrow D_{12}; \ldots <D_i> \rightarrow D_{i-1}; \ldots$$
$$<D_1> \rightarrow A_{0-3}; 0 \rightarrow DC; 0 \rightarrow A_{4-15}$$

At the conclusion of the operation SE equals $<A_{0-3}>$.

| label | DRS | comments |
|---|---|---|

Mantissa right shift of AR1 one time.

$$0 \rightarrow D_1; \ldots <D_i> \rightarrow D_{i+1}; \ldots <D_{12}> \rightarrow A_{0-3};$$
$$0 \rightarrow DC; 0 \rightarrow A_{4-15}$$

At the conclusion of the operation SE equals $<A_{0-3}>$.

| label | NRM | comments |
|---|---|---|

Normalize AR2. The mantissa digits of AR2 are shifted left until $D_1 \neq 0$. If the original $D_1$ is non-zero, no shifts occur. If twelve shifts occur, then AR2 equals zero, and no further shifts are done. The number of shifts is stored as a binary number in B $$0 \rightarrow B_{4-15}; \text{ \# of shifts} \rightarrow B_{0-3} \quad \text{(i)}$$

$$\text{For } 0 \leqq <B_{0-3}> \leqq 11; 0 \rightarrow DC \quad \text{(ii)}$$

$$\text{If } <B_{0-3}> = 12; 1 \rightarrow DC \quad \text{(iii)}$$

The Arithmetic Group

| label | CMX | comments |
|---|---|---|

Ten's complement of AR1. The mantissa of AR1 is replaced with its ten's complement, and DC is set to zero.

The bug concerns the way Sync is treated. Under the right conditions a bus grant (think "DMA cycle") causes the EMC to give Sync too early. The result is simultaneous use of the IDA Bus by the EMC and BPC. The most apparent result is that the next instruction fetch by the BPC is garbled, which is a disaster.

| label | CMY | comments |
|---|---|---|

Ten's complement of AR2. The mantissa of AR2 is replaced with it ten's complement, and DC is set to zero.

| label | CDC | comments |
|---|---|---|

Clear Decimal Carry. Clears the DC register; 0→DC.

| label | FXA | comments |
|---|---|---|

Fixed-point addition. The mantissa of AR1 and AR2 are added together, along with DC (as a $D_{12}$-digit), and the result is placed in AR2. If an overflow occurs, DC is set to one, otherwise, DC is set to zero at the completion of the addition.

During the addition the exponents are not considered, and are left strictly alone. The signs are also left completely alone.

$$\langle AR1\rangle = D_1\, D_2\, D_3 \text{------} D_{12}$$
$$\langle AR2\rangle = D_1\, D_2\, D_3 \text{------} D_{12}$$
$$+ \quad \langle DC\rangle \leftarrow \text{initial value of DC}$$
$$\text{(overflow)} \rightarrow \text{"}D_0\text{"}\ D_1\, D_2\, D_3 \text{------} D_{12} \rightarrow AR2$$

↘ DC (final value of DC)

| label | MWA | comments |
|---|---|---|

Mantissa Word Add. <B> is taken as four BCD digits, and added, as $D_9$ through $D_{12}$, to AR2. DC is also added in as a $D_{12}$. The result is left in AR2. If an overflow occurs, DC is set to one, otherwise, DC is set to zero at the completion of the addition.

During the addition the exponents are not considered, and are left strictly alone, as are the signs. MWA is intended primarily for use in rounding routines.

$$\langle B\rangle = \text{-------} D_9\, D_{10}\, D_{11}\, D_{12}$$
$$\langle AR2\rangle = D_1 \text{----} D_9\, D_{10}\, D_{11}\, D_{12}$$
$$+ \quad \langle DC\rangle \leftarrow \text{initial value of DC}$$
$$\text{(overflow)} \rightarrow \text{"}D_0\text{"}\ D_1 \text{----} D_9\, D_{10}\, D_{11}\, D_{12} \rightarrow AR2$$

↘ DC (final value of DC)

| label | FMP | comments |
|---|---|---|

Fast multiply. The mantissas of AR1 and AR2 are added together (along with DC as $D_{12}$)$\langle B_{0\text{-}3}\rangle$-times; the result accumulates in AR2.

The repeated additions are likely to cause some unknown number of overflows to occur. The number of overflows that occurs is returned in $A_{0\text{-}3}$.

FMP is used repeatedly to accumulate partial products during BCD multiplication. FMP operates strictly upon mantissa portions; signs and exponents are left strictly alone.

$$\langle AR2\rangle + ((\langle AR1\rangle) \cdot (\langle B_{0\text{-}3}\rangle)) + DC \rightarrow AR2$$

DC doesn't enter into these repeated additions except for the first one as shown at the right. 0→DC immediately after each overflow.

Represents the initial value of DC.

$0 \rightarrow DC,\ 0 \rightarrow A_{4\text{-}15}$ # of overflows $\rightarrow A_{0\text{-}3}$

| label | MPY | comments |
|---|---|---|

Binary Multiply Using Booth's Algorithm. The (binary) signed two's complement contents of the A and B registers are multiplied together. The thirty-two bit product is also a signed two 's complement number, and is stored back into A and B. B receives the sign and most-significant bits, and A the least-significant bits:

$$\langle A\rangle \cdot \langle B\rangle \rightarrow \langle B\rangle\ \langle A\rangle$$

| label | FDV | comments |
|---|---|---|

Fast Divide. The mantissas of AR1 and AR2 are added together until the first decimal overflow occurs. The result of these additions accumulates into AR2. The number of additions without overflow (n) is placed into B.

$\langle AR2\rangle + \langle AR1\rangle + \langle DC\rangle \rightarrow AR2$ (repeatedly until overflow)

then $0 \rightarrow DC,\ 0 \rightarrow B_{4\text{-}15},\ n \rightarrow B_{0\text{-}3}$ FDV is used in floating-point division to find the quotient digits of a division. In general, more than one application of FDV is needed to find each digit of the quotient.

As with the other BCD instructions, the signs and exponents of AR1 and AR2 are left strictly alone.

APPENDIX B-1

```
ASMB,R,L
                                        HED FLT POINT MATH ROUTINES - HYBRID VERSION
                                        NAM BPCFP,7  ET10585-1009A \
 *
 *    A-ET10585-1008A-2
 *      ET10585-1008A   (S)
 *      ET10585-1009A   (R)
 *    16 MAR 1978
 *    LYNN WHEELWRIGHT
 *
          0                             EXT AR1LD,.LADC,.MPYD,.DIVF,AR1LN,AR1LP,AR1L
          0                             ENT DIV1,DIV1B,DIV1P,DIV1T,MPY1,MPY1B,MPY1P
          0                             ENT MPY1T,ADD1,ADD1B,ADD1P,ADD1T,SUB1,SUB1B
          0                             ENT SUB1P,SUB1T,MIN1,MIN1B,MIN1P,MIN1T
          0                             EXT .AMIN,.BMIN,AR0D,AR1D,AR2D,AR3D
          0                     A       EQU 0
          1                     B       EQU 1
          3                     R       EQU 3
         16                     C       EQU 16B
         17                     D       EQU 17B
      77763                     E       EQU 77763B
         20                     AR2     EQU 20B
      77770                     AR1     EQU 77770B
      77774                     AR0     EQU 77774B
      77764                     AR3     EQU 77764B
 *
 *
 * FLOATING POINT SUBTRACT
 *
      0   42000      1X  SUB1   JSM AR1LD
      1   42000     10X         JSM .AMIN
      2   66000     34R         JMP FADC
      3   42000      5X  SUB1B  JSM AR1LN
      4   66000      1R         JMP SUB1+1
      5   42000      6X  SUB1P  JSM AR1LP
      6   66000      1R         JMP SUB1+1
      7   42000      7X  SUB1T  JSM AR1LT
     10   66000      1R         JMP SUB1+1
 *
 * FLOATING POINT ADD
 *
     11   42000     11X  MIN1B  JSM .BMIN
     12   42000      5X  ADD1B  JSM AR1LN        OPERAND ADDRESS ON CSTAK
     13   66000     34R         JMP FADC
     14   42000     11X  MIN1   JSM .BMIN
     15   42000      1X  ADD1   JSM AR1LD
     16   66000     34R         JMP FADC
     17   42000     11X  MIN1P  JSM .BMIN
     20   42000      6X  ADD1P  JSM AR1LP
     21   66000     34R         JMP FADC
     22    2000    162R  SFTA   LDA =D-12
     23  174040                 TCB
     24   20001      1A         ADA B
     25  172004                 SAP X11          ANYTHING TO DO?
     26    2000    163R         LDA =D0          YES
     27   75400                 MRX
     30   66000     55R         JMP ADONE
     31  170201          X11    RET 1
     32   42000     11X  MIN1T  JSM .BMIN
     33   42000      7X  ADD1T  JSM AR1LT        OPERAND ON CSTAK
     34    1770  77770A  FADC   LDA AR1
     35    4020     20A         LDB AR2
     36  170405                 AAR 6
     37  174405                 ABR 6
     40  174040                 TCB
     41   24000                 ADB A
     42   76413                 SZB ADONE        EXPON=?
     43  176457                 SBM SFTA         NO
     44    2000    162R         LDA =D-12
     45   20001      1A         ADA B
     46  172023                 SAP AR12         WORTH SHIFTING?
     47       1      1A         LDA B            YES
     50  170605                 SAL 6
     51   20020     20A         ADA AR2          FIX UP EXPONENT
     52   30020     20A         STA AR2
     53    2000    163R         LDA =D0
     54   75500                 MRY              SHIF ACCUM MANTISSA
     55   42000      2X  ADONE  JSM .LADC
     56   72717                 SDC NORM
     57      20     20A         LDA AR2
     60   22000    164R         ADA =B100
     61   30020     20A         STA AR2
     62    2000    165R         LDA =D1
     63    6000    165R         LDB =D1
     64   75500                 MRY
     65   22000    166R         ADA =D-5
     66  172402                 SAM *+2
     67   71000                 MWA
     70  170201                 RET 1
     71    2000     13X  AR12   LDA AR1D
     72    6000     14X         LDB AR2D
     73   71403                 XFR 4
     74  170201                 RET 1
     75   71500          NORM   NRM
     76   72306                 SDS NZERO
     77  174605                 SBL 6
    100  174040                 TCB
    101   24020     20A         ADB AR2
```

```
102  34020     20A          STB AR2
103 170201                  RET 1
104   6000    167R   NZERO  LDB =B100100
105  34020     20A          STB AR2
106 170201                  RET 1
* FLOATING POINT MULTIPLY
107  42000      6X   MPY1P  JSM AR1LP
110  66000    116R          JMP FMPC
111  42000      5X   MPY1B  JSM AR1LN      OPERAND ADDRESS ON CSTAK
112  66000    116R          JMP FMPC
113  42000      1X   MPY1   JSM AR1LD
114  66000    116R          JMP FMPC
115  42000      7X   MPY1T  JSM AR1LT      OPERAND ON CSTAK
116  42000      3X   FMPC   JSM .MPYD
117   2000     12X          LDA AR0D
120   6000     13X          LDB AR1D
121  71403                  XFR 4
122  71500                  NRM
123  76412                  SZB FMPX
124 174040                  TCB
125      1      1A          LDA B
126 170605                  SAL 6
127  20020     20A          ADA AR2
130  30020     20A          STA AR2
131  26000    170R          ADB =D12
132   2000    163R          LDA =D0
133  75400                  MRX
134  71200                  FXA
135 170201           FMPX   RET 1
*
136  42000      6X   DIV1P  JSM AR1LP
137  66000    145R          JMP FDVC
140  42000      5X   DIV1B  JSM AR1LN      OPERAND ADDRESS ON CSTAK
141  66000    145R          JMP FDVC
142  42000      1X   DIV1   JSM AR1LD
143  66000    145R          JMP FDVC
144  42000      7X   DIV1T  JSM AR1LT      OPERAND ON CSTAK
145   1771  77771A   FDVC   LDA AR1+1
146  61772  77772A          IOR AR1+2
147  61773  77773A          IOR AR1+3
150  72002                  RZA FDVD
151 170201                  RET 1
152  42000      4X   FDVD   JSM .DIVF
153   2000     13X          LDA AR1D
154   6000     14X          LDB AR2D
155  71403                  XFR 4
156     20     20A          LDA AR2
157  22000    164R          ADA =B100
160  30020     20A          STA AR2
161  66000     75R          JMP NORM
161                         END
162 177764
163      0
164    100
165      1
166 177773
167 100100
170     14

.AMIN   10X      .BMIN   11X      .DIVF   4X       .LADC   2X
.MPYD   3X       0       163R     1       165R     100     164R
100100  167R     14      170R     177764  162R     177773  166R

A       0A       ADD1    16R      ADD1B   12R      ADD1P   20R
ADD1T   33R      ADONE   55R      AR0     77774A   AR0D    12X
AR1     77770A   AR12    71R      AR1D    13X      AR1LD   1X
AR1LN   5X       AR1LP   6X       AR1LT   7X       AR2     20A
AR2D    14X      AR3     77764A   AR3D    15X      B       1A
C       16A      D       17A      DIV1    142R     DIV1B   140R
DIV1P   136R     DIV1T   144R     E       77763A   FADC    34R
FDVC    145R     FDVD    152R     FMPC    116R     FMPX    135R
MIN1    14R      MIN1B   11R      MIN1P   17R      MIN1T   32R
MPY1    113R     MPY1B   111R     MPY1P   107R     MPY1T   115R
NORM    75R      NZERO   104R     R       3A       SFTA    22R
SUB1    0R       SUB1B   3R       SUB1P   5R       SUB1T   7R
X1T     31R

KSPMAX=2 MSPMAX=39 NSPMAX=6 SSPMAX=339 DSPMAX=61
```

APPF IX B-2

```
ASMB,R,L
                                   HED MATH ROUTINES - CHIP VERSION \
                                   NAM BPCMC,7  ET10585-1011A \
*
*     A-ET10585-1010A-2
*        ET10585-1010A   (S)
*        ET10585-1011A   (R)
*     12 JUN 1978
*     LYNN WHEELWRIGHT
*
       0                           ENT AR1LD,.LADC,.MPYD,.DIVD,.DIVF,AR1LN,AR1L
       0                           ENT .AMIN,.BMIN,AR1LP,.BDVF,.BDVS
       0                           ENT ADD2,ADD3,ADD2B,ADD3B,ADD4B
       0                           ENT ADD2P,ADD3P,ADD4P,ADD2T,ADD4T
       0                           ENT MIN2,MIN3,MIN2B,MIN3B,MIN4B
       0                           ENT MIN2P,MIN3P,MIN4P,MIN2T,MIN4T
       0                           ENT SUB2,SUB3,SUB2B,SUB3B,SUB4B
       0                           ENT SUB2P,SUB3P,SUB4P,SUB2T,SUB4T
```

```
          0                              ENT  MPY2,MPY3,MPY2B,MPY3B,MPY4B
          0                              ENT  MPY2P,MPY3P,MPY4P,MPY2T,MPY4T
          0                              ENT  DIV2,DIV3,DIV4,DIV2B,DIV3B,DIV4B
          0                              ENT  DIV2P,DIV3P,DIV4P,DIV2T,DIV4T
          0                              ENT  MOD2,MOD3,MOD4,MOD2B,MOD3B,MOD4B
          0                              ENT  MOD2P,MOD3P,MOD4P,MOD2T,MOD4T
          0                              ENT  ADD3T,SUB3T,MIN3T,MPY3T,DIV3T,MOD3T
          0                              EXT  AR0D,AR1D,AR2D,AR3D,.FRPB
          0                       A      EQU  0
          1                       B      EQU  1
          3                       R      EQU  3
         16                       C      EQU  16B
         17                       D      EQU  17B
      77763                       E      EQU  77763B
         20                       AR2    EQU  20B
          0     21                AR2M   ABS  AR2+1
      77770                       AR1    EQU  77770B
          1  77771                AR1M   ABS  AR1+1
      77774                       AR0    EQU  77774B
          2  77775                AR0M   ABS  AR0+1
          3  77777                AR0L   ABS  AR0+3
      77764                       AR3    EQU  77764B
          4  77765                AR3M   ABS  AR3+1
          5  77767                AR3L   ABS  AR3+3
*
      77762                       TMPA   EQU  77762B
      77761                       TMPB   EQU  77761B
      77760                       CNTR   EQU  77760B
      77757                       TMP    EQU  77757B
      77756                       INDX   EQU  77756B
*
*   LONG SUB
*
          6  42000        437R    SUB2   JSM  AR1LD
          7  42000        461R           JSM  .AMIN
         10  66000         32R           JMP  .LADC
         11  42000        443R    SUB2B  JSM  AR1LN
         12  66000          7R           JMP  SUB2+1
         13  42000        447R    SUB2P  JSM  AR1LP
         14  66000          7R           JMP  SUB2+1
         15  42000        454R    SUB2T  JSM  AR1LT
         16  66000          7R           JMP  SUB2+1
*
*   LONG ADD
*
         17  42000        473R    MIN2P  JSM  .BMIN
         20  42000        447R    ADD2P  JSM  AR1LP
         21  66000         32R           JMP  .LADC
         22  42000        473R    MIN2B  JSM  .BMIN
         23  42000        443R    ADD2B  JSM  AR1LN       OPERAND ADDRESS ON CSTAK
         24  66000         32R           JMP  .LADC
         25  42000        473R    MIN2   JSM  .BMIN
         26  42000        437R    ADD2   JSM  AR1LD
         27  66000         32R           JMP  .LADC
         30  42000        473R    MIN2T  JSM  .BMIN
         31  42000        454R    ADD2T  JSM  AR1LT       OPERAND ON CSTAK
         32   1770     77770A     .LADC  LDA  AR1
         33  20020        20A            ADA  AR2
         34   4020        20A            LDB  AR2
         35  71700                       CDC              CLEAR CARRY
         36  73403                       RLA  OPSGN
         37  71200                SMSGN  FXA
         40 170201                       RET  1
         41  77613                OPSGN  RLB  NAR2,C      OPPOSITE SIGNS
         42   1770     77770A            LDA  AR1
         43  73201                       SLA  *+1,C
         44  31770     77770A            STA  AR1
         45   1771     77771A            LDA  AR1+1
         46  61772     77772A            IOR  AR1+2
         47  61773     77773A            IOR  AR1+3
         50  72002                       RZA  *+2
         51 170201                       RET  1           NOTHING TO DO
         52  71140                       CMX              COMPLEMENT AR1
         53  66000         66R           JMP  DOIT
         54  34020        20A     NAR2   STB  AR2
         55     21        21A            LDA  AR2+1
         56  60022        22A            IOR  AR2+2
         57  60023        23A            IOR  AR2+3
         60  72005                       RZA  DOIT-1
         61   2000         2X            LDA  AR1D        MOVE AR1 TO AR2
         62   6000         3X            LDB  AR2D
         63  71403                       XFR  4
         64 170201                       RET  1
         65  71040                       CMY              COMPLEMENT AR2 (ACCUM)
         66  71200                DOIT   FXA
         67  72303                       SDS  CXIT        CARRY?
         70  44020        20A            ISZ  AR2         NO, SET SIGN NEGATIVE
         71  71040                       CMY              COMPLEMENT ACCUM
         72  71700                CXIT   CDC              CLEAR CARRY
         73 170201                       RET  1
*
*   LONG MULTIPLY
*
         74  42000        447R    MPY2P  JSM  AR1LP
         75  66000        101R           JMP  SMPYC
         76  42000        443R    MPY2B  JSM  AR1LN       OPERAND ADDRESS ON CSTAK
         77  66000        101R           JMP  SMPYC
        100  42000        454R    MPY2T  JSM  AR1LT       OPERAND ON CSTAK
        101  42000        110R    SMPYC  JSM  .MPYD
        102   2000          2R           LDA  AR0M        MOVE AR0 TO AR2
```

```
    103    6000                   LDB AR2M
    104   71402                   XFR 3
    105  170201                   RET 1
    106   42000     437R   MPY2   JSM AR1LD
    107   66000     101R          JMP SMPYC
*
    110    6000       3R  .MPYD   LDB AR0L
    111   35756  77756A           STB INDX
    112    6000       5R          LDB AR3L
    113   35757  77757A           STB TMP
    114    2000                   LDA AR2M        MOVE AR2 TO AR3
    115    6000       4R          LDB AR3M
    116   71402                   XFR 3
    117   71602                   CLR 3
    120    2000       2R          LDA AR0M        CLEAR AR0,AR2
    121   71602                   CLR 3
    122   71700                   CDC
    123   42000     137R          JSM MPY40
    124   55757  77757A           DSZ TMP
    125   55756  77756A           DSZ INDX
    126   42000     137R          JSM MPY40
    127   55757  77757A           DSZ TMP
    130   55756  77756A           DSZ INDX
    131   42000     137R          JSM MPY40
    132    1770  77770A           LDA AR1
    133   20020     20A           ADA AR2
    134   52000     725R          AND =B177701
    135   30020     20A           STA AR2
    136  170201                   RET 1
    137    2000     726R   MPY40  LDA =D-4
    140   31760  77760A           STA CNTR
    141  105757  77757A   MPY42  LDB TMP,I        INDX=PRODUCT
    142   76415                   SZB MPY50        TMP=MPYR
    143  174703                   RBR 4
    144  135757  77757A           STB TMP,I
    145  174513                   SBR 12
    146   75000                   FMP
    147    6000     727R          LDB =D1
    150   75500                   MRY
    151  161756  77756A           IOR INDX,I
    152  170703                   RAR 4
    153  131756  77756A           STA INDX,I
    154   45760  77760A           ISZ CNTR
    155   66000     141R          JMP MPY42
    156  170201                   RET 1
    157      23     23A   MPY50  LDA AR2+3
    160  131756  77756A           STA INDX,I
    161    2000     730R          LDA =D0
    162    6000     731R          LDB =D4
    163   75500                   MRY
    164  170201                   RET 1
*
* LONG DIVIDE
*
    165   42000     447R   DIV2P  JSM AR1LP
    166   66000     172R          JMP SDIVC
    167   42000     443R   DIV2B  JSM AR1LN       OPERAND ADDRESS ON CSTAK
    170   66000     172R          JMP SDIVC
    171   42000     454R   DIV2T  JSM AR1LT       OPERAND ON CSTAK
    172   42000     225R   SDIVC  JSM .DIVD
    173    2000       2X          LDA AR1D        MOVE AR1 TO AR2
    174    6000       3X          LDB AR2D
    175   71403                   XFR 4
    176  170201                   RET 1
    177   42000     437R   DIV2   JSM AR1LD
    200   66000     172R          JMP SDIVC
*
    201   42000     447R   MOD2P  JSM AR1LP
    202   66000     206R          JMP SMODC
    203   42000     443R   MOD2B  JSM AR1LN       OPERAND ADDRESS ON CSTAK
    204   66000     206R          JMP SMODC
    205   42000     454R   MOD2T  JSM AR1LT       OPERAND ON CSTAK
    206   42000     225R   SMODC  JSM .DIVD
    207    2000       3X          LDA AR2D
    210   66000     403R          JMP NINEC       RETURN FROM NINES COMP TO USER
    211   42000     437R   MOD2   JSM AR1LD
    212   66000     206R          JMP SMODC
*
    213    2000     732R  .DIVF   LDA =D-12       FLOATING POINT ENTRY
    214   31760  77760A           STA CNTR          DO 12 DIGITS
    215    2000       4R          LDA AR3M
    216   31757  77757A           STA TMP         DIVIDEND POINTER
    217   71602                   CLR 3            CLEAR LSH DIVIDEND
    220    2000       1X          LDA AR0D
    221   71603                   CLR 4           CLEAR QUOTIENT AND SHIFT COUNT
    222   72101                   RIA *+1
    223   31756  77756A           STA INDX        QUOTIENT POINTER
    224   66000     277R          JMP DV002
    225   71500           .DIVD   NRM             BCD ENTRY
    226   35762  77762A           STB TMPA        TMPA=# LEADING ZEROES IN DIVID
    227    2000                   LDA AR2M        SAVE DIVIDEND IN AR0
    230    6000       2R          LDB AR0M
    231   71402                   XFR 3
    232    2000       1R          LDA AR1M        FETCH DIVISOR
    233    6000                   LDB AR2M
    234   71402                   XFR 3
    235   71500                   NRM             DIV BY ZERO ??
    236   72706                   SDC DV001
    237    6000     733R   DOVFL  LDB =B114631    RETURN TO DUMBELL - DIV BY ZER
    240   35771  77771A           STB AR1+1
```

```
241  35772   77772A         STB AR1+2
242  35773   77773A         STB AR1+3
243 170201                  RET 1
244  35761   77761A  DV001  STB TMPB       TMPB=# LEADING ZEROES IN DIVIS
245 174140                  CMB            COMPUTE # DIGITS TO BE GENERAT
246  25762   77762A         ADB TMPA       -# DIGITS = TMPA-TMPB-1
247  35760   77760A         STB CNTR
250  26000     734R         ADB =D12
251  35774   77774A         STB AR0        # DIGITS TO RIGHT SHIFT QUOTIE
252   2000       2R         LDA AR0M         WHEN DONE
253   6000                  LDB AR2M
254  71402                  XFR 3          RETRIEVE DIVIDEND
255   5761   77761A         LDB TMPB
256  26000     732R         ADB =D-12      COMPUTE # DIGITS FOR LEFT SHIF
257  66000     262R         JMP *+3
260   2000     730R         LDA =D0
261  75541                  MLY            LEFT SHIFT FOR AR3 FOR FIRST D
262  76176                  RIB *-2
263   2000                  LDA AR2M       PUT IN AR3
264   6000       4R         LDB AR3M
265  35757   77757A         STB TMP        DIVIDEND POINTER
266  71402                  XFR 3
267   2000       2R         LDA AR0M
270  31756   77756A         STA INDX       QUOTIENT POINTER
271   6000                  LDB AR2M       RETRIEVE DIVIDEND
272  71402                  XFR 3
273  71602                  CLR 3          CLR AR0
274   2000     730R         LDA =D0
275   5761   77761A         LDB TMPB       RIGHT SHIFT AR2 FOR FIRST DIVI
276  75500                  MRY
277 173201           DV002  SOC *+1,C      CLEAR OVFL AND DC
300  71700                  CDC
301   2000       3X         LDA AR2D
302  42000     403R         JSM NINEC      9'S COMP AR2
303   2000       4X         LDA AR3D
304  42000     403R         JSM NINEC      9'S COMP AR3
305   5760   77760A         LDB CNTR
306 176404                  SBM *+4        ANYTHING TO DO?
307   2000       2X         LDA AR1D       NO
310  71603                  CLR 4          RESULT = 0
311 170201                  RET 1          EXIT TO USER
312  42000     342R         JSM DV015
313  42000     322R         JSM LOOP5
314  42000     322R         JSM LOOP5
315  42000     322R         JSM LOOP5
316  45756   77756A         ISZ INDX
317  42000     322R         JSM LOOP5
320  45757   77757A         ISZ TMP
321  66000     313R         JMP *-6
322 101757   77757A  LOOP5  LDA TMP,I      GET A DIGIT
323 170713                  RAR 12
324 131757   77757A         STA TMP,I
325  75541                  MLY            SHIFT IN DIVIDEND
326  12000     735R         CPA =D9        SHOULD BE NINE
327  66000     342R         JMP DV015      IT IS
330  22000     736R         ADA =D-10
331  31762   77762A         STA TMPA       TAKE SPECIAL ACTION
332   2000     737R         LDA =D-1        TO HANDLE 13 DIGIT REMAINDER
333  72501           DV005  SIA *+1
334  75041                  FDV
335  20001       1A         ADA B          COUNT # OF ADDS IN A REG
336  45762   77762A         ISZ TMPA       DONE ENOUGH
337  66000     333R         JMP DV005      NO
340   4000                  LDB A
341  66000     343R         JMP DV020      STORE DIGIT IN QUOTIENT
342  75041           DV015  FDV            GENERATE QUOTIENT DIGIT
343  71140           DV020  CMX
344  71200                  FXA            RESTORE DIVIDEND
345  71140                  CMX
346 101756   77756A         LDA INDX,I     STORE DIGIT IN QUOTIENT
347 170603                  SAL 4
350  60001       1A         IOR B
351 131756   77756A         STA INDX,I
352  45760   77760A         ISZ CNTR       DONE 12 DIGITS?
353 170201                  RET 1          NO - RETURN TO LOOP
354  54003       3A         DSZ R          YES - POP RETURN ADDRESS
355   5774   77774A  DV045  LDB AR0        FIX UP LAST WORD OF QUOTIENT
356  77002                  SLB *+2
357 170603                  SAL 4
360 174500                  SBR 1
361  77002                  SLB *+2
362 170607                  SAL 8
363 131756   77756A         STA INDX,I
364   2000       2R  DV050  LDA AR0M       FIX UP QUOTIENT
365   6000       1R         LDB AR1M
366  71402                  XFR 3
367   2000     730R         LDA =D0
370   5774   77774A         LDB AR0
371  75400                  MRX            RIGHT JUSTIFY QUOTIENT
372   1770   77770A         LDA AR1        FIX UP EXPONENT
373   4020      20A         LDB AR2
374  73202                  SLA *+2,C      CHECK SIGNS
375  26000     727R         ADB =D1
376 170040                  TCA
377  20001       1A         ADA B
400  52000     725R         AND =B177701
401  31770   77770A         STA AR1
402 170201                  RET 1
*              NINES COMPLEMENT ACCUMULATOR
403  42000     405R  NINEC  JSM NINED      AREG PTS TO ACCUMULATOR TO BE
```

```
404   42000    405R         JSM NINEL
405   72501          NINEL  SIA *+1          COMPLEMENTED
406  104000                 LDB A,I
407  174040                 TCB
410   26000    733R         ADB =B114631
411  134000                 STB A,I
412  170201                 RET 1
*
413       3      3A  FRP1   LDA R
414   22000    740R         ADA =D-2
415  144000                 ISZ A,I
416  100000                 LDA A,I
417  100000                 LDA A,I
420  170201                 RET 1
*
421   42000    413R  AR1SL  JSM FRP1         LOAD AR1 WITH 4 DIGIT BCD
422  100000          AR1SA  LDA A,I
423   31773  77773A         STA AR1+3
424    2000      2X         LDA AR1D
425   71602                 CLR 3
426  170201                 RET 1
427   70760          AR1SN  WWC A
430   66000    422R         JMP AR1SA
431   42000      5X  AR1SP  JSM .FRPB
432  100001      1A         LDA B,I
433   31773  77773A         STA AR1+3
434    2000      2X         LDA AR1D
435   71602                 CLR 3
436  170201                 RET 1
437   42000    413R  AR1LD  JSM FRP1
440  172204                 SAP AR1LA,C
441  100000                 LDA A,I
442   66000    440R         JMP *-2
443   70760          AR1LN  WWC A
444    6000      2X  AR1LA  LDB AR1D
445   71403                 XFR 4
446  170201                 RET 1
447   42000      5X  AR1LP  JSM .FRPB
450       1      1A         LDA B
451    6000      2X         LDB AR1D
452   71403                 XFR 4
453  170201                 RET 1
454    2000    726R  AR1LT  LDA =D-4
455   20016     16A         ADA C
456   30016     16A         STA C
457   72165                 RIA AR1LA
460   66000    444R         JMP AR1LA
*
461    5770  77770A  .AMIN  LDB AR1
462   77302                 SLB *+2,S
463   77606                 RLB *+6,C
464   35770  77770A         STB AR1
465    5771  77771A         LDB AR1+1
466   25772  77772A         ADB AR1+2
467   25773  77773A         ADB AR1+3
470   76002                 RZB *+2
471   35770  77770A         STB AR1
472  170201                 RET 1
473   35761  77761A  .BMIN  STB IMPB
474    4020     20A         LDB AR2
475   77302                 SLB *+2,S
476   77606                 RLB *+6,C
477   34020     20A         STB AR2
500    4021     21A         LDB AR2+1
501   24022     22A         ADB AR2+2
502   24023     23A         ADB AR2+3
503   76002                 RZB *+2
504   34020     20A         STB AR2
505    5761  77761A         LDB IMPB
506  170201                 RET 1
*
507   42000    421R  SUB3   JSM AR1SL
510   42000    461R         JSM .AMIN
511   66000     32R         JMP .LADC
512   42000    427R  SUB3B  JSM AR1SN
513   66000    510R         JMP SUB3+1
514   42000    431R  SUB3P  JSM AR1SP
515   66000    510R         JMP SUB3+1
516   42000    473R  MIN3P  JSM .BMIN
517   42000    431R  ADD3P  JSM AR1SP
520   66000     32R         JMP .LADC
521   42000    473R  MIN3B  JSM .BMIN
522   42000    427R  ADD3B  JSM AR1SN        OPERAND ADDRESS ON CSTAK
523   66000     32R         JMP .LADC
524   42000    473R  MIN3   JSM .BMIN
525   42000    421R  ADD3   JSM AR1SL
526   66000     32R         JMP .LADC
*
527   42000    431R  MPY3P  JSM AR1SP
530   66000    101R         JMP SMPYC
531   42000    427R  MPY3B  JSM AR1SN
532   66000    101R         JMP SMPYC        OPERAND ADDRESS ON CSTAK
533   42000    421R  MPY3   JSM AR1SL
534   66000    101R         JMP SMPYC
*
535   42000    431R  DIV3P  JSM AR1SP
536   66000    172R         JMP SDIVC
537   42000    427R  DIV3B  JSM AR1SN
540   66000    172R         JMP SDIVC        OPERAND ADDRESS ON CSTAK
541   42000    421R  DIV3   JSM AR1SL
```

```
 542  66000    172R         JMP SDIVC
*
 543  42000    431R  MOD3P  JSM AR1SP
 544  66000    206R         JMP SMODC
 545  42000    427R  MOD3B  JSM AR1SN      OPERAND ADDRESS ON CSTAK
 546  66000    206R         JMP SMODC
 547  42000    421R  MOD3   JSM AR1SL
 550  66000    206R         JMP SMODC
*
  31                 ADD3T  EQU ADD2T
  30                 MIN3T  EQU MIN2T
  15                 SUB3T  EQU SUB2T
 100                 MPY3T  EQU MPY2T
 171                 DIV3T  EQU DIV2T
 205                 MOD3T  EQU MOD2T
*
 551  42000    565R  MOD4B  JSM DIV4B      OPERAND ADDRESS ON CSTAK
 552  66000    563R         JMP MOD4C+1
 553  42000      5X  MOD4P  JSM .FRPB
 554  66000    562R         JMP MOD4C
 555  42000    571R  MOD4T  JSM DIV4T      OPERAND ON CSTAK
 556  66000    563R         JMP MOD4C+1
 557 144003      3A  MOD4   ISZ R,I
 560 104003      3A         LDB R,I
 561 104001      1A         LDB B,I
 562  42000    576R  MOD4C  JSM BDIVB
 563      1      1A         LDA B
 564 170201                 RET 1
*
 565  70761          DIV4B  WWC B          OPERAND ADDRESS ON CSTAK
 566  66000    576R         JMP BDIVB
 567  42000      5X  DIV4P  JSM .FRPB
 570  66000    576R         JMP BDIVB
 571  70761          DIV4T  WWC B          OPERAND ON CSTAK
 572  66000    577R         JMP BDIVC
 573 144003      3A  DIV4   ISZ R,I
 574 104003      3A         LDB R,I
 575 104001      1A         LDB B,I        GET DEF TO ADDRESS
 576 104001      1A  BDIVB  LDB B,I        GET DIVISOR
 577  42000    635R  BDIVC  JSM .BDVS      SET UP FOR DIVIDE
 600   6000    730R         LDB =D0
 601 170600          BD005  SAL 1          SKIP OVER USELESS ZEROES
 602 172607                 SAM BD011,C
 603  45777  77777A         ISZ AR0+3
 604  66000    601R         JMP BD005
 605 170201                 RET 1
 606 170600          BD010  SAL 1
 607 174600                 SBL 1
 610 172202                 SAP *+2,C
 611  76501          BD011  SIB *+1
 612  25774  77774A  .BDVF  ADB AR0
 613 177603                 SES *+3,C
 614  25775  77775A         ADB AR0+1
 615 177602                 SES BD030,C
 616  72501                 SIA *+1
 617  45777  77777A  BD030  ISZ AR0+3      DONE?
 620  66000    606R         JMP BD010      NO.
 621  35774  77774A         STB AR0
 622   5757  77757A         LDB TMP
 623 176002                 SBP *+2
 624 170040                 TCA
 625   5776  77776A         LDB AR0+2
 626 176403                 SBM *+3
 627   5774  77774A         LDB AR0
 630 170201                 RET 1
 631   5774  77774A         LDB AR0
 632 174040                 TCB
 633 170040                 TCA
 634 170201                 RET 1
 635  76416          .BDVS  SZB BOVFL
 636  31776  77776A         STA AR0+2      SAVE DIVIDEND
 637  35757  77757A         STB TMP        SAVE DIVISOR
 640 176402                 SBM *+2
 641 174040                 TCB
 642  35774  77774A         STB AR0        -DIVISOR
 643 174040                 TCB
 644  35775  77775A         STB AR0+1      +DIVISOR
 645   6000    741R         LDB =D-15
 646  35777  77777A         STB AR0+3      CNTR
 647 172002                 SAP *+2
 650 170040                 TCA
 651 177201                 SEC *+1,C
 652 170201                 RET 1
 653   4000          BOVFL  LDB A
 654   2000    742R         LDA =D32767
 655 176002                 SBP *+2
 656 170040                 TCA
 657 173701                 SOS *+1,S
 660 170201                 RET 1
*
 661  70761          ADD4B  WWC B
 662  66000    664R         JMP ADD4P+1
 663  42000      5X  ADD4P  JSM .FRPB
 664 120001      1A         ADA B,I
 665 170201                 RET 1
 666  70761          ADD4T  WWC B
 667  20001      1A         ADA B
 670 170201                 RET 1
 671  70761          MPY4B  WWC B
 672  66000    674R         JMP MPY4P+1
```

```
673  42000         5X   MPY4P  JSM  .FRPB
674 104001         1A          LDB  B,1
675  75617                     MPY
676 170201                     RET  1
677  70761              MPY4T  WWC  B
700  75617                     MPY
701 170201                     RET  1
702  42000         5X   SUB4P  JSM  .FRPB
703 104001         1A   SUBC   LDB  B,1
704 174040                     TCB
705  20001         1A          ADA  B
706 170201                     RET  1
707  70761              SUB4B  WWC  B
710  66000       703R          JMP  SUBC
711  70761              SUB4T  WWC  B
712  66000       704R          JMP  SUBC+1
713  42000         5X   MIN4P  JSM  .FRPB
714 170040              MINC   TCA
715 120001         1A          ADA  B,1
716 170201                     RET  1
717  70761              MIN4B  WWC  B
720  66000       714R          JMP  MINC
721  70761              MIN4T  WWC  B
722 170040                     TCA
723  20001         1A          ADA  B
724 170201                     RET  1
724                            END
725 177701
726 177774
727      1
730      0
731      4
732 177764
733 114631
734     14
735     11
736 177766
737 177777
740 177776
741 177761
742  77777

.AMIN   461R     .BDVF   612R     .BDVS   635R     .BMIN   473R
.DIVD   225R     .DIVF   213R     .FRPB   5X       .LADC   32R
.MPYD   110R     0       730R     1       727R     11      735R
114631  733R     14      734R     177701  725R     177761  741R
177764  732R     177766  736R     177774  726R     177776  740R
177777  737R     4       731R     77777   742R     A       0A
ADD2    26R      ADD2B   23R      ADD2P   20R      ADD2T   31R
ADD3    525R     ADD3B   522R     ADD3P   517R     ADD3T   31R
ADD4B   661R     ADD4P   663R     ADD4T   666R     AR0     77774A
AR0D    1X       AR0L    3R       AR0M    2R       AR1     77770A
AR1D    2X       AR1LA   444R     AR1LD   437R     AR1LN   443R
AR1LP   447R     AR1LT   454R     AR1M    1R       AR1SA   422R
AR1SL   421R     AR1SN   427R     AR1SP   431R     AR2     20A
AR2D    3X       AR2M    0R       AR3     77764A   AR3D    4X
AR3L    5R       AR3M    4R       B       1A       BD005   601R
BD010   606R     BD011   611R     BD030   617R     BDIVB   576R
BDIVC   577R     BOVFL   653R     C       16A      CNTR    77760A
CXIT    72R      D       17A      DIV2    177R     DIV2B   167R
DIV2P   165R     DIV2T   171R     DIV3    541R     DIV3B   537R
DIV3P   535R     DIV3T   171R     DIV4    573R     DIV4B   565R
DIV4P   567R     DIV4T   571R     DOIT    66R      DOVFL   237R
DV001   244R     DV002   277R     DV005   333R     DV015   342R
DV020   343R     DV045   355R     DV050   364R     E       77763A
FRP1    413R     INDX    77756A   LOOP5   322R     MIN2    25R
MIN2B   22R      MIN2P   17R      MIN2T   30R      MIN3    524R
MIN3B   521R     MIN3P   516R     MIN3T   30R      MIN4B   717R
MIN4P   713R     MIN4T   721R     MINC    714R     MOD2    211R
MOD2B   203R     MOD2P   201R     MOD2T   205R     MOD3    547R
MOD3B   545R     MOD3P   543R     MOD3T   205R     MOD4    557R
MOD4B   551R     MOD4C   562R     MOD4P   553R     MOD4T   555R
MPY2    106R     MPY2B   76R      MPY2P   74R      MPY2T   100R
MPY3    533R     MPY3B   531R     MPY3P   527R     MPY3T   100R
MPY40   137R     MPY42   141R     MPY4B   671R     MPY4P   673R
MPY4T   677R     MPY50   157R     NAR2    54R      NINEC   403R
NINEL   405R     OPSGN   41R      R       3A       SDIVC   172R
SMODC   206R     SMPYC   101R     SMSGN   37R      SUB2    6R
SUB2B   11R      SUB2P   13R      SUB2T   15R      SUB3    507R
SUB3B   512R     SUB3P   514R     SUB3T   15R      SUB4B   707R
SUB4P   702R     SUB4T   711R     SUBC    703R     TMP     77757A
TMPA    77762A   TMPB    77761A

KSPMAX=2 MSPMAX=39 NSPMAX=6 SSPMAX=919 DSPMAX=158
```

APPENDIX B-3

```
ASMB,R,L
                                 HED BPC SERVICE ROUTINES - CHIP VERSION
                                 NAM BSRVC,7  ET10585-1031A \
*
*    A-ET10585-1030A-2
*      ET10585-1030A  (S)
*      ET10585-1031A  (R)
*    7 MAR 1978
*    LYNN WHEELWRIGHT
*
       0                         ENT .MVE4,.CSHV,.LDAP,.STRD,.STRB,.LDB1
       0                         ENT .SAR2,.LDBA,.RAR2,.ADDR
       0                         ENT .ARGS,.STBC,.ARGA,.ARGL
```

```
        0                     ENT  .UPC4,.CLBV,.LDBP,.STBP
        0                     ENT  .LDSI,.LDSA,.LDSP,.DSGN,.STAP
        0                     ENT  .RTNA,.RTNB,.RTNI,.RTNL
        0                     ENT  .CLNP,.CLAI,.CLAP
        0                     ENT  .CLBI,.CLBP,.FRPB
        0               A     EQU  0
        1               B     EQU  1
        3               R     EQU  3
       16               C     EQU  16B
       17               D     EQU  17B
    77763               E     EQU  77763B
       20               AR2   EQU  20B
    77777               TMP   EQU  77777B
        0                     EXT  AR2D
 *
      0 144003     3A   .ADDR ISZ  R,I        FETCH DEF
      1 100003     3A         LDA  R,I
      2 100000                LDA  A,I
      3 170201                RET  1
 *
      4  77004          .FRPB SLB  *+4        LSB=1 : VALUE
      5 174400                ABR  1            LDB STACK INDEX
      6  25763 77763A         ADB  E            JSM .FRPB
      7 170201                RET  1               BREG=ADDRESS
     10 174400                ABR  1          LSB=0 : NAME ITEM
     11  25763 77763A         ADB  E
     12 104001     1A         LDB  B,I
     13 170201                RET  1
 *
     14 144003     3A   .LDBI ISZ  R,I
     15 100003     3A         LDA  R,I
     16 100000                LDA  A,I
     17  66000    22R         JMP  .LDB
     20  42000     4R   .LDBP JSM  .FRPB
     21      1     1A   .LDBA LDA  B
     22   6000     1X   .LDB  LDB  AR2D
     23  71403                XFR  4
     24 170201                RET  1
     25 104003     3A   .MVE4 LDB  R,I
     26  76501                SIB  *+1
     27 100001     1A         LDA  B,I
     30  76501                SIB  *+1
     31 104001     1A         LDB  B,I
     32  71403                XFR  4
     33 170203                RET  3
     34  70761          .STBC WWC  B
     35  66000    50R         JMP  .STRB
     36  42000     4R   .STBP JSM  .FRPB
     37  66000    50R         JMP  .STRB
     40 144003     3A   .STRD ISZ  R,I
     41 104003     3A         LDB  R,I
     42 104001     1A         LDB  B,I
     43  66000    50R         JMP  .STRB
     44   4016    16A   .SAR2 LDB  C
     45  26000   203R         ADB  =D4
     46  34016    16A         STB  C
     47  26000   204R         ADB  =D-3
     50   2000     1X   .STRB LDA  AR2D
     51  71403                XFR  4
     52 170201                RET  1
     53   2000     1X   .RTNB LDA  AR2D
     54  71602                CLR  3
     55   5763 77763A   .RTNI LDB  E
     56  76101                RIB  *+1
     57 100001     1A         LDA  B,I
     60  30023    23A         STA  AR2+3
     61   5763 77763A   .RTNA LDB  E
     62  34016    16A         STB  C
     63  70761                WWC  B
     64  35763 77763A         STB  E
     65  70761                WWC  B
     66  24016    16A         ADB  C
     67  34016    16A         STB  C
     70 170201                RET  1
     71   1763 77763A   .RTNL LDA  E
     72   6000     1X         LDB  AR2D
     73  72101                RIA  *+1
     74  71403                XFR  4
     75  66000    61R         JMP  .RTNA
     76   6000   205R   .RAR2 LDB  =D-4
     77  24016    16A         ADB  C
    100  34016    16A         STB  C
    101  76501                SIB  *+1
    102 170201                RET  1
    103     20    20A   .DSGN LDA  AR2
    104 170700                RAR  1
    105 170201                RET  1
    106  35777 77777A   .ARGL STB  TMP        AR2=1ST PARAM
    107  42000    44R         JSM  .SAR2
    110   5777 77777A         LDB  TMP
    111  66000   113R         JMP  .ARGS
    112  70540          .ARGA PWC  A          AREG=1ST PARAM
    113  70541          .ARGS PWC  B          BREG=-# WORDS ON STACK
    114   5763 77763A         LDB  E
    115  70541                PWC  B
    116   4016    16A         LDB  C
    117  35763 77763A         STB  E
    120 170201                RET  1
    121   6000   203R   .UPC4 LDB  =D4        INCREMENT STACK 4
    122  24016    16A         ADB  C
```

```
123  34016     16A        STB C
124 170201                RET 1
125 144003      3A  .CLBI ISZ R,I          PUSH VARIABLE ON CSTAK
126 104003      3A        LDB R,I
127 104001      1A        LDB B,I
130  66000    132R        JMP .CLBV
131  42000      4R  .CLBP JSM .FRPB        PUSH PARAM ITEM ON CSTAK
132      1      1A  .CLBV LDA B            PUSH 4 WORDS ON CSTAK
133   4016     16A        LDB C
134  76501                SIB *+1
135  71403                XFR 4
136  26000    206R        ADB =D3
137  34016     16A        STB C
140 170201                RET 1
141 144003      3A  .CLAI ISZ R,I          PUSH DEF VALUE ON CSTAK
142 104003      3A        LDB R,I
143 104001      1A        LDB B,I
144  66000    153R        JMP .CSH
145  42000      4R  .CLAP JSM .FRPB        PUSH VALUE OF ITEM ON CSTAK
146  66000    153R        JMP .CSH
147  42000      4R  .CLNP JSM .FRPB        PUSH ADDRESS OF ITEM ON CSTAK
150  66000    154R        JMP .CSH+1
151 144003      3A  .CSHV ISZ R,I          PUSH ADDRESS ON CSTAK
152 104003      3A        LDB R,I
153 104001      1A  .CSH  LDB B,I
154  70541                PWC B
155 170201                RET 1
156  42000      4R  .LDAP JSM .FRPB
157 100001      1A        LDA B,I
160 170201                RET 1
161   2000      1X  .LDSA LDA AR2D
162  71602                CLR 3
163  66000    175R        JMP .LDS1
164   2000      1X  .LDSI LDA AR2D
165  71602                CLR 3
166 144003      3A        ISZ R,I
167 104003      3A        LDB R,I
170 104001      1A        LDB B,I
171  66000    175R        JMP .LDS1
172   2000      1X  .LDSP LDA AR2D
173  71602                CLR 3
174  42000      4R        JSM .FRPB
175 100001      1A  .LDS1 LDA B,I
176  30023     23A  .LDS2 STA AR2+3
177 170201                RET 1
200  42000      4R  .STAP JSM .FRPB
201 130001      1A        STA B,I
202 170201                RET 1
202                       END
203      4
204 177775
205 177774
206      3

.ADDR   0R      .ARGA   112R    .ARGL   106R    .ARGS   113R
.CLAI   141R    .CLAP   145R    .CLBI   125R    .CLBP   131R
.CLBV   132R    .CLNP   147R    .CSH    153R    .CSHV   151R
.DSGN   103R    .FRPB   4R      .LDAP   156R    .LDB    22R
.LDBA   21R     .LDBI   14R     .LDBP   20R     .LDS1   175R
.LDS2   176R    .LDSA   161R    .LDSI   164R    .LDSP   172R
.MVE4   25R     .RAR2   76R     .RTNA   61R     .RTNB   53R
.RTNI   55R     .RTNL   71R     .SAR2   44R     .STAP   200R
.STBC   34R     .STBP   36R     .STRB   50R     .STRD   40R
.UPC4   121R    177774  205R    177775  204R    3       206R
4       203R    A       0A      AR2     20A     AR2D    1X
B       1A      C       16A     D       17A     E       77763A
R       3A      TMP     77777A

KSPMAX=2 MSPMAX=39 NSPMAX=6 SSPMAX=285 DSPMAX=158
```

APPENDIX B-4

```
ASMB,R,L
                                  HED ARRAY ADDRESS COMPUTE - CHIP VERSION \
                                  NAM ARRYC,7  ET10585-1033A \
 *
 *     A-ET10585-1032A-2
 *        ET10585-1032A   (S)
 *        ET10585-1033A   (R)
 *     2 MAR 1978
 *     LYNN WHEELWRIGHT
 *
      0                           ENT .ARRY,.ARRP
      0                           EXT .FRPB
      0                     A     EQU 0
      1                     B     EQU 1
      3                     R     EQU 3
     16                     C     EQU 16B
     17                     D     EQU 17B
  77763                     E     EQU 77763B
  77777                     TMP   EQU 77777B
  77776                     CNTR  EQU 77776B
  77775                     TPTR  EQU 77775B
      0  42000      1X  .ARRP JSM .FRPB        GET ADDRESS OF ARRAY VECTOR
      1  66000      5R        JMP ARRAY
      2 144003      3A  .ARRY ISZ R,I
      3 104003      3A        LDB R,I
      4 104001      1A        LDB B,I
      5  35775  77775A  ARRAY STB TPTR
      6  76501                SIB *+1
```

```
 7  34017        17A          STB D
10  70571                     WWD B,1        GET # OF DIMS
11  35776     77776A          STB CNTR       D POINTS TO DIMENSION LIST
12 174517                     CLB
13  35777     77777A          STB TMP
14  66000        21R          JMP LSTRT
15 104017        17A  LOOP    LDB D,1
16  75617                     MPY            Dmax*(Cmax*(Bmax*A+B)+C)+D
17  31777     77777A          STA TMP
20  70760                     WWC A
21  22000        36R  LSTRT   ADA =D-1       STARTS WITH ELEMENT 1
22  70571                     WWD B,1        GET NEXT DIMENSION LIMIT
23 174040                     TCB
24  24000                     ADB A          CHECK FOR OUT OF RANGE
25 176402                     SBM *+2
26 170517                     CLA            OUT OF RANGE
27  21777     77777A          ADA TMP
30  45776     77776A          ISZ CNTR
31  66000        15R          JMP LOOP
32 105775     77775A          LDB IPTR,I
33  24000                     ADB A
34 100001         1A          LDA B,I
35 170201                     RET 1
35                            END
36 177777
```

```
.ARRP   0R       .ARRY   2R       .FRPB  1X        177777  36R
A       0A       ARRAY   5R       B      1A        C       16A
CNTR    77776A   D       17A      E      77763A    LOOP    15R
LSTRT   21R      R       3A       TMP    77777A    IPTR    77775A
```

KSPMAX=2 MSPMAX=39 NSPMAX=6 SSPMAX=90 DSPMAX=158

APPENDIX B-5

```
ASMB,R,L                              HED ARRAY ADDRESS COMPUTE - ONE DIMENSION
                                      NAM ARRYS,7  ET10585-1059A \
 *
 *    A-ET10585-1058A-2
 *      ET10585-1058A  (S)
 *      ET10585-1059A  (R)
 *    2 MAR 1978
 *    LYNN WHEELWRIGHT
 *
       0                              ENT .ARAY,.ARAP,.LRAY,.LRAP
       0                              EXT .FRPB
       0                      A       EQU 0
       1                      B       EQU 1
       3                      R       EQU 3
      16                      C       EQU 16B
      17                      D       EQU 17B
   77763                      E       EQU 77763B
   77777                      TMP     EQU 77777B
   77776                      CNTR    EQU 77776B
   77775                      IPTR    EQU 77775B
       0 170601               .LRAP   SAL 2
       1  22000        25R            ADA =D-3
       2  42000         1X    .ARAP   JSM .FRPB     GET ADDRESS OF ARRAY VECTOR
       3  66000        11R            JMP ARRAY
       4 170601               .LRAY   SAL 2
       5  22000        25R            ADA =D-3
       6 144003         3A    .ARAY   ISZ R,I
       7 104003         3A            LDB R,I
      10 104001         1A            LDB B,I
      11  35775     77775A    ARRAY   STB IPTR
      12  22000        26R            ADA =D-1      STARTS WITH ELEMENT 1
      13  26000        27R            ADB =D2
      14 104001         1A            LDB B,I
      15 174040                       TCB
      16  24000                       ADB A         CHECK FOR OUT OF RANGE
      17 176402                       SBM *+2
      20 170517                       CLA           OUT OF RANGE
      21 105775     77775A            LDB IPTR,I    FETCH BEGIN OF ARRAY
      22  24000                       ADB A         ADD OFFSET
      23 100001         1A            LDA B,I       FETCH ITEM
      24 170201                       RET 1
      24                              END
      25 177775
      26 177777
      27      2
```

```
.ARAP   2R       .ARAY   6R       .FRPB   1X       .LRAP   0R
.LRAY   4R       177775  25R      177777  26R      2       27R
A       0A       ARRAY   11R      B       1A       C       16A
CNTR    77776A   D       17A      E       77763A   R       3A
TMP     77777A   IPTR    77775A
```

KSPMAX=2 MSPMAX=39 NSPMAX=6 SSPMAX=105 DSPMAX=158

APPENDIX B-6

```
ASMB,R,L                              HED TYPE CONVERSION ROUTINES - CHIP VERSION
                                      NAM TYPEC,7  ET10585-1013A \
 *
 *    A-ET10585-1012A-2
 *      ET10585-1012A  (S)
 *      ET10585-1013A  (R)
 *    20 MAR 78
```

```
*    LYNN WHEELWRIGHT
*
      0                          ENI CNV12,CNV13,CNV14,CNV21,CNV23,CNV24
      0                          ENT CNV31,CNV34,CNV41,CNV42,CNV43
      0                          ENT CDB
      0                          EXT AR2D
      0                   A      EQU 0
      1                   B      EQU 1
      3                   R      EQU 3
     16                   C      EQU 16B
     17                   D      EQU 17B
  77763                   E      EQU 77763B
     20                   AR2    EQU 20B
  77776                   CNTR   EQU 77776B
  77777                   TMP    EQU 77777B
      0   6000     174R   CNV43  LDB =D0          CONVERT BINARY TO BCD
      1 172003                   SAP *+3
      2 170040                   TCA
      3  76501                   SIB *+1
      4  34020      20A          STB AR2
      5 174500                   SBR 1
      6  34021      21A          STB AR2+1
      7  34022      22A          STB AR2+2
     10  30023      23A          SIA AR2+3
     11  22000     175R          ADA =D-16
     12 172005                   SAP BCD10        A>=16
     13  22000     176R          ADA =D6
     14 172424                   SAM BCD30        A<10
     15  62000     177R          IOR =B20
     16  66000      37R          JMP BCD20        THAT'S ALL
     17   2000     200R   BCD10  LDA =D-10000
     20  20023      23A          ADA AR2+3
     21 172406                   SAM BCD15
     22  44022      22A          ISZ AR2+2
     23  22000     200R          ADA =D-10000
     24 172076                   SAP *-2
     25  22000     201R          ADA =D10000
     26  30023      23A          SIA AR2+3
     27 170603            BCD15  SAL 4
     30   6000     202R          LDB =D-1000
     31  42000      42R          JSM BCD50
     32   6000     203R          LDB =D-100
     33  42000      42R          JSM BCD50
     34   6000     204R          LDB =D-10
     35  42000      42R          JSM BCD50
     36  60023      23A          IOR AR2+3
     37  30023      23A   BCD20  SIA AR2+3
     40 173201            BCD30  SOC *+1,C
     41 170201                   RET 1
     42  35777   77777A   BCD50  STB TMP
     43  24023      23A          ADB AR2+3
     44 176410                   SBM BCD60
     45  72501                   SIA *+1
     46  25777   77777A          ADB TMP
     47 176076                   SBP *-2
     50 174040                   TCB
     51  25777   77777A          ADB TMP
     52 174040                   TCB
     53  34023      23A          SIB AR2+3
     54 170603            BCD60  SAL 4
     55 170201                   RET 1
     56  42000      67R   CNV13  JSM CNV12
     57     21      21A   CNV23  LDA AR2+1
     60  60020      20A          IOR AR2
     61  60022      22A          IOR AR2+2
     62  72456                   SZA BCD30
     63 173701                   SOS *+1,S
     64   2000       1X          LDA AR2D
     65  71602                   CLR 3
     66 170201                   RET 1
      0                   CNV42  EQU CNV43
     67   4020      20A   CNV12  LDB AR2
     70 176004                   SBP *+4
     71   2000       1X          LDA AR2D
     72  71603                   CLR 4
     73 170201                   RET 1
     74 174405                   ABR 6
     75 174040                   TCB
     76  26000     205R          ADB =D12
     77  76410                   SZB BCLY
    100 176413                   SBM BCLX
    101   2000     174R          LDA =D0
    102  75500                   MRY
    103  22000     206R          ADA =D-5
    104 172403                   SAM BCLY
    105   6000     207R          LDB =D1
    106  71000                   MWA
    107   2000     207R   BCLY   LDA =D1
    110  50020      20A          AND AR2
    111  30020      20A          STA AR2
    112 170201                   RET 1
    113 173774            BCLX   SOS BCLY,S
    114  66000     107R          JMP BCLY
    115  42000            CNV41  JSM CNV43
    116  71500            CNV31  NRM
    117  72704                   SDC *+4
    120   2000     210R          LDA =B100100
    121  30020      20A          STA AR2
    122 170201                   RET 1
    123      1       1A          LDA B
```

```
124 170040                  TCA
125  22000   205R           ADA  =D12
126 170605                  SAL  6
127  60020    20A           IOR  AR2
130  30020    20A           STA  AR2
131 170201                  RET  1
116                  CNV21  EQU  CNV31
132  42000    67R    CNV14  JSM  CNV12
133     22    22A    CNV24  LDA  AR2+2
134  52000   211R           AND  =B177774
135  60021    21A           IOR  AR2+1
136  72015                  RZA  OVFL
137     23    23A    CNV34  LDA  AR2+3
140  42000   156R           JSM  CDB
141   4022    22A           LDB  AR2+2
142  77002                  SLB  *+2
143  22000   201R           ADA  =D10000
144 174500                  SBR  1
145  77002                  SLB  *+2
146  22000   212R           ADA  =D20000
147   4020    20A    CNVXT  LDB  AR2
150  77002                  SLB  *+2
151 170040                  TCA
152 170201                  RET  1
153   2000   213R    OVFL   LDA  =D32767
154 173773                  SOS  CNVXT,S
155  66000   147R           JMP  CNVXT
156   6000   174R    CDB    LDB  =D0
157  42000   167R           JSM  CDB20
160  42000   162R           JSM  CDB10
161  42000   162R           JSM  CDB10
162   4000           CDB10  LDB  A              MPY BY 10
163 174601                  SBL  2
164  24000                  ADB  A
165 174600                  SBL  1
166   1777 77777A           LDA  TMP
167 170713           CDB20  RAR  12
170  31777 77777A           STA  TMP
171  52000   214R           AND  =B17
172  20001     1A           ADA  B
173 170201                  RET  1
173                         END
174      0
175 177760
176      6
177     20
200 154360
201  23420
202 176030
203 177634
204 177766
205     14
206 177773
207      1
210 100100
211 177774
212  47040
213  77777
214     17
```

| | | | | | | | |
|---|---|---|---|---|---|---|---|
| 0 | 174R | 1 | 207R | 100100 | 210R | 14 | 205R |
| 154360 | 200R | 17 | 214R | 176030 | 202R | 177634 | 203R |
| 177760 | 175R | 177766 | 204R | 177773 | 206R | 177774 | 211R |
| 20 | 177R | 23420 | 201R | 47040 | 212R | 6 | 176R |
| 77777 | 213R | A | 0A | AR2 | 20A | AR2D | 1X |
| B | 1A | BCD10 | 17R | BCD15 | 27R | BCD20 | 37R |
| BCD30 | 40R | BCD50 | 42R | BCD60 | 54R | BCLX | 113R |
| BCLY | 107R | C | 16A | CDB | 156R | CDB10 | 162R |
| CDB20 | 167R | CNTR | 77776A | CNV12 | 67R | CNV13 | 56R |
| CNV14 | 132R | CNV21 | 116R | CNV23 | 57R | CNV24 | 133R |
| CNV31 | 116R | CNV34 | 137R | CNV41 | 115R | CNV42 | 0R |
| CNV43 | 0R | CNVXT | 147R | D | 17A | E | 77763A |
| OVFL | 153R | R | 3A | TMP | 77777A | | |

KSPMAX=2 MSPMAX=39 NSPMAX=6 SSPMAX=324 DSPMAX=158

APPENDIX B-7

```
ASMB,L,R
                                HED ROUND BCDL NUMBER TO GIVEN DIGIT \
                                NAM ROUND,7   ET10585-1067A
      0                         ENT ROUND
      0                         EXT .DLFT
  *
  *   A-ET10585-1066A-2
  *     ET10585-1066A  (S)
  *     ET10585-1067A  (R)
  *   29 MAR 1978
  *   LYNN WHEELWRIGHT
  *
  *     BCDL PROCEDURE ROUND(L,I); VALUE L,I; BCDL L; INTEGER I;
  *       L=QUANTITY TO BE ROUNDED
  *        I=DIGIT TO BE ROUNDED TO
  *     DIGITS NUMBERED 0 - 11  0=MOST SIGNIFICANT
  *
      0                  A      EQU 0
      1                  B      EQU 1
     16                  C      EQU 16B
      0 104016     16A   ROUND  LDB C,I
      1 174040                  TCB
```

```
      2  26000     17R          ADB =D11
      3 176003                  SBP *+3
      4  54016     16A          DSZ C
      5 170201                  RET 1
      6 134016     16A          STB C,I        SAVE SHIFT COUNT ON CSTAK
      7 170517                  CLA
     10  75500                  MRY
     11  22000     20R          ADA =D-5
     12 172403                  SAM *+3
     13   6000     21R          LDB =D1
     14  71000                  M*A            ADD 1 TO AR2
     15  70761                  WWC B          RETRIEVE SHIFT COUNT
     16  66000      1X          JMP .DLFT
     16             1X          END
     17     13
     20 177773
     21      1

.DLFT   1X      1     21R     13     17R     177773 20R
A       0A      B     1A      C      16A     ROUND  0R

KSPMAX=2 MSPMAX=39 NSPMAX=6 SSPMAX=46 DSPMAX=158
```

APPENDIX B-8

```
ASMB,R,L
                                  HED DECIMAL SHIFT FUNCTIONS - FDIGIT \
                                  NAM DSHFT,7  ET10585-1015A \
  *
  *      A-ET10585-1014A-2
  *        ET10585-1014A   (S)
  *        ET10585-1015A   (R)
  *      15 JULY 1977
  *      LYNN WHEELWRIGHT
  *
          0                       ENT .FDIG,.DLFT,.DRGT,.DSFT
  *
  *        DECIMAL SHIFT
  *        +=LEFT, -=RIGHT (BREG)
  *        AR2=DECIMAL NUMBER
  *        JSM .DSFT
  *
         0  76501          .FDIG SIB *+1
         1 176411          .DSFT SBM .DRGT
         2                 .DLFT EQU *         AR2=DEC. NUM
         2  76407                SZB DL20      BREG=# OF SHIFTS
         3 176402                SBM *+2       JSM .DLFT     LEFT SHIFT AR2
         4 174040                TCB
         5  76501                SIB *+1
         6   2000    20R         LDA =D0
         7  75541                MLY
        10  76176                RIB *-2
        11 170201          DL20  RET 1
  *
        12                 .DRGT EQU *         AR2=DEC. NUM
        12 176002                SBP *+2       BREG=# OF SHIFTS (RIGHT)
        13 174040                TCB           JSM .DRGT .
        14   2000    20R         LDA =D0
        15  76402                SZB *+2
        16  75500                MRY
        17 170201                RET 1
        17                       END
        20      0

.DLFT   2R      .DRGT   12R      .DSFT   1R      .FDIG   0R
0       20R     DL20    11R

KSPMAX=2 MSPMAX=39 NSPMAX=6 SSPMAX=39 DSPMAX=158
```

A. ENDIX B-9

```
ASMB,R,L
                                  HED SHIFT ROTATE FUNCTIONS \
                                  NAM SHIFT,7  ET10585-1017A \
  *
  *      A-ET10585-1016A-2
  *        ET10585-1016A   (S)
  *        ET10585-1017A   (R)
  *      25 JULY 1977
  *      LYNN WHEELWRIGHT
  *
          0                       ENT .SRGT,.SLFT,.ARGT,.RLFT,.RRGT
          0                 A     EQU 0
          1                 B     EQU 1
          3                 R     EQU 3
         16                 C     EQU 16B
         17                 D     EQU 17B
  77777                     TMP   EQU 77777B
  *
         0  42000   12R     .SRGT JSM ZCHK      LDA WORD
         1  42000   12R     .SLFT JSM ZCHK      LDB SHIFT COUNT
         2  42000   12R     .ARGT JSM ZCHK      JSM .(SHIFT)
         3  42000   12R     .RRGT JSM ZCHK        AREG=RESULT
         4                  SDEF  DEF .SRGT
         5           6R     STAB  DEF *+1       *
         6 170500                 SAR 1         **
         7 170600                 SAL 1         * *
        10 170400                 AAR 1         *  *
        11 170700                 RAR 1         *****
```

```
12  76414            ZCHK  SZB ZRIN
13  26000      33R         ADB =D-1
14 174703                  RBR 4
15 174513                  SBR 12
16  35777  77777A          STB TMP
17   6000      4R          LDB SDEF
20 174040                  TCB
21 124003      3A          ADB R,I
22  26000      5R          ADB STAB
23 104001      1A          LDB B,I
24  25777  77777A          ADB TMP
25  70001                  EXE B
26  54003      3A    ZRTN  DSZ R
27 170201                  RET 1
30 174040            .RLFT TCB
31  26000     34R          ADB =D16
32  66000      3R          JMP .RRGT
32                         END
33 177777
34     20
```

```
.ARGT   2R        .RLFT   30R       .RRGT   3R        .SLFT   1R
.SRGT   0R        177777  33R       20      34R       A       0A
B       1A        C       16A       D       17A       R       3A
SDEF    4R        STAB    5R        TMP     77777A    ZCHK    12R
ZRTN    26R
```

KSPMAX=2 MSPMAX=39 NSPMAX=6 SSPMAX=99 DSPMAX=158

APPENDIX B-10

```
ASMB,R,L
                                        HED TEST SET AND RESET BIT \
                                        NAM TSRBT,7  ET10585-1019A \
*
*     A-ET10585-1018A-2
*        ET10585-1018A   (S)
*        ET10585-1019A   (R)
*     1 AUG 1977
*     LYNN WHEELWRIGHT
*
        0                               ENT .SBIT,.RBIT,.TBIT
        0                         A     EQU 0
        1                         B     EQU 1
        3                         R     EQU 3
       16                         C     EQU 16B
       17                         D     EQU 17B
    77777                         TMP   EQU 77777B
* BIT TEST AND SET FUNCTIONS
        0                         .TBIT EQU *          TEST BIT AND SET SIGN
        0   42000      14R              JSM BIT        LDA WORD
        1   50001       1A              AND B          LDB BIT# (0-15)
        2   72402                       SZA *+2        JSM .TBIT
        3    2000      27R              LDA =D-1           AREG = RESULT
        4  170201                       RET 1
        5                         .SBIT EQU *
        5   42000      14R              JSM BIT
        6   60001       1A              IOR B
        7  170201                       RET 1
       10   42000      14R        .RBIT JSM BIT
       11  174140                       CMB
       12   50001       1A              AND B
       13  170201                       RET 1
       14   31777   77777A        BIT   STA TMP
       15    2000      30R              LDA =D15
       16   50001       1A              AND B
       17    6000      31R              LDB =D1
       20   72404                       SZA RTN
       21   22000      27R              ADA =D-1
       22   62000      26R              IOR SLFT
       23   70000                       EXE A
       24    1777   77777A        RTN   LDA TMP
       25  170201                       RET 1
       26  174600                 SLFT  SBL 1
       26                               END
       27  177777
       30      17
       31       1
```

```
.RBIT   10R       .SBIT   5R        .TBIT   0R        1       31R
17      30R       177777  27R       A       0A        B       1A
BIT     14R       C       16A       D       17A       R       3A
RTN     24R       SLFT    26R       TMP     77777A
```

KSPMAX=2 MSPMAX=39 NSPMAX=6 SSPMAX=82 DSPMAX=158

APPENDIX B-11

```
ASMB,R,L
                                        HED TEST AND TURN FUNCTIONS
                                        NAM TEST,7  ET10585-1021A
*
*     A-ET10585-1020A-2
*        ET10585-1020A   (S)
*        ET10585-1021A   (R)
*     25 JULY 1977
*     LYNN WHEELWRIGHT
*
        0                               ENT .TEST,.TURN
```

```
      0                        A      EQU 0
      1                        B      EQU 1
      3                        R      EQU 3
     16                        C      EQU 16B
     17                        D      EQU 17B
  77777                        TMP    EQU 77777B
      0  42000       15R .TEST JSM KMGET
      1  50001        1A       AND B
      2  11777    77777A       CPA TMP
      3  66000        6R       JMP *+3          AREG_(ITEM AND MASK)=
      4   2000       40R       LDA =D0              (KEY AND MASK)
      5 170201                 RET 1
      6   2000       41R       LDA =D-1
      7 170201                 RET 1
     10  42000       15R .TURN JSM KMGET
     11 174140                 CMB
     12  50001        1A       AND B
     13  61777    77777A       IOR TMP          AREG_ITEM AND NOT MASK OR
     14 170201                 RET 1                 KEY AND MASK
     15  54003        3A KMGET DSZ R            AREG = KEY
     16 144003        3A       ISZ R,I          GET MASK .
     17 104003        3A       LDB R,I
     20 104001        1A       LDB B,I
     21  76403                 SZB *+3
     22 104001        1A       LDB B,I
     23  66000       25R       JMP *+2
     24  70761                 **C B
     25  50001        1A       AND B
     26  31777    77777A       STA TMP          TMP = KEY AND MASK
     27 144003        3A       ISZ R,I
     30 100003        3A       LDA R,I
     31 100000                 LDA A,I
     32  72403                 SZA *+3
     33 100000                 LDA A,I
     34  66000       36R       JMP *+2
     35  70760                 **C A
     36  44003        3A       ISZ R            AREG=ITEM
     37 170201                 RET 1            BREG=MASK
     37                        END
     40      0
     41 177777

.TEST   0R      .TURN  10R     0      40R     177777 41R
A       0A      B      1A      C      16A     D      17A
KMGET  15R      R      3A      TMP    77777A

KSPMAX=2 MSPMAX=39 NSPMAX=6 SSPMAX=62 DSPMAX=158
```

APPENDIX B-12

```
ASMB,R,L
                                       HED EQUAL CHECK
                                       NAM DEQL,7  ET10585-1023A
     *
     *   A-ET10585-1022A-2
     *     ET10585-1022A  (S)
     *     ET10585-1023A  (R)
     *   15 JULY 1977
     *   LYNN WHEELWRIGHT
     *
          0                            ENT .EQL,.DEQL,.NEQL
         20                     AR2    EQU 20B
     *
          0     21      21A  .DEQL LDA AR2+1
          1  60022      22A        IOR AR2+2
          2  60023      23A        IOR AR2+3
          3  72403           .EQL  SZA TRUE
          4   2000      12R  FALSE LDA =D0
          5 170201                 RET 1
          6   2000      13R  TRUE  LDA =D-1
          7 170201                 RET 1
         10  72076           .NEQL RZA TRUE
         11 170201                 RET 1
         11                        END
         12      0
         13 177777

.DEQL   0R       .EQL    3R       .NEQL  10R       0      12R
177777 13R       AR2    20A       FALSE   4R       TRUE    6R

KSPMAX=2 MSPMAX=39 NSPMAX=6 SSPMAX=52 DSPMAX=158
```

APPENDIX B-13

```
ASMB,R,L
                                       HED EXECUTE CASE STATEMENT \
                                       NAM CASE,7  ET10585-1025A
     *
     *   A-ET10585-1024A-2
     *     ET10585-1024A  (S)
     *     ET10585-1025A  (R)
     *   25 JULY 1977
     *   LYNN WHEELWRIGHT
     *
          0                            ENT .CASE
          0                     A      EQU 0
          1                     B      EQU 1
          3                     R      EQU 3
```

```
        16                  C        EQU 16B
        17                  D        EQU 17B
  *
         0  72402              .CASE  SZA *+2        DEF CN
         1 172002                     SAP *+2        DEF CN-1
         2 170201                     RET 1          .
         3 104003      3A             LDB R,1        .
         4  54001      1A             DSZ B          DEF C1
         5 104001      1A             LDB B,1        DEC -N
         6  24000                     ADB A          JSM .CASE   AREG=CASE TO SELECT
         7 176402                     SBM *+2
        10 170201                     RET 1
        11 170140                     CMA
        12 120003      3A             ADA R,I
        13  54003      3A             DSZ R
        14 100000                     LDA A,I
        15 164000                     JMP A,I
        15                            END

.CASE   0R        A       0A       B       1A       C       16A
D       17A       R       3A

KSPMAX=2 MSPMAX=39 NSPMAX=6 SSPMAX=31 DSPMAX=158
```

APPENDIX B-14

```
ASMB,R,L
                                     HED PROCEDURE EXIT THROUGH FORMAL GOTO \
                                     NAM FGTO,7  ET10585-1027A
  *
  *     A-ET10585-1026A-2
  *        ET10585-1026A   (S)
  *        ET10585-1027A   (R)
  *     15 JULY 1977
  *     LYNN WHEELWRIGHT
  *
         0                           ENT .FGTO
         0                           EXT .CLV
         0                  A        EQU 0
         1                  B        EQU 1
         3                  R        EQU 3
        16                  C        EQU 16B
        17                  D        EQU 17B
  *
         0  42000      1X      .FGTO JSM .CLV
         1 100001      1A            LDA B,I
         2  22000     11R            ADA =D-1
         3 104003      3A            LDB R,I
         4  54003      3A            DSZ R
         5 130003      3A            STA R,I
         6  26000     12R            ADB =D2
         7 104001      1A            LDB B,I
        10 164001      1A            JMP B,I        GO EXIT PROCEDURE
        10                           END
        11 177777
        12      2

.CLV    1A       .FGTO   0R       177777  11R      2      12R
A       0A       B       1A       C       16A      D      17A
R       3A

KSPMAX=2 MSPMAX=39 NSPMAX=6 SSPMAX=50 DSPMAX=158
```

APPENDIX B-15

```
ASMB,R,L
                                     HED READ AND WRITE ROUTINES - CHIP VERSION \
                                     NAM RDWRT,7  ET10585-1029A \
  *
  *     A-ET10585-1028A-2
  *        ET10585-1028A   (S)
  *        ET10585-1029A   (R)
  *     1 MAR 77
  *     LYNN WHEELWRIGHT
  *
         0                           ENT .WSTR,.R4,.R5,.R6,.R7
         0                           ENT .W4,.W5,.W6,.W7
         0                           ENT .WSTP
         0                           ENT .RS4,.RS5,.RS6,.RS7,.WS4,.WS5,.WS6,.WS7
         0                           ENT .WSPS,.WSTS
         0                  A        EQU 0
         1                  B        EQU 1
         3                  R        EQU 3
        16                  C        EQU 16B
        17                  D        EQU 17B
     77763                  E        EQU 77763B
         4                  R4       EQU 4
         5                  R5       EQU 5
         6                  R6       EQU 6
         7                  R7       EQU 7
        20                  AR2      EQU 20B
        11                  PA       EQU 11B
     77777                  CNTR     EQU 77777B     AR1
  *
         0  34011     11A   .RS7     STB PA
         1      7      7A   .R7      LDA R7
         2  66000     27R            JMP RWEXT
```

```
 3  34011    11A  .RS6   STB PA
 4      6     6A  .R6    LDA R6
 5  66000    27R         JMP RWEXT
 6  34011    11A  .RS5   STB PA
 7      5     5A  .R5    LDA R5
10  66000    27R         JMP RWEXT
11  34011    11A  .RS4   STB PA
12      4     4A  .R4    LDA R4
13  66000    27R         JMP RWEXT
14  34011    11A  .WS4   STB PA
15 170140         .W4    CMA
16  30004     4A         STA R4
17  66000    27R         JMP RWEXT
20  34011    11A  .WS5   STB PA
21 170140         .W5    CMA
22  30005     5A         STA R5
23  66000    27R         JMP RWEXT
24  34011    11A  .WS6   STB PA
25 170140         .W6    CMA
26  30006     6A         STA R6
27 170140         RWEXT  CMA
30  70430                DIR
31 170201                RET 1
32  34011    11A  .WS7   STB PA
33 170140         .W7    CMA
34  30007     7A         STA R7
35  66000    27R         JMP RWEXT        LDB SUBCHANNEL (4-7)
*                  LDA STRING ADDRESS
                                          JSM .WSPS
36  30017    17A  .WSPS  STA D            DEC OUTPUT CHANNEL
37 144003     3A         ISZ R,I
40 100003     3A         LDA R,I
41 100000                LDA A,I
42  30011    11A         STA PA
43  66000    54R         JMP .WSTS+1      LDB SUBCHANNEL (4-7)
44 144003     3A  .WSTP  ISZ R,I          JSM .WSTP
45 100003     3A         LDA R,I          DEC OUTPUT CHANNEL
46 100000                LDA A,I          DEF STRING
47  30011    11A         STA PA
*                  LDB SUBCHANNEL (4-7)
                                          JSM .WSTR
50 144003     3A  .WSTR  ISZ R,I          DEF STRING
51 100003     3A         LDA R,I
52 100000                LDA A,I
53  30017    17A  .WSTS  STA D            SET UP STACK POINTER
54  74570                WBD A,I          GET CHARACTER COUNT
55  31777 77777A         STA CNTR
56  72407                SZA WS020
57  74570         WS010  WBD A,I          GET CHAR
60 170140                CMA
61 130001     1A         STA B,I
62  70430                DIR
63  55777 77777A         DSZ CNTR
64  66000    57R         JMP WS010
65 170201         WS020  RET 1
65                       END

.R4     12R      .R5     7R       .R6     4R       .R7     1R
.RS4    11R      .RS5    6R       .RS6    3R       .RS7    0R
.W4     15R      .W5     21R      .W6     25R      .W7     33R
.WS4    14R      .WS5    20R      .WS6    24R      .WS7    32R
.WSPS   36R      .WSTP   44R      .WSTR   50R      .WSTS   53R
A       0A       AR2     20A      B       1A       C       16A
CNTR    77777A   D       17A      E       77763A   PA      11A
R       3A       R4      4A       R5      5A       R6      6A
R7      7A       RWEXT   27R      WS010   57R      WS020   65R

KSPMAX=2 MSPMAX=39 NSPMAX=6 SSPMAX=182 DSPMAX=158
```

APPENDIX B-16

```
ASMB,R,L
                                 HED STORE A IN ADDRESS ON CSTAK
                                 NAM STAC,7  ET10585-1035A
*
*     A-ET10585-1034A-2
*       ET10585-1034A  (S)
*       ET10585-1035A  (R)
*     15 JULY 1977
*     LYNN WHEELWRIGHT
*
   0                             ENT .STAC
   0                      A      EQU 0
   1                      B      EQU 1
   3                      R      EQU 3
  16                      C      EQU 16B
  17                      D      EQU 17B
*
   0  70761              .STAC   WWC B
   1 130001      1A              STA B,I
   2 170201                      RET 1
   2                             END

.STAC   0R      A     0A      B     1A      C     16A
D       17A     R     3A

KSPMAX=2 MSPMAX=39 NSPMAX=6 SSPMAX=31 DSPMAX=158
```

APPENDIX B-17

```
ASMB,R,L
                                           HED AND FROM  ADDRESS ON CSTAK \
                                           NAM ANDB,7  ET10585-1037A
     *
     *    A-ET10585-1036A-2
     *      ET10585-1036A   (S)
     *      ET10585-1037A   (R)
     *    15 JULY 1977
     *    LYNN WHEELWRIGHT
     *
          0                                ENT .ANDB
          0                         A      EQU 0
          1                         B      EQU 1
          3                         R      EQU 3
          16                        C      EQU 16B
          17                        D      EQU 17B
     *
          0  70761              .ANDB      WWC B
          1 150001       1A                AND B,1
          2 170201                         RET 1
          2                                END

.ANDB   0R        A       0A       B        1A       C       16A
D       17A       R       3A

KSPMAX=2 MSPMAX=39 NSPMAX=6 SSPMAX=31 DSPMAX=158
```

APPENDIX B-18

```
ASMB,R,L
                                           HED IOR FROM  ADDRESS ON CSTAK \
                                           NAM ORB,7  ET10585-1039A \
     *
     *    A-ET10585-1038A-2
     *      ET10585-1038A   (S)
     *      ET10585-1039A   (R)
     *    15 JULY 1977
     *    LYNN WHEELWRIGHT
     *
          0                                ENT .ORB
          0                         A      EQU 0
          1                         B      EQU 1
          3                         R      EQU 3
          16                        C      EQU 16B
          17                        D      EQU 17B
     *
          0  70761              .ORB       WWC B
          1 160001       1A                IOR B,1
          2 170201                         RET 1
          2                                END

.ORB    0R        A       0A       B        1A       C       16A
D       17A       R       3A

KSPMAX=2 MSPMAX=39 NSPMAX=6 SSPMAX=30 DSPMAX=158
```

APPENDIX B-19

```
ASMB,R,L
                                           HED AND FROM CSTAK \
                                           NAM ANDI,7  ET10585-1041A
     *
     *    A-ET10585-1040A-2
     *      ET10585-1040A   (S)
     *      ET10585-1041A   (R)
     *    15 JULY 1977
     *    LYNN WHEELWRIGHT
     *
          0                                ENT .ANDI
          0                         A      EQU 0
          1                         B      EQU 1
          3                         R      EQU 3
          16                        C      EQU 16B
          17                        D      EQU 17B
     *
          0  70761              .ANDI      WWC B
          1  50001       1A                AND B
          2 170201                         RET 1
          2                                END

.ANDI   0R        A       0A       B        1A       C       16A
D       17A       R       3A

KSPMAX=2 MSPMAX=39 NSPMAX=6 SSPMAX=31 DSPMAX=158
```

APPENDIX B-20

```
ASMB,R,L
                                           HED IOR FROM CSTAK
                                           NAM ORI,7  ET10585-1043A
     *
     *
     *
     *
```

```
*
*
*
      0                             ENT .ORT
      0                      A      EQU 0
      1                      B      EQU 1
      3                      R      EQU 3
     16                      C      EQU 16B
     17                      D      EQU 17B
*
      0  70761           .ORT       WMC B
      1  60001       1A             IOR B
      2 170201                      RET 1
      2                             END

.ORT    0R      A      0A      B      1A      C      16A
D       17A     R      3A

KSPMAX=2 MSPMAX=39 NSPMAX=6 SSPMAX=30 DSPMAX=158
0001 ATNER
```

APPENDIX B-21

```
ASMB,L
                                    HED ATTEN ERROR READ ROUTINE \
                                    NAM ATNER,7   85680-90012A \
      0                             ENT ATNER
*
*     A-85680-90011A-2
*       85680-90011A  (S)
*       85680-90012A  (R)
*     13 SEP 1977
*     LYNN WHEELWRIGHT
*
*       INTEGER PROCEDURE ATNER(RFAT); VALUE RFAT;
*          INTEGER RFAT;
*          EXTERNAL;
*
*       THIS PROCEDURE READS RF ATTEN ERROR COEFFICIENTS
*       FROM PROM ON RF INTERFACE BD. ERROR IS STORED IN UNITS
*       OF .2 DB.
*
      0                      A      EQU 0
     11                      PA     EQU 11B
*
      0  52000      20R      ATNER  AND =D7        ATNER(RFAT)
      1  22000      21R             ADA =D-2
      2 172003                      SAP *+3
      3 170517                      CLA
      4 170201                      RET 1
      5   4000                      LDB A
      6 174501                      SBR 2
      7  26000      22R             ADB =D6
     10  34011      11A             STB PA
     11  62000      23R             IOR =D4
     12 100000                      LDA A,I
     13 170140                      CMA
     14  70430                      DIR
     15 170607                      SAL 8
     16 170406                      AAR 7
     17 170201                      RET 1
     17                             END
     20      7
     21 177776
     22      6
     23      4

177776 21R      4       23R     6      22R      7      20R
A      0A       ATNER   0R      PA     11A

KSPMAX=2 MSPMAX=39 NSPMAX=6 SSPMAX=36 DSPMAX=158
```

'PENDIX B-22

```
ASMB,R,L
                                    HED CHARACTER ROUTINES FOR BPCL
                                    NAM AIPCR,7 ET10585-1053A
*
*     A-ET10585-1052A-2
*       ET10585-1052A  (S)
*       ET10585-1053A  (R)
*     7 MAR 1978
*     LYNN WHEELWRIGHT
*
      0                             ENT ACHAR,APCHR,ICHAR,PCHAR,IPCHR
      0                             EXT AR3D
*
*       PROCEDURE ACHAR(C,S); VALUE C,S;
*          INTEGER C; ALPHA S; EXTERNAL;
*       PROCEDURE PCHAR(P,C,S); VALUE P,C,S;
*          INTEGER P,C; ALPHA S; EXTERNAL;
*       PROCEDURE ICHAR(P,C,S); VALUE P,C,S;
*          INTEGER P,C; ALPHA S; EXTERNAL;
*
      0                      A      EQU 0
      1                      B      EQU 1
     16                      C      EQU 16B
     17                      D      EQU 17B
  77763                      E      EQU 77763B
```

```
77762                       APTR  EQU 77762B
77761                       CNTR  EQU 77761B
      *
       0   6000       1X    APCHR LDB AR3D        AREG=CHAR
       1  70541                   PWC B
      *
       2 104016      16A    ACHAR LDB C,I
       3  70540                   PWC A
       4 144001       1A          ISZ B,I         INCREMENT LENGTH
       5 100001       1A          LDA B,I         STRING LENGTH
      *
       6 170700             PCHAR RAR 1
       7  70761                   WWC B           GET CHARACTER
      10 120016      16A          ADA C,I         FORM STRING ADDRESS
      11 172212                   SAP EVEN,C      INDEX TO BYTE
      12  72101             ODD   RIA *+1
      13  31762   77762A          STA APTR
      14   2000     104R          LDA =B377       FETCH BYTE MASK
      15 174607                   SBL 8           POSITION BYTE TO BE MERGED
      16 151762   77762A    PXIT  AND APTR,I      MASK OFF UNWANTED BYTE
      17  60001       1A          IOR B           MERGE NEW BYTE
      20 131762   77762A          STA APTR,I      PUT IT BACK
      21  54016      16A          DSZ C           FIX UP STACK
      22 170201                   RET 1           RETURN TO CALLER
      23  31762   77762A    EVEN  STA APTR
      24   2000     105R          LDA =B177400    FETCH BYTE MASK
      25  66000      16R          JMP PXIT
      *
      26   2000     106R    XIT3  LDA =D-3
      27  20016      16A          ADA C
      30  30016      16A          STA C
      31 170201                   RET 1
      *
      32  70541             IPCHR PWC B           AREG=POSITION
      33  70541                   PWC B
      34   6000       1X          LDB AR3D        BREG=CHARACTER
      35  70741                   PWC B,D
      36  66000      40R          JMP *+2
      *
      37  54016      16A    ICHAR DSZ C           GET STRING ADDRESS
      40  70561                   WWC B,I
      41  70540                   PWC A           SAVE CHARACTER POSITION
      42 170040                   TCA
      43 172063                   SAP XIT3        ILLEGAL CHAR POSITION
      44 120001       1A          ADA B,I         GET LENGTH
      45 170140                   CMA
      46 172033                   SAP IAPND       OFF END OF STRING - APPEND IT
      47 170400                   AAR 1
      50  31761   77761A          STA CNTR        # OF WORDS TO JUGGLE
      51 100016      16A          LDA C,I         CHECK FOR EVEN LEN AND ODD INS
      52  73004                   SLA *+4
      53 100001       1A          LDA B,I
      54  73403                   RLA *+3         TEST FAILED - DON'T INCREASE C
      55  55761   77761A          DSZ CNTR
      56 100001       1A          LDA B,I
      57  72422                   SZA IAPND       NULL STRING
      60 170500                   SAR 1
      61  20001       1A          ADA B
      62  30017      17A          STA D
      63  72101                   RIA *+1
      64  31762   77762A          STA APTR
      65 144001       1A          ISZ B,I
      66 101762   77762A    ILOOP LDA APTR,I
      67 170507                   SAR 8
      70  70771                   WWD B
      71 174607                   SBL 8
      72  60001       1A          IOR B
      73 131762   77762A          STA APTR,I
      74  55762   77762A          DSZ APTR
      75  45761   77761A          ISZ CNTR
      76  66000      66R          JMP ILOOP
      77  70760                   WWC A
     100  66000       6R          JMP PCHAR
     101  54016      16A    IAPND DSZ C
     102  70760                   WWC A
     103  66000       2R          JMP ACHAR
     103                          END
     104    377
     105 177400
     106 177775

177400  105R      177775  106R     377    104R      A      0A
ACHAR   2R        APCHR   0R       APTR   77762A    AR3D   1X
B       1A        C       16A      CNTR   77761A    D      17A
E       77763A    EVEN    23R      IAPND  101R      ICHAR  37R
ILOOP   66R       IPCHR   32R      ODD    12R       PCHAR  6R
PXIT    16R       XIT3    26R

KSPMAX=2 MSPMAX=39 NSPMAX=6 SSPMAX=124 DSPMAX=158
```

APPENDIX B-23

```
ASMB,R,L
                          HED STRING CONVERSIONS FOR BPCL
                          NAM CNVST,7 ET10585-1055B
      *
      *    A-ET10585-1054B-2
      *      ET10585-1054B  (S)
      *      ET10585-1055B  (R)
      *    23 MAR 78
```

```
 *     LYNN WHEELWRIGHT
 *
   0                                  ENT CNV15,CNV25,CNV45,APN25
   0                                  EXT AR3D,CNV43,IPCHR
 *
 *       PROCEDURE CNV15(R); VALUE R;
 *          REAL R; EXTERNAL;
 *       PROCEDURE CNV25(D); VALUE D;
 *          BCDL D; EXTERNAL;
 *       PROCEDURE CNV45(I); VALUE I;
 *          INTEGER I; EXTERNAL;
 *       PROCEDURE APN25(D); VALUE D;
 *          BCDL D; EXTERNAL;
 *
     0                         A      EQU 0
     1                         B      EQU 1
    16                         C      EQU 16B
    17                         D      EQU 17B
    20                         AR2    EQU 20B
 77764                         AR3    EQU 77764B
 77777                         CNTR   EQU 77777B
     0  42000        77R       CNV15  JSM CNV25
     1  74770                  CN.10  WBD A          REMOVE TRAILING ZEROES
     2  12000       146R              CPA =B60
     3  66000         5R              JMP *+2
     4  66000        17R              JMP CN.20
     5  55764     77764A              DSZ AR3
     6  66000         1R              JMP CN.10
     7  45764     77764A              ISZ AR3
    10     20        20A              LDA AR2        NUM=0
    11  72406                         SZA CN.20
    12 170416                         AAR 15         LIMIT EXP TO 1 TO -1
    13 172402                         SAM *+2
    14  72501                         SIA *+1
    15 170605                         SAL 6
    16  30020        20A              STA AR2
    17   4020        20A       CN.20  LDB AR2
    20 174405                         ABR 6
    21  76432                         SZB LDP        ZERO EXP - INSERT DECIMAL POIN
    22  26000       147R              ADB =D3
    23 176435                         SBM EXP        PROCESS EXPON
    24  26000       150R              ADB =D-16      WITHIN BOUNDS FOR FXD FORMAT?
    25 176033                         SBP EXP          NO-PROCESS EXPON
    26  26000       151R              ADB =D13
    27 176413                         SBM LDZRO      GO INSERT LEADING ZEROES
    30     20        20A              LDA AR2
    31  52000       152R              AND =D1
    32 170040                         TCA
    33  21764     77764A              ADA AR3
    34 170040                         TCA
    35  20001         1A              ADA B
    36 172434                         SAM CN.30      WITHIN STRING?
    37  21764     77764A              ADA AR3        NO - LENGTHEN IT
    40  31764     77764A              STA AR3
    41 170201                         RET 1
    42  70541                  LDZRO  PWC B
    43   6000       146R              LDB =B60
    44     20        20A              LDA AR2
    45  52000       152R              AND =D1
    46  72101                         RIA *+1
    47  42000         3X              JSM IPCHR
    50 144016        16A              ISZ C,I
    51  66000        43R              JMP LDZRO+1
    52  54016        16A              DSZ C
    53     20        20A       LDP    LDA AR2
    54  52000       152R              AND =D1
    55  72101                  IDP    RIA *+1
    56   6000       153R              LDB =B56       DECIMAL POINT
    57  66000         3X              JMP IPCHR
    60  42000       121R       EXP    JSM APSET
    61   2000       154R              LDA =B105      E
    62  42000       135R              JSM APCHR
    63     20        20A              LDA AR2
    64  70540                         PWC A
    65 170405                         AAR 6
    66  42000         2X              JSM CNV43
    67  42000       101R              JSM APN25
    70  70760                         WWC A
    71  66000        54R              JMP LDP+1
    72     20        20A       CN.30  LDA AR2
    73  52000       152R              AND =D1
    74  20001         1A              ADA B
    75  66000        55R              JMP IDP
 *
    76  42000         2X       CNV45  JSM CNV43
    77   2000         1X       CNV25  LDA AR3D       CLEAR STRING BUFFER
   100  71607                         CLR 8
   101  42000       121R       APN25  JSM APSET
   102  71500                         NRM
   103  72702                         SDC *+2
   104  54001         1A              DSZ B
   105  26000       155R              ADB =D-12
   106  35777     77777A              STB CNTR
   107     20        20A              LDA AR2
   110  73003                         SLA ALOOP
   111   2000       156R              LDA =B55       MINUS
   112  42000       135R              JSM APCHR
   113  75541                  ALOOP  MLY
   114  62000       146R              IOR =B60
   115  42000       135R              JSM APCHR
```

```
116  45777   77777A           ISZ CNTR
117  66000     113R           JMP ALOOP
120 170201                    RET 1
121   5764   77764A   APSET   LDB AR3
122  76404                    SZB *+4
123  26000     157R           ADB =D-1
124 174700                    RBR 1
125  26000     160R           ADB =B100001    SET UP D REG AS CHAR POINTER
126  26000       1X           ADB AR3D
127  34017      17A           STB D
130 176204                    SBP *+4,C
131 100001       1A           LDA B,I
132  52000     161R           AND =B177400    MASK OFF GARBAGE BYTE
133 130001       1A           STA B,I
134 170201                    RET 1
135   4017      17A   APCHR   LDB D
136  45764   77764A           ISZ AR3         INCREMENT STRING LENGTH
137 176205                    SBP *+5,C       + = LAST CHAR WAS RIGHT BYTE
140 160001       1A           IOR B,I         - = LAST CHAR WAS LEFT BYTE
141 130001       1A           STA B,I
142  34017      17A           STB D
143 170201                    RET 1
144  74550                    PBD A,1         STORE LEFT CHAR,ZERO RIGHT CHA
145 170201                    RET 1
145                           END
146     60
147      3
150 177760
151     15
152      1
153     56
154    105
155 177764
156     55
157 177777
160 100001
161 177400

1       152R     100001 160R     105     154R     15      151R
177400  161R     177760 150R     177764  155R     177777  157R
3       147R     55     156R     56      153R     60      146R
A       0A       ALOOP  113R     APCHR   135R     APN25   101R
APSET   121R     AR2    20A      AR3     77764A   AR3D    1X
B       1A       C      16A      CN.10   1R       CN.20   17R
CN.30   72R      CNTR   77777A   CNV15   0R       CNV25   77R
CNV43   2X       CNV45  76R      D       17A      EXP     60R
IDP     55R      IPCHR  3X       LDP     53R      LDZRO   42R

KSPMAX=2 MSPMAX=39 NSPMAX=6 SSPMAX=206 DSPMAX=158
```

APPENDIX B-24

```
ASMB,R,L
                                      HED TRACE DUMP TO HPIB \
                                      NAM TDUMP,7 85680-90010A \
 *
 *      A-85680-90009A-2
 *        85680-90009A   (S)
 *        85680-90010A   (R)
 *      28 APR 1978
 *      LYNN WHEELWRIGHT
 *
          0                           ENT TDUMP,PDUMP,ADUMP,SDUMP,STHPB,HPBSY,HBUS
          0                           ENT WHPIB,WEOI,IHPBT,IHPIB
          0                           EXT AR3D,CNV15,CNV45
 *
 *         PROCEDURE ADUMP(ADC,FMT,RDBMV);
 *            VALUE ADC,FMT; INTEGER ADC,FMT;
 *            REAL PROCEDURE RDBMV(A);
 *               VALUE A; INTEGER A;
 *            EXTERNAL;
 *         PROCEDURE PDUMP(FMT,RDBMV);
 *            VALUE FMT; INTEGER FMT;
 *            REAL PROCEDURE RDBMV(A);
 *               VALUE A; INTEGER A;
 *            EXTERNAL;
 *         PROCEDURE TDUMP(FMT,RDBMV);
 *            VALUE FMT; INTEGER FMT;
 *            REAL PROCEDURE RDBMV(A);
 *               VALUE A; INTEGER A;
 *            EXTERNAL;
 *         PROCEDURE SDUMP(FMT,RDBMV,CNT,ADDR,INCR);
 *            VALUE FMT,CNT,ADDR,INCR;
 *            INTEGER FMT,CNT,ADDR,INCR;
 *            REAL PROCEDURE RDBMV(A);
 *               VALUE A; INTEGER A;
 *            EXTERNAL;
 *         PROCEDURE STHPB(S); VALUE S;
 *            ALPHA S; EXTERNAL;
 *         PROCEDURE HPBSY(ABORT,LOCAL);
 *            LABEL ABORT,LOCAL; EXTERNAL;
 *         PROCEDURE HBUSY; EXTERNAL;
 *         PROCEDURE WHPIB(N); VALUE N; INTEGER N;
 *            EXTERNAL;
 *         PROCEDURE WEOI; EXTERNAL;
 *         INTEGER PROCEDURE IHPIB;
 *            EXTERNAL;
 *         PROCEDURE IHPBT(DSTAD,COUNT); VALUE COUNT;
 *            INTEGER DSTAD,COUNT; EXTERNAL;
```

```
*
      0                   A      EQU 0
      1                   B      EQU 1
      3                   R      EQU 3
      4                   R4     EQU 4
      5                   R5     EQU 5
      6                   R6     EQU 6
      7                   R7     EQU 7
     11                   PA     EQU 11B
     16                   C      EQU 16B
     17                   D      EQU 17B
  77763                   E      EQU 77763B
     20                   AR2    EQU 20B
  77764                   AR3    EQU 77764B
  77754                   FMT    EQU 77754B
  77753                   CNTR   EQU 77753B
  77752                   DBMNV  EQU 77752B
  77751                   GTLCL  EQU 77751B
  77750                   ABORT  EQU 77750B
  77755                   SCNTR  EQU 77755B
*
     0   6000      262R   IHPIB  LDB =D4
     1  34011       11A          STB PA
     2   6000      263R          LDB =B177
     3  34007        7A          STB R7          HPIB BINARY INPUT
     4   6000      264R   IHP05  LDB =D2
     5  34011       11A          STB PA
     6   4007        7A   IHP07  LDB R7
     7 174614                    SBL 13
    10  16000      141R          CPB HPBRQ       HPIB INPUT?
    11  66000       15R          JMP IHP10       YES
    12  16000      140R   IHP09  CPB LOCAL       LOCAL?
    13  66000       23R          JMP IHP25
    14  66000        6R          JMP IHP07
    15   6000      262R   IHP10  LDB =D4         YES
    16  34011       11A          STB PA
    17      5        5A          LDA R5
    20 170140                    CMA
    21  52000      265R          AND =B377
    22 170201                    RET 1
    23   4006        6A   IHP25  LDB R6
    24 174600                    SBL 1
    25 176461                    SBM IHP07       HPIB IN LOCAL?
    26 165751    77751A          JMP GTLCL,I     BAILOUT - GO TO LOCAL
*
    27  70760             IHPBT  WWC A           GET ADDRESS OF DSTAD
    30  31755    77755A          STA SCNTR
    31 100000                    LDA A,I
    32 170140                    CMA
    33   6000      266R          LDB =D8
    34  34011       11A          STB PA
    35  30004        4A          STA R4          SET DST ADDRESS
    36  70760                    WWC A           FETCH # WORDS TO BE INPUT
    37 172006                    SAP IHP50-1
    40  42000                    JSM IHPIB
    41 170607                    SAL 8
    42  31753    77753A          STA CNTR
    43  42000                    JSM IHPIB
    44  61753    77753A          IOR CNTR
    45  31753    77753A          STA CNTR
    46  42000             IHP50  JSM IHPIB
    47 170607                    SAL 8
    50  30017       17A          STA D
    51  42000                    JSM IHPIB
    52  60017       17A          IOR D
    53   6000      266R          LDB =D8
    54  34011       11A          STB PA
    55 170140                    CMA
    56  30006        6A          STA R6          WRITE WORD IN DST
    57 145755    77755A          ISZ SCNTR,I     INCREMENT DSTAD
    60  55753    77753A          DSZ CNTR
    61  66000       46R          JMP IHP50
    62 170201                    RET 1
*
    63  30017       17A   STHPB  STA D           DUMP STRING TO HPIB
    64  74571                    WBD B,I         GET LENGTH
    65  35755    77755A          STB SCNTR
    66  76407                    SZB *+7         NOTHING TO DO
    67  74570             SLOOP  WBD A,I
    70 170140                    CMA
    71  42000      116R          JSM HBUSY
    72  30006        6A          STA R6
    73  55755    77755A          DSZ SCNTR
    74  66000       67R          JMP SLOOP
    75 170201                    RET 1
*
    76  52000      267R   TSET   AND =D3
    77  22000      105R          ADA FTAB
   100 100000                    LDA A,I         FETCH FORMAT POINTER
   101  31754    77754A          STA FMT
   102  70761                    WWC B           FETCH PROCEDURE ENTRY
   103  35752    77752A          STB DBMNV
   104 170201                    RET 1
   105             106R   FTAB   DEF *+1
   106             251R          DEF FMTAB
   107             237R          DEF FMT4R
   110             221R          DEF FMT8
   111             230R          DEF FMT16
*
   112  70761             HPBSY  WWC B           FETCH LABELS
```

```
113   35750  77750A         STB ABORT
114   70761                 WWC B
115   35751  77751A         STB GTLCL
116    6000    264R  HBUSY  LDB =D2
117   34011     11A         STB PA
120    4007      7A  BLOOP  LDB R7
121  174611                 SBL 10
122  176413                 SBM DONE
123  174602                 SBL 3
124   16000    141R         CPB HPBRQ
125  165750  77750A         JMP ABORT,I
126   16000    140R         CPB LOCAL
127   66000    131R         JMP *+2
130   66000    120R         JMP BLOOP
131    4006      6A         LDB R6
132  174600                 SBL 1
133  176465                 SBM BLOOP
134  165751  77751A         JMP GTLCL,I
135    6000    262R  DONE   LDB =D4
136   34011     11A         STB PA
137  170201          TDONE  RET 1
140                  LOCAL  OCT 120000
141                  HPBRQ  OCT 20000
*
142   42000    116R  WEOI   JSM HBUSY
143    6000    270R         LDB =D-3
144   34007      7A         STB R7
145  170201                 RET 1
*
146  170140          WHPIB  CMA
147   42000    116R         JSM HBUSY
150   30006      6A         STA R6
151  170201                 RET 1
*
152   31753  77753A  ADUMP  STA CNTR
153   70760                 WWC A
154   42000     76R         JSM TSET           GET ARGUMENTS
155    1753  77753A         LDA CNTR
156    6000    271R         LDB =D1
157   35753  77753A         STB CNTR
160  170140                 CMA
161  165754  77754A         JMP FMT,I
*
162    6000    271R  PDUMP  LDB =D1
163   66000    165R         JMP TDUMP+1
164    6000    272R  TDUMP  LDB =D1001
165   35753  77753A         STB CNTR
166   42000     76R         JSM TSET
167    2000    266R  TLOOP  LDA =D8
170   30011     11A         STA PA
171       5      5A         LDA R5
172  141754  77754A         JSM FMT,I
173   55753  77753A         DSZ CNTR
174   66000    167R         JMP TLOOP
175  170201                 RET 1
*
176   42000     76R  SDUMP  JSM TSET           FETCH FORMAT AND PROCEDURE
177   70760                 WWC A              FETCH COUNT
200   31753  77753A         STA CNTR
201    2000    266R  SURLP  LDA =D8
202   30011     11A         STA PA
203   70760                 WWC A              FETCH DSTAD
204  170140                 CMA
205   30004      4A         STA R4             SET DSPL ADRS
206  170140                 CMA
207  120016     16A         ADA C,I            INCREMENT ADDRESS
210   70540                 PWC A
211   72600                 SFC *              WAIT FOR DIG STOR
212       5      5A         LDA R5             READ DIG STOR
213  141754  77754A         JSM FMT,I
214   55753  77753A         DSZ CNTR
215   66000    201R         JMP SURLP
216   54016     16A         DSZ C
217   54016     16A         DSZ C              UPDATE C STACK
220  170201                 RET 1
*
221  170501          FMT8   SAR 2
222    5753  77753A  FMT81  LDB CNTR
223   16000    271R         CPB =D1
224   42000    142R         JSM WEOI
225   42000    116R  FMT82  JSM HBUSY
226   30006      6A         STA R6
227  170201                 RET 1
*
230   62000    273R  FMT16  IOR =B170000
231   70540                 PWC A
232  170707                 RAR 8
233   42000    116R         JSM HBUSY
234   30006      6A         STA R6
235   70760                 WWC A
236   66000    222R         JMP FMT81
*
237   62000    273R  FMT4R  IOR =B170000
240  170140                 CMA
241   42000      3X         JSM CNV45
242    2000      1X  FMT4S  LDA AR3D
243   42000     63R         JSM STRPB
244    2000    274R         LDA =B-16          CR
245   42000    116R         JSM HBUSY
246   30006      6A         STA R6
```

```
247   2000   275R        LDA =B-13      LF
250  66000   222R        JMP FMI81
    *
251  62000   273R  FMTAB IOR =B170000
252 170140               CMA
253 141752 77752A        JSM DBMNV,I
254 170517               CLA
255   6000   276R        LDB =D7
256  75500               MRY
257  71500               NRM
260  42000     2X        JSM CNV15
261  66000   242R        JMP FMT4S
261                      END
262      4
263    177
264      2
265    377
266     10
267      3
270 177775
271      1
272   1751
273 170000
274 177762
275 177765
276      7

1       271R    10      266R    170000  273R    1751    272R
177     263R    177762  274R    177765  275R    177775  270R
2       264R    3       267R    377     265R    4       262R
7       276R    A       0A      ABORT   77750A  ADUMP   152R
AR2     20A     AR3     77764A  AR3D    1X      B       1A
BLOOP   120R    C       16A     CNTR    77753A  CNV15   2X
CNV45   3X      D       17A     DBMNV   77752A  DONE    135R
E       77763A  FMT     77754A  FMT16   230R    FMT4R   237R
FMT4S   242R    FMT8    221R    FMT81   222R    FMT82   225R
FMTAB   251R    FTAB    105R    GTLCL   77751A  HBUSY   116R
HPBRQ   141R    HPBSY   112R    IHP05   4R      IHP07   6R
IHP09   12R     IHP10   15R     IHP25   23R     IHP50   46R
IHPB1   27R     IHPIB   0R      LOCAL   140R    PA      11A
PDUMP   162R    R       3A      R4      4A      R5      5A
R6      6A      R7      7A      SCNTR   77755A  SDUMP   176R
SLOOP   67R     STHPB   63R     SURLP   201R    TDONE   137R
TDUMP   164R    TLOOP   167R    TSET    76R     WEOI    142R
WHPIB   146R

KSPMAX=2 MSPMAX=39 NSPMAX=6 SSPMAX=384 DSPMAX=158
```

APPENDIX B-25

```
ASMB,R,L
                         HED VIDEO AVERAGE ROUTINE
                         NAM VDAVG,7  ET10585-1047A \
    *
    *   A-ET10585-1046A-2
    *     ET10585-1046A  (S)
    *     ET10585-1047A  (R)
    *   15 JULY 1977
    *   LYNN WHEELWRIGHT
    *
  0                      ENT VDAVG,VDSUB
  0                      EXT .FLT,.FDVA,AR1D
  0  12000   213R  VDAVG CPA =D1         N= AVERAGE #
  1  66000   135R        JMP STRTZ       P= PAGE OF MEMORY
  2  70540               PWC A
  3  42000     1X        JSM .FLT
  4   2000     3X        LDA AR1D
  5   6000    13R        LDB AR3D
  6  71401               XFR 2
  7  70760               WWC A
 10  22000   214R        ADA =D-1
 11  42000     1X        JSM .FLT
 12  42000     2X        JSM .FDVA
 13        77764A  AR3D  DEF AR3
 14   1771 77771A        LDA AR1+1
 15  31767 77767A        STA AR3+3       AR3+3=(N-1)/N
 16   2000   213R        LDA =D1
 17  42000     1X        JSM .FLT
 20  42000     2X        JSM .FDVA       AR1=1/N
 21        77764A        DEF AR3
 22   1770 77770A        LDA AR1
 23  72004               RZA STR
 24   2000   116R        LDA RET4
 25  30020    20A        STA AR2
 26  66000    42R        JMP STRTA
 27 170140         STR   CMA
 30  22000   120R        ADA ABR1
 31  30023    23A        STA AR2+3
 32  22000   215R        ADA =B4100
 33  30021    21A        STA AR2+1
 34  52000   216R        AND =B17
 35 170040               TCA
 36  22000   117R        ADA SBL15
 37  30020    20A        STA AR2
 40   2000   115R        LDA RET1
 41  30022    22A        STA AR2+2
 42  42000   121R  STRTA JSM SETUP
 43   5774 77774A  LOOPA LDB TRAB
```

```
    44  72600                   SFC  *
    45  34004       4A          STB  R4
    46   5775  77775A           LDB  TRC
    47  72600                   SFC  *
    50      5       5A          LDA  R5
    51 170140                   CMA
    52 170604                   SAL  5
    53  72600                   SFC  *
    54  34004       4A          STB  R4
    55   5767  77767A           LDB  AR3+3
    56  72600                   SFC  *
    57  75617                   MPY
    60  31764  77764A           STA  AR3
    61  35765  77765A           STB  AR3+1
    62      5       5A          LDA  R5
    63 170140                   CMA
    64 170604                   SAL  5
    65   5774  77774A           LDB  TRAB
    66  72600                   SFC  *
    67  34004       4A          STB  R4
    70   5771  77771A           LDB  AR1+1
    71  72600                   SFC  *
    72  75617                   MPY
    73  35776  77776A           STB  X
    74  40020      20A          JSM  AR2
    75  20001       1A          ADA  B
    76   5776  77776A           LDB  X
    77  70023                   EXE  AR2+3
   100 177201                   SEC  *+1,C
   101  21764  77764A           ADA  AR3
   102 177202                   SEC  *+2,C
   103  76501                   SIB  *+1
   104  25765  77765A           ADB  AR3+1
   105  26000     217R          ADB  =D8
   106 174503                   SBR  4
   107 174140                   CMB
   110  34006       6A          STB  R6
   111  45774  77774A           ISZ  TRAB
   112  45775  77775A           ISZ  TRC
   113  55777  77777A           DSZ  CNTR
   114  66000      43R          JMP  LOOPA
   115 170201            RET1   RET  1
   116 170204            RET4   RET  4
   117 174616            SBL15  SBL  15
   120 174400            ABR1   ABR  1
 77764                   AR3    EQU  77764B
    20                   AR2    EQU  20B
 77770                   AR1    EQU  77770B
 77774                   TRAB   EQU  77774B
 77775                   TRC    EQU  77775B
 77776                   X      EQU  77776B
 77777                   CNTR   EQU  77777B
     4                   R4     EQU  4
     5                   R5     EQU  5
     6                   R6     EQU  6
     0                   A      EQU  0
     1                   B      EQU  1
    16                   C      EQU  16B
    11                   PA     EQU  11B
   121   6000     220R   SETUP  LDB  =D1001
   122  35777  77777A           STB  CNTR
   123   6000     217R          LDB  =D8
   124  34011      11A          STB  PA
   125  70761                   WWC  B
   126 174611                   SBL  10
   127  26000     220R          ADB  =D1001
   130 174140                   CMB
   131  35774  77774A           STB  TRAB
   132   6000     221R          LDB  =D-4074
   133  35775  77775A           STB  TRC
   134 170201                   RET  1
   135  42000     121R   STRTZ  JSM  SETUP
   136   5775  77775A    LOOPZ  LDB  TRC
   137  72600                   SFC  *
   140  34004       4A          STB  R4
   141  72600                   SFC  *
   142      5       5A          LDA  R5
   143   5774  77774A           LDB  TRAB
   144  72600                   SFC  *
   145  34004       4A          STB  R4
   146  72600                   SFC  *
   147  30006       6A          STA  R6
   150  45774  77774A           ISZ  TRAB
   151  45775  77775A           ISZ  TRC
   152  55777  77777A           DSZ  CNTR
   153  66000     136R          JMP  LOOPZ
   154 170201                   RET  1
   155   6000     213R   VDSUB  LDB  =D1          C_C-B
   156  70541                   PWC  B
   157  42000     121R          JSM  SETUP
   160   5774  77774A    LOOPS  LDB  TRAB
   161  72600                   SFC  *
   162  34004       4A          STB  R4
   163   5775  77775A           LDB  TRC
   164  72600                   SFC  *
   165      5       5A          LDA  R5
   166  72501                   SIA  *+1
   167 170604                   SAL  5
   170  72600                   SFC  *
   171  34004       4A          STB  R4
```

```
  172  31776  77776A          STA X
  173  72600                  SFC *
  174      5      5A          LDA R5
  175 170140                  CMA
  176 170604                  SAL 5
  177  21776  77776A          ADA X
  200  72600                  SFC *
  201  34004      4A          STB R4
  202 170404                  AAR 5
  203 170140                  CMA
  204  72600                  SFC *
  205  30006      6A          STA R6
  206  45774  77774A          ISZ TRAB
  207  45775  77775A          ISZ TRC
  210  55777  77777A          DSZ CNTR
  211  66000    160R          JMP LOOPS
  212 170201                  RET 1
  212                         END
  213      1
  214 177777
  215   4100
  216     17
  217     10
  220   1751
  221 170026
```

| | | | | | | | |
|---|---|---|---|---|---|---|---|
| .FDVA | 2X | .FLT | 1X | 1 | 213R | 10 | 217R |
| 17 | 216R | 170026 | 221R | 1751 | 220R | 177777 | 214R |
| 4100 | 215R | A | 0A | ABR1 | 120R | AR1 | 77770A |
| AR1D | 3X | AR2 | 20A | AR3 | 77764A | AR3D | 13R |
| B | 1A | C | 16A | CNTR | 77777A | LOOPA | 43R |
| LOOPS | 160R | LOOPZ | 136R | PA | 11A | R4 | 4A |
| R5 | 5A | R6 | 6A | RET1 | 115R | RET4 | 116R |
| SBL15 | 117R | SETUP | 121R | STR | 27R | STRTA | 42R |
| STRTZ | 135R | TRAB | 77774A | TRC | 77775A | VDAVG | 0R |
| VDSUB | 155R | X | 77776A | | | | |

KSPMAX=2 MSPMAX=39 NSPMAX=6 SSPMAX=205 DSPMAX=158

APPENDIX B-26

```
ASMB,R,L
                              HED BINARY FLOATING POINT MATH \
                              NAM BFL1,7  ET10585-1049A
 *
 *    A-ET10585-1048A-2
 *      ET10585-1048A   (S)
 *      ET10585-1049A   (R)
 *    1 AUG 1977
 *    LYNN WHEELWRIGHT
 *
        0                     ENT .FMPA,.FMPB,.FDVA,.FDVB,.FLT,.FIX
        0                     ENT .FADA,.FADB
        0                     EXT AR1D,.BDVS,.BDVF
 *
 *       8 JUN 76
 *
    0 144003      3A   .FMPA  ISZ R,I            JSM .FMPA  (AR1=ACCUM)
    1 104003      3A          LDB R,I            DEF OPERAND
    2 104001      1A          LDB B,I
    3 176677                  SBM *-1,C          FOLLOW INDIRECTS
    4 100001      1A   .FMPB  LDA B,I            GET EXPONENT
    5  21770  77770A          ADA AR1
    6  72501                  SIA *+1
    7  31770  77770A          STA AR1            EXPONENTS DONE
   10  76501                  SIB *+1
   11 100001      1A          LDA B,I
   12   5771  77771A          LDB AR1+1
   13  75617                  MPY
   14  76010                  RZB FMPS
   15  72007                  RZA FMPS
   16  66000     77R          JMP FADNZ
   17 172002           FMPL   SAP *+2
   20  76101                  RIB *+1
   21 170600                  SAL 1
   22  55770  77770A          DSZ AR1
   23                         NOP
   24  35771  77771A   FMPS   STB AR1+1
   25 176404                  SBM *+4
   26 174600                  SBL 1
   27 176070                  SBP FMPL
   30 170201                  RET 1
   31 174600                  SBL 1
   32 176465                  SBM FMPL
   33 170201                  RET 1
 *
   34 144003      3A   .FDVA  ISZ R,I
   35 104003      3A          LDB R,I
   36 104001      1A          LDB B,I
   37 176677                  SBM *-1,C
   40 173201           .FDVB  SOC *+1,C
   41 100001      1A          LDA B,I
   42 170040                  TCA
   43  21770  77770A          ADA AR1
   44  72501                  SIA *+1
   45 173632                  SOS FADNZ,C        EXPONENT OVERFLOW
   46  31773  77773A          STA AR1+3
   47  76501                  SIB *+1
   50 104001      1A          LDB B,I
```

```
 51  16000     225R          CPB =B100000
 52  66000      70R          JMP FDV20
 53   1771  77771A           LDA AR1+1
 54  42000       2X          JSM .BDVS
 55 173407                   SOS FDV10
 56   4000                   LDB A
 57   2000     226R          LDA =D0
 60  42000       3X          JSM .BDVF
 61   4000                   LDB A
 62   1773  77773A           LDA AR1+3
 63  66000     112R          JMP FADN-1
 64  31771  77771A    FDV10  STA AR1+1
 65   2000     227R          LDA =D32767
 66  31770  77770A           STA AR1
 67 170201                   RET 1
 70   5771  77771A    FDV20  LDB AR1+1
 71  16000     225R          CPB =B100000
 72  66000      74R          JMP *+2
 73  66000     112R          JMP FADN-1
 74  72501                   SIA *+1
 75 174500                   SBP 1
 76  66000     100R          JMP FADNZ+1
*
 77   2000     230R   FADNZ  LDA =D-32767
100  31770  77770A           STA AR1
101  35771  77771A           STB AR1+1
102 170201                   RET 1
103  35771  77771A    FADNN  STB AR1+1
104 174600                   SBL 1
105  22000     231R          ADA =D-1
106 176475                   SBM *-3
107  66000     122R          JMP FADNX
*
110   4000            .FLT   LDB A              AREG = NUM TO BE FLOATED
111   2000     232R          LDA =D15
112  31770  77770A           STA AR1
113  76464            FADN   SZB FADNZ
114   1770  77770A           LDA AR1
115 176466                   SBM FADNN
116  35771  77771A           STB AR1+1
117 174600                   SBL 1
120  22000     231R          ADA =D-1
121 176075                   SBP *-3
122  72501            FADNX  SIA *+1
123  31770  77770A           STA AR1
124 170201                   RET 1
*
125 144003       3A   .FADA  ISZ R,I            JSM .FADA
126 104003       3A          LDB R,I            DEF OPERAND
127 104001       1A          LDB B,I
130 176677                   SBM *-1,C
131 100001       1A   .FADB  LDA B,I            JSM .FADB
132 170040                   TCA                BREG = OPER. ADDRESS
133  21770  77770A           ADA AR1
134 172423                   SAM NEXPO
135  76501                   SIB *+1
136  72003                   RZA *+3
137 104001       1A          LDB B,I
140  66000     146R          JMP FADX-2
141  22000     233R          ADA =D-16
142 172014                   SAP FADXT
143  22000     202R          ADA ABR16
144 104001       1A          LDB B,I
145  70000                   EXE A
146 173201                   SOC *+1,C
147  25771  77771A           ADB AR1+1
150 173243            FADX   SOC FADN,C
151  45770  77770A           ISZ AR1
152                          NOP
153 174400                   ABR 1
154  26000     225R          ADB =B100000
155  35771  77771A           STB AR1+1
156 170201            FADXT  RET 1
157 170040            NEXPO  TCA
160  22000     233R          ADA =D-16
161 172405                   SAM *+5
162      1       1A          LDA B
163   6000       1X          LDB AR1D
164  71401                   XFR 2
165 170201                   RET 1
166  22000     201R          ADA AAR16
167  70540                   PWC A
170 100001       1A          LDA B,I
171  31770  77770A           STA AR1
172  76501                   SIB *+1
173   1771  77771A           LDA AR1+1
174 170016                   EXE C,I
175 104001       1A          LDB B,I
176  24000                   ADB A
177  70760                   WWC A
200  66000     150R          JMP FADX
201 170417            AAR16  AAR 16
202 174417            ABR16  ABR 16
*
203   1770  77770A    .FIX   LDA AR1            JSM .FIX
204   5771  77771A           LDB AR1+1
205 172415                   SAM FIXZ           CONTENTS OF AR1,AR1+1 FIXED
206  22000     234R          ADA =D-15
207  72405                   SZA FIXIT+1
210 172006                   SAP FIXOV
```

```
 211 170140                      CMA
 212  62000   224R               IOR ABR1
 213  70000             FIXIT    EXE A
 214      1     1A               LDA B
 215 170201                      RET 1
 216   2000   227R      FIXOV    LDA =D32767
 217 176002                      SBP *+2
 220 170040                      TCA
 221 170201                      RET 1
 222   2000   226R      FIXZ     LDA =D0
 223 170201                      RET 1
 224 174400             ABR1     ABR 1
       0                A        EQU 0
       1                B        EQU 1
       3                R        EQU 3
      16                C        EQU 16B
      17                D        EQU 17B
   77774                AR0      EQU 77774B
   77770                AR1      EQU 77770B
   77770                         END
 225 100000
 226      0
 227  77777
 230 100001
 231 177777
 232     17
 233 177760
 234 177761
```

| | | | | | | | |
|---|---|---|---|---|---|---|---|
| .BDVF | 3X | .BDVS | 2X | .FADA | 125R | .FADB | 131R |
| .FDVA | 34R | .FDVB | 40R | .FIX | 203R | .FLT | 110R |
| .FMPA | 0R | .FMPB | 4R | 0 | 226R | 100000 | 225R |
| 100001 | 230R | 17 | 232R | 177760 | 233R | 177761 | 234R |
| 177777 | 231R | 77777 | 227R | A | 0A | AAR16 | 201R |
| ABR1 | 224R | ABR16 | 202R | ARO | 77774A | AR1 | 77770A |
| AR1D | 1X | B | 1A | C | 16A | D | 17A |
| FADN | 113R | FADNN | 103R | FADNX | 122R | FADNZ | 77R |
| FADX | 150R | FADXT | 156R | FDV10 | 64R | FDV20 | 70R |
| FIXIT | 213R | FIXOV | 216R | FIXZ | 222R | FMPL | 17R |
| FMPS | 24R | NEXPU | 157R | R | 3A | | |

KSPMAX=2 MSPMAX=39 NSFMAX=6 SSPMAX=256 DSPMAX=158

APPENDIX B-28

DIGITAL STREAM ANALYSIS PROGRAM

```
ASMB,R,L                                 HED DSA ROUTINES - BASE PAGE PORTION \
                                         NAM DSA,7  85680-90014A
      *
      *    A-85680-90013A-2
      *      85680-90013A  (S)
      *      85680-90014A  (R)
      *    27 SEP 1977
      *    LYNN WHEELWRIGHT
      *    DAVE SHARRIT
      *
           0                             ENT PARTB,AR0D,AR1D,AR2D,AR3D
           0                             EXT PINIT
           0                    A        EQU 0
           1                    B        EQU 1
           2                    P        EQU 2
           3                    R        EQU 3
           4                    R4       EQU 4
           5                    R5       EQU 5
           6                    R6       EQU 6
           7                    R7       EQU 7
          10                    IV       EQU 10B
          11                    PA       EQU 11B
          12                    W        EQU 12B
          13                    DMAPA    EQU 13B
          14                    DMAC     EQU 14B
          15                    DMAMA    EQU 15B
          16                    C        EQU 16B
          17                    D        EQU 17B
          20                    AR2      EQU 20B
          24                    SE       EQU 24B
       77774                    AR0      EQU 77774B
       77770                    AR1      EQU 77770B
       77764                    AR3      EQU 77764B
           0                             ORB
           0  74761             PWRON    WBC B
           1  35770   77770A             STB AR1
           2  66000      10R             JMP .DSA
           3  77774             AR0D     ABS AR0
           4  77770             AR1D     ABS AR1
           5     20             AR2D     ABS AR2
           6  77764             AR3D     ABS AR3
           7        177746B     PARLC    DEF *-41B
          10                    PARTB    EQU *
          10                             ORR
      HED DSA ROUTINES - MAIN PGM PORTION
      *
      *  CONSTANTS
      *
       77707                    CM70     EQU 77707B
           0                    CM1      DEC -1
           1                    B30      OCT 30
           2                    B10      OCT 10
           3                    HYPT1    OCT 205       HYBRID CHECK SUM
```

```
      4                   B40   OCT 100040
      5                   ROMMX OCT 140000     16 K ROM
      6                   SRLC1 OCT 057767
      7                   SRLC2 OCT 057777
*
*********************************
*     INSTRUMENT PRESET BEGINS HERE
*********************************
*
     10                  .DSA   EQU *
     10 132000      7R   BEG    STA SRLC2,I    CLEAR DSA COUNTER
*
*********************************
*  HYBRID REGISIER CHECK
*********************************
*
     11   2000      2R          LDA B10
     12  71617                  CLR 16         CLEAR INTERNAL REGISTERS
     13  76603                  SSC *+3
     14 170717                  RAR 16
     15  72176                  RIA *-2        .5 SEC DELAY
     16 132000      6R          STA SRLC1,I    CLOCK DSA COUNTER
     17   2000      2R          LDA B10
     20   6000           HYB2   LDB CM1
     21  34003      3A   HYB3   STB R
     22 104000                  LDB A,I        READ REGISTER
     23  24012     12A          ADB W
     24  34012     12A          STB W          STORE CHECKSUM
     25   4003      3A          LDB R
     26 134000                  STB A,I        WRITE PATTERN
     27 174600           HYC4   SBL 1          RIGHT SHIFT PATTERN
     30  76071                  RZB HYB3       CYCLE BACK IF #0
     31  72501                  SIA *+1        INCREMENT REGISTER INDEX
     32  12000      1R          CPA B30        CHECK FOR LAST
     33  66000     35R          JMP *+2
     34 176064                  SBP HYB2       CYCLE BACK FOR NEXT REGISTER
     35  20012     12A          ADA W
     36  12000      3R          CPA HYPT1      CHECK CHECKSUM
     37  77202                  SLB *+2,C
     40   6000                  LDB CM1        ERROR DETECTED
     41  34015     15A          STB DMAMA
*
*********************************
* ROM CHECKSUM
*********************************
*
     42   2000      4R          LDA B40
     43  30017     17A          STA D          INITIALIZE ROM LOCATION
     44     17     17A   ROMCH  LDA D
     45  12000      5R          CPA ROMMX      CHECK FOR LAST ROM LOCATION
     46  66000     75R          JMP THRU
     47   6000                  LDB CM1
     50  34020     20A          STB AR2        INITIALIZE BYTE ACCUMULATORS
     51  74570                  WBD A,I        READ UPPER BYTE
     52  24000                  ADB A          SUM UPPER BYTE
     53  74570                  WBD A,I        READ LOWER BYTE/INCR. STACK
     54  20020     20A          ADA AR2
     55  30020     20A          STA AR2        STORE LOWER BYTE SUM
     56     17     17A          LDA D
     57 170604                  SAL 5
     60  72071                  RZA *-7        CHECK FOR END OF ROM CHIP
     61     17     17A          LDA D
     62 170511                  SAR 10
     63  22000      7B          ADA PARLC
     64 114000                  CPB A,I        CHECK UPPER BYTE CHECK SUM
     65  66000     67R          JMP CHK2
     66  66000     73R          JMP ERR
     67   4020     20A   CHK2   LDB AR2
     70  72501                  SIA *+1
     71 114000                  CPB A,I        CHECK LOWER BYTE CHECK SUM
     72  66000     44R          JMP ROMCH
     73   6000           ERR    LDB CM1
     74  34015     15A          STB DMAMA
     75 132000      6R   THRU   STA SRLC1,I
*
     76   2000    417R   MDSA   LDA B17
     77  30003      3A          STA R
*
    100  76211                  SSS RAM        DO RAM CHECK IF STATUS SET
    101  66000    161R          JMP EERAM        OTHERWISE JUMP TO EMC CHECK
*
    102   2000    413R   DSA    LDA B2
    103  30011     11A          STA PA
    104  30005      5A          STA R5         CLOCK IOSB
    105 132000      6R          STA SRLC1,I    CLOCK DSA COUNTER
    106  30005      5A          STA R5         CLOCK IOSB
    107  30005      5A          STA R5         CLOCK IOSB
    110 170201                  RET 1
*
*********************************
*     RAM TEST ROUTINE (FOR FOUR 1KX4 RAMS)
*********************************
*
    111 174517           RAM    SBR 16
    112  34021     21A          STB AR2+1
    113  34022     22A          STB AR2+2
    114   2000    150R          LDA RAMSI
    115 134000                  STB A,I
    116  72501                  SIA *+1        CLEAR MEMORY
    117 172076                  SAP *-2
```

```
*
     120    6000      152R           LDB  RAMT9
     121   42000      131R   RAMT1   JSM  RAMTT
     122       1        1A           LDA  B
     123  170040                     TCA
     124   30022       22A           STA  AR2+2      STORE OLD PATTERN
     125  174700                     RBR  1          SHIFT PATTERN
     126   16000      152R           CPB  RAMT9      CHECK FOR END
     127   66000      153R           JMP  EDRAM
     130   66000      121R           JMP  RAMT1
     131    2000      151R   RAMTT   LDA  RAMSS
     132   30023       23A           STA  AR2+3
     133      23       23A   RAMTU   LDA  AR2+3
     134  176402                     SBM  *+2
     135  170140                     CMA             COMPLEMENT ADDRESS
     136   62000      151R           IOR  RAMSS
     137   30016       16A           STA  C
     140   70760                     WWC  A,D        READ RAM LOCATION
     141   20022       22A           ADA  AR2+2      CHECK FOR CORRECT PATTERN
     142   60021       21A           IOR  AR2+1
     143   30021       21A           STA  AR2+1      STORE SCORE
     144   70541                     PWC  B,I        WRITE NEXT PATTERN IN RAM LOCA
     145   44023       23A           ISZ  AR2+3      INCREMENT ADDRESS, SKIP IF DON
     146   66000      133R           JMP  RAMTU
     147  170201                     RET  1
     150                     RAMSI   OCT  076000
     151                     RAMSS   OCT  176000
     152                     RAMT9   OCT  170360
*
     153      21       21A   EDRAM   LDA  AR2+1
     154    6000                     LDB  CM1
     155   72404                     SZA  EERAM      CHECK FOR PASS
     156  170600                     SAL  1
     157   34015       15A           STB  DMAMA
     160   66000      155R           JMP  *-3
*
     161   42000      102R   EERAM   JSM  DSA
*
*********************************
*      DIGITAL STORAGE ROUTINE
*********************************
*
     162    2000        2R   EMCH    LDA  B10
     163   30011       11A           STA  PA
     164   44011       11A           ISZ  PA
     165    6000      432R           LDB  DSTC
     166   34004        4A           STB  R4
     167   30011       11A           STA  PA
     170    2000      430R           LDA  DSRAM
     171   76602                     SSC  *+2
     172    2000      431R           LDA  DSR2
     173   30022       22A           STA  AR2+2
     174  170600                     SAL  1
     175   30004        4A           STA  R4
     176  170040                     TCA
     177  174517                     CLB
     200   34006        6A           STB  R6         SET DS RAM
     201   70430                     DIR
     202   72175                     RIA  *-3
     203   34017       17A           STB  D
     204   34023       23A           STB  AR2+3
     205    2000      244R           LDA  DST9
     206   72631                     SFC  DST8
     207    4022       22A   DST1    LDB  AR2+2
     210   34004        4A           STB  R4
     211   30016       16A           STA  C
     212  170517            DST2    CLA
     213      23       23A           LDA  AR2+3
     214   20005        5A           ADA  R5         READ DS MEMORY
     215   60017       17A           IOR  D
     216   30017       17A           STA  D
     217  170517                     CLA
     220   34004        4A           STB  R4         SET DS ADDRESS
     221   70430                     DIR
     222  170517                     CLA
     223      16       16A           LDA  C
     224   30006        6A           STA  R6         WRITE DS MEMORY
     225   26000                     ADB  CM1
     226  176064                     SBP  DST2       INCR/SKIP
     227  170040                     TCA
     230   30023       23A           STA  AR2+3
     231      16       16A           LDA  C
     232  170600                     SAL  1
     233  172054                     SAP  DST1       CYCLE BACK
     234    4017       17A           LDB  D
     235  174603                     SBL  4
     236   76407                     SZB  ETDS       CHECK FOR GOOD DS MEMORY
     237    2000      413R   DST8    LDA  B2
     240   60015       15A           IOR  DMAMA
     241   30015       15A           STA  DMAMA
     242  174600                     SBL  1          SHIFT UNTIL BAD BITS GONE
     243   66000      236R           JMP  *-5
     244                     DST9    OCT  5333
     245   42000      102R   ETDS    JSM  DSA
*
*********************************
*      IOC INTERFACE VERIFY
*********************************
*
     246    6000      413R           LDB  B2
```

```
      247    34011    11A           STB  PA
      250     2000                  LDA  CM1
      251    30005     5A           STA  R5         SET KEY ROWS TO 0
      252    44011    11A           ISZ  PA
      253   174600                  SBL  1
      254    34004     4A           STB  R4         RESET RPG
      255    54011    11A           DSZ  PA
      256        7     7A           LDA  R7         READ RPG
      257   170140                  CMA
      260   170507                  SAR  8
      261     4006     6A           LDB  R6         READ KEY COLUMN
      262   174607                  SBL  8
      263    24000                  ADB  A
      264     2000   412R           LDA  B1
      265    76702                  SHC  *+2        CHECK LSRQ
      266    76403                  SZB  *+3        CHECK
      267    60015    15A           IOR  DMAMA
      270    30015    15A           STA  DMAMA      STATUS GND: CYCLE AUTOCHECK
 *                       STATUS T1: COUNTER IGNORE
      271    76602                  SSC  IOBEG      STATUS T2 OR T3: FULL POP TEST
      272    66000    10R           JMP  BEG        STATUS T0: CYCLE IOC ROUTINE
 *
 *************************************************
 *      IOC EXERCISE ROUTINE (RF SECTION INTERFACE)
 *************************************************
 *
      273     2000   420R   IOBEG   LDA  STAK2
      274    30003     3A           STA  R          INIT. RETURN STACK POINTER
      275   132000     6R           STA  SRLC1,I    CLOCK DSA COUNTER (0111)
      276    76203                  SSS  *+3
      277   132000     6R           STA  SRLC1,I    CLOCK DSA (0011)
      300    66000     1X           JMP  PINIT
      301   132000     7R           STA  SRLC2,I    CLEAR DSA COUNTER
      302     2000   414R           LDA  B4
      303    31776 77776A           STA  LIND       INIT. LOOP INDEX
 *
      304    42000   102R   STLOP   JSM  DSA
 *
      305   170517                  SAR  16
      306    31777 77777A           STA  APPL       INIT APPLIANCE COUNTER
      307     5777 77777A   LOPA    LDB  APPL
      310    16000   410R           CPB  CNTR       CHECK FOR = COUNTER
      311    66000   331R           JMP  GOIO
      312   174500                  SBR  1
      313    16000   415R           CPB  B5
      314    66000   322R           JMP  NEXTO
      315   174501                  SBR  2
      316    16000   416R           CPB  B6
      317    66000   331R           JMP  GOIO
      320   174500                  SBR  1
      321    76410                  SZB  GOIO
      322    45777 77777A   NEXTO   ISZ  APPL
      323     5777 77777A           LDB  APPL
      324   174505                  SBR  6
      325    76462                  SZB  LOPA
      326    55776 77776A           DSZ  LIND
      327    66000   304R           JMP  STLOP
      330    66000   273R           JMP  IOBEG
      331     2000   420R   GOIO    LDA  PAT1
      332    42000   336R           JSM  PATER      CYCLE IOC WITH PATTERN 1
      333     2000   421R           LDA  PAT2
      334    42000   336R           JSM  PATER      CYCLE IOC WITH PATTERN 2
      335    66000   322R           JMP  NEXTO
      336     5777 77777A   PATER   LDB  APPL
      337    16000   417R           CPB  ATTEN      CHECK FOR ATTENUATOR
      340   170517                  SAR  16            AND CLEAR PATTERN
      341    30016    16A           STA  C
      342     5777 77777A   PATT2   LDB  APPL
      343   174701                  RBR  2
      344    34011    11A           STB  PA         SET PER. ADDRESS
      345   174515                  SBR  14
      346    26000   414R           ADB  B4
      347   130001     1A           STA  B,I        OUTPUT PATTERN
      350     5777 77777A           LDB  APPL
      351    16000   411R           CPB  LCKFL      CHECK FOR FLAG ADDRESS AND
      352    42000   357R           JSM  ROWSC          GO SUB ROWSCAN/READ
      353   170700                  RAR  1          ROTATE PATTERN
      354    10016    16A           CPA  C          CHECK IF = STARTING PATTERN
      355   170201                  RET  1              AND RETURN
      356    66000   342R           JMP  PATT2       LOOP BACK
      357    31774 77774A   ROWSC   STA  LIND3
      360     6000     1R           LDB  MAXCT
      361    35775 77775A           STB  LIND2      INIT ROWSCAN LOOP COUNTER
      362     2000   422R           LDA  PAT3
      363     6000   413R   ROWS2   LDB  B2
      364    34011    11A           STB  PA
      365    30005     5A           STA  R5         OUTPUT PATTERN TO KEYROW LINES
      366    30001     1A           STA  B
      367   174501                  SBR  2
      370    77003                  SLB  *+3
      371    44011    11A           ISZ  PA
      372    30006     6A           STA  R6
      373    42000   400R           JSM  READO
      374   170700                  RAR  1          ROTATE PATTERN
      375    55775 77775A           DSZ  LIND2      DECREMENT ROWSCAN LOOP COUNTER
      376    66000   363R           JMP  ROWS2      LOOP BACK IF NOT THROUGH
      377     1774 77774A           LDA  LIND3
      400     5776 77776A   READO   LDB  LIND
      401    26000   423R           ADB  CONST
      402   104001     1A           LDB  B,I
      403    34011    11A           STB  PA
```

```
  404 174503                     SBR 4
  405 104001        1A           LDB B,1        READ INPUT DEVICE FOR THIS LOU
  406  35770    77770A           STB AR1
  407 170201                     RET 1
*
  410                     CNTR   OCT 24
  411                     LCKFL  OCT 15
  412                     B1     OCT 1
  413                     B2     OCT 2
  414                     B4     OCT 4
  415                     B5     OCT 5
  416                     B6     OCT 6
  417                     B17    OCT 17
  420                     PAT1   OCT 177757
  421                     PAT2   OCT 007040
  422                     PAT3   OCT 065200
  423             423R    CONST  DEF *
  424                            OCT 125        COUNTER
  425                            OCT 162        RPG
  426                            OCT 142        KEY COLUMN
  427                            OCT 0          A
    1                     MAXCT  EQU B30
  417                     ATTEN  EQU B17
  420                     STAK2  EQU PAT1
77737                     CM40   EQU 77737B
  430                     DSRAM  DEC 1023
  431                     DSR2   DEC 4095
  432                     DSIC   OCT 7737
77777                     APPL   EQU 77777B
77776                     LIND   EQU 77776B
77775                     LIND2  EQU 77775B
77774                     LIND3  EQU 77774B
77774                            END PWRON
```

```
.DSA    10R      A       0A       APPL    77777A   AR0     77774A
AR0D    3B       AR1     77770A   AR1D    4B       AR2     20A
AR2D    5B       AR3     77764A   AR3D    6B       ATTEN   417R
B       1A       B1      412R     B10     2R       B17     417R
B2      413R     B30     1R       B4      414R     B40     4R
B5      415R     B6      416R     BEG     10R      C       16A
CHK2    67R      CM1     0R       CM40    77737A   CM70    77707A
CNTR    410R     CONST   423R     D       17A      DMAC    14A
DMAMA   15A      DMAPA   13A      DSA     102R     DSR2    431R
DSRAM   430R     DST1    207R     DST2    212R     DST8    237R
DST9    244R     DSTC    432R     EDRAM   153R     EERAM   161R
EMCH    162R     ERR     73R      ETDS    245R     GOIO    331R
HYB2    20R      HYB3    21R      HYC4    27R      HYPT1   3R
IOBEG   273R     IV      10A      LCKFL   411R     LIND    77776A
LIND2   77775A   LIND3   77774A   LOPA    307R     MAXCT   1R
MDSA    76R      NEXTO   322R     P       2A       PA      11A
PARLC   7B       PARTB   10B      PAT1    420R     PAT2    421R
PAT3    422R     PATER   336R     PATT2   342R     PINIT   1X
PWRON   0B       R       3A       R4      4A       R5      5A
R6      6A       R7      7A       RAM     111R     RAMSS   151R
RAMST   150R     RAMT1   121R     RAMT9   152R     RAMTT   131R
RAM1U   133R     READO   400R     ROMCH   44R      ROMMX   5R
ROWS2   363R     ROWSC   357R     SE      24A      SRLC1   6R
SRLC2   7R       STAK2   420R     STLOP   304R     THRU    75R
W       12A
```

KSPMAX=2 MSPMAX=39 NSPMAX=6 SSPMAX=501 DSPMAX=158
KSPMAX=2 MSPMAX=39 NSPMAX=6 SSPMAX=501 DSPMAX=158

APPENDIX B-29

MEMORY MAP

```
DSA    1000    1433      40    50    1000
APR27  1433    34161     50    50    1000
BPCFP  34161   34352     50    50    123
BPCMC  34352   35315     50    50    123
BSRVC  35315   35524     50    50    123
ARRYC  35524   35563     50    50    123
ARRYS  35563   35613     50    50    123
TYPEC  35613   36030     50    50    123
ROUND  36030   36052     50    50    123
DSHFT  36052   36073     50    50    123
SHIFT  36073   36130     50    50    123
TSRBT  36130   36162     50    50    123
TEST   36162   36224     50    50    123
DEQL   36224   36240     50    50    123
CASE   36240   36256     50    50    123
RDWRT  36256   36344     50    50    123
STAC   36344   36347     50    50    123
ANDI   36347   36352     50    50    123
ORT    36352   36355     50    50    123
ATNER  36355   36401     50    50    123
AIPCK  36401   36510     50    50    123
CNVST  36510   36672     50    50    123
TDUMP  36672   37171     50    50    123
VDAVG  37171   37413     50    50    123
BFLT   37413   37650     50    50    123
LINKS: 121 777

.ADDR 35315 353    .AMIN 35033        .ANDT 36347 561
.ARAP 35565        .ARAY 35571 744    .ARGA 35427 776
.ARGL 35423 772    .ARGS 35430 746    .ARGT 36075
.ARRF 35524        .ARRY 35526 217    .BDVF 35164 121
.BDVS 35207 122    .BMIN 35045 443    .CASE 36240 602
.CLAI 35456        .CLAP 35462        .CLBI 35442 540
.CLBP 35446        .CLBV 35447        .CLNP 35464
.CSHV 35466 434    .DEQL 36224 752    .DIVD 34577
```

```
.DIVF  34565        .DLFT  36054  753   .DRGT  36064  755
.DSFI  36053  642   .DSGN  35420  174   .EQL   36227  701
.FADA  37540        .FADB  37544        .FDIG  36052  627
.FDVA  37447        .FDVB  37453        .FIX   37616
.FLT   37523        .FMPA  37413        .FMPB  37417
.FRPB  35321        .LADC  34404        .LDAP  35473  775
.LDBA  35336  624   .LDBI  35331  765   .LDBP  35335  736
.LDSA  35476  743   .LDSI  35501  751   .LDSP  35507
.LRAP  35563        .LRAY  35567  625   .MPYD  34462
.MVE4  35342  504   .NEQL  36234  617   .ORT   36352  615
.R4    36270        .R5    36265  501   .R6    36262  614
.R7    36257  211   .RAR2  35413        .RBIT  36140  606
.RLFT  36123  204   .RRGT  36076        .RS4   36267  330
.RS5   36264  730   .RS6   36261  212   .RS7   36256  702
.RINA  35376  773   .RINB  35370        .RTNI  35372  734
.RINL  35406  631   .SAR2  35361  766   .SBIT  36135
.SLFT  36074  610   .SRGT  36073        .STAC  36344  342
.STAP  35515  735   .STBC  35351  300   .STBP  35353  761
.STRB  35365        .STRD  35355  770   .TBIT  36130  717
.TEST  36162  655   .TURN  36172  707   .UPC4  35436  771
.W4    36273  714   .W5    36277  706   .W6    36303  731
.W7    36311  705   .WS4   36272  727   .WS5   36276  703
.WS6   36302  732   .WS7   36310  677   .WSPS  36314
.WSTP  36322        .WSTR  36326  721   .WSTS  36331  726
ACHAR  36403  430   ADD1   34176  767   ADD1B  34173
ADD1P  34201        ADD1T  34214  756   ADD2   34400  567
ADD2B  34375        ADD2P  34372  570   ADD2T  34403  634
ADD3   35077  467   ADD3B  35074        ADD3P  35071
ADD3T  34403  601   ADD4B  35233  723   ADD4P  35235  665
ADD4T  35240  745   ADUMP  37044  354   APCHR  36401
APN25  36611        AR0D   43           AR1D   44
AR1LD  35011        AR1LN  35015        AR1LP  35021
AR1LT  35026        AR2D   45           AR3D   46
AINER  36355  673   CDB    35771        CNV12  35702  737
CNV13  35671        CNV14  35745  155   CNV15  36510  431
CNV21  35731  742   CNV23  35672  565   CNV24  35746  754
CNV25  36607        CNV31  35731  750   CNV34  35752
CNV41  35730  757   CNV42  35613  652   CNV43  35613  637
CNV45  36606  426   DIV1   34323  747   DIV1B  34321
DIV1P  34317        DIV1T  34325  762   DIV2   34551  566
DIV2B  34541        DIV2P  34537        DIV2T  34543  462
DIV3   35113  572   DIV3B  35111        DIV3P  35107
DIV3T  34543        DIV4   35145  676   DIV4B  35137
DIV4P  35141        DIV41  35143  201   HBUSY  37010  514
HPBSY  37004  433   ICHAR  36440        IHPBT  36721  357
IHP1B  36672  361   IPCH.. 36433        MIN1   34175  ,04
MIN1B  34172        MIN1P  34200        MIN1T  34213
MIN2   34377  613   MIN2B  34374        MIN2P  34371  741
MIN21  34402        MIN3   35076  635   MIN3B  35073
MIN3P  35070        MIN3T  34402        MIN4B  35271
MIN4P  35265  733   MIN4T  35273        MOD2   34563  543
MOD2B  34555        MOD2P  34553        MOD2T  34557
MOD3   35121        MOD3B  35117        MOD3P  35115
MOD3T  34557        MOD4   35131  653   MOD4B  35123
MOD4P  35125        MOD4T  35127        MPY1   34274  763
MPY1B  34272        MPY1P  34270  760   MPY1T  34276  740
MPY2   34460  564   MPY2B  34450        MPY2P  34446
MPY2T  34452  531   MPY3   35105  636   MPY3B  35103
MPY3P  35101        MPY3T  34452        MPY4B  35243
MPY4P  35245  715   MPY4T  35251  671   PARTB  50
PCHAR  36407        PDUMP  37054  351   PINIT  1433
ROUND  36030  503   SDUMP  37070  130   STHPB  36755  427
SUB1   34161        SUB1B  34164        SUB1P  34166
SUB1T  34170  152   SUB2   34360  573   SUB2B  34363
SUB2P  34365  526   SUB2T  34367  641   SUB3   35061  177
SUB3B  35064        SUB3P  35066        SUB3T  34367
SUB4B  35261  256   SUB4P  35254  656   SUB4I  35263  661
TDUMP  37056  352   VDAVG  37171  164   VDSUB  37346  165
WEOI   37034  435   WHPIB  37040  436
KSPMAX=1 MSPMAX=17 NSPMAX=0 SSPMAX=1617 BSPMAX=230 ESPMAX=418
FSPMAX=3 LSPMAX=231 XSPMAX=0
```

APPEN… B-30

MAIN CONTROL PROGRAM

```
ASMB,L,R
                   HED
                   NAM  APR27,3
         0              ENT  PINIT
         0              EXT  AR0D,AR1D,AR2D,AR3D
         0         A    EQU  0
         1         B    EQU  1
         2         P    EQU  2
         3         R    EQU  3
         4         R4   EQU  4
         5         R5   EQU  5
         6         R6   EQU  6
         7         R7   EQU  7
        10         IV   EQU  10B
        11         PA   EQU  11B
        12         W    EQU  12B
        13         DMAPA EQU 13B
        14         DMAC EQU  14B
        15         DMAMA EQU 15B
        16         C    EQU  16B
        17         D    EQU  17B
     77763         E    EQU  77763B
        20         AR2  EQU  20B
        24         SE   EQU  24B
     77774         AR0  EQU  77774B
```

```
     77770                         AR1    EQU 77770B
     77764                         AR3    EQU 77764B
         0   2000      566R        PINIT LDA =B76000
         1  30003        3A              STA R
         2   2000      567R              LDA =B76100
         3  30016       16A              STA C
         4  31763    77763A              STA E
         5  66000        6R              JMP ANFNG
         6                         ANFNG EQU *
     77746                         V32742 EQU 32742   N
     77742                         V32738 EQU 32738   X
     77741                         V32737 EQU 32737   IY
        20                         V1   EQU 20B AR2
     77740                         V32736 EQU 32736   EFLAG
     77737                         V32735 EQU 32735   BLKS
        15                         V2   EQU 15B DMAMA
     77736                         V32734 EQU 32734   ETX
     77735                         V32733 EQU 32733   HPIB
     77734                         V32732 EQU 32732   CMOS
         6  66000    24714R          JMP A3
         7           77665A        V4 DEF T32693 MSTATE
        10                         K5   OC1 177777   177777
        11                         N6   DEC 39   39
     77665                         T32693 EQU 32693
     77661                         V32689 EQU 32689   LTEMP1
     77655                         V32685 EQU 32685   LTEMP2
     77651                         V32681 EQU 32681   LTEMP
     77713                         V7   EQU T32693+22 FSTEP
     77645                         V32677 EQU 32677   MFREQ
     77641                         V32673 EQU 32673   VTOFREQ
     77635                         V32669 EQU 32669   CFREST
     77631                         V32665 EQU 32665   FPILOT
     77665                         V8   EQU T32693   CFREQ
     77671                         V9   EQU T32693+4   SPAN
     77724                         V10  EQU T32693+31 AMF
     77625                         V32661 EQU 32661   CSIGNL
     77707                         V11  EQU T32693+18 FOFSET
     77621                         V32657 EQU 32657   MANT
         3                         V12  EQU 3 RPTR
        16                         V13  EQU 16B CPTR
     77763                         V14  EQU 77763B   EPTR
     77620                         V32656 EQU 32656   PREFIX
     77617                         V32655 EQU 32655   DECFLG
     77616                         V32654 EQU 32654   XFLAG
     77675                         V15  EQU T32693+8   BLEDS
     77676                         V16  EQU T32693+9   TLEDS
     77677                         V17  EQU T32693+10 RFAT
     77731                         V18  EQU T32693+36 SINDEX
     77732                         V19  EQU T32693+37 STIM
     77733                         V20  EQU T32693+38 FSTIM
     77703                         V21  EQU T32693+14 STRIG
     77700                         V22  EQU T32693+11 RLVL
     77701                         V23  EQU T32693+12 RVBW
     77702                         V24  EQU T32693+13 VIDCON
     77721                         V25  EQU T32693+28 MRKR
     77723                         V26  EQU T32693+30 MKRMODE
     77720                         V27  EQU T32693+27 AMLVL
     77717                         V28  EQU T32693+26 AMKR
     77722                         V29  EQU T32693+29 MKRLVL
     77730                         V30  EQU T32693+35 KFLAG
     77706                         V31  EQU T32693+17 ROFSET
     77705                         V32  EQU T32693+16 THRESH
     77704                         V33  EQU T32693+15 LEVLIN
     77615                         V32653 EQU 32653   DAC1
     77614                         V32652 EQU 32652   DAC2
     77613                         V32651 EQU 32651   DAC4
     77612                         V32650 EQU 32650   NCHR
     77611                         V32649 EQU 32649   CHRC
     77610                         V32648 EQU 32648   ALIM
     77607                         V32647 EQU 32647   ACNT
     77606                         V32646 EQU 32646   SRCEID
     77605                         V32645 EQU 32645   SCANSL
     77604                         V32644 EQU 32644   SATN
     77603                         V32643 EQU 32643   PLOCK
     77602                         V32642 EQU 32642   LKMSK
     77601                         V32641 EQU 32641   HPBC
     77600                         V32640 EQU 32640   CTIM
     77577                         V32639 EQU 32639   CIBASE
     77656                         V34  EQU V32685+1   BCDA
     77657                         V35  EQU V32685+2   BCDB
     77660                         V36  EQU V32685+3   BCDC
     77576                         V32638 EQU 32638   RPGPTR
     77575                         V32637 EQU 32637   K
     77574                         V32636 EQU 32636   RPG
     77573                         V32635 EQU 32635   I
     77572                         V32634 EQU 32634   J
     77571                         V32633 EQU 32633   L
     77570                         V32632 EQU 32632   M
     77567                         V32631 EQU 32631   KEYCOL
     77566                         V32630 EQU 32630   KEYCODE
     77565                         V32629 EQU 32629   SRQEN
     77564                         V32628 EQU 32628   RPGCNT
     77563                         V32627 EQU 32627   DSTAD
        12           77473A        V37 DEF T32571   BWFRQ
        13                           OCT 177777   177777
        14                         K38 OCT 70   70
     77473                         T32571 EQU 32571
        15           77436A        V39 DEF T32542   BWAMP
        16                           OCT 177777   177777
        17                         N40 DEC 29   29
```

```
77436     T32542 EQU 32542
77473     V41 EQU T32571   KK
77474     V42 EQU T32571+1   KL
77475     V43 EQU T32571+2   KM
77476     V44 EQU T32571+3   KN
77435     V32541 EQU 32541   IF1
77434     V32540 EQU 32540   IF2
77433     V32539 EQU 32539   GIN1
77432     V32538 EQU 32538   GIN2
77431     V32537 EQU 32537   RPGSwP
77430     V32536 EQU 32536   SLEN
77713     V45 EQU T32693+22 ALIMSV
77671     V46 EQU T32693+4   CTBSV
77665     V47 EQU T32693   GIN1SV
77707     V48 EQU T32693+18 GIN2SV
77724     V49 EQU T32693+31 EFLGSV
77427     V32535 EQU 32535   AS
   20     T50 EQU *
   20     N51 DEC 2208   2208
   21     N52 DEC 128 128
   22     N53 DEC 0 0
   23     N54 DEC 2240   2240
   24     N55 DEC 432 432
   25       DEC 0 0
   26     N56 DEC 2272   2272
   27     N57 DEC 768 768
   30       DEC 0 0
   31     N58 DEC 2304   2304
   32     N59 DEC 336 336
   33     N60 DEC 960 960
   34     N61 DEC 2336   2336
   35     N62 DEC 80  80
   36       DEC 960 960
   37     N63 DEC 2368   2368
   40       DEC 0 0
   41     N64 DEC 896 896
   42     N65 DEC 2400   2400
   43       DEC 0 0
   44     N66 DEC 32  32
   45     N67 DEC 2432   2432
   46     N68 DEC 800 800
   47       DEC 32  32
   50       DEC 2400   2400
   51       DEC 0 0
   52       DEC 32  32
   53       DEC 2432   2432
   54     N69 DEC 704 704
   55       DEC 32  32
   56     N70 DEC 2976   2976
   57     N71 DEC 144 144
   60     N72 DEC 608 608
   61     N73 DEC 2688   2688
   62       DEC 80  80
   63     N74 DEC 992 992
   64     N75 DEC 3008   3008
   65       DEC 0 0
   66     N76 DEC 2560   2560
   67     N77 DEC 2496   2496
   70       DEC 0 0
   71     N78 DEC 640 640
   72     N79 DEC 2528   2528
   73       DEC 0 0
   74     N80 DEC 192 192
   75       DEC 2368   2368
   76       DEC 0 0
   77       DEC 896 896
  100     N81 DEC 2592   2592
  101     N82 DEC 816 816
  102       DEC 960 960
  103       DEC 2560   2560
  104     N83 DEC 720 720
  105       DEC 992 992
  106       DEC 2560   2560
  107     N84 DEC 656 656
  110       DEC 992 992
  111       DEC 2560   2560
  112       DEC 720 720
  113       DEC 992 992
  114       DEC 2560   2560
  115       DEC 704 704
  116       DEC 992 992
  117       DEC 2560   2560
  120       DEC 640 640
  121       DEC 992 992
  122       DEC 2560   2560
  123       DEC 704 704
  124       DEC 992 992
  125     N85 DEC 2752   2752
  126     N86 DEC 832 832
  127       DEC 768 768
  130     N87 DEC 2768   2768
  131       DEC 832 832
  132     N88 DEC 864 864
  133     N89 DEC 2784   2784
  134       DEC 832 832
  135       DEC 832 832
  136     N90 DEC 2800   2800
  137       DEC 832 832
  140       DEC 800 800
  141     N91 DEC 2816   2816
```

```
142                DEC 832 832
143              N92 DEC 928 928
144              N93 DEC 2832  2832
145                DEC 832 832
146                DEC 704 704
147              N94 DEC 2848  2848
150                DEC 832 832
151              N95 DEC 736 736
152              N96 DEC 2864  2864
153                DEC 832 832
154                DEC 896 896
155              N97 DEC 2656  2656
156                DEC 0 0
157              N98 DEC 480 480
160              N99 DEC 2960  2960
161                DEC 832 832
162              N100  DEC 672 672
163              N101  DEC 2464  2464
164                DEC 0 0
165                DEC 768 768
166              N102  DEC 2624  2624
167              N103  DEC 368 368
170                DEC 32  32
171              N104  DEC 2880  2880
172              N105  DEC 16  16
173                DEC 960 960
174              N106  DEC 2384  2384
175                DEC 0 0
176                DEC 832 832
177              N107  DEC 2944  2944
200                DEC 0 0
201              N108  DEC 352 352
202              N109  DEC 2192  2192
203                DEC 0 0
204              N110  DEC 288 288
205              N111  DEC 2176  2176
206                DEC 832 832
207                DEC 640 640
210        20R   V112 DEF T50  SFTXY
211                OCT 177777  177777
212              K113  OCT 170 170
77426            V32534 EQU 32534  UFLAG
152              V114  EQU T50+90  UNCALAD
213     77005A   V115 DEF T32261 ASAVE
214              K116  OCT 177776  177776
215              N117  DEC 7 7
216                DEC 39  39
77005            T32261 EQU 32261
217              T118 EQU *
217       570R     DEF ="RES BW"
220       574R     DEF ="VBW"
221       577R     DEF ="SWP"
222       602R     DEF ="ATTEN"
223       606R     DEF ="REF"
224       611R     DEF =" "
225       613R     DEF ="CENTER"
226       617R     DEF ="SPAN"
227       622R     DEF ="START"
230       626R     DEF ="STOP"
231       631R     DEF ="STEP"
232       634R     DEF =" "
233       634R     DEF =" "
234       636R     DEF ="DL"
235       640R     DEF ="TH"
236       642R     DEF ="LINEAR"
237       634R     DEF =" "
240       646R     DEF ="MKR "
241       651R     DEF ="MKR    "
242       646R     DEF ="MKR "
243       655R     DEF ="CNTR "
244       661R     DEF ="CNTR    "
245       655R     DEF ="CNTR "
246       666R     DEF ="YTO UNLOCK "
247       675R     DEF ="249 UNLOCK "
250       704R     DEF ="275 UNLOCK "
251       713R     DEF ="OVEN COLD "
252       721R     DEF ="EXT REF "
253       726R     DEF ="VTO UNCAL "
254       734R     DEF ="YTO ERROR "
255       742R     DEF ="MEAS UNCAL"
256       750R     DEF ="VID AVG "
257       755R     DEF ="SRQ "
260       760R     DEF ="OFFSET"
261       760R     DEF ="OFFSET"
262       634R     DEF =" "
263       634R     DEF =" "
264       764R     DEF ="2nd LO "
265       771R     DEF ="CORR'D"
266       775R     DEF ="BATTERY "
267       217R   V119 DEF T118 SFTAB
270                OCT 177777  177777
271              K120  OCT 50  50
272              T121 EQU *
272       570R     DEF ="RES BW"
273      1002R     DEF ="VIDEO BW"
274      1007R     DEF ="SWEEPTIME"
275      1015R     DEF ="RF ATTEN"
276      1022R     DEF ="REF LEVEL"
277      1030R     DEF ="LOG"
300       613R     DEF ="CENTER"
```

```
301    617R      DEF ="SPAN"
302    622R      DEF ="START"
303    626R      DEF ="STOP"
304   1033R      DEF ="CF STEP"
305   1040R      DEF ="TITLE:"
306   1044R      DEF ="DACS"
307   1047R      DEF ="DISPLAY LINE"
310   1056R      DEF ="THRESHOLD"
311    634R      DEF =" "
312    634R      DEF =" "
313   1064R      DEF ="MARKER"
314   1070R      DEF ="MARKER  "
315   1075R      DEF ="MARKER ZOOM"
316   1104R      DEF ="COUNTER"
317   1111R      DEF ="COUNTER  "
320   1117R      DEF ="COUNTER ZOOM"
321   1126R      DEF ="SAVE: REG"
322   1134R      DEF ="RECALL: REG"
323   1143R      DEF ="HP-IB ADRS: "
324   1152R      DEF ="ENTRY"
325    634R      DEF =" "
326   1156R      DEF ="PREAMP GAIN"
327   1165R      DEF ="SAVE LOCK"
330   1173R      DEF ="COUNTER RESOLN"
331    750R      DEF ="VID AVG "
332    634R      DEF =" "
333   1203R      DEF ="REF LVL OFFSET"
334   1213R      DEF ="FREQ OFFSET"
335   1222R      DEF ="SIGNAL IF"
336   1230R      DEF ="PILOT IF"
337   1235R      DEF ="VTO"
340   1240R      DEF ="SWEEP GEN"
341   1246R      DEF ="DSPL ADRS"
342   1254R      DEF ="WRITE:"
343   1260R      DEF ="MIXER LEVEL"
344   1267R      DEF ="DSPL ADRS INCR"
345    272R    V122 DEF T121 AFTAB
346                OCT 177777  177777
347            K123  OCT 53  53
350            T124 EQU *
350            K125  OCT 173776  173776
351            N126  DEC 1035  1035
352            N127  DEC 2060  2060
353                DEC 0 0
354            N128  DEC 1163  1163
355            N129  DEC 2085  2085
356            K130  OCT 173771  173771
357                DEC 1035  1035
360                DEC 2060  2060
361                DEC 0 0
362                DEC 1163  1163
363                DEC 2085  2085
364            K131  OCT 173764  173764
365                DEC 1035  1035
366            N132  DEC 2065  2065
367                DEC 0 0
370                DEC 1163  1163
371            N133  DEC 2100  2100
372            K134  OCT 173757  173757
373            K135  OCT 2002  2002
374                DEC 0 0
375            N136  DEC 2548  2548
376            K137  OCT 2001  2001
377            N138  DEC 216 216
400                OCT 2002  2002
401            N139  DEC 500 500
402            N140  DEC 2048  2048
403                OCT 2001  2001
404            N141  DEC 217 217
405                OCT 2002  2002
406            N142  DEC 1000  1000
407                DEC 2548  2548
410                OCT 2001  2001
411                DEC 216 216
412                DEC 1035  1035
413            N143  DEC 2152  2152
414            K144  OCT 173733  173733
415            K145  OCT 2202  2202
416            K146  OCT 4004  4004
417            K147  OCT 1774  1774
420                OCT 4004  4004
421            N148  DEC 4 4
422            K149  OCT 5774  5774
423                DEC 4 4
424                OCT 5774  5774
425                OCT 1774  1774
426            N150  DEC 1227  1227
427            K151  OCT 173714  173714
430            K152  OCT 2022  2022
431            K153  OCT 5750  5750
432                DEC 0 0
433            K154  OCT 4030  4030
434                DEC 0 0
435                OCT 5750  5750
436                DEC 0 0
437                OCT 4030  4030
440                DEC 0 0
441                DEC 1227  1227
442            K155  OCT 173675  173675
443                OCT 2002  2002
```

```
444        DEC 0 0
445        DEC 2048  2048
446       K156  OCT 3005  3005
447        OCT 2002  2002
450        OCT 5750  5750
451        DEC 0 0
452        DEC 2048  2048
453       N157  DEC 2148  2148
454        OCT 4030  4030
455        DEC 0 0
456        DEC 2048  2048
457        DEC 2148  2148
460       N158  DEC 1099  1099
461        DEC 1035  1035
462       N159  DEC 2119  2119
463        OCT 2002  2002
464        OCT 5750  5750
465        DEC 0 0
466        DEC 2048  2048
467        DEC 2048  2048
470        DEC 2048  2048
471       N160  DEC 24  24
472        OCT 3005  3005
473        OCT 2002  2002
474       K161  OCT 5634  5634
475        DEC 2048  2048
476        DEC 2048  2048
477       K162  OCT 1750  1750
500        OCT 5634  5634
501        DEC 2048  2048
502        DEC 2048  2048
503        DEC 24  24
504        DEC 1099  1099
505        DEC 1035  1035
506       N163  DEC 2139  2139
507        DEC 1227  1227
510       K164  OCT 173630  173630
511        OCT 2002  2002
512        DEC 1163  1163
513       N165  DEC 2115  2115
514       K166  OCT 173610  173610
515        OCT 2001  2001
516       K167  OCT 3777  3777
517       K168  OCT 2522  2522
520        DEC 0 0
521       N169  DEC 2695  2695
522       K170  OCT 2501  2501
523       N171  DEC 200 200
524       N172  DEC 208 208
525       K173  OCT 172100  172100
526       K174  OCT 2402  2402
527        DEC 16  16
530        DEC 2496  2496
531       K175  OCT 2401  2401
532       K176  OCT 176000  176000
533       K127  OCT 2060  2060
534       K177  OCT 174000  174000
535       N178  DEC 1027  1027
536       K179  OCT 172000  172000
537       K180  OCT 2024  2024
540  350R V181 DEF T124 GRATCL
541        OCT 177777  177777
542        OCT 170 170
543       T182 EQU *
543       B183  HEX 10  10
544       B184  HEX 15  15
545       B185  HEX 20  20
546       B186  HEX 30  30
547       B120  HEX 50  50
550       B187  HEX 75  75
551       B188  HEX 99  99
552  543R V189 DEF T182 LGTB
553        OCT 177777  177777
554       K117  OCT 7 7
555        EXT VDAVG
  0    5X P196  EQU VDAVG
555        EXT VDSUB
  0    6X P197  EQU VDSUB
555        EXT ATNER
  0    7X P198  EQU ATNER
555        EXT ACHAR
  0   10X P199  EQU ACHAR
555        EXT CNV15
  0   11X P200  EQU CNV15
555        EXT CNV45
  0   12X P201  EQU CNV45
555        EXT STHPB
  0   13X P202  EQU STHPB
555        EXT HPBSY
  0   14X P203  EQU HPBSY
555        EXT HBUSY
  0   15X P204  EQU HBUSY
555        EXT WEDI
  0   16X P205  EQU WEDI
555        EXT WHPIB
  0   17X P206  EQU WHPIB
555        EXT PDUMP
  0   20X P207  EQU PDUMP
555        EXT TDUMP
  0   21X P208  EQU TDUMP
555        EXT ADUMP
```

```
   0               22X  P209   EQU ADUMP
 555                       EXT SDUMP
   0               23X  P210   EQU SDUMP
 555                       EXT IHPIB
   0               24X  P211   EQU IHPIB
 555                       EXT IHPBT
   0               25X  P212   EQU IHPBT
 555                       EXT ROUND
   0               26X  P213   EQU ROUND
 555                    P215   EQU * SKEY
 555    6000     1277R     LDB =D-1
 556   42000       27X     JSX .ARGA
 557    1676   77676A      LDA V16 TLEDS
 560   62000     1300R     IOR =B1000
 561   31676   77676A      STA V16 TLEDS
 562    6000     1301R     LDB =D-3   N
 563   42000       30X     JSX .LDAP
 564   42000    15546R     JSM P214   KEY
 565   66000       31X     JMX .RINA
 566   76000
 567   76100
 570 RES BW
 574 VBW
 577 SWP
 602 ATTEN
 606 REF
 611
 613 CENTER
 617 SPAN
 622 START
 626 STOP
 631 STEP
 634
 636 DL
 640 TH
 642 LINEAR
 646 MKR
 651 MKR
 655 CNTR
 661 CNTR
 666 YTO UNLOCK
 675 249 UNLOCK
 704 275 UNLOCK
 713 OVEN COLD
 721 EXT REF
 726 VTO UNCAL
 734 YTO ERROR
 742 MEAS UNCAL
 750 VID AVG
 755 SRQ
 760 OFFSET
 764 2nd LO
 771 CORR'D
 775 BATTERY
1002 VIDEO BW
1007 SWEEPTIME
1015 RF ATTEN
1022 REF LEVEL
1030 LOG
1033 CF STEP
1040 TITLE:
1044 DACS
1047 DISPLAY LINE
1056 THRESHOLD
1064 MARKER
1070 MARKER
1075 MARKER ZOOM
1104 COUNTER
1111 COUNTER
1117 COUNTER ZOOM
1126 SAVE: REG
1134 RECALL: REG
1143 HP-IB ADRS:
1152 ENTRY
1156 PREAMP GAIN
1165 SAVE LOCK
1173 COUNTER RESOLN
1203 REF LVL OFFSET
1213 FREQ OFFSET
1222 SIGNAL IF
1230 PILOT IF
1235 VTO
1240 SWEEP GEN
1246 DSPL ADRS
1254 WRITE:
1260 MIXER LEVEL
1267 DSPL ADRS INCR
1277 177777
1300   1000
1301 177775
 566                       LIT
1302                    P224   EQU * LOG
1302    6000     1363R     LDB =D-4
1303   42000       32X     JSX .ARGL
1304   42000       33X     JSX .UPC4
1305   42000       34X     JSX .STRD
1306           77742A      DEF V32738   X
1307    1742   77742A      LDA V32738   IX
1310 170405                AAR 6
1311   22000     1277R     ADA =D-1
```

```
1312  31741   77741A    STA V32737  IY
1313   2000    1364R    LDA =B100
1314  31742   77742A    STA V32738  IX
1315  30020      20A    STA V1  AR2
1316  42000      35X    JSX ADD1
1317           1365R    DEF =F3.1622776
1320  42000      36X    JSX .SAR2
1321  42000      37X    JSX .LDBI
1322           1365R    DEF =F3.1622776
1323  42000      40X    JSX MIN1
1324          77742A    DEF V32738  X
1325  42000      41X    JSX MPY1
1326           1371R    DEF =F1.924950591
1327  42000      42X    JSX DIV11
1330  42000      34X    JSX .STRD
1331          77742A    DEF V32738  X
1332  42000      41X    JSX MPY1
1333          77742A    DEF V32738  X
1334   6000    1375R    LDB =D-9   T
1335  42000      43X    JSX .STBP
1336  42000      41X    JSX MPY1
1337           1376R    DEF =F2.150025358@-3
1340  42000      35X    JSX ADD1
1341           1402R    DEF =F5.826876607@-3
1342   6000    1375R    LDB =D-9   T
1343  42000      44X    JSX MPY1P
1344  42000      35X    JSX ADD1
1345           1406R    DEF =F4.081138976@-2
1346   6000    1375R    LDB =D-9   T
1347  42000      44X    JSX MPY1P
1350  42000      35X    JSX ADD1
1351           1412R    DEF =F4.512095170@-1
1352  42000      41X    JSX MPY1
1353          77742A    DEF V32738  X
1354  42000      35X    JSX ADD1
1355           1416R    DEF =F.5
1356  42000      36X    JSX .SAR2
1357   1741   77741A    LDA V32737  IY
1360  42000      45X    JSX CNV41
1361  42000      46X    JSX ADD1T
1362  66000      31X   JMX .RTNA
1363 177774
1364    100
1365 3.1622776
1371 1.924950591
1375 177767
1376 2.150025358@-3
1402 5.826876607@-3
1406 4.081138976@-2
1412 4.512095170@-1
1416     .5
1363                    LIT
1422                   P225  EQU * FIX
1422   1742   77742A    LDA V32738  IX
1423 170405             AAR 6
1424  31741   77741A    STA V32737  IY
1425 170040             TCA
1426 172032            SAP A226
1427   1741   77741A    LDA V32737  IY
1430 170040             TCA
1431  22000    1456R    ADA =D12
1432  70540             PWC A
1433  42000      37X    JSX .LDBI
1434          77742A    DEF V32738  XL
1435  70761             WWC B
1436  42000      47X    JSX .DRGT
1437  42000      50X    JSX CNV24
1440  31741   77741A    STA V32737  IY
1441   1742   77742A    LDA V32738  IX
1442 170405             AAR 6
1443  70540             PWC A
1444  42000      37X    JSX .LDBI
1445          77742A    DEF V32738  XL
1446  70761             WWC B
1447  42000      51X    JSX .DLFT
1450  42000      34X    JSX .STRD
1451          77742A    DEF V32738  XL
1452   1742   77742A    LDA V32738  IX
1453  52000    1457R    AND =D1
1454  31742   77742A    STA V32738  IX
1455  66000    1462R    JMP A227
1456     14
1457      1
1456                    LIT
1460                   A226 EQU *
1460   2000    1463R    LDA =D0
1461  31741   77741A    STA V32737  IY
1462                   A227 EQU *
1462 170201             RET 1
1463      0
1463                    LIT
1464                   P228  EQU * PWR10
1464   6000    1363R    LDB =D-4
1465  42000      32X    JSX .ARGL
1466  42000      33X    JSX .UPC4
1467  42000      34X    JSX .STRD
1470          77742A    DEF V32738  X
1471  42000    1422R    JSM P225  FIX
1472   1741   77741A    LDA V32737  IY
1473  70540             PWC A
```

```
1474  42000      37X     JSX .LDBI
1475          77742A     DEF V32738  X
1476  42000      41X     JSX MPY1
1477           1512R     DEF =F2.302585093
1500  42000      34X     JSX .STRD
1501          77742A     DEF V32738  X
1502  42000      52X     JSX .DEQL
1503 172013             SAP A229
1504  42000      53X     JSX .LDSI
1505           1457R     DEF =D1
1506  42000      54X     JSX CNV31
1507  42000      34X     JSX .STRD
1510          77742A     DEF V32738  X
1511  66000    1632R     JMP A230
1512 2.302585093
1512                      LIT
1516                    A229 EQU *
1516  42000    1422R     JSM P225  FIX
1517  42000      37X     JSX .LDBI
1520           1565R     DEF =F8.680555550-3
1521  42000      41X     JSX MPY1
1522          77742A     DEF V32738  X
1523  42000      35X     JSX ADD1
1524           1571R     DEF =F4.3750-2
1525  42000      41X     JSX MPY1
1526          77742A     DEF V32738  X
1527  42000      35X     JSX ADD1
1530           1575R     DEF =F1.6649305560-1
1531  42000      41X     JSX MPY1
1532          77742A     DEF V32738  X
1533  42000      35X     JSX ADD1
1534           1601R     DEF =F.4992181875
1535  42000      41X     JSX MPY1
1536          77742A     DEF V32738  X
1537  42000      35X     JSX ADD1
1540           1605R     DEF =F1.000021701
1541  42000      41X     JSX MPY1
1542          77742A     DEF V32738  X
1543  42000      35X     JSX ADD1
1544           1611R     DEF =F1.000043403
1545  42000      34X     JSX .STRD
1546          77742A     DEF V32738  X
1547                    A231 EQU *
1547   1741   77741A     LDA V32737  IY
1550  72002              RZA *+2
1551  66000    1632R     JMP A232
1552 172402              SAM *+2
1553  66000    1621R     JMP A233
1554  42000      37X     JSX .LDBI
1555          77742A     DEF V32738  X
1556  42000      55X     JSX DIV1
1557           1615R     DEF =F2.718281828
1560  42000      34X     JSX .STRD
1561          77742A     DEF V32738  X
1562  45741   77741A     ISZ V32737  IY
1563                     NOP
1564  66000    1631R     JMP A234
1565 8.680555550-3
1571 4.3750-2
1575 1.6649305560-1
1601 .4992181875
1605 1.000021701
1611 1.000043403
1615 2.718281828
1565                      LIT
1621                    A233 EQU *
1621  42000      37X     JSX .LDBI
1622          77742A     DEF V32738  X
1623  42000      41X     JSX MPY1
1624           1615R     DEF =F2.718281828
1625  42000      34X     JSX .STRD
1626          77742A     DEF V32738  X
1627  55741   77741A     DSZ V32737  IY
1630                     NOP
1631                    A234 EQU *
1631  66000    1547R     JMP A231
1632                    A232 EQU *
1632                    A230 EQU *
1632  70760              WWC A
1633  31741   77741A     STA V32737  IY
1634 170605              SAL 6
1635  21742   77742A     ADA V32738  IX
1636  31742   77742A     STA V32738  IX
1637  30020      20A     STA V1  AR2
1640  42000      37X     JSX .LDBI
1641          77742A     DEF V32738  X
1642  66000      31X    JMX .RTNA
1643                    T235 EQU *
1643                     DEC 0 0
1644                    N236  DEC 57  57
1645                    N237  DEC 470 470
1646                    N238  DEC 545 545
1647                    N239  DEC 1070  1070
1650                    N240  DEC 1145  1145
1651           1643R    V241 DEF T235 RLADJ
1652                     OCT 177777  177777
1653                    K242  OCT 6 6
1654                    T243 EQU *
1654                    B53 HEX 0 0
1655                    B236  HEX 57  57
```

```
1656                     B237  HEX 470 470
1657                     B238  HEX 545 545
1660                     B239  HEX 1070  1070
1661                     B240  HEX 1145  1145
1662            1654R    V244 DEF T243 RLADJB
1663                       OCT 177777  177777
1664                       OCT 6 6
1665                     P245  EQU * RLAD
1665 174517                CLB
1666  42000       56X      JSX .ARGS
1667  44016       16A      ISZ C
1670   1730    77730A      LDA V30 KFLAG
1671 170513                SAR 12
1672  52000     1457R      AND =D1
1673  70540                PWC A
1674   1730    77730A      LDA V30 KFLAG
1675 170514                SAR 13
1676  52000     1704R      AND =D6
1677  42000       57X      JSX ADD4T
1700  22000     1457R      ADA =D1
1701  42000       60X      JSX .ARAY
1702            1651R      DEF V241   RLADJ
1703  66000       31X     JMX .RTNA
1704      6
1704                      LIT
1705                     P246  EQU * DBSHFT
1705   6000     1363R      LDB =D-4
1706  42000       32X      JSX .ARGL
1707  42000       33X      JSX .UPC4
1710   1675    77675A      LDA V15 BLEDS
1711 170140                CMA
1712 170501                SAR 2
1713  52000     1457R      AND =D1
1714  70540                PWC A
1715  70761                WWC B
1716  42000       47X      JSX .DRGT
1717  66000       31X     JMX .RTNA
1720                     P247  EQU * DBFIX
1720 174517                CLB
1721  42000       56X      JSX .ARGS
1722  42000       33X      JSX .UPC4
1723   1730    77730A      LDA V30 KFLAG
1724 170514                SAR 13
1725  52000     1704R      AND =D6
1726  22000     1457R      ADA =D1
1727  42000       60X      JSX .ARAY
1730            1662R      DEF V244   RLADJB
1731  42000       61X      JSX .LDSA
1732   2000     1463R      LDA =D0
1733  75541                MLY
1734  42000     1705R      JSM P246   DBSHFT
1735  66000       31X     JMX .RTNA
1736                     P248  EQU * NANOV
1736   6000     1363R      LDB =D-4
1737  42000       32X      JSX .ARGL
1740  42000       33X      JSX .UPC4
1741  42000       53X      JSX .LDSI
1742            1770R      DEF =H2000
1743  42000     1705R      JSM P246   DBSHFT
1744  42000       62X      JSX CNV21
1745  42000       36X      JSX .SAR2
1746  42000     1720R      JSM P247   DBFIX
1747   6000     1375R      LDB =D-9   D
1750  42000       63X      JSX MIN2P
1751  42000       62X      JSX CNV21
1752  42000       42X      JSX DIV1T
1753  42000     1464R      JSM P228   PWR10
1754  42000       36X      JSX .SAR2
1755   1730    77730A      LDA V30 KFLAG
1756 170602                SAL 3
1757 172004               SAP A249
1760  42000       37X      JSX .LDBI
1761            1771R      DEF =F273.8606
1762  66000     1765R      JMP A250
1763                     A249 EQU *
1763  42000       37X      JSX .LDBI
1764            1775R      DEF =F223.606
1765                     A250 EQU *
1765  42000       64X      JSX MPY1T
1766  42000       65X      JSX CNV12
1767  66000       31X     JMX .RTNA
1770  20000
1771 273.8606
1775 223.606
1770                      LIT
2001                     P251  EQU * DBM
2001   6000     1363R      LDB =D-4
2002  42000       32X      JSX .ARGL
2003  42000       33X      JSX .UPC4
2004  42000       53X      JSX .LDSI
2005            1770R      DEF =H2000
2006  42000     1705R      JSM P246   DBSHFT
2007  42000       62X      JSX CNV21
2010  42000       36X      JSX .SAR2
2011   1730    77730A      LDA V30 KFLAG
2012 170602                SAL 3
2013 172004               SAP A252
2014  42000       37X      JSX .LDBI
2015            1771R      DEF =F273.8606
2016  66000     2021R      JMP A253
```

```
2017                     A252 EQU *
2017  42000      37X       JSX .LDBI
2020           1775R       DEF =F223.606
2021                     A253 EQU *
2021  42000      36X       JSX .SAR2
2022   6000    1375R       LDB =D-9  NV
2023  42000      66X       JSX .LDBP
2024  42000      52X       JSX .DEQL
2025 172004               SAP A254
2026  42000      53X       JSX .LDSI
2027           1457R       DEF =D1
2030  66000    2031R       JMP A255
2031                     A254 EQU *
2031                     A255 EQU *
2031  42000      62X       JSX CNV21
2032  42000      42X       JSX DIV1T
2033  42000    1302R       JSM P224  LOG
2034  42000      64X       JSX MPY1T
2035  42000      36X       JSX .SAR2
2036  42000    1720R       JSM P247  DBFIX
2037  42000      62X       JSX CNV21
2040  42000      46X       JSX ADD1T
2041  42000      65X       JSX CNV12
2042  66000      31X       JMX .RTNA
2043                     P256  EQU * DLIMIT
2043   6000    2066R       LDB =D-8
2044  42000      32X       JSX .ARGL
2045  42000      33X       JSX .UPC4
2046   6000    1375R       LDB =D-9  A
2047  42000      30X       JSX .LDAP
2050  73004               SLA A257
2051  42000      53X       JSX .LDSI
2052           1463R       DEF =D0
2053  66000    2065R       JMP A258
2054                     A257 EQU *
2054   6000    2067R       LDB =D-17 LIM
2055  42000      63X       JSX MIN2P
2056   4020      20A       LDB AR2
2057  77004               SLB A259
2060   6000    2067R       LDB =D-17 LIM
2061  42000      66X       JSX .LDBP
2062  66000    2065R       JMP A260
2063                     A259 EQU *
2063   6000    1375R       LDB =D-9  A
2064  42000      66X       JSX .LDBP
2065                     A260 EQU *
2065                     A258 EQU *
2065  66000      31X       JMX .RTNA
2066 177770
2067 177757
2066                       LIT
2070                     P261  EQU * IFBW
2070 174517                CLB
2071  42000      56X       JSX .ARGS
2072  44016      16A       ISZ C
2073   1434   77434A       LDA V32540   IF2
2074 170513               SAR 12
2075   6000    2107R       LDB =D3 IFBW
2076  42000      67X       JSX .STAP
2077 170040                TCA
2100  22000    1704R       ADA =D6
2101 172005               SAP A262
2102   6000    2107R       LDB =D3 IFBW
2103  42000      30X       JSX .LDAP
2104  22000    2110R       ADA =D-2
2105  66000      31X       JMX .RTNA
2106                     A262 EQU *
2106  66000      70X       JMX .RTN1
2107      3
2110 177776
2107                       LIT
2111                     P263  EQU * VBW
2111 174517                CLB
2112  42000      56X       JSX .ARGS
2113  44016      16A       ISZ C
2114   1434   77434A       LDA V32540   IF2
2115 170507               SAR 8
2116  52000    2131R       AND =B17
2117   6000    2107R       LDB =D3 VBW
2120  42000      67X       JSX .STAP
2121 170040                TCA
2122  22000    1704R       ADA =D6
2123 172005               SAP A264
2124   6000    2107R       LDB =D3 VBW
2125  42000      30X       JSX .LDAP
2126  22000    2110R       ADA =D-2
2127  66000      31X       JMX .RTNA
2130                     A264 EQU *
2130  66000      70X       JMX .RTN1
2131     17
2131                       LIT
2132                     P265  EQU * LIMIT
2132   6000    2110R       LDB =D-2
2133  42000      27X       JSX .ARGA
2134  44016      16A       ISZ C
2135   4000                LDB A
2136   2000    1463R       LDA =D0
2137 176413               SBM A266
2140   6000    1301R       LDB =D-3  I
2141  42000      30X       JSX .LDAP
2142   6000    2153R       LDB =D-5  J
```

```
2143  42000      71X   JSX M1N4P
2144 172004            SAP A267
2145   6000    2153R   LDB =D-5   J
2146  42000      30X   JSX .LDAP
2147  66000    2152R   JMP A268
2150                  A267 EQU *
2150   6000    1301R   LDB =D-3   I
2151  42000      30X   JSX .LDAP
2152                  A268 EQU *
2152                  A266 EQU *
2152  66000      31X   JMX .RTNA
2153 177773
2153                   LIT
2154                  P269  EQU * WSPIN
2154   1570   77570A   LDA V32632   M
2155 170603            SAL 4
2156  61571   77571A   IOR V32633   L
2157 170610            SAL 9
2160   6000    2107R   LDB =D3
2161  42000      72X   JSX .WS6
2162 170201            RET 1
2163                  P270  EQU * TLEDSOUT
2163   6000    1277R   LDB =D-1
2164  42000      27X   JSX .ARGA
2165  31676   77676A   STA V16 TLEDS
2166 170140            CMA
2167   6000    2172R   LDB =D13
2170  42000      72X   JSX .WS6
2171  66000      31X   JMX .RTNA
2172     15
2172                   LIT
2173                  P271  EQU * CRLF
2173   2000    2172R   LDA =D13
2174   6000    2203R   LDB =D8
2175  42000      72X   JSX .WS6
2176   2000    2204R   LDA =D10
2177  42000      73X   JSX .W6
2200   2000    2205R   LDA =B40
2201  42000      73X   JSX .W6
2202 170201            RET 1
2203     10
2204     12
2205     40
2203                   LIT
2206                  P272  EQU * SPACE
2206   2000    2205R   LDA =B40
2207   6000    2203R   LDB =D8
2210  42000      72X   JSX .WS6
2211 170201            RET 1
2212                  P273  EQU * DELTA
2212   6000    2221R   LDB =D9
2213  42000      74X   JSX .RS5
2214  31742   77742A   STA V32738   IX
2215   2000    2222R   LDA =D249
2216   6000    2203R   LDB =D8
2217  42000      72X   JSX .WS6
2220 170201            RET 1
2221     11
2222    371
2221                   LIT
2223                  P274  EQU * NBLK
2223   6000    1277R   LDB =D-1
2224  42000      27X   JSX .ARGA
2225   6000    2107R   LDB =D3
2226  75617            MPY
2227  22000    2110R   ADA =D-2
2230  31573   77573A   STA V32635   I
2231  42000      60X   JSX .ARAY
2232            210R   DEF V112   SFTXY
2233   6000    2203R   LDB =D8
2234  42000      75X   JSX .WS4
2235   2000    1463R   LDA =D0
2236  42000      73X   JSX .W6
2237   2000    2275R   LDA =B2102
2240  42000      73X   JSX .W6
2241   1573   77573A   LDA V32635   I
2242  22000    1457R   ADA =D1
2243  42000      60X   JSX .ARAY
2244            210R   DEF V112   SFTXY
2245  42000      73X   JSX .W6
2246   1573   77573A   LDA V32635   I
2247  22000    2276R   ADA =D2
2250  42000      60X   JSX .ARAY
2251            210R   DEF V112   SFTXY
2252  62000    2277R   IOR =B4000
2253  42000      73X   JSX .W6
2254   2000    2300R   LDA =B2101
2255  42000      73X   JSX .W6
2256   6000    1301R   LDB =D-3   N
2257  42000      30X   JSX .LDAP
2260  42000      60X   JSX .ARAY
2261            267R   DEF V119   SFTAB
2262   6000    1704R   LDB =D6
2263  42000      76X   JSX .WSTS
2264   6000    1301R   LDB =D-3   N
2265  42000      30X   JSX .LDAP
2266  12000    2301R   CPA =D19
2267  66000    2273R   JMP A276
2270  12000    2302R   CPA =D22
2271  66000    2273R   JMP *+2
2272  66000    2274R   JMP A275
```

```
1021    2273                      A276 EQU *
1022    2273   42000      2212R     JSM P273   DELTA
1023    2274                      A275 EQU *
1024    2274   66000       31X      JMX .RTNA
        2275    2102
        2276       2
        2277    4000
        2300    2101
        2301      23
        2302      26
1025    2275                        LIT
1026    2303                      P277  EQU * GOFSET
1027    2303  174517                CLB
1028    2304   42000       56X      JSX .ARGS
1029    2305   44016       16A      ISZ C
1030    2306    5677    77677A      LDB V17 RFAT
1031    2307  174613                SBL 12
1032    2310    1432    77432A      LDA V32538   GIN2
1033    2311  176402              SBM A278
1034    2312    1433    77433A      LDA V32539   GIN1
1035    2313                      A278 EQU *
1036    2313   66000       31X      JMX .RTNA
1037    2314                      P279  EQU * SBLK
1038    2314    6000     1277R      LDB =D-1
1039    2315   42000       27X      JSX .ARGA
1040    2316    6000     2107R      LDB =D3
1041    2317   75617                MPY
1042    2320   22000     2110R      ADA =D-2
1043    2321   42000       60X      JSX .ARAY
1044    2322                210R    DEF V112   SFIXY
1045    2323   70541                PWC B
1046    2324    6000     1301R      LDB =D-3   N
1047    2325   42000       30X      JSX .LDAP
1048    2326   42000       60X      JSX .ARAY
1049    2327                267R    DEF V119   SFIAB
1050    2330  100000                LDA A,I
1051    2331   42000       77X      JSX ADD4B
1052    2332   22000     2405R      ADA =D5
1053    2333    6000     2203R      LDB =D8
1054    2334   42000       75X      JSX .WS4
1055    2335    2000     2205R      LDA =B40
1056    2336   42000       73X      JSX .W6
1057    2337    6000     1301R      LDB =D-3   N
1058    2340   42000       30X      JSX .LDAP
1059    2341  170500                SAR 1
1060    2342   12000     2406R      CPA =D7
1061    2343   66000     2351R      JMP A281
1062    2344    6000     1301R      LDB =D-3   N
1063    2345   42000       30X      JSX .LDAP
1064    2346   12000     2407R      CPA =D34
1065    2347   66000     2351R      JMP *+2
1066    2350   66000     2355R      JMP A280
1067    2351                      A281 EQU *
1068    2351   42000     2173R      JSM P271   CRLF
1069    2352    1616    77616A      LDA V32654   XFLAG
1070    2353   62000     2410R      IOR =B200
1071    2354   31616    77616A      STA V32654   XFLAG
1072    2355                      A280 EQU *
1073    2355    6000     1301R      LDB =D-3   N
1074    2356   42000       30X      JSX .LDAP
1075    2357   42000    14055R      JSM P216   MESSAGE
1076    2360    6000     1301R      LDB =D-3   N
1077    2361   42000       30X      JSX .LDAP
1078    2362   12000     2411R      CPA =D4
1079    2363   66000     2365R      JMP *+2
1080    2364   66000     2374R      JMP A282
1081    2365   42000     2303R      JSM P277   GOFSET
1082    2366   72406              SZA A282
1083    2367    6000     1704R      LDB =D6
1084    2370   42000      100X      JSX .WSIR
1085    2371               2412R    DEF ="  PG "
1086    2372    2000     2416R      LDA =D29
1087    2373   42000    14055R      JSM P216   MESSAGE
1088    2374                      A282 EQU *
1089    2374    6000     1301R      LDB =D-3   N
1090    2375   42000       30X      JSX .LDAP
1091    2376    4000                LDB A
1092    2377   26000     2417R      ADB =B177772
1093    2400    2000     2420R      LDA =D145
1094    2401   76402              SZB A283
1095    2402    2000     2421R      LDA =D146
1096    2403                      A283 EQU *
1097    2403   42000       73X      JSX .W6
1098    2404   66000       31X      JMX .RTNA
        2405       5
        2406       7
        2407      42
        2410     200
        2411       4
        2412    PG
        2416      35
        2417  177772
        2420     221
        2421     222
1099    2405                        LIT
1100    2422                      P284  EQU * BLKAD
1101    2422    6000     1277R      LDB =D-1
1102    2423   42000       27X      JSX .ARGA
1103    2424    6000     2107R      LDB =D3
1104    2425   75617                MPY
```

```
2426  22000   2110R   ADA =D-2
2427  42000     60X   JSX .ARAY
2430            210R  DEF V112  SFTXY
2431   6000   2203R   LDB =D8
2432  42000     75X   JSX .WS4
2433  66000     31X   JMX .RTNA
2434                 P285  EQU * BLKOF
2434   6000   1277R   LDB =D-1
2435  42000     27X   JSX .ARGA
2436  66000   2445R   JMP A286
2437                 T287 EQU *
2437                  DEC 0 0
2440                 K288  OCT 177401  177401
2441                 K289  OCT 742 742
2442          2437R  V290 DEF T287 SK16
2443                  OCT 177777  177777
2444                 K291  OCT 3 3
2445                 A286  EQU *
2445  42000   2422R   JSM P284  BLKAD
2446   6000   1301R   LDB =D-3  N
2447  42000     30X   JSX .LDAP
2450  12000   1456R   CPA =D12
2451  66000   2455R   JMP A293
2452  12000   2477R   CPA =D36
2453  66000   2455R   JMP *+2
2454  66000   2457R   JMP A292
2455                 A293 EQU *
2455   2000   2500R   LDA =D147
2456  66000   2475R   JMP A294
2457                 A292 EQU *
2457   6000   1301R   LDB =D-3  N
2460  42000     30X   JSX .LDAP
2461  52000   2131R   AND =D15
2462  70540           PWC A
2463   6000   1301R   LDB =D-3  N
2464  42000     30X   JSX .LDAP
2465 170503           SAR 4
2466  22000   1457R   ADA =D1
2467  42000     60X   JSX .ARAY
2470          2442R   DEF V290  SK16
2471  70761           WWC B
2472  42000    101X   JSX .1BIT
2473 170416           AAR 15
2474  22000   2421R   ADA =D146
2475                 A294 EQU *
2475  42000     73X   JSX .W6
2476  66000     31X   JMX .RTNA
2477     44
2500    223
2477                  LIT
2501                 P295  EQU * BLINK
2501   6000   1277R   LDB =D-1
2502  42000     27X   JSX .ARGA
2503  42000   2223R   JSM P274  NBLK
2504   6000   1301R   LDB =D-3  N
2505  42000     30X   JSX .LDAP
2506  42000   2422R   JSM P284  BLKAD
2507   6000   1301R   LDB =D-3  N
2510  42000     30X   JSX .LDAP
2511   4000           LDB A
2512  26000   2520R   ADB =B177741
2513   2000   1463R   LDA =D0
2514  76402          SZB A296
2515   2000   2521R   LDA =B21
2516                 A296 EQU *
2516  42000     73X   JSX .W6
2517  66000     31X   JMX .RTNA
2520 177741
2521     21
2520                  LIT
2522                 P297  EQU * RJUST
2522   6000   2110R   LDB =D-2
2523  42000     27X   JSX .ARGA
2524  42000   2314R   JSM P279  SBLK
2525   2000   2107R   LDA =D3
2526   6000   1301R   LDB =D-3  N
2527  42000    102X   JSX MPY4P
2530  22000   2110R   ADA =D-2
2531  42000     60X   JSX .ARAY
2532            210R  DEF V112  SFTXY
2533  22000   2276R   ADA =D2
2534  42000    103X   JSX .W4
2535   6000   1301R   LDB =D-3  N
2536  42000     30X   JSX .LDAP
2537  42000     60X   JSX .ARAY
2540            267R  DEF V119  SFTAB
2541 100000           LDA A,I
2542  21430  77430A   ADA V32536  SLEN
2543  22000   1457R   ADA =D1
2544 170603           SAL 4
2545   6000   2153R   LDB =D-5  P
2546  42000     71X   JSX MIN4P
2547  42000     73X   JSX .W6
2550  66000     31X   JMX .RTNA
2551                 P298  EQU * ABLK
2551   1620  77620A   LDA V32656  PREFIX
2552  12000   2406R   CPA =D7
2553  66000   2555R   JMP *+2
2554  66000   2566R   JMP A299
2555   1675  77675A   LDA V15 BLEDS
2556 170604           SAL 5
```

```
2557 172007           SAP A299
2560   2000   2565R    LDA =D11
2561  42000   2223R    JSM P274   NBLK
2562   2000   2565R    LDA =D11
2563  42000   2314R    JSM P279   SBLK
2564  66000   2570R    JMP A300
2565     13
2565                   LIT
2566                  A299 EQU *
2566   2000   2565R    LDA =D11
2567  42000   2434R    JSM P285   BLKOF
2570                  A300 EQU *
2570   1616  77616A    LDA V32654   XFLAG
2571  62000   2644R    IOR =B10000
2572  31616  77616A    STA V32654   XFLAG
2573   1601  77601A    LDA V32641   HPBC
2574  52000   2645R    AND =B137777
2575  31601  77601A    STA V32641   HPBC
2576   2000   2646R    LDA =D3008
2577  31737  77737A    STA V32735   BLKS
2600   2000   1463R    LDA =D0
2601  31617  77617A    STA V32655   DECFLG
2602  31611  77611A    STA V32649   CHRC
2603  42000     53X    JSX .LDSI
2604          1463R    DEF =D0
2605  42000     34X    JSX .SIRD
2606         77651A    DEF V32681   LTEMP
2607   1620  77620A    LDA V32656   PREFIX
2610  72433           SZA A301
2611  42000     60X    JSX .ARAY
2612           345R    DEF V122   AFTAB
2613 100000            LDA A,I
2614  22000   2406R    ADA =D7
2615  31612  77612A    STA V32650   NCHR
2616  21737  77737A    ADA V32735   BLKS
2617   6000   2203R    LDB =D8
2620  42000     75X    JSX .WS4
2621   1620  77620A    LDA V32656   PREFIX
2622  42000  14055R    JSM P216  MESSAGE
2623   1620  77620A    LDA V32656   PREFIX
2624 170040            TCA
2625  22000   2521R    ADA =D17
2626 172007           SAP A302
2627   1620  77620A    LDA V32656   PREFIX
2630  22000   2647R    ADA =D-24
2631 172004           SAP A302
2632  42000   2173R    JSM P271   CRLF
2633   2000   2521R    LDA =D17
2634  42000  14055R    JSM P216   MESSAGE
2635                  A302 EQU *
2635   1620  77620A    LDA V32656   PREFIX
2636 170500            SAR 1
2637  12000   1456R    CPA =D12
2640  66000   2643R    JMP A303
2641   2000   2500R    LDA =D147
2642  42000     73X    JSX .W6
2643                  A303 EQU *
2643                  A301 EQU *
2643 170201             RET 1
2644  10000
2645 137777
2646   5700
2647 177750
2644                   LIT
2650                  P304  EQU * UNCAL
2650   2000    152R    LDA V114  UNCALAD
2651   6000   2203R    LDB =D8
2652  42000     75X    JSX .WS4
2653   1426  77426A    LDA V32534  UFLAG
2654 172012           SAP A305
2655   2000   1463R    LDA =D0
2656  42000     73X    JSX .W6
2657   2000    152R    LDA V114  UNCALAD
2660  22000   2405R    ADA =D5
2661  42000    103X    JSX .W4
2662   6000   1704R    LDB =D6
2663  42000    100X    JSX .WSTR
2664           742R    DEF ="MEAS UNCAL"
2665  66000   2731R    JMP A306
2666                  A305 EQU *
2666   1733  77733A    LDA V20 FSTIM
2667 172415           SAM A309
2670   1426  77426A    LDA V32534  UFLAG
2671 170612            SAL 11
2672 172004           SAP A310
2673   1676  77676A    LDA V16 TLEDS
2674 170611            SAL 10
2675 172013           SAP A308
2676                  A310 EQU *
2676   1426  77426A    LDA V32534  UFLAG
2677 170615            SAL 14
2700 172004           SAP A311
2701   1676  77676A    LDA V16 TLEDS
2702 170614            SAL 13
2703 172005           SAP A308
2704                  A311 EQU *
2704                  A309 EQU *
2704   1426  77426A    LDA V32534  UFLAG
2705  52000   2723R    AND =B54
2706  22000   2724R    ADA =B177724
```

```
2707  72020             RZA A307
2710                   A308 EGU *
2710   2000     1463R    LDA =D0
2711  42000       73X    JSX .W6
2712   2000      152R    LDA V114  UNCALAD
2713  22000     2405R    ADA =D5
2714  42000      103X    JSX .W4
2715   6000     1704R    LDB =D6
2716  42000      100X    JSX .WSTR
2717            2725R    DEF =" *"
2720   2000     2420R    LDA =D145
2721  42000       73X    JSX .W6
2722  66000     2731R    JMP A312
2723     54
2724 177724
2725  *
2723                    LIT
2727                   A307 EQU *
2727   2000     2420R    LDA =D145
2730  42000       73X    JSX .W6
2731                   A312 EQU *
2731                   A306 EQU *
2731   1723   77723A     LDA V26 MKRMODE
2732 170040              TCA
2733  22000     2761R    ADA =D20
2734 172024             SAP A313
2735   1426   77426A     LDA V32534  UFLAG
2736 170610              SAL 9
2737 172021             SAP A313
2740   2000     2107R    LDA =D3
2741   5723   77723A     LDB V26 MKRMODE
2742  75617              MPY
2743  22000     2110R    ADA =D-2
2744  42000       60X    JSX .ARAY
2745             210R    DEF V112  SFTXY
2746  70541              PWC B
2747   1723   77723A     LDA V26 MKRMODE
2750  42000       60X    JSX .ARAY
2751             267R    DEF V119  SFTAB
2752 100000              LDA A,I
2753  42000       77X    JSX ADD4B
2754  22000     2405R    ADA =D5
2755  42000      103X    JSX .W4
2756   2000     2421R    LDA =D146
2757  42000       73X    JSX .W6
2760                   A313 EQU *
2760 170201              RET 1
2761     24
2761                    LIT
2762                   P314  EQU * AVGRST
2762   2000     1277R    LDA =B177777
2763  31607   77607A     STA V32647  ACNT
2764   1426   77426A     LDA V32534  UFLAG
2765  62000     2771R    IOR =B126
2766  31426   77426A     STA V32534  UFLAG
2767  42000     2650R    JSM P304  UNCAL
2770 170201              RET 1
2771    126
2771                    LIT
2772                   P315  EGU * DALG
2772  42000     2762R    JSM P314  AVGRST
2773   1702   77702A     LDA V24 VIDCON
2774 170611              SAL 10
2775 172002              SAP *+2
2776  66000     3043R    JMP A316
2777  66000     3006R    JMP A317
3000                   T318 EQU *
3000            3023R    DEF =" NEG PK"
3001            3030R    DEF =" POS PK"
3002            3035R    DEF =" SAMPLE"
3003            3000R  V319 DEF T318 ALGS
3004                     OCT 177777  177777
3005                     OCT 3 3
3006                   A317  EGU *
3006   2000     3042R    LDA =D37
3007  42000     2223R    JSM P274  NBLK
3010   1702   77702A     LDA V24 VIDCON
3011 170502              SAR 3
3012  52000     2107R    AND =D3
3013  22000     1457R    ADA =D1
3014  42000       60X    JSX .ARAY
3015            3003R    DEF V319  ALGS
3016   6000     1704R    LDB =D6
3017  42000       76X    JSX .WSTS
3020   2000     2420R    LDA =D145
3021  42000       73X    JSX .W6
3022  66000     3045R    JMP A320
3023 NEG PK
3030 POS PK
3035 SAMPLE
3042     45
3023                    LIT
3043                   A316 EQU *
3043   2000     3042R    LDA =D37
3044  42000     2434R    JSM P285  BLKOF
3045                   A320 EQU *
3045 170201              RET 1
3046                   P321  EQU * CLEAR
3046   6000     1277R    LDB =D-1
3047  42000       27X    JSX .ARGA
3050  22000     1277R    ADA =D-1
```

```
3051 170611          SAL 10
3052  22000   1457R  ADA =D1
3053   6000   2203R  LDB =D8
3054  42000     75X  JSX .WS4
3055   6000   1301R  LDB =D-3  N
3056  42000     30X  JSX .LDAP
3057   4000          LDB A
3060  26000   1363R  ADB =B177774
3061   2000   3110R  LDA =B2024
3062  76402          SZB A322
3063   2000   1463R  LDA =D0
3064                A322 EQU *
3064  31572  77572A  STA V32634  J
3065   2000   3111R  LDA =B176001
3066  70540          PWC A
3067   2000   1457R  LDA =D1
3070                A323 EQU *
3070  31573  77573A  STA V32635  I
3071 170040          ICA
3072  22000   3112R  ADA =D1001
3073 172005          SAP A324
3074   1572  77572A  LDA V32634  J
3075  72003          RZA A324
3076   2000   3113R  LDA =B2060
3077  66000   3101R  JMP A325
3100                A324 EQU *
3100   1572  77572A  LDA V32634  J
3101                A325 EQU *
3101  42000     73X  JSX .W6
3102   2000   1457R  LDA =D1
3103  21573  77573A  ADA V32635  I
3104 144016     16A  ISZ C,1
3105  66000   3070R  JMP A323
3106  54016     16A  DSZ C
3107  66000     31X  JMX .RTNA
3110   2024
3111 176001
3112   1751
3113   2060
3110                 LIT
3114                P326  EQU * *DACS
3114   6000   1277R  LDB =D-1
3115  42000     27X  JSX .ARGA
3116   2000   3166R  LDA =D1023
3117  70540          PWC A
3120   6000   1301R  LDB =D-3  DAC
3121  42000     30X  JSX .LDAP
3122  42000   2132R  JSM P265  LIMIT
3123  31613  77613A  STA V32651  DAC4
3124  31614  77614A  STA V32652  DAC2
3125  31615  77615A  STA V32653  DAC1
3126  42000    104X  JSX .TURN
3127          3166R  DEF =B1777
3130         77604A  DEF V32644  SATN
3131  31604  77604A  STA V32644  SATN
3132   2000   1463R  LDA =D0
3133  31605  77605A  STA V32645  SCANSL
3134  31602  77602A  STA V32642  LKMSK
3135   1616  77616A  LDA V32654  XFLAG
3136  62000   2277R  IOR =B4000
3137  31616  77616A  STA V32654  XFLAG
3140   1603  77603A  LDA V32643  PLOCK
3141  52000   3167R  AND =B5777
3142  62000   3170R  IOR =B152000
3143  31603  77603A  STA V32643  PLOCK
3144   1615  77615A  LDA V32653  DAC1
3145   6000   1463R  LDB =D0
3146  42000     75X  JSX .WS4
3147   1614  77614A  LDA V32652  DAC2
3150  42000    105X  JSX .W5
3151   1613  77613A  LDA V32651  DAC4
3152  42000    106X  JSX .W7
3153   1604  77604A  LDA V32644  SATN
3154   6000   1457R  LDB =D1
3155  42000     75X  JSX .WS4
3156   1603  77603A  LDA V32643  PLOCK
3157  42000     73X  JSX .W6
3160   1605  77605A  LDA V32645  SCANSL
3161  42000    106X  JSX .W7
3162   1602  77602A  LDA V32642  LKMSK
3163   6000   2107R  LDB =D3
3164  42000    107X  JSX .WS5
3165  66000     31X  JMX .RTNA
3166   1777
3167   5777
3170 152000
3166                 LIT
3171                P327  EQU * HLDOF
3171   6000   1277R  LDB =D-1
3172  42000     27X  JSX .ARGA
3173   4000          LDB A
3174  26000   1277R  ADB =B177777
3175   2000   1457R  LDA =D1
3176 176403          SBM A328
3177   6000   1301R  LDB =D-3  N
3200  42000     30X  JSX .LDAP
3201                A328 EQU *
3201 170601          SAL 2
3202   6000   2405R  LDB =D5
3203  42000     75X  JSX .WS4
3204  66000     31X  JMX .RTNA
```

```
3205                          P329  EQU * BUSY
3205                          A330 EQU *
3205     6000     2276R         LDB =D2
3206    42000      110X         JSX .RS7
3207    31567    77567A         STA V32631  KEYCOL
3210  170612                    SAL 11
3211  172002                    SAP A331
3212   76673                    SSC A330
3213                          A331 EQU *
3213  170201                    RET 1
3214                          P332  EQU * WAIT
3214     6000     1277R         LDB =D-1
3215    42000       27X         JSX .ARGA
3216    42000     3171R         JSM P327   HLDOF
3217    42000     3205R         JSM P329   BUSY
3220    66000       31X         JMX .RTNA
3221                          P333  EQU * CORREK
3221  174517                    CLB
3222    42000       56X         JSX .ARGS
3223    44016       16A         ISZ C
3224     1740    77740A         LDA V32736   EFLAG
3225    52000     3231R         AND =B60
3226    22000     3232R         ADA =B177720
3227    42000      111X         JSX .EQL
3230    66000       31X        JMX .RTNA
3231       60
3232  177720
3231                            LIT
3233                          P334  EQU * IFSAV
3233     1434    77434A         LDA V32540  IF2
3234  170507                    SAR 8
3235    42000      104X         JSX .TURN
3236               3242R        DEF =B377
3237              77435A        DEF V32541  IF1
3240    31701    77701A         STA V23 RVBW
3241  170201                    RET 1
3242      377
3242                            LIT
3243                          P335  EQU * WIF1
3243    42000     3233R         JSM P334  IFSAV
3244     5730    77730A         LDB V30 KFLAG
3245  174611                    SBL 10
3246     1435    77435A         LDA V32541  IF1
3247  176002                   SBP A336
3250    52000     3254R         AND =B177437
3251                          A336 EQU *
3251     6000     2172R         LDB =D13
3252    42000       75X         JSX .WS4
3253  170201                    RET 1
3254  177437
3254                            LIT
3255                          P337  EQU * WRFAT
3255     1677    77677A         LDA V17 RFAT
3256  170140                    CMA
3257     6000     2107R         LDB =D3
3260    42000      112X         JSX .WS7
3261     2000     2411R         LDA =D4
3262    42000     2314R         JSM P279   SBLK
3263    42000     2762R         JSM P314   AVGRST
3264     2000     2411R         LDA =D4
3265    42000     3214R         JSM P332   WAIT
3266     2000     2107R         LDA =D3
3267     6000     2107R         LDB =D3
3270    42000       75X         JSX .WS4
3271     2000     2411R         LDA =D4
3272    42000      103X         JSX .W4
3273  170201                    RET 1
3274                          P338  EQU * RLMIN
3274  174517                    CLB
3275    42000       56X         JSX .ARGS
3276    44016       16A         ISZ C
3277     5675    77675A         LDB V15 BLEDS
3300  174605                    SBL 6
3301     2000     3311R         LDA =B176175
3302  176006                   SBP A339
3303     1677    77677A         LDA V17 RFAT
3304    52000     2406R         AND =D7
3305     6000     3312R         LDB =D100
3306    75617                   MPY
3307    22000     3313R         ADA =D-999
3310                          A339 EQU *
3310    66000       31X        JMX .RTNA
3311  176175
3312      144
3313  176031
3311                            LIT
3314                          P340  EQU * MXRLVL
3314  174517                    CLB
3315    42000       56X         JSX .ARGS
3316    44016       16A         ISZ C
3317     1677    77677A         LDA V17 RFAT
3320  170403                    AAR 4
3321    66000       31X         JMX .RTNA
3322                          P341  EQU * RFATV
3322  174517                    CLB
3323    42000       56X         JSX .ARGS
3324    44016       16A         ISZ C
3325     2000     1704R         LDA =D6
3326    70540                   PWC A
3327    42000     3314R         JSM P340   MXRLVL
```

```
3330  42000     113X   JSX DIV4
3331           3312R   DEF =D100
3332  22000    1457R   ADA =D1
3333 170040            TCA
3334  21573   77573A   ADA V32635  I
3335  42000    2132R   JSM P265  LIMIT
3336  22000    1457R   ADA =D1
3337  66000      31X   JMX .RTNA
3340                  P342  EQU * RLMAX
3340 174517            CLB
3341  42000      56X   JSX .ARGS
3342  44016      16A   ISZ C
3343   5730   77730A   LDB V30 KFLAG
3344 174612            SBL 11
3345   2000    3404R   LDA =D700
3346 176404           SBM A343
3347  42000    3314R   JSM P340  MXRLVL
3350 170040            TCA
3351  22000    3405R   ADA =D300
3352                  A343 EQU *
3352  70540            PWC A
3353   5675   77675A   LDB V15 BLEDS
3354 174605            SBL 6
3355   2000    3404R   LDA =D700
3356 176021           SBP A344
3357   1677   77677A   LDA V17 RFAT
3360  52000    2406R   AND =D7
3361  70540            PWC A
3362   1730   77730A   LDA V30 KFLAG
3363 170612            SAL 11
3364 172005           SAP A346
3365  42000    2070R   JSM P261  IFBW
3366 170040            TCA
3367  22000    1704R   ADA =D6
3370 172403           SAM A345
3371                  A346 EQU *
3371   2000    1463R   LDA =D0
3372  66000    3374R   JMP A347
3373                  A345 EQU *
3373   2000    1457R   LDA =D1
3374                  A347 EQU *
3374  42000      57X   JSX ADD4T
3375   6000    3312R   LDB =D100
3376  75617            MPY
3377                  A344 EQU *
3377  42000    2132R   JSM P265  LIMIT
3400  70540            PWC A
3401  42000    3314R   JSM P340  MXRLVL
3402  42000      57X   JSX ADD4T
3403  66000      31X  JMX .RTNA
3404   1274
3405    454
3404                   LIT
3406                  P348  EQU * RFLC
3406 174517            CLB
3407  42000      56X   JSX .ARGS
3410  44016      16A   ISZ C
3411   2000    1463R   LDA =D0
3412   6000    2107R   LDB =D3 RFLC
3413  42000      67X   JSX .STAP
3414  42000    3221R   JSM P333  CORREK
3415 172402            SAM *+2
3416  66000    3515R   JMP A349
3417   1677   77677A   LDA V17 RFAT
3420  42000       7X   JSM P198  ATNER
3421  70540            PWC A
3422  42000    2070R   JSM P261  IFBW
3423  42000      60X   JSX .ARAY
3424             15R   DEF V39 BWAMP
3425  42000      57X   JSX ADD4T
3426  70540            PWC A
3427   1603   77603A   LDA V32643  PLOCK
3430 170140            CMA
3431 170511            SAR 10
3432  52000    1457R   AND =D1
3433  70540            PWC A
3434   2000    2131R   LDA =D15
3435  42000      60X   JSX .ARAY
3436             15R   DEF V39 BWAMP
3437  42000     114X   JSX MPY4T
3440  42000      57X   JSX ADD4T
3441  70540            PWC A
3442   2000    2406R   LDA =D7
3443  70540            PWC A
3444   1573   77573A   LDA V32635  I
3445  22000    1363R   ADA =D-4
3446  42000    2132R   JSM P265  LIMIT
3447  22000    2301R   ADA =D19
3450  42000      60X   JSX .ARAY
3451             15R   DEF V39 BWAMP
3452  42000      57X   JSX ADD4T
3453   6000    2107R   LDB =D3 RFLC
3454  42000      67X   JSX .STAP
3455   1435   77435A   LDA V32541  IF1
3456 172022           SAP A350
3457 170514            SAR 13
3460  52000    2107R   AND =D3
3461 170040            TCA
3462  22000    2416R   ADA =D29
3463  42000      60X   JSX .ARAY
```

```
3464            15R    DEF V39 BWAMP
3465  70541            PWC B
3466  42000   2070R    JSM P261  IFBW
3467   4000            LDB A
3470  26000   3526R    ADB =B177766
3471   2000   1457R    LDA =D1
3472 176402            SBM A351
3473   2000   3527R    LDA =D14
3474                  A351 EQU *
3474  42000     60X    JSX .ARAY
3475            15R    DEF V39 BWAMP
3476  42000     77X    JSX ADD4B
3477  66000   3511R    JMP A352
3500                  A350 EQU *
3500   1573  77573A    LDA V32635  I
3501  22000   1363R    ADA =D-4
3502 170516            SAR 15
3503  70540            PWC A
3504   2000   2131R    LDA =D15
3505  21573  77573A    ADA V32635  I
3506  42000     60X    JSX .ARAY
3507            15R    DEF V39 BWAMP
3510  42000    114X    JSX MPY4T
3511                  A352 EQU *
3511   6000   2107R    LDB =D3 RFLC
3512  42000    115X    JSX ADD4P
3513   6000   2107R    LDB =D3 RFLC
3514  42000     67X    JSX .STAP
3515                  A349 EQU *
3515   6000   2107R    LDB =D3 RFLC
3516  42000     30X    JSX .LDAP
3517 172003            SAP A353
3520  22000   2153R    ADA =D-5
3521  66000   3523R    JMP A354
3522                  A353 EQU *
3522  22000   2405R    ADA =D5
3523                  A354 EQU *
3523  42000    113X    JSX DIV4
3524          2204R    DEF =D10
3525  66000     31X    JMX .RTNA
3526 177766
3527     16
3526                   LIT
3530                  P355  EQU * REFLEV
3530   6000   1277R    LDB =D-1
3531  42000     27X    JSX .ARGA
3532  66000   3571R    JMP A356
3533                  T357 EQU *
3533                  K358  OCT 347  347
3534                  K359  OCT 346  346
3535                  K360  OCT 343  343
3536                  K361  OCT 342  342
3537                  K362  OCT 341  341
3540                  K363  OCT 340  340
3541                  K364  OCT 300  300
3542                  K365  OCT 140  140
3543                  K366  OCT 100  100
3544                  K367  OCT 40   40
3545                    DEC 0 0
3546                  K368  OCT 400  400
3547                  K142  OCT 1000  1000
3550          3533R   V369 DEF T357 REFLOG
3551                    OCT 177777  177777
3552                  K184  OCT 15   15
3553                  T370 EQU *
3553                  K371  OCT 370  370
3554                  K372  OCT 360  360
3555                  K373  OCT 350  350
3556                    OCT 340  340
3557                    OCT 300  300
3560                    OCT 140  140
3561                    OCT 100  100
3562                    OCT 40   40
3563                    DEC 0 0
3564                    OCT 400  400
3565                    OCT 1000  1000
3566          3553R   V374 DEF T370 REFLIN
3567                    OCT 177777  177777
3570                  K375  OCT 13   13
3571                  A356  EQU *
3571   1606  77606A    LDA V32646   SRCEID
3572 170615            SAL 14
3573 172007            SAP A376
3574   1606  77606A    LDA V32646   SRCEID
3575  62000   2644R    IOR =B10000
3576  31606  77606A    STA V32646   SRCEID
3577   2000   3654R    LDA =B20
3600   6000   2411R    LDB =D4
3601  42000    112X    JSX .WS7
3602                  A376 EQU *
3602   1435  77435A    LDA V32541   IF1
3603 170516            SAR 15
3604  70540            PWC A
3605  42000   2070R    JSM P261   IFBW
3606 170040            TCA
3607  22000   1704R    ADA =D6
3610 170140            CMA
3611 170516            SAR 15
3612  42000     57X    JSX ADD4T
```

```
3613   6000  3655R     LDB =D200
3614  75617            MPY
3615  22000  3656R     ADA =D999
3616  70540            PWC A
3617   5675  77675A    LDB V15 BLEDS
3620 174605            SBL 6
3621   2000  1457R     LDA =D1
3622 176003           SBP A377
3623   1677  77677A    LDA V17 RFAT
3624  52000  2406R     AND =D7
3625                 A377 EQU *
3625   6000  3312R     LDB =D100
3626  75617            MPY
3627  42000   116X     JSX SUB41
3630  31742  77742A    STA V32738  IX
3631  42000  1665R     JSM P245  RLAD
3632   6000  1301R     LDB =D-3  LVL
3633  42000    71X     JSX MIN4P
3634  70540            PWC A
3635  42000  2303R     JSM P277  GOFSET
3636 170040            TCA
3637  21706  77706A    ADA V31 ROFSET
3640 170040            TCA
3641  42000    57X     JSX ADD4T
3642   6000  1301R     LDB =D-3  LVL
3643  42000    67X     JSX .STAP
3644  42000  3340R     JSM P342  RLMAX
3645   6000  1301R     LDB =D-3  LVL
3646  42000   117X     JSX SUB4P
3647 172010           SAP A378
3650  42000  3340R     JSM P342  RLMAX
3651   6000  1301R     LDB =D-3  LVL
3652  42000    67X     JSX .STAP
3653  66000  3671R     JMP A379
3654     20
3655    310
3656   1747
3654                   LIT
3657                 A378 EQU *
3657   1730  77730A    LDA V30 KFLAG
3660 170612            SAL 11
3661 172410           SAM A380
3662  42000  3274R     JSM P338  RLMIN
3663   6000  1301R     LDB =D-3  LVL
3664  42000    71X     JSX MIN4P
3665 172004           SAP A380
3666  42000  3274R     JSM P338  RLMIN
3667   6000  1301R     LDB =D-3  LVL
3670  42000    67X     JSX .STAP
3671                 A380 EQU *
3671                 A379 EQU *
3671   1742  77742A    LDA V32738  IX
3672   6000  1301R     LDB =D-3  LVL
3673  42000    71X     JSX MIN4P
3674 172007           SAP A381
3675   1742  77742A    LDA V32738  IX
3676  22000  3702R     ADA =D1999
3677   6000  1301R     LDB =D-3  LVL
3700  42000    67X     JSX .STAP
3701  66000  3740R     JMP A382
3702   3717
3702                   LIT
3703                 A381 EQU *
3703   1435  77435A    LDA V32541  IF1
3704 170516            SAR 15
3705   6000  3655R     LDB =D200
3706  75617            MPY
3707  21742  77742A    ADA V32738  IX
3710  22000  4044R     ADA =D1099
3711  70540            PWC A
3712   1675  77675A    LDA V15 BLEDS
3713 170140            CMA
3714 170510            SAR 9
3715  52000  1457R     AND =D1
3716  70540            PWC A
3717  42000  3314R     JSM P340  MXRLVL
3720  22000  3404R     ADA =D700
3721  42000   114X     JSX MPY4T
3722  42000    57X     JSX ADD4T
3723  31741  77741A    STA V32737  IY
3724   6000  1301R     LDB =D-3  LVL
3725  42000    30X     JSX .LDAP
3726   4000            LDB A
3727 174040            TCB
3730  25741  77741A    ADB V32737  IY
3731   1741  77741A    LDA V32737  IY
3732 176403           SBM A383
3733   6000  1301R     LDB =D-3  LVL
3734  42000    30X     JSX .LDAP
3735                 A383 EQU *
3735  22000  3702R     ADA =D1999
3736   6000  1301R     LDB =D-3  LVL
3737  42000    67X     JSX .STAP
3740                 A382 EQU *
3740  42000   113X     JSX DIV4
3741         3312R     DEF =D100
3742  22000  4045R     ADA =D-19
3743  31573  77573A    STA V32635  I
3744   1675  77675A    LDA V15 BLEDS
3745 170605            SAL 6
```

```
3746 172424                 SAM A384
3747  42000     3322R        JSM P341  RFATV
3750  42000      120X        JSX .TEST
3751            2406R        DEF =D7
3752           77677A        DEF V17 RFAT
3753  72017                 RZA A384
3754   1573    77573A        LDA V32635  I
3755  70540                  PWC A
3756   1742    77742A        LDA V32738  IX
3757  70540                  PWC A
3760  42000     3322R        JSM P341  RFATV
3761  42000      104X        JSX .TURN
3762            2406R        DEF =D7
3763           77677A        DEF V17 RFAT
3764  31677    77677A        STA V17 RFAT
3765  42000     3255R        JSM P337  WRFAT
3766  70760                  WWC A
3767  31742    77742A        STA V32738  IX
3770  70760                  WWC A
3771  31573    77573A        STA V32635  I
3772                       A384 EQU *
3772   1677    77677A        LDA V17 RFAT
3773  52000     2406R        AND =D7
3774 170040                  TCA
3775  21573    77573A        ADA V32635  I
3776  70540                  PWC A
3777  42000     2070R        JSM P261  IFBW
4000 170040                  TCA
4001  22000     1704R        ADA =D6
4002 170140                  CMA
4003 170516                  SAR 15
4004 170600                  SAL 1
4005  42000       57X        JSX ADD4T
4006  22000     2204R        ADA =D10
4007  31573    77573A        STA V32635  I
4010  42000     3406R        JSM P348  RFLC
4011  31572    77572A        STA V32634  J
4012   6000     1301R        LDB =D-3  LVL
4013  42000       30X        JSX .LDAP
4014  42000      113X        JSX DIV4
4015            3312R        DEF =D100
4016  70540                  PWC A
4017   6000     1301R        LDB =D-3  LVL
4020  42000       30X        JSX .LDAP
4021  21572    77572A        ADA V32634  J
4022  42000      113X        JSX DIV4
4023            3312R        DEF =D100
4024  42000      116X        JSX SUB4T
4025 172021                 SAP A385
4026   1742    77742A        LDA V32738  IX
4027  22000     3702R        ADA =D1999
4030  70540                  PWC A
4031   6000     1301R        LDB =D-3  LVL
4032  42000       30X        JSX .LDAP
4033  21572    77572A        ADA V32634  J
4034  42000      116X        JSX SUB4T
4035 172411                 SAM A385
4036  55573    77573A        DSZ V32635  I
4037                         NOP
4040  42000     3406R        JSM P348  RFLC
4041  22000     3312R        ADA =D100
4042  31572    77572A        STA V32634  J
4043  66000     4063R        JMP A386
4044   2113
4045 177755
4044                        LIT
4046                       A385 EQU *
4046   1742    77742A        LDA V32738  IX
4047  22000     3702R        ADA =D1999
4050  70540                  PWC A
4051   6000     1301R        LDB =D-3  LVL
4052  42000       30X        JSX .LDAP
4053  21572    77572A        ADA V32634  J
4054  42000      116X        JSX SUB4T
4055 172006                 SAP A387
4056   1742    77742A        LDA V32738  IX
4057  22000     3702R        ADA =D1999
4060   6000     1301R        LDB =D-3  LVL
4061  42000      117X        JSX SUB4P
4062  31572    77572A        STA V32634  J
4063                       A387 EQU *
4063                       A386 EQU *
4063   6000     1301R        LDB =D-3  LVL
4064  42000       30X        JSX .LDAP
4065  42000      121X        JSX MOD4
4066            3312R        DEF =D100
4067  21572    77572A        ADA V32634  J
4070  42000      122X        JSX CNV42
4071  42000       34X        JSX .STRD
4072           77655A        DEF V32685  LTEMP2
4073   1660    77660A        LDA V36 BCDC
4074 170507                  SAR 8
4075   6000     4167R        LDB =B240
4076  75617                  MPY
4077  21660    77660A        ADA V36 BCDC
4100  42000      104X        JSX .TURN
4101            3242R        DEF =B377
4102           77434A        DEF V32540  IF2
4103  31434    77434A        STA V32540  IF2
```

```
4104   1435  77435A    LDA V32541   IF1
4105 172006            SAP A388
4106   1573  77573A    LDA V32635   I
4107  22000   2276R    ADA =D2
4110  42000     60X    JSX .ARAY
4111          3550R    DEF V369   REFLOG
4112  66000   4116R    JMP A389
4113                  A388 EQU *
4113   1573  77573A    LDA V32635   I
4114  42000     60X    JSX .ARAY
4115          3566R    DEF V374   REFLIN
4116                  A389 EQU *
4116  42000    104X    JSX .TURN
4117          3166R    DEF =B1777
4120         77435A    DEF V32541   IF1
4121  31435  77435A    STA V32541   IF1
4122  42000   3243R    JSM P335   W1F1
4123   1434  77434A    LDA V32540   IF2
4124  42000    105X    JSX .W5
4125  42000   2303R    JSM P277   GOFSET
4126  70540            PWC A
4127  42000   3406R    JSM P348   RFLC
4130  70540            PWC A
4131  42000     37X    JSX .LDBI
4132         77655A    DEF V32685   LTEMP2
4133  42000     50X    JSX CNV24
4134  70540            PWC A
4135  42000   1665R    JSM P245   RLAD
4136  42000     57X    JSX ADD4T
4137  42000    116X    JSX SUB4T
4140  21706  77706A    ADA V31 ROFSET
4141  42000    116X    JSX SUB4T
4142  22000   4170R    ADA =D-99
4143  70540            PWC A
4144   1677  77677A    LDA V17 RFAT
4145  52000   2406R    AND =D7
4146  21573  77573A    ADA V32635   I
4147  22000   3526R    ADA =D-10
4150  70540            PWC A
4151  42000   2070R    JSM P261   IFBW
4152 170040            TCA
4153  22000   1704R    ADA =D6
4154 170140            CMA
4155 170416            AAR 15
4156 170600            SAL 1
4157  42000     57X    JSX ADD4T
4160   6000   3312R    LDB =D100
4161  75617            MPY
4162  42000     57X    JSX ADD4T
4163  31700  77700A    STA V22 RLVL
4164   1730  77730A    LDA V30 RFLAG
4165  42000  15050R    JSM P223   AMPU
4166  66000     31X    JMX .RTNA
4167    240
4170 177635
4167                   LIT
4171                  P390   EQU * LGDB
4171   6000   1277R    LDB =D-1
4172  42000     27X    JSX .ARGA
4173  42000    104X    JSX .TURN
4174          4207R    DEF =B160000
4175         77435A    DEF V32541   IF1
4176  31435  77435A    STA V32541   IF1
4177  42000   3243R    JSM P335   W1F1
4200   2000   1704R    LDA =D6
4201  42000   2314R    JSM P279   SBLK
4202  42000   3221R    JSM P333   CORREK
4203 172003            SAP A391
4204   1700  77700A    LDA V22 RLVL
4205  42000   3530R    JSM P355   REFLEV
4206                  A391 EQU *
4206  66000     31X    JMX .RTNA
4207 160000
4207                   LIT
4210                  P392   EQU * IFBWOUT
4210   6000   1277R    LDB =D-1
4211  42000     27X    JSX .ARGA
4212   1572  77572A    LDA V32634   J
4213  70540            PWC A
4214   1434  77434A    LDA V32540   IF2
4215  70540            PWC A
4216   6000   1301R    LDB =D-3   I
4217  42000     30X    JSX .LDAP
4220 170040            TCA
4221  22000   1704R    ADA =D6
4222 172006            SAP A393
4223   6000   1301R    LDB =D-3   I
4224  42000     30X    JSX .LDAP
4225  22000   2276R    ADA =D2
4226   6000   1301R    LDB =D-3   I
4227  42000     67X    JSX .STAP
4230                  A393 EQU *
4230   6000   1301R    LDB =D-3   I
4231  42000     30X    JSX .LDAP
4232 170613            SAL 12
4233  42000    104X    JSX .TURN
4234          4256R    DEF =B170000
4235         77434A    DEF V32540   IF2
4236  31434  77434A    STA V32540   IF2
```

```
4237    6000   2172R    LDB =D13
4240   42000    107X    JSX .WS5
4241   70760            WWC A
4242   31572  77572A    STA V32634   J
4243   11434  77434A    CPA V32540   IF2
4244   66000   4310R    JMP A394
4245   42000   2762R    JSM P314   AVGRSI
4246   42000   3221R    JSM P333   CORREK
4247  172010            SAP A395
4250    1700  77700A    LDA V22 RLVL
4251   42000   3530R    JSM P355   REFLEV
4252   42000     37X    JSX .LDB1
4253          77665A    DEF V8   CFREQ
4254   42000   6750R    JSM P222   TUNE
4255   66000   4306R    JMP A396
4256  170000
4256                    LIT
4257                    A395 EQU *
4257    1572  77572A    LDA V32634   J
4260  170513            SAR 12
4261   31572  77572A    STA V32634   J
4262    6000   1301R    LDB =D-3   I
4263   42000     30X    JSX .LDAP
4264  170040            TCA
4265   22000   1704R    ADA =D6
4266  172005            SAP A399
4267    1572  77572A    LDA V32634   J
4270  170040            TCA
4271   22000   1704R    ADA =D6
4272  172012            SAP A398
4273                    A399 EQU *
4273    6000   1301R    LDB =D-3   I
4274   42000     30X    JSX .LDAP
4275  170040            TCA
4276   22000   1704R    ADA =D6
4277  172407            SAM A397
4300    1572  77572A    LDA V32634   J
4301  170040            TCA
4302   22000   1704R    ADA =D6
4303  172003            SAP A397
4304                    A398 EQU *
4304    1700  77700A    LDA V22 RLVL
4305   42000   3530R    JSM P355   REFLEV
4306                    A397 EQU *
4306                    A396 EQU *
4306    2000   1457R    LDA =D1
4307   42000   2314R    JSM P279   SBLK
4310                    A394 EQU *
4310   42000   3233R    JSM P334   IFSAV
4311   70760            WWC A
4312   31572  77572A    STA V32634   J
4313   66000     31X    JMX .RTNA
4314                    P400   EQU *  VBWOUT
4314    6000   1277R    LDB =D-1
4315   42000     27X    JSX .ARGA
4316    1434  77434A    LDA V32540   IF2
4317   70540            PWC A
4320    6000   1301R    LDB =D-3   I
4321   42000     30X    JSX .LDAP
4322  170040            TCA
4323   22000   1704R    ADA =D6
4324  172006            SAP A401
4325    6000   1301R    LDB =D-3   I
4326   42000     30X    JSX .LDAP
4327   22000   2276R    ADA =D2
4330    6000   1301R    LDB =D-3   I
4331   42000     67X    JSX .STAP
4332                    A401 EQU *
4332    6000   1301R    LDB =D-3   I
4333   42000     30X    JSX .LDAP
4334  170607            SAL 8
4335   42000    104X    JSX .TURN
4336           4355R    DEF =B7400
4337          77434A    DEF V32540   IF2
4340   31434  77434A    STA V32540   IF2
4341    6000   2172R    LDB =D13
4342   42000    107X    JSX .WS5
4343   70760            WWC A
4344    6000   1301R    LDB =D-3   I
4345   42000     67X    JSX .STAP
4346   11434  77434A    CPA V32540   IF2
4347   66000   4351R    JMP A402
4350   42000   2762R    JSM P314   AVGRSI
4351                    A402 EQU *
4351    2000   2276R    LDA =D2
4352   42000   2314R    JSM P279   SBLK
4353   42000   3233R    JSM P334   IFSAV
4354   66000     31X    JMX .RTNA
4355    7400
4355                    LIT
4356                    P403   EQU *  EXPSIX
4356    6000   1277R    LDB =D-1
4357   42000     27X    JSX .ARGA
4360   42000     33X    JSX .UPC4
4361  170040            TCA
4362  172404            SAM A404
4363   42000     53X    JSX .LDSI
4364           1463R    DEF =D0
```

```
4365  66000   4410R     JMP A405
4366                   A404 EQU *
4366   6000   1301R     LDB =D-3   ST
4367  42000     30X     JSX .LDAP
4370  22000   1277R     ADA =D-1
4371  42000    113X     JSX DIV4
4372          1704R     DEF =D6
4373  22000   1277R     ADA =D-1
4374  70540             PWC A
4375   6000   1301R     LDB =D-3   SI
4376  42000     30X     JSX .LDAP
4377  22000   1277R     ADA =D-1
4400  42000    121X     JSX MOD4
4401          1704R     DEF =D6
4402  22000   1457R     ADA =D1
4403  42000     60X     JSX .ARAY
4404           552R     DEF V189   LGTB
4405  42000     61X     JSX .LDSA
4406  70761             WWC B
4407  42000    123X     JSX .DSFT
4410                   A405 EQU *
4410  66000     31X    JMX .RTNA
4411                   P406  EQU * EXP2
4411   6000   1277R     LDB =D-1
4412  42000     27X     JSX .ARGA
4413  42000     33X     JSX .UPC4
4414 170600             SAL 1
4415  22000   1277R     ADA =D-1
4416  42000   4356R     JSM P403   EXPSIX
4417  66000     31X    JMX .RTNA
4420                   P407  EQU * EXP3
4420   6000   1277R     LDB =D-1
4421  42000     27X     JSX .ARGA
4422  42000     33X     JSX .UPC4
4423   6000   2107R     LDB =D3
4424  75617             MPY
4425  22000   1457R     ADA =D1
4426  42000   4356R     JSM P403   EXPSIX
4427  66000     31X    JMX .RTNA
4430                   P408  EQU * LGSCL
4430 174517             CLB
4431  42000     56X     JSX .ARGS
4432  44016     16A     ISZ C
4433   1435  77435A     LDA V32541   IF1
4434 170514             SAR 13
4435  52000   2107R     AND =D3
4436 170040             TCA
4437  22000   2411R     ADA =D4
4440  42000   4411R     JSM P406   EXP2
4441  42000     50X     JSX CNV24
4442  66000     31X    JMX .RTNA
4443                   P409  EQU * DBMA
4443   6000   1277R     LDB =D-1
4444  42000     27X     JSX .ARGA
4445  42000     33X     JSX .UPC4
4446  42000   4430R     JSM P408   LGSCL
4447  70540             PWC A
4450   6000   1301R     LDB =D-3   ADC
4451  42000     30X     JSX .LDAP
4452 170604             SAL 5
4453 170404             AAR 5
4454 170040             TCA
4455  22000   4470R     ADA =D1000
4456  42000    114X     JSX MPY4T
4457  42000    122X     JSX CNV42
4460  42000     36X     JSX .SAR2
4461   1700  77700A     LDA V22 RLVL
4462  42000    122X     JSX CNV42
4463   2000   1463R     LDA =D0
4464  75541             MLY
4465  42000    124X     JSX SUB2T
4466  42000   1705R     JSM P246   DBSHFT
4467  66000     31X    JMX .RTNA
4470   1750

4470                    LIT
4471                   P410  EQU * DBMWV
4471   6000   1277R     LDB =D-1
4472  42000     27X     JSX .ARGA
4473  42000     33X     JSX .UPC4
4474   1435  77435A     LDA V32541   IF1
4475 172402             SAM *+2
4476  66000   4535R     JMP A411
4477   6000   1301R     LDB =D-3   A
4500  42000     30X     JSX .LDAP
4501  42000   4443R     JSM P409   DBMA
4502  42000     36X     JSX .SAR2
4503   1675  77675A     LDA V15 BLEDS
4504 170615             SAL 14
4505 172010            SAP A412
4506  42000   2070R     JSM P261   IFBW
4507  42000    125X     JSX CNV43
4510  42000    126X     JSX MPY3
4511          4532R     DEF =H500
4512  42000    127X     JSX MIN3
4513          1300R     DEF =H200
4514  66000   4517R     JMP A413
4515                   A412 EQU *
4515  42000     53X     JSX .LDSI
```

```
4516               1463R    DEF =D0
4517                     A413 EQU *
4517   42000        130X    JSX ADD2T
4520    6000       2107R    LDB =D3 DBMNV
4521   42000         43X    JSX .STBP
4522    1730      77730A    LDA V30 KFLAG
4523   52000       4533R    AND =B140000
4524   22000       4534R    ADA =B40000
4525   72004                RZA A414
4526   42000       1736R    JSM P248  NANOV
4527    6000       2107R    LDB =D3 DBMNV
4530   42000         43X    JSX .STBP
4531                     A414 EQU *
4531   66000       4622R    JMP A415
4532    2400
4533  140000
4534   40000
4532                        LIT
4535                     A411 EQU *
4535    1700      77700A    LDA V22 KLVL
4536    6000       2204R    LDB =D10
4537   75617                MPY
4540   42000        122X    JSX CNV42
4541   42000       1705R    JSM P246  DBSHFT
4542   42000       1736R    JSM P248  NANOV
4543   42000         62X    JSX CNV21
4544   42000         41X    JSX MPY1
4545               4623R    DEF =F1.0E-3
4546   42000         36X    JSX .SAR2
4547    6000       1301R    LDB =D-3  A
4550   42000         30X    JSX .LDAP
4551  170604                SAL 5
4552  170404                AAR 5
4553   42000         45X    JSX CNV41
4554   42000         64X    JSX MPY1T
4555   42000         65X    JSX CNV12
4556    6000       2107R    LDB =D3 DBMNV
4557   42000         43X    JSX .STBP
4560    1675      77675A    LDA V15 BLEDS
4561  170615                SAL 14
4562  172405                SAM A417
4563    1730      77730A    LDA V30 KFLAG
4564  170515                SAR 14
4565   12000       2107R    CPA =D3
4566   66000       4622R    JMP A416
4567                     A417 EQU *
4567    6000       2107R    LDB =D3 DBMNV
4570   42000         66X    JSX .LDBP
4571   42000       2001R    JSM P251  DBM
4572   42000         36X    JSX .SAR2
4573    1675      77675A    LDA V15 BLEDS
4574  170615                SAL 14
4575  172010                SAP A418
4576   42000       2070R    JSM P261  IFBW
4577   42000        125X    JSX CNV43
4600   42000        126X    JSX MPY3
4601               4532R    DEF =H500
4602   42000        127X    JSX MIN3
4603               4627R    DEF =H55
4604   66000       4607R    JMP A419
4605                     A418 EQU *
4605   42000         53X    JSX .LDS1
4606               1463R    DEF =D0
4607                     A419 EQU *
4607   42000        130X    JSX ADD2T
4610    6000       2107R    LDB =D3 DBMNV
4611   42000         43X    JSX .STBP
4612    1730      77730A    LDA V30 KFLAG
4613  170515                SAR 14
4614   12000       2107R    CPA =D3
4615   66000       4617R    JMP *+2
4616   66000       4622R    JMP A420
4617   42000       1736R    JSM P248  NANOV
4620    6000       2107R    LDB =D3 DBMNV
4621   42000         43X    JSX .STBP
4622                     A420 EQU *
4622                     A416 EQU *
4622                     A415 EQU *
4622   66000        131X    JMX .RINL
4623  1.0E-3
4627     125
4623                        LIT
4630                     P421 EQU * RDBMV
4630    6000       1277R    LDB =D-1
4631   42000         27X    JSX .ARGA
4632   42000         33X    JSX .UPC4
4633    1675      77675A    LDA V15 BLEDS
4634   62000       2411R    IOR =D4
4635   31675      77675A    STA V15 BLEDS
4636    6000       1301R    LDB =D-3  A
4637   42000         30X    JSX .LDAP
4640   42000       4471R    JSM P410  DBMNV
4641   42000         62X    JSX CNV21
4642   42000         34X    JSX .STRD
4643              77742A    DEF V32738  X
4644    1675      77675A    LDA V15 BLEDS
4645   52000       2153R    AND =B177773
4646   31675      77675A    STA V15 BLEDS
```

```
4647   1730  77730A     LDA V30 KFLAG
4650 170515             SAR 14
4651   4000             LDB A
4652  26000   1301R     ADB =B177775
4653   2000   4663R     LDA =B1100
4654  76402            SZB A422
4655   2000   2410R     LDA =B200
4656                   A422 EQU *
4656 170040             TCA
4657  21742  77742A     ADA V32738  IX
4660  31742  77742A     STA V32738  IX
4661  30020     20A     STA V1  AR2
4662  66000     31X    JMX .RTNA
4663   1100
4663                    LIT
4664                   P423  EQU * VDCOP
4664  66000   4730R     JMP A424
4665                   T425 EQU *
4665                   D426  OCT 0,1010,103425,10000 20887151000
4671                   D427  OCT 0,1421,13424,4210 31117140888
4675                   D428  OCT 0,1050,103064,41042 22886344222
4701                   D429  OCT 0,1461,13064,51042  33116345222
4705                   D430  OCT 0,51104,43424,24210 524447142888
4711                   D431  OCT 0,51124,43425,30000 525447153000
4715                   D432  OCT 0,73050,103024,43146  762886144666
4721                   D433  OCT 0,73010,103424,13567  760887141777
4725          4665R    V434 DEF T425 NXTVDC
4726                    OCT 177777  177777
4727                    OCT 40  40
4730                   A424  EQU *
4730   5702  77702A     LDB V24 VIDCON
4731 174603             SBL 4
4732   2000   5015R     LDA =B4007
4733 176010            SBP A435
4734   1566  77566A     LDA V32630  KEYCODE
4735  22000   5016R     ADA =B-141
4736  70540             PWC A
4737  42000     37X     JSX .LDB1
4740          5017R     DEF =F887007887007
4741  70761             WWC B
4742  42000    132X     JSX .FDIG
4743                   A435 EQU *
4743  31572  77572A     STA V32634  J
4744  12000   2203R     CPA =D8
4745  66000   4747R     JMP *+2
4746  66000   4751R     JMP A436
4747   2000   5015R     LDA =B4007
4750  31572  77572A     STA V32634  J
4751                   A436 EQU *
4751   1566  77566A     LDA V32630  KEYCODE
4752  22000   5016R     ADA =B-141
4753  70540             PWC A
4754   1702  77702A     LDA V24 VIDCON
4755 170603             SAL 4
4756 172012            SAP A437
4757   1676  77676A     LDA V16 ILEDS
4760 170610             SAL 9
4761 172004            SAP A438
4762  42000     37X     JSX .LDB1
4763          5023R     DEF =F768888148888
4764  66000   4767R     JMP A439
4765                   A438 EQU *
4765  42000     37X     JSX .LDB1
4766          5027R     DEF =F28888148888
4767                   A439 EQU *
4767  66000   4776R     JMP A440
4770                   A437 EQU *
4770   1702  77702A     LDA V24 VIDCON
4771  52000   2406R     AND =D7
4772  22000   1457R     ADA =D1
4773  42000    133X     JSX .LRAY
4774          4725R     DEF V434  NXTVDC
4775  42000    134X     JSX .LDBA
4776                   A440 EQU *
4776  70761             WWC B
4777  42000    132X     JSX .FDIG
5000  31573  77573A     STA V32635  I
5001 170613             SAL 12
5002 172004            SAP A441
5003   1702  77702A     LDA V24 VIDCON
5004  62000   2277R     IOR =B4000
5005  66000   5012R     JMP A442
5006                   A441 EQU *
5006   1573  77573A     LDA V32635  I
5007  42000    104X     JSX .TURN
5010         77572A     DEF V32634  J
5011         77702A     DEF V24 VIDCON
5012                   A442 EQU *
5012  31702  77702A     STA V24 VIDCON
5013  42000   2650R     JSM P304  UNCAL
5014 170201             RET 1
5015   4007
5016 177637
5017 887007887007
5023 768888148888
5027 28888148888
```

```
5015                           LIT
5033                           P443  EQU * CPERIOD
5033 174517                      CLB
5034  42000         56X          JSX .ARGS
5035  44016         16A          ISZ C
5036   5730     77730A           LDB V30 KFLAG
5037 174605                      SBL 6
5040   1577     77577A           LDA V32639  CIBASE
5041 176412                     SBM A444
5042  42000         37X          JSX .LDBI
5043             5054R           DEF =F443020000000
5044   5605     77605A           LDB V32645  SCANSL
5045  42000        132X          JSX .FDIG
5046  70540                      PWC A
5047   1604     77604A           LDA V32644  SAIN
5050 170515                      SAR 14
5051  52000      1457R           AND =D1
5052  42000         57X          JSX ADD4T
5053                           A444 EQU *
5053  66000         31X          JMA .RTNA
5054 443020000000
5054                            LIT
5060                           P445  EQU * WCNT
5060                           A446 EQU *
5060   6000      2276R           LDB =D2
5061  42000        110X          JSX .RS7
5062  31572     77572A           STA V32634   J
5063 170612                      SAL 11
5064 172014                     SAP A447
5065  76213                      SSS A447
5066  76772                      SHC A446
5067   1575     77575A           LDA V32637   K
5070 170500                      SAR 1
5071  12000      1457R           CPA =D1
5072  66000      5074R           JMP *+2
5073  66000      5060R           JMP A446
5074   1572     77572A           LDA V32634   J
5075  52000      2406R           AND =D7
5076  22000      5115R           ADA =D-7
5077 172061                     SAP A446
5100                           A447 EQU *
5100  76216                      SSS A448
5101   1572     77572A           LDA V32634   J
5102 170612                      SAL 11
5103 172013                     SAP A449
5104   2000      1457R           LDA =D1
5105  42000      3214R           JSM P332   WAIT
5106   1575     77575A           LDA V32637   K
5107 170600                      SAL 1
5110  42000        104X          JSX .TURN
5111             1704R           DEF =D6
5112            77616A           DEF V32654   XFLAG
5113  31616     77616A           STA V32654   XFLAG
5114  66000     32476R           JMP L193   RESET
5115 177771
5115                            LIT
5116                           A449 EQU *
5116                           A448 EQU *
5116 170201                      RET 1
5117                           P450  EQU * COUNTIF
5117   6000      1277R           LDB =D-1
5120  42000         27X          JSX .ARGA
5121  42000         33X          JSX .UPC4
5122  42000         53X          JSX .LDSI
5123             1463R           DEF =D0
5124  42000         34X          JSX .STRD
5125            77655A           DEF V32685   LTEMP2
5126   6000      1301R           LDB =D-3   N
5127  42000         30X          JSX .LDAP
5130  12000      1704R           CPA =D6
5131  66000      5133R           JMP *+2
5132  66000      5140R           JMP A451
5133   1605     77605A           LDA V32645   SCANSL
5134  52000      2276R           AND =D2
5135  22000      1457R           ADA =D1
5136  31573     77573A           STA V32635   I
5137  66000      5213R           JMP A452
5140                           A451 EQU *
5140   1616     77616A           LDA V32654   XFLAG
5141 170613                      SAL 12
5142 172016                     SAP A453
5143   2000      1704R           LDA =D6
5144  70540                      PWC A
5145  42000      5033R           JSM P443   CPERIOD
5146  70540                      PWC A
5147   6000      1301R           LDB =D-3   N
5150  42000         30X          JSX .LDAP
5151  22000      1301R           ADA =D-3
5152  42000        135X          JSX .NEQL
5153 170516                      SAR 15
5154  42000         57X          JSX ADD4T
5155  42000      2132R           JSM P265  LIMIT
5156  31573     77573A           STA V32635   I
5157  66000      5213R           JMP A454
5160                           A453 EQU *
5160   5605     77605A           LDB V32645   SCANSL
5161   1600     77600A           LDA V32640   CTIM
5162  76005                      RZB A455
```

```
5163  42000     2070R     JSM P261   IFBW
5164 170500               SAR 1
5165 170040               ICA
5166  22000     2565R     ADA =D11
5167                     A455 EQU *
5167  31573    77573A     STA V32635  I
5170   6000     1301R     LDB =D-3  N
5171  42000       30X     JSX .LDAP
5172  12000     2107R     CPA =D3
5173  66000     5175R     JMP *+2
5174  66000     5204R     JMP A456
5175   2000     2276R     LDA =D2
5176  70540               PWC A
5177   1573    77573A     LDA V32635  I
5200  22000     5115R     ADA =D-7
5201  42000     2132R     JSM P265  LIMIT
5202  22000     2107R     ADA =D3
5203  66000     5212R     JMP A457
5204                     A456 EQU *
5204   2000     2405R     LDA =D5
5205  70540               PWC A
5206   1573    77573A     LDA V32635  I
5207  22000     1363R     ADA =D-4
5210  42000     2132R     JSM P265  LIMIT
5211  22000     1457R     ADA =D1
5212                     A457 EQU *
5212  31573    77573A     STA V32635  I
5213                     A454 EQU *
5213                     A452 EQU *
5213 170601               SAL 2
5214  70540               PWC A
5215   6000     1301R     LDB =D-3  N
5216  42000       30X     JSX .LDAP
5217  52000     2107R     AND =D3
5220  42000      136X     JSX .ORI
5221   6000     2405R     LDB =D5
5222  42000       75X     JSX .WS4
5223  42000     5060R     JSM P445  WCNT
5224   6000     2405R     LDB =D5
5225  42000       74X     JSX .RS5
5226  31657    77657A     STA V35 BCDB
5227  42000      137X     JSX .R6
5230  31660    77660A     STA V36 BCDC
5231  76604              SSC A458
5232  42000       37X     JSX .LDBI
5233            5246R     DEF =F20000000
5234  66000     5245R     JMP A459
5235                     A458 EQU *
5235   1573    77573A     LDA V32635  I
5236 170040               TCA
5237  22000     1704R     ADA =D6
5240  70540               PWC A
5241  42000       37X     JSX .LDBI
5242           77655A     DEF V32685  LTEMP2
5243  70761               WWC B
5244  42000       51X     JSX .DLFT
5245                     A459 EQU *
5245  66000       31X    JMX .RTNA
5246 20000000
5246                      LIT
5252                     P460  EQU * YIGSLEW
5252 174517               CLB
5253  42000       56X     JSX .ARGS
5254  42000       33X     JSX .UPC4
5255   2000     1704R     LDA =D6
5256  42000     5117R     JSM P450  COUNTIF
5257  42000       34X     JSX .STRD
5260           77655A     DEF V32685  LTEMP2
5261   1573    77573A     LDA V32635  I
5262 170040               ICA
5263  22000     1704R     ADA =D6
5264  70540               PWC A
5265  42000       53X     JSX .LDSI
5266            1457R     DEF =D1
5267  70761               WWC B
5270  42000       51X     JSX .DLFT
5271  42000       34X     JSX .STRD
5272           77661A     DEF V32689  LTEMP1
5273  42000       53X     JSX .LDSI
5274            1463R     DEF =D0
5275   6000     2107R     LDB =D3 YIGSLEW
5276  42000       43X     JSX .STBP
5277   2000     1463R     LDA =D0
5300  31567    77567A     STA V32631  KEYCOL
5301                     A461 EQU *
5301  42000       37X     JSX .LDBI
5302           77655A     DEF V32685  LTEMP2
5303   6000     2107R     LDB =D3 YIGSLEW
5304  42000       63X     JSX MIN2P
5305   4020       20A     LDB AR2
5306  77202               SLB *+2,C
5307  34020       20A     STB AR2
5310  42000      140X     JSX MIN2
5311           77661A     DEF V32689  LTEMP1
5312   4020       20A     LDB AR2
5313  77407              RLB A463
5314  42000       37X     JSX .LDBI
5315            5340R     DEF =F8000000
```

```
5316   42000     140X     JSX MIN2
5317           77655A     DEF V32685  LTEMP2
5320    4020      20A     LDB AR2
5321   77024             SLB A462
5322                    A463 EQU *
5322    1567   77567A     LDA V32631  KEYCOL
5323   22000    5344R     ADA =D-4000
5324  172021             SAP A462
5325   45567   77567A     ISZ V32631  KEYCOL
5326                      NOP
5327   42000      37X     JSX .LDB1
5330           77655A     DEF V32685  LTEMP2
5331    6000    2107R     LDB =D3 Y1GSLE*
5332   42000      43X     JSX .STBP
5333    2000    1704R     LDA =D6
5334   42000    5117R     JSM P450  COUNTIF
5335   42000      34X     JSX .STRD
5336           77655A     DEF V32685  LTEMP2
5337   66000    5301R     JMP A461
5340 B000000
5344  170140
5340                     LIT
5345                    A462 EQU *
5345   42000      37X     JSX .LDB1
5346           77655A     DEF V32685  LTEMP2
5347   66000      31X    JMX .RTNA
5350                    P464  EQU * SROM
5350    1740   77740A     LDA V32736  EFLAG
5351  170604              SAL 5
5352  172404             SAM A465
5353    2000    1364R     LDA =B100
5354    6000    2411R     LDB =D4
5355   42000     112X     JSX .WS7
5356                    A465 EQU *
5356  170201              RET 1
5357                    P466  EQU * NOLOCK
5357    2000    1463R     LDA =D0
5360   31573   77573A     STA V32635  I
5361                    A467 EQU *
5361   45573   77573A     ISZ V32635  I
5362                      NOP
5363    1573   77573A     LDA V32635  I
5364  170040              TCA
5365   22000    3654R     ADA =D16
5366    4000              LDB A
5367    2000    1457R     LDA =D1
5370   42000     141X     JSX .SLFT
5371   51602   77602A     AND V32642  LKMSK
5372    6000    2107R     LDB =D3
5373   42000     107X     JSX .WS5
5374    6000    2276R     LDB =D2
5375   42000     110X     JSX .RS7
5376   31572   77572A     STA V32634  J
5377   52000    2406R     AND =D7
5400   12000    2406R     CPA =D7
5401   66000    5406R     JMP A468
5402    1573   77573A     LDA V32635  I
5403  170040              TCA
5404   22000    1704R     ADA =D6
5405  172054             SAP A467
5406                    A468 EQU *
5406    1573   77573A     LDA V32635  I
5407  170040              TCA
5410   22000    2276R     ADA =D2
5411  172024             SAP A469
5412    1573   77573A     LDA V32635  I
5413   22000    2417R     ADA =D-6
5414  172021             SAP A469
5415    1573   77573A     LDA V32635  I
5416   70540              P*C A
5417   42000    5350R     JSM P464  SROM
5420    1573   77573A     LDA V32635  I
5421  170040              TCA
5422   22000    3654R     ADA =D16
5423    4000              LDB A
5424    1602   77602A     LDA V32642  LKMSK
5425   42000     142X     JSX .RBIT
5426   31602   77602A     STA V32642  LKMSK
5427    1573   77573A     LDA V32635  I
5430  170040              TCA
5431   22000    5515R     ADA =D30
5432   42000    2501R     JSM P295  BLINK
5433   70760              W*C A
5434   31573   77573A     STA V32635  I
5435                    A469 EQU *
5435    1573   77573A     LDA V32635  1
5436   66000    5540R     JMP A470
5437                    C471 EQU *
5437    2000    3166R     LDA =D1023
5440   70540              P*C A
5441    1613   77613A     LDA V32651  DAC4
5442   22000    1301R     ADA =D-3
5443   42000    2132R     JSM P265  LIMIT
5444   31613   77613A     STA V32651  DAC4
5445    6000    1463R     LDB =D0
5446   42000     112X     JSX .WS7
5447   72005             RZA A472
5450    1602   77602A     LDA V32642  LKMSK
5451   52000    5516R     AND =B37777
```

```
5452  62000   4534R    IOR =B40000
5453  31602  77602A    STA V32642  LKMSK
5454                A472 EQU *
5454   2000   2405R    LDA =D5
5455  42000   3214R    JSM P332  WAIT
5456  66000   5541R    JMP A473
5457                C474 EQU *
5457   2000   3166R    LDA =D1023
5460  70540            PWC A
5461   1613  77613A    LDA V32651  DAC4
5462  22000   2107R    ADA =D3
5463  42000   2132R    JSM P265  LIMIT
5464  31613  77613A    STA V32651  DAC4
5465   6000   1463R    LDB =D0
5466  42000    112X    JSX .WS7
5467  12000   3166R    CPA =D1023
5470  66000   5472R    JMP *+2
5471  66000   5476R    JMP A475
5472   1602  77602A    LDA V32642  LKMSK
5473  52000   5516R    AND =B37777
5474  62000   5517R    IOR =B100000
5475  31602  77602A    STA V32642  LKMSK
5476                A475 EQU *
5476   2000   2405R    LDA =D5
5477  42000   3214R    JSM P332  WAIT
5500  66000   5541R    JMP A473
5501                C476 EQU *
5501  42000   2154R    JSM P269  WSPIN
5502  66000   5541R    JMP A473
5503                C477 EQU *
5503   2000   5520R    LDA =D24
5504  42000   2501R    JSM P295  BLINK
5505   1616  77616A    LDA V32654  XFLAG
5506 170610            SAL 9
5507 172013            SAP A478
5510  42000   5350R    JSM P464  SRQM
5511   1602  77602A    LDA V32642  LKMSK
5512  52000   5521R    AND =B175777
5513  31602  77602A    STA V32642  LKMSK
5514  66000   5530R    JMP A479
5515     36
5516  37777
5517 100000
5520     30
5521 175777
5515                   LIT
5522                A478 EQU *
5522   1616  77616A    LDA V32654  XFLAG
5523  62000   1364R    IOR =B100
5524  31616  77616A    STA V32654  XFLAG
5525  42000     37X    JSX .LDBI
5526         77665A    DEF V8  CFREQ
5527  42000   6750R    JSM P222  TUNE
5530                A479 EQU *
5530  66000   5541R    JMP A473
5531          5503R    DEF C477
5532          5501R    DEF C476
5533          5541R    DEF A473
5534          5541R    DEF A473
5535          5457R    DEF C474
5536          5437R    DEF C471
5537                   DEC -7
5540  42000    143X A470  JSX .CASE
5541                A473 EQU *
5541   1602  77602A    LDA V32642  LKMSK
5542   6000   2107R    LDB =D3
5543  42000    107X    JSX .WS5
5544 170201            RET 1
5545                P480  EQU * VTOSLEW
5545 174517            CLB
5546  42000     56X    JSX .ARGS
5547  42000     33X    JSX .UPC4
5550  42000     53X    JSX .LDSI
5551          1463R    DEF =D0
5552   6000   2107R    LDB =D3 VTOSLEW
5553  42000     43X    JSX .STBP
5554   2000   2107R    LDA =D3
5555  42000   5117R    JSM P450  COUNTIF
5556  42000     34X    JSX .STRD
5557         77655A    DEF V32685  LTEMP2
5560   1573  77573A    LDA V32635  I
5561 170040            TCA
5562  22000   1704R    ADA =D6
5563  70540            PWC A
5564  42000     53X    JSX .LDSI
5565          1457R    DEF =D1
5566  70761            WWC B
5567  42000     51X    JSX .DLFT
5570  42000     36X    JSX .SAR2
5571   1604  77604A    LDA V32644  SATN
5572 172004            SAP A481
5573  42000     53X    JSX .LDSI
5574          1463R    DEF =D0
5575  66000   5600R    JMP A482
5576                A481 EQU *
5576  42000     53X    JSX .LDSI
5577          1364R    DEF =H40
5600                A482 EQU *
```

```
5600  42000     144X   JSX ADD3I
5601  42000      34X   JSX .STRD
5602          77661A   DEF V32689   LTEMP1
5603   2000    1463R   LDA =D0
5604  31567   77567A   STA V32631   KEYCOL
5605                  A483 EQU *
5605   6000    2107R   LDB =D3 VTOSLEW
5606  42000      66X   JSX .LDBP
5607  42000     140X   JSX MIN2
5610          77655A   DEF V32685   LTEMP2
5611   4020      20A   LDB AR2
5612  77202            SLB *+2,C
5613  34020      20A   STB AR2
5614  42000     140X   JSX MIN2
5615          77661A   DEF V32689   LTEMP1
5616   4020      20A   LDB AR2
5617  77022           SLB A484
5620   1567   77567A   LDA V32631   KEYCOL
5621  22000    5640R   ADA =D-200
5622 172017           SAP A484
5623  45567   77567A   ISZ V32631   KEYCOL
5624                   NOP
5625  42000      37X   JSX .LDBI
5626          77655A   DEF V32685   LTEMP2
5627   6000    2107R   LDB =D3 VTOSLEW
5630  42000      43X   JSX .STBP
5631   2000    2107R   LDA =D3
5632  42000    5117R   JSM P450   COUNTIF
5633   2000    2107R   LDA =D3
5634  42000    5117R   JSM P450   COUNTIF
5635  42000      34X   JSX .STRD
5636          77655A   DEF V32685   LTEMP2
5637  66000    5605R   JMP A483
5640 177470
5640                  LIT
5641                 A484 EQU *
5641  42000      37X   JSX .LDBI
5642          77655A   DEF V32685   LTEMP2
5643  66000      31X   JMX .RTNA
5644                 P485  EQU * KSWP
5644   1604   77604A   LDA V32644   SATN
5645  52000    4534R   AND =B40000
5646  62000    1770R   IOR =B20000
5647   6000    1457R   LDB =D1
5650  42000      75X   JSX .WS4
5651 170201            RET 1
5652                 P486  EQU * SWPON
5652   1604   77604A   LDA V32644   SATN
5653   6000    1457R   LDB =D1
5654  42000      75X   JSX .WS4
5655 170201            RET 1
5656                 P487  EQU * VTOTUNE
5656   1605   77605A   LDA V32645   SCANSL
5657  73002            SLA A488
5660  42000    5644R   JSM P485   KSWP
5661                 A488 EQU *
5661   2000    2416R   LDA =D29
5662  42000    2434R   JSM P285   BLKOF
5663   2000    1300R   LDA =D512
5664  31615   77615A   STA V32653   DAC1
5665   2000    1463R   LDA =D0
5666  31573   77573A   STA V32635   I
5667   1605   77605A   LDA V32645   SCANSL
5670  73006            SLA A489
5671   1604   77604A   LDA V32644   SATN
5672  52000    4533R   AND =B140000
5673  62000    1770R   IOR =B20000
5674   6000    1457R   LDB =D1
5675  42000      75X   JSX .WS4
5676                 A489 EQU *
5676                 A490 EQU *
5676   1614   77614A   LDA V32652   DAC2
5677  21573   77573A   ADA V32635   I
5700  31614   77614A   STA V32652   DAC2
5701   1615   77615A   LDA V32653   DAC1
5702   6000    1463R   LDB =D0
5703  42000      75X   JSX .WS4
5704   1614   77614A   LDA V32652   DAC2
5705  42000     105X   JSX .WS
5706  42000    5545R   JSM P480   VTOSLEW
5707  42000     145X   JSX SUB2
5710          77641A   DEF V32673   VTOFREQ
5711  42000      34X   JSX .STRD
5712          77655A   DEF V32685   LTEMP2
5713  42000     146X   JSX DIV3
5714           5741R   DEF =H7500
5715  42000      50X   JSX CNV24
5716  31573   77573A   STA V32635   I
5717  72404           SZA A491
5720   1614   77614A   LDA V32652   DAC2
5721  52000    5742R   AND =B176000
5722  72454           SZA A490
5723                 A491 EQU *
5723   1614   77614A   LDA V32652   DAC2
5724  52000    5742R   AND =B176000
5725  72416           SZA A492
5726   2000    3166R   LDA =D1023
5727  70540            PWC A
```

```
5730   1614  77614A    LDA V32652  DAC2
5731  42000   2132R    JSM P265  LIMIT
5732  31614  77614A    STA V32652  DAC2
5733   6000   1463R    LDB =D0
5734  42000    107X    JSX .WS5
5735   2000   2416R    LDA =D29
5736  42000   2501R    JSM P295   BLINK
5737  42000   5350R    JSM P464   SROM
5740  66000   5755R    JMP A493
5741  72400
5742 176000

5741                   LIT
5743                  A492 EQU *
5743   2000   3166R    LDA =D1023
5744  70540            PWC A
5745  42000     37X    JSX .LDBI
5746         77655A    DEF V32685  LTEMP2
5747  42000     50X    JSX CNV24
5750  42000    113X    JSX DIV4
5751          3654R    DEF =D16
5752  22000   1300R    ADA =D512
5753  42000   2132R    JSM P265  LIMIT
5754  31615  77615A    STA V32653  DAC1
5755                  A493 EQU *
5755   1615  77615A    LDA V32653  DAC1
5756   6000   1463R    LDB =D0
5757  42000     75X    JSX .WS4
5760   1605  77605A    LDA V32645  SCANSL
5761  73002            SLA A494
5762  42000   5652R    JSM P486  SWPON
5763                  A494 EQU *
5763 170201            RET 1
5764                  P495  EQU * FRQC
5764 174517            CLB
5765  42000     56X    JSX .ARGS
5766  42000     33X    JSX .UPC4
5767  42000   3221R    JSM P333  CORREK
5770 172006            SAP A496
5771  42000   2070R    JSM P261  IFBW
5772  42000    133X    JSX .LRAY
5773            12R    DEF V37 BWFRQ
5774  42000    134X    JSX .LDBA
5775  66000   6000R    JMP A497
5776                  A496 EQU *
5776  42000     53X    JSX .LDSI
5777          1463R    DEF =D0
6000                  A497 EQU *
6000  42000    145X    JSX SUB2
6001         77707A    DEF V11 FOFSET
6002  42000     36X    JSX .SAR2
6003   1605  77605A    LDA V32645  SCANSL
6004 170615            SAL 14
6005 172004            SAP A498
6006  42000     53X    JSX .LDSI
6007          6015R    DEF =H7000
6010  66000   6013R    JMP A499
6011                  A498 EQU *
6011  42000     53X    JSX .LDSI
6012          1463R    DEF =D0
6013                  A499 EQU *
6013  42000    130X    JSX ADD2T
6014  66000     31X    JMX .RTNA
6015  70000

6015                   LIT
6016                  P500  EQU * STUNE
6016   6000   1363R    LDB =D-4
6017  42000     32X    JSX .ARGL
6020  42000   5764R    JSM P495  FRQC
6021   6000   1375R    LDB =D-9  MFREQ
6022  42000    147X    JSX ADD2P
6023   6000   1375R    LDB =D-9  MFREQ
6024  42000     43X    JSX .STBP
6025  42000    150X    JSX ADD2
6026          6102R    DEF =F42500000
6027  42000    151X    JSX DIV2
6030          5246R    DEF =F20000000
6031  42000    152X    JSX CNV23
6032     23     23A    LDA AR2+3
6033  31746  77746A    STA V32742  N
6034   6000   1375R    LDB =D-9  MFREQ
6035  42000     66X    JSX .LDBP
6036  42000    150X    JSX ADD2
6037          6106R    DEF =F1400000
6040  42000     36X    JSX .SAR2
6041  42000     53X    JSX .LDSI
6042         77746A    DEF V32742  N
6043  42000    153X    JSX MPY2
6044          5246R    DEF =F20000000
6045  42000    124X    JSX SUB21
6046  42000     34X    JSX .STRD
6047         77661A    DEF V32689  LTEMP1
6050  42000     37X    JSX .LDBI
6051          6112R    DEF =F4750000
6052  42000    140X    JSX MIN2
6053         77661A    DEF V32689  LTEMP1
6054  42000    151X    JSX DIV2
6055          6116R    DEF =F4000000
6056  42000     50X    JSX CNV24
```

```
6057 170040             TCA
6060  22000     2521R   ADA =D17
6061  31570    77570A   STA V32632  M
6062  42000      125X   JSX CNV43
6063  42000      127X   JSX MIN3
6064             6122R  DEF =H17
6065  42000      153X   JSX MPY2
6066             6116R  DEF =F4000000
6067  42000      150X   JSX ADD2
6070             6112R  DEF =F4750000
6071  42000      140X   JSX MIN2
6072            77661A  DEF V32689  LTEMP1
6073  42000      151X   JSX DIV2
6074             6123R  DEF =F250000
6075  42000       50X   JSX CNV24
6076  52000     3527R   AND =D14
6077  31571    77571A   STA V32633  L
6100  42000     2154R   JSM P269  *SPIN
6101  66000       31X   JMX .RTNA
6102 42500000
6106 1400000
6112 4750000
6116 4000000
6122      27
6123 250000
6102                   LIT
6127                   P501  EQU * MKIS
6127 174517             CLB
6130  42000       56X   JSX .ARGS
6131  44016       16A   ISZ C
6132   1723    77723A   LDA V26 MKRMODE
6133  42000      135X   JSX .NEQL
6134  70540             P*C A
6135   1605    77605A   LDA V32645  SCANSL
6136  42000      135X   JSX .NEQL
6137  51675    77675A   AND V15 BLEDS
6140  61616    77616A   IOR V32654  XFLAG
6141 170601             SAL 2
6142  70540             P*C A
6143   1740    77740A   LDA V32736  EFLAG
6144  52000     6157R   AND =B10003
6145  42000      111X   JSX .EQL
6146 170140             CMA
6147  42000      136X   JSX .ORT
6150  42000      154X   JSX .ANDT
6151  70540             P*C A
6152   1730    77730A   LDA V30 KFLAG
6153 170614             SAL 13
6154 170140             CMA
6155  42000      154X   JSX .ANDI
6156  66000       31X  JMX .RTNA
6157  10003
6157                   LIT
6160                   P502  EQU * EOS
6160  42000     5644R   JSM P485  KSWP
6161   1603    77603A   LDA V32643  PLUCK
6162 170603             SAL 4
6163 172002             SAP *+2
6164  66000     6245R   JMP A503
6165   1616    77616A   LDA V32654  XFLAG
6166  52000     2302R   AND =B26
6167  22000     6231R   ADA =B177754
6170  72004            RZA A504
6171  42000       37X   JSX .LDBI
6172            77665A  DEF V8  CFREQ
6173  42000     6016R   JSM P500  STUNE
6174                   A504 EQU *
6174   1616    77616A   LDA V32654  XFLAG
6175  52000     6232R   AND =B177761
6176  31616    77616A   STA V32654  XFLAG
6177   1730    77730A   LDA V30 KFLAG
6200 170614             SAL 13
6201 172434            SAM A505
6202  42000     6127R   JSM P501  MKIS
6203 172003            SAP A506
6204   1721    77721A   LDA V25 MRKR
6205  66000     6207R   JMP A507
6206                   A506 EQU *
6206   2000     3112R   LDA =D1001
6207                   A507 EQU *
6207   6000     2221R   LDB =D9
6210  42000       72X   JSX .WS6
6211   2000     1457R   LDA =D1
6212  42000      106X   JSX .W7
6213   1676    77676A   LDA V16 TLEDS
6214  52000     6233R   AND =B600
6215  22000     6234R   ADA =B177200
6216  72007            RZA A508
6217   1702    77702A   LDA V24 VIDCON
6220 170140             CMA
6221  42000      104X   JSX .TURN
6222             1457R  DEF =D1
6223            77702A  DEF V24 VIDCON
6224  31702    77702A   STA V24 VIDCON
6225                   A508 EQU *
6225   2000     1463R   LDA =D0
6226   6000     2203R   LDB =D8
6227  42000      112X   JSX .WS7
```

```
6230  66000    6245R     JMP A509
6231 177754
6232 177761
6233    600
6234 177200
6231                    LIT
6235                   A505 EQU *
6235   2000    6350R     LDA =D4073
6236   6000    2221R     LDB =D9
6237  42000      72X     JSX .WS6
6240   2000    6351R     LDA =D3073
6241  42000     106X     JSX .W7
6242   2000    6352R     LDA =D3072
6243   6000    2203R     LDB =D8
6244  42000     112X     JSX .WS7
6245                   A509 EQU *
6245                   A503 EQU *
6245   1616   77616A     LDA V32654   XFLAG
6246 170603              SAL 4
6247 172002              SAP *+2
6250  66000    6577R     JMP A510
6251   1616   77616A     LDA V32654   XFLAG
6252 170612              SAL 11
6253 172402              SAM *+2
6254  66000    6372R     JMP A511
6255   1603   77603A     LDA V32643   PLOCK
6256  52000    6353R     AND =B7777
6257  62000    6354R     IOR =B150000
6260  31603   77603A     STA V32643   PLOCK
6261  52000    2645R     AND =B137777
6262   6000    1457R     LDB =D1
6263  42000      72X     JSX .WS6
6264   2000    2107R     LDA =D3
6265  42000    3214R     JSM P332   WAIT
6266   2000    2107R     LDA =D3
6267  42000    3214R     JSM P332   WAIT
6270   2000    2107R     LDA =D3
6271  42000    3214R     JSM P332   WAIT
6272   2000    3166R     LDA =D1023
6273  70540              PWC A
6274  42000    5252R     JSM P460   YIGSLE*
6275  42000     145X     JSX SUB2
6276           5246R     DEF =F20000000
6277   6000    2405R     LDB =D5
6300  42000      47X     JSX .DRG1
6301  42000      50X     JSX CNV24
6302  42000     113X     JSX DIV4
6303           2521R     DEF =D17
6304 170040              TCA
6305  21613   77613A     ADA V32651   DAC4
6306  42000    2132R     JSM P265   LIMIT
6307  31613   77613A     STA V32651   DAC4
6310   6000    1463R     LDB =D0
6311  42000     112X     JSX .WS7
6312   2000    5515R     LDA =D30
6313  42000    2434R     JSM P285   BLKOF
6314   1613   77613A     LDA V32651   DAC4
6315   6000    2521R     LDB =D17
6316  75617              MPY
6317  42000     122X     JSX CNV42
6320   6000    2405R     LDB =D5
6321  42000      51X     JSX .DLFT
6322  42000      36X     JSX .SAR2
6323  42000    5764R     JSM P495   FRQC
6324  42000     150X     JSX ADD2
6325          77665A     DEF V8   CFREQ
6326  42000     124X     JSX SUB2T
6327   4020      20A     LDB AR2
6330  77202              SLB *+2,C
6331  34020      20A     STB AR2
6332  42000     140X     JSX MIN2
6333           6355R     DEF =F9000000
6334   4020      20A     LDB AR2
6335  77027             SLB A512
6336   1616   77616A     LDA V32654   XFLAG
6337 170610              SAL 9
6340 172421             SAM A513
6341   1616   77616A     LDA V32654   XFLAG
6342  62000    1364R     IOR =B100
6343  31616   77616A     STA V32654   XFLAG
6344  42000      37X     JSX .LDBI
6345          77665A     DEF V8   CFREQ
6346  42000    6750R     JSM P222   TUNE
6347  66000    6364R     JMP A514
6350   7751
6351   6001
6352   6000
6353   7777
6354 150000
6355 9000000
6356                    LIT
6361                   A513 EQU *
6361   2000    5515R     LDA =D30
6362  42000    2501R     JSM P295   BLINK
6363  42000    5350R     JSM P464   SRQM
6364                   A514 EQU *
6364                   A512 EQU *
6364   1603   77603A     LDA V32643   PLOCK
6365  52000    6371R     AND =B167777
```

```
6366  31603   77603A     STA V32643  PLUCK
6367  42000    5252R     JSM P460   YIGSLEW
6370  66000    6374R     JMP A515
6371 167777
6371                     LIT
6372                    A511 EQU *
6372   2000    5515R     LDA =D30
6373  42000    2434R     JSM P285   BLKOF
6374                    A515 EQU *
6374   1603   77603A     LDA V32643  PLOCK
6375   6000    1457R     LDB =D1
6376  42000      72X     JSX .WS6
6377   1605   77605A     LDA V32645  SCANSL
6400  73002              SLA A516
6401  42000    5545R     JSM P480   VTOSLEW
6402                    A516 EQU *
6402   2000    1277R     LDA =B177777
6403  31602   77602A     STA V32642  LKMSK
6404   6000    2107R     LDB =D3
6405  42000     107X     JSX .WS5
6406   1605   77605A     LDA V32645  SCANSL
6407 170040              ICA
6410  22000    1457R     ADA =D1
6411 172003              SAP A517
6412   2000    2107R     LDA =D3
6413  42000    3214R     JSM P332   WAIT
6414                    A517 EQU *
6414   2000    2411R     LDA =D4
6415  42000    3171R     JSM P327   HLDOF
6416   2000    1363R     LDA =B177774
6417  70540              PWC A
6420   2000    5520R     LDA =D24
6421                    A518 EQU *
6421  31572   77572A     STA V32634  J
6422  42000    2434R     JSM P285   BLKOF
6423   2000    1457R     LDA =D1
6424  21572   77572A     ADA V32634  J
6425 144016      16A     ISZ C,I
6426  66000    6421R     JMP A518
6427  54016      16A     DSZ C
6430                    A519 EQU *
6430   6000    2276R     LDB =D2
6431  42000     110X     JSX .RS7
6432  31567   77567A     STA V32631  KEYCOL
6433  52000    6122R     AND =B27
6434  22000    6450R     ADA =B177751
6435  72473              SZA A519
6436                    A520 EQU *
6436   1567   77567A     LDA V32631  KEYCOL
6437  52000    2406R     AND =D7
6440  12000    2406R     CPA =D7
6441  66000    6443R     JMP *+2
6442  66000    6451R     JMP A521
6443  42000    5357R     JSM P466   NOLOCK
6444   6000    2276R     LDB =D2
6445  42000     110X     JSX .RS7
6446  31567   77567A     STA V32631  KEYCOL
6447  66000    6436R     JMP A520
6450 177751
6450                     LIT
6451                    A521 EQU *
6451   1616   77616A     LDA V32654  XFLAG
6452  52000    6512R     AND =B177677
6453  31616   77616A     STA V32654  XFLAG
6454 170612              SAL 11
6455 172402              SAM *+2
6456  66000    6516R     JMP A522
6457   1602   77602A     LDA V32642  LKMSK
6460  52000    6513R     AND =B35777
6461  31602   77602A     STA V32642  LKMSK
6462   6000    2107R     LDB =D3
6463  42000     107X     JSX .WS5
6464   1605   77605A     LDA V32645  SCANSL
6465 170615              SAL 14
6466 172002              SAP A523
6467  42000    3205R     JSM P329   BUSY
6470                    A523 EQU *
6470   2000    2107R     LDA =D3
6471  42000    3214R     JSM P332   WAIT
6472   1603   77603A     LDA V32643  PLOCK
6473  52000    6514R     AND =B77777
6474   6000    1457R     LDB =D1
6475  42000      72X     JSX .WS6
6476   1603   77603A     LDA V32643  PLOCK
6477  52000    6353R     AND =B7777
6500  62000    6515R     IOR =B50000
6501  31603   77603A     STA V32643  PLOCK
6502   6000    1457R     LDB =D1
6503  42000      72X     JSX .WS6
6504  42000    5652R     JSM P486   SWPON
6505   2000    2107R     LDA =D3
6506  42000    3214R     JSM P332   WAIT
6507   2000    2107R     LDA =D3
6510  42000    3214R     JSM P332   WAIT
6511  66000    6576R     JMP A524
6512 177677
6513  35777
6514  77777
6515  50000
```

```
6512                       LIT
6516                       A522 EQU *
6516    1604    77604A       LDA V32644   SATN
6517   52000     4533R       AND =B140000
6520   62000     1770R       IOR =B20000
6521    6000     1457R       LDB =D1
6522   42000       75X       JSX .WS4
6523    1740    77740A       LDA V32736   EFLAG
6524   52000     2107R       AND =D3
6525   72023                 RZA A525
6526   42000     5545R       JSM P480     VTOSLEW
6527   42000      145X       JSX SUB2
6530            77641A       DEF V32673   VTOFREQ
6531   42000       34X       JSX .STRD
6532            77655A       DEF V32685   LTEMP2
6533   42000       50X       JSX CNV24
6534   42000      113X       JSX DIV4
6535             3654R       DEF =D16
6536   21615    77615A       ADA V32653   DAC1
6537   31615    77615A       STA V32653   DAC1
6540   52000     5742R       AND =B176000
6541   72403                 SZA A526
6542   42000     5656R       JSM P487     VTOTUNE
6543   66000     6547R       JMP A527
6544                       A526 EQU *
6544    1615    77615A       LDA V32653   DAC1
6545    6000     1463R       LDB =D0
6546   42000       75X       JSX .WS4
6547                       A527 EQU *
6547   66000     6553R       JMP A528
6550                       A525 EQU *
6550    1616    77616A       LDA V32654   XFLAG
6551   62000     2203R       IOR =B10
6552   31616    77616A       STA V32654   XFLAG
6553                       A528 EQU *
6553    1604    77604A       LDA V32644   SATN
6554   52000     6514R       AND =B77777
6555    6000     1457R       LDB =D1
6556   42000       75X       JSX .WS4
6557    2000     2276R       LDA =D2
6560   42000     3214R       JSM P332     WAIT
6561   42000     5652R       JSM P486     SWPON
6562   42000     5545R       JSM P480     VTOSLEW
6563    1616    77616A       LDA V32654   XFLAG
6564   52000     1375R       AND =B177767
6565   31616    77616A       STA V32654   XFLAG
6566    2000     2405R       LDA =D5
6567   42000     3171R       JSM P327     HLDOF
6570                       A529 EQU *
6570    6000     2276R       LDB =D2
6571   42000      110X       JSX .RS7
6572   31567    77567A       STA V32631   KEYCOD
6573   52000     6122R       AND =B27
6574   22000     6450R       ADA =B177751
6575   72473                 SZA A529
6576                       A524 EQU *
6576   66000     6617R       JMP A530
6577                       A510 EQU *
6577    1616    77616A       LDA V32654   XFLAG
6600  170612                 SAL 11
6601  172005                 SAP A531
6602    1603    77603A       LDA V32643   PLOCK
6603   52000     6353R       AND =B7777
6604   62000     6515R       IOR =B50000
6605   31603    77603A       STA V32643   PLOCK
6606                       A531 EQU *
6606    1603    77603A       LDA V32643   PLOCK
6607    6000     1457R       LDB =D1
6610   42000       72X       JSX .WS6
6611    2000     1463R       LDA =D0
6612    6000     2107R       LDB =D3
6613   42000      107X       JSX .WS5
6614   42000     5652R       JSM P486     SWPON
6615    2000     2411R       LDA =D4
6616   42000     3214R       JSM P332     WAIT
6617                       A530 EQU *
6617   42000     2070R       JSM P261     IFBW
6620  170400                 AAR 1
6621  170040                 TCA
6622   22000     1704R       ADA =D6
6623   42000     3171R       JSM P327     HLDOF
6624   42000     5060R       JSM P445     WCNT
6625   42000     2111R       JSM P263     VBW
6626  170400                 AAR 1
6627  170040                 TCA
6630   22000     1704R       ADA =D6
6631   42000     3171R       JSM P327     HLDOF
6632   42000     5060R       JSM P445     WCNT
6633    1603    77603A       LDA V32643   PLOCK
6634   62000     2277R       IOR =B4000
6635   31603    77603A       STA V32643   PLOCK
6636    6000     1457R       LDB =D1
6637   42000       72X       JSX .WS6
6640  170201                 RET 1
6641                       P532  EQU * LOSHFT
6641    6000     1363R       LDB =D-4
6642   42000       32X       JSX .ARGL
```

```
6643   1730  77730A     LDA V30 KFLAG
6644  52000   2107R     AND =D3
6645  72023            RZA A533
6646   1605  77605A     LDA V32645   SCANSL
6647  52000   1704R     AND =D6
6650  72015            RZA A534
6651  42000    150X     JSX ADD2
6652          6677R     DEF =F7500000
6653  42000    146X     JSX DIV3
6654          2405R     DEF =D5
6655   6000   2405R     LDB =D5
6656  42000    132X     JSX .FDIG
6657 170611             SAL 10
6660 170140             CMA
6661  42000    104X     JSX .TURN
6662          6703R     DEF =B2000
6663         77603A     DEF V32643   PLOCK
6664  66000   6667R     JMP A535
6665                  A534 EQU *
6665   1603  77603A     LDA V32643   PLOCK
6666  62000   6703R     IOR =B2000
6667                  A535 EQU *
6667  66000   6675R     JMP A536
6670                  A533 EQU *
6670   1730  77730A     LDA V30 KFLAG
6671 170611             SAL 10
6672  42000    104X     JSX .TURN
6673          6703R     DEF =B2000
6674         77603A     DEF V32643   PLOCK
6675                  A536 EQU *
6675  31603  77603A     STA V32643   PLOCK
6676  66000     31X     JMX .RINA
6677 7500000
6703   2000
6677                    LIT
6704                  P537  EQU * CPILOT
6704   6000   1277R     LDB =D-1
6705  42000     27X     JSX .ARGA
6706  42000     33X     JSX .UPC4
6707  42000   5117R     JSM P450   COUNTIF
6710  42000    150X     JSX ADD2
6711          6717R     DEF =F10000000
6712  42000    155X     JSX MOD2
6713          5246R     DEF =F20000000
6714  42000    150X     JSX ADD2
6715          6717R     DEF =F10000000
6716  66000     31X     JMX .RINA
6717 10000000
6717                    LIT
6723                  P538  EQU * CSBLK
6723   1675  77675A     LDA V15 BLEDS
6724  52000   1457R     AND =D1
6725 170600             SAL 1
6726  22000   2406R     ADA =D7
6727  42000   2314R     JSM P279  SBLK
6730   2000   6703R     LDA =D1024
6731  70540             PWC A
6732   1675  77675A     LDA V15 BLEDS
6733  52000   1457R     AND =D1
6734 170600             SAL 1
6735  22000   2203R     ADA =D8
6736  42000   2522R     JSM P297  RJUST
6737 170201             RET 1
6740                  P539  EQU * CFDUMP
6740   1606  77606A     LDA V32646  SRCEID
6741  73006            SLA A540
6742  62000   5517R     IOR =B100000
6743  31606  77606A     STA V32646  SRCEID
6744   2000   3654R     LDA =B20
6745   6000   2411R     LDB =D4
6746  42000    112X     JSX .WS7
6747                  A540 EQU *
6747 170201             RET 1
6750                  P222  EQU * IONE
6750   6000   1363R     LDB =D-4
6751  42000     32X     JSX .ARGL
6752  42000    156X     JSX .CLB1
6753          7220R     DEF =F1739100000
6754  42000     37X     JSX .LDB1
6755         77707A     DEF V11 FOFSET
6756   6000   1375R     LDB =D-9  F
6757  42000     63X     JSX MIN2P
6760  42000   2043R     JSM P256  DLIMIT
6761   6000   1375R     LDB =D-9  F
6762  42000     43X     JSX .STBP
6763  42000    150X     JSX ADD2
6764         77707A     DEF V11 FOFSET
6765  42000     34X     JSX .STRD
6766         77665A     DEF V8  CFREQ
6767  42000   6740R     JSM P539  CFDUMP
6770  42000   5764R     JSM P495  FRQC
6771   6000   1375R     LDB =D-9  F
6772  42000    147X     JSX ADD2P
6773  42000    150X     JSX ADD2
6774         77707A     DEF V11 FOFSET
6775   6000   1375R     LDB =D-9  F
6776  42000     43X     JSX .STBP
6777   1603  77603A     LDA V32643  PLOCK
7000  52000   6353R     AND =B7777
```

```
7001  62000   4533R    IOR =B140000
7002  31603  77603A    STA V32643  PLOCK
7003  42000   5644R    JSM P485  KSWP
7004   1603  77603A    LDA V32643  PLOCK
7005  31573  77573A    STA V32635  I
7006   6000   1375R    LDB =D-9  F
7007  42000     66X    JSX .LDBP
7010  42000   6641R    JSM P532  LOSHFT
7011   1603  77603A    LDA V32643  PLOCK
7012  52000   7224R    AND =B27777
7013  62000   7225R    IOR =B110000
7014   6000   1457R    LDB =D1
7015  42000     72X    JSX .WS6
7016  42000   3221R    JSM P333  CORREK
7017 172010           SAP A541
7020   1603  77603A    LDA V32643  PLOCK
7021  42000    120X    JSX .TEST
7022          6703R    DEF =B2000
7023         77573A    DEF V32635  I
7024  72003           RZA A541
7025   1700  77700A    LDA V22 RLVL
7026  42000   3530R    JSM P355  REFLEV
7027                  A541 EQU *
7027  42000     37X    JSX .LDBI
7030         77665A    DEF V8  CFREQ
7031  42000   6016R    JSM P500  STUNE
7032   5604  77604A    LDB V32644  SATN
7033 174600           SBL 1
7034   2000   7226R    LDA =B42000
7035 176402           SBM A542
7036   2000   6015R    LDA =B70000
7037                  A542 EQU *
7037   6000   2107R    LDB =D3
7040  42000     72X    JSX .WS6
7041   1603  77603A    LDA V32643  PLOCK
7042 170604           SAL 5
7043 172004           SAP A543
7044  42000     37X    JSX .LDBI
7045          7227R    DEF =F31100000
7046  66000   7051R    JMP A544
7047                  A543 EQU *
7047  42000     37X    JSX .LDBI
7050          7233R    DEF =F26100000
7051                  A544 EQU *
7051  42000     36X    JSX .SAR2
7052   6000   1375R    LDB =D-9  F
7053  42000     66X    JSX .LDBP
7054  42000    150X    JSX ADD2
7055         77661A    DEF V32689  LTEMP1
7056  42000    124X    JSX SUB2T
7057  42000    151X    JSX DIV2
7060          7237R    DEF =F1700000
7061  42000     50X    JSX CNV24
7062  31613  77613A    STA V32651  DAC4
7063   5613  77613A    LDB V32651  DAC4
7064 174040           TCB
7065  26000   3166R    ADB =D1023
7066 176002           SBP A545
7067  22000   7243R    ADA =D-12
7070                  A545 EQU *
7070   6000   1463R    LDB =D0
7071  42000    112X    JSX .WS7
7072   1604  77604A    LDA V32644  SATN
7073 170600           SAL 1
7074 172031           SAP A546
7075  42000     37X    JSX .LDBI
7076          7244R    DEF =F2250000
7077  42000    140X    JSX MIN2
7100         77661A    DEF V32689  LTEMP1
7101  42000    151X    JSX DIV2
7102          6116R    DEF =F4000000
7103  42000     50X    JSX CNV24
7104 170040           TCA
7105  22000   2521R    ADA =D17
7106  31570  77570A    STA V32632  M
7107  42000    125X    JSX CNV43
7110  42000    127X    JSX MIN3
7111          6122R    DEF =H17
7112  42000    153X    JSX MPY2
7113          6116R    DEF =F4000000
7114  42000    150X    JSX ADD2
7115          7244R    DEF =F2250000
7116  42000    140X    JSX MIN2
7117         77661A    DEF V32689  LTEMP1
7120  42000    151X    JSX DIV2
7121          6123R    DEF =F250000
7122  42000     50X    JSX CNV24
7123  52000   3527R    AND =D14
7124  31571  77571A    STA V32633  L
7125                  A546 EQU *
7125   1570  77570A    LDA V32632  M
7126 170040           TCA
7127  22000   2521R    ADA =D17
7130 170603           SAL 4
7131  21571  77571A    ADA V32633  L
7132  42000    122X    JSX CNV42
7133  42000    153X    JSX MPY2
7134          6123R    DEF =F250000
```

```
7135  42000     140X     JSX MIN2
7136           77661A    DEF V32689   LTEMP1
7137  42000      36X     JSX .SAR2
7140   1604   77604A     LDA V32644   SATN
7141 170600              SAL 1
7142 172004             SAP A547
7143  42000      53X     JSX .LDS1
7144            3654R    DEF =H10
7145  66000     7150R    JMP A548
7146                   A547 EQU *
7146  42000      53X     JSX .LDS1
7147            2405R    DEF =D5
7150                   A548 EQU *
7150  42000     157X     JSX MPY2T
7151  42000      34X     JSX .STRD
7152           77641A    DEF V32673   VTOFREW
7153  42000     5656R    JSM P487   VTOTUNE
7154  42000     5252R    JSM P460   YIGSLEW
7155   2000     3166R    LDA =D1023
7156  70540              PWC A
7157   2000     1704R    LDA =D6
7160  42000     6704R    JSM P537   CPILOT
7161   6000     1375R    LDB =D-9   F
7162  42000      63X     JSX MIN2P
7163  42000      36X     JSX .SAR2
7164   1603   77603A     LDA V32643   PLOCK
7165 170604              SAL 5
7166 172004             SAP A549
7167  42000      37X     JSX .LDB1
7170            5246R    DEF =F20000000
7171  66000     7174R    JMP A550
7172                   A549 EQU *
7172  42000      37X     JSX .LDB1
7173            7250R    DEF =F25000000
7174                   A550 EQU *
7174  42000     130X     JSX ADD2T
7175  42000     151X     JSX DIV2
7176            7237R    DEF =F1700000
7177  42000      50X     JSX CNV24
7200  42000     2132R    JSM P265   LIMIT
7201  31613   77613A     STA V32651   DAC4
7202   6000     1463R    LDB =D0
7203  42000     112X     JSX .WS7
7204  42000     2154R    JSM P269   WSPIN
7205  42000     5252R    JSM P460   YIGSLEW
7206   1603   77603A     LDA V32643   PLOCK
7207  52000     6371R    AND =B167777
7210  31603   77603A     STA V32643   PLOCK
7211  42000      53X     JSX .LDS1
7212            1463R    DEF =D0
7213  42000      34X     JSX .STRD
7214           77635A    DEF V32669   CFREST
7215  42000     6723R    JSM P538   CSBLK
7216  42000     6160R    JSM P502   EOS
7217  66000      31X     JMX .RTNA
7220 1739100000
7224  27777
7225 110000
7226  42000
7227 31100000
7233 26100000
7237 1700000
7243 177764
7244 2250000
7250 25000000
7220                    LIT
7254                   P551   EQU * LOGSIX
7254   6000     1363R    LDB =D-4
7255  42000      32X     JSX .ARGL
7256  44016      16A     ISZ C
7257  42000      52X     JSX .DEQL
7260 172005             SAP A552
7261   2000     1463R    LDA =D0
7262   6000     2107R    LDB =D3 LOGSIX
7263  42000      67X     JSX .STAP
7264  66000     7326R    JMP A553
7265                   A552 EQU *
7265   4020      20A     LDB AR2
7266  77202              SLB *+2,C
7267  34020      20A     STB AR2
7270  71500              NRM
7271  35573   77573A     STB V32635   I
7272   6000     2204R    LDB =D10
7273  42000      47X     JSX .DRGT
7274   6000     1375R    LDB =D-9   L
7275  42000      43X     JSX .STBP
7276   1573   77573A     LDA V32635   I
7277 170040              TCA
7300  22000     2565R    ADA =D11
7301   6000     1704R    LDB =D6
7302  75617              MPY
7303  22000     1457R    ADA =D1
7304   6000     2107R    LDB =D3 LOGSIX
7305  42000      67X     JSX .STAP
7306   2000     1457R    LDA =D1
7307                   A555 EQU *
7307  31573   77573A     STA V32635   I
7310  42000      60X     JSX .ARAY
7311             552R    DEF V189   LGIB
```

```
7312  42000    61X   JSX .LDSA
7313   6000  1375R   LDB =D-9  L
7314  42000   160X   JSX SUB2P
7315   4020    20A   LDB AR2
7316  77010         SLB A554
7317   6000  1457R   LDB =D1
7320  25763 77763A   ADB E
7321 144001     1A   ISZ B,I
7322                 NOP
7323   2000  1457R   LDA =D1
7324  21573 77573A   ADA V32635  1
7325  66000  7307R   JMP A555
7326                A554 EQU *
7326                A553 EQU *
7326  66000    70X   JMX .RIN1
7327                P556  EQU * LOG2
7327   6000  1363R   LDB =D-4
7330  42000    32X   JSX .ARGL
7331  44016    16A   ISZ C
7332  42000  7254R   JSM P551  LOGSIX
7333  22000  1457R   ADA =D1
7334 170400          AAR 1
7335  66000    31X  JMX .RINA
7336                P557  EQU * LOG3
7336   6000  1363R   LDB =D-4
7337  42000    32X   JSX .ARGL
7340  44016    16A   ISZ C
7341  42000  7254R   JSM P551  LOGSIX
7342  42000   113X   JSX DIV4
7343         2107R   DEF =D3
7344  66000    31X  JMX .RINA
7345                P558  EQU * SCANT
7345   6000  1363R   LDB =D-4
7346  42000    32X   JSX .ARGL
7347  66000  7413R   JMP A559
7350                T560 EQU *
7350                K561  OCT 174077  174077
7351                K562  OCT 170057  170057
7352                K563  OCT 164067  164067
7353                K564  OCT 160047  160047
7354                K565  OCT 150073  150073
7355                K566  OCT 144053  144053
7356                K567  OCT 140075  140075
7357                K568  OCT 130055  130055
7360                K569  OCT 124065  124065
7361                K570  OCT 120045  120045
7362                K571  OCT 110071  110071
7363                K572  OCT 104051  104051
7364                K573  OCT 100076  100076
7365                K574  OCT 56  56
7366                K575  OCT 66  66
7367                K576  OCT 46  46
7370                K577  OCT 72  72
7371                K578  OCT 52  52
7372                K579  OCT 74  74
7373                K580  OCT 54  54
7374                K581  OCT 64  64
7375                K582  OCT 44  44
7376                  OCT 70  70
7377                  OCT 50  50
7400                K583  OCT 34  34
7401                K584  OCT 14  14
7402                K160  OCT 24  24
7403                  DEC 4 4
7404                K186  OCT 30  30
7405                K183  OCT 10  10
7406                K185  OCT 20  20
7407                  DEC 0 0
7410         7350R  V585 DEF T560 SCANTAB
7411                  OCT 177777  177777
7412                  OCT 40  40
7413                A559  EQU *
7413  42000    37X   JSX .LDBI
7414        77671A   DEF V9  SPAN
7415  42000    52X   JSX .DEQL
7416 172413         SAM A586
7417  42000    37X   JSX .LDBI
7420         7555R   DEF =F20000
7421   6000  1375R   LDB =D-9  ST
7422  42000    63X   JSX MIN2P
7423   4020    20A   LDB AR2
7424  77005         SLB A586
7425  42000    37X   JSX .LDBI
7426         7555R   DEF =F20000
7427   6000  1375R   LDB =D-9  ST
7430  42000    43X   JSX .STBP
7431                A586 EQU *
7431   1604 77604A   LDA V32644   SATN
7432  70540          PWC A
7433   1606 77606A   LDA V32646   SRCEID
7434  73006         SLA A587
7435  62000  1770R   IOR =B20000
7436  31606 77606A   STA V32646   SRCEID
7437   2000  3654R   LDA =B20
7440   6000  2411R   LDB =D4
7441  42000   112X   JSX .WS7
7442                A587 EQU *
7442   6000  1375R   LDB =D-9  ST
```

```
7443  42000     66X   JSX .LDBP
7444  42000    140X   JSX MIN2
7445          7561R   DEF =F15000
7446   4020     20A   LDB AR2
7447  77402           RLB *+2
7450  66000   7572R   JMP A588

7451   1732  77732A   LDA V19 STIM
7452  70540           PWC A
7453   2000   2205R   LDA =D32
7454  70540           PWC A
7455   6000   1375R   LDB =D-9  SI
7456  42000     66X   JSX .LDBP
7457  42000   7254R   JSM P551  LOGSIX
7460  22000   2647R   ADA =D-24
7461  42000   2132R   JSM P265  LIMI1
7462  31731  77731A   STA V18 SINDEX
7463  42000     60X   JSX .ARAY
7464          7410R   DEF V585  SCANTAB
7465  31732  77732A   STA V19 STIM
7466  70760           WWC A
7467  31573  77573A   STA V32635  I
7470  11732  77732A   CPA V19 STIM
7471  66000   7473R   JMP A589
7472  42000   2762R   JSM P314  AVGRST
7473                 A589 EQU *
7473   1731  77731A   LDA V18 SINDEX
7474 170040           TCA
7475  22000   2405R   ADA =D5
7476 170505           SAR 6
7477  42000    104X   JSX .TURN
7500          1300R   DEF =B1000
7501         77702A   DEF V24 VIDCON
7502  31702  77702A   STA V24 VIDCON
7503   1731  77731A   LDA V18 SINDEX
7504 170040           TCA
7505  22000   7565R   ADA =D18
7506  70540           PWC A
7507   1605  77605A   LDA V32645  SCANSL
7510  42000    111X   JSX .EQL
7511  42000    136X   JSX .ORT
7512  42000    104X   JSX .TURN
7513          5517R   DEF =B100000
7514         77604A   DEF V32644  SATN
7515  31604  77604A   STA V32644  SATN
7516   1733  77733A   LDA V20 FSTIM
7517 172402           SAM *+2
7520  66000   7554R   JMP A590
7521   1676  77676A   LDA V16 TLEDS
7522  52000   7566R   AND =B617
7523  72431          SZA A590
7524   1702  77702A   LDA V24 VIDCON
7525  52000   7567R   AND =B173777
7526  31702  77702A   STA V24 VIDCON
7527   2000   1463R   LDA =D0
7530   6000   2203R   LDB =D8
7531  42000     75X   JSX .WS4
7532   5676  77676A   LDB V16 TLEDS
7533 174614           SBL 13
7534   2000   3113R   LDA =B2060
7535 176402          SBM A591
7536   2000   7570R   LDA =B2020
7537                 A591 EQU *
7537  42000     73X   JSX .W6
7540   2000   6703R   LDA =D1024
7541  42000    103X   JSX .W4
7542   5676  77676A   LDB V16 TLEDS
7543 174611           SBL 10
7544   2000   3113R   LDA =B2060
7545 176402          SBM A592
7546   2000   7571R   LDA =B2030
7547                 A592 EQU *
7547  42000     73X   JSX .W6
7550   2000   1463R   LDA =D0
7551  31733  77733A   STA V20 FSTIM
7552  42000  10747R   JSM P219  MKRDEL
7553  42000  15224R   JSM P221  TRIGR
7554                 A590 EQU *
7554  66000   7641R   JMP A593
7555  20000
7561  15000
7565     22
7566    617
7567 173777
7570   2020
7571   2030
7555                  LIT
7572                 A588 EQU *
7572   1702  77702A   LDA V24 VIDCON
7573  52000   7666R   AND =B172777
7574  62000   2277R   IOR =B4000
7575  31702  77702A   STA V24 VIDCON
7576   2000   1463R   LDA =D0
7577   6000   2203R   LDB =D8
7600  42000     75X   JSX .WS4
7601   2000   3113R   LDA =B2060
7602  42000     73X   JSX .W6
7603   2000   6703R   LDA =D1024
7604  42000    103X   JSX .W4
```

```
7605   2000   3113R    LDA =B2060
7606  42000     73X    JSX .W6
7607   2000   6352R    LDA =D3072
7610  42000    103X    JSX .W4
7611   2000   3110R    LDA =B2024
7612  42000     73X    JSX .W6
7613   2000   7667R    LDA =B157
7614  42000  15546R    JSM P214   KEY
7615   2000   1456R    LDA =D12
7616  70540            PWC A
7617   6000   1375R    LDB =D-9  ST
7620  42000     66X    JSX .LDBP
7621  42000   7327R    JSM P556   LOG2
7622  22000   1277R    ADA =D-1
7623  42000   2132R    JSM P265   LIMIT
7624  22000   1457R    ADA =D1
7625  31731  77731A    STA V18 SINDEX
7626  42000     60X    JSX .ARAY
7627          7410R    DEF V585   SCANTAB
7630  31733  77733A    STA V20 FSTIM
7631   2000   1463R    LDA =D0
7632  31732  77732A    STA V19 STIM
7633  42000  10747R    JSM P219   MKRDEL
7634   1604  77604A    LDA V32644   SATN
7635  52000   6514R    AND =B77777
7636  31604  77604A    STA V32644   SATN
7637   2000   7670R    LDA =B164
7640  42000  15546R    JSM P214   KEY
7641                  A593 EQU *
7641   1604  77604A    LDA V32644   SATN
7642   6000   1457R    LDB =D1
7643  42000     75X    JSX .WS4
7644   1732  77732A    LDA V19 STIM
7645  42000    105X    JSX .W5
7646  70760            WWC A
7647  31573  77573A    STA V32635   I
7650  42000    120X    JSX .TEST
7651          5517R    DEF =B100000
7652         77604A    DEF V32644   SATN
7653  72005           RZA A594
7654  42000   6160R    JSM P502   EOS
7655   2000   2107R    LDA =D3
7656   6000   2107R    LDB =D3
7657  42000     75X    JSX .WS4
7660                  A594 EQU *
7660   1733  77733A    LDA V20 FSTIM
7661   6000   1456R    LDB =D12
7662  42000    112X    JSX .WS7
7663   2000   2107R    LDA =D3
7664  42000   2314R    JSM P279   SBLK
7665  66000     31X    JMX .RINA
7666 172777
7667    157
7670    164
7666                   LIT
7671                  P595   EQU * YIGSHFT
7671   1603  77603A    LDA V32643   PLOCK
7672  31573  77573A    STA V32635   I
7673  42000   5764R    JSM P495   FROC
7674  42000    150X    JSX ADD2
7675         77665A    DEF V8   CFREQ
7676  42000   6641R    JSM P532   LOSHFT
7677   1603  77603A    LDA V32643   PLOCK
7700  42000    120X    JSX .TEST
7701          6703R    DEF =B2000
7702         77573A    DEF V32635   I
7703  72025           RZA A596
7704   1616  77616A    LDA V32654   XFLAG
7705  52000   7731R    AND =B177737
7706  31616  77616A    STA V32654   XFLAG
7707   5573  77573A    LDB V32635   I
7710 174604            SBL 5
7711   2000   2107R    LDA =D3
7712 176402           SBM A597
7713   2000   1301R    LDA =B177775
7714                  A597 EQU *
7714  21613  77613A    ADA V32651   DAC4
7715  31613  77613A    STA V32651   DAC4
7716   1603  77603A    LDA V32643   PLOCK
7717   6000   1457R    LDB =D1
7720  42000     72X    JSX .WS6
7721   1613  77613A    LDA V32651   DAC4
7722   6000   1463R    LDB =D0
7723  42000    112X    JSX .WS7
7724  42000   3221R    JSM P333   CORREK
7725 172003           SAP A598
7726   1700  77700A    LDA V22 RLVL
7727  42000   3530R    JSM P355   REFLEV
7730                  A598 EQU *
7730                  A596 EQU *
7730 170201            RET 1
7731 177737
7731                   LIT
7732                  P599   EQU * FPNLUN
7732   1565  77565A    LDA V32629   SRQEN
7733   6000   2276R    LDB =D2
7734  42000    107X    JSX .WS5
7735 172404           SAM A600
```

```
7736    2000    2107R      LDA =D3
7737    6000    2107R      LDB =D3
7740   42000      75X      JSX .WS4
7741                      A600 EQU *
7741    1565   77565A      LDA V32629   SRQEN
7742   42000     104X      JSX .TURN
7743             5517R     DEF =B100000
7744            77675A     DEF V15 BLEDS
7745   31675   77675A      STA V15 BLEDS
7746  170140               CMA
7747    6000    2276R      LDB =D2
7750   42000      75X      JSX .WS4
7751    1601   77601A      LDA V32641   HPBC
7752  172005              SAP A601
7753    1602   77602A      LDA V32642   LKMSK
7754    6000    2107R      LDB =D3
7755   42000     107X      JSX .WS5
7756   42000      15X      JSM P204  HBUSY
7757                      A601 EQU *
7757    1601   77601A      LDA V32641   HPBC
7760  170601               SAL 2
7761  172007              SAP A602
7762    1676   77676A      LDA V16 ILEDS
7763  170501               SAR 2
7764   52000    2410R      AND =B200
7765   61601   77601A      IOR V32641   HPBC
7766    6000    2411R      LDB =D4
7767   42000     112X      JSX .WS7
7770                      A602 EQU *
7770    1601   77601A      LDA V32641   HPBC
7771   52000    7774R      AND =B57777
7772   31601   77601A      STA V32641   HPBC
7773  170201               RET 1
7774   57777
7774                       LI1
7775                      P603  EQU * CSCANBW
7775    1675   77675A      LDA V15 BLEDS
7776  170610               SAL 9
7777  172426              SAM A604
10000   1605   77605A      LDA V32645   SCANSL
10001  72424              SZA A604
10002   2000    2565R      LDA =D11
10003  70540               PWC A
10004   1605   77605A      LDA V32645   ŞCANSL
10005  52000    1704R      AND =D6
10006   4000               LDB A
10007   2000    2565R      LDA =D11
10010  76402              SZB A605
10011   2000    2172R      LDA =D13
10012                     A605 EQU *
10012  70540               PWC A
10013  42000      37X      JSX .LDB1
10014           77671A     DEF V9  SPAN
10015  42000    7254R      JSM P551  LOGSIX
10016  42000     116X      JSX SUB4T
10017  42000     113X      JSX DIV4
10020            2107R     DEF =D3
10021  22000    2110R      ADA =D-2
10022  42000    2132R      JSM P265  LIMIT
10023  22000    2276R      ADA =D2
10024  42000    4210R      JSM P392  IFBWOUT
10025                     A604 EQU *
10025  42000    2070R      JSM P261  IFBW
10026  31473   77473A      STA V41 KK
10027   1675   77675A      LDA V15 BLEDS
10030 170607               SAL 8
10031 172407              SAM A606
10032   1473   77473A      LDA V41 KK
10033  22000    2110R      ADA =D-2
10034 170502               SAR 3
10035 170040               TCA
10036  21473   77473A      ADA V41 KK
10037  42000    4314R      JSM P400  VBWOUT
10040                     A606 EQU *
10040  42000    2111R      JSM P263  VBW
10041  31476   77476A      STA V44 KN
10042   1605   77605A      LDA V32645  SCANSL
10043  72002              RZA *+2
10044  66000   10274R      JMP A607
10045   1473   77473A      LDA V41 KK
10046 170040               TCA
10047  21476   77476A      ADA V44 KN
10050 172006              SAP A608
10051   1473   77473A      LDA V41 KK
10052  21476   77476A      ADA V44 KN
10053   6000    2107R      LDB =D3
10054  75617               MPY
10055  66000   10061R      JMP A609
10056                     A608 EQU *
10056   2000    1704R      LDA =D6
10057   5473   77473A      LDB V41 KK
10060  75617               MPY
10061                     A609 EQU *
10061  70540               PWC A
10062  42000      37X      JSX .LDB1
10063           77671A     DEF V9  SPAN
10064  42000    7254R      JSM P551  LOGSIX
10065  22000   10141R      ADA =D38
```

```
10066  42000     116X     JSX SUB4T
10067  70540              PWC A
10070   1616   77616A     LDA V32654  XFLAG
10071 170605              SAL 6
10072 170416              AAR 15
10073 170601              SAL 2
10074  42000      57X     JSX ADD4T
10075  31656   77656A     STA V34 BCDA
10076  42000      53X     JSX .LDS1
10077            1770R    DEF =H2000
10100  42000     140X     JSX MIN2
10101          77671A     DEF V9  SPAN
10102   4020      20A     LDB AR2
10103  77402              RLB *+2
10104  66000   10145R     JMP A610
10105   2000    2107R     LDA =D3
10106   5473   77473A     LDB V41 KK
10107  75617              MPY
10110  70540              PWC A
10111  42000      37X     JSX .LDB1
10112          77671A     DEF V9  SPAN
10113  42000    7254R     JSM P551  LOGSIX
10114  22000   10142R     ADA =D31
10115  42000     116X     JSX SUB4T
10116  70540              PWC A
10117   1616   77616A     LDA V32654  XFLAG
10120 170605              SAL 6
10121 170416              AAR 15
10122 170601              SAL 2
10123  42000      57X     JSX ADD4T
10124  31657   77657A     STA V35 BCDB
10125   1473   77473A     LDA V41 KK
10126  22000    1363R      ADA =D-4
10127 172011              SAP A611
10130   1657   77657A      LDA V35 BCDB
10131  22000   10143R      ADA =D-43
10132 172006              SAP A611
10133   1616   77616A      LDA V32654  XFLAG
10134 170605               SAL 6
10135 172403              SAM A611
10136   2000   10144R      LDA =D43
10137  31657   77657A      STA V35 BCDB
10140                    A611 EQU *
10140  66000   10161R      JMP A612
10141     46
10142     37
10143 177725
10144     53
10141                      LIT
10145                    A610 EQU *
10145   2000    2107R      LDA =D3
10146   5473   77473A      LDB V41 KK
10147  75617               MPY
10150 170040               TCA
10151  22000   10237R      ADA =D52
10152  70540               PWC A
10153   1616   77616A      LDA V32654  XFLAG
10154 170605               SAL 6
10155 170416               AAR 15
10156 170601               SAL 2
10157  42000      57X      JSX ADD4T
10160  31657   77657A      STA V35 BCDB
10161                    A612 EQU *
10161   1657   77657A      LDA V35 BCDB
10162 170040               TCA
10163  21656   77656A      ADA V34 BCDA
10164 172003              SAP A613
10165   1657   77657A      LDA V35 BCDB
10166  31656   77656A      STA V34 BCDA
10167                    A613 EQU *
10167   2000    2107R      LDA =D3
10170   5476   77476A      LDB V44 KN
10171  75617               MPY
10172 170040               TCA
10173  22000   10240R      ADA =D47
10174  70540               PWC A
10175   1616   77616A      LDA V32654  XFLAG
10176 170605               SAL 6
10177 170416               AAR 15
10200 170601               SAL 2
10201  42000      57X      JSX ADD4T
10202  31657   77657A      STA V35 BCDB
10203 170040               TCA
10204  21656   77656A      ADA V34 BCDA
10205 172003              SAP A614
10206   1657   77657A      LDA V35 BCDB
10207  31656   77656A      STA V34 BCDA
10210                    A614 EQU *
10210   1675   77675A      LDA V15 BLEDS
10211 170601               SAL 2
10212 172006              SAP A615
10213   1656   77656A      LDA V34 BCDA
10214  22000   10241R      ADA =D-29
10215 172003              SAP A615
10216   2000    2416R      LDA =D29
10217  31656   77656A      STA V34 BCDA
10220                    A615 EQU *
10220   1656   77656A      LDA V34 BCDA
10221  22000   10242R      ADA =D-27
```

```
10222 172003                SAP A616
10223   2000      10243R      LDA =D27
10224  31656      77656A      STA V34 BCDA
10225                       A616 EQU *
10225   1656      77656A      LDA V34 BCDA
10226 170040                  TCA
10227  22000      10244R      ADA =D56
10230 172015                SAP A617
10231   2000      10244R      LDA =D56
10232  31656      77656A      STA V34 BCDA
10233   1426      77426A      LDA V32534  UFLAG
10234  62000       5517R      IOR =B100000
10235  31426      77426A      STA V32534  UFLAG
10236  66000      10250R      JMP A618
10237     64
10240     57
10241 177743
10242 177745
10243     33
10244     70
10237                         LIT
10245                       A617 EQU *
10245   1426      77426A      LDA V32534  UFLAG
10246  52000       6514R      AND =B77777
10247  31426      77426A      STA V32534  UFLAG
10250                       A618 EQU *
10250   1675      77675A      LDA V15 BLEDS
10251 170606                  SAL 7
10252 172411                SAM A619
10253   1656      77656A      LDA V34 BCDA
10254  22000       2647R      ADA =D-24
10255  11731      77731A      CPA V18 SINDEX
10256  66000      10262R      JMP A620
10257   1656      77656A      LDA V34 BCDA
10260  42000       4356R      JSM P403  EXPSIX
10261  42000       7345R      JSM P558  SCANT
10262                       A620 EQU *
10262  66000      10273R      JMP A621
10263                       A619 EQU *
10263   1656      77656A      LDA V34 BCDA
10264  22000       2647R      ADA =D-24
10265 170040                  TCA
10266  21731      77731A      ADA V18 SINDEX
10267 172004                SAP A622
10270   1426      77426A      LDA V32534  UFLAG
10271  62000       5517R      IOR =B100000
10272  31426      77426A      STA V32534  UFLAG
10273                       A622 EQU *
10273                       A621 EQU *
10273  66000      10277R      JMP A623
10274                       A607 EQU *
10274   1426      77426A      LDA V32534  UFLAG
10275  52000       6514R      AND =B77777
10276  31426      77426A      STA V32534  UFLAG
10277                       A623 EQU *
10277  42000       2650R      JSM P304  UNCAL
10300 170201                  RET 1
10301                       P624  EQU * MKRACT
10301   1616      77616A      LDA V32654  XFLAG
10302 170602                  SAL 3
10303 172006                SAP A625
10304   1576      77576A      LDA V32638  RPGPTR
10305  12000       7565R      CPA =D18
10306  66000      10310R      JMP *+2
10307  66000      10311R      JMP A625
10310  42000      12334R      JSM P217  MBLK
10311                       A625 EQU *
10311 170201                  RET 1
10312                       P218  EQU * MKREL
10312 174517                  CLB
10313  42000         56X      JSX .ARGS
10314  44016         16A      ISZ C
10315   1723      77723A      LDA V26 MKRMODE
10316  42000        121X      JSX MOD4
10317              2107R      DEF =D3
10320  22000       1277R      ADA =D-1
10321  42000        111X      JSX .EQL
10322  66000         31X     JMX .RTNA
10323                       P626  EQU * MRKROK
10323 174517                  CLB
10324  42000         56X      JSX .ARGS
10325  44016         16A      ISZ C
10326   1676      77676A      LDA V16 TLEDS
10327  52000       2477R      AND =B44
10330  22000      10335R      ADA =B177734
10331  42000        111X      JSX .EQL
10332  61733      77733A      IOR V20 FSTIM
10333 170140                  CMA
10334  66000         31X     JMX .RTNA
10335 177734
10335                         LIT
10336                       P627  EQU * MKRAD
10336  42000      10323R      JSM P626  MRKROK
```

```
10337 172022          SAP A628
10340   1702  77702A    LDA V24 VIDCON
10341 170603            SAL 4
10342 172004          SAP A631
10343   1676  77676A    LDA V16 TLEDS
10344 170615            SAL 14
10345 172404          SAM A630
10346                 A631 EQU *
10346   1676  77676A    LDA V16 TLEDS
10347  52000  10360R    AND =B201
10350  72403           SZA A629
10351                 A630 EQU *
10351   1721  77721A    LDA V25 MRKR
10352  66000  10355R    JMP A632
10353                 A629 EQU *
10353   1721  77721A    LDA V25 MRKR
10354  22000   6703R    ADA =D1024
10355                 A632 EQU *
10355   6000   2203R    LDB =D8
10356  42000     75X    JSX .WS4
10357  66000  10410R    JMP A633
10360    201
10360                  LIT
10361                 A628 EQU *
10361   1721  77721A    LDA V25 MRKR
10362  70540            PWC A
10363   1723  77723A    LDA V26 MKRMODE
10364  70540            PWC A
10365   1675  77675A    LDA V15 BLEDS
10366  70540            PWC A
10367   2000  10411R    LDA =B114
10370  42000  15546R    JSM P214  KEY
10371  70760            WWC A
10372  31675  77675A    STA V15 BLEDS
10373  70760            WWC A
10374  31723  77723A    STA V26 MKRMODE
10375  70760            WWC A
10376  31721  77721A    STA V25 MRKR
10377   1566  77566A    LDA V32630  KEYCODE
10400  12000  10412R    CPA =B113
10401  66000  10403R    JMP *+2
10402  66000  10406R    JMP A635
10403   1575  77575A    LDA V32637  K
10404  12000   2405R    CPA =D5
10405  66000  10410R    JMP A634
10406                 A635 EQU *
10406  54003      3A    DSZ V12 RPTR
10407                   NOP
10410                 A634 EQU *
10410                 A633 EQU *
10410 170201            RET 1
10411    114
10412    113
10411                  LIT
10413                 P636  EQU * MKRON
10413   1721  77721A    LDA V25 MRKR
10414  12000   3166R    CPA =D1023
10415  66000  10417R    JMP *+2
10416  66000  10424R    JMP A637
10417   2000  10522R    LDA =D501
10420  31721  77721A    STA V25 MRKR
10421  42000    161X    JSX .MVE4
10422         77665A    DEF V8  CFREQ
10423         77645A    DEF V32677  MFREQ
10424                 A637 EQU *
10424   1675  77675A    LDA V15 BLEDS
10425 170601            SAL 2
10426 172427          SAM A638
10427   2000   2203R    LDA =D6
10430  70540            PWC A
10431   1721  77721A    LDA V25 MRKR
10432  22000  10523R    ADA =D-501
10433  42000    122X    JSX CNV42
10434  42000    153X    JSX MPY2
10435         77671A    DEF V9  SPAN
10436  42000     26X    JSM P213  ROUND
10437   6000   2107R    LDB =D3
10440  42000     47X    JSX .DRGT
10441  42000    150X    JSX ADD2
10442         77665A    DEF V8  CFREQ
10443  42000     34X    JSX .STRD
10444         77645A    DEF V32677  MFREQ
10445  42000  10312R    JSM P218  MKREL
10446 172007          SAP A639
10447  42000     37X    JSX .LDBI
10450         77724A    DEF V10 AMP
10451  42000    140X    JSX MIN2
10452         77645A    DEF V32677  MFREQ
10453  42000     34X    JSX .STRD
10454         77645A    DEF V32677  MFREQ
10455                 A639 EQU *
10455                 A638 EQU *
10455  42000  10336R    JSM P627  MKRAD
10456   1675  77675A    LDA V15 BLEDS
10457 170613            SAL 12
10460 172402            SAM *+2
10461  66000  10525R    JMP A640
10462   1721  77721A    LDA V25 MRKR
```

```
10463   70540            PWC  A
10464    2000   10524R   LDA  =D968
10465   70540            PWC  A
10466    1721   77721A   LDA  V25 MRKR
10467   22000    2067R   ADA  =D-17
10470   42000    2132R   JSM  P265  LIMIT
10471   22000    1457R   ADA  =D1
10472   31721   77721A   STA  V25 MRKR
10473    2000    1463R   LDA  =D0
10474   31722   77722A   STA  V29 MKRLVL
10475   42000   10336R   JSM  P627  MKRAD
10476    2000    2205R   LDA  =D32
10477   70540            PWC  A
10500                   A641 EQU *
10500   42000     162X   JSX  .R5
10501   31473   77473A   STA  V41 KK
10502  170604            SAL  5
10503  170404            AAR  5
10504   21722   77722A   ADA  V29 MKRLVL
10505   31722   77722A   STA  V29 MKRLVL
10506  154016      16A   DSZ  C,1
10507   66000   10500R   JMP  A641
10510   54016      16A   DSZ  C
10511    2000    3166R   LDA  =D1023
10512   70540            PWC  A
10513    1722   77722A   LDA  V29 MKRLVL
10514  170404            AAR  5
10515   42000    2132R   JSM  P265  LIMIT
10516   31722   77722A   STA  V29 MKRLVL
10517   70760            WWC  A
10520   31721   77721A   STA  V25 MRKR
10521   66000   10532R   JMP  A642
10522     765
10523  177013
10524    1710
10522                    LIT
10525                   A640 EQU *
10525   42000     162X   JSX  .R5
10526   31573   77573A   STA  V32635  I
10527  170604            SAL  5
10530  170404            AAR  5
10531   31722   77722A   STA  V29 MKRLVL
10532                   A642 EQU *
10532    1675   77675A   LDA  V15 BLEDS
10533  170611            SAL  10
10534  172011           SAP  A643
10535    1705   77705A   LDA  V32 THRESH
10536   52000    1363R   AND  =B177774
10537  170040            TCA
10540   21722   77722A   ADA  V29 MKRLVL
10541  172004           SAP  A643
10542    1705   77705A   LDA  V32 THRESH
10543   52000    1363R   AND  =B177774
10544   31722   77722A   STA  V29 MKRLVL
10545                   A643 EQU *
10545    2000   10706R   LDA  =D2050
10546   42000     103X   JSX  .W4
10547    2000   10707R   LDA  =B2202
10550   42000      73X   JSX  .W6
10551    2000    4470R   LDA  =D1000
10552   70540            PWC  A
10553    1721   77721A   LDA  V25 MRKR
10554   22000    1363R   ADA  =D-4
10555   42000    2132R   JSM  P265  LIMIT
10556   42000      73X   JSX  .W6
10557    2000   10710R   LDA  =D1015
10560   70540            PWC  A
10561    1722   77722A   LDA  V29 MKRLVL
10562   22000    1363R   ADA  =D-4
10563   42000    2132R   JSM  P265  LIMIT
10564   22000   10711R   ADA  =D2052
10565   42000      73X   JSX  .W6
10566    1575   77575A   LDA  V32637  K
10567   12000    2107R   CPA  =D3
10570   66000   10641R   JMP  A644
10571    6000    2221R   LDB  =D9
10572   42000      74X   JSX  .RS5
10573   31573   77573A   STA  V32635  I
10574    6000    2203R   LDB  =D6
10575   42000      74X   JSX  .RS5
10576   31573   77573A   STA  V32635  I
10577   52000    6353R   AND  =B7777
10600  170040            TCA
10601   21721   77721A   ADA  V25 MRKR
10602  170040            TCA
10603  172005           SAP  A645
10604   42000    6127R   JSM  P501  MKIS
10605  172003           SAP  A645
10606    1721   77721A   LDA  V25 MRKR
10607   66000   10611R   JMP  A646
10610                   A645 EQU *
10610    2000    3112R   LDA  =D1001
10611                   A646 EQU *
10611   70540            PWC  A
10612    1730   77730A   LDA  V30 KFLAG
10613  170614            SAL  13
10614  172403           SAM  A647
10615    2000    1463R   LDA  =D0
```

```
10616  66000  10620R     JMP A648
10617                   A647 EQU *
10617   2000   6352R     LDA =D3072
10620                   A648 EQU *
10620  42000     57X     JSX ADD4T
10621   6000   2221R     LDB =D9
10622  42000     72X     JSX .WS6
10623   2000   2521R     LDA =D17
10624  42000   2422R     JSM P284  BLKAD
10625  42000    162X     JSX .R5
10626  31573  77573A     STA V32635  I
10627  52000   3166R     AND =B1777
10630  12000   2421R     CPA =D146
10631  66000  10633R     JMP *+2
10632  66000  10641R     JMP A649
10633   1723  77723A     LDA V26 MKRMODE
10634  42000   2223R     JSM P274  NBLK
10635   2000   2421R     LDA =D146
10636  42000     73X     JSX .W6
10637   2000   2521R     LDA =D17
10640  42000   2223R     JSM P274  NBLK
10641                   A649 EQU *
10641                   A644 EQU *
10641   1675  77675A     LDA V15 BLEDS
10642 170601             SAL 2
10643 172416            SAM A650
10644   1723  77723A     LDA V26 MKRMODE
10645  42000   2422R     JSM P284  BLKAD
10646   1435  77435A     LDA V32541  IF1
10647  52000   4207R     AND =B160000
10650  22000   5517R     ADA =B100000
10651  72006            RZA A651
10652   1722  77722A     LDA V29 MKRLVL
10653  22000  10712R     ADA =D-100
10654 172003            SAP A651
10655   2000   2521R     LDA =B21
10656  66000  10660R     JMP A652
10657                   A651 EQU *
10657   2000   1463R     LDA =D0
10660                   A652 EQU *
10660  42000     73X     JSX .W6
10661                   A650 EQU *
10661   1675  77675A     LDA V15 BLEDS
10662 170601             SAL 2
10663 172012            SAP A654
10664   1426  77426A     LDA V32534  UFLAG
10665 170610             SAL 9
10666 172405            SAM A655
10667   1575  77575A     LDA V32637  K
10670  12000   2276R     CPA =D2
10671  66000  10673R     JMP *+2
10672  66000  10675R     JMP A654
10673                   A655 EQU *
10673   1605  77605A     LDA V32645  SCANSL
10674  72005            RZA A653
10675                   A654 EQU *
10675   2000   7570R     LDA =D1040
10676  70540             PWC A
10677   1723  77723A     LDA V26 MKRMODE
10700  42000   2522R     JSM P297  RJUST
10701                   A653 EQU *
10701   2000   6703R     LDA =D1024
10702  70540             PWC A
10703   2000   2521R     LDA =D17
10704  42000   2522R     JSM P297  RJUST
10705 170201             RET 1
10706   4002
10707   2202
10710   1767
10711   4004
10712 177634
10706                    LIT
10713                   P656  EQU * GRAT
10713   6000   2110R     LDB =D-2
10714  42000     27X     JSX .ARGA
10715   6000   2153R     LDB =D-5  N
10716  42000     30X     JSX .LDAP
10717 170040             TCA
10720   6000   1301R     LDB =D-3  M
10721  42000    115X     JSX ADD4P
10722  22000   1277R     ADA =B177777
10723  70540             PWC A
10724   6000   1301R     LDB =D-3  M
10725  42000     30X     JSX .LDAP
10726                   A657 EQU *
10726  31573  77573A     STA V32635  I
10727  42000     60X     JSX .ARAY
10730            540R     DEF V181  GRATCL
10731  31572  77572A     STA V32634  J
10732 172005            SAP A658
10733 170040             TCA
10734   6000   2203R     LDB =D8
10735  42000     75X     JSX .WS4
10736  66000  10741R     JMP A659
10737                   A658 EQU *
10737   6000   2203R     LDB =D8
10740  42000     72X     JSX .WS6
```

```
10741                           A659 EQU *
10741    2000     1457R           LDA =D1
10742   21573    77573A           ADA V32635  I
10743  144016       16A           ISZ C,I
10744   66000    10726R           JMP A657
10745   54016       16A           DSZ C
10746   66000       31X           JMX .RTNA
10747                           P219  EQU * MKRDEL
10747    1723    77723A           LDA V26 MKRMODE
10750   72002                     RZA *+2
10751   66000    11007R           JMP A660
10752   42000    10413R           JSM P636   MKRON
10753   42000    10301R           JSM P624   MKRACT
10754   42000    10312R           JSM P218   MKREL
10755  172026                     SAP A661
10756   42000    10323R           JSM P626   MKRROK
10757  172024                     SAP A661
10760    2000     5015R           LDA =D2055
10761    6000     2203R           LDB =D8
10762   42000       75X           JSX .WS4
10763    2000    10707R           LDA =B2202
10764   42000       73X           JSX .W6
10765    2000     4470R           LDA =D1000
10766   70540                     PWC A
10767    1717    77717A           LDA V28 AMKR
10770   22000     1363R           ADA =D-4
10771   42000     2132R           JSM P265  LIMIT
10772   42000       73X           JSX .W6
10773    2000    10710R           LDA =D1015
10774   70540                     PWC A
10775    1720    77720A           LDA V27 AMLVL
10776   22000     1363R           ADA =D-4
10777   42000     2132R           JSM P265  LIMIT
11000   22000    10711R           ADA =D2052
11001   42000       73X           JSX .W6
11002   66000    11007R           JMP A662
11003                           A661 EQU *
11003    2000     2221R           LDA =D9
11004   70540                     PWC A
11005    2000     2406R           LDA =D7
11006   42000    10713R           JSM P656  GRAT
11007                           A662 EQU *
11007                           A660 EQU *
11007  170201                     RET 1
11010                           P663  EQU * STMRKR
11010    6000     1277R           LDB =D-1
11011   42000       27X           JSX .ARGA
11012    2000     4470R           LDA =D1000
11013   70540                     PWC A
11014    6000     1301R           LDB =D-3  X
11015   42000       30X           JSX .LDAP
11016   22000     1277R           ADA =D-1
11017   42000     2132R           JSM P265  LIMIT
11020   22000     1457R           ADA =D1
11021   31721    77721A           STA V25 MRKR
11022    1616    77616A           LDA V32654  XFLAG
11023   52000     1704R           AND =D6
11024   22000     1363R           ADA =B177774
11025   72011                     RZA A664
11026    1616    77616A           LDA V32654  XFLAG
11027   52000     2153R           AND =B177773
11030   31616    77616A           STA V32654  XFLAG
11031  170612                     SAL 11
11032  172004                     SAP A665
11033   42000       37X           JSX .LDBI
11034            77665A           DEF V8  CFREQ
11035   42000     6016R           JSM P500  STUNE
11036                           A665 EQU *
11036                           A664 EQU *
11036    1426    77426A           LDA V32534  UFLAG
11037   62000     1364R           IOR =B100
11040   31426    77426A           STA V32534  UFLAG
11041   42000    10413R           JSM P636  MKRON
11042   42000     2650R           JSM P304  UNCAL
11043   66000       31X           JMX .RTNA
11044                           P666  EQU * WTHRSH
11044    6000     1277R           LDB =D-1
11045   42000       27X           JSX .ARGA
11046    2000     4470R           LDA =D1000
11047   70540                     PWC A
11050    6000     1301R           LDB =D-3  T
11051   42000       30X           JSX .LDAP
11052   42000     2132R           JSM P265  LIMIT
11053   31705    77705A           STA V32 THRESH
11054    2000    11067R           LDA =D2169
11055    6000     2203R           LDB =D8
11056   42000       75X           JSX .WS4
11057    1705    77705A           LDA V32 THRESH
11060  170501                     SAR 2
11061   52000    11070R           AND =B170777
11062   62000    11071R           IOR =B3000
11063   42000       73X           JSX .W6
11064    2000     2131R           LDA =D15
11065   42000     2314R           JSM P279  SBLK
11066   66000       31X           JMX .RTNA
11067    4171
11070  170777
11071    3000
```

```
11067                    LIT
11072                    P667  EQU * WLVLN
11072    6000     1277R    LDB =D-1
11073   42000       27X    JSX .ARGA
11074    2000     4470R    LDA =D1000
11075   70540              PWC A
11076    6000     1301R    LDB =D-3  L
11077   42000       30X    JSX .LDAP
11100   42000     2132R    JSM P265  LIMI1
11101   31704    77704A    STA V33 LEVLIN
11102    2000    11117R    LDA =D2060
11103    6000     2203R    LDB =D8
11104   42000       75X    JSX .WS4
11105    2000    10707R    LDA =B2202
11106   42000       73X    JSX .W6
11107    2000     1463R    LDA =D0
11110   42000       73X    JSX .W6
11111    1704    77704A    LDA V33 LEVLIN
11112   62000     2277R    IOR =D2048
11113   42000       73X    JSX .W6
11114    2000     3527R    LDA =D14
11115   42000     2314R    JSM P279  SBLK
11116   66000       31X    JMX .RTNA
11117    4014
11117                    LIT
11120                    P668  EQU * SPANW
11120    6000     1363R    LDB =D-4
11121   42000       32X    JSX .ARGL
11122   66000    11200R    JMP A669
11123                    T670 EQU *
11123                    D671  OCT 0,0,20,0  100000
11127                    D672  OCT 0,0,400,0 1000000
11133                    D673  OCT 0,0,20000,0 20000000
11137                    D674  OCT 0,27,0,0  1700000000
11143            11123R  V675 DEF T670 SPANLIMIT
11144                      OCT 177777  177777
11145                      OCT 20  20
11146                    T676 EQU *
11146                    D677  OCT 0,20106,0,0 2.0460-1
11152                    D678  OCT 0,10043,0,0 1.0230-1
11156                    D679  OCT 177600,50425,0,0  5.1150-3
11162                    D680  OCT 177400,60027,62160,54400  6.0176470590-5
11166            11146R  V681 DEF T676 SWPSENS
11167                      OCT 177777  177777
11170                      OCT 20  20
11171                    T682 EQU *
11171                    N683  DEC 1 1
11172                      DEC 1 1
11173                    N684  DEC 2 2
11174                      DEC 4 4
11175            11171R  V685 DEF T682 SCANITEM
11176                      OCT 177777  177777
11177                    K148  OCT 4 4
11200                    A669  EQU *
11200    1605    77605A    LDA V32645   SCANSL
11201   70540              PWC A
11202   42000       34X    JSX .STRD
11203            77671A    DEF V9  SPAN
11204    1606    77606A    LDA V32646   SRCEID
11205   73006              SLA A686
11206   62000     4534R    IOR =B40000
11207   31606    77606A    STA V32646   SRCEID
11210    2000     3654R    LDA =B20
11211    6000     2411R    LDB =D4
11212   42000      112X    JSX .WS7
11213                    A686 EQU *
11213   71500              NRM
11214   35600    77600A    STB V32640   CTIM
11215    6000     1463R    LDB =D0
11216   42000      132X    JSX .FDIG
11217   22000     2417R    ADA =D-6
11220  172003              SAP A687
11221   45600    77600A    ISZ V32640   CTIM
11222                      NOP
11223                    A687 EQU *
11223   42000       37X    JSX .LDBI
11224            77671A    DEF V9  SPAN
11225   42000      127X    JSX MIN3
11226             1457R    DEF =D1
11227    4020       20A    LDB AR2
11230   77414              RLB A688
11231    1604    77604A    LDA V32644   SATN
11232   31573    77573A    STA V32635   I
11233    2000     4207R    LDA =B160000
11234   31604    77604A    STA V32644   SATN
11235    2000     1463R    LDA =D0
11236   31605    77605A    STA V32645   SCANSL
11237   42000       53X    JSX .LDSI
11240             1463R    DEF =D0
11241   42000       34X    JSX .STRD
11242            77671A    DEF V9  SPAN
11243   66000    11401R    JMP A689
11244                    A688 EQU *
11244    1604    77604A    LDA V32644   SATN
11245   70540              PWC A
11246    1733    77733A    LDA V20 FSTIM
11247  172004              SAP A690
```

```
11250   1675    77675A      LDA V15 BLEDS
11251   52000   11303R      AND =B177377
11252   31675   77675A      STA V15 BLEDS
11253                      A690 EQU *
11253   42000     156X      JSX .CLB1
11254           11304R      DEF =F1699999900
11255   42000      53X      JSX .LDSI
11256           11310R      DEF =H100
11257   42000     140X      JSX MIN2
11260           77671A      DEF V9  SPAN
11261   42000    2043R      JSM P256  DLIMIT
11262   42000     163X      JSX ADD3
11263           11310R      DEF =H100
11264   42000      34X      JSX .STRD
11265           77671A      DEF V9  SPAN
11266    2000    1457R      LDA =D1
11267   31573   77573A      STA V32635  I
11270                      A691 EQU *
11270    1573   77573A      LDA V32635  I
11271   42000     133X      JSX .LRAY
11272           11143R      DEF V675  SPANLIMIT
11273   42000     134X      JSX .LDBA
11274   42000     145X      JSX SUB2
11275           77671A      DEF V9  SPAN
11276    4020      20A      LDB AR2
11277   77012              SLB A692
11300   45573   77573A      ISZ V32635  I
11301                       NOP
11302   66000   11270R      JMP A691
11303 177377
11304 1699999900
11310     400
11303                       LIT
11311                      A692 EQU *
11311    1573   77573A      LDA V32635  I
11312   42000      60X      JSX .ARAY
11313           11175R      DEF V665  SCANITEM
11314   31605   77605A      STA V32645  SCANSL
11315   42000      37X      JSX .LDBI
11316           77671A      DEF V9  SPAN
11317   42000      62X      JSX CNV21
11320   42000      36X      JSX .SAR2
11321    1573   77573A      LDA V32635  I
11322   42000     133X      JSX .LRAY
11323           11166R      DEF V681  SWPSENS
11324   42000     134X      JSX .LDBA
11325   42000      64X      JSX MPY1I
11326   42000      65X      JSX CNV12
11327   42000      34X      JSX .STRD
11330           77655A      DEF V32685  LTEMP2
11331    2000    6703R      LDA =B2000
11332   31604   77604A      STA V32644  SATN
11333                      A693 EQU *
11333   42000      37X      JSX .LDBI
11334           77655A      DEF V32685  LTEMP2
11335   42000     127X      JSX MIN3
11336           11353R      DEF =H1023
11337    4020      20A      LDB AR2
11340   77014              SLB A694
11341   42000      37X      JSX .LDBI
11342           77655A      DEF V32685  LTEMP2
11343    6000    1457R      LDB =D1
11344   42000      47X      JSX .DRGT
11345   42000      34X      JSX .STRD
11346           77655A      DEF V32685  LTEMP2
11347    1604   77604A      LDA V32644  SATN
11350 170600                SAL 1
11351   31604   77604A      STA V32644  SATN
11352   66000   11333R      JMP A693
11353   10043
11353                       LIT
11354                      A694 EQU *
11354    1573   77573A      LDA V32635  I
11355   12000    1457R      CPA =D1
11356   66000   11360R      JMP *+2
11357   66000   11363R      JMP A695
11360    1604   77604A      LDA V32644  SATN
11361   62000    4534R      IOR =B40000
11362   31604   77604A      STA V32644  SATN
11363                      A695 EQU *
11363   70760               MWC A
11364   31573   77573A      STA V32635  I
11365    1731   77731A      LDA V18 SINDEX
11366 170040                TCA
11367   22000    7565R      ADA =D18
11370   42000     104X      JSX .TURN
11371            5517R      DEF =B100000
11372           77604A      DEF V32644  SATN
11373   70540               PWC A
11374   42000      37X      JSX .LDBI
11375           77655A      DEF V32685  LTEMP2
11376   42000      50X      JSX CNV24
11377   42000     136X      JSX .ORT
11400   31604   77604A      STA V32644  SATN
11401                      A689 EQU *
11401    1605   77605A      LDA V32645  SCANSL
11402   22000    2110R      ADA =D-2
```

```
11403 172005           SAP A696
11404   1603  77603A    LDA V32643  PLOCK
11405  52000  11451R    AND =B67777
11406  62000   5517R    IOR =B100000
11407  31603  77603A    STA V32643  PLOCK
11410                  A696 EQU *
11410   1604  77604A    LDA V32644  SATN
11411   6000   1457R    LDB =D1
11412  42000     75X    JSX .WS4
11413   1605  77605A    LDA V32645  SCANSL
11414  42000    106X    JSX .W7
11415   1603  77603A    LDA V32643  PLOCK
11416  42000     73X    JSX .W6
11417  70760            WWC A
11420  31572  77572A    STA V32634  J
11421   1605  77605A    LDA V32645  SCANSL
11422 170040            TCA
11423  22000   1457R    ADA =D1
11424 170412            AAR 11
11425  42000    104X    JSX .TURN
11426          3654R    DEF =D16
11427         77616A    DEF V32654  XFLAG
11430  31616  77616A    STA V32654  XFLAG
11431   1605  77605A    LDA V32645  SCANSL
11432  11572  77572A    CPA V32634  J
11433  66000  11435R    JMP *+2
11434  66000  11442R    JMP A698
11435   1573  77573A    LDA V32635  I
11436  42000    120X    JSX .TEST
11437          4534R    DEF =B40000
11440         77604A    DEF V32644  SATN
11441  72011            RZA A697
11442                  A698 EQU *
11442  42000     37X    JSX .LDBI
11443         77665A    DEF V8  CFREQ
11444  42000   6750R    JSM P222  TUNE
11445   2000   2107R    LDA =D3
11446   6000   2107R    LDB =D3
11447  42000     75X    JSX .WS4
11450  66000  11462R    JMP A699
11451  67777
11451                   LIT
11452                  A697 EQU *
11452  42000   6723R    JSM P538  CSBLK
11453   1600  77600A    LDA V32640  CTIM
11454 170040            TCA
11455  22000   2406R    ADA =D7
11456 172004            SAP A700
11457   2000   2107R    LDA =D3
11460   6000   2107R    LDB =D3
11461  42000     75X    JSX .WS4
11462                  A700 EQU *
11462                  A699 EQU *
11462  42000   7775R    JSM P603  CSCANBW
11463  66000     31X    JMX .RTNA
11464                  P701  EQU * STEPD
11464   6000   1363R    LDB =D-4
11465  42000     32X    JSX .ARGL
11466  42000     37X    JSX .LDBI
11467         77707A    DEF V11 FOFSET
11470  42000    140X    JSX MIN2
11471         77665A    DEF V8  CFREQ
11472   6000   1375R    LDB =D-9  F
11473  42000    147X    JSX ADD2P
11474  42000     34X    JSX .STRD
11475         77655A    DEF V32685  LTEMP2
11476   1655  77655A    LDA V32685  LTEMP2
11477  73010            SLA A702
11500  42000     37X    JSX .LDBI
11501         77665A    DEF V8  CFREQ
11502  42000    140X    JSX MIN2
11503         77707A    DEF V11 FOFSET
11504   6000   1375R    LDB =D-9  F
11505  42000     43X    JSX .STBP
11506  66000  11523R    JMP A703
11507                  A702 EQU *
11507  42000    140X    JSX MIN2
11510          7220R    DEF =F1739100000
11511   4020     20A    LDB AR2
11512  77011            SLB A704
11513  42000     37X    JSX .LDBI
11514         77665A    DEF V8  CFREQ
11515  42000    140X    JSX MIN2
11516          7220R    DEF =F1739100000
11517  42000    150X    JSX ADD2
11520         77707A    DEF V11 FOFSET
11521   6000   1375R    LDB =D-9  F
11522  42000     43X    JSX .STBP
11523                  A704 EQU *
11523                  A703 EQU *
11523  42000     37X    JSX .LDBI
11524         77665A    DEF V8  CFREQ
11525   6000   1375R    LDB =D-9  F
11526  42000    147X    JSX ADD2P
11527  42000     34X    JSX .STRD
11530         77665A    DEF V8  CFREQ
11531   6000   1375R    LDB =D-9  F
11532  42000     66X    JSX .LDBP
11533  42000     52X    JSX .DEQL
```

```
11534 172002                SAP *+2
11535  66000     12177R     JMP A705
11536  42000      6740R     JSM P539   CFDUMP
11537   1616     77616A     LDA V32654   XFLAG
11540  62000      2205R     IOR =B40
11541  31616     77616A     STA V32654   XFLAG
11542   1571     77571A     LDA V32633   L
11543  70540                PWC A
11544   1604     77604A     LDA V32644   SATN
11545 170600                SAL 1
11546 172014               SAP A706
11547  42000       161X     JSX .MVE4
11550            11555R     DEF =F2500000
11551            77661A     DEF V32689   LTEMP1
11552   2000     11561R     LDA =D667
11553  31573     77573A     STA V32635   I
11554  66000     11567R     JMP A707
11555 2500000
11561   1233
11555                       LIT
11562                      A706 EQU *
11562  42000       161X     JSX .MVE4
11563            11777R     DEF =F1250000
11564            77661A     DEF V32689   LTEMP1
11565   2000     12003R     LDA =D333
11566  31573     77573A     STA V32635   I
11567                      A707 EQU *
11567   1604     77604A     LDA V32644   SATN
11570 170600                SAL 1
11571 172004               SAP A708
11572  42000        37X     JSX .LDBI
11573            12004R     DEF =F200000
11574  66000     11577R     JMP A709
11575                      A708 EQU *
11575  42000        37X     JSX .LDBI
11576            12010R     DEF =F400000
11577                      A709 EQU *
11577  42000        36X     JSX .SAR2
11600   6000      1375R     LDB =D-9   F
11601  42000        66X     JSX .LDBP
11602   6000      1375R     LDB =D-9   F
11603  42000       147X     JSX ADD2P
11604   6000      1704R     LDB =D6
11605  42000        51X     JSX .DLFT
11606  42000       164X     JSX DIV2T
11607  42000        34X     JSX .STRD
11610            77655A     DEF V32685   LTEMP2
11611  42000       146X     JSX DIV3
11612             5741R     DEF =H7500
11613  42000        50X     JSX CNV24
11614  21614     77614A     ADA V32652   DAC2
11615  31614     77614A     STA V32652   DAC2
11616  42000        37X     JSX .LDBI
11617            77655A     DEF V32685   LTEMP2
11620  42000       140X     JSX MIN2
11621            77641A     DEF V32673   VTOFREQ
11622  42000        34X     JSX .STRD
11623            77641A     DEF V32673   VTOFREQ
11624  42000        37X     JSX .LDBI
11625             7250R     DEF =F25000000
11626  42000       140X     JSX MIN2
11627            77641A     DEF V32673   VTOFREQ
11630  42000        34X     JSX .STRD
11631            77742A     DEF V32738   XL
11632   4020        20A     LDB AR2
11633  77202                SLB *+2,C
11634  34020        20A     STB AR2
11635  42000       140X     JSX MIN2
11636            77661A     DEF V32689   LTEMP1
11637   4020        20A     LDB AR2
11640  77026               SLB A710
11641   1742     77742A     LDA V32738   IX
11642 170601                SAL 2
11643 170040                TCA
11644  22000      2276R     ADA =D2
11645  31742     77742A     STA V32738   IX
11646  21571     77571A     ADA V32633   L
11647  31571     77571A     STA V32633   L
11650   1742     77742A     LDA V32738   IX
11651 170400                AAR 1
11652   5573     77573A     LDB V32635   I
11653  75617                MPY
11654  21614     77614A     ADA V32652   DAC2
11655  31614     77614A     STA V32652   DAC2
11656   1742     77742A     LDA V32738   IX
11657  42000       122X     JSX CNV42
11660  42000       153X     JSX MPY2
11661            77661A     DEF V32689   LTEMP1
11662  42000       140X     JSX MIN2
11663            77641A     DEF V32673   VTOFREQ
11664  42000        34X     JSX .STRD
11665            77641A     DEF V32673   VTOFREQ
11666                      A710 EQU *
11666  42000        37X     JSX .LDBI
11667            77655A     DEF V32685   LTEMP2
11670  42000        50X     JSX CNV24
11671  42000       113X     JSX DIV4
11672             3654R     DEF =D16
```

```
11673  21615  77615A    ADA V32653  DAC1
11674  31615  77615A    STA V32653  DAC1
11675  70760            WWC A
11676  31573  77573A    STA V32635  1
11677  11571  77571A    CPA V32633  L
11700  66000  11702R    JMP *+2
11701  66000  11716R    JMP A712
11702   1615  77615A    LDA V32653  DAC1
11703  52000   5742R    AND =B176000
11704  72012           RZA A712
11705  42000     37X    JSX .LDB1
11706         77655A    DEF V32685  LTEMP2
11707   4020     20A    LDB AR2
11710  77202            SLB *+2,C
11711  34020     20A    STB AR2
11712  42000    127X    JSX MIN3
11713          5741R    DEF =H7500
11714   4020     20A    LDB AR2
11715  77002           SLB A711
11716                 A712 EQU *
11716  42000   5656R    JSM P487  VTOTUNE
11717                 A711 EQU *
11717   1615  77615A    LDA V32653  DAC1
11720   6000   1463R    LDB =D0
11721  42000     75X    JSX .WS4
11722   1614  77614A    LDA V32652  DAC2
11723  42000    105X    JSX .W5
11724   6000   1375R    LDB =D-9   F
11725  42000     66X    JSX .LDBP
11726   6000   1375R    LDB =D-9   F
11727  42000    147X    JSX ADD2P
11730   6000   1704R    LDB =D6
11731  42000     47X    JSX .DRGT
11732  42000     50X    JSX CNV24
11733 170600            SAL 1
11734 170040            TCA
11735  21571  77571A    ADA V32633  L
11736  31571  77571A    STA V32633  L
11737 170403            AAR 4
11740 170040            TCA
11741  21570  77570A    ADA V32632  M
11742  31570  77570A    STA V32632  M
11743   1571  77571A    LDA V32633  L
11744  52000   3527R    AND =D14
11745  31571  77571A    STA V32633  L
11746   1746  77746A    LDA V32742  N
11747  70540            PWC A
11750                 A713 EQU *
11750   1570  77570A    LDA V32632  M
11751  22000   2066R    ADA =D-8
11752 172417           SAM A715
11753   1570  77570A    LDA V32632  M
11754  12000   2203R    CPA =D8
11755  66000  11757R    JMP *+2
11756  66000  12015R    JMP A714
11757   1571  77571A    LDA V32633  L
11760 170040            TCA
11761  22000   2204R    ADA =L10
11762 172407           SAM A716
11763   1571  77571A    LDA V32633  L
11764 170040            TCA
11765 172030           SAP A714
11766   1604  77604A    LDA V32644  SATN
11767 170600            SAL 1
11770 172425           SAM A714
11771                 A716 EQU *
11771                 A715 EQU *
11771   1570  77570A    LDA V32632  M
11772  22000  12014R    ADA =D-13
11773  42000    113X    JSX DIV4
11774          2405R    DEF =D5
11775  31573  77573A    STA V32635  1
11776  66000  12042R    JMP A717
11777 1250000
12003    515
12004 200000
12010 400000
12014 177763
11777                   LIT
12015                 A714 EQU *
12015   1570  77570A    LDA V32632  M
12016 170040            TCA
12017  22000   2172R    ADA =D13
12020 172413           SAM A719
12021   1570  77570A    LDA V32632  M
12022  12000   2172R    CPA =D13
12023  66000  12025R    JMP *+2
12024  66000  12040R    JMP A718
12025   1571  77571A    LDA V32633  L
12026  22000   3526R    ADA =D-10
12027 172011           SAP A718
12030   1604  77604A    LDA V32644  SATN
12031 170600            SAL 1
12032 172006           SAP A718
12033                 A719 EQU *
12033   1570  77570A    LDA V32632  M
12034  22000   2066R    ADA =D-8
12035  42000    113X    JSX DIV4
```

```
12036                 2405R    DEF =D5
12037  66000         12041R    JMP A720
12040                         A718 EQU *
12040   2000          1463R    LDA =D0
12041                         A720 EQU *
12041  31573         77573A    STA V32635   I
12042                         A717 EQU *
12042   6000          2405R    LDB =D5
12043  75617                   MPY
12044 170040                   TCA
12045  21570         77570A    ADA V32632   M
12046  31570         77570A    STA V32632   M
12047   1573         77573A    LDA V32635   I
12050  42000           125X    JSX CNV43
12051  42000           163X    JSX ADD3
12052                77746A    DEF V32742   N
12053     23            23A    LDA AR2+3
12054  31746         77746A    STA V32742   N
12055   1573         77573A    LDA V32635   I
12056  72402                   SZA *+2
12057  66000         11750R    JMP A713
12060  42000          2154R    JSM P269   WSPIN
12061   6000          1375R    LDB =D-9   F
12062  42000            66X    JSX .LDBP
12063  42000           150X    JSX ADD2
12064                77635A    DEF V32669   CFREST
12065   6000          1375R    LDB =D-9   F
12066  42000            43X    JSX .STBP
12067  70760                   WWC A
12070  31573         77573A    STA V32635   I
12071   4020            20A    LDB AR2
12072  77202                   SLB *+2,C
12073  34020            20A    STB AR2
12074  42000           145X    JSX SUB2
12075                 7237R    DEF =F1700000
12076   4020            20A    LDB AR2
12077  77017                  SLB A722
12100   1573         77573A    LDA V32635   I
12101  42000           120X    JSX .TEST
12102                 1277R    DEF =B177777
12103                77746A    DEF V32742   N
12104  72412                  SZA A722
12105   1605         77605A    LDA V32645   SCANSL
12106 170615                   SAL 14
12107 172402                   SAM *+2
12110  66000         12173R    JMP A721
12111   1731         77731A    LDA V18 SINDEX
12112 170040                   TCA
12113  22000          2221R    ADA =D9
12114 172402                   SAM *+2
12115  66000         12173R    JMP A721
12116                         A722 EQU *
12116   2000          3166R    LDA =D1023
12117  70540                   PWC A
12120   6000          1375R    LDB =D-9   F
12121  42000            66X    JSX .LDBP
12122  42000           151X    JSX DIV2
12123                 7237R    DEF =F1700000
12124  42000            50X    JSX CNV24
12125  21613         77613A    ADA V32651   DAC4
12126  42000          2132R    JSM P265   LIMIT
12127  31613         77613A    STA V32651   DAC4
12130   6000          1463R    LDB =D0
12131  42000           112X    JSX .WS7
12132   6000          1375R    LDB =D-9   F
12133  42000            66X    JSX .LDBP
12134  42000           155X    JSX MOD2
12135                 7237R    DEF =F1700000
12136  42000            34X    JSX .STRD
12137                77635A    DEF V32669   CFREST
12140   1616         77616A    LDA V32654   XFLAG
12141 170612                   SAL 11
12142 172415                  SAM A723
12143   1603         77603A    LDA V32643   PLUCK
12144  52000         11451R    AND =B67777
12145  62000          7225R    IOR =B110000
12146   6000          1457R    LDB =D1
12147  42000            72X    JSX .WS6
12150  42000          7671R    JSM P595   YIGSHFT
12151  42000          5252R    JSM P460   YIGSLEW
12152   1603         77603A    LDA V32643   PLUCK
12153   6000          1457R    LDB =D1
12154  42000            72X    JSX .WS6
12155  42000          5252R    JSM P460   YIGSLEW
12156  66000         12166R    JMP A724
12157                         A723 EQU *
12157  42000            37X    JSX .LDBI
12160                12167R    DEF =F100000000
12161  42000           140X    JSX MIN2
12162                77671A    DEF V9   SPAN
12163   4020            20A    LDB AR2
12164  77002                  SLB A725
12165  42000          6160R    JSM P502   EOS
12166                         A725 EQU *
12166                         A724 EQU *
12166  66000         12177R    JMP A726
12167 100000000
```

```
12167                          LIT
12173                          A721 EQU *
12173     6000     1375R        LDB =D-9   F
12174    42000       66X        JSX .LDBP
12175    42000       34X        JSX .STRD
12176            77635A         DEF V32669   CFREST
12177                          A726 EQU *
12177                          A705 EQU *
12177    66000       31X        JMX .RTNA
12200                          P727  EQU * STEPH
12200     6000     1363R        LDB =D-4
12201    42000       32X        JSX .ARGL
12202     1763    77763A        LDA E
12203    22000     2153R        ADA =D-5
12204    22000     2107R        ADA =D3
12205    31573    77573A        STA V32635   I
12206   101573    77573A        LDA V32635,I   I
12207    52000     2110R        AND =B177776
12210   131573    77573A        STA V32635,I   I
12211    42000      126X        JSX MPY3
12212              2405R        DEF =D5
12213     6000     1457R        LDB =D1
12214    42000       47X        JSX .DRGT
12215    42000    11464R        JSM P701   STEPD
12216    42000       37X        JSX .LDB1
12217            77671A         DEF V9  SPAN
12220     6000     1375R        LDB =D-9   F
12221    42000      147X        JSX ADD2P
12222    42000    11120R        JSM P668   SPANW
12223    66000       31X        JMX .RTNA
12224                          P728  EQU * STEPL
12224     6000     1363R        LDB =D-4
12225    42000       32X        JSX .ARGL
12226     1763    77763A        LDA E
12227    22000     2153R        ADA =D-5
12230    22000     2107R        ADA =D3
12231    31573    77573A        STA V32635   I
12232   101573    77573A        LDA V32635,I   I
12233    52000     2110R        AND =B177776
12234   131573    77573A        STA V32635,I   I
12235    42000      126X        JSX MPY3
12236              2405R        DEF =D5
12237     6000     1457R        LDB =D1
12240    42000       47X        JSX .DRGT
12241    42000    11464R        JSM P701   STEPD
12242     6000     1375R        LDB =D-9   F
12243    42000       66X        JSX .LDBP
12244    42000      140X        JSX MIN2
12245            77671A         DEF V9  SPAN
12246    42000    11120R        JSM P668   SPANW
12247    66000       31X        JMX .RTNA
12250                          P729  EQU * STEPF
12250     6000     1363R        LDB =D-4
12251    42000       32X        JSX .ARGL
12252    42000    11464R        JSM P701   STEPD
12253     1600    77600A        LDA V32640   CTIM
12254   170040                  TCA
12255    22000     2203R        ADA =D8
12256   172004                  SAP A730
12257     2000     2107R        LDA =D3
12260     6000     2107R        LDB =D3
12261    42000       75X        JSX .WS4
12262                          A730 EQU *
12262     2000     2406R        LDA =D7
12263    42000     2314R        JSM P279   SBLK
12264    66000       31X        JMX .RTNA
12265                          P731  EQU * DSWRT
12265     6000     1277R        LDB =D-1
12266    42000       27X        JSX .ARGA
12267     1563    77563A        LDA V32627   DSTAD
12270     6000     2203R        LDB =D8
12271    42000       75X        JSX .WS4
12272     6000     1301R        LDB =D-3   N
12273    42000       30X        JSX .LDAP
12274    42000       73X        JSX .W6
12275     1563    77563A        LDA V32627   DSTAD
12276    22000     1457R        ADA =D1
12277    52000     6353R        AND =B7777
12300    31563    77563A        STA V32627   DSTAD
12301    66000       31X        JMX .RTNA
12302                          P732  EQU * WKEY
12302     1612    77612A        LDA V32650   NCHR
12303    21737    77737A        ADA V32735   BLKS
12304    21611    77611A        ADA V32649   CHRC
12305     6000     2203R        LDB =D8
12306    42000       75X        JSX .WS4
12307     1566    77566A        LDA V32630   KEYCODE
12310    42000       73X        JSX .W6
12311     2000     2500R        LDA =D147
12312    42000       73X        JSX .W6
12313    42000       73X        JSX .W6
12314    45611    77611A        ISZ V32649   CHRC
12315                           NOP
12316   170201                  RET 1
12317                          P733  EQU * CLRNUM
12317     1616    77616A        LDA V32654   XFLAG
12320   170602                  SAL 3
12321   172012                  SAP A734
```

```
12322    2000   1463R     LDA =D0
12323   31611  77611A     STA V32649   CHRC
12324    1616  77616A     LDA V32654   XFLAG
12325   52000   6371R     AND =B167777
12326   31616  77616A     STA V32654   XFLAG
12327   42000     53X     JSX .LDSI
12330           1463R     DEF =D0
12331   42000     34X     JSX .STRD
12332          77651A     DEF V32681   LTEMP
12333                   A734 EQU *
12333  170201             RET 1
12334                   P217  EQU * MBLK
12334    1576  77576A     LDA V32638   RPGPTR
12335   12000   7565R     CPA =D18
12336   66000  12341R     JMP A735
12337   42000   2551R     JSM P298   ABLK
12340   66000  12473R     JMP A736
12341                   A735 EQU *
12341    1723  77723A     LDA V26 MKRMODE
12342   22000  12375R     ADA =D-21
12343  172405            SAM A738
12344    1426  77426A     LDA V32534   UFLAG
12345  170610             SAL 9
12346  172002             SAP *+2
12347   66000  12456R     JMP A737
12350                   A738 EQU *
12350   66000  12376R     JMP A739
12351                   P740  EQU * COPY
12351                   A741 EQU *
12351    1573  77573A     LDA V32635   I
12352   42000    103X     JSX .W4
12353   42000    162X     JSX .R5
12354   31656  77656A     STA V34 BCDA
12355   52000   3242R     AND =B377
12356   31656  77656A     STA V34 BCDA
12357    1572  77572A     LDA V32634   J
12360   42000    103X     JSX .W4
12361    1656  77656A     LDA V34 BCDA
12362   12000   2421R     CPA =D146
12363   66000  12365R     JMP A742
12364   42000     73X     JSX .W6
12365                   A742 EQU *
12365   45573  77573A     ISZ V32635   I
12366                     NOP
12367   45572  77572A     ISZ V32634   J
12370                     NOP
12371   12000   2421R     CPA =D146
12372   66000  12374R     JMP *+2
12373   66000  12351R     JMP A741
12374  170201             RET 1
12375  177753
12375                     LIT
12376                   A739  EQU *
12376   42000  12317R     JSM P733   CLRNUM
12377    1616  77616A     LDA V32654   XFLAG
12400   62000   2644R     IOR =B10000
12401   31616  77616A     STA V32654   XFLAG
12402    2000   1463R     LDA =D0
12403   31617  77617A     STA V32655   DECFLG
12404    1737  77737A     LDA V32735   BLKS
12405   21612  77612A     ADA V32650   NCHR
12406   31572  77572A     STA V32634   J
12407    6000   2203R     LDB =D8
12410   34011     11A     STB PA
12411    2000   2107R     LDA =D3
12412    5723  77723A     LDB V26 MKRMODE
12413   75617             MPY
12414   22000   2110R     ADA =D-2
12415   42000     60X     JSX .ARAY
12416            210R     DEF V112   SFTXY
12417   70541             PWC B
12420    1723  77723A     LDA V26 MKRMODE
12421   42000     60X     JSX .ARAY
12422            267R     DEF V119   SFTAB
12423  100000             LDA A,I
12424   42000     77X     JSX ADD4B
12425   22000   1704R     ADA =D6
12426   31573  77573A     STA V32635   I
12427   42000  12351R     JSM P740   COPY
12430   42000   2173R     JSM P271   CRLF
12431    1572  77572A     LDA V32634   J
12432   22000   2276R     ADA =D2
12433   31572  77572A     STA V32634   J
12434    2000   2107R     LDA =D3
12435    6000   2521R     LDB =D17
12436   75617             MPY
12437   22000   2110R     ADA =D-2
12440   42000     60X     JSX .ARAY
12441            210R     DEF V112   SFTXY
12442   70541             PWC B
12443    2000   2521R     LDA =D17
12444   42000     60X     JSX .ARAY
12445            267R     DEF V119   SFTAB
12446  100000             LDA A,I
12447   42000     77X     JSX ADD4B
12450   22000   1704R     ADA =D6
12451   31573  77573A     STA V32635   I
12452   42000  12351R     JSM P740   COPY
12453    2000   2500R     LDA =D147
```

```
12454  42000      73X    JSX .W6
12455  66000   12473R    JMP A743
12456                  A737 EQU *
12456  42000   12317R    JSM P733  CLRNUM
12457   1612   77612A    LDA V32650  NCHR
12460  21737   77737A    ADA V32735  BLKS
12461   6000    2203R    LDB =D8
12462  42000      75X    JSX .WS4
12463   2000    2500R    LDA =D147
12464  42000      73X    JSX .W6
12465  42000      73X    JSX .W6
12466   1616   77616A    LDA V32654  XFLAG
12467  62000    2644R    IOR =B10000
12470  31616   77616A    STA V32654  XFLAG
12471   2000    1463R    LDA =D0
12472  31617   77617A    STA V32655  DECFLG
12473                  A743 EQU *
12473                  A736 EQU *
12473 170201             RET 1
12474                  P744  EQU * UNITS
12474  66000   12513R    JMP A746
12475                  T747 EQU *
12475                  B748  HEX 1113  1113
12476                  B749  HEX 2311  2311
12477                  B750  HEX 1114  1114
12500                  B751  HEX 0223  0223
12501                  B752  HEX 2111  2111
12502                  B753  HEX 1110  1110
12503                    HEX 10  10
12504                  B754  HEX 2010  2010
12505                  B755  HEX 210 210
12506                  B683  HEX 1 1
12507                  B756  HEX 1200  1200
12510          12475R  V757 DEF T747 UNITSTAB
12511                    OCT 177777  177777
12512                    OCT 13  13
12513                  A746  EQU *
12513   1740   77740A    LDA V32736  EFLAG
12514 170606             SAL 7
12515 172025             SAP A758
12516   1601   77601A    LDA V32641  HPBC
12517 170601             SAL 2
12520 172422             SAM A758
12521   2000    3654R    LDA =B20
12522   6000    2411R    LDB =D4
12523  42000     112X    JSX .WS7
12524   1740   77740A    LDA V32736  EFLAG
12525  52000   11303R    AND =B177377
12526  31740   77740A    STA V32736  EFLAG
12527   1616   77616A    LDA V32654  XFLAG
12530 170600             SAL 1
12531 172011             SAP A759
12532   1620   77620A    LDA V32656  PREFIX
12533  12000   10243R    CPA =D27
12534  66000   12542R    JMP A759
12535   1565   77565A    LDA V32629  SRQEN
12536  52000    5517R    AND =B100000
12537  62000    6514R    IOR =B77777
12540  31565   77565A    STA V32629  SRQEN
12541  66000   13027R    JMP L745  EXU
12542                  A759 EQU *
12542                  A758 EQU *
12542   1620   77620A    LDA V32656  PREFIX
12543  72002             RZA *+2
12544  66000   13027R    JMP A760
12545   1566   77566A    LDA V32630  KEYCODE
12546  12000    2107R    CPA =D3
12547  66000   12551R    JMP *+2
12550  66000   12555R    JMP A761
12551   1616   77616A    LDA V32654  XFLAG
12552 170602             SAL 3
12553 172002             SAP *+2
12554  66000   13027R    JMP A760
12555                  A761 EQU *
12555   1617   77617A    LDA V32655  DECFLG
12556 172003             SAP A762
12557  22000    1457R    ADA =D1
12560  31617   77617A    STA V32655  DECFLG
12561                  A762 EQU *
12561   1616   77616A    LDA V32654  XFLAG
12562 170602             SAL 3
12563 172407             SAM A764
12564   1611   77611A    LDA V32649  CHRC
12565  12000    1457R    CPA =D1
12566  66000   12570R    JMP *+2
12567  66000   12604R    JMP A763
12570   1651   77651A    LDA V32681  LTS
12571  73013             SLA A763
12572                  A764 EQU *
12572   1651   77651A    LDA V32681  LTS
12573  73005             SLA A765
12574  42000      53X    JSX .LDS1
12575           1457R    DEF =D1
12576  42000     165X    JSX .BMIN
12577  66000   12602R    JMP A766
12600                  A765 EQU *
12600  42000      53X    JSX .LDS1
12601           1457R    DEF =D1
```

```
12602                    A766 EQU *
12602  42000        34X    JSX .STRD
12603           77651A     DEF V32681   LTEMP
12604                    A763 EQU *
12604   1601    77601A     LDA V32641   HPBC
12605 170600               SAL 1
12606 172014              SAP A767
12607  42000        37X    JSX .LDB1
12610           77651A     DEF V32681   LTEMP
12611  42000        50X    JSX CNV24
12612  21617    77617A     ADA V32655   DECFLG
12613  31617    77617A     STA V32655   DECFLG
12614  42000       161X    JSX .MVE4
12615           77621A     DEF V32657   MANT
12616           77651A     DEF V32681   LTEMP
12617   1601    77601A     LDA V32641   HPBC
12620  52000     2645R     AND =B137777
12621  31601    77601A     STA V32641   HPBC
12622                    A767 EQU *
12622   1620    77620A     LDA V32656   PREFIX
12623  22000     1277R     ADA =D-1
12624  52000     2107R     AND =D3
12625  22000     2203R     ADA =D6
12626  70540               PWC A
12627   1620    77620A     LDA V32656   PREFIX
12630  22000     2107R     ADA =D3
12631 170501               SAR 2
12632  42000        60X    JSX .ARAY
12633           12510R     DEF V757   UNITSTAB
12634  42000        61X    JSX .LDSA
12635  70761               WWC B
12636  42000       132X    JSX .FDIG
12637  66000    13001R     JMP A768
12640                    C769 EQU *
12640   1566    77566A     LDA V32630   KEYCODE
12641  12000     2107R     CPA =D3
12642  66000    12644R     JMP *+2
12643  66000    12661R     JMP A770
12644   1620    77620A     LDA V32656   PREFIX
12645  12000     2107R     CPA =D3
12646  66000    12655R     JMP A771
12647   1576    77576A     LDA V32638   RPGPTR
12650  12000     7565R     CPA =D18
12651  66000    12653R     JMP *+2
12652  66000    12661R     JMP A770
12653   1605    77605A     LDA V32645   SCANSL
12654  72005              RZA A770
12655                    A771 EQU *
12655   1617    77617A     LDA V32655   DECFLG
12656  22000     1704R     ADA =D6
12657  31617    77617A     STA V32655   DECFLG
12660  66000    12706R     JMP A772
12661                    A770 EQU *
12661   1566    77566A     LDA V32630   KEYCODE
12662  12000    10240R     CPA =B57
12663  66000    12665R     JMP *+2
12664  66000    12670R     JMP A773
12665   1617    77617A     LDA V32655   DECFLG
12666  22000     2221R     ADA =D9
12667  31617    77617A     STA V32655   DECFLG
12670                    A773 EQU *
12670   1566    77566A     LDA V32630   KEYCODE
12671  12000    12734R     CPA =B43
12672  66000    12674R     JMP *+2
12673  66000    12677R     JMP A774
12674   1617    77617A     LDA V32655   DECFLG
12675  22000     1704R     ADA =D6
12676  31617    77617A     STA V32655   DECFLG
12677                    A774 EQU *
12677   1566    77566A     LDA V32630   KEYCODE
12700  12000    10141R     CPA =B46
12701  66000    12703R     JMP *+2
12702  66000    12706R     JMP A775
12703   1617    77617A     LDA V32655   DECFLG
12704  22000     2107R     ADA =D3
12705  31617    77617A     STA V32655   DECFLG
12706                    A775 EQU *
12706                    A772 EQU *
12706  66000    13002R     JMP A776
12707                    C777 EQU *
12707   1566    77566A     LDA V32630   KEYCODE
12710  12000     2107R     CPA =D3
12711  66000    12713R     JMP *+2
12712  66000    12735R     JMP A778
12713   1730    77730A     LDA V30 KFLAG
12714 170606               SAL 7
12715 172005              SAP A779
12716   1620    77620A     LDA V32656   PREFIX
12717 170500               SAR 1
12720  12000     2406R     CPA =D7
12721  66000    12735R     JMP A778
12722                    A779 EQU *
12722   1730    77730A     LDA V30 KFLAG
12723 170515               SAR 14
12724   4000               LDB A
12725  26000     1301R     ADB =B177775
12726   2000     2221R     LDA =D9
12727  76402              SZB A780
12730   2000     1457R     LDA =D1
12731                    A780 EQU *
```

```
12731  21617   77617A     ADA V32655   DECFLG
12732  31617   77617A     STA V32655   DECFLG
12733  66000   12775R     JMP A781
12734     43
12734                    LIT
12735                    A778 EQU *
12735   1566   77566A     LDA V32630   KEYCODE
12736  22000   10241R     ADA =D-29
12737  42000     113X     JSX DIV4
12740            2107R    DEF =D3
12741  66000   12774R     JMP A782
12742                    C783 EQU *
12742   1617   77617A     LDA V32655   DECFLG
12743  22000    2107R     ADA =D3
12744  31617   77617A     STA V32655   DECFLG
12745  66000   12775R     JMP A784
12746                    C785 EQU *
12746  45617   77617A     ISZ V32655   DECFLG
12747                     NOP
12750  42000      37X     JSX .LDBI
12751          77651A     DEF V32681   LTEMP
12752  42000     165X     JSX .BMIN
12753  42000      34X     JSX .STRD
12754          77651A     DEF V32681   LTEMP
12755  66000   12775R     JMP A784
12756                    C786 EQU *
12756   1617   77617A     LDA V32655   DECFLG
12757  22000    1704R     ADA =D6
12760  31617   77617A     STA V32655   DECFLG
12761  66000   12775R     JMP A784
12762                    C787 EQU *
12762  45617   77617A     ISZ V32655   DECFLG
12763                     NOP
12764  66000   12775R     JMP A784
12765          12762R     DEF C787
12766          12775R     DEF A784
12767          12775R     DEF A784
12770          12756R     DEF C786
12771          12746R     DEF C785
12772          12742R     DEF C783
12773                     DEC -7
12774  42000     143X    A782  JSX .CASE
12775                    A784 EQU *
12775                    A781 EQU *
12775  66000   13002R     JMP A776
12776          12707R     DEF C777
12777          12640R     DEF C769
13000                     DEC -3
13001  42000     143X    A768  JSX .CASE
13002                    A776 EQU *
13002   1617   77617A     LDA V32655   DECFLG
13003 172010              SAP A788
13004  22000    2565R     ADA =D11
13005  70540              PWC A
13006  42000      37X     JSX .LDBI
13007          77651A     DEF V32681   LTEMP
13010  42000      26X     JSM P213   ROUND
13011  42000      34X     JSX .STRD
13012          77651A     DEF V32681   LTEMP
13013                    A788 EQU *
13013  42000      37X     JSX .LDBI
13014          77651A     DEF V32681   LTEMP
13015   5617   77617A     LDB V32655   DECFLG
13016  42000     123X     JSX .DSFI
13017  42000      34X     JSX .STRD
13020          77651A     DEF V32681   LTEMP
13021   1616   77616A     LDA V32654   XFLAG
13022  52000   11451R     AND =B67777
13023  62000    5517R     IOR =B100000
13024  31616   77616A     STA V32654   XFLAG
13025   2000    1463R     LDA =D0
13026  31617   77617A     STA V32655   DECFLG
13027                    A760 EQU *
13027                    L745  EQU * EXU
13027 170201              RET 1
13030                    P789  EQU * WCRLF
13030   2000    2172R     LDA =D13
13031  42000      17X     JSM P206   WHPIB
13032   1730   77730A     LDA V30 KFLAG
13033 170607              SAL 8
13034 172402              SAM A790
13035  42000      16X     JSM P205   WEOI
13036                    A790 EQU *
13036   2000    2204R     LDA =D10
13037  42000      17X     JSM P206   WHPIB
13040   1730   77730A     LDA V30 KFLAG
13041  52000   13044R     AND =B177577
13042  31730   77730A     STA V30 KFLAG
13043 170201              RET 1
13044 177577
13044                    LIT
13045                    P791  EQU * OHPB
13045   1601   77601A     LDA V32641   HPBC
13046 172406              SAM A792
13047  62000    5517R     IOR =B100000
13050  31601   77601A     STA V32641   HPBC
13051   2000    1463R     LDA =D0
13052   6000    2107R     LDB =D3
13053  42000     107X     JSX .WS5
13054                    A792 EQU *
```

```
13054  42000    166X   JSX .CSHV
13055         32476R   DEF L193  RESET
13056  42000    166X   JSX .CSHV
13057         32473R   DEF L195  ABORT
13060  42000     14X   JSM P203  HPBSY
13061 170201           RET 1
13062                 P793  EQU * NDUMP
13062   6000   2417R   LDB =D-6
13063  42000     32X   JSX .ARGL
13064  66000  13163R   JMP A794
13065                 T795 EQU *
13065         13126R   DEF ="HZ"
13066         13130R   DEF ="KHZ"
13067         13133R   DEF ="MHZ"
13070         13065R  V796 DEF T795 HZUNIT
13071                  OCT 177777  177777
13072                  OCT 3 3
13073                 T797 EQU *
13073                 N798  DEC 237 237
13074                 K799  OCT 155 155
13075                  OCT 40  40
13076         13073R  V800 DEF T797 SUNIT
13077                  OCT 177777  177777
13100                  OCT 3 3
13101                 T801 EQU *
13101                 K802  OCT 156 156
13102                  DEC 237 237
13103                  OCT 155 155
13104                  OCT 40  40
13105         13101R  V803 DEF T801 VUNIT
13106                  OCT 177777  177777
13107                  OCT 4 4
77773                 V804  EQU 77773B   ASEND
13110                 P805  EQU * DBL
13110   1675  77675A   LDA V15 BLEDS
13111 170501           SAR 2
13112  52000   1457R   AND =D1
13113  22000   1457R   ADA =D1
13114 170040           TCA
13115  21573  77573A   ADA V32635  I
13116  31656  77656A   STA V34 BCDA
13117 172006          SAP A806
13120   6000  13136R   LDB =D-11 DIGS
13121  42000     71X   JSX MIN4P
13122  31573  77573A   STA V32635  I
13123   6000  13136R   LDB =D-11 DIGS
13124  42000     67X   JSX .STAP
13125                 A806 EQU *
13125 170201           RET 1
13126 HZ
13130 KHZ
13133 MHZ
13136 177765
13126                  LIT
13137                 P807  EQU * HZSEC
13137   1573  77573A   LDA V32635  I
13140  42000    121X   JSX MOD4
13141          2107R   DEF =D3
13142  31656  77656A   STA V34 BCDA
13143  72405          SZA A809
13144   1573  77573A   LDA V32635  I
13145 170040           TCA
13146  22000   2221R   ADA =D9
13147 172004          SAP A808
13150                 A809 EQU *
13150   1656  77656A   LDA V34 BCDA
13151  22000   2107R   ADA =D3
13152  31656  77656A   STA V34 BCDA
13153                 A808 EQU *
13153   1573  77573A   LDA V32635  I
13154  12000   1456R   CPA =D12
13155  66000  13157R   JMP *+2
13156  66000  13162R   JMP A810
13157   1656  77656A   LDA V34 BCDA
13160  22000   2107R   ADA =D3
13161  31656  77656A   STA V34 BCDA
13162                 A810 EQU *
13162 170201           RET 1
13163                 A794  EQU *
13163   6000   1375R   LDB =D-9  NUM
13164  42000     66X   JSX .LDBP
13165  71500           NRM
13166  35573  77573A   STB V32635  I
13167  42000     34X   JSX .STRD
13170         77742A   DEF V32738  XL
13171   6000  13136R   LDB =D-11 DIGS
13172  42000     30X   JSX .LDAP
13173 172402           SAM *+2
13174  66000  13247R   JMP A811
13175  42000     37X   JSX .LDBI
13176         77671A   DEF V9  SPAN
13177  42000     52X   JSX .DEQL
13200 172015          SAP A812
13201   2000   2107R   LDA =D3
13202  70540           PWC A
13203  42000   2070R   JSM P261  IFBW
13204 170500           SAR 1
13205  22000   2110R   ADA =D-2
13206  42000   2132R   JSM P265  LIMIT
13207  21573  77573A   ADA V32635  I
```

```
13210 170040                TCA
13211  22000     1456R      ADA =D12
13212   6000    13136R      LDB =D-11 DIGS
13213  42000       67X      JSX .STAP
13214  66000    13225R      JMP A813
13215                      A812 EQU *
13215  71500                NRM
13216  35572    77572A      STB V32634  J
13217   1573    77573A      LDA V32635  I
13220 170040                TCA
13221  21572    77572A      ADA V32634  J
13222  22000     2411R      ADA =D4
13223   6000    13136R      LDB =D-11 DIGS
13224  42000       67X      JSX .STAP
13225                      A813 EQU *
13225 170040                TCA
13226 172410               SAM A814
13227  42000       53X      JSX .LDS1
13230             1463R     DEF =D0
13231  42000       34X      JSX .STRD
13232           77742A      DEF V32738  XL
13233   2000     1456R      LDA =D12
13234  31573    77573A      STA V32635  I
13235  66000    13247R      JMP A815
13236                      A814 EQU *
13236   6000    13136R      LDB =D-11 DIGS
13237  42000       30X      JSX .LDAP
13240  22000     1277R      ADA =D-1
13241  70540                PWC A
13242  42000       37X      JSX .LDB1
13243           77742A      DEF V32738  XL
13244  42000       26X      JSM P213  ROUND
13245  42000       34X      JSX .STRD
13246           77742A      DEF V32738  XL
13247                      A815 EQU *
13247                      A811 EQU *
13247   1573    77573A      LDA V32635  I
13250  12000     1456R      CPA =D12
13251  66000    13253R      JMP *+2
13252  66000    13260R      JMP A816
13253   2000     1457R      LDA =D1
13254  31573    77573A      STA V32635  I
13255   6000    13136R      LDB =D-11 DIGS
13256  42000       67X      JSX .STAP
13257  66000    13263R      JMP A817
13260                      A816 EQU *
13260 170040                TCA
13261  22000     1456R      ADA =D12
13262  31573    77573A      STA V32635  I
13263                      A817 EQU *
13263   6000    13136R      LDB =D-11 DIGS
13264  42000       30X      JSX .LDAP
13265 170040                TCA
13266  21573    77573A      ADA V32635  I
13267 172004               SAP A818
13270   1573    77573A      LDA V32635  I
13271   6000    13136R      LDB =D-11 DIGS
13272  42000       67X      JSX .STAP
13273                      A818 EQU *
13273   6000    13136R      LDB =D-11 DIGS
13274  42000       30X      JSX .LDAP
13275  31656    77656A      STA V34 BCDA
13276   6000    12014R      LDB =D-13 UNTS
13277  42000       30X      JSX .LDAP
13300  66000    13357R      JMP A819
13301                      C820 EQU *
13301  42000    13137R      JSM P807  HZSEC
13302  66000    13360R      JMP A821
13303                      C822 EQU *
13303  42000    13137R      JSM P807  HZSEC
13304  66000    13360R      JMP A821
13305                      C823 EQU *
13305   1730    77730A      LDA V30 KFLAG
13306 170515                SAR 14
13307  12000     2107R      CPA =D3
13310  66000    13312R      JMP *+2
13311  66000    13322R      JMP A824
13312   1573    77573A      LDA V32635  I
13313  42000      121X      JSX MOD4
13314             2107R     DEF =D3
13315  31656    77656A      STA V34 BCDA
13316  72003               RZA A825
13317   2000     2107R      LDA =D3
13320  31656    77656A      STA V34 BCDA
13321                      A825 EQU *
13321  66000    13323R      JMP A826
13322                      A824 EQU *
13322  42000    13110R      JSM P805  DBL
13323                      A826 EQU *
13323  66000    13360R      JMP A821
13324                      C827 EQU *
13324  42000    13110R      JSM P805  DBL
13325  66000    13360R      JMP A821
13326                      C828 EQU *
13326   1573    77573A      LDA V32635  I
13327  22000     1363R      ADA =D-4
13330  31656    77656A      STA V34 BCDA
13331 172006               SAP A829
13332   2000     2411R      LDA =D4
13333  31573    77573A      STA V32635  I
```

```
13334   6000  13136R      LDB =D-11 DIGS
13335  42000     67X      JSX .STAP
13336  66000  13346R      JMP A830
13337                   A829 EQU *
13337   1573  77573A      LDA V32635  I
13340 170040              TCA
13341  22000   2406R      ADA =D7
13342 172004             SAP A831
13343   1656  77656A      LDA V34 BCDA
13344   6000  13136R      LDB =D-11 DIGS
13345  42000     67X      JSX .STAP
13346                   A831 EQU *
13346                   A830 EQU *
13346  66000  13360R      JMP A821
13347         13326R      DEF C828
13350         13324R      DEF C827
13351         13360R      DEF A821
13352         13305R      DEF C823
13353         13360R      DEF A821
13354         13303R      DEF C822
13355         13301R      DEF C820
13356                     DEC -8
13357  42000    143X    A819  JSX .CASE
13360                   A821 EQU *
13360   1573  77573A      LDA V32635  I
13361  22000   1277R      ADA =D-1
13362  42000    113X      JSX DIV4
13363          2107R      DEF =D3
13364  31573  77573A      STA V32635  I
13365   6000  12014R      LDB =D-13 UNIS
13366  42000     30X      JSX .LDAP
13367  22000   1301R      ADA =D-3
13370 172007             SAP A832
13371   1573  77573A      LDA V32635  I
13372 170040              TCA
13373  22000   2276R      ADA =D2
13374 172003             SAP A832
13375   2000   2276R      LDA =D2
13376  31573  77573A      STA V32635  I
13377                   A832 EQU *
13377   1656  77656A      LDA V34 BCDA
13400   6000  13136R      LDB =D-11 DIGS
13401  42000     71X      JSX MIN4P
13402 172004             SAP A833
13403   1656  77656A      LDA V34 BCDA
13404   6000  13136R      LDB =D-11 DIGS
13405  42000     67X      JSX .STAP
13406                   A833 EQU *
13406   2000  13442R      LDA =B30060
13407  31773  77773A      STA V804  ASEND
13410   1656  77656A      LDA V34 BCDA
13411 170605              SAL 6
13412  61742  77742A      IOR V32738  IX
13413  31742  77742A      STA V32738  IX
13414  42000     37X      JSX .LDBI
13415         77742A      DEF V32738  X
13416  42000     11X      JSM P200  CNV15
13417   1742  77742A      LDA V32738  IX
13420  52000   1457R      AND =D1
13421   6000  13136R      LDB =D-11 DIGS
13422  42000    115X      JSX ADD4P
13423  70540              PWC A
13424   1742  77742A      LDA V32738  IX
13425 170405              AAR 6
13426   6000  13136R      LDB =D-11 DIGS
13427  42000    117X      JSX SUB4P
13430 170516              SAR 15
13431  42000     57X      JSX ADD41
13432  31572  77572A      STA V32634  J
13433 101427  77427A      LDA V32535,I  AS
13434 170040              TCA
13435  21572  77572A      ADA V32634  J
13436 172005             SAP A834
13437   1572  77572A      LDA V32634  J
13440 131427  77427A      STA V32535,I  AS
13441  66000  13467R      JMP A835
13442  30060
                          LIT
13442                   A834 EQU *
13443                   
13443 101427  77427A      LDA V32535,I  AS
13444 170040              TCA
13445  21572  77572A      ADA V32634  J
13446 170040              TCA
13447 172020             SAP A836
13450 101427  77427A      LDA V32535,I  AS
13451  70540              PWC A
13452   1742  77742A      LDA V32738  IX
13453  52000   1457R      AND =D1
13454  21656  77656A      ADA V34 BCDA
13455  70761              WWC B
13456  10001      1A      CPA B
13457  66000  13461R      JMP *+2
13460  66000  13465R      JMP A837
13461   1427  77427A      LDA V32535  AS
13462  70540              PWC A
13463   2000  13532R      LDA =B56
13464  42000     10X      JSM P199  ACHAR
13465                   A837 EQU *
13465   1572  77572A      LDA V32634  J
13466 131427  77427A      STA V32535,I  AS
```

```
13467                    A836 EQU *
13467                    A835 EQU *
13467    1601   77601A     LDA V32641  HPBC
13470  172402              SAM *+2
13471   66000   13555R     JMP A838
13472    6000   12014R     LDB =D-13 UNTS
13473   42000      30X     JSX .LDAP
13474   12000    1457R     CPA =D1
13475   66000   13512R     JMP A840
13476   12000    2276R     CPA =D2
13477   66000   13512R     JMP A840
13500    6000   12014R     LDB =D-13 UNTS
13501   42000      30X     JSX .LDAP
13502   12000    2411R     CPA =D4
13503   66000   13505R     JMP *+2
13504   66000   13551R     JMP A839
13505    1730   77730A     LDA V30 KFLAG
13506  170515              SAR 14
13507   12000    2107R     CPA =D3
13510   66000   13512R     JMP *+2
13511   66000   13551R     JMP A839
13512                    A840 EQU *
13512    1573   77573A     LDA V32635   I
13513    6000    2107R     LDB =D3
13514   75617              MPY
13515   31573   77573A     STA V32635   I
13516    6000   12014R     LDB =D-13 UNTS
13517   42000      30X     JSX .LDAP
13520  170500              SAR 1
13521   66000   13536R     JMP A841
13522                    C842 EQU *
13522    1573   77573A     LDA V32635   I
13523   22000    2417R     ADA =D-6
13524   31573   77573A     STA V32635   I
13525   66000   13537R     JMP A843
13526                    C844 EQU *
13526    1573   77573A     LDA V32635   I
13527   22000    1375R     ADA =D-9
13530   31573   77573A     STA V32635   I
13531   66000   13537R     JMP A843
13532      56
13532                      LIT
13533           13526R     DEF C844
13534           13522R     DEF C842
13535                      DEC -3
13536   42000     143X   A841  JSX .CASE
13537                    A843 EQU *
13537    1573   77573A     LDA V32635   I
13540   72411              SZA A845
13541    1427   77427A     LDA V32535   AS
13542   70540              PWC A
13543    2000   13554R     LDA =B105
13544   42000      10X     JSM P199   ACHAR
13545    1427   77427A     LDA V32535   AS
13546   42000      13X     JSM P202   STHPB
13547    1573   77573A     LDA V32635   I
13550   42000      12X     JSM P201   CNV45
13551                    A845 EQU *
13551                    A839 EQU *
13551    1427   77427A     LDA V32535   AS
13552   42000      13X     JSM P202   STHPB
13553   66000   13776R     JMP A846
13554     105
13554                      LIT
13555                    A838 EQU *
13555   45573   77573A     ISZ V32635   I
13556                      NOP
13557    1427   77427A     LDA V32535   AS
13560    6000    1704R     LDB =D6
13561   42000      76X     JSX .WSTS
13562  101427   77427A     LDA V32535,I   AS
13563   22000    1457R     ADA =D1
13564   31430   77430A     STA V32536   SLEN
13565    1616   77616A     LDA V32654   XFLAG
13566  170607              SAL 8
13567  172006              SAP A847
13570    2000    2172R     LDA =D13
13571   42000      73X     JSX .W6
13572    2000    2204R     LDA =D10
13573   42000      73X     JSX .W6
13574   66000   13602R     JMP A848
13575                    A847 EQU *
13575    6000   12014R     LDB =D-13 UNTS
13576   42000      30X     JSX .LDAP
13577   72403              SZA A849
13600    2000    2205R     LDA =B40
13601   42000      73X     JSX .W6
13602                    A849 EQU *
13602                    A848 EQU *
13602    1616   77616A     LDA V32654   XFLAG
13603   52000   13044R     AND =B177577
13604   31616   77616A     STA V32654   XFLAG
13605    6000   12014R     LDB =D-13 UNTS
13606   42000      30X     JSX .LDAP
13607   66000   13775R     JMP A850
13610                    C851 EQU *
13610    1573   77573A     LDA V32635   I
13611   42000      60X     JSX .ARAY
13612           13070R     DEF V796   HZUNIT
13613    6000    1704R     LDB =D6
```

```
13614  42000     76X     JSX .WSTS
13615   1573  77573A     LDA V32635  I
13616  42000     60X     JSX .ARAY
13617         13070R     DEF V796  HZUNIT
13620 100000             LDA A,I
13621  21430  77430A     ADA V32536  SLEN
13622  31430  77430A     STA V32536  SLEN
13623  66000  13776R     JMP A852
13624                   C853 EQU *
13624   1573  77573A     LDA V32635  I
13625  42000     60X     JSX .ARAY
13626         13076R     DEF V800  SUNIT
13627  42000     73X     JSX .W6
13630   6000   1704R     LDB =D6
13631  42000    100X     JSX .WSTR
13632         13665R     DEF ="sec"
13633   1430  77430A     LDA V32536  SLEN
13634  22000   2411R     ADA =D4
13635  31430  77430A     STA V32536  SLEN
13636  66000  13776R     JMP A852
13637                   C854 EQU *
13637   6000   1704R     LDB =D6
13640  42000    100X     JSX .WSTR
13641         13670R     DEF ="dB"
13642   1430  77430A     LDA V32536  SLEN
13643  22000   2276R     ADA =D2
13644  31430  77430A     STA V32536  SLEN
13645  66000  13776R     JMP A852
13646                   C855 EQU *
13646   1730  77730A     LDA V30 KFLAG
13647 170515             SAR 14
13650  12000   2107R     CPA =D3
13651  66000  13653R     JMP *+2
13652  66000  13672R     JMP A856
13653   1430  77430A     LDA V32536  SLEN
13654  22000   2276R     ADA =D2
13655  31430  77430A     STA V32536  SLEN
13656   1573  77573A     LDA V32635  I
13657  42000     60X     JSX .ARAY
13660         13105R     DEF V803  VUNIT
13661  42000     73X     JSX .W6
13662   2000   2771R     LDA =B126
13663  42000     73X     JSX .W6
13664  66000  13715R     JMP A857
13665 sec
13670 dB
13665                    LIT
13672                   A856 EQU *
13672   6000   1704R     LDB =D6
13673  42000    100X     JSX .WSTR
13674         13670R     DEF ="dB"
13675   1730  77730A     LDA V30 KFLAG
13676 172003             SAP A858
13677   2000  13752R     LDA =D237
13700  66000  13702R     JMP A859
13701                   A858 EQU *
13701   2000  13753R     LDA =B155
13702                   A859 EQU *
13702  42000     73X     JSX .W6
13703   1430  77430A     LDA V32536  SLEN
13704  22000   2107R     ADA =D3
13705  31430  77430A     STA V32536  SLEN
13706   1730  77730A     LDA V30 KFLAG
13707 170515             SAR 14
13710  72405             SZA A860
13711  45430  77430A     ISZ V32536  SLEN
13712                    NOP
13713   2000   2771R     LDA =B126
13714  42000     73X     JSX .W6
13715                   A860 EQU *
13715                   A857 EQU *
13715   1675  77675A     LDA V15 BLEDS
13716 170615             SAL 14
13717 172007             SAP A861
13720   1430  77430A     LDA V32536  SLEN
13721  22000   2406R     ADA =D7
13722  31430  77430A     STA V32536  SLEN
13723   6000   1704R     LDB =D6
13724  42000    100X     JSX .WSTR
13725         13754R     DEF =" (1 Hz)"
13726                   A861 EQU *
13726  66000  13776R     JMP A852
13727                   C862 EQU *
13727   6000   1704R     LDB =D6
13730  42000    100X     JSX .WSTR
13731         13761R     DEF ="dB/"
13732   1430  77430A     LDA V32536  SLEN
13733  22000   2107R     ADA =D3
13734  31430  77430A     STA V32536  SLEN
13735  66000  13776R     JMP A852
13736                   C863 EQU *
13736   6000   1704R     LDB =D6
13737  42000    100X     JSX .WSTR
13740         13670R     DEF ="dB"
13741   1430  77430A     LDA V32536  SLEN
13742  22000   2276R     ADA =D2
13743  31430  77430A     STA V32536  SLEN
13744  66000  13776R     JMP A852
13745                   C864 EQU *
13745   2000  13764R     LDA =B130
```

```
13746  42000     73X       JSX .W6
13747  45430  77430A       ISZ V32536  SLEN
13750                      NOP
13751  66000  13776R       JMP A852
13752    355
13753    155
13754  (1 HZ)
13761  dB/
13764    130
13752                     LIT
13765         13745R       DEF C864
13766         13736R       DEF C863
13767         13727R       DEF C862
13770         13646R       DEF C855
13771         13637R       DEF C854
13772         13624R       DEF C853
13773         13610R       DEF C851
13774                      DEC -8
13775  42000    143X     A850  JSX .CASE
13776                    A852 EQU *
13776                    A846 EQU *
13776  66000     31X       JMX .RINA
13777                    P865  EQU * DSPITEM
13777   2000   2646R       LDA =D3008
14000  31737  77737A       STA V32735  BLKS
14001   2000  14033R       LDA =D3012
14002   6000   2203R       LDB =D8
14003  42000     75X       JSX .WS4
14004   1620  77620A       LDA V32656  PREFIX
14005  72002               RZA *+2
14006  66000  14047R       JMP A866
14007  42000     60X       JSX .ARAY
14010           345R       DEF V122  AFTAB
14011   6000   1704R       LDB =D6
14012  42000     76X       JSX .WSTS
14013   1620  77620A       LDA V32656  PREFIX
14014  12000   2301R       CPA =D19
14015  66000  14021R       JMP A868
14016  12000   2302R       CPA =D22
14017  66000  14021R       JMP *+2
14020  66000  14022R       JMP A867
14021                    A868 EQU *
14021  42000   2212R       JSM P273  DELTA
14022                    A867 EQU *
14022   1620  77620A       LDA V32656  PREFIX
14023 170500               SAR 1
14024  12000   1456R       CPA =D12
14025  66000  14027R       JMP *+2
14026  66000  14037R       JMP A869
14027   6000   1704R       LDB =D6
14030  42000    100X       JSX .WSTR
14031         14034R       DEF ="    "
14032  66000  14040R       JMP A870
14033   5704
14034
14033                     LIT
14037                    A869 EQU *
14037  42000   2173R       JSM P271  CRLF
14040                    A870 EQU *
14040   1620  77620A       LDA V32656  PREFIX
14041  42000     60X       JSX .ARAY
14042           345R       DEF V122  AFTAB
14043 100000               LDA A,I
14044  22000   2406R       ADA =D7
14045  31612  77612A       STA V32650  NCHR
14046  66000  14051R       JMP A871
14047                    A866 EQU *
14047   2000   2411R       LDA =D4
14050  31612  77612A       STA V32650  NCHR
14051                    A871 EQU *
14051   2000   2500R       LDA =D147
14052  42000     73X       JSX .W6
14053  42000     73X       JSX .W6
14054 170201               RET 1
14055                    P216  EQU * MESSAGE
14055   6000   1277R       LDB =D-1
14056  42000     27X       JSX .ARGA
14057  66000  14413R       JMP A872
14060                    C873 EQU *
14060   2000   1457R       LDA =D1
14061  70540               PWC A
14062  70540               PWC A
14063  42000   2070R       JSM P261  IFBW
14064  42000   4420R       JSM P407  EXP3
14065  42000  13062R       JSM P793  NDUMP
14066  66000  14414R       JMP A874
14067                    C875 EQU *
14067   2000   1457R       LDA =D1
14070  70540               PWC A
14071  70540               PWC A
14072  42000   2111R       JSM P263  VBW
14073  42000   4420R       JSM P407  EXP3
14074  42000  13062R       JSM P793  NDUMP
14075  66000  14414R       JMP A874
14076                    C876 EQU *
14076   2000   2276R       LDA =D2
14077  70540               PWC A
14100  70540               PWC A
14101   1733  77733A       LDA V20 FSTIM
14102 172004               SAP A877
```

```
14103    1731   77731A     LDA V18 SINDEX
14104   42000    4411R     JSM P406   EXP2
14105   66000   14111R     JMP A878
14106                     A877 EQU *
14106    1731   77731A     LDA V18 SINDEX
14107   22000    5520R     ADA =D24
14110   42000    4356R     JSM P403   EXPSIX
14111                     A878 EQU *
14111   42000   13062R     JSM P793   NDUMP
14112   66000   14414R     JMP A874
14113                     C879 EQU *
14113    2000    2107R     LDA =D3
14114   70540              PWC A
14115    2000    2276R     LDA =D2
14116   70540              PWC A
14117    1677   77677A     LDA V17 REAL
14120   52000    2406R     AND =D7
14121    6000    2204R     LDB =D10
14122   75617              MPY
14123   42000     122X     JSX CNV42
14124   42000   13062R     JSM P793   NDUMP
14125   66000   14414R     JMP A874
14126                     C880 EQU *
14126    2000    2411R     LDA =D4
14127   70540              PWC A
14130   70540              PWC A
14131    2000    4470R     LDA =D1000
14132   42000    4471R     JSM P410   DBMNY
14133   42000   13062R     JSM P793   NDUMP
14134   66000   14414R     JMP A874
14135                     C881 EQU *
14135    1435   77435A     LDA V32541   IF1
14136  172010              SAP A882
14137    2000    2405R     LDA =D5
14140   70540              PWC A
14141    2000    2276R     LDA =D2
14142   70540              PWC A
14143   42000    4430R     JSM P408   LGSCL
14144   42000     122X     JSX CNV42
14145   42000   13062R     JSM P793   NDUMP
14146                     A882 EQU *
14146   66000   14414R     JMP A874
14147                     C883 EQU *
14147    2000    1457R     LDA =D1
14150   70540              PWC A
14151    2000    1277R     LDA =B177777
14152   70540              PWC A
14153   42000      37X     JSX .LDBI
14154           77665A     DEF V8   CFREQ
14155   42000   13062R     JSM P793   NDUMP
14156   66000   14414R     JMP A874
14157                     C884 EQU *
14157    2000    1457R     LDA =D1
14160   70540              PWC A
14161    2000    1277R     LDA =B177777
14162   70540              PWC A
14163   42000      37X     JSX .LDBI
14164           77671A     DEF V9   SPAN
14165   42000   13062R     JSM P793   NDUMP
14166   66000   14414R     JMP A874
14167                     C885 EQU *
14167    2000    1457R     LDA =D1
14170   70540              PWC A
14171    2000    1277R     LDA =B177777
14172   70540              PWC A
14173   42000      37X     JSX .LDBI
14174           77671A     DEF V9   SPAN
14175   42000     126X     JSX MPY3
14176            2405R     DEF =D5
14177    6000    1457R     LDB =D1
14200   42000      47X     JSX .DRGT
14201   42000     140X     JSX MIN2
14202           77665A     DEF V8   CFREQ
14203   42000   13062R     JSM P793   NDUMP
14204   66000   14414R     JMP A874
14205                     C886 EQU *
14205    2000    1457R     LDA =D1
14206   70540              PWC A
14207    2000    1277R     LDA =B177777
14210   70540              PWC A
14211   42000      37X     JSX .LDBI
14212           77671A     DEF V9   SPAN
14213   42000     126X     JSX MPY3
14214            2405R     DEF =D5
14215    6000    1457R     LDB =D1
14216   42000      47X     JSX .DRGT
14217   42000     150X     JSX ADD2
14220           77665A     DEF V8   CFREQ
14221   42000   13062R     JSM P793   NDUMP
14222   66000   14414R     JMP A874
14223                     C887 EQU *
14223    2000    1457R     LDA =D1
14224   70540              PWC A
14225    2000    1277R     LDA =B177777
14226   70540              PWC A
14227   42000      37X     JSX .LDBI
14230           77713A     DEF V7   FSTEP
14231   42000   13062R     JSM P793   NDUMP
14232   66000   14414R     JMP A874
14233                     C888 EQU *
```

```
14233   2000   1463R   LDA =D0
14234  70540           PWC A
14235   2000   2411R   LDA =D4
14236  70540           PWC A
14237   1614  77614A   LDA V32652  DAC2
14240  42000    122X   JSX CNV42
14241  42000  13062R   JSM P793  NDUMP
14242  66000  14414R   JMP A874
14243                 C889 EQU *
14243   2000   2411R   LDA =D4
14244  70540           PWC A
14245  70540           PWC A
14246   1704  77704A   LDA V33 LEVLIN
14247  42000   4471R   JSM P410  DBMNV
14250  42000  13062R   JSM P793  NDUMP
14251  66000  14414R   JMP A874
14252                 C890 EQU *
14252   2000   2411R   LDA =D4
14253  70540           PWC A
14254  70540           PWC A
14255   1705  77705A   LDA V32 THRESH
14256  52000   1363R   AND =B177774
14257  42000   4471R   JSM P410  DBMNV
14260  42000  13062R   JSM P793  NDUMP
14261  66000  14414R   JMP A874
14262                 C891 EQU *
14262   1675  77675A   LDA V15 BLEDS
14263 170501           SAR 2
14264  62000   2411R   IOR =D4
14265  42000    104X   JSX .TURN
14266          1704R   DEF =D6
14267         77675A   DEF V15 BLEDS
14270  31675  77675A   STA V15 BLEDS
14271  42000  10312R   JSM P218  MKREL
14272 172402           SAM *+2
14273  66000  14341R   JMP A892
14274   1730  77730A   LDA V30 KFLAG
14275 170515           SAR 14
14276  12000   2107R   CPA =D3
14277  66000  14301R   JMP *+2
14300  66000  14341R   JMP A892
14301   2000   2406R   LDA =D7
14302  70540           PWC A
14303   2000   2107R   LDA =D3
14304  70540           PWC A
14305   1435  77435A   LDA V32541  IF1
14306 172015          SAP A893
14307   1720  77720A   LDA V27 AMLVL
14310  42000   4471R   JSM P410  DBMNV
14311  42000     62X   JSX CNV21
14312  42000     36X   JSX .SAR2
14313   1722  77722A   LDA V29 MKRLVL
14314  42000   4471R   JSM P410  DBMNV
14315  42000     62X   JSX CNV21
14316  42000     41X   JSX MPY1
14317         14335R   DEF =F10000.0
14320  42000     42X   JSX DIV1T
14321  42000     65X   JSX CNV12
14322  66000  14333R   JMP A894
14323                 A893 EQU *
14323   1720  77720A   LDA V27 AMLVL
14324  42000    122X   JSX CNV42
14325  42000     36X   JSX .SAR2
14326   1722  77722A   LDA V29 MKRLVL
14327  42000    122X   JSX CNV42
14330   6000   2411R   LDB =D4
14331  42000     51X   JSX .DLFT
14332  42000    164X   JSX DIV2T
14333                 A894 EQU *
14333  42000  13062R   JSM P793  NDUMP
14334  66000  14365R   JMP A895
14335 10000.0
14335                  LIT
14341                 A892 EQU *
14341  42000  10312R   JSM P218  MKREL
14342 172003          SAP A896
14343   2000   1704R   LDA =D6
14344  66000  14346R   JMP A897
14345                 A896 EQU *
14345   2000   2411R   LDA =D4
14346                 A897 EQU *
14346  70540           PWC A
14347   2000   2405R   LDA =D5
14350  70540           PWC A
14351  42000  10312R   JSM P218  MKREL
14352 172004          SAP A898
14353   1720  77720A   LDA V27 AMLVL
14354  42000   4471R   JSM P410  DBMNV
14355  66000  14360R   JMP A899
14356                 A898 EQU *
14356  42000     53X   JSX .LDSI
14357          1463R   DEF =D0
14360                 A899 EQU *
14360  42000     36X   JSX .SAR2
14361   1722  77722A   LDA V29 MKRLVL
14362  42000   4471R   JSM P410  DBMNV
14363  42000    124X   JSX SUB2T
14364  42000  13062R   JSM P793  NDUMP
14365                 A895 EQU *
14365   1675  77675A   LDA V15 BLEDS
```

```
14366  52000    5115R      AND =B177771
14367  31675   77675A      STA V15 BLEDS
14370  66000   14414R      JMP A874
14371          14262R      DEF C891
14372          14414R      DEF A874
14373          14252R      DEF C890
14374          14243R      DEF C889
14375          14233R      DEF C888
14376          14414R      DEF A874
14377          14223R      DEF C887
14400          14205R      DEF C886
14401          14167R      DEF C885
14402          14157R      DEF C884
14403          14147R      DEF C883
14404          14135R      DEF C881
14405          14126R      DEF C880
14406          14113R      DEF C879
14407          14076R      DEF C876
14410          14067R      DEF C875
14411          14060R      DEF C873
14412                      DEC -18
14413  42000     143X    A872  JSX .CASE
14414                    A874 EQU *
14414   6000    1301R      LDB =D-3   N
14415  42000      30X      JSX .LDAP
14416  42000     113X      JSX DIV4
14417           1704R      DEF =D6
14420  12000    2107R      CPA =D3
14421  66000   14423R      JMP *+2
14422  66000   14511R      JMP A900
14423   1733   77733A      LDA V20 FSTIM
14424 172002               SAP *+2
14425  66000   14511R      JMP A900
14426   1605   77605A      LDA V32645  SCANSL
14427  72027              RZA A901
14430   2000    2276R      LDA =D2
14431  70540               PWC A
14432   2000    2411R      LDA =D4
14433  70540               PWC A
14434   1731   77731A      LDA V18 SINDEX
14435  22000    5520R      ADA =D24
14436  42000    4356R      JSM P403  EXPSIX
14437   6000    2107R      LDB =D3
14440  42000      47X      JSX .DRGT
14441  42000      36X      JSX .SAR2
14442  42000   10312R      JSM P218  MKREL
14443 172005              SAP A902
14444   1717   77717A      LDA V26 AMKR
14445 170040               TCA
14446  21721   77721A      ADA V25 MKKR
14447  66000   14452R      JMP A903
14450                    A902 EQU *
14450   1721   77721A      LDA V25 MKKR
14451  22000    1277R      ADA =D-1
14452                    A903 EQU *
14452  42000     122X      JSX CNV42
14453  42000     157X      JSX MPY21
14454  42000   13062R      JSM P793  NDUMP
14455  66000   14510R      JMP A904
14456                    A901 EQU *
14456   1675   77675A      LDA V15 BLEDS
14457 170601               SAL 2
14460 172011              SAP A905
14461  42000      37X      JSX .LDB1
14462          77645A      DEF V32677  MFREQ
14463  71500               NRM
14464  35572   77572A      STB V32634  J
14465  42000      37X      JSX .LDB1
14466          77671A      DEF V9  SPAN
14467  71500               NRM
14470  35573   77573A      STB V32635  I
14471                    A905 EQU *
14471   2000    1457R      LDA =D1
14472  70540               PWC A
14473   5675   77675A      LDB V15 BLEDS
14474 174601               SBL 2
14475   2000    1277R      LDA =B177777
14476 176006              SBP A906
14477  42000    5033R      JSM P443  CPERIOD
14500  22000    1704R      ADA =D6
14501 170040               TCA
14502  21572   77572A      ADA V32634  J
14503 170040               TCA
14504                    A906 EQU *
14504  70540               PWC A
14505  42000      37X      JSX .LDB1
14506          77645A      DEF V32677  MFREQ
14507  42000   13062R      JSM P793  NDUMP
14510                    A904 EQU *
14510  66000   14740R      JMP A907
14511                    A900 EQU *
14511   6000    1301R      LDB =D-3   N
14512  42000      30X      JSX .LDAP
14513  22000   14714R      ADA =D-25
14514  66000   14737R      JMP A908
14515                    C909 EQU *
14515   2000    1463R      LDA =D0
14516  70540               PWC A
14517   2000    2276R      LDA =D2
14520  70540               PWC A
```

```
14521    1735   77735A      LDA V32733  HPIB
14522   42000     122X      JSX CNV42
14523   42000   13062R      JSM P793  NDUMP
14524   66000   14740R      JMP A910
14525                     C911 EQU *
14525    2000    1463R      LDA =D0
14526   70540               PWC A
14527    2000    1456R      LDA =D12
14530   70540               PWC A
14531   42000      37X      JSX .LDBI
14532           77651A      DEF V32681  LTEMP
14533   42000   13062R      JSM P793  NDUMP
14534   66000   14740R      JMP A910
14535                     C912 EQU *
14535    2000    1704R      LDA =D6
14536   70540               PWC A
14537    2000    2411R      LDA =D4
14540   70540               PWC A
14541   42000    2303R      JSM P277  GOFSET
14542   42000     122X      JSX CNV42
14543   42000   13062R      JSM P793  NDUMP
14544   66000   14740R      JMP A910
14545                     C913 EQU *
14545    2000    1457R      LDA =D1
14546   70540               PWC A
14547   70540               PWC A
14550    1730   77730A      LDA V30 KFLAG
14551  170605               SAL 6
14552  172012               SAP A914
14553    1577   77577A      LDA V32639  CTBASE
14554  170040               TCA
14555   22000    1704R      ADA =D6
14556   70540               PWC A
14557   42000      53X      JSX .LDS1
14560            1457R      DEF =D1
14561   70761               WWC B
14562   42000      51X      JSX .DLF1
14563   66000   14566R      JMP A915
14564                     A914 EQU *
14564   42000      53X      JSX .LDS1
14565            1463R      DEF =D0
14566                     A915 EQU *
14566   42000   13062R      JSM P793  NDUMP
14567   66000   14740R      JMP A910
14570                     C916 EQU *
14570    2000    1463R      LDA =D0
14571   70540               PWC A
14572    2000    2405R      LDA =D5
14573   70540               PWC A
14574    1610   77610A      LDA V32648  ALIM
14575   42000     122X      JSX CNV42
14576   42000   13062R      JSM P793  NDUMP
14577   66000   14740R      JMP A910
14600                     C917 EQU *
14600    2000    1463R      LDA =D0
14601   70540               PWC A
14602    2000    2107R      LDA =D3
14603   70540               PWC A
14604   42000      37X      JSX .LDBI
14605           77655A      DEF V32685  LTEMP2
14606   42000   13062R      JSM P793  NDUMP
14607   66000   14740R      JMP A910
14610                     C918 EQU *
14610    2000    1704R      LDA =D6
14611   70540               PWC A
14612    2000    2411R      LDA =D4
14613   70540               PWC A
14614    1706   77706A      LDA V31 ROFSET
14615   42000     122X      JSX CNV42
14616   42000   13062R      JSM P793  NDUMP
14617   66000   14740R      JMP A910
14620                     C919 EQU *
14620    2000    1457R      LDA =D1
14621   70540               PWC A
14622    2000    1277R      LDA =B177777
14623   70540               PWC A
14624   42000      37X      JSX .LDBI
14625           77707A      DEF V11 FOFSET
14626   42000   13062R      JSM P793  NDUMP
14627   66000   14740R      JMP A910
14630                     C920 EQU *
14630    2000    1457R      LDA =D1
14631   70540               PWC A
14632    2000    1456R      LDA =D12
14633   70540               PWC A
14634   42000      37X      JSX .LDBI
14635           77625A      DEF V32661  CSIGNL
14636   42000   13062R      JSM P793  NDUMP
14637    1601   77601A      LDA V32641  HPBC
14640  172005               SAP A921
14641    2000    2723R      LDA =B54
14642   42000      17X      JSM P206  WHPIB
14643    2000    2172R      LDA =D13
14644   42000   14055R      JSM P216  MESSAGE
14645                     A921 EQU *
14645   66000   14740R      JMP A910
14646                     C922 EQU *
14646    2000    2477R      LDA =D36
14647   42000   14055R      JSM P216  MESSAGE
14650   66000   14740R      JMP A910
```

```
14651                       C923 EQU *
14651    2000     2477R       LDA =D36
14652   42000    14055R       JSM P216   MESSAGE
14653   66000    14740R       JMP A910
14654                       C924 EQU *
14654    2000     2276R       LDA =D2
14655   70540                 PWC A
14656    2000     2107R       LDA =D3
14657   70540                 PWC A
14660   42000      37X        JSX .LDB1
14661            77625A       DEF V32661   CSIGNL
14662   42000    13062R       JSM P793   NDUMP
14663   66000    14740R       JMP A910
14664                       C925 EQU *
14664    2000     1463R       LDA =D0
14665   70540                 PWC A
14666    2000     2411R       LDA =D4
14667   70540                 PWC A
14670    1563    77563A       LDA V32627   DSTAD
14671   42000      122X       JSX CNV42
14672   42000    13062R       JSM P793   NDUMP
14673   66000    14740R       JMP A910
14674                       C926 EQU *
14674    2000     2411R       LDA =D4
14675   70540                 PWC A
14676   70540                 PWC A
14677    1730    77730A       LDA V30 KFLAG
14700  170515                 SAR 14
14701   12000     2107R       CPA =D3
14702   66000    14704R       JMP *+2
14703   66000    14710R       JMP A927
14704   42000     3314R       JSM P340   MXRLVL
14705   42000      122X       JSX CNV42
14706   42000     1736R       JSM P248   NANOV
14707   66000    14712R       JMP A928
14710                       A927 EQU *
14710   42000     3314R       JSM P340   MXRLVL
14711   42000      122X       JSX CNV42
14712                       A928 EQU *
14712   42000    13062R       JSM P793   NDUMP
14713   66000    14740R       JMP A910
14714  177747
14714                         LIT
14715            14674R       DEF C926
14716            14740R       DEF A910
14717            14664R       DEF C925
14720            14654R       DEF C924
14721            14651R       DEF C923
14722            14646R       DEF C922
14723            14630R       DEF C920
14724            14620R       DEF C919
14725            14610R       DEF C918
14726            14600R       DEF C917
14727            14570R       DEF C916
14730            14545R       DEF C913
14731            14740R       DEF A910
14732            14535R       DEF C912
14733            14740R       DEF A910
14734            14525R       DEF C911
14735            14515R       DEF C909
14736                         DEC -18
14737   42000      143X     A908  JSX .CASE
14740                       A910 EQU *
14740                       A907 EQU *
14740   66000       31X       JMX .RTNA
14741                       P929  EQU * ENTRY
14741    6000     1277R       LDB =D-1
14742   42000       27X       JSX .ARGA
14743  172002                 SAP *+2
14744  170040                 TCA
14745   31576    77576A       STA V32638   RPGPTR
14746   31620    77620A       STA V32656   PREFIX
14747   42000      113X       JSA DIV4
14750             1704R       DEF =D6
14751   12000     2107R       CPA =D3
14752   66000    14754R       JMP *+2
14753   66000    14756R       JMP A930
14754    2000     7565R       LDA =D18
14755   31576    77576A       STA V32638   RPGPTR
14756                       A930 EQU *
14756    2000     1463R       LDA =D0
14757   31564    77564A       STA V32628   RPGCNT
14760   31431    77431A       STA V32537   RPGSWP
14761    2000     2107R       LDA =D3
14762    6000     2107R       LDB =D3
14763   42000       75X       JSX .WS4
14764    6000     1301R       LDB =D-3  A
14765   42000       30X       JSX .LDAP
14766  172003                 SAP A931
14767    2000     1463R       LDA =D0
14770   31576    77576A       STA V32638   RPGPTR
14771                       A931 EQU *
14771   42000    13777R       JSM P865   DSPITEM
14772   42000     2551R       JSM P298   ABLK
14773    1616    77616A       LDA V32654   XFLAG
14774  170600                 SAL 1
14775  172013                 SAP A932
14776    1620    77620A       LDA V32656   PREFIX
14777   12000    10243R       CPA =D27
15000   66000    15004R       JMP A934
```

```
15001   1740  77740A    LDA V32736  EFLAG
15002 170606             SAL 7
15003 172003             SAP A933
15004                   A934 EQU *
15004   2000  15026R     LDA =B7760
15005  66000  15007R     JMP A935
15006                   A933 EQU *
15006   2000   6514R     LDA =B77777
15007                   A935 EQU *
15007  31565  77565A     STA V32629  SRQEN
15010                   A932 EQU *
15010   1576  77576A     LDA V32638  RPGPTR
15011  42000    111X     JSX .EQL
15012  70540             PWC A
15013   1565  77565A     LDA V32629  SRQEN
15014  52000  15026R     AND =B7760
15015  22000  15027R     ADA =B170020
15016  42000    111X     JSX .EQL
15017  42000    136X     JSX .ORT
15020 170140             CMA
15021  42000    104X     JSX .TURN
15022           5517R    DEF =B100000
15023          77565A    DEF V32629  SRQEN
15024  31565  77565A     STA V32629  SRQEN
15025  66000     31X     JMX .RTNA
15026   7760
15027 170020
                         LIT
15026                   P936  EQU * ALTCK
15030
15030   1676  77676A     LDA V16 TLEDS
15031  52000   6233R     AND =B600
15032  22000   6234R     ADA =B177200
15033  72013            RZA A937
15034   1566  77566A     LDA V32630  KEYCODE
15035 170040             TCA
15036  22000  15047R     ADA =B145
15037 172004            SAP A938
15040   1702  77702A     LDA V24 VIDCON
15041  52000   2110R     AND =B177776
15042  66000  15045R     JMP A939
15043                   A938 EQU *
15043   1702  77702A     LDA V24 VIDCON
15044  62000   1457R     IOR =D1
15045                   A939 EQU *
15045  31702  77702A     STA V24 VIDCON
15046                   A937 EQU *
15046 170201             RET 1
15047    145
                         LIT
15047                   P223  EQU * AMPU
15050
15050   6000   1277R     LDB =D-1
15051  42000     27X     JSX .ARGA
15052  42000   1665R     JSM P245  RLAD
15053  31573  77573A     STA V32635  I
15054   6000   1301R     LDB =D-3  N
15055  42000     30X     JSX .LDAP
15056  42000    104X     JSX .TURN
15057           4533R    DEF =B140000
15060          77730A    DEF V30 KFLAG
15061  31730  77730A     STA V30 KFLAG
15062   1573  77573A     LDA V32635  I
15063 170040             TCA
15064  21700  77700A     ADA V22 RLVL
15065  70540             PWC A
15066  42000   1665R     JSM P245  RLAD
15067  42000     57X     JSX ADD4I
15070  31700  77700A     STA V22 RLVL
15071   2000   2405R     LDA =D5
15072  42000   2314R     JSM P279  SBLK
15073   1675  77675A     LDA V15 BLEDS
15074 170612             SAL 11
15075 172003            SAP A940
15076   2000   3527R     LDA =D14
15077  42000   2314R     JSM P279  SBLK
15100                   A940 EQU *
15100   1675  77675A     LDA V15 BLEDS
15101 170611             SAL 10
15102 172003            SAP A941
15103   2000   2131R     LDA =D15
15104  42000   2314R     JSM P279  SBLK
15105                   A941 EQU *
15105   1723  77723A     LDA V26 MKRMODE
15106  72407             SZA A942
15107  42000  10323R     JSM P626  MKRROK
15110 172005             SAP A942
15111   2000   6703R     LDA =D1024
15112  70540             PWC A
15113   2000   2521R     LDA =D17
15114  42000   2522R     JSM P297  RJUST
15115                   A942 EQU *
15115  42000  10301R     JSM P624  MKRACT
15116  66000     31X     JMX .RTNA
15117                   P943  EQU * SMODE
15117   1675  77675A     LDA V15 BLEDS
15120 170613             SAL 12
15121 172404             SAM A945
15122   1730  77730A     LDA V30 KFLAG
15123 170614             SAL 13
15124 172003             SAP A944
15125                   A945 EQU *
```

```
15125    2000  15047R     LDA =B145
15126   66000  15130R     JMP A946
15127                   A944 EQU *
15127    2000  15132R     LDA =B141
15130                   A946 EQU *
15130   42000    555R     JSM P215  SKEY
15131  170201             RET 1
15132     141
15132                    LIT
15133                   P947  EQU * TRNOFF
15133    6000   1277R     LDB =D-1
15134   42000     27X     JSX .ARGA
15135   11620  77620A     CPA V32656  PREFIX
15136   66000  15140R     JMP *+2
15137   66000  15142R     JMP A948
15140    2000   1463R     LDA =D0
15141   42000  14741R     JSM P929  ENTRY
15142                   A948 EQU *
15142   66000     31X     JMX .RTNA
15143                   P949  EQU * UNBLANK
15143    1575  77575A     LDA V32637  K
15144   12000   2107R     CPA =D3
15145   66000  15222R     JMP A950
15146    6000   2221R     LDB =D9
15147   42000     74X     JSX .RS5
15150   31742  77742A     STA V32738  IX
15151    6000   2203R     LDB =D8
15152   42000     74X     JSX .RS5
15153   31742  77742A     STA V32738  IX
15154   52000   3166R     AND =B1777
15155   31742  77742A     STA V32738  IX
15156    1676  77676A     LDA V16 TLEDS
15157   52000   1704R     AND =D6
15160   72404            SZA A951
15161    1742  77742A     LDA V32738  IX
15162   22000   6703R     ADA =D1024
15163   31742  77742A     STA V32738  IX
15164                   A951 EQU *
15164                   A952 EQU *
15164    1742  77742A     LDA V32738  IX
15165   42000    103X     JSX .W4
15166    2000   1375R     LDA =B177767
15167   70540             PWC A
15170    2000   1463R     LDA =D0
15171                   A953 EQU *
15171   31573  77573A     STA V32635  I
15172   42000    162X     JSX .R5
15173   31572  77572A     STA V32634  J
15174    1573  77573A     LDA V32635  I
15175   21742  77742A     ADA V32738  IX
15176   42000    103X     JSX .W4
15177    5572  77572A     LDB V32634  J
15200  174604             SBL 5
15201    1572  77572A     LDA V32634  J
15202  176402            SBM A954
15203   52000   7567R     AND =B173777
15204                   A954 EQU *
15204   42000     73X     JSX .W6
15205    2000   1457R     LDA =D1
15206   21573  77573A     ADA V32635  I
15207  144016     16A     ISZ C,I
15210   66000  15171R     JMP A953
15211   54016     16A     DSZ C
15212    1742  77742A     LDA V32738  IX
15213   22000   6703R     ADA =D1024
15214   31742  77742A     STA V32738  IX
15215   22000  15223R     ADA =D-2048
15216  172004            SAP A955
15217    1676  77676A     LDA V16 TLEDS
15220   52000   3231R     AND =B60
15221   72443            SZA A952
15222                   A955 EQU *
15222                   A950 EQU *
15222  170201             RET 1
15223  174000
15223                    LIT
15224                   P221  EQU * TRIGR
15224   66000  15235R     JMP A956
15225                   T957 EQU *
15225                   K958  OCT 140000  140000
15226                   K959  OCT 50000 50000
15227                   K960  OCT 44000 44000
15230                      DEC 0 0
15231                   K961  OCT 54000 54000
15232          15225R   V962 DEF T957 MTRIG
15233                     OCT 177777  177777
15234                   K963  OCT 5 5
15235                   A956  EQU *
15235    1607  77607A     LDA V32647  ACNT
15236  172003            SAP A964
15237    2000   1463R     LDA =D0
15240   31607  77607A     STA V32647  ACNT
15241                   A964 EQU *
15241   42000   2650R     JSM P304  UNCAL
15242   42000  15143R     JSM P949  UNBLANK
15243    1676  77676A     LDA V16 TLEDS
15244  170512             SAR 11
15245   52000   2406R     AND =D7
15246   22000   1457R     ADA =D1
15247   42000     60X     JSX .ARAY
```

```
15250          15232R     DEF V962  MTRIG
15251   31703  77703A     STA V21 STRIG
15252 172005             SAP A965
15253    1733  77733A     LDA V20 FSTIM
15254 172003             SAP A965
15255    2000   4534R     LDA =B40000
15256   31703  77703A     STA V21 STRIG
15257                   A965 EQU *
15257    1730  77730A     LDA V30 KFLAG
15260 170613              SAL 12
15261 172006             SAP A966
15262    1733  77733A     LDA V20 FSTIM
15263 172004             SAP A966
15264    1703  77703A     LDA V21 STRIG
15265   52000   2645R     AND =B137777
15266   31703  77703A     STA V21 STRIG
15267                   A966 EQU *
15267    1603  77603A     LDA V32643  PLOCK
15270   52000   7567R     AND =B173777
15271   31603  77603A     STA V32643  PLOCK
15272   42000   6160R     JSM P502  EOS
15273 170201              RET 1
15274                   P967  EQU * TMODE
15274    6000   1277R     LDB =D-1
15275   42000     27X     JSX .ARGA
15276   42000    104X     JSX .TURN
15277          15312R     DEF =B34000
15300          77676A     DEF V16 TLEDS
15301   42000   2163R     JSM P270  TLEDSOUT
15302    6000   1301R     LDB =D-3  N
15303   42000     30X     JSX .LDAP
15304   42000    104X     JSX .TURN
15305           2203R     DEF =D8
15306          77730A     DEF V30 KFLAG
15307   31730  77730A     STA V30 KFLAG
15310   42000  15224R     JSM P221  TRIGR
15311   66000     31X     JMX .RTNA
15312   34000
                           LIT
15312                   P968  EQU * CFDF
15313
15313    6000   1277R     LDB =D-1
15314   42000     27X     JSX .ARGA
15315   42000    104X     JSX .TURN
15316           1457R     DEF =D1
15317          77675A     DEF V15 BLEDS
15320   31675  77675A     STA V15 BLEDS
15321   52000   1457R     AND =D1
15322 170600              SAL 1
15323   22000   2406R     ADA =D7
15324   42000   2223R     JSM P274  NBLK
15325    1675  77675A     LDA V15 BLEDS
15326   52000   1457R     AND =D1
15327 170600              SAL 1
15330   22000   2203R     ADA =D8
15331   42000   2223R     JSM P274  NBLK
15332   42000   6723R     JSM P538  CSBLK
15333   66000     31X     JMX .RTNA
15334                   P969  EQU * CLRDA
15334    1620  77620A     LDA V32656  PREFIX
15335   12000  15343R     CPA =D40
15336   66000  15340R     JMP *+2
15337   66000  15342R     JMP A970
15340    2000   1463R     LDA =D0
15341   42000  14741R     JSM P929  ENTRY
15342                   A970 EQU *
15342 170201              RET 1
15343      50
                           LIT
15343                   P971  EQU * USFT
15344
15344    1676  77676A     LDA V16 TLEDS
15345   52000  15350R     AND =B176777
15346   42000   2163R     JSM P270  TLEDSOUT
15347 170201              RET 1
15350 176777
                           LIT
15350                   P972  EQU * SAVPREP
15351
15351    1601  77601A     LDA V32641  HPBC
15352   52000  15404R     AND =B177400
15353   61577  77577A     IOR V32639  CTBASE
15354   31671  77671A     STA V46 CTBSV
15355    1610  77610A     LDA V32648  ALIM
15356 170600              SAL 1
15357   61713  77713A     IOR V45 ALIMSV
15360   31713  77713A     STA V45 ALIMSV
15361    1740  77740A     LDA V32736  EFLAG
15362   42000    104X     JSX .TURN
15363           1363R     DEF =B177774
15364          77724A     DEF V49 EFLGSV
15365   70540             PWC A
15366    1426  77426A     LDA V32534  UFLAG
15367 170501              SAR 2
15370   52000   2276R     AND =D2
15371   42000    136X     JSX .ORT
15372   31724  77724A     STA V49 EFLGSV
15373    1433  77433A     LDA V32539  GIN1
15374 170600              SAL 1
15375   61665  77665A     IOR V47 GIN1SV
15376   31665  77665A     STA V47 GIN1SV
15377    1432  77432A     LDA V32538  GIN2
15400 170600              SAL 1
```

```
15401  61707  77707A      IOR V48 GIN2SV
15402  31707  77707A      STA V48 GIN2SV
15403 170201              RET 1
15404 177400
15404                    LIT
15405                   P973  EQU * SAVCLR
15405   2000   1463R      LDA =D0
15406  31671  77671A      STA V46 CTBSV
15407   1713  77713A      LDA V45 ALIMSV
15410  52000   1457R      AND =D1
15411  31713  77713A      STA V45 ALIMSV
15412   1724  77724A      LDA V49 EFLGSV
15413  52000   1457R      AND =D1
15414  31724  77724A      STA V49 EFLGSV
15415   1665  77665A      LDA V47 GIN1SV
15416  52000   1457R      AND =D1
15417  31665  77665A      STA V47 GIN1SV
15420   1707  77707A      LDA V48 GIN2SV
15421  52000   1457R      AND =D1
15422  31707  77707A      STA V48 GIN2SV
15423 170201              RET 1
15424                   P974  EQU * SAVFIX
15424   1713  77713A      LDA V45 ALIMSV
15425 170500              SAR 1
15426  31610  77610A      STA V32648  ALIM
15427   1671  77671A      LDA V46 CTBSV
15430  52000   3242R      AND =B377
15431  31577  77577A      STA V32639  CTBASE
15432   1724  77724A      LDA V49 EFLGSV
15433  42000    104X      JSX .TURN
15434          15467R     DEF =B143454
15435          77740A     DEF V32736  EFLAG
15436  31740  77740A      STA V32736  EFLAG
15437   1724  77724A      LDA V49 EFLGSV
15440 170601              SAL 2
15441  42000    104X      JSX .TURN
15442           2203R     DEF =D8
15443          77426A     DEF V32534  UFLAG
15444  31426  77426A      STA V32534  UFLAG
15445   1671  77671A      LDA V46 CTBSV
15446  42000    104X      JSX .TURN
15447          15470R     DEF =B1400
15450          77601A     DEF V32641  HPBC
15451  31601  77601A      STA V32641  HPBC
15452   6000   1704R      LDB =D6
15453  42000     74X      JSX .RSS
15454  31572  77572A      STA V32634  J
15455 170601              SAL 2
15456 172407             SAM A975
15457   1665  77665A      LDA V47 GIN1SV
15460 170400              AAR 1
15461  31433  77433A      STA V32539  GIN1
15462   1707  77707A      LDA V48 GIN2SV
15463 170400              AAR 1
15464  31432  77432A      STA V32538  GIN2
15465                   A975 EQU *
15465  42000  15405R      JSM P973  SAVCLR
15466 170201              RET 1
15467 143454
15470   1400
15467                    LIT
15471                   P976  EQU * NUMBER
15471   1620  77620A      LDA V32656  PREFIX
15472  72002              RZA *+2
15473  66000  15531R      JMP A977
15474  42000  12317R      JSM P733  CLRNUM
15475   1611  77611A      LDA V32649  CHRC
15476  22000   7243R      ADA =D-12
15477 172017             SAP A978
15500  42000     37X      JSX .LDBI
15501          77651A     DEF V32681  LTEMP
15502   1566  77566A      LDA V32630  KEYCODE
15503  75541              MLY
15504  42000     34X      JSX .STRD
15505          77651A     DEF V32681  LTEMP
15506  42000  12302R      JSM P732  WKEY
15507   1617  77617A      LDA V32655  DECFLG
15510 172006             SAP A979
15511   1601  77601A      LDA V32641  HPBC
15512 170600              SAL 1
15513 172403             SAM A979
15514  55617  77617A      DSZ V32655  DECFLG
15515                     NOP
15516                   A979 EQU *
15516                   A978 EQU *
15516   1620  77620A      LDA V32656  PREFIX
15517 170500              SAR 1
15520  12000   1456R      CPA =D12
15521  66000  15523R      JMP *+2
15522  66000  15531R      JMP A980
15523   2000   2411R      LDA =D4
15524   6000   2411R      LDB =D4
15525  42000    112X      JSX .WS7
15526   1616  77616A      LDA V32654  XFLAG
15527  62000   5517R      IOR =B100000
15530  31616  77616A      STA V32654  XFLAG
15531                   A980 EQU *
15531                   A977 EQU *
15531 170201              RET 1
15532                   P981  EQU * DSPW
```

```
15532   1620  77620A      LDA V32656  PREFIX
15533  12000  15544R      CPA =D41
15534  66000  15536R      JMP *+2
15535  66000  15541R      JMP A983
15536   1616  77616A      LDA V32654  XFLAG
15537 170602              SAL 3
15540 172403             SAM A982
15541                    A983 EQU *
15541   2000  15545R      LDA =B177727
15542  42000  14741R      JSM P929  ENTRY
15543                    A982 EQU *
15543 170201              RET 1
15544     51
15545 177727
15544                     LIT
15546                    P214  EQU * KEY
15546   6000   1277R      LDB =D-1
15547  42000    27X       JSX .ARGA
15550  31566  77566A      STA V32630  KEYCODE
15551   2000   1463R      LDA =D0
15552  31564  77564A      STA V32628  RPGCNT
15553   1616  77616A      LDA V32654  XFLAG
15554  52000  15666R      AND =B77776
15555  31616  77616A      STA V32654  XFLAG
15556   1601  77601A      LDA V32641  HPBC
15557 170140              CMA
15560 170600              SAL 1
15561  51616  77616A      AND V32654  XFLAG
15562 170600              SAL 1
15563 172033             SAP A985
15564   1740  77740A      LDA V32736  EFLAG
15565 170606              SAL 7
15566 172405             SAM A988
15567   1620  77620A      LDA V32656  PREFIX
15570  12000  10243R      CPA =D27
15571  66000  15573R      JMP *+2
15572  66000  15601R      JMP A987
15573                    A988 EQU *
15573   1566  77566A      LDA V32630  KEYCODE
15574  22000  15667R      ADA =B-47
15575 172421             SAM A986
15576   1566  77566A      LDA V32630  KEYCODE
15577  12000  10240R      CPA =B57
15600  66000  15616R      JMP A986
15601                    A987 EQU *
15601   1620  77620A      LDA V32656  PREFIX
15602  12000  10243R      CPA =D27
15603  66000  15605R      JMP *+2
15604  66000  24634R      JMP L984  EXIT
15605   1566  77566A      LDA V32630  KEYCODE
15606 170040              TCA
15607  22000  15670R      ADA =B55
15610 172402              SAM *+2
15611  66000  24634R      JMP L984  EXIT
15612   1566  77566A      LDA V32630  KEYCODE
15613  22000  15671R      ADA =B-72
15614 172402              SAM *+2
15615  66000  24634R      JMP L984  EXIT
15616                    A986 EQU *
15616                    A985 EQU *
15616   1676  77676A      LDA V16 ILEDS
15617 170605              SAL 6
15620 172402              SAM *+2
15621  66000  15702R      JMP A989
15622   1566  77566A      LDA V32630  KEYCODE
15623  12000   2204R      CPA =B12
15624  66000  15637R      JMP A991
15625  12000   2107R      CPA =D3
15626  66000  15637R      JMP A991
15627   1566  77566A      LDA V32630  KEYCODE
15630  11736  77736A      CPA V32734  ETX
15631  66000  15633R      JMP *+2
15632  66000  15641R      JMP A990
15633   1620  77620A      LDA V32656  PREFIX
15634  12000   1456R      CPA =D12
15635  66000  15637R      JMP *+2
15636  66000  15641R      JMP A990
15637                    A991 EQU *
15637   2000  15672R      LDA =B140
15640  31566  77566A      STA V32630  KEYCODE
15641                    A990 EQU *
15641   1566  77566A      LDA V32630  KEYCODE
15642  12000  15673R      CPA =B52
15643  66000  15645R      JMP *+2
15644  66000  15647R      JMP A992
15645   2000  15670R      LDA =B55
15646  31566  77566A      STA V32630  KEYCODE
15647                    A992 EQU *
15647   1620  77620A      LDA V32656  PREFIX
15650  12000   1456R      CPA =D12
15651  66000  15653R      JMP *+2
15652  66000  15674R      JMP A993
15653   1566  77566A      LDA V32630  KEYCODE
15654  12000  15672R      CPA =B140
15655  66000  15674R      JMP A993
15656   1566  77566A      LDA V32630  KEYCODE
15657  12000   3042R      CPA =B45
15660  66000  15674R      JMP A993
15661   1611  77611A      LDA V32649  CHRC
15662  22000  15671R      ADA =D-58
```

```
15663 172002          SAP A994
15664  42000  12302R    JSM P732   WKEY
15665               A994 EQU *
15665  66000  24634R    JMP L984   EXIT
15666  77776
15667 177731
15670     55
15671 177706
15672    140
15673     52
15666                  LIT
15674               A993 EQU *
15674   1566  77566A    LDA V32630   KEYCODE
15675  22000  15701R    ADA =B-40
15676 172002          SAP A996
15677  42000  15344R    JSM P971   USF1
15700               A996 EQU *
15700               A995 EQU *
15700  66000  15712R    JMP A997
15701 177740
15701                  LIT
15702               A989 EQU *
15702   1566  77566A    LDA V32630   KEYCODE
15703  22000   3232R    ADA =B-60
15704 172406          SAM A998
15705   1566  77566A    LDA V32630   KEYCODE
15706  22000  15671R    ADA =B-72
15707 172003          SAP A998
15710  42000  15471R    JSM P976   NUMBER
15711  66000  24634R    JMP L984   EXIT
15712               A998 EQU *
15712               A997 EQU *
15712   1566  77566A    LDA V32630   KEYCODE
15713 170504            SAR 5
15714  22000   1457R    ADA =D1
15715  66000  24626R    JMP A999
15716               C1000 EQU *
15716   1566  77566A    LDA V32630   KEYCODE
15717  22000   1457R    ADA =D1
15720  66000  16754R    JMP A1001
15721               C1002 EQU *
15721   1616  77616A    LDA V32654   XFLAG
15722 170515            SAR 14
15723   6000  15026R    LDB =B7760
15724  75617            MPY
15725  42000    104X    JSX .TURN
15726          6514R    DEF =B77777
15727         77565A    DEF V32629   SRQEN
15730  31565  77565A    STA V32629   SRQEN
15731   6000   2276R    LDB =D2
15732  42000    107X    JSX .WS5
15733   1740  77740A    LDA V32736   EFLAG
15734  52000  16167R    AND =B175377
15735  62000  11310R    IOR =B400
15736  31740  77740A    STA V32736   EFLAG
15737  66000  16755R    JMP A1003
15740               C1004 EQU *
15740   1676  77676A    LDA V16 TLEDS
15741  52000  16170R    AND =B611
15742  72410           SZA A1005
15743   1740  77740A    LDA V32736   EFLAG
15744  62000   2277R    IOR =B4000
15745  31740  77740A    STA V32736   EFLAG
15746   1601  77601A    LDA V32641   HPBC
15747  52000  16171R    AND =B157777
15750  31601  77601A    STA V32641   HPBC
15751  42000  15224R    JSM P221   TRIGR
15752               A1005 EQU *
15752  66000  16755R    JMP A1003
15753               C1006 EQU *
15753  42000  12474R    JSM P744   UNITS
15754  66000  16755R    JMP A1003
15755               C1007 EQU *
15755  42000  15224R    JSM P221   TRIGR
15756   1740  77740A    LDA V32736   EFLAG
15757  52000  16172R    AND =B174777
15760  62000   1300R    IOR =B1000
15761  31740  77740A    STA V32736   EFLAG
15762  66000  16755R    JMP A1003
15763               C1008 EQU *
15763   2000   2411R    LDA =D4
15764  42000   3046R    JSM P321   CLEAR
15765   2000   6352R    LDA =D3072
15766  31563  77563A    STA V32627   DSTAD
15767   1426  77426A    LDA V32534   UFLAG
15770  52000  16173R    AND =B177733
15771  31426  77426A    STA V32534   UFLAG
15772  42000   2650R    JSM P304   UNCAL
15773  66000  16755R    JMP A1003
15774               C1009 EQU *
15774   1740  77740A    LDA V32736   EFLAG
15775  52000  16174R    AND =B174377
15776  62000   6703R    IOR =B2000
15777  31740  77740A    STA V32736   EFLAG
16000   1616  77616A    LDA V32654   XFLAG
16001 170600            SAL 1
16002 172021           SAP A1010
16003   1620  77620A    LDA V32656   PREFIX
16004  12000  10243R    CPA =D27
16005  66000  16023R    JMP A1010
```

```
16006   1565  77565A        LDA V32629  SRQEN
16007  52000   5517R        AND =B100000
16010  62000   6514R        IOR =B77777
16011  31565  77565A        STA V32629  SRQEN
16012   6000   2276R        LDB =D2
16013  42000    107X        JSX .WS5
16014   2000   2411R        LDA =D4
16015  42000   3214R        JSM P332  WAIT
16016   2000   2107R        LDA =D3
16017   6000   2107R        LDB =D3
16020  42000     75X        JSX .WS4
16021   2000   2411R        LDA =D4
16022  42000    103X        JSX .W4
16023                 A1010 EQU *
16023  66000  16755R        JMP A1003
16024                 C1011 EQU *
16024   1740  77740A        LDA V32736  EFLAG
16025  52000   5521R        AND =B175777
16026  31740  77740A        STA V32736  EFLAG
16027  66000  16755R        JMP A1003
16030                 C1012 EQU *
16030   1601  77601A        LDA V32641  HPBC
16031  52000  16175R        AND =B176377
16032  62000  11310R        IOR =B400
16033  31601  77601A        STA V32641  HPBC
16034  66000  16755R        JMP A1003
16035                 C1013 EQU *
16035   1601  77601A        LDA V32641  HPBC
16036  52000  16175R        AND =B176377
16037  62000   1300R        IOR =B1000
16040  31601  77601A        STA V32641  HPBC
16041  66000  16755R        JMP A1003
16042                 C1014 EQU *
16042  42000  13045R        JSM P791  OHPB
16043  42000     24X        JSM P211  IHPIB
16044  31567  77567A        STA V32631  KEYCOL
16045  42000     53X        JSX .LDSI
16046          1463R        DEF =D0
16047  42000     34X        JSX .STRD
16050         77655A        DEF V32685  LTEMP2
16051   1567  77567A        LDA V32631  KEYCOL
16052  52000   2406R        AND =D7
16053  31660  77660A        STA V36 BCDC
16054   1567  77567A        LDA V32631  KEYCOL
16055 170600                SAL 1
16056  42000    104X        JSX .TURN
16057         16176R        DEF =B160
16060         77660A        DEF V36 BCDC
16061  31660  77660A        STA V36 BCDC
16062   1567  77567A        LDA V32631  KEYCOL
16063 170601                SAL 2
16064  42000    104X        JSX .TURN
16065         16177R        DEF =B3400
16066         77660A        DEF V36 BCDC
16067  31660  77660A        STA V36 BCDC
16070  42000   7732R        JSM P599  FPNLON
16071   2000  16200R        LDA =D33
16072  42000   2501R        JSM P295  BLINK
16073   2000  16200R        LDA =D33
16074  42000   2314R        JSM P279  SBLK
16075  66000  16755R        JMP A1003
16076                 C1015 EQU *
16076   1601  77601A        LDA V32641  HPBC
16077  52000  16175R        AND =B176377
16100  62000  15470R        IOR =B1400
16101  31601  77601A        STA V32641  HPBC
16102  66000  16755R        JMP A1003
16103                 C1016 EQU *
16103  42000  13045R        JSM P791  OHPB
16104   2000  16201R        LDA =D1025
16105  31573  77573A        STA V32635  I
16106   2000   3112R        LDA =D1001
16107  70540                PWC A
16110  42000    166X        JSX .CSHV
16111         77573A        DEF V32635  I
16112  42000     25X        JSM P212  IHPBI
16113  66000  16755R        JMP A1003
16114                 C1017 EQU *
16114   1676  77676A        LDA V16 TLEDS
16115 170605                SAL 6
16116 172403                SAM A1018
16117   2000  16200R        LDA =D33
16120  42000   2434R        JSM P285  BLKOF
16121                 A1018 EQU *
16121  66000  16755R        JMP A1003
16122                 C1019 EQU *
16122   1601  77601A        LDA V32641  HPBC
16123  52000  16175R        AND =B176377
16124  31601  77601A        STA V32641  HPBC
16125  66000  16755R        JMP A1003
16126                 C1020 EQU *
16126  42000  15532R        JSM P981  DSPW
16127  42000  13045R        JSM P791  OHPB
16130  42000     24X        JSM P211  IHPIB
16131 170607                SAL 8
16132  31572  77572A        STA V32634  J
16133  42000     24X        JSM P211  IHPIB
16134  61572  77572A        IOR V32634  J
16135  42000  12265R        JSM P731  DSWRT
16136  66000  16755R        JMP A1003
```

```
16137                          C1021 EQU *
16137   42000   13045R           JSM P791   OHPB
16140   42000   10323R           JSM P626   MRKROK
16141  172402                    SAM *+2
16142   66000   16220R           JMP A1022
16143    1723   77723A           LDA V26 MRKMODE
16144   72002                    RZA *+2
16145   66000   16220R           JMP A1022
16146    1675   77675A           LDA V15 BLEDS
16147  170601                    SAL 2
16150  172010                  SAP A1023
16151    1426   77426A           LDA V32534   UFLAG
16152  170610                    SAL 9
16153  172005                  SAP A1023
16154    1601   77601A           LDA V32641   HPBC
16155   52000   15470R           AND =B1400
16156   72002                    RZA *+2
16157   66000   16220R           JMP A1022
16160                          A1023 EQU *
16160    1601   77601A           LDA V32641   HPBC
16161   52000   15470R           AND =B1400
16162   72020                  RZA A1024
16163    2000    7565R           LDA =D18
16164   42000   14055R           JSM P216   MESSAGE
16165   42000   13030R           JSM P789   WCRLF
16166   66000   16217R           JMP A1025
16167  175377
16170     611
16171  157777
16172  174777
16173  177733
16174  174377
16175  176377
16176     160
16177    3400
16200      41
16201    2001
                               LIT
16167                          A1024 EQU *
16202
16202   42000     166X           JSX .CSHV
16203             4630R          DEF P421   RDBMV
16204    1601   77601A           LDA V32641   HPBC
16205  170507                    SAR 8
16206   70540                    PWC A
16207   42000   10312R           JSM P218   MKREL
16210  172005                  SAP A1026
16211    1717   77717A           LDA V28 AMKR
16212  170040                    TCA
16213   21721   77721A           ADA V25 MRKR
16214   66000   16216R           JMP A1027
16215                          A1026 EQU *
16215    1721   77721A           LDA V25 MRKR
16216                          A1027 EQU *
16216   42000      22X           JSM P209   ADUMP
16217                          A1025 EQU *
16217   66000   16224R           JMP A1028
16220                          A1022 EQU *
16220   42000     167X           JSX .ADDR
16221           16243R           DEF ="999999999999"
16222   42000      13X           JSM P202   STHPB
16223   42000   13030R           JSM P789   WCRLF
16224                          A1028 EQU *
16224   66000   16755R           JMP A1003
16225                          C1029 EQU *
16225   42000   13045R           JSM P791   OHPB
16226   42000   10323R           JSM P626   MRKROK
16227  172402                    SAM *+2
16230   66000   16270R           JMP A1030
16231    1723   77723A           LDA V26 MRKMODE
16232   72002                    RZA *+2
16233   66000   16270R           JMP A1030
16234    1601   77601A           LDA V32641   HPBC
16235   52000   15470R           AND =B1400
16236   72014                  RZA A1031
16237    2000    2521R           LDA =D17
16240   42000   14055R           JSM P216   MESSAGE
16241   42000   13030R           JSM P789   WCRLF
16242   66000   16267R           JMP A1032
16243 999999999999
                               LIT
16243                          A1031 EQU *
16252
16252   42000     166X           JSX .CSHV
16253             4630R          DEF P421   RDBMV
16254    1601   77601A           LDA V32641   HPBC
16255  170507                    SAR 8
16256   70540                    PWC A
16257   42000   10312R           JSM P218   MKREL
16260  172005                  SAP A1033
16261    1720   77720A           LDA V27 AMLVL
16262  170040                    TCA
16263   21722   77722A           ADA V29 MKRLVL
16264   66000   16266R           JMP A1034
16265                          A1033 EQU *
16265    1722   77722A           LDA V29 MKRLVL
16266                          A1034 EQU *
16266   42000      22X           JSM P209   ADUMP
16267                          A1032 EQU *
16267   66000   16274R           JMP A1035
16270                          A1030 EQU *
16270   42000     167X           JSX .ADDR
```

```
16271               16243R     DEF ="999999999999"
16272    42000         13X     JSM P202  STHPB
16273    42000      13030R     JSM P789  *CRLF
16274                      A1035 EQU *
16274    66000      16755R     JMP A1003
16275                      C1036 EQU *
16275     2000       1457R     LDA =D1
16276     6000       2203R     LDB =D8
16277    42000         75X     JSX .WS4
16300    42000      13045R     JSM P791  OHPB
16301    42000        166X     JSX .CSHV
16302                4630R     DEF P421  RDBMV
16303     1601      77601A     LDA V32641  HPBC
16304   170507                 SAR 8
16305    42000         21X     JSM P208  TDUMP
16306    66000      16755R     JMP A1003
16307                      C1037 EQU *
16307     2000      16201R     LDA =D1025
16310     6000       2203R     LDB =D8
16311    42000         75X     JSX .WS4
16312    42000      13045R     JSM P791  OHPB
16313    42000        166X     JSX .CSHV
16314                4630R     DEF P421  RDBMV
16315     1601      77601A     LDA V32641  HPBC
16316   170507                 SAR 8
16317    42000         21X     JSM P208  TDUMP
16320    66000      16755R     JMP A1003
16321                      C1038 EQU *
16321     1563      77563A     LDA V32627  DSTAD
16322     6000       2203R     LDB =D8
16323    42000         75X     JSX .WS4
16324    22000       1457R     ADA =D1
16325    52000       6353R     AND =B7777
16326    31563      77563A     STA V32627  DSTAD
16327    42000      13045R     JSM P791  OHPB
16330    42000        166X     JSX .CSHV
16331                4630R     DEF P421  RDBMV
16332     1601      77601A     LDA V32641  HPBC
16333   170507                 SAR 8
16334    42000         20X     JSM P207  PDUMP
16335    42000      15334R     JSM P969  CLRDA
16336    66000      16755R     JMP A1003
16337                      C1039 EQU *
16337    66000      16407R     JMP A1040
16340                      T1041 EQU *
16340                      K1042 OCT 24050  24050
16341                      K1043 OCT 23447  23447
16342                      K1044 OCT 3001   3001
16343                      K1045 OCT 22445  22445
16344                      K1046 OCT 4007   4007
16345                      K1047 OCT 21042  21042
16346                      K1048 OCT 7416   7416
16347                      K1049 OCT 11022  11022
16350                      K1050 OCT 10421  10421
16351                      K1051 OCT 21443  21443
16352                      K1052 OCT 20040  20040
16353                      K1053 OCT 6014   6014
16354                      K1054 OCT 17430  17430
16355                      K1055 OCT 22044  22044
16356                      K1056 OCT 23046  23046
16357                      K1057 OCT 20441  20441
16360                      K1058 OCT 5413   5413
16361                      K1059 OCT 6415   6415
16362               16340R V1060 DEF T1041 OTLIST
16363                            OCT 177777  177777
16364                      K1061 OCT 22   22
16365                      P1062 EQU * NOSKIP
16365   174517                 CLB
16366    42000         56X     JSX .ARGS
16367    44016         16A     ISZ C
16370     1573      77573A     LDA V32635  I
16371    22000      16400R     ADA =D-145
16372    70540                 PWC A
16373     1573      77573A     LDA V32635  I
16374   170040                 TCA
16375    22000       2500R     ADA =D147
16376    42000        136X     JSX .ORI
16377    66000         31X     JMX .RTNA
16400   177557
16400                          LIT
16401                      P1063 EQU * DSRD
16401     6000       2203R     LDB =D8
16402    42000         74X     JSX .RS5
16403    31573      77573A     STA V32635  I
16404    52000       6353R     AND =B7777
16405    31573      77573A     STA V32635  I
16406   170201                 RET 1
16407                      A1040 EQU *
16407    42000      13045R     JSM P791  OHPB
16410     2000      16476R     LDA =B177756
16411    70540                 PWC A
16412     2000       1457R     LDA =D1
16413                      A1064 EQU *
16413    31572      77572A     STA V32634  J
16414    42000         60X     JSX .ARAY
16415               16362R     DEF V1060 OTLIST
16416   170507                 SAR 8
16417    31573      77573A     STA V32635  I
16420     1572      77572A     LDA V32634  J
16421    42000         60X     JSX .ARAY
```

```
16422                 16362R        DEF V1060 OTLIST
16423    52000         3242R        AND =B377
16424    31741        77741A        STA V32737   IY
16425     1573        77573A        LDA V32635   I
16426   170040                      TCA
16427    21741        77741A        ADA V32737   IY
16430    22000         1277R        ADA =B177777
16431    70540                      PWC A
16432     1741        77741A        LDA V32737   IY
16433                             A1065 EQU *
16433    31741        77741A        STA V32737   IY
16434    42000         2422R        JSM P284   BLKAD
16435    42000        16401R        JSM P1063 DSRD
16436    42000        16365R        JSM P1062 NOSKIP
16437   172402                      SAM *+2
16440    66000        16477R        JMP A1066
16441    42000        16401R        JSM P1063 DSRD
16442    42000        16401R        JSM P1063 DSRD
16443    42000        16401R        JSM P1063 DSRD
16444    42000        16401R        JSM P1063 DSRD
16445     1741        77741A        LDA V32737   IY
16446    12000         2172R        CPA =D13
16447    66000        16453R        JMP A1067
16450    12000         2477R        CPA =D36
16451    66000        16453R        JMP A1067
16452    42000        16401R        JSM P1063 DSRD
16453                             A1067 EQU *
16453                             A1068 EQU *
16453    42000        16365R        JSM P1062 NOSKIP
16454   172023                     SAP A1069
16455     1573        77573A        LDA V32635   I
16456    72421                     SZA A1069
16457     1573        77573A        LDA V32635   I
16460    12000         2521R        CPA =B21
16461    66000        16477R        JMP A1069
16462     1573        77573A        LDA V32635   I
16463    12000         2204R        CPA =D10
16464    66000        16470R        JMP A1071
16465    12000         2172R        CPA =D13
16466    66000        16470R        JMP *+2
16467    66000        16472R        JMP A1070
16470                             A1071 EQU *
16470     2000         2205R        LDA =B40
16471    31573        77573A        STA V32635   I
16472                             A1070 EQU *
16472     1573        77573A        LDA V32635   I
16473    42000           17X        JSM P206   WHPIB
16474    42000        16401R        JSM P1063 DSRD
16475    66000        16453R        JMP A1068
16476   177756
16476                              LI1
16477                             A1069 EQU *
16477                             A1066 EQU *
16477     1741        77741A        LDA V32737   IY
16500    12000         2172R        CPA =D13
16501    66000        16505R        JMP A1072
16502     1730        77730A        LDA V30 KFLAG
16503    62000         2410R        IOR =B200
16504    31730        77730A        STA V30 KFLAG
16505                             A1072 EQU *
16505    42000        13030R        JSM P789   WCRLF
16506     2000         1457R        LDA =D1
16507    21741        77741A        ADA V32737   IY
16510   144016           16A        ISZ C,I
16511    66000        16433R        JMP A1065
16512    54016           16A        DSZ C
16513     2000         1457R        LDA =D1
16514    21572        77572A        ADA V32634   J
16515   144016           16A        ISZ C,I
16516    66000        16413R        JMP A1064
16517    54016           16A        DSZ C
16520    66000        16755R        JMP A1003
16521                             C1073 EQU *
16521    42000        13045R        JSM P791   UHPB
16522     2000        10142R        LDA =B37
16523    42000           17X        JSM P206   WHPIB
16524    42000        15351R        JSM P972   SAVPREP
16525     2000        15667R        LDA =B177731
16526    70540                      PWC A
16527     2000         1457R        LDA =D1
16530                             A1074 EQU *
16530    31573        77573A        STA V32635   I
16531    42000           60X        JSX .ARAY
16532                     7R        DEF V4   MSTATE
16533   170507                      SAR 8
16534    42000           17X        JSM P206   WHPIB
16535     1573        77573A        LDA V32635   I
16536    42000           60X        JSX .ARAY
16537                     7R        DEF V4   MSTATE
16540    42000           17X        JSM P206   WHPIB
16541     2000         1457R        LDA =D1
16542    21573        77573A        ADA V32635   I
16543   144016           16A        ISZ C,I
16544    66000        16530R        JMP A1074
16545    54016           16A        DSZ C
16546    42000           16X        JSM P205   WEOI
16547     2000        16571R        LDA =B245
16550    42000           17X        JSM P206   WHPIB
16551    42000        15405R        JSM P973   SAVCLR
16552    66000        16755R        JMP A1003
```

```
16553                    C1075 EQU *
16553  66000    16572R         JMP A1076
16554                    P1077 EQU * KEYETX
16554 174517                   CLB
16555  42000      56X          JSX .ARGS
16556  44016      16A          ISZ C
16557   1566   77566A          LDA V32630  KEYCODE
16560  22000    1301R          ADA =D-3
16561  42000     111X          JSX .EQL
16562  70540                   PWC A
16563   1736   77736A          LDA V32734  ETX
16564 170040                   TCA
16565  21566   77566A          ADA V32630  KEYCODE
16566  42000     111X          JSX .EQL
16567  42000     136X          JSX .ORT
16570  66000      31X          JMX .RTNA
16571    245
16571                          LIT
16572                    A1076 EQU *
16572  42000    13045R         JSM P791  OHPB
16573  42000    15532R         JSM P981  DSPW
16574                    A1078 EQU *
16574  42000      24X          JSM P211  IHPIB
16575  31566   77566A          STA V32630  KEYCODE
16576  42000    16554R         JSM P1077 KEYETX
16577 172403                   SAM A1079
16600   1566   77566A          LDA V32630  KEYCODE
16601  42000    12265R         JSM P731  DSWRT
16602                    A1079 EQU *
16602  42000    16554R         JSM P1077 KEYETX
16603 172071                   SAP A1078
16604  66000    16755R         JMP A1003
16605                    C1080 EQU *
16605   2000    16710R         LDA =B177730
16606  42000    14741R         JSM P929  ENTRY
16607  66000    16755R         JMP A1003
16610                    C1081 EQU *
16610  42000    15532R         JSM P981  DSPW
16611   1601   77601A          LDA V32641  HPBC
16612  52000    16711R         AND =B165777
16613  31601   77601A          STA V32641  HPBC
16614  66000    16755R         JMP A1003
16615                    C1082 EQU *
16615   1601   77601A          LDA V32641  HPBC
16616  52000     6371R         AND =B167777
16617  31601   77601A          STA V32641  HPBC
16620  66000    16755R         JMP A1003
16621                    C1083 EQU *
16621   1601   77601A          LDA V32641  HPBC
16622  52000    16712R         AND =B163777
16623  62000     2644R         IOR =B10000
16624  31601   77601A          STA V32641  HPBC
16625  66000    16755R         JMP A1003
16626                    C1084 EQU *
16626   1565   77565A          LDA V32629  SRQEN
16627  62000     5517R         IOR =B100000
16630  31565   77565A          STA V32629  SRQEN
16631   2000     2107R         LDA =D3
16632   6000     2107R         LDB =D3
16633  42000      75X          JSX .WS4
16634  66000    16755R         JMP A1003
16635                    C1085 EQU *
16635  42000    13045R         JSM P791  OHPB
16636   1620   77620A          LDA V32656  PREFIX
16637  42000    14055R         JSM P216  MESSAGE
16640  42000    13030R         JSM P789  WCRLF
16641  66000    16755R         JMP A1003
16642                    C1086 EQU *
16642  42000    13045R         JSM P791  OHPB
16643  42000     166X          JSX .CSHV
16644           24714R         DEF L194  POP
16645  42000     166X          JSX .CSHV
16646           32473R         DEF L195  ABORT
16647  42000      14X          JSM P203  HPBSY
16650   2000    15667R         LDA =B177731
16651  70540                   PWC A
16652   2000     1457R         LDA =D1
16653                    A1087 EQU *
16653  31573   77573A          STA V32635  I
16654  42000      24X          JSM P211  IHPIB
16655 170607                   SAL 8
16656  31572   77572A          STA V32634  J
16657   1573   77573A          LDA V32635  I
16660  42000      60X          JSX .ARAY
16661               7R         DEF V4  MSTATE
16662  70541                   PWC B
16663  42000      24X          JSM P211  IHPIB
16664  61572   77572A          IOR V32634  J
16665  42000     170X          JSX .STAC
16666   2000     1457R         LDA =D1
16667  21573   77573A          ADA V32635  I
16670 144016      16A          ISZ C,I
16671  66000    16653R         JMP A1087
16672  54016      16A          DSZ C
16673  42000      24X          JSM P211  IHPIB
16674  12000    16571R         CPA =B245
16675  66000    16677R         JMP *+2
16676  66000    24714R         JMP L194  POP
16677   1601   77601A          LDA V32641  HPBC
16700  52000     6514R         AND =B77777
```

```
16701  31601   77601A     STA V32641   HPBC
16702  42000   15424R     JSM P974   SAVFIX
16703   2000   14714R     LDA =B177747
16704  42000   14741R     JSM P929   ENTRY
16705   2000    3231R     LDA =B60
16706  42000   15546R     JSM P214   KEY
16707  66000   16755R     JMP A1003
16710 177730
16711 165777
16712 163777
16710                    LIT
16713          16642R     DEF C1086
16714          16635R     DEF C1085
16715          16626R     DEF C1084
16716          16621R     DEF C1083
16717          16615R     DEF C1082
16720          16610R     DEF C1081
16721          16605R     DEF C1080
16722          16553R     DEF C1075
16723          16755R     DEF A1003
16724          16521R     DEF C1073
16725          16337R     DEF C1039
16726          16321R     DEF C1038
16727          16307R     DEF C1037
16730          16275R     DEF C1036
16731          16225R     DEF C1029
16732          16137R     DEF C1021
16733          16126R     DEF C1020
16734          16122R     DEF C1019
16735          16114R     DEF C1017
16736          16103R     DEF C1016
16737          16076R     DEF C1015
16740          16042R     DEF C1014
16741          16035R     DEF C1013
16742          16030R     DEF C1012
16743          16024R     DEF C1011
16744          15774R     DEF C1009
16745          15763R     DEF C1008
16746          15755R     DEF C1007
16747          15753R     DEF C1006
16750          15740R     DEF C1004
16751          32476R     DEF L193   RESET
16752          15721R     DEF C1002
16753                     DEC -33
16754  42000     143X    A1001 JSX .CASE
16755                    A1003 EQU *
16755  66000   24627R     JMP A1088
16756                    C1089 EQU *
16756   1566   77566A     LDA V32630   KEYCODE
16757  22000    2520R     ADA =B-37
16760  66000   17263R     JMP A1090
16761                    C1091 EQU *
16761   1676   77676A     LDA V16 ILEDS
16762 170605              SAL 6
16763 172004             SAP A1093
16764   1601   77601A     LDA V32641   HPBC
16765 170601              SAL 2
16766 172402             SAM A1092
16767                    A1093 EQU *
16767  42000   12474R     JSM P744   UNITS
16770                    A1092 EQU *
16770  66000   17264R     JMP A1094
16771                    C1095 EQU *
16771   1601   77601A     LDA V32641   HPBC
16772  52000   17017R     AND =B171777
16773  31601   77601A     STA V32641   HPBC
16774  66000   17264R     JMP A1094
16775                    C1096 EQU *
16775   1601   77601A     LDA V32641   HPBC
16776  52000   17017R     AND =B171777
16777  62000    6703R     IOR =B2000
17000  31601   77601A     STA V32641   HPBC
17001  66000   17264R     JMP A1094
17002                    C1097 EQU *
17002  42000   12474R     JSM P744   UNITS
17003  66000   17264R     JMP A1094
17004                    C1098 EQU *
17004  42000   13045R     JSM P791   OHPB
17005  42000      24X     JSM P211   IHPIB
17006  31736   77736A     STA V32734   ETX
17007  66000   17264R     JMP A1094
17010                    C1099 EQU *
17010   1617   77617A     LDA V32655   DECFLG
17011  12000    1277R     CPA =B177777
17012  66000   17014R     JMP *+2
17013  66000   17020R     JMP A1100
17014   2000    1463R     LDA =D0
17015  31617   77617A     STA V32655   DECFLG
17016  66000   17032R     JMP A1101
17017 171777
17017                    LIT
17020                    A1100 EQU *
17020  42000      37X     JSX .LDBI
17021          77651A     DEF V32681   LTEMP
17022   6000    1457R     LDB =D1
17023  42000      47X     JSX .DRGT
17024  42000      34X     JSX .STRD
17025          77651A     DEF V32681   LTEMP
17026   1617   77617A     LDA V32655   DECFLG
17027 172003             SAP A1102
```

```
17030  22000    1457R    ADA =D1
17031  31617   77617A    STA V32655   DECFLG
17032                   A1102 EQU *
17032                   A1101 EQU *
17032   1611   77611A    LDA V32649   CHRC
17033 170040             TCA
17034 172012            SAP A1103
17035  55611   77611A    DSZ V32649   CHRC
17036                    NOP
17037   1737   77737A    LDA V32735   BLKS
17040  21612   77612A    ADA V32650   NCHR
17041  21611   77611A    ADA V32649   CHRC
17042   6000    2203R    LDB =D8
17043  42000      75X    JSX .*S4
17044   2000    2500R    LDA =D147
17045  42000      73X    JSX .*6
17046                   A1103 EQU *
17046   1611   77611A    LDA V32649   CHRC
17047  72010            RZA A1104
17050  42000      53X    JSX .LDS1
17051           1463R    DEF =D0
17052  42000      34X    JSX .STRD
17053          77651A    DEF V32681   LTEMP
17054   1616   77616A    LDA V32654   XFLAG
17055  62000    2644R    IOR =B10000
17056  31616   77616A    STA V32654   XFLAG
17057                   A1104 EQU *
17057  66000   17264R    JMP A1094
17060                   C1105 EQU *
17060  42000   12474R    JSM P744  UNITS
17061  66000   17264R    JMP A1094
17062                   C1106 EQU *
17062  42000   15224R    JSM P221   TRIGR
17063  66000   17264R    JMP A1094
17064                   C1107 EQU *
17064   1676   77676A    LDA V16 TLEDS
17065 170605             SAL 6
17066 172005            SAP A1108
17067  42000   15344R    JSM P971   USFT
17070   1616   77616A    LDA V32654   XFLAG
17071  62000   11310R    IOR =B400
17072  31616   77616A    STA V32654   XFLAG
17073                   A1108 EQU *
17073   5616   77616A    LDB V32654   XFLAG
17074 174606             SBL 7
17075   2000   17114R    LDA =B177742
17076 176402            SBM A1109
17077   2000    2647R    LDA =B177750
17100                   A1109 EQU *
17100  42000   14741R    JSM P929   ENTRY
17101  66000   17264R    JMP A1094
17102                   C1110 EQU *
17102   1676   77676A    LDA V16 TLEDS
17103 170605             SAL 6
17104 172011            SAP A1111
17105  42000   15344R    JSM P971   USFT
17106   1616   77616A    LDA V32654   XFLAG
17107  52000   11303R    AND =B177377
17110  31616   77616A    STA V32654   XFLAG
17111   2000    1463R    LDA =D0
17112  42000   14741R    JSM P929   ENTRY
17113  66000   17117R    JMP A1112
17114 177742
17114                    LIT
17115                   A1111 EQU *
17115   2000   14714R    LDA =B177747
17116  42000   14741R    JSM P929   ENTRY
17117                   A1112 EQU *
17117  66000   17264R    JMP A1094
17120                   C1113 EQU *
17120   2000    1463R    LDA =D0
17121  42000   14741R    JSM P929   ENTRY
17122  66000   17264R    JMP A1094
17123                   C1114 EQU *
17123   1676   77676A    LDA V16 TLEDS
17124 170605             SAL 6
17125 172006            SAP A1115
17126  42000   15344R    JSM P971   USFT
17127   2000   17132R    LDA =B177726
17130  42000   14741R    JSM P929   ENTRY
17131  66000   17206R    JMP A1116
17132 177726
17132                    LIT
17133                   A1115 EQU *
17133   2000   17230R    LDA =D441
17134  31613   77613A    STA V32651   DAC4
17135   6000    1463R    LDB =D0
17136  42000     112X    JSX .*S7
17137   2000    1463R    LDA =D0
17140  42000   14741R    JSM P929   ENTRY
17141  42000    2762R    JSM P314   AVGRSI
17142  42000     161X    JSX .MVE4
17143          17231R    DEF =F750000000
17144          77665A    DEF V8   CFREQ
17145  42000     161X    JSX .MVE4
17146          17235R    DEF =F1500000000
17147          77671A    DEF V9   SPAN
17150   2000    2107R    LDA =D3
17151  31731   77731A    STA V18 SINDEX
17152  31600   77600A    STA V32640   CTIM
```

```
17153    1675   77675A      LDA V15 BLEDS
17154   52000   17241R      AND =B177077
17155   31675   77675A      STA V15 BLEDS
17156    2000    2172R      LDA =D13
17157   42000    4210R      JSM P392   IFB*OUT
17160    2000    2172R      LDA =D13
17161   42000    4314R      JSM P400   VB*OUT
17162    1616   77616A      LDA V32654  XFLAG
17163   52000   15404R      AND =B177400
17164   62000    3654R      IOR =B20
17165   31616   77616A      STA V32654  XFLAG
17166    2000    2411R      LDA =D4
17167   31605   77605A      STA V32645  SCANSL
17170   42000      37X      JSX .LDBI
17171           17235R      DEF =F1500000000
17172   42000   11120R      JSM P668   SPAN*
17173   42000      37X      JSX .LDBI
17174           77665A      DEF V8  CFREQ
17175   42000    6750R      JSM P222   TUNE
17176   42000      37X      JSX .LDBI
17177            7555R      DEF =F20000
17200   42000    7345R      JSM P558   SCANT
17201   42000   15224R      JSM P221   TRIGR
17202    2000    1457R      LDA =D1
17203   42000   15313R      JSM P968   CFDF
17204    2000   10411R      LDA =B114
17205   42000   15546R      JSM P214   KEY
17206                     A1116 EQU *
17206   66000   17264R      JMP A1094
17207                     C1117 EQU *
17207   42000   12317R      JSM P733   CLRNUM
17210   42000   12302R      JSM P732   *KEY
17211    2000    1457R      LDA =D1
17212   31651   77651A      STA V32681  LTS
17213   42000   15344R      JSM P971   USFT
17214   66000   17264R      JMP A1094
17215                     C1118 EQU *
17215    1620   77620A      LDA V32656  PREFIX
17216   72407               SZA A1119
17217    1617   77617A      LDA V32655  DECFLG
17220   72005               RZA A1120
17221    2000    1277R      LDA =B177777
17222   31617   77617A      STA V32655  DECFLG
17223   42000   12317R      JSM P733   CLRNUM
17224   42000   12302R      JSM P732   *KEY
17225                     A1120 EQU *
17225                     A1119 EQU *
17225   66000   17264R      JMP A1094
17226                     C1121 EQU *
17226   42000   12474R      JSM P744   UNITS
17227   66000   17264R      JMP A1094
17230     671
17231 750000000
17235 1500000000
17241 177077
17230                       LIT
17242           17226R      DEF C1121
17243           17215R      DEF C1118
17244           17207R      DEF C1117
17245           17123R      DEF C1114
17246           17264R      DEF A1094
17247           17120R      DEF C1113
17250           17102R      DEF C1110
17251           17064R      DEF C1107
17252           17062R      DEF C1106
17253           17060R      DEF C1105
17254           17010R      DEF C1099
17255           17004R      DEF C1098
17256           17002R      DEF C1097
17257           16775R      DEF C1096
17260           16771R      DEF C1095
17261           16761R      DEF C1091
17262                       DEC -17
17263   42000     143X    A1090 JSX .CASE
17264                     A1094 EQU *
17264    1566   77566A      LDA V32630  KEYCODE
17265   22000   17330R      ADA =B-73
17266   66000   17506R      JMP A1122
17267                     C1123 EQU *
17267    1676   77676A      LDA V16 TLEDS
17270 170605                SAL 6
17271 172003                SAP A1124
17272    2000   10241R      LDA =B177743
17273   42000   14741R      JSM P929   ENTRY
17274                     A1124 EQU *
17274   42000   15344R      JSM P971   USFT
17275    1677   77677A      LDA V17 RFAT
17276   52000    1375R      AND =B177767
17277   31677   77677A      STA V17 RFAT
17300    6000    1704R      LDB =D6
17301   42000     171X      JSX .RS4
17302   31573   77573A      STA V32635  I
17303   42000     104X      JSX .TURN
17304           17331R      DEF =B30000
17305           77730A      DEF V30 KFLAG
17306   31730   77730A      STA V30 KFLAG
17307    1700   77700A      LDA V22 RLVL
17310   42000    3530R      JSM P355   REFLEV
17311    1426   77426A      LDA V32534  UFLAG
17312   70540               P*C A
```

```
8103 17313  42000   3255R    JSM P337  WREAT
8104 17314  70760            WWC A
8105 17315  31426  77426A    STA V32534  UFLAG
8106 17316  42000   2650R    JSM P304  UNCAL
8107 17317  42000   2551R    JSM P298  ABLK
8108 17320  66000  17507R    JMP A1125
8109 17321                  C1126 EQU *
8110 17321   1676  77676A    LDA V16 TLEDS
8111 17322 170605            SAL 6
8112 17323 172007            SAP A1127
8113 17324  42000  15344R    JSM P971  USFT
8114 17325   2000   2520R    LDA =B177741
8115 17326  42000  14741R    JSM P929  ENTRY
8116 17327  66000  17427R    JMP A1128
     17330 177705
     17331  30000
8117 17330                   LIT
8118 17332                  A1127 EQU *
8119 17332  42000  10323R    JSM P626  MRKRUK
8120 17333 172402            SAM *+2
8121 17334  66000  17410R    JMP A1129
8122 17335   1605  77605A    LDA V32645  SCANSL
8123 17336  72002            RZA *+2
8124 17337  66000  17410R    JMP A1129
8125 17340   1723  77723A    LDA V26 MKRMODE
8126 17341  72003            RZA A1130
8127 17342   2000  17407R    LDA =B115
8128 17343  42000  15546R    JSM P214  KEY
8129 17344                  A1130 EQU *
8130 17344   1730  77730A    LDA V30 KFLAG
8131 17345 170612            SAL 11
8132 17346  61675  77675A    IOR V15 BLEDS
8133 17347 170140            CMA
8134 17350  42000    104X    JSX .TURN
8135 17351           1770R    DEF =B20000
8136 17352          77675A    DEF V15 BLEDS
8137 17353  31675  77675A    STA V15 BLEDS
8138 17354   1723  77723A    LDA V26 MKRMODE
8139 17355  42000    121X    JSX MOD4
8140 17356           2107R    DEF =D3
8141 17357  22000   7565R    ADA =D18
8142 17360  70540            PWC A
8143 17361   1675  77675A    LDA V15 BLEDS
8144 17362 170601            SAL 2
8145 17363 170516            SAR 15
8146 17364   6000   2107R    LDB =D3
8147 17365  75617            MPY
8148 17366  42000     57X    JSX ADD4T
8149 17367  31723  77723A    STA V26 MKRMODE
8150 17370   1426  77426A    LDA V32534  UFLAG
8151 17371  62000   1364R    IOR =B100
8152 17372  31426  77426A    STA V32534  UFLAG
8153 17373   1576  77576A    LDA V32638  RPGPTR
8154 17374  12000   7565R    CPA =D18
8155 17375  66000  17377R    JMP *+2
8156 17376  66000  17401R    JMP A1131
8157 17377   1723  77723A    LDA V26 MKRMODE
8158 17400  42000  14741R    JSM P929  ENTRY
8159 17401                  A1131 EQU *
8160 17401   2000   2521R    LDA =D17
8161 17402  42000   2434R    JSM P285  BLKOF
8162 17403  42000   7775R    JSM P603  CSCANBW
8163 17404  42000  10413R    JSM P636  MKRON
8164 17405  42000  12334R    JSM P217  MBLK
8165 17406  66000  17427R    JMP A1132
     17407    115
8166 17407                   LIT
8167 17410                  A1129 EQU *
8168 17410   1675  77675A    LDA V15 BLEDS
8169 17411 170601            SAL 2
8170 17412 172015            SAP A1133
8171 17413   1723  77723A    LDA V26 MKRMODE
8172 17414  42000    121X    JSX MOD4
8173 17415           2107R    DEF =D3
8174 17416  22000   7565R    ADA =D18
8175 17417  31723  77723A    STA V26 MKRMODE
8176 17420   1675  77675A    LDA V15 BLEDS
8177 17421  52000  16171R    AND =B157777
8178 17422  31675  77675A    STA V15 BLEDS
8179 17423   2000   2521R    LDA =D17
8180 17424  42000   2434R    JSM P285  BLKOF
8181 17425  42000  10413R    JSM P636  MKRON
8182 17426  42000   7775R    JSM P603  CSCANBW
8183 17427                  A1133 EQU *
8184 17427                  A1132 EQU *
8185 17427                  A1128 EQU *
8186 17427  66000  17507R    JMP A1125
8187 17430                  C1134 EQU *
8188 17430   1676  77676A    LDA V16 TLEDS
8189 17431 170605            SAL 6
8190 17432 172003            SAP A1135
8191 17433   2000  10241R    LDA =B177743
8192 17434  42000  14741R    JSM P929  ENTRY
8193 17435                  A1135 EQU *
8194 17435  42000  15344R    JSM P971  USFT
8195 17436   1677  77677A    LDA V17 REAT
8196 17437  62000   2203R    IOR =B10
8197 17440  31677  77677A    STA V17 REAT
8198 17441   6000   1704R    LDB =D6
8199 17442  42000    171X    JSX .RS4
```

```
17443  31573  77573A      STA V32635  I
17444 170501              SAR 2
17445  42000    104X      JSX .TURN
17446         17331R      DEF =B30000
17447         77730A      DEF V30 KFLAG
17450  31730  77730A      STA V30 KFLAG
17451   1700  77700A      LDA V22 RLVL
17452  42000   3530R      JSM P355   REFLEV
17453   1426  77426A      LDA V32534   UFLAG
17454  70540              P*C A
17455  42000   3255R      JSM P337   WRFAT
17456  70760              W*C A
17457  31426  77426A      STA V32534   UFLAG
17460  42000   2650R      JSM P304   UNCAL
17461  42000   2551R      JSM P298   ABLK
17462  66000  17507R      JMP A1125
17463               C1136 EQU *
17463   1601  77601A      LDA V32641   HPBC
17464  62000   4534R      IOR =B40000
17465  31601  77601A      STA V32641   HPBC
17466  42000    161X      JSX .MVE4
17467         77651A      DEF V32681   LTEMP
17470         77621A      DEF V32657   MANT
17471   2000  15047R      LDA =B145
17472  31566  77566A      STA V32630   KEYCODE
17473  42000  12302R      JSM P732  WKEY
17474  42000     53X      JSX .LDS1
17475          1463R      DEF =D0
17476  42000     34X      JSX .STRD
17477         77651A      DEF V32681   LTEMP
17500  66000  17507R      JMP A1125
17501         17463R      DEF C1136
17502         17430R      DEF C1134
17503         17321R      DEF C1126
17504         17267R      DEF C1123
17505                     DEC -5
17506  42000    143X A1122 JSX .CASE
17507               A1125 EQU *
17507  66000  24627R      JMP A1088
17510               C1137 EQU *
17510   1676  77676A      LDA V16 TLEDS
17511 170605              SAL 6
17512 172002              SAP *+2
17513  66000  20573R      JMP A1138
17514   1566  77566A      LDA V32630   KEYCODE
17515  22000  20421R      ADA =B-100
17516  66000  20571R      JMP A1139
17517               C1140 EQU *
17517   1675  77675A      LDA V15 BLEDS
17520  52000   6512R      AND =B177677
17521  31675  77675A      STA V15 BLEDS
17522  42000   7775R      JSM P603   CSCANBW
17523   2000   1457R      LDA =D1
17524  42000  15133R      JSM P947   TRNOFF
17525  66000  20572R      JMP A1141
17526               C1142 EQU *
17526   1675  77675A      LDA V15 BLEDS
17527  52000  13044R      AND =B177577
17530  31675  77675A      STA V15 BLEDS
17531  42000   7775R      JSM P603   CSCANBW
17532   2000   2276R      LDA =D2
17533  42000  15133R      JSM P947   TRNOFF
17534  66000  20572R      JMP A1141
17535               C1143 EQU *
17535   1675  77675A      LDA V15 BLEDS
17536  52000  11303R      AND =B177377
17537  31675  77675A      STA V15 BLEDS
17540  42000   7775R      JSM P603   CSCANBW
17541   2000   2107R      LDA =D3
17542  42000  15133R      JSM P947   TRNOFF
17543  66000  20572R      JMP A1141
17544               C1144 EQU *
17544   1675  77675A      LDA V15 BLEDS
17545  52000  15350R      AND =B176777
17546  31675  77675A      STA V15 BLEDS
17547   1700  77700A      LDA V22 RLVL
17550  42000   3530R      JSM P355   REFLEV
17551   2000   2411R      LDA =D4
17552  42000  15133R      JSM P947   TRNOFF
17553  66000  20572R      JMP A1141
17554               C1145 EQU *
17554   1675  77675A      LDA V15 BLEDS
17555  52000   5521R      AND =B175777
17556  31675  77675A      STA V15 BLEDS
17557   2000   2565R      LDA =D11
17560  42000  15133R      JSM P947   TRNOFF
17561   2000   2565R      LDA =D11
17562  42000   2434R      JSM P285   BLKOF
17563  66000  20572R      JMP A1141
17564               C1146 EQU *
17564   1675  77675A      LDA V15 BLEDS
17565  62000   1364R      IOR =B100
17566  31675  77675A      STA V15 BLEDS
17567   2000   1457R      LDA =D1
17570  42000  14741R      JSM P929   ENTRY
17571  66000  20572R      JMP A1141
17572               C1147 EQU *
17572   1675  77675A      LDA V15 BLEDS
17573  62000   2410R      IOR =B200
17574  31675  77675A      STA V15 BLEDS
```

```
17575   2000    2276R     LDA =D2
17576  42000   14741R     JSM P929  ENTRY
17577  66000   20572R     JMP A1141
17600                   C1148 EQU *
17600   1675   77675A     LDA V15 BLEDS
17601  62000   11310R     IOR =B400
17602  31675   77675A     STA V15 BLEDS
17603   2000    2107R     LDA =D3
17604  42000   14741R     JSM P929  ENTRY
17605  66000   20572R     JMP A1141
17606                   C1149 EQU *
17606   1675   77675A     LDA V15 BLEDS
17607  62000    1300R     IOR =B1000
17610  31675   77675A     STA V15 BLEDS
17611   2000    2411R     LDA =D4
17612  42000   14741R     JSM P929  ENTRY
17613  66000   20572R     JMP A1141
17614                   C1150 EQU *
17614   1675   77675A     LDA V15 BLEDS
17615  62000    6703R     IOR =B2000
17616  31675   77675A     STA V15 BLEDS
17617   2000    2565R     LDA =D11
17620  42000   14741R     JSM P929  ENTRY
17621  66000   20572R     JMP A1141
17622                   C1151 EQU *
17622  42000   10323R     JSM P626  MRKROK
17623 172402              SAM *+2
17624  66000   17666R     JMP A1152
17625   2000    4256R     LDA =B170000
17626  31722   77722A     STA V29 MKRLVL
17627   2000    1457R     LDA =D1
17630  31721   77721A     STA V25 MRKR
17631  42000   10336R     JSM P627  MKRAD
17632   2000   20422R     LDA =B176027
17633  70540              PWC A
17634   2000    1457R     LDA =D1
17635                   A1153 EQU *
17635  31572   77572A     STA V32634  J
17636  42000     162X     JSX .R5
17637  31573   77573A     STA V32635  I
17640 170604              SAL 5
17641 170404              AAR 5
17642  31573   77573A     STA V32635  I
17643 170040              TCA
17644  21722   77722A     ADA V29 MKRLVL
17645 172005             SAP A1154
17646   1573   77573A     LDA V32635  I
17647  31722   77722A     STA V29 MKRLVL
17650   1572   77572A     LDA V32634  J
17651  31721   77721A     STA V25 MRKR
17652                   A1154 EQU *
17652   2000    1457R     LDA =D1
17653  21572   77572A     ADA V32634  J
17654 144016      16A     ISZ C,I
17655  66000   17635R     JMP A1153
17656  54016      16A     DSZ C
17657   1723   77723A     LDA V26 MKRMODE
17660  72003             RZA A1155
17661   2000    7565R     LDA =D18
17662  31723   77723A     STA V26 MKRMODE
17663                   A1155 EQU *
17663   1721   77721A     LDA V25 MRKR
17664  42000   11010R     JSM P663  STMRKR
17665  42000   10301R     JSM P624  MKRACT
17666                   A1152 EQU *
17666  66000   20572R     JMP A1141
17667                   C1156 EQU *
17667   2000    3166R     LDA =D1023
17670  31721   77721A     STA V25 MRKR
17671   1723   77723A     LDA V26 MKRMODE
17672  42000   15133R     JSM P947  TRNOFF
17673   2000    2521R     LDA =D17
17674  42000    2434R     JSM P285  BLKOF
17675   2000    7565R     LDA =D18
17676  42000    2434R     JSM P285  BLKOF
17677   2000    3042R     LDA =D37
17700  42000   15133R     JSM P947  TRNOFF
17701   2000   10141R     LDA =D38
17702  42000   15133R     JSM P947  TRNOFF
17703   2000    2477R     LDA =D36
17704  42000   15133R     JSM P947  TRNOFF
17705   1616   77616A     LDA V32654  XFLAG
17706  52000    2302R     AND =B26
17707  22000    6231R     ADA =B177754
17710  72004             RZA A1157
17711  42000      37X     JSX .LDB1
17712          77665A     DEF V8  CFREQ
17713  42000    6016R     JSM P500  STUNE
17714                   A1157 EQU *
17714   1616   77616A     LDA V32654  XFLAG
17715  52000    1704R     AND =D6
17716  22000    1363R     ADA =B177774
17717   4000              LDB A
17720   2000   20423R     LDA =B21016
17721  76402             SZB A1158
17722   2000   20424R     LDA =B21010
17723                   A1158 EQU *
17723  70540              PWC A
17724   2000    1463R     LDA =D0
17725  42000     104X     JSX .TURN
```

```
17726                      NOP
17727            77616A    DEF V32654   XFLAG
17730  31616     77616A    STA V32654   XFLAG
17731   2000      1463R    LDA =D0
17732  31723     77723A    STA V26 MKRMODE
17733   1740     77740A    LDA V32736   EFLAG
17734  52000      2644R    AND =B10000
17735 170600               SAL 1
17736  61601     77601A    IOR V32641   HPBC
17737  31601     77601A    STA V32641   HPBC
17740   1740     77740A    LDA V32736   EFLAG
17741  52000     20425R    AND =B167774
17742  31740     77740A    STA V32736   EFLAG
17743   2000      2221R    LDA =D9
17744  70540               PWC A
17745   2000      1457R    LDA =D1
17746  42000     10713R    JSM P656   GRAT
17747   1675     77675A    LDA V15 BLEDS
17750  31573     77573A    STA V32635   I
17751   1675     77675A    LDA V15 BLEDS
17752  52000     20426R    AND =B117767
17753  31675     77675A    STA V15 BLEDS
17754   1573     77573A    LDA V32635   I
17755 170613               SAL 12
17756 172002              SAP A1159
17757  42000     15117R    JSM P943   SMODE
17760                    A1159 EQU *
17760  42000      7775R    JSM P603   CSCANBW
17761  66000     20572R    JMP A1141
17762                    C1160 EQU *
17762  42000     10323R    JSM P626   MRKROK
17763 172030              SAP A1161
17764   1675     77675A    LDA V15 BLEDS
17765 170601               SAL 2
17766  70540               PWC A
17767   1605     77605A    LDA V32645   SCANSL
17770  42000       135X    JSX .NEQL
17771  42000       154X    JSX .ANDI
17772 170516               SAR 15
17773   6000      2107R    LDB =D3
17774  75617               MPY
17775  22000      7565R    ADA =D18
17776  31723     77723A    STA V26 MKRMODE
17777   2000     20427R    LDA =B173
20000  42000     15546R    JSM P214   KEY
20001   2000      2521R    LDA =D17
20002  42000      2434R    JSM P285   BLKOF
20003  42000     10413R    JSM P636   MKRON
20004   1723     77723A    LDA V26 MKRMODE
20005  42000     14741R    JSM P929   ENTRY
20006  42000     12334R    JSM P217   MBLK
20007   2000      2221R    LDA =D9
20010  70540               PWC A
20011   2000      2406R    LDA =D7
20012  42000     10713R    JSM P656   GRAT
20013                    A1161 EQU *
20013  66000     20572R    JMP A1141
20014                    C1162 EQU *
20014   1723     77723A    LDA V26 MKRMODE
20015  72425              SZA A1163
20016  42000     10323R    JSM P626   MRKROK
20017 172023              SAP A1163
20020  42000      2762R    JSM P314   AVGRST
20021  42000     10312R    JSM P218   MKREL
20022 172004              SAP A1164
20023  42000        37X    JSX .LDBI
20024            77724A    DEF V10 AMF
20025  66000     20030R    JMP A1165
20026                    A1164 EQU *
20026  42000        53X    JSX .LDSI
20027             1463R    DEF =D0
20030                    A1165 EQU *
20030  42000       150X    JSX ADD2
20031            77645A    DEF V32677   MFREQ
20032  42000      6750R    JSM P222   TUNE
20033   2000     10522R    LDA =D501
20034  31721     77721A    STA V25 MRKR
20035   1426     77426A    LDA V32534   UFLAG
20036  62000      1364R    IOR =B100
20037  31426     77426A    STA V32534   UFLAG
20040  42000      2650R    JSM P304   UNCAL
20041  42000     12334R    JSM P217   MBLK
20042                    A1163 EQU *
20042  66000     20572R    JMP A1141
20043                    C1166 EQU *
20043  42000     10323R    JSM P626   MRKROK
20044 172402               SAM *+2
20045  66000     20150R    JMP A1167
20046   1723     77723A    LDA V26 MKRMODE
20047  72003              RZA A1168
20050   2000     17407R    LDA =B115
20051  42000     15546R    JSM P214   KEY
20052                    A1168 EQU *
20052   2000     20427R    LDA =B173
20053  42000     15546R    JSM P214   KEY
20054  42000     10312R    JSM P218   MKREL
20055 172005              SAP A1170
20056   1723     77723A    LDA V26 MKRMODE
20057  11620     77620A    CPA V32656   PREFIX
20060  66000     20062R    JMP *+2
```

```
20061  66000  20145R     JMP A1169
20062                   A1170 EQU *
20062  42000  10312R     JSM P218   MKREL
20063 172006             SAP A1171
20064  42000     37X     JSX .LDBI
20065         77724A     DEF V10 AMF
20066  42000    150X     JSX ADD2
20067         77645A     DEF V32677   MFREQ
20070  66000  20073R     JMP A1172
20071                   A1171 EQU *
20071  42000     37X     JSX .LDBI
20072         77645A     DEF V32677   MFREQ
20073                   A1172 EQU *
20073  42000     34X     JSX .STRD
20074         77724A     DEF V10 AMF
20075  42000     53X     JSX .LDS1
20076           1463R     DEF =D0
20077  42000     34X     JSX .STRD
20100         77645A     DEF V32677   MFREQ
20101   1675  77675A     LDA V15 BLEDS
20102 170601             SAL 2
20103  70540             PWC A
20104   1605  77605A     LDA V32645   SCANSL
20105  42000    135X     JSX .NEQL
20106  42000    154X     JSX .ANDT
20107 170516             SAR 15
20110   6000   2107R     LDB =D3
20111  75617             MPY
20112  22000   2301R     ADA =D19
20113  31723  77723A     STA V26 MKRMODE
20114   1721  77721A     LDA V25 MRKR
20115  31717  77717A     STA V28 AMKR
20116   1722  77722A     LDA V29 MKRLVL
20117  31720  77720A     STA V27 AMLVL
20120   2000   2521R     LDA =D17
20121  42000   2434R     JSM P285   BLKOF
20122  42000  10413R     JSM P636   MKRON
20123   2000   2153R     LDA =B177773
20124  70540             PWC A
20125   2000  10706R     LDA =D2050
20126                   A1173 EQU *
20126  31573  77573A     STA V32635   I
20127   6000   2203R     LDB =D6
20130  42000     75X     JSX .WS4
20131  42000    162X     JSX .R5
20132  31572  77572A     STA V32634   J
20133   1573  77573A     LDA V32635   I
20134  22000   2405R     ADA =D5
20135  42000    103X     JSX .W4
20136   1572  77572A     LDA V32634   J
20137  42000     73X     JSX .W6
20140   2000   1457R     LDA =D1
20141  21573  77573A     ADA V32635   I
20142 144016     16A     ISZ C,I
20143  66000  20126R     JMP A1173
20144  54016     16A     DSZ C
20145                   A1169 EQU *
20145   1723  77723A     LDA V26 MKRMODE
20146  42000  14741R     JSM P929   ENTRY
20147  42000  12334R     JSM P217   MBLK
20150                   A1167 EQU *
20150  66000  20572R     JMP A1141
20151                   C1174 EQU *
20151  42000  10323R     JSM P626   MRKROK
20152 172012             SAP A1175
20153   2000  20427R     LDA =B173
20154  42000  15546R     JSM P214   KEY
20155   2000  17407R     LDA =B115
20156  42000  15546R     JSM P214   KEY
20157   1723  77723A     LDA V26 MKRMODE
20160  22000   2276R     ADA =D2
20161  31723  77723A     STA V26 MKRMODE
20162  42000  14741R     JSM P929   ENTRY
20163  42000  12334R     JSM P217   MBLK
20164                   A1175 EQU *
20164  66000  20572R     JMP A1141
20165                   C1176 EQU *
20165   1723  77723A     LDA V26 MKRMODE
20166  72416             SZA A1177
20167  42000  10323R     JSM P626   MRKROK
20170 172014             SAP A1177
20171  42000     37X     JSX .LDBI
20172         77645A     DEF V32677   MFREQ
20173   4020     20A     LDB AR2
20174  77202             SLB *+2,C
20175  34020     20A     STB AR2
20176  42000     34X     JSX .STRD
20177         77713A     DEF V7   FSTEP
20200   1675  77675A     LDA V15 BLEDS
20201  62000   6703R     IOR =B2000
20202  31675  77675A     STA V15 BLEDS
20203  42000  12334R     JSM P217   MBLK
20204                   A1177 EQU *
20204  66000  20572R     JMP A1141
20205                   C1178 EQU *
20205   1723  77723A     LDA V26 MKRMODE
20206  72433             SZA A1179
20207  42000  10323R     JSM P626   MRKROK
20210 172031             SAP A1179
20211   1722  77722A     LDA V29 MKRLVL
```

```
20212   42000    4471R   JSM P410   DBMNV
20213   42000      34X   JSX .STRD
20214           77655A   DEF V32685  LTEMP2
20215    1730   77730A   LDA V30 KFLAG
20216  170515            SAR 14
20217   12000    2107R   CPA =D3
20220   66000   20222R   JMP *+2
20221   66000   20224R   JMP A1180
20222   42000    2001R   JSM P251   DBM
20223   66000   20224R   JMP A1181
20224                  A1180 EQU *
20224                  A1181 EQU *
20224   42000      50X   JSX CNV24
20225   70540            PWC A
20226    1435   77435A   LDA V32541   IF1
20227  170140            CMA
20230  170516            SAR 15
20231    6000    2405R   LDB =D5
20232   75617            MPY
20233   42000      57X   JSX ADD4T
20234   42000    3530R   JSM P355   REFLEV
20235   42000    2762R   JSM P314   AVGRST
20236   42000   12334R   JSM P217   MBLK
20237    2000    4470R   LDA =D1000
20240   31722   77722A   STA V29 MKRLVL
20241                  A1179 EQU *
20241   66000   20572R   JMP A1141
20242                  C1182 EQU *
20242    1723   77723A   LDA V26 MKRMODE
20243   72414            SZA A1183
20244   42000   10323R   JSM P626   MRKROK
20245  172012            SAP A1183
20246    1675   77675A   LDA V15 BLEDS
20247  170140            CMA
20250   42000     104X   JSX .TURN
20251            4534R   DEF =B40000
20252           77675A   DEF V15 BLEDS
20253   31675   77675A   STA V15 BLEDS
20254  170140            CMA
20255    6000    2276R   LDB =D2
20256   42000      75X   JSX .WS4
20257                  A1183 EQU *
20257   66000   20572R   JMP A1141
20260                  C1184 EQU *
20260    2000    1277R   LDA =B177777
20261   31574   77574A   STA V32636   RPG
20262    1616   77616A   LDA V32654   XFLAG
20263   62000    1457R   IOR =D1
20264   31616   77616A   STA V32654   XFLAG
20265   66000   20572R   JMP A1141
20266                  C1185 EQU *
20266    2000    1457R   LDA =D1
20267   31574   77574A   STA V32636   RPG
20270    1616   77616A   LDA V32654   XFLAG
20271   62000    1457R   IOR =D1
20272   31616   77616A   STA V32654   XFLAG
20273   66000   20572R   JMP A1141
20274                  C1186 EQU *
20274    2000    2406R   LDA =D7
20275   42000   14741R   JSM P929   ENTRY
20276    1675   77675A   LDA V15 BLEDS
20277   73003            SLA A1187
20300    2000    1463R   LDA =D0
20301   42000   15313R   JSM P968   CFDF
20302                  A1187 EQU *
20302   66000   20572R   JMP A1141
20303                  C1188 EQU *
20303    2000    2203R   LDA =D8
20304   42000   14741R   JSM P929   ENTRY
20305    1675   77675A   LDA V15 BLEDS
20306   73003            SLA A1189
20307    2000    1463R   LDA =D0
20310   42000   15313R   JSM P968   CFDF
20311                  A1189 EQU *
20311   66000   20572R   JMP A1141
20312                  C1190 EQU *
20312    2000    2221R   LDA =D9
20313   42000   14741R   JSM P929   ENTRY
20314    1675   77675A   LDA V15 BLEDS
20315   73403            RLA A1191
20316    2000    1457R   LDA =D1
20317   42000   15313R   JSM P968   CFDF
20320                  A1191 EQU *
20320   66000   20572R   JMP A1141
20321                  C1192 EQU *
20321    2000    2204R   LDA =D10
20322   42000   14741R   JSM P929   ENTRY
20323    1675   77675A   LDA V15 BLEDS
20324   73403            RLA A1193
20325    2000    1457R   LDA =D1
20326   42000   15313R   JSM P968   CFDF
20327                  A1193 EQU *
20327   66000   20572R   JMP A1141
20330                  C1194 EQU *
20330    2000    2405R   LDA =D5
20331   42000   14741R   JSM P929   ENTRY
20332   66000   20572R   JMP A1141
20333                  C1195 EQU *
20333    2000    6514R   LDA =B77777
20334    6000    2276R   LDB =D2
```

```
20335  42000    107X   JSX .WS5
20336   2000   2411R   LDA =D4
20337  42000   3214R   JSM P332  WAIT
20340   2000  10242R   LDA =B177745
20341  42000  14741R   JSM P929  ENTRY
20342   1565  77565A   LDA V32629  SRQEN
20343   6000   2276R   LDB =D2
20344  42000    107X   JSX .WS5
20345   2000   2411R   LDA =D4
20346  42000   3214R   JSM P332  WAIT
20347  66000  20572R   JMP A1141
20350                C1196 EQU *
20350  42000  13045R   JSM P791  OHPB
20351  42000     24X   JSM P211  IHPIB
20352  31735  77735A   STA V32733  HPIB
20353  42000   7732R   JSM P599  FPNLON
20354   2000  14033R   LDA =D3012
20355   6000   2203R   LDB =D8
20356  42000     75X   JSX .WS4
20357   6000   1704R   LDB =D6
20360  42000    100X   JSX .WSTR
20361          1143R   DEF ="HP-IB ADRS: "
20362   1735  77735A   LDA V32733  HPIB
20363  22000   2205R   ADA =B40
20364  42000     73X   JSX .W6
20365   1735  77735A   LDA V32733  HPIB
20366  22000   1364R   ADA =B100
20367  42000     73X   JSX .W6
20370   2000   2205R   LDA =B40
20371  42000     73X   JSX .W6
20372   2000  20430R   LDA =D26
20373  42000  14055R   JSM P216  MESSAGE
20374  42000   2173R   JSM P271  CRLF
20375   6000   1704R   LDB =D6
20376  42000    100X   JSX .WSTR
20377         20431R   DEF ="REV 28.4.78"
20400   2000   2500R   LDA =D147
20401  42000     73X   JSX .W6
20402  66000  20572R   JMP A1141
20403                C1197 EQU *
20403   2000   2276R   LDA =D2
20404  42000   3046R   JSM P321  CLEAR
20405   1734  77734A   LDA V32732  CMOS
20406  12000  20440R   CPA =B123456
20407  66000  20411R   JMP *+2
20410  66000  20442R   JMP A1198
20411   1730  77730A   LDA V30 KFLAG
20412 170610           SAL 9
20413 172005           SAP A1199
20414   2000  14714R   LDA =B177747
20415  42000  14741R   JSM P929  ENTRY
20416   2000  20441R   LDA =B67
20417  42000  15546R   JSM P214  KEY
20420                A1199 EQU *
20420  66000  20525R   JMP A1200
20421 177700
20422 176027
20423  21016
20424  21010
20425 167774
20426 117767
20427    173
20430     32
20431 REV 28.4.78
20440 123456
20441     67
20421                LIT
20442                A1198 EQU *
20442   2000  15343R   LDA =D40
20443  42000   2501R   JSM P295  BLINK
20444   2000   7565R   LDA =D18
20445  31735  77735A   STA V32733  HPIB
20446   1616  77616A   LDA V32654  XFLAG
20447  52000  11303R   AND =B177377
20450  31616  77616A   STA V32654  XFLAG
20451   2000   5115R   LDA =B177771
20452  70540           PWC A
20453   2000   1457R   LDA =D1
20454                A1201 EQU *
20454  31474  77474A   STA V42 KL
20455  42000  24635R   JSM P220  SAVEM
20456   2000   1457R   LDA =D1
20457  21474  77474A   ADA V42 KL
20460 144016     16A   ISZ C,I
20461  66000  20454R   JMP A1201
20462  54016     16A   DSZ C
20463   2000  10241R   LDA =B177743
20464  70540           PWC A
20465   2000   1457R   LDA =D1
20466                A1202 EQU *
20466  31474  77474A   STA V42 KL
20467  42000     60X   JSX .ARAY
20470            15R   DEF V39 BWAMP
20471  70541           PWC B
20472   2000   1463R   LDA =D0
20473  42000    170X   JSX .STAC
20474   2000   1457R   LDA =D1
20475  21474  77474A   ADA V42 KL
20476 144016     16A   ISZ C,I
20477  66000  20466R   JMP A1202
```

```
20500  54016     16A        DSZ C
20501   2000  12014R        LDA =B177763
20502  70540                PWC A
20503   2000   2276R        LDA =D2
20504                 A1203 EQU *
20504  31474  77474A        STA V42 KL
20505  42000    133X        JSX .LRAY
20506                12R    DEF V37 BWFRQ
20507  70541                PWC B
20510  42000     53X        JSX .LDSI
20511          1463R        DEF =D0
20512  42000    172X        JSX .STBC
20513   2000   1457R        LDA =D1
20514  21474  77474A        ADA V42 KL
20515 144016     16A        ISZ C,I
20516  66000  20504R        JMP A1203
20517  54016     16A        DSZ C
20520   1740  77740A        LDA V32736  EFLAG
20521  52000   2067R        AND =B177757
20522  31740  77740A        STA V32736  EFLAG
20523   2000  20440R        LDA =B123456
20524  31734  77734A        STA V32732  CMOS
20525                 A1200 EQU *
20525   1735  77735A        LDA V32733  HPIB
20526 170600                SAL 1
20527  22000   1457R        ADA =D1
20530   6000   2411R        LDB =D4
20531  42000    112X        JSX .WS7
20532  66000  20572R        JMP A1141
20533         20403R        DEF C1197
20534         20350R        DEF C1196
20535         20333R        DEF C1195
20536         20330R        DEF C1194
20537         20321R        DEF C1192
20540         20312R        DEF C1190
20541         20303R        DEF C1188
20542         20274R        DEF C1186
20543         20266R        DEF C1185
20544         20260R        DEF C1184
20545         20242R        DEF C1182
20546         20205R        DEF C1178
20547         20165R        DEF C1176
20550         20151R        DEF C1174
20551         20043R        DEF C1166
20552         20014R        DEF C1162
20553         17762R        DEF C1160
20554         17667R        DEF C1156
20555         17622R        DEF C1151
20556         17614R        DEF C1150
20557         17606R        DEF C1149
20560         17600R        DEF C1148
20561         17572R        DEF C1147
20562         17564R        DEF C1146
20563         17554R        DEF C1145
20564         17544R        DEF C1144
20565         17535R        DEF C1143
20566         17526R        DEF C1142
20567         17517R        DEF C1140
20570                       DEC -30
20571  42000    143X  A1139 JSX .CASE
20572                 A1141 EQU *
20572  66000  22352R        JMP A1204
20573                 A1138 EQU *
20573   1566  77566A        LDA V32630  KEYCODE
20574  12000  13554R        CPA =B105
20575  66000  20577R        JMP A1205
20576  42000  15344R        JSM P971  USFT
20577                 A1205 EQU *
20577   1566  77566A        LDA V32630  KEYCODE
20600  22000  20421R        ADA =B-100
20601  66000  22351R        JMP A1206
20602                 C1207 EQU *
20602   2000   1463R        LDA =D0
20603  42000  15050R        JSM P223  AMPU
20604  42000   2551R        JSM P298  ABLK
20605  66000  22352R        JMP A1208
20606                 C1209 EQU *
20606   2000   4534R        LDA =B40000
20607  42000  15050R        JSM P223  AMPU
20610  42000   2551R        JSM P298  ABLK
20611  66000  22352R        JMP A1208
20612                 C1210 EQU *
20612   2000   5517R        LDA =B100000
20613  42000  15050R        JSM P223  AMPU
20614  42000   2551R        JSM P298  ABLK
20615  66000  22352R        JMP A1208
20616                 C1211 EQU *
20616   2000   4533R        LDA =B140000
20617  42000  15050R        JSM P223  AMPU
20620  42000   2551R        JSM P298  ABLK
20621  66000  22352R        JMP A1208
20622                 C1212 EQU *
20622   2000   7243R        LDA =B177764
20623  42000  14741R        JSM P929  ENTRY
20624   1620  77620A        LDA V32656  PREFIX
20625  42000   2223R        JSM P274  NBLK
20626   2000   2407R        LDA =D34
20627  42000     60X        JSX .ARAY
20630           210R        DEF V112  SFTXY
20631  31737  77737A        STA V32735  BLKS
```

```
20632   2000    2405R     LDA =D5
20633  31612   77612A     STA V32650  NCHR
20634  21737   77737A     ADA V32735  BLKS
20635  42000     103X     JSX .W4
20636   2000   17330R     LDA =B177705
20637  70540              PWC A
20640   2000    1457R     LDA =D1
20641                   A1213 EQU *
20641  31573   77573A     STA V32635  I
20642   2000    2500R     LDA =D147
20643  42000      73X     JSX .W6
20644   2000    1457R     LDA =D1
20645  21573   77573A     ADA V32635  I
20646 144016      16A     ISZ C,I
20647  66000   20641R     JMP A1213
20650  54016      16A     DSZ C
20651  66000   22352R     JMP A1208
20652                   C1214 EQU *
77626                   V1215 EQU V32661+1  CSIGB
77627                   V1216 EQU V32661+2  CSIGC
77630                   V1217 EQU V32661+3  CSIGD
20652   1616   77616A     LDA V32654  XFLAG
20653  70540              PWC A
20654  62000    2277R     IOR =B4000
20655  31616   77616A     STA V32654  XFLAG
20656  42000   15224R     JSM P221  TRIGR
20657  70760              WWC A
20660  31616   77616A     STA V32654  XFLAG
20661   2000    1463R     LDA =D0
20662  31626   77626A     STA V1215 CSIGB
20663  31625   77625A     STA V32661  CSIGA
20664   2000    4533R     LDA =B140000
20665   6000    1456R     LDB =D12
20666  42000      72X     JSX .WS6
20667   2000   15343R     LDA =D40
20670   6000    2405R     LDB =D5
20671  42000      75X     JSX .WS4
20672                   A1218 EQU *
20672  76302             SHS A1219
20673  66000   20672R     JMP A1218
20674                   A1219 EQU *
20674  42000     162X     JSX .R5
20675  31627   77627A     STA V1216 CSIGC
20676  42000     137X     JSX .R6
20677  31630   77630A     STA V1217 CSIGD
20700   2000    1457R     LDA =D1
20701  42000    3214R     JSM P332  WAIT
20702   2000   15667R     LDA =B177731
20703  42000   14741R     JSM P929  ENTRY
20704  66000   22352R     JMP A1208
20705                   C1220 EQU *
20705   2000   15701R     LDA =B177740
20706  42000   14741R     JSM P929  ENTRY
20707   1730   77730A     LDA V30 KFLAG
20710  62000    2411R     IOR =D4
20711  31730   77730A     STA V30 KFLAG
20712   2000   21176R     LDA =B175
20713  42000   15546R     JSM P214  KEY
20714   1676   77676A     LDA V16 TLEDS
20715  52000    6233R     AND =B600
20716  22000    6234R     ADA =B177200
20717  72405             SZA A1222
20720   1676   77676A     LDA V16 TLEDS
20721  52000   21177R     AND =B210
20722  22000   21200R     ADA =B177570
20723  72003             RZA A1221
20724                   A1222 EQU *
20724   2000   21201R     LDA =B152
20725  42000   15546R     JSM P214  KEY
20726                   A1221 EQU *
20726   1676   77676A     LDA V16 TLEDS
20727  52000   21202R     AND =B401
20730  22000   11303R     ADA =B177377
20731  72003             RZA A1223
20732   2000    3312R     LDA =B144
20733  42000   15546R     JSM P214  KEY
20734                   A1223 EQU *
20734   1676   77676A     LDA V16 TLEDS
20735  52000   21203R     AND =B411
20736  22000    1277R     ADA =B177777
20737  72003             RZA A1224
20740   2000   15132R     LDA =B141
20741  42000   15546R     JSM P214  KEY
20742                   A1224 EQU *
20742   1676   77676A     LDA V16 TLEDS
20743  52000   21204R     AND =B211
20744  22000    2066R     ADA =B177770
20745  72003             RZA A1225
20746   2000   21205R     LDA =B147
20747  42000   15546R     JSM P214  KEY
20750                   A1225 EQU *
20750   2000   21201R     LDA =B152
20751  42000     555R     JSM P215  SKEY
20752  42000   15117R     JSM P943  SMODE
20753  42000   15224R     JSM P221  TRIGR
20754  66000   22352R     JMP A1208
20755                   C1226 EQU *
20755   1730   77730A     LDA V30 KFLAG
20756 170614              SAL 13
20757 172014              SAP A1227
```

```
20760    2000   2205R    LDA =D32
20761   42000  15133R    JSM P947   IRNOFF
20762    2000   2205R    LDA =D32
20763   42000   2434R    JSM P285   BLKOF
20764    2000  21206R    LDA =B153
20765   42000    555R    JSM P215   SKEY
20766    1730  77730A    LDA V30 KFLAG
20767   52000   2153R    AND =B177773
20770   31730  77730A    STA V30 KFLAG
20771   42000  15117R    JSM P943   SMODE
20772   42000  15224R    JSM P221   TRIGR
20773                  A1227 EQU *
20773   66000  22352R    JMP A1208
20774                  C1228 EQU *
20774    1730  77730A    LDA V30 KFLAG
20775   62000   3654R    IOR =B20
20776   31730  77730A    STA V30 KFLAG
20777   66000  22352R    JMP A1208
21000                  C1229 EQU *
21000    2000   1463R    LDA =D0
21001   42000   3114R    JSM P326   WDACS
21002    2000   2172R    LDA =D13
21003   42000  14741R    JSM P929   ENTRY
21004   66000  22352R    JMP A1208
21005                  C1230 EQU *
21005    2000  17407R    LDA =B115
21006   42000  15546R    JSM P214   KEY
21007    1740  77740A    LDA V32736   EFLAG
21010   52000   1363R    AND =B177774
21011   62000   2276R    IOR =B2
21012   31740  77740A    STA V32736   EFLAG
21013   66000  22352R    JMP A1208
21014                  C1231 EQU *
21014    1723  77723A    LDA V26 MKRMODE
21015   72407           SZA A1232
21016    1675  77675A    LDA V15 BLEDS
21017   52000   1375R    AND =B177767
21020   31675  77675A    STA V15 BLEDS
21021   42000  15117R    JSM P943   SMODE
21022   42000  10413R    JSM P636   MKRON
21023   42000  10301R    JSM P624   MKRACT
21024                  A1232 EQU *
21024   66000  22352R    JMP A1208
21025                  C1233 EQU *
21025   42000  10323R    JSM P626   MRKROK
21026  172013           SAP A1234
21027    1723  77723A    LDA V26 MKRMODE
21030   72003           RZA A1235
21031    2000  17407R    LDA =B115
21032   42000  15546R    JSM P214   KEY
21033                  A1235 EQU *
21033    1675  77675A    LDA V15 BLEDS
21034   62000   2203R    IOR =B10
21035   31675  77675A    STA V15 BLEDS
21036   42000  15117R    JSM P943   SMODE
21037   42000  10413R    JSM P636   MKRON
21040   42000  10301R    JSM P624   MKRACT
21041                  A1234 EQU *
21041   66000  22352R    JMP A1208
21042                  C1236 EQU *
21042    2000  17407R    LDA =B115
21043   42000  15546R    JSM P214   KEY
21044    1740  77740A    LDA V32736   EFLAG
21045   52000   1363R    AND =B177774
21046   62000   2107R    IOR =B3
21047   31740  77740A    STA V32736   EFLAG
21050   66000  22352R    JMP A1208
21051                  C1237 EQU *
21051   42000  10312R    JSM P218   MKREL
21052  172025           SAP A1238
21053   42000  10323R    JSM P626   MRKROK
21054  172023           SAP A1238
21055   42000     37X    JSX .LDBI
21056          77645A    DEF V32677   MFREQ
21057    4020     20A    LDB AR2
21060   77202           SLB *+2,C
21061   34020     20A    STB AR2
21062   42000  11120R    JSM P668   SPANW
21063   42000     37X    JSX .LDBI
21064          77645A    DEF V32677   MFREQ
21065   42000    146X    JSX DIV3
21066           2276R    DEF =D2
21067   42000    150X    JSX ADD2
21070          77724A    DEF V10 AMF
21071   42000   6750R    JSM P222   TUNE
21072    2000  10522R    LDA =D501
21073   42000  11010R    JSM P663   STMRKR
21074   42000   2762R    JSM P314   AVGRST
21075    2000  17407R    LDA =B115
21076   42000  15546R    JSM P214   KEY
21077                  A1238 EQU *
21077   66000  22352R    JMP A1208
21100                  C1239 EQU *
21100    2000  21207R    LDA =B177746
21101   42000  14741R    JSM P929   ENTRY
21102   66000  22352R    JMP A1208
21103                  C1240 EQU *
21103    2000  17407R    LDA =B115
21104   42000  15546R    JSM P214   KEY
21105    1740  77740A    LDA V32736   EFLAG
```

```
21106  52000   1363R     AND =B177774
21107  62000   1457R     IOR =B1
21110  31740  77740A     STA V32736   EFLAG
21111  66000  22352R     JMP A1208
21112                  C1241 EQU *
21112   1616  77616A     LDA V32654   XFLAG
21113  62000   6703R     IOR =B2000
21114  31616  77616A     STA V32654   XFLAG
21115  66000  22352R     JMP A1208
21116                  C1242 EQU *
21116   1730  77730A     LDA V30 KFLAG
21117  52000   1363R     AND =B177774
21120  31730  77730A     STA V30 KFLAG
21121   2000  10141R     LDA =D38
21122  42000   2434R     JSM P285   BLKOF
21123  42000     37X     JSX .LDBI
21124         77665A     DEF V8   CFREQ
21125  42000   6750R     JSM P222   TUNE
21126  66000  22352R     JMP A1208
21127                  C1243 EQU *
21127   1730  77730A     LDA V30 KFLAG
21130  52000   1363R     AND =B177774
21131  62000   1457R     IOR =B1
21132  31730  77730A     STA V30 KFLAG
21133   2000  10141R     LDA =D38
21134  42000   2223R     JSM P274   NBLK
21135   2000  21210R     LDA =D172
21136  42000     73X     JSX .W6
21137   2000   2420R     LDA =D145
21140  42000     73X     JSX .W6
21141  42000     37X     JSX .LDBI
21142         77665A     DEF V8   CFREQ
21143  42000   6750R     JSM P222   TUNE
21144  66000  22352R     JMP A1208
21145                  C1244 EQU *
21145   1730  77730A     LDA V30 KFLAG
21146  52000   1363R     AND =B177774
21147  62000   2276R     IOR =B2
21150  31730  77730A     STA V30 KFLAG
21151   2000  10141R     LDA =D38
21152  42000   2223R     JSM P274   NBLK
21153   2000  21211R     LDA =B136
21154  42000     73X     JSX .W6
21155   2000   2420R     LDA =D145
21156  42000     73X     JSX .W6
21157  42000     37X     JSX .LDBI
21160         77665A     DEF V8   CFREQ
21161  42000   6750R     JSM P222   TUNE
21162  66000  22352R     JMP A1208
21163                  C1245 EQU *
21163   2000  21212R     LDA =B177735
21164  42000  14741R     JSM P929   ENTRY
21165  66000  22352R     JMP A1208
21166                  C1246 EQU *
21166  66000  21417R     JMP A1247
21167                  P1248 EQU * SLVL
21167 174517             CLB
21170  42000     56X     JSX .ARGS
21171  44016     16A     ISZ C
21172   1722  77722A     LDA V29 MKRLVL
21173  42000   4471R     JSM P410   DBMNV
21174  42000     50X     JSX CNV24
21175  66000     31X    JMX .RTNA
21176    175
21177    210
21200 177570
21201    152
21202    401
21203    411
21204    211
21205    147
21206    153
21207 177746
21210    254
21211    136
21212 177735
21176                    LIT
21213                  P1249 EQU * RFSET
21213   6000   1277R     LDB =D-1
21214  42000     27X     JSX .ARGA
21215  42000    104X     JSX .TURN
21216          2406R     DEF =D7
21217         77677A     DEF V17 RFAT
21220  31677  77677A     STA V17 RFAT
21221  42000   3255R     JSM P337   WRFAT
21222  66000     31X     JMX .RTNA
77467                  V1250 EQU T32542+25 A20
77466                  V1251 EQU T32542+24 A10
77465                  V1252 EQU T32542+23 A0
77460                  V1253 EQU T32542+18 SG50
77454                  V1254 EQU T32542+14 LOOFS
21223                  P1255 EQU * STLVL
21223  42000   2303R     JSM P277   GOFSET
21224  70540             PWC A
21225  42000   1665R     JSM P245   RLAD
21226  22000  21232R     ADA =D-70
21227  42000    116X     JSX SUB4T
21230  42000   3530R     JSM P355   REFLEV
21231 170201             RET 1
21232 177672
```

```
9175  21232                        LIT
9176  21233                      P1256 EQU * IKSCAN
9177  21233   2000    1463R        LDA =D0
9178  21234  31426   77426A        STA V32534  UFLAG
9179  21235  31620   77620A        STA V32656  PREFIX
9180  21236   2000   14033R        LDA =D3012
9181  21237   6000    2203R        LDB =D8
9182  21240  42000      75X        JSX .*S4
9183  21241   6000    1704R        LDB =D6
9184  21242  42000     100X        JSX .*STR
9185  21243          21301R        DEF ="CALIBRATING!"
9186  21244   2000    2500R        LDA =D147
9187  21245  42000      73X        JSX .*6
9188  21246   1675   77675A        LDA V15 BLEDS
9189  21247 170140                 CMA
9190  21250   6000    2276R        LDB =D2
9191  21251  42000      75X        JSX .*S4
9192  21252                      L1257 EQU * AGAIN
9193  21252   2000    6514R        LDA =B77777
9194  21253   6000    2276R        LDB =D2
9195  21254  42000     107X        JSX .*S5
9196  21255   2000    2107R        LDA =D3
9197  21256   6000    2107R        LDB =D3
9198  21257  42000      75X        JSX .*S4
9199  21260   2000    2405R        LDA =D5
9200  21261  42000     103X        JSX .*4
9201  21262   2000    7670R        LDA =B164
9202  21263  42000   15546R        JSM P214  KEY
9203  21264   1702   77702A        LDA V24 VIDCON
9204  21265   6000    2221R        LDB =D9
9205  21266  42000      75X        JSX .*S4
9206  21267   1703   77703A        LDA V21 STRIG
9207  21270   6000    1456R        LDB =D12
9208  21271  42000      72X        JSX .*S6
9209  21272   2000    1463R        LDA =D0
9210  21273   6000    2107R        LDB =D3
9211  21274  42000     107X        JSX .*S5
9212  21275   2000    1704R        LDA =D6
9213  21276  42000     103X        JSX .*4
9214  21277                      A1258 EQU *
9215  21277  76311                SHS A1259
9216  21300  66000   21277R        JMP A1258
      21301 CALIBRATING!
9217  21301                        LIT
9218  21310                      A1259 EQU *
9219  21310   6000    2276R        LDB =D2
9220  21311  42000     110X        JSX .RS7
9221  21312  31573   77573A        STA V32635   I
9222  21313  52000    2406R        AND =D7
9223  21314  72422                SZA A1260
9224  21315   2000   14033R        LDA =D3012
9225  21316   6000    2203R        LDB =D8
9226  21317  42000      75X        JSX .*S4
9227  21320   6000    1704R        LDB =D6
9228  21321  42000     100X        JSX .*STR
9229  21322          21326R        DEF ="CALIB ABORTED"
9230  21323   2000    2500R        LDA =D147
9231  21324  42000      73X        JSX .*6
9232  21325  66000   32476R        JMP L193  RESET
      21326 CALIB ABORTED
9233  21326                        LIT
9234  21336                      A1260 EQU *
9235  21336   2000   10412R        LDA =B113
9236  21337  42000   15546R        JSM P214  KEY
9237  21340   2000    2405R        LDA =D5
9238  21341   6000    2107R        LDB =D3
9239  21342  42000      75X        JSX .*S4
9240  21343   1675   77675A        LDA V15 BLEDS
9241  21344  62000    2411R        IOR =D4
9242  21345  31675   77675A        STA V15 BLEDS
9243  21346   1722   77722A        LDA V29 MKRLVL
9244  21347 170040                 TCA
9245  21350  22000   21367R        ADA =D1019
9246  21351 172404                 SAM A1262
9247  21352   1722   77722A        LDA V29 MKRLVL
9248  21353  22000   10712R        ADA =D-100
9249  21354 172025                 SAP A1261
9250  21355                      A1262 EQU *
9251  21355   2000   14033R        LDA =D3012
9252  21356   6000    2203R        LDB =D8
9253  21357  42000      75X        JSX .*S4
9254  21360   6000    1704R        LDB =D6
9255  21361  42000     100X        JSX .*STR
9256  21362          21370R        DEF ="ADJUST AMPTD CAL"
9257  21363   2000    2500R        LDA =D147
9258  21364  42000      73X        JSX .*6
9259  21365  42000    5350R        JSM P464  SRQM
9260  21366  66000   32476R        JMP L193  RESET
      21367   1773
      21370 ADJUST AMPTD CAL
9261  21367                        LIT
9262  21401                      A1261 EQU *
9263  21401   1721   77721A        LDA V25 MRKR
9264  21402  22000   21413R        ADA =D-500
9265  21403 172002                 SAP *+2
9266  21404 170040                 TCA
9267  21405 170040                 TCA
9268  21406  22000   21414R        ADA =D400
9269  21407 172007                 SAP A1263
9270  21410   2000   21415R        LDA =B116
```

```
21411  42000  15546R     JSM P214  KEY
21412  66000  21252R     JMP L1257 AGAIN
21413 177014
21414    620
21415    116
21413                   LIT
21416                   A1263 EQU *
21416 170201             RET 1
21417                   A1247 EQU *
21417   2000  22222R     LDA =D39
21420  42000   2434R     JSM P285   BLKOF
21421   2000  15132R     LDA =B141
21422  42000  15546R     JSM P214  KEY
21423   2000  22223R     LDA =B143
21424  42000  15546R     JSM P214  KEY
21425   1730  77730A     LDA V30 KFLAG
21426  70540             PWC A
21427   1706  77706A     LDA V31 ROFSET
21430  70540             PWC A
21431   1677  77677A     LDA V17 RFAT
21432  70540             PWC A
21433   1606  77606A     LDA V32646  SRCEID
21434  70540             PWC A
21435   2000   1463R     LDA =D0
21436  31606  77606A     STA V32646  SRCEID
21437   1677  77677A     LDA V17 RFAT
21440  52000   2131R     AND =B17
21441  62000  22224R     IOR =B174700
21442  31677  77677A     STA V17 RFAT
21443   1676  77676A     LDA V16 TLEDS
21444  52000  22225R     AND =B410
21445  72403             SZA A1264
21446   2000  21206R     LDA =B153
21447  42000  15546R     JSM P214  KEY
21450                   A1264 EQU *
21450   2000   7667R     LDA =B157
21451  42000  15546R     JSM P214  KEY
21452   2000   1463R     LDA =D0
21453  31706  77706A     STA V31 ROFSET
21454   2000   2723R     LDA =B54
21455  42000  15546R     JSM P214  KEY
21456   2000  22226R     LDA =B166
21457  42000  15546R     JSM P214  KEY
21460   2000  22227R     LDA =B106
21461  42000  15546R     JSM P214  KEY
21462   2000   1463R     LDA =D0
21463  42000  15313R     JSM P966  CFDF
21464   1730  77730A     LDA V30 KFLAG
21465  52000  22230R     AND =B37770
21466  31730  77730A     STA V30 KFLAG
21467  42000  15050R     JSM P223  AMPU
21470   2000  22231R     LDA =B104
21471  42000  15546R     JSM P214  KEY
21472   1740  77740A     LDA V32736  EFLAG
21473  52000  22232R     AND =B177703
21474  31740  77740A     STA V32736  EFLAG
21475   2000  22233R     LDA =B162
21476  42000  15546R     JSM P214  KEY
21477  42000  21223R     JSM P1255 STLVL
21500  42000     37X     JSX .LDBI
21501         11133R     DEF D673   20000000
21502  42000    150X     JSX ADD2
21503         77707A     DEF V11 FOFSET
21504  42000   6750R     JSM P222  TUNE
21505  42000     37X     JSX .LDBI
21506          6717R     DEF =F10000000
21507  42000  11120R     JSM P668  SPANW
21510   2000  22234R     LDA =B124
21511  42000    555R     JSM P215  SKEY
21512  42000  21233R     JSM P1256 TKSCAN
21513   2000   2172R     LDA =D13
21514  22000   2110R     ADA =B177776
21515  42000    113X     JSX DIV4
21516          1277R     DEF =B177777
21517  22000   1277R     ADA =B177777
21520  70540             PWC A
21521   2000   2172R     LDA =D13
21522                   A1265 EQU *
21522  31474  77474A     STA V42 KL
21523  42000   4210R     JSM P392  IFBWOUT
21524   1474  77474A     LDA V42 KL
21525  42000   4420R     JSM P407  EXP3
21526  42000    126X     JSX MPY3
21527          2405R     DEF =D5
21530  42000  11120R     JSM P668  SPANW
21531   2000   2405R     LDA =D5
21532  42000   3214R     JSM P332  WAIT
21533  42000  21233R     JSM P1256 TKSCAN
21534   1474  77474A     LDA V42 KL
21535  42000    133X     JSX .LRAY
21536            12R     DEF V37 BWFRQ
21537  70541             PWC B
21540  42000     37X     JSX .LDBI
21541         11133R     DEF D673   20000000
21542  42000    140X     JSX MIN2
21543         77645A     DEF V32677  MFREQ
21544  42000    145X     JSX SUB2
21545         77707A     DEF V11 FOFSET
21546  42000    172X     JSX .STBC
21547   1474  77474A     LDA V42 KL
```

```
21550  42000     60X   JSX .ARAY
21551            15R   DEF V39 BWAMP
21552  70541           PWC B
21553  42000   2303R   JSM P277  GOFSET
21554  70540           PWC A
21555  42000  21167R   JSM P1248 SLVL
21556  22000   4470R   ADA =D1000
21557  42000    116X   JSX SUB4T
21560  42000    170X   JSX .STAC
21561   1474  77474A   LDA V42 KL
21562  12000   2221R   CPA =D9
21563  66000  21567R   JMP A1267
21564  12000   2204R   CPA =D10
21565  66000  21567R   JMP *+2
21566  66000  21623R   JMP A1266
21567                A1267 EQU *
21567   2000  22235R   LDA =B161
21570  42000  15546R   JSM P214  KEY
21571   2000   4207R   LDA =B160000
21572  42000   4171R   JSM P390  LGDB
21573   2000   2405R   LDA =D5
21574  42000   3214R   JSM P332  WAIT
21575  42000  21233R   JSM P1256 TKSCAN
21576   6000   3526R   LDB =B177766
21577  25474  77474A   ADB V42 KL
21600   2000   3527R   LDA =D14
21601  76402           SZB A1268
21602   2000   1457R   LDA =D1
21603                A1268 EQU *
21603  42000     60X   JSX .ARAY
21604            15R   DEF V39 BWAMP
21605  70541           PWC B
21606  42000   2303R   JSM P277  GOFSET
21607  70540           PWC A
21610   1474  77474A   LDA V42 KL
21611  42000     60X   JSX .ARAY
21612            15R   DEF V39 BWAMP
21613  70541           PWC B
21614  42000  21167R   JSM P1248 SLVL
21615  42000    173X   JSX SUB4B
21616  22000   4470R   ADA =D1000
21617  42000    116X   JSX SUB4T
21620  42000    170X   JSX .STAC
21621   2000  22233R   LDA =B162
21622  42000  15546R   JSM P214  KEY
21623                A1266 EQU *
21623   1474  77474A   LDA V42 KL
21624  12000   2203R   CPA =D8
21625  66000  21627R   JMP *+2
21626  66000  21651R   JMP A1269
21627   2000   4627R   LDA =B125
21630  42000    555R   JSM P215  SKEY
21631   2000   2405R   LDA =D5
21632  42000   3214R   JSM P332  WAIT
21633  42000  21233R   JSM P1256 TKSCAN
21634  42000   2303R   JSM P277  GOFSET
21635  70540           PWC A
21636   2000   2203R   LDA =D8
21637  42000     60X   JSX .ARAY
21640            15R   DEF V39 BWAMP
21641  70541           PWC B
21642  42000  21167R   JSM P1248 SLVL
21643  22000   4470R   ADA =D1000
21644  42000    173X   JSX SUB4B
21645  42000    116X   JSX SUB4T
21646  31454  77454A   STA V1254 LOOFS
21647   2000  22234R   LDA =B124
21650  42000    555R   JSM P215  SKEY
21651                A1269 EQU *
21651   1474  77474A   LDA V42 KL
21652 170040           TCA
21653  22000   2276R   ADA =D2
21654 172003           SAP A1270
21655   2000  21415R   LDA =B116
21656  42000  15546R   JSM P214  KEY
21657                A1270 EQU *
21657   2000   1277R   LDA =B177777
21660  21474  77474A   ADA V42 KL
21661 144016     16A   ISZ C,I
21662  66000  21522R   JMP A1265
21663  54016     16A   DSZ C
21664   2000  22235R   LDA =B161
21665  42000  15546R   JSM P214  KEY
21666   2000   4207R   LDA =B160000
21667  42000   4171R   JSM P390  LGDB
21670   2000  22236R   LDA =B111
21671  42000  15546R   JSM P214  KEY
21672   2000   2411R   LDA =D4
21673  42000   4210R   JSM P392  IFBWOUT
21674  42000     53X   JSX .LDS1
21675          1300R   DEF =H200
21676  42000  11120R   JSM P668  SPANW
21677   2000   2405R   LDA =D5
21700  42000   3214R   JSM P332  WAIT
21701  42000  21233R   JSM P1256 TKSCAN
21702  42000  21167R   JSM P1248 SLVL
21703  31475  77475A   STA V43 KM
21704   2000   1363R   LDA =B177774
21705  70540           PWC A
21706   2000   1463R   LDA =D0
```

```
21707                     A1271 EQU *
21707  31474   77474A           STA V42 KL
21710  22000    2411R           ADA =D4
21711 170614                    SAL 13
21712  42000    4171R           JSM P390  LGDB
21713   2000    2405R           LDA =D5
21714  42000    3214R           JSM P332  WAIT
21715  42000   21233R           JSM P1256 TKSCAN
21716   1474   77474A           LDA V42 KL
21717 170040                    TCA
21720  22000    2416R           ADA =D29
21721  42000      60X           JSX .ARAY
21722              15R          DEF V39 BWAMP
21723  70541                    PWC B
21724  42000   21167R           JSM P1248 SLVL
21725 170040                    TCA
21726  21475   77475A           ADA V43 KM
21727 170040                    TCA
21730  42000     170X           JSX .STAC
21731   2000    1457R           LDA =D1
21732  21474   77474A           ADA V42 KL
21733 144016      16A           ISZ C,I
21734  66000   21707R           JMP A1271
21735  54016      16A           DSZ C
21736   2000   22233R           LDA =B162
21737  42000   15546R           JSM P214  KEY
21740   2000    2405R           LDA =D5
21741  42000    3214R           JSM P332  WAIT
21742  42000   21233R           JSM P1256 TKSCAN
21743  42000   21167R           JSM P1248 SLVL
21744  31475   77475A           STA V43 KM
21745   2000    1463R           LDA =D0
21746  31467   77467A           STA V1250 A20
21747   2000    2417R           LDA =B177772
21750  70540                    PWC A
21751   2000    2276R           LDA =D2
21752                     A1272 EQU *
21752  31474   77474A           STA V42 KL
21753  42000   21213R           JSM P1249 RFSET
21754  42000   21223R           JSM P1255 STLVL
21755   1474   77474A           LDA V42 KL
21756  12000    1704R           CPA =D6
21757  66000   21761R           JMP *+2
21760  66000   21766R           JMP A1273
21761   2000   22237R           LDA =B107
21762  42000   15546R           JSM P214  KEY
21763   2000    2276R           LDA =D2
21764  42000    4314R           JSM P400  VBWOUT
21765  42000    7775R           JSM P603  CSCANBW
21766                     A1273 EQU *
21766   2000    2405R           LDA =D5
21767  42000    3214R           JSM P332  WAIT
21770  42000   21233R           JSM P1256 TKSCAN
21771   1474   77474A           LDA V42 KL
21772 170040                    TCA
21773  22000   10243R           ADA =D27
21774  42000      60X           JSX .ARAY
21775              15R          DEF V39 BWAMP
21776  70541                    PWC B
21777   1677   77677A           LDA V17 RFAT
22000  42000       7X           JSM P198  ATNER
22001  70540                    PWC A
22002  42000   21167R           JSM P1248 SLVL
22003 170040                    TCA
22004  21475   77475A           ADA V43 KM
22005 170040                    TCA
22006  42000     116X           JSX SUB4I
22007  42000     170X           JSX .STAC
22010   2000    1457R           LDA =D1
22011  21474   77474A           ADA V42 KL
22012 144016      16A           ISZ C,I
22013  66000   21752R           JMP A1272
22014  54016      16A           DSZ C
22015   1435   77435A           LDA V32541  IF1
22016  62000   22240R           IOR =B740
22017   6000    2172R           LDB =D13
22020  42000      75X           JSX .WS4
22021   2000    2405R           LDA =D5
22022  42000    3214R           JSM P332  WAIT
22023  42000   21233R           JSM P1256 TKSCAN
22024   1677   77677A           LDA V17 RFAT
22025  42000       7X           JSM P198  ATNER
22026  70540                    PWC A
22027  42000   21167R           JSM P1248 SLVL
22030 170040                    TCA
22031  21475   77475A           ADA V43 KM
22032 170040                    TCA
22033 170040                    TCA
22034  21466   77466A           ADA V1251 A10
22035 170040                    TCA
22036  42000     116X           JSX SUB4I
22037  31460   77460A           STA V1253 SG50
22040   2000   22241R           LDA =B102
22041  42000   15546R           JSM P214  KEY
22042   2000    2107R           LDA =D3
22043  42000   21213R           JSM P1249 RFSET
22044  42000   21223R           JSM P1255 STLVL
22045   2000    2405R           LDA =D5
22046  42000    3214R           JSM P332  WAIT
22047  42000   21233R           JSM P1256 TKSCAN
```

```
22050    1677   77677A    LDA V17 RFAT
22051   42000       7X    JSM P198  ATNER
22052   70540             PWC A
22053   42000   21167R    JSM P1248 SLVL
22054   42000     116X    JSX SUB4T
22055   31475   77475A    STA V43 KM
22056    2000    1301R    LDA =B177775
22057   70540             PWC A
22060    2000    1457R    LDA =D1
22061                   A1274 EQU *
22061   31474   77474A    STA V42 KL
22062   22000    2107R    ADA =D3
22063   42000   21213R    JSM P1249 RFSET
22064    1474   77474A    LDA V42 KL
22065  170602             SAL 3
22066   61435   77435A    IOR V32541  IF1
22067    6000    2172R    LDB =D13
22070   42000      75X    JSX .WS4
22071    2000    2405R    LDA =D5
22072   42000    3214R    JSM P332  WAIT
22073   42000   21233R    JSM P1256 TKSCAN
22074    1474   77474A    LDA V42 KL
22075  170040             TCA
22076   22000    2301R    ADA =D19
22077   42000      60X    JSX .ARAY
22100              15R    DEF V39 BWAMP
22101   70541             PWC B
22102    1677   77677A    LDA V17 RFAT
22103   42000       7X    JSM P198  ATNER
22104   70540             PWC A
22105   42000   21167R    JSM P1248 SLVL
22106  170040             TCA
22107   21475   77475A    ADA V43 KM
22110  170040             TCA
22111   42000     116X    JSX SUB4T
22112   42000     170X    JSX .STAC
22113    2000    1457R    LDA =D1
22114   21474   77474A    ADA V42 KL
22115  144016      16A    ISZ C,I
22116   66000   22061R    JMP A1274
22117   54016      16A    DSZ C
22120    2000   22235R    LDA =B161
22121   42000   15546R    JSM P214   KEY
22122    2000   22242R    LDA =B123
22123   42000     555R    JSM P215   SKEY
22124    2000    5115R    LDA =B177771
22125   70540             PWC A
22126    2000    2406R    LDA =D7
22127                   A1275 EQU *
22127   31573   77573A    STA V32635   I
22130   42000      60X    JSX .ARAY
22131              15R    DEF V39 BWAMP
22132   70541             PWC B
22133    1573   77573A    LDA V32635   I
22134   42000      60X    JSX .ARAY
22135              15R    DEF V39 BWAMP
22136  170040             TCA
22137   21465   77465A    ADA V1252 AO
22140  170040             TCA
22141   42000     170X    JSX .STAC
22142    2000    1457R    LDA =D1
22143   21573   77573A    ADA V32635   I
22144  144016      16A    ISZ C,I
22145   66000   22127R    JMP A1275
22146   54016      16A    DSZ C
22147   70760             WWC A
22150   31606   77606A    STA V32646   SRCEID
22151   70760             WWC A
22152   31677   77677A    STA V17 RFAT
22153   70760             WWC A
22154   31706   77706A    STA V31 ROFSET
22155   70760             WWC A
22156   31730   77730A    STA V30 KFLAG
22157   42000    3255R    JSM P337   WRFAT
22160    1675   77675A    LDA V15 BLEDS
22161   52000   22243R    AND =B176773
22162   31675   77675A    STA V15 BLEDS
22163    1740   77740A    LDA V32736   EFLAG
22164   52000   22232R    AND =B177703
22165   62000   22244R    IOR =B74
22166   31740   77740A    STA V32736   EFLAG
22167    2000   22222R    LDA =D39
22170   42000    2223R    JSM P274   NBLK
22171    2000    2723R    LDA =B54
22172   42000   15546R    JSM P214   KEY
22173    1730   77730A    LDA V30 KFLAG
22174   42000   15050R    JSM P223   AMPU
22175   42000    1665R    JSM P245   RLAD
22176   42000    3530R    JSM P355   REFLEV
22177    2000    1463R    LDA =D0
22200   42000   14741R    JSM P929   ENTRY
22201   66000   22352R    JMP A1208
22202                   C1276 EQU *
22202    1740   77740A    LDA V32736   EFLAG
22203   62000    2205R    IOR =B40
22204   31740   77740A    STA V32736   EFLAG
22205   42000    2762R    JSM P314   AVGRST
22206    1700   77700A    LDA V22 RLVL
22207   42000    3530R    JSM P355   REFLEV
22210   42000      37X    JSX .LDBI
```

```
22211           77665A     DEF V8  CFREQ
22212  42000     6750R     JSM P222  TUNE
22213  42000     7775R     JSM P603  CSCANBW
22214   1740    77740A     LDA V32736  EFLAG
22215 170612               SAL 11
22216 172027               SAP A1277
22217   2000    22222R     LDA =D39
22220  42000     2223R     JSM P274  NBLK
22221  66000    22247R     JMP A1278
22222     47
22223    143
22224 174700
22225    410
22226    166
22227    106
22230  37770
22231    104
22232 177703
22233    162
22234    124
22235    161
22236    111
22237    107
22240    740
22241    102
22242    123
22243 176773
22244     74
22222                     LIT
22245                     A1277 EQU *
22245   2000    22222R     LDA =D39
22246  42000     2434R     JSM P265  BLKOF
22247                     A1278 EQU *
22247  66000    22352R     JMP A1208
22250                     C1279 EQU *
22250   2000    22222R     LDA =D39
22251  42000     2434R     JSM P265  BLKOF
22252   1740    77740A     LDA V32736  EFLAG
22253  52000     7731R     AND =B177737
22254  31740    77740A     STA V32736  EFLAG
22255   1700    77700A     LDA V22 RLVL
22256  42000     3530R     JSM P355  REFLEV
22257  42000       37X     JSX .LDBI
22260           77665A     DEF V8  CFREQ
22261  42000     6750R     JSM P222  TUNE
22262  42000     7775R     JSM P603  CSCANBW
22263  66000    22352R     JMP A1208
22264                     C1280 EQU *
22264   2000    22313R     LDA =B177736
22265  42000    14741R     JSM P929  ENTRY
22266  66000    22352R     JMP A1208
22267                     C1281 EQU *
22267   1740    77740A     LDA V32736  EFLAG
22270  70540               PWC A
22271  62000     2205R     IOR =B40
22272  31740    77740A     STA V32736  EFLAG
22273  42000    13045R     JSM P791  OHPB
22274   2000     1704R     LDA =D6
22275  70540               PWC A
22276   2000     2411R     LDA =D4
22277  70540               PWC A
22300  42000     3406R     JSM P348  RFLC
22301  42000      122X     JSX CNV42
22302  42000    13062R     JSM P793  NDUMP
22303  42000    13030R     JSM P789  WCRLF
22304  70760               WWC A
22305  31740    77740A     STA V32736  EFLAG
22306  66000    22352R     JMP A1208
22307                     C1282 EQU *
22307   1730    77730A     LDA V30 KFLAG
22310  62000    11310R     IOR =B400
22311  31730    77730A     STA V30 KFLAG
22312  66000    22352R     JMP A1208
22313 177736
22313                     LIT
22314           22307R     DEF C1282
22315           22267R     DEF C1281
22316           22264R     DEF C1280
22317           22250R     DEF C1279
22320           22202R     DEF C1276
22321           21166R     DEF C1246
22322           21163R     DEF C1245
22323           21145R     DEF C1244
22324           21127R     DEF C1243
22325           21116R     DEF C1242
22326           21112R     DEF C1241
22327           21103R     DEF C1240
22330           21100R     DEF C1239
22331           21051R     DEF C1237
22332           21042R     DEF C1236
22333           21025R     DEF C1233
22334           21014R     DEF C1231
22335           21005R     DEF C1230
22336           21000R     DEF C1229
22337           20774R     DEF C1228
22340           20755R     DEF C1226
22341           20705R     DEF C1220
22342           20652R     DEF C1214
22343           20622R     DEF C1212
22344           20616R     DEF C1211
```

```
22345          20612R    DEF C1210
22346          20606R    DEF C1209
22347          20602R    DEF C1207
22350                    DEC -29
22351  42000     143X  A1206 JSX .CASE
22352                  A1208 EQU *
22352                  A1204 EQU *
22352  66000   24627R    JMP A1088
22353                  C1283 EQU *
22353   1676   77676A    LDA V16 TLEDS
22354 170605             SAL 6
22355 172002             SAP *+2
22356  66000   23432R    JMP A1284
22357   1733   77733A    LDA V20 FSTIM
22360 172005            SAP A1286
22361   1566   77566A    LDA V32630  KEYCODE
22362 170040             TCA
22363  22000   22443R    ADA =B154
22364 172004            SAP A1285
22365                  A1286 EQU *
22365   1566   77566A    LDA V32630  KEYCODE
22366  22000   22444R    ADA =B-140
22367  66000   22371R    JMP A1287
22370                  A1285 EQU *
22370   2000    1463R    LDA =D0
22371                  A1287 EQU *
22371  66000   23430R    JMP A1288
22372                  C1289 EQU *
22372  42000   15143R    JSM P949  UNBLANK
22373   1676   77676A    LDA V16 TLEDS
22374  52000   21200R    AND =B177570
22375  62000    2410R    IOR =B200
22376  42000    2163R    JSM P270  TLEDSOUT
22377   1426   77426A    LDA V32534  UFLAG
22400  62000    2276R    IOR =D2
22401  31426   77426A    STA V32534  UFLAG
22402   2000    1463R    LDA =D0
22403  31607   77607A    STA V32647  ACNT
22404   2000    1457R    LDA =D1
22405  42000    3046R    JSM P321  CLEAR
22406   2000    1463R    LDA =D0
22407   6000    2203R    LDB =D8
22410  42000      75X    JSX .WS4
22411   2000    7570R    LDA =B2020
22412  42000      73X    JSX .W6
22413  42000   10747R    JSM P219  MKRDEL
22414   1603   77603A    LDA V32643  PLOCK
22415  52000    7567R    AND =B173777
22416  31603   77603A    STA V32643  PLOCK
22417  42000    6160R    JSM P502  EOS
22420  42000    4664R    JSM P423  VDCUP
22421  66000   23431R    JMP A1290
22422                  C1291 EQU *
22422  42000   15030R    JSM P936  ALTCK
22423   1676   77676A    LDA V16 TLEDS
22424  52000   21200R    AND =B177570
22425  62000    1457R    IOR =B1
22426  42000    2163R    JSM P270  TLEDSOUT
22427   2000    1463R    LDA =D0
22430   6000    2203R    LDB =D8
22431  42000      75X    JSX .WS4
22432   2000    7570R    LDA =B2020
22433  42000      73X    JSX .W6
22434  42000    4664R    JSM P423  VDCUP
22435   1676   77676A    LDA V16 TLEDS
22436 170613             SAL 12
22437 172006            SAP A1292
22440   2000   21206R    LDA =B153
22441  42000   15546R    JSM P214  KEY
22442  66000   22446R    JMP A1293
22443    154
22444 177640
22443                   LIT
22445                  A1292 EQU *
22445  42000   15143R    JSM P949  UNBLANK
22446                  A1293 EQU *
22446   2000   22604R    LDA =B110
22447  42000     555R    JSM P215  SKEY
22450  42000   10747R    JSM P219  MKRDEL
22451   1603   77603A    LDA V32643  PLOCK
22452  52000    7567R    AND =B173777
22453  31603   77603A    STA V32643  PLOCK
22454  42000    6160R    JSM P502  EOS
22455  66000   23431R    JMP A1290
22456                  C1294 EQU *
22456   1676   77676A    LDA V16 TLEDS
22457 170610             SAL 9
22460 172012            SAP A1295
22461   1676   77676A    LDA V16 TLEDS
22462  52000    6512R    AND =B177677
22463  42000    2163R    JSM P270  TLEDSOUT
22464   1426   77426A    LDA V32534  UFLAG
22465  62000    2276R    IOR =D2
22466  31426   77426A    STA V32534  UFLAG
22467   2000    1277R    LDA =B177777
22470  31607   77607A    STA V32647  ACNT
22471  42000    4664R    JSM P423  VDCUP
22472                  A1295 EQU *
22472  66000   23431R    JMP A1290
22473                  C1296 EQU *
```

```
22473   42000   15030R        JSM P936   ALTCK
22474   42000   15143R        JSM P949   UNBLANK
22475    1676   77676A        LDA V16 TLEDS
22476   52000   21200R        AND =B177570
22477   62000    2276R        IOR =B2
22500   42000    2163R        JSM P270   TLEDSOUT
22501    2000    1463R        LDA =D0
22502    6000    2203R        LDB =D8
22503   42000      75X        JSX .WS4
22504    2000    7570R        LDA =B2020
22505   42000      73X        JSX .W6
22506   42000    4664R        JSM P423   VDCUP
22507   42000   10747R        JSM P219   MKRDEL
22510   66000   23431R        JMP A1290
22511                    C1297 EQU *
22511   42000   15030R        JSM P936   ALTCK
22512   42000   15143R        JSM P949   UNBLANK
22513    1676   77676A        LDA V16 TLEDS
22514   52000   21200R        AND =B177570
22515   62000    2411R        IOR =B4
22516   42000    2163R        JSM P270   TLEDSOUT
22517    2000    1463R        LDA =D0
22520    6000    2203R        LDB =D8
22521   42000      75X        JSX .WS4
22522    2000    3113R        LDA =B2060
22523   42000      73X        JSX .W6
22524   42000    4664R        JSM P423   VDCOP
22525   42000   10747R        JSM P219   MKRDEL
22526   66000   23431R        JMP A1290
22527                    C1298 EQU *
22527    1676   77676A        LDA V16 TLEDS
22530  170610                 SAL 9
22531  172002                 SAP *+2
22532   66000   22606R        JMP A1299
22533    2000   20422R        LDA =B176027
22534   70540                 PWC A
22535    2000    1457R        LDA =D1
22536                    A1300 EQU *
22536   31573   77573A        STA V32635   I
22537   22000    6703R        ADA =D1024
22540    6000    2203R        LDB =D8
22541   42000      75X        JSX .WS4
22542   42000     162X        JSX .R5
22543   31572   77572A        STA V32634   J
22544    1573   77573A        LDA V32635   I
22545   42000     103X        JSX .W4
22546   42000     162X        JSX .R5
22547   31567   77567A        STA V32631   KEYCOL
22550    1573   77573A        LDA V32635   I
22551   42000     103X        JSX .W4
22552    1572   77572A        LDA V32634   J
22553  170604                 SAL 5
22554   70540                 PWC A
22555    1567   77567A        LDA V32631   KEYCOL
22556  170604                 SAL 5
22557   42000     116X        JSX SUB4T
22560  170404                 AAR 5
22561   42000      73X        JSX .W6
22562    2000    1457R        LDA =D1
22563   21573   77573A        ADA V32635   I
22564  144016      16A        ISZ C,I
22565   66000   22536R        JMP A1300
22566   54016      16A        DSZ C
22567    1676   77676A        LDA V16 TLEDS
22570   62000    1364R        IOR =B100
22571   42000    2163R        JSM P270   TLEDSOUT
22572   42000    4664R        JSM P423   VDCOP
22573    1676   77676A        LDA V16 TLEDS
22574   52000   22225R        AND =B410
22575   72410                SZA A1301
22576    1676   77676A        LDA V16 TLEDS
22577   52000   11303R        AND =B177377
22600   31676   77676A        STA V16 TLEDS
22601    2000   21201R        LDA =B152
22602   42000   15546R        JSM P214   KEY
22603   66000   22606R        JMP A1302
22604     110
22604                         LIT
22605                    A1301 EQU *
22605   42000   10747R        JSM P219   MKRDEL
22606                    A1302 EQU *
22606                    A1299 EQU *
22606   66000   23431R        JMP A1290
22607                    C1303 EQU *
22607    1676   77676A        LDA V16 TLEDS
22610   70540                 PWC A
22611    2000    1463R        LDA =D0
22612   31607   77607A        STA V32647   ACNT
22613   42000   15143R        JSM P949   UNBLANK
22614    1426   77426A        LDA V32534   UFLAG
22615   62000    3654R        IOR =B20
22616   31426   77426A        STA V32534   UFLAG
22617    1676   77676A        LDA V16 TLEDS
22620   52000   22646R        AND =B177207
22621   62000   11310R        IOR =B400
22622   42000    2163R        JSM P270   TLEDSOUT
22623    2000    2276R        LDA =D2
22624   42000    3046R        JSM P321   CLEAR
22625    2000    6703R        LDA =D1024
22626    6000    2203R        LDB =D8
22627   42000      75X        JSX .WS4
```

```
22630    2000   7571R    LDA =B2030
22631   42000    73X     JSX .W6
22632    1603  77603A    LDA V32643  PLOCK
22633   52000   7567R    AND =B173777
22634   31603  77603A    STA V32643  PLOCK
22635   42000   6160R    JSM P502  EOS
22636   42000   4664R    JSM P423  VDCOP
22637   70760            WWC A
22640   31573  77573A    STA V32635  I
22641  170610            SAL 9
22642  172005           SAP A1304
22643    2000  15047R    LDA =B145
22644   42000  15546R    JSM P214  KEY
22645   66000  22650R    JMP A1305
22646  177207
22646                   LIT
22647                  A1304 EQU *
22647   42000  10747R    JSM P219  WKRDEL
22650                  A1305 EQU *
22650   66000  23431R    JMP A1290
22651                  C1306 EQU *
22651   42000  15030R    JSM P936  ALTCK
22652   42000   4664R    JSM P423  VDCOP
22653    1676  77676A    LDA V16 TLEDS
22654   52000  22661R    AND =B101
22655   72405           SZA A1307
22656    2000  15047R    LDA =B145
22657   42000  15546R    JSM P214  KEY
22660   66000  22663R    JMP A1308
22661     101
22661                   LIT
22662                  A1307 EQU *
22662   42000  15143R    JSM P949  UNBLANK
22663                  A1308 EQU *
22663    1676  77676A    LDA V16 TLEDS
22664   52000  22646R    AND =B177207
22665   62000   2203R    IOR =B10
22666   42000   2163R    JSM P270  TLEDSOUT
22667    2000   6703R    LDA =D1024
22670    6000   2203R    LDB =D8
22671   42000    75X     JSX .WS4
22672    2000   7571R    LDA =B2030
22673   42000    73X     JSX .W6
22674    2000  22604R    LDA =B110
22675   42000    555R    JSM P215  SKEY
22676   42000  10747R    JSM P219  WKRDEL
22677    1603  77603A    LDA V32643  PLOCK
22700   52000   7567R    AND =B173777
22701   31603  77603A    STA V32643  PLOCK
22702   42000   6160R    JSM P502  EOS
22703   66000  23431R    JMP A1290
22704                  C1309 EQU *
22704   42000  15143R    JSM P949  UNBLANK
22705    2000   1457R    LDA =D1
22706    6000   2203R    LDB =D8
22707   42000    75X     JSX .WS4
22710    2000  20422R    LDA =B176027
22711   70540            PWC A
22712    2000   1457R    LDA =D1
22713                  A1310 EQU *
22713   31573  77573A    STA V32635  I
22714   42000   162X     JSX .R5
22715   31572  77572A    STA V32634  J
22716    1573  77573A    LDA V32635  I
22717   22000   6703R    ADA =D1024
22720   42000   103X     JSX .W4
22721   42000   162X     JSX .R5
22722   31567  77567A    STA V32631  KEYCOL
22723    1573  77573A    LDA V32635  I
22724   22000   6703R    ADA =D1024
22725   42000   103X     JSX .W4
22726    1572  77572A    LDA V32634  J
22727   42000    73X     JSX .W6
22730    1573  77573A    LDA V32635  I
22731   42000   103X     JSX .W4
22732    1567  77567A    LDA V32631  KEYCOL
22733   42000    73X     JSX .W6
22734    2000   1457R    LDA =D1
22735   21573  77573A    ADA V32635  I
22736  144016    16A     ISZ C,I
22737   66000  22713R    JMP A1310
22740   54016    16A     DSZ C
22741    1426  77426A    LDA V32534  UFLAG
22742   52000   3654R    AND =B20
22743  170502            SAR 3
22744   70540            PWC A
22745    1426  77426A    LDA V32534  UFLAG
22746   52000   2276R    AND =D2
22747  170602            SAL 3
22750   42000   136X     JSX .ORT
22751   42000   104X     JSX .TURN
22752           7565R    DEF =B22
22753          77426A    DEF V32534  UFLAG
22754   31426  77426A    STA V32534  UFLAG
22755    1676  77676A    LDA V16 TLEDS
22756   52000  10360R    AND =B201
22757   72403           SZA A1311
22760    2000   3312R    LDA =B144
22761   42000  15546R    JSM P214  KEY
22762                  A1311 EQU *
22762    1676  77676A    LDA V16 TLEDS
```

```
10045 22763  52000  22225R     AND =B410
10046 22764  72404            SZA A1312
10047 22765   2000  21201R     LDA =B152
10048 22766  42000  15546R     JSM P214   KEY
10049 22767  66000  22771R     JMP A1313
10050 22770                   A1312 EQU *
10051 22770  42000  10747R     JSM P219   MKRDEL
10052 22771                   A1313 EQU *
10053 22771  42000   2650R     JSM P304   UNCAL
10054 22772  66000  23431R     JMP A1290
10055 22773                   C1314 EQU *
10056 22773  42000  15030R     JSM P936   ALTCK
10057 22774  42000  15143R     JSM P949   UNBLANK
10058 22775   1676  77676A     LDA V16 TLEDS
10059 22776  52000  23363R     AND =B177307
10060 22777  62000   3654R     IOR =B20
10061 23000  42000   2163R     JSM P270   TLEDSOUT
10062 23001   2000   6703R     LDA =D1024
10063 23002   6000   2203R     LDB =D8
10064 23003  42000    75X      JSX .WS4
10065 23004   2000   7571R     LDA =B2030
10066 23005  42000    73X      JSX .W6
10067 23006  42000   4664R     JSM P423   VDCOP
10068 23007  42000  10747R     JSM P219   MKRDEL
10069 23010  66000  23431R     JMP A1290
10070 23011                   C1315 EQU *
10071 23011  42000  15030R     JSM P936   ALTCK
10072 23012  42000  15143R     JSM P949   UNBLANK
10073 23013   1676  77676A     LDA V16 TLEDS
10074 23014  52000  23363R     AND =B177307
10075 23015  62000   2205R     IOR =B40
10076 23016  42000   2163R     JSM P270   TLEDSOUT
10077 23017   2000   6703R     LDA =D1024
10078 23020   6000   2203R     LDB =D8
10079 23021  42000    75X      JSX .WS4
10080 23022   2000   3113R     LDA =B2060
10081 23023  42000    73X      JSX .W6
10082 23024  42000   4664R     JSM P423   VDCOP
10083 23025  42000  10747R     JSM P219   MKRDEL
10084 23026  66000  23431R     JMP A1290
10085 23027                   C1316 EQU *
10086 23027   2000  16201R     LDA =D1025
10087 23030   6000   2203R     LDB =D8
10088 23031  42000    75X      JSX .WS4
10089 23032   2000  20422R     LDA =B176027
10090 23033  70540             PWC A
10091 23034   2000  16201R     LDA =D1025
10092 23035                   A1317 EQU *
10093 23035  31573  77573A     STA V32635   I
10094 23036  42000   162X      JSX .R5
10095 23037  31572  77572A     STA V32634   J
10096 23040   1573  77573A     LDA V32635   I
10097 23041  42000   103X      JSX .W4
10098 23042   1704  77704A     LDA V33 LEVLIN
10099 23043 170604             SAL 5
10100 23044  70540             PWC A
10101 23045   1572  77572A     LDA V32634   J
10102 23046 170604             SAL 5
10103 23047  42000   116X      JSX SUB4I
10104 23050 170404             AAR 5
10105 23051  42000    73X      JSX .W6
10106 23052   2000   1457R     LDA =D1
10107 23053  21573  77573A     ADA V32635   I
10108 23054 144016    16A      ISZ C,I
10109 23055  66000  23035R     JMP A1317
10110 23056  54016    16A      DSZ C
10111 23057   1675  77675A     LDA V15 BLEDS
10112 23060 170612             SAL 11
10113 23061 172410            SAM A1318
10114 23062   1704  77704A     LDA V33 LEVLIN
10115 23063  42000  11072R     JSM P667   WLVLN
10116 23064   2000   3527R     LDA =D14
10117 23065  42000   2223R     JSM P274   NBLK
10118 23066   1675  77675A     LDA V15 BLEDS
10119 23067  62000   3654R     IOR =B20
10120 23070  31675  77675A     STA V15 BLEDS
10121 23071                   A1318 EQU *
10122 23071   2000  21201R     LDA =B152
10123 23072  42000  15546R     JSM P214   KEY
10124 23073   1676  77676A     LDA V16 TLEDS
10125 23074 170610             SAL 9
10126 23075 172002            SAP A1319
10127 23076  42000   2762R     JSM P314   AVGRST
10128 23077                   A1319 EQU *
10129 23077   1426  77426A     LDA V32534   UFLAG
10130 23100  62000   3654R     IOR =B20
10131 23101  31426  77426A     STA V32534   UFLAG
10132 23102  42000   2650R     JSM P304   UNCAL
10133 23103  66000  23431R     JMP A1290
10134 23104                   C1320 EQU *
10135 23104   2000   2131R     LDA =D15
10136 23105  70540             PWC A
10137 23106   2000   2172R     LDA =D13
10138 23107  42000  10713R     JSM P656   GRAT
10139 23110   1675  77675A     LDA V15 BLEDS
10140 23111  52000   2067R     AND =B177757
10141 23112  31675  77675A     STA V15 BLEDS
10142 23113   2000   3527R     LDA =D14
10143 23114  42000  15133R     JSM P947   TRNOFF
10144 23115   2000   3527R     LDA =D14
10145 23116  42000   2434R     JSM P265   BLKOF
```

```
23117  66000  23431R      JMP A1290
23120                C1321 EQU *
23120   1704  77704A      LDA V33 LEVLIN
23121  42000  11072R      JSM P667  WLVLN
23122   2000   3527R      LDA =D14
23123  42000  14741R      JSM P929   ENTRY
23124   2000   3527R      LDA =D14
23125  42000   2223R      JSM P274   NBLK
23126   1675  77675A      LDA V15 BLEDS
23127  62000   3654R      IOR =B20
23130  31675  77675A      STA V15 BLEDS
23131  66000  23431R      JMP A1290
23132                C1322 EQU *
23132   2000  11067R      LDA =D2169
23133   6000   2203R      LDB =D8
23134  42000     75X      JSX .WS4
23135   2000  23364R      LDA =B3777
23136  42000     73X      JSX .W6
23137   1675  77675A      LDA V15 BLEDS
23140  52000   7731R      AND =B177737
23141  31675  77675A      STA V15 BLEDS
23142   2000   2131R      LDA =D15
23143  42000  15133R      JSM P947   TRNOFF
23144   2000   2131R      LDA =D15
23145  42000   2434R      JSM P285   BLKOF
23146  66000  23431R      JMP A1290
23147                C1323 EQU *
23147   1705  77705A      LDA V32 THRESH
23150  42000  11044R      JSM P666   WTHRSH
23151   2000   2131R      LDA =D15
23152  42000  14741R      JSM P929   ENTRY
23153   2000   2131R      LDA =D15
23154  42000   2223R      JSM P274   NBLK
23155   1675  77675A      LDA V15 BLEDS
23156  62000   2205R      IOR =B40
23157  31675  77675A      STA V15 BLEDS
23160  66000  23431R      JMP A1290
23161                C1324 EQU *
23161   1435  77435A      LDA V32541   IF1
23162 172417             SAM A1325
23163   1730  77730A      LDA V30 KFLAG
23164 170513              SAR 12
23165  42000    104X      JSX .TURN
23166          1456R      DEF =D12
23167         77740A      DEF V32736   EFLAG
23170  31740  77740A      STA V32736   EFLAG
23171   1435  77435A      LDA V32541   IF1
23172  62000   5517R      IOR =B100000
23173  31435  77435A      STA V32541   IF1
23174   1700  77700A      LDA V22 RLVL
23175  42000   3530R      JSM P355   REFLEV
23176   1740  77740A      LDA V32736   EFLAG
23177  42000  15050R      JSM P223   AMPU
23200  42000   2762R      JSM P314   AVGRST
23201                A1325 EQU *
23201   2000   1704R      LDA =D6
23202  42000  14741R      JSM P929   ENTRY
23203   2000   1704R      LDA =D6
23204  42000   2223R      JSM P274   NBLK
23205   2000   1704R      LDA =D6
23206  42000   2314R      JSM P279   SBLK
23207  66000  23431R      JMP A1290
23210                C1326 EQU *
23210   1435  77435A      LDA V32541   IF1
23211 172006             SAP A1327
23212   1730  77730A      LDA V30 KFLAG
23213  42000    104X      JSX .TURN
23214          4533R      DEF =B140000
23215         77740A      DEF V32736   EFLAG
23216  31740  77740A      STA V32736   EFLAG
23217                A1327 EQU *
23217   1435  77435A      LDA V32541   IF1
23220  52000  23365R      AND =B17777
23221  31435  77435A      STA V32541   IF1
23222   1700  77700A      LDA V22 RLVL
23223  42000   3530R      JSM P355   REFLEV
23224   2000   1704R      LDA =D6
23225  42000  15133R      JSM P947   TRNOFF
23226   2000   3654R      LDA =D16
23227  42000   2223R      JSM P274   NBLK
23230   2000   2420R      LDA =D145
23231  42000     73X      JSX .W6
23232  42000   2762R      JSM P314   AVGRST
23233   1740  77740A      LDA V32736   EFLAG
23234 170613              SAL 12
23235  42000  15050R      JSM P223   AMPU
23236  42000   2551R      JSM P298   ABLK
23237  66000  23431R      JMP A1290
23240                C1328 EQU *
23240   1676  77676A      LDA V16 ILEDS
23241  62000   1300R      IOR =B1000
23242  42000   2163R      JSM P270   ILEDSOUT
23243  66000  23431R      JMP A1290
23244                C1329 EQU *
23244   1676  77676A      LDA V16 ILEDS
23245  52000   5521R      AND =B175777
23246  42000   2163R      JSM P270   ILEDSOUT
23247  42000  15224R      JSM P221   TRIGR
23250  66000  23431R      JMP A1290
23251                C1330 EQU *
23251   1733  77733A      LDA V20 FSTIM
```

```
23252 172405              SAM A1331
23253   1676   77676A      LDA V16 TLEDS
23254  62000    6703R      IOR =B2000
23255  42000    2163R      JSM P270  TLEDSOUT
23256  42000   15224R      JSM P221  TRIGR
23257                     A1331 EQU *
23257  66000   23431R      JMP A1290
23260                     C1332 EQU *
23260   2000    1463R      LDA =D0
23261  42000   15274R      JSM P967  TMODE
23262  66000   23431R      JMP A1290
23263                     C1333 EQU *
23263   2000    2277R      LDA =B4000
23264  42000   15274R      JSM P967  TMODE
23265  66000   23431R      JMP A1290
23266                     C1334 EQU *
23266   2000    2644R      LDA =B10000
23267  42000   15274R      JSM P967  TMODE
23270  66000   23431R      JMP A1290
23271                     C1335 EQU *
23271   2000    1770R      LDA =B20000
23272  42000   15274R      JSM P967  TMODE
23273  66000   23431R      JMP A1290
23274                     C1336 EQU *
23274   1676   77676A      LDA V16 TLEDS
23275 170140               CMA
23276  52000    6514R      AND =B77777
23277  42000     104X      JSX .TURN
23300           4533R      DEF =B140000
23301          77676A      DEF V16 TLEDS
23302  42000    2163R      JSM P270  TLEDSOUT
23303   1676   77676A      LDA V16 TLEDS
23304 170600               SAL 1
23305 170403               AAR 4
23306  42000     104X      JSX .TURN
23307          23366R      DEF =B14000
23310          77435A      DEF V32541  IF1
23311  31435   77435A      STA V32541  IF1
23312  42000    3243R      JSM P335  *IF1
23313  66000   23431R      JMP A1290
23314                     C1337 EQU *
23314   1675   77675A      LDA V15 BLEDS
23315 170600               SAL 1
23316 172003              SAP A1338
23317   2000   22242R      LDA =B123
23320  42000   15546R      JSM P214  KEY
23321                     A1338 EQU *
23321  66000   23431R      JMP A1290
23322                     C1339 EQU *
23322   1676   77676A      LDA V16 TLEDS
23323 170140               CMA
23324  52000    2645R      AND =B137777
23325  42000     104X      JSX .TURN
23326           4533R      DEF =B140000
23327          77676A      DEF V16 TLEDS
23330  42000    2163R      JSM P270  TLEDSOUT
23331   1676   77676A      LDA V16 TLEDS
23332 170502               SAR 3
23333  42000     104X      JSX .TURN
23334          23366R      DEF =B14000
23335          77435A      DEF V32541  IF1
23336  31435   77435A      STA V32541  IF1
23337  42000    3243R      JSM P335  *IF1
23340  66000   23431R      JMP A1290
23341                     C1340 EQU *
23341   1675   77675A      LDA V15 BLEDS
23342 170601               SAL 2
23343 172003              SAP A1341
23344   2000   23367R      LDA =B75
23345  42000   15546R      JSM P214  KEY
23346                     A1341 EQU *
23346  66000   23431R      JMP A1290
23347                     C1342 EQU *
23347   1675   77675A      LDA V15 BLEDS
23350 170601               SAL 2
23351 172403              SAM A1343
23352   2000   23367R      LDA =B75
23353  42000   15546R      JSM P214  KEY
23354                     A1343 EQU *
23354  66000   23431R      JMP A1290
23355                     C1344 EQU *
23355   1675   77675A      LDA V15 BLEDS
23356 170600               SAL 1
23357 172403              SAM A1345
23360   2000   22242R      LDA =B123
23361  42000   15546R      JSM P214  KEY
23362                     A1345 EQU *
23362  66000   23431R      JMP A1290
23363 177307
23364   3777
23365  17777
23366  14000
23367     75
23363                      LIT
23370          23355R      DEF C1344
23371          23347R      DEF C1342
23372          23341R      DEF C1340
23373          23322R      DEF C1339
23374          23314R      DEF C1337
23375          23274R      DEF C1336
23376          23271R      DEF C1335
```

```
23377          23266R      DEF C1334
23400          23263R      DEF C1333
23401          23260R      DEF C1332
23402          23251R      DEF C1330
23403          23244R      DEF C1329
23404          23240R      DEF C1328
23405          23210R      DEF C1326
23406          23161R      DEF C1324
23407          23147R      DEF C1323
23410          23132R      DEF C1322
23411          23120R      DEF C1321
23412          23104R      DEF C1320
23413          23027R      DEF C1316
23414          23011R      DEF C1315
23415          22773R      DEF C1314
23416          22704R      DEF C1309
23417          22651R      DEF C1306
23420          22607R      DEF C1303
23421          22527R      DEF C1298
23422          22511R      DEF C1297
23423          22473R      DEF C1296
23424          22456R      DEF C1294
23425          22422R      DEF C1291
23426          22372R      DEF C1289
23427                      DEC -32
23430   42000    143X A1288 JSX .CASE
23431                 A1290 EQU *
23431   66000  24373R      JMP A1346
23432                 A1284 EQU *
23432   42000  15344R      JSM P971   USFI
23433    1566  77566A      LDA V32630   KEYCODE
23434   22000  23527R      ADA =B-137
23435   66000  24372R      JMP A1347
23436                 C1348 EQU *
23436    2000   1463R      LDA =D0
23437   42000  14741R      JSM P929   ENTRY
23440   66000  24373R      JMP A1349
23441                 C1350 EQU *
23441    1702  77702A      LDA V24 VIDCON
23442   52000  23530R      AND =B177707
23443   62000   2205R      IOR =B40
23444   31702  77702A      STA V24 VIDCON
23445   42000   2772R      JSM P315   DALG
23446   66000  24373R      JMP A1349
23447                 C1351 EQU *
23447    1702  77702A      LDA V24 VIDCON
23450   52000  23530R      AND =B177707
23451   62000   2203R      IOR =B10
23452   31702  77702A      STA V24 VIDCON
23453   42000   2772R      JSM P315   DALG
23454   66000  24373R      JMP A1349
23455                 C1352 EQU *
23455    2000  20422R      LDA =B176027
23456   70540              PWC A
23457    2000   1457R      LDA =D1
23460                 A1353 EQU *
23460   31573  77573A      STA V32635   I
23461   22000   6703R      ADA =D1024
23462    6000   2203R      LDB =D8
23463   42000     75X      JSX .MS4
23464   42000    162X      JSX .R5
23465   31572  77572A      STA V32634   J
23466    1573  77573A      LDA V32635   I
23467   42000    103X      JSX .M4
23470   42000    162X      JSX .R5
23471   31567  77567A      STA V32631   KEYCOL
23472    1573  77573A      LDA V32635   I
23473   42000    103X      JSX .M4
23474    2000   3166R      LDA =D1023
23475   70540              PWC A
23476    1572  77572A      LDA V32634   J
23477  170604              SAL 5
23500  170404              AAR 5
23501   70540              PWC A
23502    1567  77567A      LDA V32631   KEYCOL
23503  170604              SAL 5
23504  170404              AAR 5
23505   42000     57X      JSX ADD4T
23506   42000   2132R      JSM P265   LIMIT
23507   42000     73X      JSX .W6
23510    2000   1457R      LDA =D1
23511   21573  77573A      ADA V32635   I
23512  144016     16A      ISZ C,1
23513   66000  23460R      JMP A1353
23514   54016     16A      DSZ C
23515    1676  77676A      LDA V16 TLEDS
23516  170610              SAL 9
23517  172012             SAP A1354
23520    1426  77426A      LDA V32534   UFLAG
23521   70540              PWC A
23522    2000  22223R      LDA =B143
23523   42000  15546R      JSM P214   KEY
23524   70760              WWC A
23525   31426  77426A      STA V32534   UFLAG
23526   66000  23534R      JMP A1355
23527  177641
23530  177707
23527                      LIT
23531                 A1354 EQU *
23531    1426  77426A      LDA V32534   UFLAG
```

```
23532   62000    2276R      IOR  =D2
23533   31426   77426A      STA  V32534   UFLAG
23534                     A1355  EQU  *
23534   42000   10747R      JSM  P219   MKRDEL
23535   42000    2650R      JSM  P304   UNCAL
23536   66000   24373R      JMP  A1349
23537                     C1356  EQU  *
23537    1702   77702A      LDA  V24 VIDCON
23540   52000   23530R      AND  =B177707
23541   31702   77702A      STA  V24 VIDCON
23542   42000    2772R      JSM  P315   DALG
23543   66000   24373R      JMP  A1349
23544                     C1357  EQU  *
23544    1702   77702A      LDA  V24 VIDCON
23545   52000   23530R      AND  =B177707
23546   62000    3654R      IOR  =B20
23547   31702   77702A      STA  V24 VIDCON
23550   42000    2772R      JSM  P315   DALG
23551   66000   24373R      JMP  A1349
23552                     C1358  EQU  *
23552    1730   77730A      LDA  V30 KFLAG
23553   62000    1364R      IOR  =B100
23554   31730   77730A      STA  V30 KFLAG
23555   66000   24373R      JMP  A1349
23556                     C1359  EQU  *
23556    1435   77435A      LDA  V32541   IF1
23557   62000    6703R      IOR  =B2000
23560   31435   77435A      STA  V32541   IF1
23561   42000    3243R      JSM  P335   WIF1
23562   66000   24373R      JMP  A1349
23563                     C1360  EQU  *
23563    1435   77435A      LDA  V32541   IF1
23564   52000    5521R      AND  =B175777
23565   31435   77435A      STA  V32541   IF1
23566   42000    3243R      JSM  P335   WIF1
23567   66000   24373R      JMP  A1349
23570                     C1361  EQU  *
23570    2000   16201R      LDA  =D1025
23571    6000    2203R      LDB  =D8
23572   42000      75X      JSX  .WS4
23573    2000   20422R      LDA  =B176027
23574   70540               PWC  A
23575    2000   16201R      LDA  =D1025
23576                     A1362  EQU  *
23576   31573   77573A      STA  V32635   I
23577   42000     162X      JSX  .R5
23600   31572   77572A      STA  V32634   J
23601    1573   77573A      LDA  V32635   I
23602   22000    2277R      ADA  =D2048
23603   42000     103X      JSX  .W4
23604   42000     162X      JSX  .R5
23605   31567   77567A      STA  V32631   KEYCOL
23606    1573   77573A      LDA  V32635   I
23607   22000    2277R      ADA  =D2048
23610   42000     103X      JSX  .W4
23611    1572   77572A      LDA  V32634   J
23612   42000      73X      JSX  .W6
23613    1573   77573A      LDA  V32635   I
23614   42000     103X      JSX  .W4
23615    1567   77567A      LDA  V32631   KEYCOL
23616   52000   23656R      AND  =B7006
23617   22000   23657R      ADA  =B175774
23620    4000               LDB  A
23621    2000    3113R      LDA  =B2060
23622   76402              SZB  A1363
23623    1567   77567A      LDA  V32631   KEYCOL
23624                     A1363  EQU  *
23624   42000      73X      JSX  .W6
23625    2000    1457R      LDA  =D1
23626   21573   77573A      ADA  V32635   I
23627  144016      16A      ISZ  C,I
23630   66000   23576R      JMP  A1362
23631   54016      16A      DSZ  C
23632    1426   77426A      LDA  V32534   UFLAG
23633   52000    2411R      AND  =D4
23634  170601               SAL  2
23635   62000    2205R      IOR  =B40
23636   70540               PWC  A
23637    1426   77426A      LDA  V32534   UFLAG
23640   52000    3654R      AND  =B20
23641  170501               SAR  2
23642   42000     136X      JSX  .ORT
23643   42000     104X      JSX  .TURN
23644           10237R      DEF  =B64
23645           77426A      DEF  V32534   UFLAG
23646   31426   77426A      STA  V32534   UFLAG
23647   42000    2650R      JSM  P304   UNCAL
23650    1676   77676A      LDA  V16 TLEDS
23651   52000   22225R      AND  =B410
23652   72406              SZA  A1364
23653    2000   21201R      LDA  =B152
23654   42000   15546R      JSM  P214   KEY
23655   66000   23661R      JMP  A1365
23656    7006
23657  175774
                            LIT
23660                     A1364  EQU  *
23660   42000   10747R      JSM  P219   MKRDEL
23661                     A1365  EQU  *
23661   66000   24373R      JMP  A1349
23662                     C1366  EQU  *
23662    2000    6352R      LDA  =D3072
23663    6000    2203R      LDB  =D8
```

```
23664   42000     75X    JSX .WS4
23665    2000   7571R    LDA =B2030
23666   42000     73X    JSX .W6
23667    1426  77426A    LDA V32534  UFLAG
23670   62000   2203R    IOR =B10
23671   31426  77426A    STA V32534  UFLAG
23672   42000   2650R    JSM P304  UNCAL
23673   66000  24373R    JMP A1349
23674                  C1367 EQU *
23674    2000   6352R    LDA =D3072
23675    6000   2203R    LDB =D8
23676   42000     75X    JSX .WS4
23677    2000   3110R    LDA =B2024
23700   42000     73X    JSX .W6
23701    1426  77426A    LDA V32534  UFLAG
23702   52000   1375R    AND =B177767
23703   31426  77426A    STA V32534  UFLAG
23704   42000   2650R    JSM P304  UNCAL
23705   66000  24373R    JMP A1349
23706                  C1368 EQU *
23706    2000  16201R    LDA =D1025
23707    6000   2203R    LDB =D8
23710   42000     75X    JSX .WS4
23711    2000  20422R    LDA =B176027
23712   70540            PWC A
23713    2000  16201R    LDA =D1025
23714                  A1369 EQU *
23714   31573  77573A    STA V32635  I
23715   42000    162X    JSX .R5
23716   31572  77572A    STA V32634  J
23717    1573  77573A    LDA V32635  I
23720   22000   2277R    ADA =D2048
23721   42000    103X    JSX .W4
23722    1572  77572A    LDA V32634  J
23723   42000     73X    JSX .W6
23724    1573  77573A    LDA V32635  I
23725   22000   1457R    ADA =D1
23726   42000    103X    JSX .W4
23727    2000   1457R    LDA =D1
23730   21573  77573A    ADA V32635  I
23731  144016     16A    ISZ C,I
23732   66000  23714R    JMP A1369
23733   54016     16A    DSZ C
23734    1426  77426A    LDA V32534  UFLAG
23735   62000   2205R    IOR =B40
23736   70540            PWC A
23737    1426  77426A    LDA V32534  UFLAG
23740  170501            SAR 2
23741   42000    104X    JSX .TURN
23742           2411R    DEF =D4
23743                    NOP
23744   31426  77426A    STA V32534  UFLAG
23745   42000   2650R    JSM P304  UNCAL
23746   66000  24373R    JMP A1349
23747                  C1370 EQU *
23747    2000  24130R    LDA =D2065
23750    6000   2203R    LDB =D8
23751   42000     75X    JSX .WS4
23752    2000  24131R    LDA =D1035
23753   42000     73X    JSX .W6
23754    2000  24132R    LDA =D2168
23755   42000     73X    JSX .W6
23756   66000  24373R    JMP A1349
23757                  C1371 EQU *
23757    2000  24133R    LDA =D21
23760   70540            PWC A
23761    2000   2301R    LDA =D19
23762   42000  10713R    JSM P656  GRAT
23763   66000  24373R    JMP A1349
23764                  C1372 EQU *
23764    2000  24134R    LDA =D2170
23765    6000   2203R    LDB =D8
23766   42000     75X    JSX .WS4
23767    2000   3113R    LDA =B2060
23770   42000     73X    JSX .W6
23771   66000  24373R    JMP A1349
23772                  C1373 EQU *
23772    2000  24134R    LDA =D2170
23773    6000   2203R    LDB =D8
23774   42000     75X    JSX .WS4
23775    2000  24135R    LDA =B2522
23776   42000     73X    JSX .W6
23777   66000  24373R    JMP A1349
24000                  C1374 EQU *
24000    1730  77730A    LDA V30 KFLAG
24001   62000   2205R    IOR =B40
24002   31730  77730A    STA V30 KFLAG
24003   42000   3243R    JSM P335  WIFI
24004   66000  24373R    JMP A1349
24005                  C1375 EQU *
24005    2000   3654R    LDA =B20
24006    6000   2411R    LDB =D4
24007   42000    112X    JSX .WS7
24010   66000  24373R    JMP A1349
24011                  C1376 EQU *
24011    1723  77723A    LDA V26 MKRMODE
24012   72413            SZA A1377
24013   42000  10323R    JSM P626  MKRROK
24014  172011            SAP A1377
24015    2000   4533R    LDA =B140000
24016   31703  77703A    STA V21 STRIG
```

```
24017    1601   77601A       LDA V32641  HPBC
24020   52000   16171R       AND =B157777
24021   31601   77601A       STA V32641  HPBC
24022    1740   77740A       LDA V32736  EFLAG
24023   62000    2644R       IOR =B10000
24024   31740   77740A       STA V32736  EFLAG
24025                  A1377 EQU *
24025   66000   24373R       JMP A1349
24026                  C1378 EQU *
24026    1616   77616A       LDA V32654  XFLAG
24027   62000    1770R       IOR =B20000
24030   31616   77616A       STA V32654  XFLAG
24031    1676   77676A       LDA V16 TLEDS
24032   62000    6703R       IOR =B2000
24033   42000    2163R       JSM P270  TLEDSOUT
24034    2000    7670R       LDA =B164
24035   42000     555R       JSM P215  SKEY
24036   42000   15224R       JSM P221  TRIGR
24037   66000   24373R       JMP A1349
24040                  C1379 EQU *
24040    1616   77616A       LDA V32654  XFLAG
24041   62000    2277R       IOR =B4000
24042   31616   77616A       STA V32654  XFLAG
24043    2000    2066R       LDA =B177770
24044   70540                P*C A
24045    2000    5520R       LDA =D24
24046                  A1380 EQU *
24046   31572   77572A       STA V32634  J
24047   42000    2501R       JSM P295  BLINK
24050    2000    1457R       LDA =D1
24051   21572   77572A       ADA V32634  J
24052  144016      16A       ISZ C,I
24053   66000   24046R       JMP A1380
24054   54016      16A       DSZ C
24055   66000   24373R       JMP A1349
24056                  C1381 EQU *
24056    2000    6352R       LDA =D3072
24057    6000    2203R       LDB =D8
24060   42000      75X       JSX .WS4
24061    2000   24136R       LDA =B2022
24062   42000      73X       JSX .W6
24063    2000    3654R       LDA =D16
24064   42000      73X       JSX .W6
24065    2000    2646R       LDA =D3008
24066   42000      73X       JSX .W6
24067    2000   16201R       LDA =B2001
24070   42000      73X       JSX .W6
24071    1675   77675A       LDA V15 BLEDS
24072   62000    2411R       IOR =D4
24073   31675   77675A       STA V15 BLEDS
24074                  L1382 EQU * CDUMP
24074    2000   10241R       LDA =B177743
24075   70540                P*C A
24076    2000    1457R       LDA =D1
24077                  A1383 EQU *
24077   31474   77474A       STA V42 KL
24100    1730   77730A       LDA V30 KFLAG
24101   62000    2410R       IOR =B200
24102   31730   77730A       STA V30 KFLAG
24103    2000    1704R       LDA =D6
24104   70540                P*C A
24105    2000    2411R       LDA =D4
24106   70540                P*C A
24107    1474   77474A       LDA V42 KL
24110   42000      60X       JSX .ARAI
24111              15R       DEF V39 BWAMP
24112   42000     122X       JSX CNV42
24113   42000   13062R       JSM P793  NDUMP
24114    1474   77474A       LDA V42 KL
24115  170040                TCA
24116   22000    1457R       ADA =D1
24117  172402                SAM *+2
24120   66000   24156R       JMP A1384
24121    1474   77474A       LDA V42 KL
24122   22000   24137R       ADA =D-14
24123  172033               SAP A1384
24124    1601   77601A       LDA V32641  HPBC
24125  172013               SAP A1385
24126   42000   13030R       JSM P789  WCRLF
24127   66000   24142R       JMP A1386
24130    4021
24131    2013
24132    4170
24133      25
24134    4172
24135    2522
24136    2022
24137  177762
24130                        LIT
24140                  A1385 EQU *
24140   42000    2206R       JSM P272  SPACE
24141   42000    2206R       JSM P272  SPACE
24142                  A1386 EQU *
24142    1730   77730A       LDA V30 KFLAG
24143   62000    2410R       IOR =B200
24144   31730   77730A       STA V30 KFLAG
24145    2000    1457R       LDA =D1
24146   70540                P*C A
24147    2000    1456R       LDA =D12
24150   70540                P*C A
24151    1474   77474A       LDA V42 KL
```

```
24152  42000    133X      JSX .LRAY
24153             12R      DEF V37 BWFRQ
24154  42000    134X      JSX .LDBA
24155  42000  13062R      JSM P793  NDUMP
24156                    A1384 EQU *
24156   1601  77601A      LDA V32641  HPBC
24157 172003             SAP A1387
24160  42000  13030R      JSM P789  WCRLF
24161  66000  24163R      JMP A1388
24162                    A1387 EQU *
24162  42000   2173R      JSM P271  CRLF
24163                    A1388 EQU *
24163   2000   1457R      LDA =D1
24164  21474  77474A      ADA V42 KL
24165 144016     16A      ISZ C,I
24166  66000  24077R      JMP A1383
24167  54016     16A      DSZ C
24170   2000   2417R      LDA =B177772
24171  70540              PWC A
24172   2000   2276R      LDA =D2
24173                    A1389 EQU *
24173  31474  77474A      STA V42 KL
24174  22000   5115R      ADA =D-7
24175 172004             SAP A1390
24176   1730  77730A      LDA V30 KFLAG
24177  62000   2410R      IOR =B200
24200  31730  77730A      STA V30 KFLAG
24201                    A1390 EQU *
24201   1474  77474A      LDA V42 KL
24202  42000      7X      JSM P198  ATNER
24203  31572  77572A      STA V32634  J
24204   6000   2203R      LDB =D8
24205  34011     11A      STB PA
24206   2000   1704R      LDA =D6
24207  70540              PWC A
24210   2000   2411R      LDA =D4
24211  70540              PWC A
24212   1572  77572A      LDA V32634  J
24213  42000    122X      JSX CNV42
24214  42000  13062R      JSM P793  NDUMP
24215   1601  77601A      LDA V32641  HPBC
24216 172003             SAP A1391
24217  42000  13030R      JSM P789  WCRLF
24220  66000  24222R      JMP A1392
24221                    A1391 EQU *
24221  42000   2206R      JSM P272  SPACE
24222                    A1392 EQU *
24222   2000   1457R      LDA =D1
24223  21474  77474A      ADA V42 KL
24224 144016     16A      ISZ C,I
24225  66000  24173R      JMP A1389
24226  54016     16A      DSZ C
24227   1740  77740A      LDA V32736  EFLAG
24230  52000   1770R      AND =B20000
24231  61601  77601A      IOR V32641  HPBC
24232  52000  24237R      AND =B120000
24233  22000   4207R      ADA =B160000
24234  72004              RZA A1393
24235  42000  13045R      JSM P791  OHPB
24236  66000  24074R      JMP L1382 CDUMP
24237 120000
24237                     LIT
24240                    A1393 EQU *
24240   2000   3110R      LDA =B2024
24241   6000   2203R      LDB =D8
24242  42000     72X      JSX .WS6
24243   1675  77675A      LDA V15 BLEDS
24244  52000   2153R      AND =B177773
24245  31675  77675A      STA V15 BLEDS
24246   1730  77730A      LDA V30 KFLAG
24247  52000  13044R      AND =B177577
24250  31730  77730A      STA V30 KFLAG
24251  66000  24373R      JMP A1349
24252                    C1394 EQU *
24252   2000  24327R      LDA =B10010
24253  42000  15274R      JSM P967  TMODE
24254  66000  24373R      JMP A1349
24255                    C1395 EQU *
24255   2000  24330R      LDA =B20010
24256  42000  15274R      JSM P967  TMODE
24257  66000  24373R      JMP A1349
24260                    C1396 EQU *
24260   2000  16710R      LDA =B177730
24261  42000  14741R      JSM P929  ENTRY
24262  66000  24373R      JMP A1349
24263                    C1397 EQU *
24263   1563  77563A      LDA V32627  DSTAD
24264   6000   2203R      LDB =D8
24265  42000     75X      JSX .WS4
24266  22000   3112R      ADA =D1001
24267  52000   6353R      AND =B7777
24270  31563  77563A      STA V32627  DSTAD
24271  42000  13045R      JSM P791  OHPB
24272  42000    166X      JSX .CSHV
24273           4630R      DEF P421  RDBMV
24274   1601  77601A      LDA V32641  HPBC
24275 170507              SAR 8
24276  42000     21X      JSM P208  IDUMP
24277  42000  15334R      JSM P969  CLRDA
24300  66000  24373R      JMP A1349
24301                    C1398 EQU *
```

```
24301    2000   20430R        LDA =B32
24302   42000   15546R        JSM P214   KEY
24303   66000   24373R        JMP A1349
24304                   C1399 EQU *
24304   42000   13045R        JSM P791   UHPB
24305    2000    3112R        LDA =D1001
24306   70540                 PWC A
24307   42000     166X        JSX .CSHV
24310           77563A        DEF V32627   DSTAD
24311   42000      25X        JSM P212   IHPBT
24312   42000   15334R        JSM P969   CLRDA
24313   66000   24373R        JMP A1349
24314                   C1400 EQU *
24314    2000   10143R        LDA =B177725
24315   42000   14741R        JSM P929   ENTRY
24316   66000   24373R        JMP A1349
24317                   C1401 EQU *
24317   42000   13045R        JSM P791   UHPB
24320    2000    1277R        LDA =B177777
24321   70540                 PWC A
24322   42000     166X        JSX .CSHV
24323           77563A        DEF V32627   DSTAD
24324   42000      25X        JSM P212   IHPBT
24325   42000   15334R        JSM P969   CLRDA
24326   66000   24373R        JMP A1349
24327   10010
24330   20010
24327                       LIT
24331           24317R        DEF C1401
24332           24314R        DEF C1400
24333           24304R        DEF C1399
24334           24301R        DEF C1398
24335           24263R        DEF C1397
24336           24260R        DEF C1396
24337           24255R        DEF C1395
24340           24252R        DEF C1394
24341           24056R        DEF C1381
24342           24040R        DEF C1379
24343           24026R        DEF C1378
24344           24011R        DEF C1376
24345           24373R        DEF A1349
24346           24005R        DEF C1375
24347           24000R        DEF C1374
24350           23772R        DEF C1373
24351           23764R        DEF C1372
24352           23757R        DEF C1371
24353           23747R        DEF C1370
24354           23706R        DEF C1368
24355           23674R        DEF C1367
24356           23662R        DEF C1366
24357           23570R        DEF C1361
24360           23563R        DEF C1360
24361           23556R        DEF C1359
24362           23552R        DEF C1358
24363           23544R        DEF C1357
24364           23537R        DEF C1356
24365           23455R        DEF C1352
24366           23447R        DEF C1351
24367           23441R        DEF C1350
24370           23436R        DEF C1348
24371                         DEC -33
24372   42000     143X  A1347 JSX .CASE
24373                   A1349 EQU *
24373                   A1346 EQU *
24373   66000   24627R        JMP A1088
24374                   C1402 EQU *
24374    1566   77566A        LDA V32630   KEYCODE
24375  170040                 TCA
24376   22000   24424R        ADA =B177
24377  172027                 SAP A1403
24400    1566   77566A        LDA V32630   KEYCODE
24401   22000   24425R        ADA =B-220
24402  172024                 SAP A1403
24403    1566   77566A        LDA V32630   KEYCODE
24404   31606   77606A        STA V32646   SRCEID
24405   73003                 SLA A1404
24406   62000    4207R        IOR =B160000
24407   31606   77606A        STA V32646   SRCEID
24410                   A1404 EQU *
24410  170615                 SAL 14
24411  172004                 SAP A1405
24412    1606   77606A        LDA V32646   SRCEID
24413   62000    2644R        IOR =B10000
24414   31606   77606A        STA V32646   SRCEID
24415                   A1405 EQU *
24415    1606   77606A        LDA V32646   SRCEID
24416   52000    4256R        AND =B170000
24417   72404                 SZA A1406
24420    2000    3654R        LDA =B20
24421    6000    2411R        LDB =D4
24422   42000     112X        JSX .MS7
24423                   A1406 EQU *
24423   66000   24617R        JMP A1407
24424     177
24425  177560
24424                       LIT
24426                   A1403 EQU *
24426    1566   77566A        LDA V32630   KEYCODE
24427   12000   24443R        CPA =B220
24430   66000   24432R        JMP *+2
24431   66000   24445R        JMP A1408
```

```
10933  24432  42000  15344R   JSM P971  USFT
10934  24433  42000  10312R   JSM P218  MKREL
10935  24434 172004           SAP A1410
10936  24435   1576  77576A   LDA V32638  RPGPTR
10937  24436  12000   7565R   CPA =D18
10938  24437  66000  24442R   JMP A1409
10939  24440                A1410 EQU *
10940  24440   2000  24444R   LDA =B117
10941  24441  42000  15546R   JSM P214  KEY
10942  24442                A1409 EQU *
10943  24442  66000  24617R   JMP A1411
       24443    220
       24444    117
10944  24443                 LIT
10945  24445                A1408 EQU *
10946  24445  22000  24453R   ADA =B-236
10947  24446 172006           SAP A1412
10948  24447  42000  15344R   JSM P971  USFT
10949  24450   2000  17407R   LDA =B115
10950  24451  42000  15546R   JSM P214  KEY
10951  24452  66000  24617R   JMP A1413
       24453 177542
10952  24453                 LIT
10953  24454                A1412 EQU *
10954  24454   1566  77566A   LDA V32630  KEYCODE
10955  24455  12000  24574R   CPA =B236
10956  24456  66000  24460R   JMP *+2
10957  24457  66000  24615R   JMP A1414
10958  24460   1606  77606A   LDA V32646  SRCEID
10959  24461 172017           SAP A1415
10960  24462  42000    167X   JSX .ADDR
10961  24463         24575R   DEF ="CF"
10962  24464  42000     13X   JSM P202  STHPB
10963  24465  42000     37X   JSX .LDB1
10964  24466         77665A   DEF V8  CFREQ
10965  24467  42000     62X   JSX CNV21
10966  24470  42000     11X   JSM P200  CNV15
10967  24471   1427  77427A   LDA V32535  AS
10968  24472  42000     13X   JSM P202  STHPB
10969  24473   1606  77606A   LDA V32646  SRCEID
10970  24474  52000   6015R   AND =B70000
10971  24475  72403           SZA A1416
10972  24476   2000   2723R   LDA =B54
10973  24477  42000     17X   JSM P206  WHPIB
10974  24500                A1416 EQU *
10975  24500                A1415 EQU *
10976  24500   1606  77606A   LDA V32646  SRCEID
10977  24501 170600           SAL 1
10978  24502 172017           SAP A1417
10979  24503  42000    167X   JSX .ADDR
10980  24504         24577R   DEF ="SP"
10981  24505  42000     13X   JSM P202  STHPB
10982  24506  42000     37X   JSX .LDB1
10983  24507         77671A   DEF V9  SPAN
10984  24510  42000     62X   JSX CNV21
10985  24511  42000     11X   JSM P200  CNV15
10986  24512   1427  77427A   LDA V32535  AS
10987  24513  42000     13X   JSM P202  STHPB
10988  24514   1606  77606A   LDA V32646  SRCEID
10989  24515  52000  17331R   AND =B30000
10990  24516  72403           SZA A1418
10991  24517   2000   2723R   LDA =B54
10992  24520  42000     17X   JSM P206  WHPIB
10993  24521                A1418 EQU *
10994  24521                A1417 EQU *
10995  24521   1606  77606A   LDA V32646  SRCEID
10996  24522 170601           SAL 2
10997  24523 172027           SAP A1419
10998  24524  42000    167X   JSX .ADDR
10999  24525         24601R   DEF ="ST"
11000  24526  42000     13X   JSM P202  STHPB
11001  24527   1733  77733A   LDA V20 FSTIM
11002  24530 172004           SAP A1420
11003  24531   1731  77731A   LDA V18 SINDEX
11004  24532  42000   4411R   JSM P406  EXP2
11005  24533  66000  24537R   JMP A1421
11006  24534                A1420 EQU *
11007  24534   1731  77731A   LDA V18 SINDEX
11008  24535  22000   5520R   ADA =D24
11009  24536  42000   4356R   JSM P403  EXPSIX
11010  24537                A1421 EQU *
11011  24537  42000     62X   JSX CNV21
11012  24540  42000     41X   JSX MPY1
11013  24541         24603R   DEF =F1@-6
11014  24542  42000     11X   JSM P200  CNV15
11015  24543   1427  77427A   LDA V32535  AS
11016  24544  42000     13X   JSM P202  STHPB
11017  24545   1606  77606A   LDA V32646  SRCEID
11018  24546 170602           SAL 3
11019  24547 172003           SAP A1422
11020  24550   2000   2723R   LDA =B54
11021  24551  42000     17X   JSM P206  WHPIB
11022  24552                A1422 EQU *
11023  24552                A1419 EQU *
11024  24552   1606  77606A   LDA V32646  SRCEID
11025  24553 170602           SAL 3
11026  24554 172013           SAP A1423
11027  24555  42000    167X   JSX .ADDR
11028  24556         24607R   DEF ="RL"
11029  24557  42000     13X   JSM P202  STHPB
11030  24560   1700  77700A   LDA V22 RLVL
```

```
24561  42000      45X     JSX  CNV41
24562  42000      41X     JSX  MPY1
24563          24611R     DEF  =F10-1
24564  42000      11X     JSM  P200   CNV15
24565   1427   77427A     LDA  V32535  AS
24566  42000      13X     JSM  P202   STHPB
24567                   A1423 EQU  *
24567   1606   77606A     LDA  V32646   SRCEID
24570  52000    6353R     AND  =B7777
24571  31606   77606A     STA  V32646   SRCEID
24572  42000   13030R     JSM  P789   *CRLF
24573  66000   24617R     JMP  A1424
24574    236
24575 CF
24577 SP
24601 ST
24603   1@-6
24607 RL
24611   1@-1
24574                    LIT
24615                   A1414 EQU  *
24615   2000    1463R     LDA  =D0
24616  42000   14741R     JSM  P929   ENTRY
24617                   A1424 EQU  *
24617                   A1413 EQU  *
24617                   A1411 EQU  *
24617                   A1407 EQU  *
24617  66000   24627R     JMP  A1088
24620          24374R     DEF  C1402
24621          22353R     DEF  C1283
24622          17510R     DEF  C1137
24623          16756R     DEF  C1089
24624          15716R     DEF  C1000
24625                     DEC  -6
24626  42000     143X   A999  JSX  .CASE
24627                   A1088 EQU  *
24627   1566   77566A     LDA  V32630   KEYCODE
24630 170040              TCA
24631  22000   24424R     ADA  =B177
24632 172002             SAP A1425
24633  42000   15344R     JSM  P971   USFT
24634                   A1425 EQU  *
24634                   L984  EQU  * EXIT
24634  66000      31X     JMX  .RTNA
24635                   P220  EQU  * SAVEM
24635   6000    1277R     LDB  =D-1
24636  42000      27X     JSX  .ARGA
24637  42000   15351R     JSM  P972   SAVPREP
24640   6000    1301R     LDB  =D-3   S
24641  42000      30X     JSX  .LDAP
24642  52000    2406R     AND  =D7
24643  31572   77572A     STA  V32634   J
24644   2000   15667R     LDA  =B177731
24645  70540              PWC  A
24646   2000    1457R     LDA  =D1
24647                   A1426 EQU  *
24647  31573   77573A     STA  V32635   I
24650  70540              PWC  A
24651   1572   77572A     LDA  V32634   J
24652  42000     174X     JSX  .ARRI
24653             213R     DEF  V115   ASAVE
24654  70541              PWC  B
24655   1573   77573A     LDA  V32635   I
24656  42000      60X     JSX  .ARAY
24657               7R     DEF  V4   MSTATE
24660  42000     170X     JSX  .STAC
24661   2000    1457R     LDA  =D1
24662  21573   77573A     ADA  V32635   I
24663 144016      16A     ISZ  C,1
24664  66000   24647R     JMP  A1426
24665  54016      16A     DSZ  C
24666  42000   15405R     JSM  P973   SAVCLR
24667  66000      31X     JMX  .RTNA
24670                   P1427 EQU  * NUMKEY
24670 174517              CLB
24671  42000      56X     JSX  .ARGS
24672  44016      16A     ISZ  C
24673   1566   77566A     LDA  V32630   KEYCODE
24674  22000    3232R     ADA  =B-60
24675 172415             SAM A1428
24676   1566   77566A     LDA  V32630   KEYCODE
24677  22000   15671R     ADA  =B-72
24700 172012             SAP A1428
24701   1620   77620A     LDA  V32656   PREFIX
24702  12000    1456R     CPA  =D12
24703  66000   24712R     JMP  A1428
24704   1620   77620A     LDA  V32656   PREFIX
24705 170500              SAR  1
24706  12000    1456R     CPA  =D12
24707  66000   24712R     JMP  A1428
24710   2000    1277R     LDA  =D-1
24711  66000   24713R     JMP  A1429
24712                   A1428 EQU  *
24712 170517              CLA
24713                   A1429 EQU  *
24713  66000      31X     JMX  .RTNA
24714                   A3    EQU  *
24714                   L194  EQU  * POP
24714   2000    3166R     LDA  =D1023
24715   6000    1463R     LDB  =D0
24716  42000     112X     JSX  .WS7
```

```
24717   2000    1704R   LDA =D6
24720  42000    3171R   JSM P327  MLDDF
24721   2000    2203R   LDA =D8
24722   6000    2411R   LDB =D4
24723  42000     112X   JSX .WS7
24724   2000    1770R   LDA =B20000
24725   6000    1456R   LDB =D12
24726  42000      72X   JSX .WS6
24727   2000    2107R   LDA =D3
24730  31736   77736A   STA V32734  ETX
24731   2000   25250R   LDA =B77764
24732  31427   77427A   STA V32535  AS
24733   2000    2406R   LDA =D7
24734  42000   24635R   JSM P220  SAVEM
24735  42000      53X   JSX .LDS1
24736           1463R   DEF =D0
24737  42000      34X   JSX .STRD
24740          77707A   DEF V11 FOFSET
24741   2000    3312R   LDA =D100
24742  31610   77610A   STA V32648  ALIM
24743  31705   77705A   STA V32 THRESH
24744   2000    6352R   LDA =D3072
24745  31563   77563A   STA V32627  DSTAD
24746   2000    3654R   LDA =B20
24747  31426   77426A   STA V32534  UFLAG
24750   1616   77616A   LDA V32654  XFLAG
24751  52000   11310R   AND =B400
24752  31616   77616A   STA V32654  XFLAG
24753   2000    1463R   LDA =D0
24754  31723   77723A   STA V26 MKRMODE
24755  31606   77606A   STA V32646  SRCEID
24756  31706   77706A   STA V31 ROFSET
24757  31434   77434A   STA V32540  IF2
24760  31603   77603A   STA V32643  PLOCK
24761  31565   77565A   STA V32629  SRUEN
24762   2000    1463R   LDA =D0
24763  31577   77577A   STA V32639  CTBASE
24764  31733   77733A   STA V20 FS1IM
24765  31575   77575A   STA V32637  K
24766  31604   77604A   STA V32644  SATN
24767  31614   77614A   STA V32652  DAC2
24770  31601   77601A   STA V32641  HPBC
24771  31607   77607A   STA V32647  ACNT
24772   2000    2107R   LDA =D3
24773  31431   77431A   STA V32537  RPGSWP
24774   2000   25251R   LDA =D550
24775  31704   77704A   STA V33 LEVLIN
24776   1740   77740A   LDA V32736  EFLAG
24777  52000    3654R   AND =D16
25000  62000   25252R   IOR =B2014
25001  31740   77740A   STA V32736  EFLAG
25002   2000    5517R   LDA =B100000
25003  31435   77435A   STA V32541  IF1
25004   6000    1704R   LDB =D6
25005  42000     171X   JSX .RS4
25006  31573   77573A   STA V32635  I
25007  42000     162X   JSX .R5
25010  31572   77572A   STA V32634  J
25011 170601            SAL 2
25012 172404           SAM A1431
25013   2000    1463R   LDA =D0
25014  31432   77432A   STA V32538  GIN2
25015  31433   77433A   STA V32539  GIN1
25016                  A1431 EQU *
25016   1573   77573A   LDA V32635  I
25017 170501            SAR 2
25020  52000   17331R   AND =B30000
25021  70540            PWC A
25022   1572   77572A   LDA V32634  J
25023  52000    4533R   AND =B140000
25024  42000     136X   JSX .ORT
25025  70540            PWC A
25026   1730   77730A   LDA V30 KFLAG
25027  52000    1364R   AND =B100
25030  42000     136X   JSX .ORT
25031  31730   77730A   STA V30 KFLAG
25032   2000   25253R   LDA =B174710
25033  31677   77677A   STA V17 RFAT
25034  42000     161X   JSX .MVE4
25035          12167R   DEF =F100000000
25036          77713A   DEF V7  FSTEP
25037   2000    4167R   LDA =B240
25040  42000    2163R   JSM P270  TLEDSOUT
25041   2000    1277R   LDA =B177777
25042  31602   77602A   STA V32642  LKMSK
25043   2000    2205R   LDA =B40
25044  31702   77702A   STA V24 VIDCON
25045     15      15A   LDA V2  DMAMA
25046 170612            SAL 11
25047  31675   77675A   STA V15 BLEDS
25050  72203           SFS A1432
25051  62000    2644R   IOR =B10000
25052  31675   77675A   STA V15 BLEDS
25053                  A1432 EQU *
25053 170140            CMA
25054   6000    2276R   LDB =D2
25055  42000      75X   JSX .WS4
25056   1702   77702A   LDA V24 VIDCON
25057   6000    2221R   LDB =D9
25060  42000      75X   JSX .WS4
25061   2000    1457R   LDA =D1
```

```
25062   42000    3046R      JSM P321   CLEAR
25063    2000    2107R      LDA =D3
25064   42000    3046R      JSM P321   CLEAR
25065    2000    2411R      LDA =D4
25066   42000    3046R      JSM P321   CLEAR
25067    2000   10142R      LDA =D31
25070   42000    2223R      JSM P274   NBLK
25071    2000   17114R      LDA =B177742
25072   70540               PWC A
25073    2000    2565R      LDA =D11
25074                 A1433 EQU *
25074   31572   77572A      STA V32634   J
25075   42000    2434R      JSM P285   BLKOP
25076    2000    1457R      LDA =D1
25077   21572   77572A      ADA V32634   J
25100  144016      16A      ISZ C,I
25101   66000   25074R      JMP A1433
25102   54016      16A      DSZ C
25103    2000    1463R      LDA =D0
25104    6000    2203R      LDB =D6
25105   42000      75X      JSX .WS4
25106    2000    7570R      LDA =B2020
25107   42000      73X      JSX .W6
25110    2000   25254R      LDA =D120
25111   70540               PWC A
25112    2000    1457R      LDA =D1
25113   42000   10713R      JSM P656   GRAT
25114    2000    2066R      LDA =B177770
25115   70540               PWC A
25116    2000    1457R      LDA =D1
25117                 A1434 EQU *
25117   31572   77572A      STA V32634   J
25120   42000    2223R      JSM P274   NBLK
25121    2000    1457R      LDA =D1
25122   21572   77572A      ADA V32634   J
25123  144016      16A      ISZ C,I
25124   66000   25117R      JMP A1434
25125   54016      16A      DSZ C
25126    2000    1463R      LDA =D0
25127   42000   14741R      JSM P929   ENTRY
25130    2000    1457R      LDA =D1
25131    6000    2107R      LDB =D3
25132   42000      75X      JSX .WS4
25133    2000    2276R      LDA =D2
25134   42000     103X      JSX .W4
25135    2000    2107R      LDA =D3
25136   42000     103X      JSX .W4
25137    2000    2411R      LDA =D4
25140   42000     103X      JSX .W4
25141    2000    2405R      LDA =D5
25142   42000     103X      JSX .W4
25143   42000    1665R      JSM P245   READ
25144   42000    3530R      JSM P355   REFLEV
25145    2000    1704R      LDA =D6
25146   42000    2314R      JSM P279   SBLK
25147   76603               SSC A1435
25150    2000   22226R      LDA =B166
25151   42000     555R      JSM P215   SKEY
25152                 A1435 EQU *
25152   42000    3205R      JSM P329   BUSY
25153    2000    2723R      LDA =B54
25154   42000   15546R      JSM P214   KEY
25155    2000    2276R      LDA =D2
25156   42000   15546R      JSM P214   KEY
25157    2000    2406R      LDA =D7
25160   42000   15546R      JSM P214   KEY
25161    6000    2276R      LDB =D2
25162   42000     175X      JSX .RS6
25163   31567   77567A      STA V32631   KEYCOL
25164   42000     176X      JSX .R7
25165   31572   77572A      STA V32634   J
25166    1567   77567A      LDA V32631   KEYCOL
25167  170140               CMA
25170   42000     104X      JSX .TURN
25171            4534R      DEF =B40000
25172           77616A      DEF V32654   XFLAG
25173   31616   77616A      STA V32654   XFLAG
25174  170600               SAL 1
25175  172003               SAP A1436
25176    2000    6514R      LDA =B77777
25177   31565   77565A      STA V32629   SRGEN
25200                 A1436 EQU *
25200    1572   77572A      LDA V32634   J
25201  170613               SAL 12
25202  172003               SAP A1437
25203    2000   25255R      LDA =D28
25204   42000    2223R      JSM P274   NBLK
25205                 A1437 EQU *
25205                 L190  EQU * LOOP
25205   42000    7732R      JSM P599   FPNLON
25206   76702               SHC *+2
25207   66000   25315R      JMP L192   *LOOP
25210    1575   77575A      LDA V32637   K
25211   12000    1457R      CPA =D1
25212   66000   25217R      JMP A1439
25213  170040               TCA
25214   22000    2107R      ADA =D3
25215  172402               SAM *+2
25216   66000   25256R      JMP A1438
25217                 A1439 EQU *
25217    1703   77703A      LDA V21 STRIG
```

```
25220  12000   1770R   CPA =B20000
25221  66000  25256R   JMP A1438
25222   1676  77676A   LDA V16 TLEDS
25223  52000  16170R   AND =B611
25224  72432           SZA A1438
25225   6000   2221R   LDB =D9
25226  42000     74X   JSX .RS5
25227  31567  77567A   STA V32631  KEYCOL
25230   6000   2203R   LDB =D8
25231  42000     74X   JSX .RS5
25232  31567  77567A   STA V32631  KEYCOL
25233  52000   6353R   AND =B7777
25234  70540           PWC A
25235   5730  77730A   LDB V30 KFLAG
25236 174614           SBL 13
25237   2000   6352R   LDA =D3072
25240 176402           SBM A1441
25241   2000   1463R   LDA =D0
25242                 A1441 EQU *
25242  22000   3112R   ADA =D1001
25243  42000    116X   JSX SUB4T
25244 172012           SAP A1440
25245   2000   2107R   LDA =D3
25246  31575  77575A   STA V32637  K
25247  66000  25707R   JMP L191  SLOOP
25250  77764
25251   1046
25252   2014
25253 174710
25254    170
25255     34
25250                  LIT
25256                 A1440 EQU *
25256                 A1438 EQU *
25256   5730  77730A   LDB V30 KFLAG
25257 174614           SBL 13
25260   1702  77702A   LDA V24 VIDCON
25261 176002           SBP A1442
25262  52000   2066R   AND =B177770
25263                 A1442 EQU *
25263   6000   2221R   LDB =D9
25264  42000     75X   JSX .WS4
25265   1676  77676A   LDA V16 TLEDS
25266  52000  16170R   AND =B611
25267  72003           RZA A1444
25270   1733  77733A   LDA V20 FSTIM
25271 172005           SAP A1443
25272                 A1444 EQU *
25272   1703  77703A   LDA V21 STRIG
25273   6000   1456R   LDB =D12
25274  42000     72X   JSX .WS6
25275  66000  25312R   JMP A1445
25276                 A1443 EQU *
25276   6000   2276R   LDB =D2
25277  42000    175X   JSX .RS6
25300  31567  77567A   STA V32631  KEYCOL
25301  42000    176X   JSX .R7
25302  31573  77573A   STA V32635  I
25303 170507           SAR 8
25304  72406           SZA A1446
25305   1573  77573A   LDA V32635  I
25306  52000   2066R   AND =B177770
25307  62000   2107R   IOR =B3
25310  31573  77573A   STA V32635  I
25311  66000  25333R   JMP L1430 RLOOP
25312                 A1446 EQU *
25312                 A1445 EQU *
25312   2000   1704R   LDA =D6
25313   6000   2107R   LDB =D3
25314  42000     75X   JSX .WS4
25315                 L192  EQU * WLOOP
25315   2000   1463R   LDA =D0
25316  31575  77575A   STA V32637  K
25317   2000   1277R   LDA =B177777
25320  31566  77566A   STA V32630  KEYCODE
25321                 A1447 EQU *
25321  76302           SHS A1448
25322  66000  25321R   JMP A1447
25323                 A1448 EQU *
25323   2000   1770R   LDA =B20000
25324   6000   1456R   LDB =D12
25325  42000     72X   JSX .WS6
25326   6000   2276R   LDB =D2
25327  42000    175X   JSX .RS6
25330  31567  77567A   STA V32631  KEYCOL
25331  42000    176X   JSX .R7
25332  31573  77573A   STA V32635  I
25333                 L1430 EQU * RLOOP
25333   2000   2405R   LDA =D5
25334   6000   2107R   LDB =D3
25335  42000     75X   JSX .WS4
25336   1573  77573A   LDA V32635  I
25337  52000   2406R   AND =D7
25340  22000   1457R   ADA =D1
25341  66000  25706R   JMP A1449
25342                 C1450 EQU *
25342   6000   2221R   LDB =D9
25343  42000     74X   JSX .RS5
25344  31567  77567A   STA V32631  KEYCOL
25345   6000   2203R   LDB =D8
25346  42000     74X   JSX .RS5
```

```
25347  31567  77567A     STA V32631   KEYCOL
25350  52000   6353R     AND =B7777
25351  31567  77567A     STA V32631   KEYCOL
25352  22000   1277R     ADA =D-1
25353  11721  77721A     CPA V25 MRKR
25354  66000  25356R     JMP *+2
25355  66000  25361R     JMP A1451
25356   2000   2276R     LDA =D2
25357  31575  77575A     STA V32637   K
25360  66000  25414R     JMP A1452
25361                   A1451 EQU *
25361   5730  77730A     LDB V30 KFLAG
25362 174614             SBL 13
25363   2000   6352R     LDA =D3072
25364 176402             SBM A1454
25365   2000   1463R     LDA =D0
25366                   A1454 EQU *
25366  22000   3112R     ADA =D1001
25367 170040             TCA
25370  21567  77567A     ADA V32631   KEYCOL
25371 170040             TCA
25372 172004             SAP A1453
25373   2000   2107R     LDA =D3
25374  31575  77575A     STA V32637   K
25375  66000  25414R     JMP A1455
25376                   A1453 EQU *
25376   1721  77721A     LDA V25 MRKR
25377  12000   3166R     CPA =D1023
25400  66000  25405R     JMP A1457
25401   1567  77567A     LDA V32631   KEYCOL
25402 170040             TCA
25403  21721  77721A     ADA V25 MRKR
25404 172010             SAP A1456
25405                   A1457 EQU *
25405   5730  77730A     LDB V30 KFLAG
25406 174614             SBL 13
25407   2000   6350R     LDA =D4073
25410 176402             SBM A1458
25411   2000   3112R     LDA =D1001
25412                   A1458 EQU *
25412   6000   2221R     LDB =D9
25413  42000     72X     JSX .WS6
25414                   A1456 EQU *
25414                   A1455 EQU *
25414                   A1452 EQU *
25414  66000  25707R     JMP A1459
25415                   C1460 EQU *
25415   2000   1457R     LDA =D1
25416  42000    103X     JSX .W4
25417   2000   2107R     LDA =D3
25420  31575  77575A     STA V32637   K
25421   1573  77573A     LDA V32635   I
25422 170613             SAL 12
25423 172004             SAP A1461
25424   2000  25255R     LDA =D28
25425  42000   2223R     JSM P274   NBLK
25426  66000  25431R     JMP A1462
25427                   A1461 EQU *
25427   2000  25255R     LDA =D28
25430  42000   2434R     JSM P285   BLKOF
25431                   A1462 EQU *
25431  66000  25707R     JMP A1459
25432                   C1463 EQU *
25432   2000   2276R     LDA =D2
25433  42000    103X     JSX .W4
25434   1567  77567A     LDA V32631   KEYCOL
25435 170140             CMA
25436  42000    104X     JSX .TURN
25437          4534R     DEF =B40000
25440         77616A     DEF V32654   XFLAG
25441  31616  77616A     STA V32654   XFLAG
25442 170600             SAL 1
25443 172014             SAP A1464
25444   1740  77740A     LDA V32736   EFLAG
25445 170606             SAL 7
25446 172405             SAM A1466
25447   1620  77620A     LDA V32656   PREFIX
25450  12000  10243R     CPA =D27
25451  66000  25453R     JMP *+2
25452  66000  25455R     JMP A1465
25453                   A1466 EQU *
25453   2000  15026R     LDA =B7760
25454  66000  25456R     JMP A1467
25455                   A1465 EQU *
25455   2000   6514R     LDA =B77777
25456                   A1467 EQU *
25456  66000  25462R     JMP A1468
25457                   A1464 EQU *
25457   1576  77576A     LDA V32638   RPGPTR
25460 170040             TCA
25461  52000   5517R     AND =B100000
25462                   A1468 EQU *
25462  31565  77565A     STA V32629   SRQEN
25463   2000  15672R     LDA =B140
25464  42000  15546R     JSM P214   KEY
25465  66000  25707R     JMP A1459
25466                   C1469 EQU *
25466   2000   1457R     LDA =D1
25467  31575  77575A     STA V32637   K
25470   1573  77573A     LDA V32635   I
```

```
25471 170507                 SAR 6
25472  31573   77573A        STA V32635   I
25473   2000    1463R        LDA =D0
25474  31431   77431A        STA V32537   RPGSWP
25475   5567   77567A        LDB V32631   KEYCOL
25476 174606                 SBL 7
25477   2000    1457R        LDA =D1
25500 176402                SBM A1470
25501   2000    1277R        LDA =B177777
25502                      A1470 EQU *
25502  31574   77574A        STA V32636   RPG
25503   5573   77573A        LDB V32635   I
25504  75617                 MPY
25505  21564   77564A        ADA V32628   RPGCNT
25506  31564   77564A        STA V32628   RPGCNT
25507   2000    2107R        LDA =D3
25510  42000     103X        JSX .W4
25511  66000   25707R        JMP A1459
25512                      C1471 EQU *
25512   2000    1463R        LDA =D0
25513  31474   77474A        STA V42 KL
25514                      A1472 EQU *
25514   2000    3242R        LDA =B377
25515  31567   77567A        STA V32631   KEYCOL
25516   2000    1463R        LDA =D0
25517                      A1474 EQU *
25517  31573   77573A        STA V32635   I
25520  22000    7243R        ADA =D-12
25521 172021                SAP A1473
25522   1567   77567A        LDA V32631   KEYCOL
25523  12000    3242R        CPA =B377
25524  66000   25526R        JMP *+2
25525  66000   25542R        JMP A1473
25526   2000    2110R        LDA =B177776
25527   5573   77573A        LDB V32635   I
25530  42000     177X        JSX .RLFT
25531   6000    2276R        LDB =D2
25532  42000     107X        JSX .WS5
25533  42000     137X        JSX .R6
25534  31567   77567A        STA V32631   KEYCOL
25535  52000    3242R        AND =B377
25536  31567   77567A        STA V32631   KEYCOL
25537   2000    1457R        LDA =D1
25540  21573   77573A        ADA V32635   I
25541  66000   25517R        JMP A1474
25542                      A1473 EQU *
25542   2000   25621R        LDA =B177242
25543  70540                 PWC A
25544   2000    1457R        LDA =D1
25545                      A1475 EQU *
25545  31572   77572A        STA V32634   J
25546  42000     137X        JSX .R6
25547  31566   77566A        STA V32630   KEYCODE
25550  52000    3242R        AND =B377
25551  11567   77567A        CPA V32631   KEYCOL
25552  66000   25555R        JMP A1476
25553   2000    3242R        LDA =B377
25554  31567   77567A        STA V32631   KEYCOL
25555                      A1476 EQU *
25555   2000    1457R        LDA =D1
25556  21572   77572A        ADA V32634   J
25557 144016      16A        ISZ C,I
25560  66000   25545R        JMP A1475
25561  54016      16A        DSZ C
25562  45474   77474A        ISZ V42 KL
25563                        NOP
25564   1474   77474A        LDA V42 KL
25565 170040                 TCA
25566  22000    2107R        ADA =D3
25567 172404                SAM A1477
25570   1567   77567A        LDA V32631   KEYCOL
25571  12000    3242R        CPA =B377
25572  66000   25514R        JMP A1472
25573                      A1477 EQU *
25573   2000    1277R        LDA =B177777
25574  31566   77566A        STA V32630   KEYCODE
25575   1565   77565A        LDA V32629   SHGEN
25576  42000     105X        JSX .W5
25577   1567   77567A        LDA V32631   KEYCOL
25600  12000    3242R        CPA =B377
25601  66000   25631R        JMP A1478
25602   1730   77730A        LDA V30 KFLAG
25603  52000    6512R        AND =B177677
25604  31730   77730A        STA V30 KFLAG
25605   2000    1463R        LDA =D0
25606  31572   77572A        STA V32634   J
25607                      A1479 EQU *
25607   1572   77572A        LDA V32634   J
25610  22000    1375R        ADA =D-9
25611 172011                SAP A1480
25612   1567   77567A        LDA V32631   KEYCOL
25613   5572   77572A        LDB V32634   J
25614  42000     101X        JSX .TBIT
25615 172005                SAP A1480
25616  45572   77572A        ISZ V32634   J
25617                        NOP
25620  66000   25607R        JMP A1479
25621 177242
25621                       LIT
25622                      A1480 EQU *
25622   1573   77573A        LDA V32635   I
```

```
25623  22000   2107R     ADA =D3
25624 170602             SAL 3
25625  61572  77572A     IOR V32634   J
25626  31566  77566A     STA V32630   KEYCODE
25627   2000   2405R     LDA =D5
25630  31575  77575A     STA V32637   K
25631                   A1478 EQU *
25631   2000   2411R     LDA =D4
25632  42000   3214R     JSM P332  WAIT
25633   2000   2107R     LDA =D3
25634   6000   2107R     LDB =D3
25635  42000     75X     JSX .WS4
25636   2000   2411R     LDA =D4
25637  42000    103X     JSX .W4
25640  66000  25707R     JMP A1459
25641                   C1481 EQU *
25641   2000   2405R     LDA =D5
25642  31575  77575A     STA V32637   K
25643                   L1482 EQU * HLOOP
25643   6000   2411R     LDB =D4
25644  42000     74X     JSX .RS5
25645  31566  77566A     STA V32630   KEYCODE
25646  52000   3242R     AND =B377
25647  31566  77566A     STA V32630   KEYCODE
25650  42000  24670R     JSM P1427 NUMKEY
25651 172015             SAP A1483
25652   1601  77601A     LDA V32641   HPBC
25653  42000    106X     JSX .W7
25654  42000  15471R     JSM P976  NUMBER
25655                   A1484 EQU *
25655  76302             SHS A1485
25656  66000  25655R     JMP A1484
25657                   A1485 EQU *
25657   6000   2276R     LDB =D2
25660  42000    110X     JSX .RS7
25661  31573  77573A     STA V32635   I
25662  52000   2406R     AND =D7
25663  12000   1704R     CPA =D6
25664  66000  25643R     JMP L1482 HLOOP
25665  66000  25315R     JMP L192  WLOOP
25666                   A1483 EQU *
25666   1601  77601A     LDA V32641   HPBC
25667  62000   1770R     IOR =B20000
25670  31601  77601A     STA V32641   HPBC
25671  66000  25707R     JMP A1459
25672                   C1486 EQU *
25672   2000   2411R     LDA =D4
25673  31575  77575A     STA V32637   K
25674  66000  25707R     JMP A1459
25675         25672R     DEF C1486
25676         25641R     DEF C1481
25677         25707R     DEF A1459
25700         25512R     DEF C1471
25701         25466R     DEF C1469
25702         25432R     DEF C1463
25703         25415R     DEF C1460
25704         25342R     DEF C1450
25705                    DEC -9
25706  42000    143X    A1449 JSX .CASE
25707                   A1459 EQU *
25707                   L191  EQU * SLOOP
25707   1575  77575A     LDA V32637   K
25710  66000  32431R     JMP A1487
25711                   C1488 EQU *
25711   1564  77564A     LDA V32628   RPGCNT
25712  42000    122X     JSX CNV42
25713  42000     36X     JSX .SAR2
25714   1605  77605A     LDA V32645   SCANSL
25715  72005             RZA A1489
25716  42000   2070R     JSM P261   IFBW
25717  22000   2110R     ADA =D-2
25720  42000   4420R     JSM P407   EXP3
25721  66000  25730R     JMP A1490
25722                   A1489 EQU *
25722  42000     37X     JSX .LDB1
25723         77671A     DEF V9   SPAN
25724  42000     62X     JSX CNV21
25725  42000     41X     JSX MPY1
25726         26246R     DEF =F.005
25727  42000     65X     JSX CNV12
25730                   A1490 EQU *
25730  42000    157X     JSX MPY21
25731  42000     34X     JSX .STRD
25732         77651A     DEF V32681   LTEMP
25733   1576  77576A     LDA V32638   RPGPTR
25734  66000  26275R     JMP A1491
25735                   C1492 EQU *
25735   1564  77564A     LDA V32628   RPGCNT
25736 172002             SAP *+2
25737 170040             TCA
25740 170040             TCA
25741  22000   2301R     ADA =D19
25742 172013             SAP A1493
25743   2000   2565R     LDA =D11
25744  70540             PWC A
25745  42000   2070R     JSM P261   IFBW
25746  22000   2110R     ADA =D-2
25747  21574  77574A     ADA V32636   RPG
25750  42000   2132R     JSM P265   LIMIT
25751  22000   2276R     ADA =D2
25752  42000   4210R     JSM P392   IFBWOUT
```

```
25753   42000    7775R      JSM P603  CSCANBW
25754   42000    6723R      JSM P538  CSBLK
25755                      A1493 EQU *
25755   66000   26276R      JMP A1494
25756                      C1495 EQU *
25756    1564   77564A      LDA V32628  RPGCNT
25757  172002               SAP *+2
25760  170040               TCA
25761  170040               TCA
25762   22000    2301R      ADA =D19
25763  172010               SAP A1496
25764    2000    2172R      LDA =D13
25765   70540               PWC A
25766   42000    2111R      JSM P263  VBW
25767   21574   77574A      ADA V32636  RPG
25770   42000    2132R      JSM P265  LIMIT
25771   42000    4314R      JSM P400  VBWOUT
25772   42000    7775R      JSM P603  CSCANBW
25773                      A1496 EQU *
25773   66000   26276R      JMP A1494
25774                      C1497 EQU *
25774    1564   77564A      LDA V32628  RPGCNT
25775  172002               SAP *+2
25776  170040               TCA
25777  170040               TCA
26000   22000    2301R      ADA =D19
26001  172402               SAM *+2
26002   66000   26041R      JMP A1498
26003    1733   77733A      LDA V20 FS1IM
26004  172012               SAP A1499
26005    2000    2172R      LDA =D13
26006   70540               PWC A
26007    1731   77731A      LDA V18 SINDEX
26010   22000    1277R      ADA =D-1
26011   21574   77574A      ADA V32636  RPG
26012   42000    2132R      JSM P265  LIMIT
26013   22000    1457R      ADA =D1
26014   42000    4411R      JSM P406  EXP2
26015   66000   26037R      JMP A1500
26016                      A1499 EQU *
26016    1605   77605A      LDA V32645  SCANSL
26017   72010               RZA A1501
26020    2000    2205R      LDA =D32
26021   70540               PWC A
26022    1731   77731A      LDA V18 SINDEX
26023   21574   77574A      ADA V32636  RPG
26024   42000    2132R      JSM P265  LIMIT
26025   22000    5520R      ADA =D24
26026   66000   26036R      JMP A1502
26027                      A1501 EQU *
26027    2000    2416R      LDA =D29
26030   70540               PWC A
26031    1731   77731A      LDA V18 SINDEX
26032   22000    1301R      ADA =D-3
26033   21574   77574A      ADA V32636  RPG
26034   42000    2132R      JSM P265  LIMIT
26035   22000   10243R      ADA =D27
26036                      A1502 EQU *
26036   42000    4356R      JSM P403  EXPSIX
26037                      A1500 EQU *
26037   42000    7345R      JSM P558  SCANT
26040   42000    7775R      JSM P603  CSCANBW
26041                      A1498 EQU *
26041   66000   26276R      JMP A1494
26042                      C1503 EQU *
26042    1564   77564A      LDA V32628  RPGCNT
26043  172002               SAP *+2
26044  170040               TCA
26045  170040               TCA
26046   22000    2301R      ADA =D19
26047  172020               SAP A1504
26050    2000    1704R      LDA =D6
26051   70540               PWC A
26052    1677   77677A      LDA V17 RFAT
26053   52000    2406R      AND =D7
26054   21574   77574A      ADA V32636  RPG
26055   22000    1277R      ADA =D-1
26056   42000    2132R      JSM P265  LIMIT
26057   22000    1457R      ADA =D1
26060   42000     104X      JSX .TURN
26061            2406R      DEF =D7
26062           77677A      DEF V17 RFAT
26063   31677   77677A      STA V17 RFAT
26064    1700   77700A      LDA V22 RLVL
26065   42000    3530R      JSM P355  REFLEV
26066   42000    3255R      JSM P337  WRFAT
26067                      A1504 EQU *
26067   66000   26276R      JMP A1494
26070                      C1505 EQU *
26070   42000    4430R      JSM P408  LGSCL
26071   70540               PWC A
26072    2000    2204R      LDA =D10
26073   42000     200X      JSX DIV4T
26074   70540               PWC A
26075    1564   77564A      LDA V32628  RPGCNT
26076  172002               SAP *+2
26077  170040               TCA
26100   42000     116X      JSX SUB4T
26101  172412               SAM A1506
26102   42000    4430R      JSM P408  LGSCL
26103    5564   77564A      LDB V32628  RPGCNT
```

```
26104  75617            MPY
26105  42000      113X   JSX  DIV4
26106            2204R   DEF  =D10
26107  21700    77700A   ADA  V22 RLVL
26110  42000     3530R   JSM  P355   REFLEV
26111   2000     1463R   LDA  =D0
26112  31564    77564A   STA  V32628   RPGCNT
26113                  A1506 EQU *
26113  66000    26276R   JMP  A1494
26114                  C1507 EQU *
26114   1564    77564A   LDA  V32628   RPGCNT
26115 172002             SAP  *+2
26116 170040             TCA
26117 170040             TCA
26120  22000     2301R   ADA  =D19
26121 172017            SAP A1508
26122   2000     2107R   LDA  =D3
26123  70540             PWC  A
26124   1435    77435A   LDA  V32541   IF1
26125 170514             SAR  13
26126  52000     2107R   AND  =D3
26127 170040             TCA
26130  21574    77574A   ADA  V32636   RPG
26131 170040             TCA
26132  42000     2132R   JSM  P265   LIMIT
26133  62000     2411R   IOR  =D4
26134 170614             SAL  13
26135  42000     4171R   JSM  P390   LGD6
26136   1730    77730A   LDA  V30 KFLAG
26137  42000    15050R   JSM  P223   AMPU
26140                  A1508 EQU *
26140  66000    26276R   JMP  A1494
26141                  C1509 EQU *
26141  42000    12250R   JSM  P729   STEPF
26142  66000    26276R   JMP  A1494
26143                  C1510 EQU *
26143  42000      156X   JSX  .CLBI
26144           11304R   DEF  =F1699999900
26145  42000      150X   JSX  ADD2
26146           77671A   DEF  V9   SPAN
26147  42000      201X   JSX  SUB3
26150           11310R   DEF  =H100
26151  42000     2043R   JSM  P256   DLIMIT
26152  42000      163X   JSX  ADD3
26153           11310R   DEF  =H100
26154  42000    11120R   JSM  P666   SPANW
26155  66000    26276R   JMP  A1494
26156                  C1511 EQU *
26156  42000    12224R   JSM  P728   STEPL
26157  66000    26276R   JMP  A1494
26160                  C1512 EQU *
26160  42000    12200R   JSM  P727   STEPH
26161  66000    26276R   JMP  A1494
26162                  C1513 EQU *
26162  42000       37X   JSX  .LDBI
26163           77713A   DEF  V7   FSTEP
26164  42000      202X   JSX  .DSGN
26165 170416             AAR  15
26166 170600             SAL  1
26167  22000     1457R   ADA  =D1
26170  31572    77572A   STA  V32634   J
26171  42000      156X   JSX  .CLBI
26172           11137R   DEF  D674   1700000000
26173   4020       20A   LDB  AR2
26174  77202             SLB  *+2,C
26175  34020       20A   STB  AR2
26176  42000      150X   JSX  ADD2
26177           77651A   DEF  V32681   LTEMP
26200  42000     2043R   JSM  P256   DLIMIT
26201  42000       36X   JSX  .SAR2
26202   1572    77572A   LDA  V32634   J
26203  42000      122X   JSX  CNV42
26204  42000      157X   JSX  MPY2T
26205  42000       34X   JSX  .STRD
26206           77713A   DEF  V7   FSTEP
26207  66000    26276R   JMP  A1494
26210                  C1514 EQU *
26210   1615    77615A   LDA  V32653   DAC1
26211  21564    77564A   ADA  V32628   RPGCNT
26212  42000     3114R   JSM  P326   WDACS
26213  66000    26276R   JMP  A1494
26214                  C1515 EQU *
26214   1704    77704A   LDA  V33 LEVLIN
26215  21564    77564A   ADA  V32628   RPGCNT
26216  42000    11072R   JSM  P667   WLVLN
26217  66000    26276R   JMP  A1494
26220                  C1516 EQU *
26220   1705    77705A   LDA  V32 THRESH
26221  21564    77564A   ADA  V32628   RPGCNT
26222  42000    11044R   JSM  P666   WTHRSH
26223  66000    26276R   JMP  A1494
26224                  C1517 EQU *
26224   1564    77564A   LDA  V32628   RPGCNT
26225 172002             SAP  *+2
26226 170040             TCA
26227 170040             TCA
26230  22000     2204R   ADA  =D10
26231 172011            SAP A1518
26232   1564    77564A   LDA  V32628   RPGCNT
26233 172002             SAP  *+2
26234 170040             TCA
```

```
26235   5564  77564A      LDB V32628   RPGCNT
26236  75617              MPY
26237  42000    113X      JSX DIV4
26240          2203R      DEF =D8
26241  31564  77564A      STA V32628   RPGCNT
26242               A1518 EQU *
26242   1721  77721A      LDA V25 MRKR
26243  21564  77564A      ADA V32628   RPGCNT
26244  42000  11010R      JSM P663   STMRKR
26245  66000  26276R      JMP A1494
26246   .005
26246                    LIT
26252         26224R      DEF C1517
26253         26276R      DEF A1494
26254         26276R      DEF A1494
26255         26220R      DEF C1516
26256         26214R      DEF C1515
26257         26210R      DEF C1514
26260         26276R      DEF A1494
26261         26162R      DEF C1513
26262         26160R      DEF C1512
26263         26156R      DEF C1511
26264         26143R      DEF C1510
26265         26141R      DEF C1509
26266         26114R      DEF C1507
26267         26070R      DEF C1505
26270         26042R      DEF C1503
26271         25774R      DEF C1497
26272         25756R      DEF C1495
26273         25735R      DEF C1492
26274                     DEC -19
26275  42000    143X A1491 JSX .CASE
26276                A1494 EQU *
26276   1576  77576A      LDA V32638   RPGPIR
26277  22000  13136R      ADA =D-11
26300 172002             SAP A1519
26301  42000   2762R      JSM P314   AVGRST
26302                A1519 EQU *
26302  42000  12334R      JSM P217   MBLK
26303   1576  77576A      LDA V32638   RPGPIR
26304 170040              TCA
26305  22000   1704R      ADA =D6
26306 172407             SAM A1521
26307   1564  77564A      LDA V32628   RPGCNT
26310 172002              SAP *+2
26311 170040              TCA
26312 170040              TCA
26313  22000   2301R      ADA =D19
26314 172003             SAP A1520
26315                A1521 EQU *
26315   2000   1463R      LDA =D0
26316  31564  77564A      STA V32628   RPGCNT
26317                A1520 EQU *
26317  66000  32432R      JMP A1522
26320                C1523 EQU *
26320   1723  77723A      LDA V26 MKRMODE
26321  72002              RZA *+2
26322  66000  26645R      JMP A1524
26323  42000  10413R      JSM P636   MKRON
26324   1616  77616A      LDA V32654   XFLAG
26325  62000   2203R      IOR =B10
26326  31616  77616A      STA V32654   XFLAG
26327   1675  77675A      LDA V15 BLEDS
26330 170601              SAL 2
26331 172402              SAM *+2
26332  66000  26570R      JMP A1525
26333   2000   2411R      LDA =D4
26334  42000   3214R      JSM P332   WAIT
26335   1571  77571A      LDA V32633   L
26336  70540              PWC A
26337   1570  77570A      LDA V32632   M
26340  70540              PWC A
26341   1746  77746A      LDA V32742   N
26342  70540              PWC A
26343  42000   5033R      JSM P443   CPERIOD
26344 170040              TCA
26345  22000   2276R      ADA =D2
26346 172013             SAP A1526
26347   1576  77576A      LDA V32638   RPGPIR
26350  22000  13136R      ADA =D-11
26351 172010             SAP A1526
26352   1565  77565A      LDA V32629   SRGEN
26353  52000   6514R      AND =B77777
26354   6000   2276R      LDB =D2
26355  42000    107X      JSX .WS5
26356   2000   2107R      LDA =D3
26357   6000   2107R      LDB =D3
26360  42000     75X      JSX .WS4
26361                A1526 EQU *
26361   1616  77616A      LDA V32654   XFLAG
26362 170612              SAL 11
26363 172402              SAM *+2
26364  66000  26435R      JMP A1527
26365   2000   2203R      LDA =D8
26366  70540              PWC A
26367   1721  77721A      LDA V25 MRKR
26370  22000  10523R      ADA =D-501
26371  42000    122X      JSX CNV42
26372  42000    153X      JSX MPY2
26373         77671A      DEF V9   SPAN
```

```
26374   42000      26X      JSM P213   ROUND
26375    6000    2107R      LDB =D3
26376   42000      47X      JSX .DRGT
26377   42000     150X      JSX ADD2
26400           77665A      DEF V8   CFREQ
26401   42000    6016R      JSM P500   STONE
26402    2000    2411R      LDA =D4
26403   42000    3214R      JSM P332   WAIT
26404    2000    1457R      LDA =D1
26405   42000    5117R      JSM P450   COUNTIF
26406   42000      34X      JSX .STRD
26407           77661A      DEF V32689   LTEMP1
26410    2000    2276R      LDA =D2
26411   42000    6704R      JSM P537   CPILOT
26412   42000      34X      JSX .STRD
26413           77631A      DEF V32665   FPILOT
26414    2000    1457R      LDA =D1
26415   42000    5117R      JSM P450   COUNTIF
26416   42000     150X      JSX ADD2
26417           77661A      DEF V32689   LTEMP1
26420   42000     146X      JSX DIV3
26421            2276R      DEF =D2
26422   42000      36X      JSX .SAR2
26423    2000    2107R      LDA =D3
26424   42000    5117R      JSM P450   COUNTIF
26425   42000     146X      JSX DIV3
26426            2405R      DEF =D5
26427   42000     130X      JSX ADD2T
26430   42000     140X      JSX MIN2
26431           77631A      DEF V32665   FPILOT
26432   42000      34X      JSX .STRD
26433           77631A      DEF V32665   FPILOT
26434   66000   26506R      JMP A1528
26435                     A1527 EQU *
26435    1730   77730A      LDA V30 KFLAG
26436  170605               SAL 6
26437  172014              SAP A1529
26440    1577   77577A      LDA V32639   CIBASE
26441   12000    1704R      CPA =D6
26442   66000   26444R      JMP *+2
26443   66000   26453R      JMP A1529
26444    2000    2107R      LDA =D3
26445   42000    5117R      JSM P450   COUNTIF
26446    2000    2107R      LDA =D3
26447   42000    5117R      JSM P450   COUNTIF
26450   42000      34X      JSX .STRD
26451           77631A      DEF V32665   FPILOT
26452   66000   26456R      JMP A1530
26453                     A1529 EQU *
26453   42000    5545R      JSM P480   VTOSLEW
26454   42000      34X      JSX .STRD
26455           77631A      DEF V32665   FPILOT
26456                     A1530 EQU *
26456    2000    1457R      LDA =D1
26457   42000    5117R      JSM P450   COUNTIF
26460   42000      34X      JSX .STRD
26461           77661A      DEF V32689   LTEMP1
26462    1604   77604A      LDA V32644   SAIN
26463  170600               SAL 1
26464  172004              SAP A1531
26465   42000      53X      JSX .LDSI
26466            2205R      DEF =H20
26467   66000   26472R      JMP A1532
26470                     A1531 EQU *
26470   42000      53X      JSX .LDSI
26471            3654R      DEF =H10
26472                     A1532 EQU *
26472   42000      36X      JSX .SAR2
26473    2000    2107R      LDA =D3
26474   42000    5117R      JSM P450   COUNTIF
26475   42000     150X      JSX ADD2
26476           77631A      DEF V32665   FPILOT
26477   42000     164X      JSX DIV2T
26500   42000     150X      JSX ADD2
26501           77661A      DEF V32689   LTEMP1
26502   42000     140X      JSX MIN2
26503           11133R      DEF D673   20000000
26504   42000      34X      JSX .STRD
26505           77631A      DEF V32665   FPILOT
26506                     A1528 EQU *
26506    1570   77570A      LDA V32632   M
26507  170040               TCA
26510   22000    2521R      ADA =D17
26511  170603               SAL 4
26512   21571   77571A      ADA V32633   L
26513   42000     122X      JSX CNV42
26514   42000     153X      JSX MPY2
26515            6123R      DEF =F250000
26516   42000      36X      JSX .SAR2
26517   42000      53X      JSX .LDSI
26520           77746A      DEF V32742   N
26521   42000     153X      JSX MPY2
26522           11133R      DEF D673   20000000
26523   42000     124X      JSX SUB2T
26524   42000     150X      JSX ADD2
26525           77631A      DEF V32665   FPILOT
26526   42000     150X      JSX ADD2
26527           77707A      DEF V11 FOFSET
26530   42000      34X      JSX .STRD
26531           77645A      DEF V32677   MFREQ
26532   70760               WWC A
```

```
26533  31746   77746A     STA V32742  N
26534  70760              WWC A
26535  31570   77570A     STA V32632  M
26536  70760              WWC A
26537  31571   77571A     STA V32633  L
26540  42000    2154R     JSM P269  WSPIN
26541  42000   10312R     JSM P218  MKREL
26542 172007             SAP A1533
26543  42000      37X     JSX .LDB1
26544          77724A     DEF V10 AMF
26545  42000     140X     JSX MIN2
26546          77645A     DEF V32677  MFREQ
26547  42000      34X     JSX .STRD
26550          77645A     DEF V32677  MFREQ
26551                  A1533 EQU *
26551   1426   77426A     LDA V32534  UFLAG
26552  52000    6512R     AND =B177677
26553  31426   77426A     STA V32534  UFLAG
26554   1723   77723A     LDA V26 MKRMODE
26555  42000    2422R     JSM P284  BLKAD
26556   6000   26644R     LDB =B177160
26557  25722   77722A     ADB V29 MKRLVL
26560   2000    2521R     LDA =B21
26561 176402             SBM A1534
26562   2000    1463R     LDA =D0
26563                  A1534 EQU *
26563  42000      73X     JSX .W6
26564   2000    7570R     LDA =D1040
26565  70540              PWC A
26566   1723   77723A     LDA V26 MKRMODE
26567  42000    2522R     JSM P297  RJUST
26570                  A1525 EQU *
26570   1740   77740A     LDA V32736  EFLAG
26571  52000    2107R     AND =D3
26572  72417             SZA A1535
26573   1740   77740A     LDA V32736  EFLAG
26574  52000    2107R     AND =D3
26575  42000    5117R     JSM P450  COUNTIF
26576  42000      34X     JSX .STRD
26577          77625A     DEF V32661  CSIGNL
26600   1576   77576A     LDA V32638  RPGPTR
26601  12000    7565R     CPA =D18
26602  66000   26604R     JMP *+2
26603  66000   26611R     JMP A1536
26604   1740   77740A     LDA V32736  EFLAG
26605  52000    2107R     AND =D3
26606  22000   12734R     ADA =D35
26607  31620   77620A     STA V32656  PREFIX
26610  42000   13777R     JSM P865  DSPITEM
26611                  A1536 EQU *
26611                  A1535 EQU *
26611  42000   10301R     JSM P624  MKRACT
26612   1616   77616A     LDA V32654  XFLAG
26613  52000    1375R     AND =B177767
26614  31616   77616A     STA V32654  XFLAG
26615 170601              SAL 2
26616 172006             SAP A1537
26617   1616   77616A     LDA V32654  XFLAG
26620 170605              SAL 6
26621 172403             SAM A1537
26622   2000    1770R     LDA =B20000
26623  31703   77703A     STA V21 STRIG
26624                  A1537 EQU *
26624   1740   77740A     LDA V32736  EFLAG
26625 170602              SAL 3
26626 172007             SAP A1538
26627   1601   77601A     LDA V32641  HPBC
26630  62000    1770R     IOR =B20000
26631  31601   77601A     STA V32641  HPBC
26632   1740   77740A     LDA V32736  EFLAG
26633  52000    6371R     AND =B167777
26634  31740   77740A     STA V32736  EFLAG
26635                  A1538 EQU *
26635   1721   77721A     LDA V25 MKKR
26636  12000    3112R     CPA =D1001
26637  66000   26641R     JMP *+2
26640  66000   26645R     JMP A1539
26641   2000    2107R     LDA =D3
26642  31575   77575A     STA V32637  K
26643  66000   25707R     JMP L191  SLOOP
26644 177160
26644                     LIT
26645                  A1539 EQU *
26645                  A1524 EQU *
26645  66000   32432R     JMP A1522
26646                  C1540 EQU *
26646  66000   26762R     JMP A1541
26647                  P1542 EQU * PEAK
26647   6000    1277R     LDB =D-1
26650  42000      27X     JSX .ARGA
26651  44016      16A     ISZ C
26652  21721   77721A     ADA V25 MKKR
26653 170040              TCA
26654  22000    1457R     ADA =D1
26655 172402              SAM *+2
26656  66000   26757R     JMP A1543
26657   1721   77721A     LDA V25 MKKR
26660   6000    1301R     LDB =D-3  D
26661  42000     115X     JSX ADD4P
26662  22000   26755R     ADA =D-1000
26663 172402              SAM *+2
```

```
26664  66000  26757R     JMP A1543
26665   1721  77721A     LDA V25 MRKR
26666   6000   1301R     LDB =D-3  D
26667  42000    115X     JSX ADD4P
26670  22000   1277R     ADA =D-1
26671  70540             PWC A
26672   5730  77730A     LDB V30 KFLAG
26673 174614             SBL 13
26674   2000   6352R     LDA =D3072
26675 176410            SBM A1544
26676   1702  77702A     LDA V24 VIDCON
26677  52000   2406R     AND =D7
26700   4000             LDB A
26701   2000  20430R     LDA =B32
26702  42000    101X     JSX .TBIT
26703 170504             SAR 5
26704  52000   6703R     AND =D1024
26705                  A1544 EQU *
26705  42000     57X     JSX ADD4I
26706   6000   2203R     LDB =D8
26707  42000     75X     JSX .WS4
26710  42000    162X     JSX .R5
26711  31473  77473A     STA V41 KK
26712  42000    162X     JSX .R5
26713  31475  77475A     STA V43 KM
26714  42000    162X     JSX .R5
26715  31476  77476A     STA V44 KN
26716   1475  77475A     LDA V43 KM
26717 170604             SAL 5
26720 170404             AAR 5
26721  31475  77475A     STA V43 KM
26722   1722  77722A     LDA V29 MKRLVL
26723  22000  26756R     ADA =D-50
26724 170040             TCA
26725  21475  77475A     ADA V43 KM
26726 170040             TCA
26727 172022            SAP A1545
26730   1473  77473A     LDA V41 KK
26731 170604             SAL 5
26732 170404             AAR 5
26733 170040             TCA
26734  21475  77475A     ADA V43 KM
26735 172414            SAM A1545
26736   1476  77476A     LDA V44 KN
26737 170604             SAL 5
26740 170404             AAR 5
26741 170040             TCA
26742  21475  77475A     ADA V43 KM
26743 172406            SAM A1545
26744   1475  77475A     LDA V43 KM
26745 170040             TCA
26746 172003            SAP A1545
26747   2000   1277R     LDA =D-1
26750  66000  26752R     JMP A1546
26751                  A1545 EQU *
26751 170517             CLA
26752                  A1546 EQU *
26752   6000   2107R     LDB =D3 PEAK
26753  42000     67X     JSX .STAP
26754  66000  26761R     JMP A1547
26755 176030
26756 177716
26755                    LIT
26757                  A1543 EQU *
26757 170517             CLA
26760  66000     31X     JMX .RTNA
26761                  A1547 EQU *
26761  66000     70X     JMX .RTNI
26762                  A1541 EQU *
26762   1740  77740A     LDA V32736  EFLAG
26763 170610             SAL 9
26764 172002             SAP *+2
26765  66000  27431R     JMP A1548
26766   1610  77610A     LDA V32648  ALIM
26767  70540             PWC A
26770   1607  77607A     LDA V32647  ACNT
26771  22000   1457R     ADA =D1
26772  42000   2132R     JSM P265  LIMIT
26773  31607  77607A     STA V32647  ACNT
26774   1730  77730A     LDA V30 KFLAG
26775 170614             SAL 13
26776 172402             SAM *+2
26777  66000  27043R     JMP A1549
27000   1676  77676A     LDA V16 TLEDS
27001 170610             SAL 9
27002 172002            SAP A1550
27003  42000      6X     JSM P197  VDSUB
27004                  A1550 EQU *
27004   1676  77676A     LDA V16 TLEDS
27005 170507             SAR 8
27006  52000   1457R     AND =D1
27007  70540             PWC A
27010   1610  77610A     LDA V32648  ALIM
27011  70540             PWC A
27012   1607  77607A     LDA V32647  ACNT
27013  22000   1277R     ADA =D-1
27014  42000   2132R     JSM P265  LIMIT
27015  22000   1457R     ADA =D1
27016  42000      5X     JSM P196  VDAVG
27017   1607  77607A     LDA V32647  ACNT
27020 170040             TCA
```

```
27021 172005              SAP A1551
27022   1426   77426A      LDA V32534  UFLAG
27023  52000   16173R      AND =B177733
27024  62000    2205R      IOR =B40
27025  31426   77426A      STA V32534  UFLAG
27026                     A1551 EQU *
27026   2000    2205R      LDA =D32
27027  42000    2223R      JSM P274   NBLK
27030  42000    2173R      JSM P271   CRLF
27031   2000    1463R      LDA =D0
27032  70540               PWC A
27033   2000    2405R      LDA =D5
27034  70540               PWC A
27035   1607   77607A      LDA V32647  ACNT
27036  42000     122X      JSX CNV42
27037  42000   13062R      JSM P793   NDUMP
27040   2000    2421R      LDA =D146
27041  42000      73X      JSX .W6
27042  66000   27045R      JMP A1552
27043                     A1549 EQU *
27043   2000    2205R      LDA =D32
27044  42000    2434R      JSM P285   BLKOF
27045                     A1552 EQU *
27045   1607   77607A      LDA V32647  ACNT
27046  22000    1277R      ADA =D-1
27047 172011               SAP A1554
27050   1616   77616A      LDA V32654  XFLAG
27051 170605               SAL 6
27052 172002               SAP *+2
27053  66000   27367R      JMP A1553
27054   1675   77675A      LDA V15 BLEDS
27055 170600               SAL 1
27056 172002               SAP *+2
27057  66000   27367R      JMP A1553
27060                     A1554 EQU *
27060   1675   77675A      LDA V15 BLEDS
27061 170600               SAL 1
27062 172402               SAM *+2
27063  66000   27252R      JMP A1555
27064   1702   77702A      LDA V24 VIDCON
27065  52000    2406R      AND =D7
27066   4000               LDB A
27067   2000   27101R      LDA =B253
27070  42000     101X      JSX .TB11
27071 172402               SAM *+2
27072  66000   27252R      JMP A1555
27073   1721   77721A      LDA V25 MRKR
27074  12000   10522R      CPA =D501
27075  66000   27102R      JMP A1559
27076   2000    1463R      LDA =D0
27077  31607   77607A      STA V32647  ACNT
27100  66000   27206R      JMP L1557 ENDIT
27101    253
                           LIT
27101                     A1559 EQU *
27102                     L1556 EQU * SEARCH
27102   2000   20422R      LDA =B176027
27103  70540               PWC A
27104   2000    1463R      LDA =D0
27105                     A1560 EQU *
27105  31573   77573A      STA V32635  I
27106  42000   26647R      JSM P1542 PEAK
27107 172032               SAP A1561
27110   1475   77475A      LDA V43 KM
27111  31572   77572A      STA V32634  J
27112   1573   77573A      LDA V32635  I
27113 170040               TCA
27114  42000   26647R      JSM P1542 PEAK
27115   1475   77475A      LDA V43 KM
27116 170040               TCA
27117  21572   77572A      ADA V32634  J
27120 172410               SAM A1562
27121   1721   77721A      LDA V25 MRKR
27122  21573   77573A      ADA V32635  I
27123  31721   77721A      STA V25 MRKR
27124   6000    1277R      LDB =B177777
27125  24016     16A       ADB C
27126  34016     16A       STB C
27127  66000   27206R      JMP L1557 ENDIT
27130                     A1562 EQU *
27130   1573   77573A      LDA V32635  I
27131 170040               TCA
27132  21721   77721A      ADA V25 MRKR
27133  31721   77721A      STA V25 MRKR
27134   6000    1277R      LDB =B177777
27135  24016     16A       ADB C
27136  34016     16A       STB C
27137  66000   27102R      JMP L1556 SEARCH
27140                     A1563 EQU *
27140  66000   27143R      JMP A1564
27141                     A1561 EQU *
27141   1475   77475A      LDA V43 KM
27142  31572   77572A      STA V32634  J
27143                     A1564 EQU *
27143   1573   77573A      LDA V32635  I
27144 170040               TCA
27145  42000   26647R      JSM P1542 PEAK
27146 172024               SAP A1565
27147   1572   77572A      LDA V32634  J
27150 170040               TCA
27151  21475   77475A      ADA V43 KM
27152 172411               SAM A1566
27153   1573   77573A      LDA V32635  I
27154 170040               TCA
```

```
27155  21721   77721A     ADA V25 MRKR
27156  31721   77721A     STA V25 MRKR
27157   6000    1277R     LDB =B177777
27160  24016      16A     ADB C
27161  34016      16A     STB C
27162  66000   27206R     JMP L1557 FNDIT
27163                   A1566 EQU *
27163   1721   77721A     LDA V25 MRKR
27164  21573   77573A     ADA V32635  I
27165  31721   77721A     STA V25 MRKR
27166   6000    1277R     LDB =B177777
27167  24016      16A     ADB C
27170  34016      16A     STB C
27171  66000   27102R     JMP L1556 SEARCH
27172                   A1567 EQU *
27172                   A1565 EQU *
27172   2000    1457R     LDA =D1
27173  21573   77573A     ADA V32635  I
27174 144016      16A     ISZ C,I
27175  66000   27105R     JMP A1560
27176  54016      16A     DSZ C
27177   1722   77722A     LDA V29 MKRLVL
27200  42000     113X     JSX DIV4
27201           2204R     DEF =D10
27202 170040              TCA
27203  21722   77722A     ADA V29 MKRLVL
27204  31722   77722A     STA V29 MKRLVL
27205  66000   27240R     JMP L1558 NOSIGNL
27206                   L1557 EQU * FNDIT
27206   1675   77675A     LDA V15 BLEDS
27207 170601              SAL 2
27210 172403             SAM A1568
27211  42000   10413R     JSM P636  MKRON
27212  42000   10301R     JSM P624  MKRACT
27213                   A1568 EQU *
27213   2000    1463R     LDA =D0
27214  31575   77575A     STA V32637  K
27215  42000      37X     JSX .LDBI
27216          77665A     DEF V8  CFREQ
27217  42000     140X     JSX MIN2
27220          77645A     DEF V32677  MFREQ
27221  42000      36X     JSX .SAR2
27222  42000   10312R     JSM P218  MKREL
27223 172004             SAP A1569
27224  42000      37X     JSX .LDBI
27225          77724A     DEF V10 AMF
27226  66000   27231R     JMP A1570
27227                   A1569 EQU *
27227  42000      53X     JSX .LDSI
27230           1463R     DEF =D0
27231                   A1570 EQU *
27231  42000     130X     JSX ADD2T
27232  42000   11464R     JSM P701  STEPD
27233   2000    2107R     LDA =D3
27234  31575   77575A     STA V32637  K
27235  42000    6723R     JSM P538  CSBLK
27236   2000   10522R     LDA =D501
27237  31721   77721A     STA V25 MRKR
27240                   L1558 EQU * NOSIGNL
27240   1620   77620A     LDA V32656  PREFIX
27241  22000    1457R     ADA =D1
27242  52000    1363R     AND =B177774
27243  22000    2066R     ADA =B177770
27244  72005             RZA A1571
27245   1616   77616A     LDA V32654  XFLAG
27246 170602              SAL 3
27247 172002             SAP A1571
27250  42000    2551R     JSM P298  ABLK
27251                   A1571 EQU *
27251  66000   27260R     JMP A1572
27252                   A1555 EQU *
27252   1723   77723A     LDA V26 MKRMODE
27253  72405             SZA A1573
27254  42000    6127R     JSM P501  MKIS
27255 172403             SAM A1573
27256  42000   10413R     JSM P636  MKRON
27257  42000   10301R     JSM P624  MKRACT
27260                   A1573 EQU *
27260                   A1572 EQU *
27260   1616   77616A     LDA V32654  XFLAG
27261 170605              SAL 6
27262 172402              SAM *+2
27263  66000   27336R     JMP A1574
27264   2000    1463R     LDA =D0
27265  31575   77575A     STA V32637  K
27266  31607   77607A     STA V32647  ACNT
27267  42000      37X     JSX .LDBI
27270          77671A     DEF V9  SPAN
27271  42000    7327R     JSM P556  LOG2
27272  22000    2110R     ADA =D-2
27273  42000    4411R     JSM P406  EXP2
27274  42000      34X     JSX .STRD
27275          77661A     DEF V32689  LTEMP1
27276  42000      37X     JSX .LDBI
27277          77651A     DEF V32681  LTEMP
27300  42000     140X     JSX MIN2
27301          77671A     DEF V9  SPAN
27302  42000      52X     JSX .DEQL
27303 172014             SAP A1575
27304  42000    2551R     JSM P298  ABLK
27305   1616   77616A     LDA V32654  XFLAG
```

```
27306 170600                 SAL 1
27307 172403                SAM A1576
27310   2000      5517R      LDA =B100000
27311  31565    77565A       STA V32629   SRQEN
27312                      A1576 EQU *
27312   1616    77616A       LDA V32654   XFLAG
27313  52000    15350R       AND =B176777
27314  31616    77616A       STA V32654   XFLAG
27315  42000     7775R       JSM P603  CSCANBW
27316  66000    27336R       JMP A1577
27317                      A1575 EQU *
27317   2000     1463R       LDA =D0
27320  31575    77575A       STA V32637   K
27321  31607    77607A       STA V32647   ACNT
27322  42000       37X       JSX .LDBI
27323           77661A       DEF V32689   LTEMP1
27324  42000      140X       JSX MIN2
27325           77651A       DEF V32681   LTEMP
27326   4020       20A       LDB AR2
27327  77004                SLB A1578
27330  42000       37X       JSX .LDBI
27331           77661A       DEF V32689   LTEMP1
27332  66000    27335R       JMP A1579
27333                      A1578 EQU *
27333  42000       37X       JSX .LDBI
27334           77651A       DEF V32681   LTEMP
27335                      A1579 EQU *
27335  42000    11120R       JSM P668   SPANW
27336                      A1577 EQU *
27336                      A1574 EQU *
27336   1616    77616A       LDA V32654   XFLAG
27337 170605                 SAL 6
27340 172427                SAM A1580
27341   1610    77610A       LDA V32648   ALIM
27342 170040                 TCA
27343  21607    77607A       ADA V32647   ACNT
27344 172004                SAP A1581
27345   1730    77730A       LDA V30 KFLAG
27346 170614                 SAL 13
27347 172420                SAM A1580
27350                      A1581 EQU *
27350   1740    77740A       LDA V32736   EFLAG
27351 170605                 SAL 6
27352 172004                SAP A1582
27353   2000     2205R       LDA =B40
27354   6000     2411R       LDB =D4
27355  42000      112X       JSX .WS7
27356                      A1582 EQU *
27356   1740    77740A       LDA V32736   EFLAG
27357 170603                 SAL 4
27360 172007                SAP A1583
27361   1601    77601A       LDA V32641   HPBC
27362  62000     1770R       IOR =B20000
27363  31601    77601A       STA V32641   HPBC
27364   1740    77740A       LDA V32736   EFLAG
27365  52000     7567R       AND =B173777
27366  31740    77740A       STA V32736   EFLAG
27367                      A1583 EQU *
27367                      A1580 EQU *
27367                      A1553 EQU *
27367   1431    77431A       LDA V32537   RPGSWP
27370  22000     1301R       ADA =D-3
27371 172003                SAP A1584
27372  45431    77431A       ISZ V32537   RPGSWP
27373                        NOP
27374                      A1584 EQU *
27374   1431    77431A       LDA V32537   RPGSWP
27375  12000     1457R       CPA =D1
27376  66000    27400R       JMP *+2
27377  66000    27431R       JMP A1585
27400   1576    77576A       LDA V32638   RPGPTR
27401  72430                SZA A1585
27402   1731    77731A       LDA V18 SINDEX
27403 170040                 TCA
27404  22000     2221R       ADA =D9
27405 172005                SAP A1586
27406   2000     2107R       LDA =D3
27407   6000     2107R       LDB =D3
27410  42000       75X       JSX .WS4
27411  66000    27431R       JMP A1587
27412                      A1586 EQU *
27412   6000     2276R       LDB =D2
27413  42000      175X       JSX .RS6
27414  31567    77567A       STA V32631   KEYCOL
27415  42000      176X       JSX .R7
27416  31573    77573A       STA V32635   I
27417 170507                 SAR 8
27420  72411                SZA A1588
27421   1616    77616A       LDA V32654   XFLAG
27422  62000     1704R       IOR =D6
27423  31616    77616A       STA V32654   XFLAG
27424   1573    77573A       LDA V32635   I
27425  52000     2066R       AND =B177770
27426  62000     2107R       IOR =B3
27427  31573    77573A       STA V32635   I
27430  66000    25333R       JMP L1430 RLOOP
27431                      A1588 EQU *
27431                      A1587 EQU *
27431                      A1585 EQU *
27431                      A1548 EQU *
27431   1740    77740A       LDA V32736   EFLAG
```

```
27432  52000   6512R    AND =B177677
27433  31740  77740A    STA V32736  EFLAG
27434   1607  77607A    LDA V32647  ACNT
27435 170040            TCA
27436 172033           SAP A1589
27437   1676  77676A    LDA V16 TLEDS
27440  52000   6233R    AND =B600
27441  22000   6234R    ADA =B177200
27442  72013           RZA A1590
27443   1702  77702A    LDA V24 VIDCON
27444  52000   2406R    AND =D7
27445   6000   2107R    LDB =D3
27446  75617            MPY
27447  22000   1457R    ADA =D1
27450   4000            LDB A
27451   1426  77426A    LDA V32534  UFLAG
27452  42000    142X    JSX .RBIT
27453  31426  77426A    STA V32534  UFLAG
27454  66000  27471R    JMP A1591
27455                 A1590 EQU *
27455   1676  77676A    LDA V16 TLEDS
27456  52000   1704R    AND =D6
27457  72004           RZA A1592
27460   1426  77426A    LDA V32534  UFLAG
27461  52000   1301R    AND =B177775
27462  31426  77426A    STA V32534  UFLAG
27463                 A1592 EQU *
27463   1676  77676A    LDA V16 TLEDS
27464  52000   3231R    AND =B60
27465  72004           RZA A1593
27466   1426  77426A    LDA V32534  UFLAG
27467  52000   2067R    AND =B177757
27470  31426  77426A    STA V32534  UFLAG
27471                 A1593 EQU *
27471                 A1591 EQU *
27471                 A1589 EQU *
27471   1600  77600A    LDA V32640  CTIM
27472 170040            TCA
27473  22000   2406R    ADA =D7
27474 172013           SAP A1594
27475   1576  77576A    LDA V32638  RPGPTR
27476  22000  13136R    ADA =D-11
27477 172010           SAP A1594
27500   1565  77565A    LDA V32629  SRQEN
27501  52000   6514R    AND =B77777
27502   6000   2276R    LDB =D2
27503  42000    107X    JSX .WS5
27504   2000   2107R    LDA =D3
27505   6000   2107R    LDB =D3
27506  42000     75X    JSX .WS4
27507                 A1594 EQU *
27507  76705           SHC A1595
27510   1616  77616A    LDA V32654  XFLAG
27511  62000   1704R    IOR =D6
27512  31616  77616A    STA V32654  XFLAG
27513  66000  32476R    JMP L193  RESET
27514                 A1595 EQU *
27514   1616  77616A    LDA V32654  XFLAG
27515 170604            SAL 5
27516 172402            SAM *+2
27517  66000  27736R    JMP A1596
27520   2000  27725R    LDA =D2680
27521   6000   2203R    LDB =D8
27522  42000     75X    JSX .WS4
27523   2000  24136R    LDA =B2022
27524  42000     73X    JSX .W6
27525   2000   3654R    LDA =D16
27526  42000     73X    JSX .W6
27527   2000   2646R    LDA =D3008
27530  42000     73X    JSX .W6
27531   2000  16201R    LDA =B2001
27532  42000     73X    JSX .W6
27533   2000   1463R    LDA =D0
27534  70540            PWC A
27535   2000   2411R    LDA =D4
27536  70540            PWC A
27537   1615  77615A    LDA V32653  DAC1
27540  42000    122X    JSX CNV42
27541  42000  13062R    JSM P793  NDUMP
27542  42000   2173R    JSM P271  CRLF
27543   2000   1463R    LDA =D0
27544  70540            PWC A
27545   2000   2411R    LDA =D4
27546  70540            PWC A
27547   1614  77614A    LDA V32652  DAC2
27550  42000    122X    JSX CNV42
27551  42000  13062R    JSM P793  NDUMP
27552  42000   2173R    JSM P271  CRLF
27553   2000   1463R    LDA =D0
27554  70540            PWC A
27555   2000   2411R    LDA =D4
27556  70540            PWC A
27557   1613  77613A    LDA V32651  DAC4
27560  42000    122X    JSX CNV42
27561  42000  13062R    JSM P793  NDUMP
27562  42000   2206R    JSM P272  SPACE
27563   2000   1463R    LDA =D0
27564  70540            PWC A
27565   2000   2107R    LDA =D3
27566  70540            PWC A
27567  42000   5764R    JSM P495  FRQC
```

```
27570  42000     150X   JSX ADD2
27571           77665A  DEF V8   CFREQ
27572  42000      36X   JSX .SAR2
27573   1603    77603A  LDA V32643   PLOCK
27574 170604            SAL 5
27575 172004            SAP A1597
27576  42000      53X   JSX .LDSI
27577            1463R  DEF =D0
27600  66000    27603R  JMP A1598
27601                  A1597 EQU *
27601  42000      37X   JSX .LDBI
27602           27726R  DEF =F5000000
27603                  A1598 EQU *
27603  42000     130X   JSX ADD2T
27604  42000     151X   JSX DIV2
27605            7237R  DEF =F1700000
27606  42000      36X   JSX .SAR2
27607   1613    77613A  LDA V32651   DAC4
27610  42000     122X   JSX CNV42
27611  42000     124X   JSX SUB2T
27612  42000   13062R   JSM P793   NDUMP
27613  42000    2173R   JSM P271   CRLF
27614   2000    1463R   LDA =D0
27615  70540            PWC A
27616   2000    2411R   LDA =D4
27617  70540            PWC A
27620  42000      53X   JSX .LDSI
27621           77746A  DEF V32742   N
27622  42000   13062R   JSM P793   NDUMP
27623  42000    2206R   JSM P272   SPACE
27624   2000    1463R   LDA =D0
27625  70540            PWC A
27626   2000    2411R   LDA =D4
27627  70540            PWC A
27630   1570    77570A  LDA V32632   M
27631  52000    2406R   AND =D7
27632  42000     122X   JSX CNV42
27633  42000   13062R   JSM P793   NDUMP
27634  42000    2206R   JSM P272   SPACE
27635   2000    1463R   LDA =D0
27636  70540            PWC A
27637   2000    2411R   LDA =D4
27640  70540            PWC A
27641   1571    77571A  LDA V32633   L
27642 170500            SAR 1
27643  42000     122X   JSX CNV42
27644  42000   13062R   JSM P793   NDUMP
27645  42000    2206R   JSM P272   SPACE
27646   1603    77603A  LDA V32643   PLOCK
27647 170511            SAR 10
27650 170140            CMA
27651  52000    1457R   AND =D1
27652  62000    3231R   IOR =B60
27653  42000      73X   JSX .W6
27654  42000    2173R   JSM P271   CRLF
27655   1604    77604A  LDA V32644   SATN
27656 170600            SAL 1
27657 172004            SAP A1599
27660  42000      53X   JSX .LDSI
27661            3654R  DEF =H10
27662  66000    27665R  JMP A1600
27663                  A1599 EQU *
27663  42000      53X   JSX .LDSI
27664            2405R  DEF =D5
27665                  A1600 EQU *
27665  42000      36X   JSX .SAR2
27666  42000      37X   JSX .LDBI
27667           77641A  DEF V32673   VTOFREQ
27670  42000     164X   JSX DIV2T
27671  42000      34X   JSX .STRD
27672           77661A  DEF V32689   LTEMP1
27673   2000    1463R   LDA =D0
27674  70540            PWC A
27675   2000    1456R   LDA =D12
27676  70540            PWC A
27677  42000   13062R   JSM P793   NDUMP
27700  42000    2173R   JSM P271   CRLF
27701   2000    1463R   LDA =D0
27702  70540            PWC A
27703   2000    1456R   LDA =D12
27704  70540            PWC A
27705   1570    77570A  LDA V32632   M
27706 170040            TCA
27707  22000    2521R   ADA =D17
27710 170603            SAL 4
27711  21571    77571A  ADA V32633   L
27712  42000     122X   JSX CNV42
27713  42000     153X   JSX MPY2
27714            6123R  DEF =F250000
27715  42000     150X   JSX ADD2
27716           77661A  DEF V32689   LTEMP1
27717  42000     140X   JSX MIN2
27720           27732R  DEF =F280000000
27721  42000   13062R   JSM P793   NDUMP
27722   2000    2500R   LDA =D147
27723  42000      73X   JSX .W6
27724  66000    27743R  JMP A1601
27725   5500
27726 5000000
27732 280000000
27725                   LIT
```

```
27736                        A1596 EQU *
27736    2000   27767R         LDA =D2884
27737    6000    2203R         LDB =D6
27740   42000      75X         JSX .WS4
27741    2000    2500R         LDA =D147
27742   42000      73X         JSX .W6
27743                        A1601 EQU *
27743    1676   77676A         LDA V16 ILEDS
27744  170604                  SAL 5
27745  172023                 SAP A1602
27746    1740   77740A         LDA V32736  EFLAG
27747  170602                  SAL 3
27750  172420                 SAM A1602
27751    1616   77616A         LDA V32654  XFLAG
27752  170605                  SAL 6
27753  172415                 SAM A1602
27754    1730   77730A         LDA V30 KFLAG
27755  170614                  SAL 13
27756  172005                 SAP A1603
27757    1610   77610A         LDA V32648  ALIM
27760  170040                  TCA
27761   21607   77607A         ADA V32647  ACNT
27762  172406                 SAM A1602
27763                        A1603 EQU *
27763   42000    2650R         JSM P304  UNCAL
27764    2000    1770R         LDA =B20000
27765   31703   77703A         STA V21 STRIG
27766   66000   27775R         JMP A1604
27767    5504
27767                          LIT
27770                        A1602 EQU *
27770    1616   77616A         LDA V32654  XFLAG
27771  170611                  SAL 10
27772  172002                 SAP A1605
27773   42000    7671R         JSM P595  YIGSHFT
27774                        A1605 EQU *
27774   42000   15224R         JSM P221  IRIGR
27775                        A1604 EQU *
27775   66000   32432R         JMP A1522
27776                        C1606 EQU *
27776   42000    5357R         JSM P466  NOLOCK
27777   66000   32432R         JMP A1522
30000                        C1607 EQU *
30000    1566   77566A         LDA V32630  KEYCODE
30001   42000   15546R         JSM P214  KEY
30002    1616   77616A         LDA V32654  XFLAG
30003   73402                  RLA *+2
30004   66000   30247R         JMP A1608
30005    1601   77601A         LDA V32641  HPBC
30006  170601                  SAL 2
30007  172403                 SAM A1609
30010    2000    2406R         LDA =D7
30011   42000   24635R         JSM P220  SAVEM
30012                        A1609 EQU *
30012    2000    1457R         LDA =D1
30013   31575   77575A         STA V32637  K
30014    1574   77574A         LDA V32636  RPG
30015    6000    3312R         LDB =D100
30016   75617                  MPY
30017   31564   77564A         STA V32628  RPGCNT
30020    1574   77574A         LDA V32636  RPG
30021   42000     122X         JSX CNV42
30022   42000      36X         JSX .SAR2
30023    1605   77605A         LDA V32645  SCANSL
30024   72004                 RZA A1610
30025   42000    2070R         JSM P261  IFBW
30026   42000    4420R         JSM P407  EXP3
30027   66000   30034R         JMP A1611
30030                        A1610 EQU *
30030   42000      37X         JSX .LDB1
30031           77671A         DEF V9  SPAN
30032    6000    1457R         LDB =D1
30033   42000      47X         JSX .DRGT
30034                        A1611 EQU *
30034   42000     157X         JSX MPY2T
30035   42000      34X         JSX .STRD
30036           77651A         DEF V32681  LTEMP
30037    1576   77576A         LDA V32638  RPGPTR
30040   66000   30236R         JMP A1612
30041                        C1613 EQU *
30041    5435   77435A         LDB V32541  IF1
30042    2000    2204R         LDA =D10
30043  176004                 SBP A1614
30044   42000    4430R         JSM P408  LGSCL
30045    6000    2204R         LDB =D10
30046   75617                  MPY
30047                        A1614 EQU *
30047    5574   77574A         LDB V32636  RPG
30050   75617                  MPY
30051   21700   77700A         ADA V22 RLVL
30052   42000    3530R         JSM P355  REFLEV
30053   66000   30237R         JMP A1615
30054                        C1616 EQU *
30054    1675   77675A         LDA V15 BLEDS
30055  170604                  SAL 5
30056  172027                 SAP A1617
30057    1574   77574A         LDA V32636  RPG
30060   42000     122X         JSX CNV42
30061   42000     153X         JSX MPY2
30062           77713A         DEF V7  FSTEP
30063   42000     150X         JSX ADD2
```

```
30064          77665A   DEF V8   CFREQ
30065   42000    145X   JSX SUB2
30066          77707A   DEF V11  FOFSET
30067   42000     34X   JSX .STRD
30070          77651A   DEF V32681  LTEMP
30071    1651  77651A   LDA V32681  LTEMP
30072   73412          RLA A1618
30073   42000    140X   JSX MIN2
30074           7220R   DEF =F1739100000
30075    4020     20A   LDB AR2
30076   77406          RLB A1618
30077    1574  77574A   LDA V32636  RPG
30100   42000    122X   JSX CNV42
30101   42000    153X   JSX MPY2
30102          77713A   DEF V7   FSTEP
30103   42000  12250R   JSM P729  STEPF
30104                 A1618 EQU *
30104   66000  30106R   JMP A1619
30105                 A1617 EQU *
30105   42000  12250R   JSM P729  STEPF
30106                 A1619 EQU *
30106   66000  30237R   JMP A1615
30107                 C1620 EQU *
30107   42000     37X   JSX .LDB1
30110          77671A   DEF V9   SPAN
30111   42000    163X   JSX ADD3
30112           1457R   DEF =D1
30113   42000   7327R   JSM P556  LOG2
30114   21574  77574A   ADA V32636  RPG
30115   42000   4411R   JSM P406  EXP2
30116   42000  11120R   JSM P668  SPANW
30117   66000  30237R   JMP A1615
30120                 C1621 EQU *
30120   42000  12224R   JSM P728  STEPL
30121   66000  30237R   JMP A1615
30122                 C1622 EQU *
30122   42000  12200R   JSM P727  STEPH
30123   66000  30237R   JMP A1615
30124                 C1623 EQU *
30124   42000     37X   JSX .LDB1
30125          77713A   DEF V7   FSTEP
30126   42000    202X   JSX .DSGN
30127  170416           AAR 15
30130  170600           SAL 1
30131   22000   1457R   ADA =D1
30132   31572  77572A   STA V32634  J
30133    2000   2416R   LDA =D29
30134   70540           PWC A
30135   42000   7327R   JSM P556  LOG2
30136   21574  77574A   ADA V32636  RPG
30137   42000   2132R   JSM P265  LIMIT
30140   42000   4411R   JSM P406  EXP2
30141   42000     36X   JSX .SAR2
30142    1572  77572A   LDA V32634  J
30143   42000    122X   JSX CNV42
30144   42000    157X   JSX MPY2I
30145   42000     34X   JSX .STRD
30146          77713A   DEF V7   FSTEP
30147   66000  30237R   JMP A1615
30150                 C1624 EQU *
30150    1574  77574A   LDA V32636  RPG
30151  172004          SAP A1625
30152    1615  77615A   LDA V32653  DAC1
30153  170400           AAR 1
30154   66000  30162R   JMP A1626
30155                 A1625 EQU *
30155    5615  77615A   LDB V32653  DAC1
30156    2000   1457R   LDA =D1
30157   76403          SZB A1627
30160    1615  77615A   LDA V32653  DAC1
30161  170600           SAL 1
30162                 A1627 EQU *
30162                 A1626 EQU *
30162   42000   3114R   JSM P326  WDACS
30163   66000  30237R   JMP A1615
30164                 C1628 EQU *
30164    1723  77723A   LDA V26 MKRMODE
30165   42000    121X   JSX MOD4
30166           2107R   DEF =D3
30167   12000   2276R   CPA =D2
30170   66000  30172R   JMP *+2
30171   66000  30207R   JMP A1629
30172   42000     37X   JSX .LDB1
30173          77645A   DEF V32677  MFREQ
30174   42000   6750R   JSM P222  TUNE
30175   42000   2762R   JSM P314  AVGRST
30176    2000  10522R   LDA =D501
30177   42000  11010R   JSM P663  STMRKR
30200   42000     37X   JSX .LDB1
30201          77671A   DEF V9   SPAN
30202   42000   7327R   JSM P556  LOG2
30203   21574  77574A   ADA V32636  RPG
30204   42000   4411R   JSM P406  EXP2
30205   42000  11120R   JSM P668  SPANW
30206   66000  30212R   JMP A1630
30207                 A1629 EQU *
30207    1721  77721A   LDA V25 MRKR
30210   21564  77564A   ADA V32628  RPGCNT
30211   42000  11010R   JSM P663  STMRKR
30212                 A1630 EQU *
```

```
30212  66000  30237R     JMP A1615
30213         30164R     DEF C1628
30214         30237R     DEF A1615
30215         30237R     DEF A1615
30216         25707R     DEF L191   SLOOP
30217         25707R     DEF L191   SLOOP
30220         30150R     DEF C1624
30221         30237R     DEF A1615
30222         30124R     DEF C1623
30223         30122R     DEF C1622
30224         30120R     DEF C1621
30225         30107R     DEF C1620
30226         30054R     DEF C1616
30227         25707R     DEF L191   SLOOP
30230         30041R     DEF C1613
30231         25707R     DEF L191   SLOOP
30232         25707R     DEF L191   SLOOP
30233         25707R     DEF L191   SLOOP
30234         25707R     DEF L191   SLOOP
30235                    DEC -19
30236  42000    143X    A1612 JSX .CASE
30237                   A1615 EQU *
30237   1576  77576A     LDA V32638  RPGPTR
30240  72404             SZA A1631
30241  22000  13136R     ADA =D-11
30242 172002             SAP A1631
30243  42000   2762R     JSM P314   AVGRST
30244                   A1631 EQU *
30244   2000   1463R     LDA =D0
30245  31564  77564A     STA V32628  RPGCNT
30246  42000  12334R     JSM P217   MBLK
30247                   A1608 EQU *
30247   1616  77616A     LDA V32654   XFLAG
30250 172402             SAM *+2
30251  66000  32420R     JMP A1632
30252  66000  30456R     JMP A1634
30253                   P1635 EQU * LINLVL
30253 174517             CLB
30254  42000     56X     JSX .ARGS
30255  44016     16A     ISZ C
30256   1566  77566A     LDA V32630    KEYCODE
30257  22000  15701R     ADA =B-40
30260  42000    111X     JSX .EQL
30261  70540             PWC A
30262   1566  77566A     LDA V32630    KEYCODE
30263  22000  30302R     ADA =B-46
30264  42000    111X     JSX .EQL
30265  42000    136X     JSX .ORT
30266  70540             PWC A
30267   1730  77730A     LDA V30 KFLAG
30270 170515             SAR 14
30271  22000   1301R     ADA =D-3
30272  42000    111X     JSX .EQL
30273  70540             PWC A
30274   1566  77566A     LDA V32630    KEYCODE
30275  22000   1301R     ADA =D-3
30276  42000    111X     JSX .EQL
30277  42000    154X     JSX .ANDT
30300  42000    136X     JSX .ORT
30301  66000     31X     JMX .RTNA
30302 177732
30302                    LIT
30303                   P1636 EQU * DBLVL
30303 174517             CLB
30304  42000     56X     JSX .ARGS
30305  44016     16A     ISZ C
30306  42000  30253R     JSM P1635 LINLVL
30307 172005             SAP A1637
30310  42000     37X     JSX .LDBI
30311         77651A     DEF V32681   LTEMP
30312  42000   2001R     JSM P251   DBM
30313  66000  30316R     JMP A1638
30314                   A1637 EQU *
30314  42000     37X     JSX .LDBI
30315         77651A     DEF V32681   LTEMP
30316                   A1638 EQU *
30316  42000     50X     JSX CNV24
30317   6000   2107R     LDB =D3 DBLVL
30320  42000     67X     JSX .STAP
30321 172002             SAP *+2
30322 170040             TCA
30323 170040             TCA
30324  22000  30336R     ADA =D20000
30325 172010             SAP A1639
30326   6000   2107R     LDB =D3 DBLVL
30327  42000     30X     JSX .LDAP
30330 172003             SAP A1640
30331   2000  30337R     LDA =B130740
30332  66000  30334R     JMP A1641
30333                   A1640 EQU *
30333   2000  30336R     LDA =D20000
30334                   A1641 EQU *
30334  66000     31X     JMX .RTNA
30335                   A1639 EQU *
30335  66000     70X     JMX .RTNI
30336  47040
30337 130740
30336                    LIT
30340                   P1642 EQU * ADCLVL
30340 174517             CLB
```

```
30341   42000     56X     JSX .ARGS
30342   44016     16A     ISZ C
30343    1730  77730A     LDA V30 KFLAG
30344  170606             SAL 7
30345  172007             SAP A1643
30346   42000     37X     JSX .LDBI
30347          77651A     DEF V32681  LTEMP
30350   42000     50X     JSX CNV24
30351    6000   2107R     LDB =D3 ADCLVL
30352   42000     67X     JSX .STAP
30353   66000  30423R     JMP A1644
30354                   A1643 EQU *
30354    1435  77435A     LDA V32541  IF1
30355  172023             SAP A1645
30356    2000   3166R     LDA =D1023
30357   70540             PWC A
30360   42000   4430R     JSM P408  LGSCL
30361   42000    122X     JSX CNV42
30362   42000     36X     JSX .SAR2
30363   42000  30303R     JSM P1636 DBLVL
30364  170040             TCA
30365   21700  77700A     ADA V22 RLVL
30366   42000    122X     JSX CNV42
30367    2000   1463R     LDA =D0
30370   75541             MLY
30371   42000    164X     JSX DIV2T
30372   42000     50X     JSX CNV24
30373  170040             TCA
30374   22000   4470R     ADA =D1000
30375   42000   2132R     JSM P265  LIMIT
30376   42000     45X     JSX CNV41
30377   66000  30421R     JMP A1646
30400                   A1645 EQU *
30400    1700  77700A     LDA V22 RLVL
30401   42000    122X     JSX CNV42
30402   42000   1736R     JSM P248  NANOV
30403   42000     62X     JSX CNV21
30404   42000     36X     JSX .SAR2
30405   42000  30253R     JSM P1635 LINLVL
30406  172405             SAM A1647
30407   42000     37X     JSX .LDBI
30410          77651A     DEF V32681  LTEMP
30411   42000   1736R     JSM P248  NANOV
30412   66000  30415R     JMP A1648
30413                   A1647 EQU *
30413   42000     37X     JSX .LDBI
30414          77651A     DEF V32681  LTEMP
30415                   A1648 EQU *
30415   42000     62X     JSX CNV21
30416   42000     41X     JSX MPY1
30417          30424R     DEF =F1.003
30420   42000     42X     JSX DIVIT
30421                   A1646 EQU *
30421   42000    203X     JSX CNV14
30422   66000     31X     JMX .RTNA
30423                   A1644 EQU *
30423   66000     70X     JMX .RTNI
30424   1.003
30424                     LIT
30430                   P1649 EQU * RBLK
30430    1706  77706A     LDA V31 ROFSET
30431   72004             RZA A1650
30432    2000   2407R     LDA =D34
30433   42000   2434R     JSM P285  BLKOF
30434   66000  30441R     JMP A1651
30435                   A1650 EQU *
30435    2000   2407R     LDA =D34
30436   42000   2223R     JSM P274  NBLK
30437    2000   2407R     LDA =D34
30440   42000   2314R     JSM P279  SBLK
30441                   A1651 EQU *
30441  170201             RET 1
30442                   P1652 EQU * FBLK
30442   42000     37X     JSX .LDBI
30443          77707A     DEF V11 FOFSET
30444   42000     52X     JSX .DEQL
30445  172004             SAP A1653
30446    2000  12734R     LDA =D35
30447   42000   2434R     JSM P265  BLKOF
30450   66000  30455R     JMP A1654
30451                   A1653 EQU *
30451    2000  12734R     LDA =D35
30452   42000   2223R     JSM P274  NBLK
30453    2000  12734R     LDA =D35
30454   42000   2314R     JSM P279  SBLK
30455                   A1654 EQU *
30455  170201             RET 1
30456                   A1634 EQU *
30456    1620  77620A     LDA V32656  PREFIX
30457  170500             SAR 1
30460   12000   1456R     CPA =D12
30461   66000  30467R     JMP A1655
30462    1601  77601A     LDA V32641  HPBC
30463  170601             SAL 2
30464  172403             SAM A1655
30465    2000   2406R     LDA =D7
30466   42000  24635R     JSM P220  SAVEM
30467                   A1655 EQU *
30467    1620  77620A     LDA V32656  PREFIX
```

```
30470  66000  31310R        JMP A1656
30471                 C1657 EQU *
30471   2000   2565R        LDA =D11
30472  70540                PWC A
30473  42000     37X        JSX .LDBI
30474         77651A        DEF V32681  LTEMP
30475  42000   7336R        JSM P557  LOG3
30476  22000   2110R        ADA =D-2
30477  42000   2132R        JSM P265  LIMIT
30500  22000   2276R        ADA =D2
30501  42000   4210R        JSM P392  IFBWOUT
30502  42000   7775R        JSM P603  CSCANBW
30503  42000   6723R        JSM P538  CSBLK
30504  66000  31311R        JMP A1658
30505                 C1659 EQU *
30505   2000   2172R        LDA =D13
30506  70540                PWC A
30507  42000     37X        JSX .LDBI
30510         77651A        DEF V32681  LTEMP
30511  42000   7336R        JSM P557  LOG3
30512  42000   2132R        JSM P265  LIMIT
30513  42000   4314R        JSM P400  VBWOUT
30514  42000   7775R        JSM P603  CSCANBW
30515  66000  31311R        JMP A1658
30516                 C1660 EQU *
30516  42000     37X        JSX .LDBI
30517         77651A        DEF V32681  LTEMP
30520   4020     20A        LDB AR2
30521  77202                SLB *+2,C
30522  34020     20A        STB AR2
30523  42000   7345R        JSM P556  SCANI
30524  42000   7775R        JSM P603  CSCANBW
30525  66000  31311R        JMP A1658
30526                 C1661 EQU *
30526   2000   2406R        LDA =D7
30527  70540                PWC A
30530  42000     37X        JSX .LDBI
30531         77651A        DEF V32681  LTEMP
30532   4020     20A        LDB AR2
30533  77202                SLB *+2,C
30534  34020     20A        STB AR2
30535  42000    163X        JSX ADD3
30536          2221R        DEF =D9
30537   6000   2204R        LDB =D10
30540  42000    132X        JSX .FDIG
30541  42000   2132R        JSM P265  LIMIT
30542  42000    104X        JSX .TURN
30543          2406R        DEF =D7
30544         77677A        DEF V17 RFAT
30545  31677  77677A        STA V17 RFAT
30546  42000   3255R        JSM P337  WRFAT
30547   1700  77700A        LDA V22 RLVL
30550  42000   3530R        JSM P355  REFLEV
30551  66000  31311R        JMP A1658
30552                 C1662 EQU *
30552  42000  30303R        JSM P1636 DBLVL
30553  42000   3530R        JSM P355  REFLEV
30554  66000  31311R        JMP A1658
30555                 C1663 EQU *
30555   2000   2411R        LDA =D4
30556  70540                PWC A
30557  42000     37X        JSX .LDBI
30560         77651A        DEF V32681  LTEMP
30561  42000   7327R        JSM P556  LOG2
30562  42000   2132R        JSM P265  LIMIT
30563 170040                TCA
30564  22000   2411R        ADA =D4
30565  62000   2411R        IOR =D4
30566 170614                SAL 13
30567  42000   4171R        JSM P390  LGDB
30570   1730  77730A        LDA V30 KFLAG
30571  42000  15050R        JSM P223  AMPU
30572  66000  31311R        JMP A1658
30573                 C1664 EQU *
30573  42000     37X        JSX .LDBI
30574         77651A        DEF V32681  LTEMP
30575  42000   6750R        JSM P222  TUNE
30576  66000  31311R        JMP A1658
30577                 C1665 EQU *
30577   1676  77676A        LDA V16 ILEDS
30600  52000   6233R        AND =B600
30601  72412               SZA A1667
30602   1675  77675A        LDA V15 BLEDS
30603 170600               SAL 1
30604 172007               SAP A1667
30605  42000     37X        JSX .LDBI
30606         77671A        DEF V9  SPAN
30607  42000    140X        JSX MIN2
30610         77651A        DEF V32681  LTEMP
30611   4020     20A        LDB AR2
30612  77405               RLB A1666
30613                 A1667 EQU *
30613  42000     37X        JSX .LDBI
30614         77651A        DEF V32681  LTEMP
30615  42000  11120R        JSM P668  SPANW
30616  66000  30675R        JMP A1668
30617                 A1666 EQU *
30617   1616  77616A        LDA V32654  XFLAG
30620  52000  30663R        AND =B176771
30621  62000   1300R        IOR =B1000
```

```
30622   31616   77616A      STA V32654  XFLAG
30623   42000      53X      JSX .LDSI
30624           11310R      DEF =H100
30625   42000     140X      JSX MIN2
30626           77651A      DEF V32681  LTEMP
30627    4020      20A      LDB AR2
30630   77005              SLB A1669
30631   42000      53X      JSX .LDSI
30632           11310R      DEF =H100
30633   42000      34X      JSX .STRD
30634           77651A      DEF V32681  LTEMP
30635                     A1669 EQU *
30635    1616   77616A      LDA V32654  XFLAG
30636  170600               SAL 1
30637  172405              SAM A1670
30640    2000    6514R      LDA =B77777
30641   31565   77565A      STA V32629  SROEN
30642    6000    2276R      LDB =D2
30643   42000     107X      JSX .WS5
30644                     A1670 EQU *
30644    1737   77737A      LDA V32735  BLKS
30645   21612   77612A      ADA V32650  NCHR
30646    6000    2203R      LDB =D8
30647   42000      75X      JSX .WS4
30650    6000    1704R      LDB =D6
30651   42000     100X      JSX .WSTR
30652           30664R      DEF =" AUTO ZOOM "
30653    2000    2500R      LDA =D147
30654   42000      73X      JSX .W6
30655    1601   77601A      LDA V32641  HPBC
30656  170601               SAL 2
30657  172014              SAP A1671
30660    2000    2276R      LDA =D2
30661   42000   15546R      JSM P214  KEY
30662   66000   30674R      JMP A1672
30663  176771
30664  AUTO ZOOM
                            LIT
30663                     A1671 EQU *
30673                     A1671 EQU *
30673   42000   15224R      JSM P221  TRIGR
30674                     A1672 EQU *
30674   66000   25205R      JMP L190  LOOP
30675                     A1668 EQU *
30675   66000   31311R      JMP A1658
30676                     C1673 EQU *
30676   42000      37X      JSX .LDBI
30677           77671A      DEF V9  SPAN
30700   42000     146X      JSX DIV3
30701            2276R      DEF =D2
30702   42000      34X      JSX .STRD
30703           77742A      DEF V32738  XL
30704   42000      37X      JSX .LDBI
30705           77651A      DEF V32681  LTEMP
30706   42000     150X      JSX ADD2
30707           77665A      DEF V8  CFREQ
30710   42000     150X      JSX ADD2
30711           77742A      DEF V32738  XL
30712   42000     146X      JSX DIV3
30713            2276R      DEF =D2
30714   42000     145X      JSX SUB2
30715           77707A      DEF V11  FOFSET
30716   42000      34X      JSX .STRD
30717           77655A      DEF V32685  LTEMP2
30720   42000      37X      JSX .LDBI
30721           77742A      DEF V32738  XL
30722   42000     150X      JSX ADD2
30723           77665A      DEF V8  CFREQ
30724   42000     145X      JSX SUB2
30725           77651A      DEF V32681  LTEMP
30726    4020      20A      LDB AR2
30727   77010              SLB A1674
30730   42000      53X      JSX .LDSI
30731            1463R      DEF =D0
30732   42000   11120R      JSM P668  SPAN*
30733   42000      37X      JSX .LDBI
30734           77651A      DEF V32681  LTEMP
30735   42000    6750R      JSM P222  TUNE
30736   66000   31021R      JMP A1675
30737                     A1674 EQU *
30737    1655   77655A      LDA V32685  LTEMP2
30740   73015              SLA A1676
30741   42000      37X      JSX .LDBI
30742           77707A      DEF V11  FOFSET
30743   42000    6750R      JSM P222  TUNE
30744   42000      37X      JSX .LDBI
30745           77651A      DEF V32681  LTEMP
30746    4020      20A      LDB AR2
30747   77202              SLB *+2,C
30750   34020      20A      STB AR2
30751   42000     126X      JSX MPY3
30752            2276R      DEF =D2
30753   42000   11120R      JSM P668  SPAN*
30754   66000   31021R      JMP A1677
30755                     A1676 EQU *
30755   42000      37X      JSX .LDBI
30756           77655A      DEF V32685  LTEMP2
30757   42000     140X      JSX MIN2
30760            7220R      DEF =F1739100000
30761    4020      20A      LDB AR2
30762   77021              SLB A1678
```

```
30763  42000     37X   JSX .LDBI
30764          77707A  DEF V11 FOFSET
30765  42000    150X   JSX ADD2
30766           7220R  DEF =F1739100000
30767  42000    6750R  JSM P222  TUNE
30770  42000     37X   JSX .LDBI
30771          77651A  DEF V32681  LTEMP
30772  42000    140X   JSX MIN2
30773          77665A  DEF V8  CFREQ
30774  42000    126X   JSX MPY3
30775           2276R  DEF =D2
30776   4020     20A   LDB AR2
30777  77202           SLB *+2,C
31000  34020     20A   STB AR2
31001  42000   11120R  JSM P668  SPANW
31002  66000   31021R  JMP A1679
31003                 A1678 EQU *
31003  42000     37X   JSX .LDBI
31004          77665A  DEF V8  CFREQ
31005  42000    150X   JSX ADD2
31006          77742A  DEF V32738  XL
31007  42000    145X   JSX SUB2
31010          77651A  DEF V32681  LTEMP
31011  42000   11120R  JSM P668  SPANW
31012  42000     37X   JSX .LDBI
31013          77671A  DEF V9  SPAN
31014  42000    146X   JSX DIV3
31015           2276R  DEF =D2
31016  42000    150X   JSX ADD2
31017          77651A  DEF V32681  LTEMP
31020  42000    6750R  JSM P222  TUNE
31021                 A1679 EQU *
31021                 A1677 EQU *
31021                 A1675 EQU *
31021  66000   31311R  JMP A1658
31022                 C1680 EQU *
31022  42000     37X   JSX .LDBI
31023          77671A  DEF V9  SPAN
31024  42000    146X   JSX DIV3
31025           2276R  DEF =D2
31026  42000     34X   JSX .STRD
31027          77742A  DEF V32738  XL
31030  42000     37X   JSX .LDBI
31031          77651A  DEF V32681  LTEMP
31032  42000    150X   JSX ADD2
31033          77665A  DEF V8  CFREQ
31034  42000    145X   JSX SUB2
31035          77742A  DEF V32738  XL
31036  42000    146X   JSX DIV3
31037           2276R  DEF =D2
31040  42000    145X   JSX SUB2
31041          77707A  DEF V11 FOFSET
31042  42000     34X   JSX .STRD
31043          77655A  DEF V32685  LTEMP2
31044  42000     37X   JSX .LDBI
31045          77742A  DEF V32738  XL
31046  42000    140X   JSX MIN2
31047          77665A  DEF V8  CFREQ
31050  42000    140X   JSX MIN2
31051          77651A  DEF V32681  LTEMP
31052   4020     20A   LDB AR2
31053  77010           SLB A1681
31054  42000     53X   JSX .LDSI
31055           1463R  DEF =D0
31056  42000   11120R  JSM P668  SPANW
31057  42000     37X   JSX .LDBI
31060          77651A  DEF V32681  LTEMP
31061  42000    6750R  JSM P222  TUNE
31062  66000   31142R  JMP A1682
31063                 A1681 EQU *
31063  42000     37X   JSX .LDBI
31064          77655A  DEF V32685  LTEMP2
31065  42000    140X   JSX MIN2
31066           7220R  DEF =F1739100000
31067   4020     20A   LDB AR2
31070  77016           SLB A1683
31071  42000     37X   JSX .LDBI
31072          77707A  DEF V11 FOFSET
31073  42000    150X   JSX ADD2
31074           7220R  DEF =F1739100000
31075  42000    6750R  JSM P222  TUNE
31076  42000     37X   JSX .LDBI
31077          77665A  DEF V8  CFREQ
31100  42000    140X   JSX MIN2
31101          77651A  DEF V32681  LTEMP
31102  42000    126X   JSX MPY3
31103           2276R  DEF =D2
31104  42000   11120R  JSM P668  SPANW
31105  66000   31142R  JMP A1684
31106                 A1683 EQU *
31106   1655   77655A  LDA V32685  LTEMP2
31107  73015           SLA A1685
31110  42000     37X   JSX .LDBI
31111          77707A  DEF V11 FOFSET
31112  42000    6750R  JSM P222  TUNE
31113  42000     37X   JSX .LDBI
31114          77651A  DEF V32681  LTEMP
31115  42000    126X   JSX MPY3
31116           2276R  DEF =D2
31117   4020     20A   LDB AR2
```

```
31120  77202             SLB *+2,C
31121  34020     20A     STB AR2
31122  42000     11120R  JSM P668   SPANW
31123  66000     31142R  JMP A1686
31124                  A1685 EQU *
31124  42000     37X     JSX .LDBI
31125            77651A  DEF V32681   LTEMP
31126  42000     150X    JSX ADD2
31127            77742A  DEF V32738   AL
31130  42000     145X    JSX SUB2
31131            77665A  DEF V8   CFREQ
31132  42000     11120R  JSM P668   SPANW
31133  42000     37X     JSX .LDBI
31134            77671A  DEF V9   SPAN
31135  42000     146X    JSX DIV3
31136            2276R   DEF =D2
31137  42000     140X    JSX MIN2
31140            77651A  DEF V32681   LTEMP
31141  42000     6750R   JSM P222   TUNE
31142                  A1686 EQU *
31142                  A1684 EQU *
31142                  A1682 EQU *
31142  66000     31311R  JMP A1658
31143                  C1687 EQU *
31143  42000     37X     JSX .LDBI
31144            77651A  DEF V32681   LTEMP
31145  4020      20A     LDB AR2
31146  77202             SLB *+2,C
31147  34020     20A     STB AR2
31150  42000     140X    JSX MIN2
31151            11137R  DEF D674   1700000000
31152  4020      20A     LDB AR2
31153  77013             SLB A1688
31154  42000     37X     JSX .LDBI
31155            77651A  DEF V32681   LTEMP
31156  42000     202X    JSX .DSGN
31157  170416            AAR 15
31160  170600            SAL 1
31161  22000     1457R   ADA =D1
31162  42000     122X    JSX CNV42
31163  42000     153X    JSX MPY2
31164            11137R  DEF D674   1700000000
31165  66000     31170R  JMP A1689
31166                  A1688 EQU *
31166  42000     37X     JSX .LDBI
31167            77651A  DEF V32681   LTEMP
31170                  A1689 EQU *
31170  42000     34X     JSX .STRD
31171            77713A  DEF V7   FSTEP
31172  66000     31311R  JMP A1658
31173                  C1690 EQU *
31173  1566      77566A  LDA V32630   KEYCODE
31174  12000     2107R   CPA =D3
31175  66000     31177R  JMP *+2
31176  66000     31204R  JMP A1691
31177  42000     37X     JSX .LDBI
31200            77651A  DEF V32681   LTEMP
31201  42000     50X     JSX CNV24
31202  42000     3114R   JSM P326   WDACS
31203  66000     31261R  JMP A1692
31204                  A1691 EQU *
31204  2000      3166R   LDA =D1023
31205  70540             PWC A
31206  42000     37X     JSX .LDBI
31207            77651A  DEF V32681   LTEMP
31210  42000     50X     JSX CNV24
31211  42000     2132R   JSM P265   LIMIT
31212  31573     77573A  STA V32635   I
31213  1566      77566A  LDA V32630   KEYCODE
31214  22000     10241R  ADA =D-29
31215  42000     113X    JSX DIV4
31216            2107R   DEF =D3
31217  66000     31260R  JMP A1693
31220                  C1694 EQU *
31220  1573      77573A  LDA V32635   I
31221  31615     77615A  STA V32653   DAC1
31222  1573      77573A  LDA V32635   I
31223  6000      1463R   LDB =D0
31224  42000     75X     JSX .WS4
31225  66000     31261R  JMP A1695
31226                  C1696 EQU *
31226  1573      77573A  LDA V32635   I
31227  31613     77613A  STA V32651   DAC4
31230  1573      77573A  LDA V32635   I
31231  6000      1463R   LDB =D0
31232  42000     112X    JSX .WS7
31233  66000     31261R  JMP A1695
31234                  C1697 EQU *
31234  1573      77573A  LDA V32635   I
31235  31614     77614A  STA V32652   DAC2
31236  1573      77573A  LDA V32635   I
31237  6000      1463R   LDB =D0
31240  42000     107X    JSX .WS5
31241  66000     31261R  JMP A1695
31242                  C1698 EQU *
31242  1573      77573A  LDA V32635   I
31243  42000     104X    JSX .TURN
31244            3166R   DEF =B1777
31245            77604A  DEF V32644   SATN
31246  6000      1457R   LDB =D1
```

```
31247  42000     75X        JSX  .WS4
31250  66000  31261R        JMP  A1695
31251         31242R        DEF  C1698
31252         31261R        DEF  A1695
31253         31261R        DEF  A1695
31254         31234R        DEF  C1697
31255         31226R        DEF  C1696
31256         31220R        DEF  C1694
31257                       DEC  -7
31260  42000    143X  A1693 JSX  .CASE
31261                 A1695 EQU  *
31261                 A1692 EQU  *
31261  66000  31311R        JMP  A1658
31262                 C1699 EQU  *
31262  42000  30340R        JSM  P1642  ADCLVL
31263  42000  11072R        JSM  P667   WLVLN
31264  66000  31311R        JMP  A1658
31265                 C1700 EQU  *
31265  42000  30340R        JSM  P1642  ADCLVL
31266  42000  11044R        JSM  P666   WTHRSH
31267  66000  31311R        JMP  A1658
31270         31265R        DEF  C1700
31271         31262R        DEF  C1699
31272         31173R        DEF  C1690
31273         31311R        DEF  A1658
31274         31143R        DEF  C1687
31275         31022R        DEF  C1680
31276         30676R        DEF  C1673
31277         30577R        DEF  C1665
31300         30573R        DEF  C1664
31301         30555R        DEF  C1663
31302         30552R        DEF  C1662
31303         30526R        DEF  C1661
31304         30516R        DEF  C1660
31305         30505R        DEF  C1659
31306         30471R        DEF  C1657
31307                       DEC  -16
31310  42000    143X  A1656 JSX  .CASE
31311                 A1658 EQU  *
31311   1620  77620A        LDA  V32656  PREFIX
31312  22000  13136R        ADA  =D-11
31313 172002                SAP  A1701
31314  42000   2762R        JSM  P314   AVGRST
31315                 A1701 EQU  *
31315   1576  77576A        LDA  V32638  RPGPTR
31316  12000   7565R        CPA  =D18
31317  66000  31321R        JMP  *+2
31320  66000  31421R        JMP  A1702
31321   1730  77730A        LDA  V30 KFLAG
31322 170606                SAL  7
31323 172012                SAP  A1703
31324  42000  10312R        JSM  P218   MKREL
31325   5717  77717A        LDB  V28 AMKR
31326  75617                MPY
31327  42000    122X        JSX  CNV42
31330  42000    140X        JSX  MIN2
31331         77651A        DEF  V32681  LTEMP
31332  42000     50X        JSX  CNV24
31333  42000  11010R        JSM  P663   STMKKR
31334  66000  31421R        JMP  A1704
31335                 A1703 EQU  *
31335   1605  77605A        LDA  V32645  SCANSL
31336  72032                RZA  A1705
31337  42000  10312R        JSM  P218   MKREL
31340  70540                PWC  A
31341   1717  77717A        LDA  V28 AMKR
31342  22000   1277R        ADA  =D-1
31343  42000    114X        JSX  MPY4I
31344  42000     45X        JSX  CNV41
31345  42000     36X        JSX  .SAR2
31346   1731  77731A        LDA  V18 SINDEX
31347  22000   1704R        ADA  =D6
31350  42000   4356R        JSM  P403   EXPSIX
31351  42000     62X        JSX  CNV21
31352  42000     36X        JSX  .SAR2
31353  42000     37X        JSX  .LDBI
31354         77651A        DEF  V32681  LTEMP
31355  42000     62X        JSX  CNV21
31356  42000     42X        JSX  DIVIT
31357  42000     36X        JSX  .SAR2
31360  42000     53X        JSX  .LDSI
31361          1457R        DEF  =D1
31362  42000     54X        JSX  CNV31
31363  42000     46X        JSX  ADDIT
31364  42000    204X        JSX  SUBIT
31365  42000    203X        JSX  CNV14
31366  42000  11010R        JSM  P663   STMKKR
31367  66000  31421R        JMP  A1706
31370                 A1705 EQU  *
31370  42000     37X        JSX  .LDBI
31371         77671A        DEF  V9   SPAN
31372  42000     62X        JSX  CNV21
31373  42000     36X        JSX  .SAR2
31374  42000  10312R        JSM  P218   MKREL
31375  22000   1457R        ADA  =D1
31376  42000    122X        JSX  CNV42
31377  42000    153X        JSX  MPY2
31400         77665A        DEF  V8   CFREQ
31401  42000    140X        JSX  MIN2
31402         77651A        DEF  V32681  LTEMP
```

```
31403  42000     62X      JSX CNV21
31404  42000     41X      JSX MPY1
31405         30424R      DEF =F1.003
31406  42000     42X      JSX DIVIT
31407  42000     36X      JSX .SAR2
31410  42000  10312R      JSM P218   MKREL
31411 172003             SAP A1707
31412   1717  77717A      LDA V28 AMKR
31413  66000  31415R      JMP A1708
31414                   A1707 EQU *
31414   2000  10522R      LDA =D501
31415                   A1708 EQU *
31415  42000     45X      JSX CNV41
31416  42000     46X      JSX ADD11
31417  42000    203X      JSX CNV14
31420  42000  11010R      JSM P663   STMRKR
31421                   A1706 EQU *
31421                   A1704 EQU *
31421                   A1702 EQU *
31421   1620  77620A      LDA V32656   PREFIX
31422  22000    645OR     ADA =D-23
31423  66000  32410R      JMP A1709
31424                   C1710 EQU *
31424   1566  77566A      LDA V32630   KEYCODE
31425  22000  31445R      ADA =B-61
31426 172414             SAM A1712
31427   1566  77566A      LDA V32630   KEYCODE
31430 170040              TCA
31431  22000  20441R      ADA =B67
31432 172410             SAM A1712
31433   1566  77566A      LDA V32630   KEYCODE
31434  12000  20441R      CPA =B67
31435  66000  31437R      JMP *+2
31436  66000  31446R      JMP A1711
31437   1616  77616A      LDA V32654   XFLAG
31440 170600              SAL 1
31441 172405             SAM A1711
31442                   A1712 EQU *
31442   2000   1463R      LDA =D0
31443  42000  14741R      JSM P929   ENTRY
31444  66000  31450R      JMP A1713
31445 177717
31445                      LIT
31446                   A1711 EQU *
31446   1566  77566A      LDA V32630   KEYCODE
31447  42000  24635R      JSM P220   SAVEM
31450                   A1713 EQU *
31450  66000  32411R      JMP A1714
31451                   C1715 EQU *
31451   1566  77566A      LDA V32630   KEYCODE
31452 170040              TCA
31453  22000  20441R      ADA =B67
31454 172402              SAM *+2
31455  66000  31557R      JMP A1716
31456   1566  77566A      LDA V32630   KEYCODE
31457  70540              PWC A
31460   2000   4207R      LDA =B160000
31461  42000   4171R      JSM P390   LGDB
31462   2000  15132R      LDA =B141
31463  42000  15546R      JSM P214   KEY
31464   2000  22223R      LDA =B143
31465  42000  15546R      JSM P214   KEY
31466   2000  21206R      LDA =B153
31467  42000  15546R      JSM P214   KEY
31470   2000  21206R      LDA =B153
31471  42000    555R      JSM P215   SKEY
31472   2000  22604R      LDA =B110
31473  42000    555R      JSM P215   SKEY
31474   2000   7670R      LDA =B164
31475  42000  15546R      JSM P214   KEY
31476   1740  77740A      LDA V32736   EFLAG
31477  52000   7731R      AND =B177737
31500  31740  77740A      STA V32736   EFLAG
31501   2000  22222R      LDA =D39
31502  42000   2434R      JSM P285   BLKOF
31503   1675  77675A      LDA V15 BLEDS
31504  52000  31541R      AND =B176077
31505  62000   1364R      IOR =B100
31506  31675  77675A      STA V15 BLEDS
31507  42000   2303R      JSM P277   GOFSET
31510  70540              PWC A
31511  42000   1665R      JSM P245   RLAD
31512  22000  21232R      ADA =D-70
31513  42000    116X      JSX SUB4T
31514  42000   3530R      JSM P355   REFLEV
31515  42000     37X      JSX .LDBI
31516         11133R      DEF D673   20000000
31517  42000    150X      JSX ADD2
31520         77707A      DEF V11 FOFSET
31521  42000   6750R      JSM P222   TUNE
31522  70760              W*C A
31523  31566  77566A      STA V32630   KEYCODE
31524  12000  10244R      CPA =B70
31525  66000  31527R      JMP *+2
31526  66000  31546R      JMP A1717
31527   2000   1456R      LDA =D12
31530  42000   4210R      JSM P392   IFBWOUT
31531  42000     37X      JSX .LDBI
31532         31542R      DEF =F2000000
31533  42000  11120R      JSM P666   SPAN*
```

```
31534    2000   10411R    LDA =B114
31535   42000   15546R    JSM P214  KEY
31536    2000   17407R    LDA =B115
31537   42000   15546R    JSM P214  KEY
31540   66000   31556R    JMP A1718
31541  176077
31542 2000000
31541                    LIT
31546                   A1717 EQU *
31546    2000    2107R    LDA =D3
31547   42000    4210R    JSM P392  IFBWOUT
31550   42000      53X    JSX .LDS1
31551            1463R    DEF =D0
31552   42000   11120R    JSM P668  SPANW
31553   42000      37X    JSX .LDB1
31554            6717R    DEF =F10000000
31555   42000    7345R    JSM P558  SCANT
31556                   A1718 EQU *
31556   66000   32033R    JMP A1719
31557                   A1716 EQU *
31557    1566   77566A    LDA V32630  KEYCODE
31560   22000    3232R    ADA =B-60
31561  172004            SAP A1720
31562    2000    1463R    LDA =D0
31563   42000   14741R    JSM P929  ENTRY
31564   66000   32033R    JMP A1721
31565                   A1720 EQU *
31565   42000   15143R    JSM P949  UNBLANK
31566    1566   77566A    LDA V32630  KEYCODE
31567   52000    2406R    AND =D7
31570   31573   77573A    STA V32635  I
31571   72424            SZA A1722
31572    2000   15667R    LDA =B177731
31573   70540             PWC A
31574    2000    1457R    LDA =D1
31575                   A1723 EQU *
31575   31572   77572A    STA V32634  J
31576   42000      60X    JSX .ARAY
31577               7R    DEF V4  MSTATE
31600   70541             PWC B
31601    1572   77572A    LDA V32634  J
31602   70540             PWC A
31603    1573   77573A    LDA V32635  I
31604   42000     174X    JSX .ARRY
31605             213R    DEF V115  ASAVE
31606   42000     170X    JSX .STAC
31607    2000    1457R    LDA =D1
31610   21572   77572A    ADA V32634  J
31611  144016      16A    ISZ C,I
31612   66000   31575R    JMP A1723
31613   54016      16A    DSZ C
31614   42000   15424R    JSM P974  SAVFIX
31615                   A1722 EQU *
31615    1616   77616A    LDA V32654  XFLAG
31616   52000   31651R    AND =B150761
31617   31616   77616A    STA V32654  XFLAG
31620    1730   77730A    LDA V30 KFLAG
31621   52000   31652R    AND =B177137
31622   31730   77730A    STA V30 KFLAG
31623   42000    3255R    JSM P337  WRFAT
31624    1740   77740A    LDA V32736  EFLAG
31625   52000    1363R    AND =B177774
31626   31740   77740A    STA V32736  EFLAG
31627    1676   77676A    LDA V16 TLEDS
31630   52000   15350R    AND =B176777
31631   42000    2163R    JSM P270  TLEDSOUT
31632    1701   77701A    LDA V23 RVBW
31633   31435   77435A    STA V32541  IF1
31634    1701   77701A    LDA V23 RVBW
31635  170607             SAL 8
31636   31434   77434A    STA V32540  IF2
31637    1700   77700A    LDA V22 RLVL
31640   42000    3530R    JSM P355  REFLEV
31641    1675   77675A    LDA V15 BLEDS
31642  170612             SAL 11
31643  172010            SAP A1724
31644    2000    3527R    LDA =D14
31645   42000    2223R    JSM P274  NBLK
31646    1704   77704A    LDA V33 LEVLIN
31647   42000   11072R    JSM P667  WLVLN
31650   66000   31655R    JMP A1725
31651  150761
31652  177137
31651                    LIT
31653                   A1724 EQU *
31653    2000   13753R    LDA =B155
31654   42000   15546R    JSM P214  KEY
31655                   A1725 EQU *
31655    1675   77675A    LDA V15 BLEDS
31656  170611             SAL 10
31657  172006            SAP A1726
31660    2000    2131R    LDA =D15
31661   42000    2223R    JSM P274  NBLK
31662    1705   77705A    LDA V32 THRESH
31663   42000   11044R    JSM P666  WTHRSH
31664   66000   31667R    JMP A1727
31665                   A1726 EQU *
31665    2000    7667R    LDA =B157
31666   42000   15546R    JSM P214  KEY
31667                   A1727 EQU *
```

```
31667    1733   77733A    LDA V20 FSTIM
31670 172004            SAP A1728
31671    1731   77731A    LDA V18 SINDEX
31672   42000    4411R    JSM P406  EXP2
31673   66000   31677R    JMP A1729
31674                   A1728 EQU *
31674    1731   77731A    LDA V18 SINDEX
31675   22000    5520R    ADA =D24
31676   42000    4356R    JSM P403  EXPSIX
31677                   A1729 EQU *
31677   42000    7345R    JSM P558  SCANT
31700    1675   77675A    LDA V15 BLEDS
31701   42000   15313R    JSM P968  CFDF
31702   42000      37X    JSX .LDB1
31703           77671A    DEF V9  SPAN
31704   42000   11120R    JSM P668  SPANW
31705   42000      37X    JSX .LDB1
31706           77665A    DEF V8  CFREQ
31707   42000    6750R    JSM P222  TUNE
31710    2000    1463R    LDA =D0
31711    6000    2203R    LDB =D8
31712   42000      75X    JSX .WS4
31713    1676   77676A    LDA V16 TLEDS
31714 170614              SAL 13
31715 172403            SAM A1731
31716    1733   77733A    LDA V20 FSTIM
31717 172003            SAP A1730
31720                   A1731 EQU *
31720    2000    3113R    LDA =B2060
31721   66000   31723R    JMP A1732
31722                   A1730 EQU *
31722    2000    7570R    LDA =B2020
31723                   A1732 EQU *
31723   42000      73X    JSX .W6
31724    2000    6703R    LDA =D1024
31725   42000     103X    JSX .W4
31726    1676   77676A    LDA V16 TLEDS
31727 170611              SAL 10
31730 172403            SAM A1734
31731    1733   77733A    LDA V20 FSTIM
31732 172003            SAP A1733
31733                   A1734 EQU *
31733    2000    3113R    LDA =B2060
31734   66000   31736R    JMP A1735
31735                   A1733 EQU *
31735    2000    7571R    LDA =B2030
31736                   A1735 EQU *
31736   42000      73X    JSX .W6
31737    1426   77426A    LDA V32534   UFLAG
31740 170502              SAR 3
31741   52000    1457R    AND =D1
31742 170040              TCA
31743   22000   21206R    ADA =B153
31744   42000     555R    JSM P215  SKEY
31745    1730   77730A    LDA V30 KFLAG
31746   42000   15050R    JSM P223  AMPU
31747    2000    2417R    LDA =B177772
31750   70540             PWC A
31751    2000    1457R    LDA =D1
31752                   A1736 EQU *
31752   31567   77567A    STA V32631  KEYCOL
31753   42000    2223R    JSM P274  NBLK
31754    1567   77567A    LDA V32631  KEYCOL
31755   42000    2314R    JSM P279  SBLK
31756    2000    1457R    LDA =D1
31757   21567   77567A    ADA V32631  KEYCOL
31760 144016      16A     ISZ C,I
31761   66000   31752R    JMP A1736
31762   54016      16A    DSZ C
31763   42000    2772R    JSM P315  DALG
31764    1435   77435A    LDA V32541  IF1
31765 172405            SAM A1737
31766    2000    3654R    LDA =D16
31767   42000    2223R    JSM P274  NBLK
31770    2000    2420R    LDA =D145
31771   42000      73X    JSX .W6
31772                   A1737 EQU *
31772    2000    2521R    LDA =D17
31773   42000    2434R    JSM P285  BLKOF
31774    1723   77723A    LDA V26 MKRMODE
31775   72004             RZA A1738
31776    2000   10411R    LDA =B114
31777   42000   15546R    JSM P214  KEY
32000   66000   32002R    JMP A1739
32001                   A1738 EQU *
32001   42000   10747R    JSM P219  MKRDEL
32002                   A1739 EQU *
32002    2000   10141R    LDA =D38
32003   42000    2434R    JSM P285  BLKOF
32004    1730   77730A    LDA V30 KFLAG
32005   52000    2107R    AND =D3
32006   72413             SZA A1740
32007    2000   10141R    LDA =D38
32010   42000    2223R    JSM P274  NBLK
32011    5730   77730A    LDB V30 KFLAG
32012 174615              SBL 14
32013    2000   21211R    LDA =B136
32014 176402            SBM A1741
32015    2000   21210R    LDA =D172
32016                   A1741 EQU *
```

```
32016   42000      73X      JSX .W6
32017    2000    2420R      LDA =D145
32020   42000      73X      JSX .W6
32021                     A1740 EQU *
32021    2000   22222R      LDA =D39
32022   42000    2434R      JSM P285   BLKOF
32023   42000    3221R      JSM P333   CORREK
32024  172003              SAP A1742
32025    2000   22222R      LDA =D39
32026   42000    2223R      JSM P274   NBLK
32027                     A1742 EQU *
32027   42000   30430R      JSM P1649  RBLK
32030   42000   30442R      JSM P1652  FBLK
32031   42000    2762R      JSM P314   AVGRST
32032   42000   15224R      JSM P221   TRIGR
32033                     A1721 EQU *
32033                     A1719 EQU *
32033   66000   32411R      JMP A1714
32034                     C1743 EQU *
32034    2000    5515R      LDA =D30
32035   70540               PWC A
32036   42000      37X      JSX .LDBI
32037           77651A      DEF V32681   LTEMP
32040   42000      50X      JSX CNV24
32041   42000    2132R      JSM P265   LIMIT
32042   31735   77735A      STA V32733   HPIB
32043  170600               SAL 1
32044   22000    1457R      ADA =D1
32045    6000    2411R      LDB =D4
32046   42000     112X      JSX .WS7
32047    2000   15343R      LDA =D40
32050   42000    2434R      JSM P285   BLKOF
32051    2000   20440R      LDA =B123456
32052   31734   77734A      STA V32732   CMOS
32053    2000    1463R      LDA =D0
32054   42000   14741R      JSM P929   ENTRY
32055   66000   32411R      JMP A1714
32056                     C1744 EQU *
32056    1737   77737A      LDA V32735   BLKS
32057   21612   77612A      ADA V32650   NCHR
32060    6000    2203R      LDB =D8
32061   42000      75X      JSX .WS4
32062    2000   10243R      LDA =D27
32063   42000   14055R      JSM P216   MESSAGE
32064    2000    2500R      LDA =D147
32065   42000      73X      JSX .W6
32066   66000   32415R      JMP L1633 DONE
32067                     C1745 EQU *
32067    1677   77677A      LDA V17 RFAT
32070  170613               SAL 12
32071  172006              SAP A1746
32072   42000      37X      JSX .LDBI
32073           77651A      DEF V32681   LTEMP
32074   42000      50X      JSX CNV24
32075   31432   77432A      STA V32538   GIN2
32076   66000   32103R      JMP A1747
32077                     A1746 EQU *
32077   42000      37X      JSX .LDBI
32100           77651A      DEF V32681   LTEMP
32101   42000      50X      JSX CNV24
32102   31433   77433A      STA V32539   GIN1
32103                     A1747 EQU *
32103   42000    2762R      JSM P314   AVGRST
32104    1700   77700A      LDA V22 RLVL
32105   42000    3530R      JSM P355   REFLEV
32106    2000    2411R      LDA =D4
32107   42000    2314R      JSM P279   SBLK
32110   66000   32411R      JMP A1714
32111                     C1748 EQU *
32111   42000      37X      JSX .LDBI
32112           77651A      DEF V32681   LTEMP
32113   71500               NRM
32114   35577   77577A      STB V32639   CTBASE
32115    1577   77577A      LDA V32639   CTBASE
32116   12000    1456R      CPA =D12
32117   66000   32121R      JMP *+2
32120   66000   32125R      JMP A1749
32121    1730   77730A      LDA V30 KFLAG
32122   52000   15350R      AND =B176777
32123   31730   77730A      STA V30 KFLAG
32124   66000   32137R      JMP A1750
32125                     A1749 EQU *
32125    1730   77730A      LDA V30 KFLAG
32126   62000    1300R      IOR =B1000
32127   31730   77730A      STA V30 KFLAG
32130    2000    2405R      LDA =D5
32131   70540               PWC A
32132    1577   77577A      LDA V32639   CTBASE
32133   22000    2417R      ADA =D-6
32134   42000    2132R      JSM P265   LIMIT
32135   22000    1457R      ADA =D1
32136   31577   77577A      STA V32639   CTBASE
32137                     A1750 EQU *
32137   66000   32411R      JMP A1714
32140                     C1751 EQU *
32140    2000    5516R      LDA =D16383
32141   70540               PWC A
32142   42000      53X      JSX .LDSI
32143            1457R      DEF =D1
32144   42000     140X      JSX MIN2
```

```
32145               77651A     DEF V32681  LTEMP
32146   42000          50X     JSX CNV24
32147   42000        2132R     JSM P265  LIMIT
32150   22000        1457R     ADA =D1
32151   31610       77610A     STA V32648  ALIM
32152   66000       32411R     JMP A1714
32153                        C1752 EQU *
32153    1706       77706A     LDA V31 ROFSET
32154  170040                  TCA
32155   21700       77700A     ADA V22 RLVL
32156   70540                  PWC A
32157   42000       30303R     JSM P1636 DBLVL
32160   42000          57X     JSX ADD4T
32161   31700       77700A     STA V22 RLVL
32162   42000       30303R     JSM P1636 DBLVL
32163   31706       77706A     STA V31 ROFSET
32164    1730       77730A     LDA V30 RFLAG
32165   42000       15050R     JSM P223  AMPU
32166   42000       30430R     JSM P1649 RBLK
32167   66000       32411R     JMP A1714
32170                        C1753 EQU *
32170   42000          37X     JSX .LDBI
32171               77665A     DEF V8  CFREQ
32172   42000         150X     JSX ADD2
32173               77651A     DEF V32681  LTEMP
32174   42000         145X     JSX SUB2
32175               77707A     DEF V11 FOFSET
32176   42000          34X     JSX .STRD
32177               77665A     DEF V8  CFREQ
32200   42000         161X     JSX .MVE4
32201               77651A     DEF V32681  LTEMP
32202               77707A     DEF V11 FOFSET
32203   42000        6750R     JSM P222  TUNE
32204   42000       30442R     JSM P1652 FBLK
32205   66000       32411R     JMP A1714
32206                        C1754 EQU *
32206   42000          37X     JSX .LDBI
32207               77651A     DEF V32681  LTEMP
32210   42000          50X     JSX CNV24
32211   52000        6353R     AND =B7777
32212   31563       77563A     STA V32627  DSTAD
32213   66000       32411R     JMP A1714
32214                        C1755 EQU *
32214   42000          37X     JSX .LDBI
32215               77651A     DEF V32681  LTEMP
32216   42000          50X     JSX CNV24
32217   31572       77572A     STA V32634  J
32220  172003                  SAP A1756
32221   52000        3166R     AND =B1777
32222   66000       32223R     JMP A1757
32223                        A1756 EQU *
32223                        A1757 EQU *
32223   70540                  PWC A
32224    1601       77601A     LDA V32641  HPBC
32225   52000       23366R     AND =B14000
32226   22000       32250R     ADA =B164000
32227   72405                  SZA A1759
32230    1601       77601A     LDA V32641  HPBC
32231   52000        6352R     AND =B6000
32232   22000        5742R     ADA =B176000
32233   72003                  RZA A1758
32234                        A1759 EQU *
32234    2000        2277R     LDA =D2048
32235   66000       32237R     JMP A1760
32236                        A1758 EQU *
32236    2000        1463R     LDA =D0
32237                        A1760 EQU *
32237   42000         136X     JSX .ORT
32240   42000       12265R     JSM P731  DSWRT
32241    1601       77601A     LDA V32641  HPBC
32242  170140                  CMA
32243   42000         104X     JSX .TURN
32244                2277R     DEF =B4000
32245               77601A     DEF V32641  HPBC
32246   31601       77601A     STA V32641  HPBC
32247   66000       32415R     JMP L1633 DONE
32250  164000
32250                          LIT
32251                        C1761 EQU *
32251   42000          53X     JSX .LDSI
32252               11310R     DEF =H100
32253   42000         165X     JSX .BMIN
32254   42000         145X     JSX SUB2
32255               77651A     DEF V32681  LTEMP
32256    4020          20A     LDB AR2
32257   77007                  SLB A1762
32260   42000          53X     JSX .LDSI
32261               11310R     DEF =H100
32262   42000         165X     JSX .BMIN
32263   42000          34X     JSX .STRD
32264               77651A     DEF V32681  LTEMP
32265   66000       32302R     JMP A1763
32266                        A1762 EQU *
32266   42000          53X     JSX .LDSI
32267                2644R     DEF =H1000
32270   42000         165X     JSX .BMIN
32271   42000         140X     JSX MIN2
32272               77651A     DEF V32681  LTEMP
32273    4020          20A     LDB AR2
32274   77006                  SLB A1764
```

```
32275   42000     53X        JSX  .LDSI
32276             2644R      DEF  =H1000
32277   42000     165X       JSX  .BMIN
32300   42000     34X        JSX  .STRD
32301             77651A     DEF  V32681  LTEMP
32302                  A1764 EQU  *
32302                  A1763 EQU  *
32302    2000     2221R      LDA  =D9
32303   70540                PWC  A
32304   42000     37X        JSX  .LDBI
32305             77651A     DEF  V32681  LTEMP
32306   42000     26X        JSM  P213  ROUND
32307    6000     2276R      LDB  =D2
32310   42000     47X        JSX  .DRGT
32311   42000     50X        JSX  CNV24
32312    6000     32361R     LDB  =D1600
32313   75617                MPY
32314   42000     104X       JSX  .TURN
32315             32362R     DEF  =B177760
32316             77677A     DEF  V17 RFAT
32317   31677     77677A     STA  V17 RFAT
32320   42000     2762R      JSM  P314  AVGRST
32321    1700     77700A     LDA  V22 RLVL
32322   42000     3530R      JSM  P355  REFLEV
32323   66000     32411R     JMP  A1714
32324                  C1765 EQU  *
32324   42000     13045R     JSM  P791  DHPB
32325    2000     4470R      LDA  =D1000
32326   70540                PWC  A
32327   42000     37X        JSX  .LDBI
32330             77651A     DEF  V32681  LTEMP
32331   42000     50X        JSX  CNV24
32332   22000     1277R      ADA  =D-1
32333   42000     2132R      JSM  P265  LIMIT
32334   22000     1457R      ADA  =D1
32335   31573     77573A     STA  V32635  I
32336    1616     77616A     LDA  V32654  XFLAG
32337   62000     2644R      IOR  =B10000
32340   52000     15666R     AND  =B77776
32341   31616     77616A     STA  V32654  XFLAG
32342    1573     77573A     LDA  V32635  I
32343   70540                PWC  A
32344    1563     77563A     LDA  V32627  DSTAD
32345   70540                PWC  A
32346    2000     4470R      LDA  =D1000
32347   42000     113X       JSX  DIV4
32350             77573A     DEF  V32635  I
32351   22000     1457R      ADA  =D1
32352   70540                PWC  A
32353   42000     166X       JSX  .CSHV
32354             4630R      DEF  P421  RDBMV
32355    1601     77601A     LDA  V32641  HPBC
32356  170507                SAR  8
32357   42000     23X        JSM  P210  SDUMP
32360   66000     32415R     JMP  L1633 DONE
32361    3100
32362  177760
32361                        LIT
32363             32324R     DEF  C1765
32364             32251R     DEF  C1761
32365             32214R     DEF  C1755
32366             32206R     DEF  C1754
32367             32411R     DEF  A1714
32370             32411R     DEF  A1714
32371             32411R     DEF  A1714
32372             32411R     DEF  A1714
32373             32170R     DEF  C1753
32374             32153R     DEF  C1752
32375             32411R     DEF  A1714
32376             32140R     DEF  C1751
32377             32111R     DEF  C1748
32400             32411R     DEF  A1714
32401             32067R     DEF  C1745
32402             32411R     DEF  A1714
32403             32056R     DEF  C1744
32404             32034R     DEF  C1743
32405             31451R     DEF  C1715
32406             31424R     DEF  C1710
32407                        DEC  -21
32410   42000     143X   A1709 JSX  .CASE
32411                  A1714 EQU  *
32411   42000     12334R     JSM  P217  MBLK
32412    1730     77730A     LDA  V30 KFLAG
32413   52000     11303R     AND  =B177377
32414   31730     77730A     STA  V30 KFLAG
32415                  L1633 EQU  * DONE
32415    1616     77616A     LDA  V32654  XFLAG
32416   62000     2644R      IOR  =B10000
32417   31616     77616A     STA  V32654  XFLAG
32420                  A1632 EQU  *
32420   52000     15666R     AND  =B77776
32421   31616     77616A     STA  V32654  XFLAG
32422   66000     32432R     JMP  A1522
32423             30000R     DEF  C1607
32424             27776R     DEF  C1606
32425             26640R     DEF  C1540
32426             26320R     DEF  C1523
32427             25711R     DEF  C1488
32430                        DEC  -6
32431   42000     143X   A1487 JSX  .CASE
32432                  A1522 EQU  *
```

```
32432    1616   77616A      LDA V32654  XFLAG
32433   52000    1704R      AND =D6
32434   72002               RZA *+2
32435   66000   25205R      JMP L190  LOOP
32436   76702               SHC *+2
32437   66000   25205R      JMP L190  LOOP
32440    1616   77616A      LDA V32654  XFLAG
32441  170500               SAR 1
32442   52000    2107R      AND =D3
32443   31575   77575A      STA V32637  K
32444    1616   77616A      LDA V32654  XFLAG
32445   52000    6232R      AND =B177761
32446   31616   77616A      STA V32654  XFLAG
32447    1575   77575A      LDA V32637  K
32450   12000    2276R      CPA =D2
32451   66000   32453R      JMP *+2
32452   66000   32462R      JMP A1766
32453    1616   77616A      LDA V32654  XFLAG
32454  170612               SAL 11
32455  172004              SAP A1767
32456   42000      37X      JSX .LDB1
32457           77665A      DEF V8  CFREG
32460   42000    6016R      JSM P500  STUNE
32461                  A1767 EQU *
32461   66000   32471R      JMP A1768
32462                  A1766 EQU *
32462    1676   77676A      LDA V16 ILEDS
32463   52000   16170R      AND =B611
32464   72002               RZA *+2
32465   66000   25205R      JMP L190  LOOP
32466    1740   77740A      LDA V32736  EFLAG
32467   62000    1364R      IOR =B100
32470   31740   77740A      STA V32736  EFLAG
32471                  A1768 EQU *
32471   42000    7732R      JSM P599  FPNLON
32472   66000   25707R      JMP L191  SLOOP
32473                  L195  EQU * ABORT
32473    1601   77601A      LDA V32641  HPBC
32474   52000   16171R      AND =B157777
32475   31601   77601A      STA V32641  HPBC
32476                  L193  EQU * RESET
32476    2000     566R      LDA =B76000
32477   30003       3A      STA V12 RPTR
32500    2000     567R      LDA =B76100
32501   31763   77763A      STA V14 EPTR
32502   30016      16A      STA V13 CPTR
32503    1616   77616A      LDA V32654  XFLAG
32504   52000    1375R      AND =B177767
32505   31616   77616A      STA V32654  XFLAG
32506    1730   77730A      LDA V30 KFLAG
32507   52000   13044R      AND =B177577
32510   31730   77730A      STA V30 KFLAG
32511    1675   77675A      LDA V15 BLEDS
32512   52000    2153R      AND =B177773
32513   31675   77675A      STA V15 BLEDS
32514    1601   77601A      LDA V32641  HPBC
32515  172007              SAP A1769
32516    1602   77602A      LDA V32642  LKMSK
32517    6000    2107R      LDB =D3
32520   42000     107X      JSX .WS5
32521    1601   77601A      LDA V32641  HPBC
32522   52000    6514R      AND =B77777
32523   31601   77601A      STA V32641  HPBC
32524                  A1769 EQU *
32524   66000   25205R      JMP L190  LOOP
32525   66000       6R STOP  JMP ANFNG
32525               6R      END ANFNG

---------------
MCCP  NCCP  IBCK  ICNT  NCNT  IV   MFLAG  KTX
0     0     0     0     1     12   -1     3
ISTAR=17435 KT=0
INPUT BUFFER NV:
  END ANFNG
RING BUFFER NW,MW:

1
```

APPENDIX B-31
ADDRESS ASSIGNMENTS

| ADDRESS DEC | ADDRESS OCT | FUNCTION | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|
| 0 | 0 | 50 MHz VTO LOW ORDER DAC | | | | | | | MSB— | | | | | | | | | —LSB |
| 1 | 1 | 50 MHz VTO HIGH ORDER DAC | | | | | | | MSB— | | | | | | | | | —LSB |
| 2 | 2 | NOT USED | | | | | | | | | | | | | | | | |
| 3 | 3 | YIG DAC | | | | | | | MSB— | | | | | | | | | —LSB |
| 4 | 4 | SCAN ATTEN & VTO CONTROL | VTO HFLT | VTO HDIV | ÷00÷1 | | ÷10÷100 | | MSB— | | | | | | | | | —LSB |
| 5 | 5 | SCANTIME (1MSECX) | | | | | | | | | | | $\overline{10}$ | $\overline{1.5}$ | $\overline{2}$ | $\overline{5}$ | $\overline{10}$ | $\overline{100}$ |
| 6 | 6 | YIG φ LOCK, SCAN | | 100KHz LOOP | 10KHz LOOP | LOOP GND | $\overline{\text{BCW}}$ 2nd LO RESET SHIFT | | | | | | | | | | | |
| 7 | 7 | RESET 2nd LO SHIFT SCAN MODE | $\overline{\text{HOLD}}$ | BW | BW | | | | | | | | | | YIG MAIN | | YIG FM | VTO |
| 8 | 10 | 85680 FRONT PANEL LEDS | RBW | YBW | SCAN TIME | SHIFT KEY | ATTN | LINE TRIG EXT TRIG | SINGLE TRIG | | VIDEO TRIG | RPG ENBLD. | INPUT #2 | INPUT #1 | | | | |
| 9 | 11 | KEY ROWS, RPG ENABLE | RPG ENABLE | | | | ROW #11— | | | | | | | | | | | —ROW #0 |
| 10 | 12 | KEY COLUMNS, QUALIFIERS | REMOTE | | | | UNDB KEY DOWN | | RPG SIGN | | COL #7— | | | | | | | —COL #0 |
| 11 | 13 | RPG COUNT QUALIFIERS | MSB— | RPG COUNT (BINARY) | | | | | —LBS | | | | HPIB BUSY | CTR BUSY | EXT REF | | | SERVICE REQUEST (SEE CODE) |
| 12 | 14 | RESETS | | | | | | | | | | | | | | | | RESETS (SEE CODE) |

| SERVICE REQUEST | CODE |
|---|---|
| 0 0 0 | HISCAN |
| 0 0 1 | EXT.REF |
| 0 1 0 | LOCAL/REM |
| 0 1 1 | RPG |
| 1 0 0 | KEYDOWN DEBOUNCED |
| 1 0 1 | LTGR |
| 1 1 0 | REMOTE REQ |
| 1 1 1 | UNLOCKED |

| RESET | CODE |
|---|---|
| 0 0 0 | |
| 0 0 1 | EXT |
| 0 1 0 | LOCAL |
| 0 1 1 | RPG |
| 1 0 0 | KEYDOWN |
| 1 0 1 | HISCAN |

-continued

APPENDIX B-31

ADDRESS ASSIGNMENTS

| ADDRESS DEC | ADDRESS OCT | FUNCTION | | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|
| | | 1 1 0 | STOP | | | | | | | | | | | | | | | | |
| | | 1 1 1 | | | | | | | | | | | | | | | | | |
| 13 | 15 | φ LOCK FLAG ENABLE | | LO DAC | HI DAC | REF NOT φ3 LOCKED | | φ2 | φ1 | | | | | | | | | | |
| 14 | 16 | 245MHz φ LOCK DIVIDE # = 9-M+.125(N) FREQ = 280-VTO REF-[(DIVIDE #)(4)] | | MSB —— | M | —— LSB | MSB —— | N(RATIO) | —— LSB | | | | | | | | | | |
| 15 | 17 | INPUT RELAY ATTENUATOR | | | | | | | | | | | | | | RELAY 0 = IN #1 | | | ATTEN CODE |
| | | ATTEN | CODE | | | | | | | | | | | | | | | | |
| | | 0 0 0 | 70dB | | | | | | | | | | | | | | | | |
| | | 0 0 1 | 60 | | | | | | | | | | | | | | | | |
| | | 0 1 0 | 50 | | | | | | | | | | | | | | | | |
| | | 0 1 1 | 40 | | | | | | | | | | | | | | | | |
| | | 1 0 0 | 30 | | | | | | | | | | | | | | | | |
| | | 1 0 1 | 20 | | | | | | | | | | | | | | | | |
| | | 1 1 0 | 10 | | | | | | | | | | | | | | | | |
| | | 1 1 1 | 0dB | | | | | | | | | | | | | | | | |
| 16 | 20 | NOT USED | | | | | | | | | | | | | | | | | |
| 17 | 21 | HPIB TO HYBRID | | | | | | | | | | X | X | X | X | X | X | X | X |
| 18 | 22 | HYBRID TO HPIB | | | | | | | | | | X | X | X | X | X | X | X | X |
| 19 | 23 | HPIB STATUS | | | | | | | | | | | | | | | | | |
| 20 | 24 | COUNTER INPUT, PERIOD SELECT | | | | | | | | | | | | MSB —— | M SECTION | —— | —— | LSB | INPUT SELECT (SEE CODE) |
| | | INPUT | CODE | | | | | | | | | | | | | | | | |
| | | 0 0 | TIMER | | | | | | | | | | | | | | | | |
| | | 0 1 | SIG IF | | | | | | | | | | | | | | | | |
| | | 1 0 | PILOT IF | | | | | | | | | | | | | | | | |
| | | 1 1 | VTO | | | | | | | | | | | | | | | | |
| 21 | 25 | COUNTER OUTPUT 4 MSD BCD | | MSB —— | | | | | | | | | | | | | | | —— LSB |
| 22 | 26 | COUNTER OUTPUT 4 LSD BCD | | MSB —— | | | | | | | | | | | | | | | —— LSB |
| 23 | 27 | NOT USED | | | | | | | | | | | | | | | | | |
| 24 | 30 | INPUT OPTS, & POST ATTEN GAIN | | IN #2 OPTS (SEE CODE) | | IN #1 OPTS (SEE CODE) | | | | | | MSB —— | | | 20 dB ATTEN ERROR | | | | —— LSB |
| | | INPUT OPT. | CODE | | | | | | | | | | | | | | | | |
| | | 0 0 | 50 Ω | | | | | | | | | | | | | | | | |
| | | 0 1 | 75 Ω | | | | | | | | | | | | | | | | |
| | | 1 0 | HI Z | | | | | | | | | | | | | | | | |
| | | 1 1 | NOT PRESENT | | | | | | | | | | | | | | | | |

-continued

APPENDIX B-31
ADDRESS ASSIGNMENTS

| ADDRESS DEC | ADDRESS OCT | FUNCTION | | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|
| 25 | 31 | READOUT UNITS, POST ATTEN GAIN | | DEFAULT READOUT UNITS (SEE CODE) | | PRE-AMPS PRESENT | | | | | | MSB— | | | 30 dB ATTEN ERROR | | | | —LSB |
| | | UNITS | CODE | | | | | | | | | | | | | | | | |
| | | 0 0 | dBm | | | | | | | | | | | | | | | | |
| | | 0 1 | dBmV | | | | | | | | | | | | | | | | |
| | | 1 0 | dBμV | | | | | | | | | | | | | | | | |
| 26 | 32 | MSB | | | | | | | | | | MSB— | | | 40 dB ATTEN ERROR | | | | —LSB |
| 27 | 33 | LSB | | | | | | | | | | MSB— | | | 50 dB ATTEN ERROR | | | | —LSB |
| 28 | 34 | MSB | | | | | | | | | | MSB— | | | 60 dB ATTEN ERROR | | | | —LSB |
| 29 | 35 | LSB | | | | | | | | | | MSB— | | | 70 dB ATTEN ERROR | | | | —LSB |
| 30 | 36 | NOT USED | | | | | | | | | | | | | | | | | |
| 31 | 37 | NOT USED | | | | | | | | | | | | | | | | | |
| 32 | 40 | DIGITAL STORAGE SET ADDRESS | | | | | | MSB— | | | | | | | | | | | —LSB |
| 33 | 41 | D.S. READ & INC. ADDRESS | | | | | | MSB— | | | | | | | | | | | —LSB |
| 34 | 42 | D.S. WRITE & INC. ADDRESS | | | | | | MSB— | | | | | | | | | | | —LSB |
| 35 | 43 | D.S. LOAD OFFSET | | | | | | MSB— | | | | | | | | | | | —LSB |
| 36 | 44 | D.S. VIDEO CONTROL | | | | | | MSB— | | | | | | | | | | | —LSB |
| 37 | 45 | D.S. READ SCAN ADDRESS | | | | | | MSB— | | | | | | | | | | | —LSB |
| 38 | 46 | D.S. LOAD MARKER | | | | | | MSB— | | | | | | | | | | | —LSB |
| 39 | 47 | D.S. LOAD SCAN ADDRESS | | | | | | MSB— | | | | | | | | | | | —LSB |
| 40 | 50 | NOT USED | | | | | | | | | | | | | | | | | |
| 49 | 61 | NOT USED | | | | | | | | | | | | | | | | | |
| 50 | 62 | SCAN TRIGGER & SOURCE SEL. | | GO ARM STOP | | | SOURCE (SEE CODE) | | | | | | | | | | | | |
| | | SOURCE | CODE | | | | | | | | | | | | | | | | |
| | | 0 0 | FREE RUN | | | | | | | | | | | | | | | | |
| | | 0 1 | EXT | | | | | | | | | | | | | | | | |
| | | 1 0 | LINE | | | | | | | | | | | | | | | | |
| 51 | 63 | FAST SCAN GEN 10 MSEC ÷ X | | ON | X100 | X10 | X5 | X2 (X = MULTIPLY SELECTED VALUES) | | | | | | | | | | | |
| 52 | 64 | IF SCALE, GAIN | | LOG:1 LIN:0 | dB SCALE (SEE CODE) | REC CAL | | ZERO | CRT OFF | AZD | AID | SG 20 | SG 20 | SG 10 | LG 20 | LG 10 | OS 20 | OS 20 | OS 10 |
| | | SOURCE | CODE | | | | | | | | | | | | | | | | |
| | | 0 0 | 10dB | | | | | | | | | | | | | | | | |

-continued

APPENDIX B-31
ADDRESS ASSIGNMENTS

| ADDRESS DEC | ADDRESS OCT | FUNCTION | | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|
| | | 0 1 | 5 | | | | | | | | | | | | | | | | |
| | | 1 0 | 2 | | | | | | | | | | | | | | | | |
| | | 1 1 | 1 | | | | | | | | | | | | | | | | |
| 53 | 65 | IF BW, FINE GAIN | | MSB | RES BW (SEE CODE) | | LSB | MSB | VID BW (SEE CODE) | | LSB | ATTEN 8 | ATTEN 4 | 2 | ATTEN 1 | ATTEN .8 | ATTEN .4 | .2 | ATTEN .1 |
| 54 | 66 | LEDS | | | VIDEO | | EXT | LINE | SINGLE SWP | SHIFT | WRITE B | WRITE A-B A | | BLNK B | VIEW B | PEAK B | BLNK A | VIEW A | PEAK A |

| BANDWIDTH | CODE RES BW | VID BW |
|---|---|---|
| 0 0 0 0 | | 1 Hz |
| 0 0 0 1 | | 3 Hz |
| 0 0 1 0 | 10 Hz | 10 Hz |
| 0 0 1 1 | 30 Hz | 30 Hz |
| 0 1 0 0 | 100 Hz | 100 Hz |
| 0 1 0 1 | 300 Hz | 300 Hz |
| 0 1 1 0 | 1 KHz | 1 KHz |
| 0 1 1 1 | | |
| 1 0 0 0 | | |
| 1 0 0 1 | 3 KHz | 3 KHz |
| 1 0 1 0 | 10 KHz | 10 KHz |
| 1 0 1 1 | 30 KHz | 03 KHz |
| 1 1 0 0 | 100 KHz | 100 KHz |
| 1 1 0 1 | 300 KHz | 300 KHz |
| 1 1 1 0 | 1 MHz | 1 MHz |
| 1 1 1 1 | 3 MHz | 3 MHz |

MICRO ASSEMBLER: 18 FEB 76

APPENDIX C-1

```
                                                     MICRA 23 APRIL 79
                                                     *
                                                     *        PRODUCTION  SOFTWARE  REVISION #2
                                                     *
                                                     *       L. BOWER, M. NEERING  4/23/79
                                                     *
                                                     *
                                                     *       REGISTERS:
                                                             DECLARE SC=0,BPCR=0,SCAN=1,SOFR=2,MKR=3
                                                             DECLARE POSPK=4,NEGPK=5,T=5,VDC=6,REF=7
                                                             DECLARE SCR=0,X=1,Y=2,THRESH=3,DC=4,MA=5
                                                             DECLARE SAVEA=6,CHR=7,DELTAY=7,RA=7
                                                     *
                                                     *       FLAGS:
                                                             DECLARE FLGA=8,FLGB=9,FLGC=10,LROMEN=0
                                                             DECLARE SELA=11,SELB=13,HOLD=15,CE=12
                                                             DECLARE FLGTA=3,FLGTB=4,FLGTC=6
                                                             DECLARE CHAR=1,BLINK=2,FS=3,BRIGHT=4
                                                             DECLARE LLGBLANK=5,DIN=6,FSTPT=7,DOTEN=14
                                                     *
                                                     *       I/O PORTS:
                                                             DECLARE ADC=0,BPCAD=6,BPCD=7,MDR=3
                                                             DECLARE RAMP=4,BPCO=6,STT=8,MSRS=11
                                                             DECLARE MEM=1,TSTA=4,TSTB=3,MAR=7
                                                             DECLARE RTN=2,LGCHAR=0,LGX=1,LGY=2,LGEXP=5
                                                             DECLARE RSTO=9,INCRSA=10,CLRSA=12,DRTIMER=13
                                                             DECLARE SRSEN=14,CRSEN=15
                                                     *
                                                     *       CONSTANTS:
                                                             DECLARE 0=0,1=15,2=1,4=2,8=2,15=3,16=4,32=5,97=6
                                                             DECLARE 255=7,1023=8,1024=9,2047=10,2048=11
                                                             DECLARE 3072=12,4032=13,4095=14,1032=1
                                                     *
                                                     *       QUALIFIERS:
                                                             DECLARE B0=0,B1=1,B2=2,B3=3,B4=4,B5=5,B6=6,B7=7
                                                             DECLARE B8=8,B9=9,B10=10,B11=11,ZERO=12,POS=14
                                                     *
                                                     *
                                                     *
                                                     *                  MAIN PROGRAM
                                                     *
                                                     *        BPC SERVICE ROUTINE
                                                     *
                                                             ADRS 0
 0    0    2--1 1  0 3--17 17--0 2 1 6               HK      JCH H DAC=VDC*0
 1    0    1--1 1  0 3--17 17--0 4 1 6               CF      JCH H DAC=VDC
 2    0    1--1 1  0 2--17 17--0 5 0 6               CH      JCJ H SLROMEN DVDC=AC
 3    1    1--0 1  0 3--17 13--0 7 1 0               CJ      JCL OHSRS
 4    1    1--1 1 14 0--17  1--0 5 1 5               CL      JCM DT=B IMEM CCE
 5    0   27--0 1 13 2--17  6--0 4 0 5               CM      JCN H OBPCO DAC=T&B SSELA
 6    0  173--0 1 14 2--17  7--0 4 0 0               CD      JCF H OMAR DAC=BPCR&B SCE
 7    0    1--1 0 17 3--17 17--0 0 1 0               CG      JCI H W DAC=BPCR+1
10    1    1--1 0  0 3--17 17--0 5 0 0               CI      JCK W DBPCR=AC
11    0  175--1 0 14 0--17 17--0 7 1 0               CK      JCD H W CCE
12    0  174--1 1  0 3--17  7--0 5 1 0               BV      JCD H DBPCR=B IBPCD
13    0  173--1 1  0 3--17 17--0 5 0 0               BW      JCD H DBPCR=AC
14    0  173--0 0 14 2--17  7--0 4 0 0               BX      JCG H W DAC=BPCR&B OMAR SCE
15    1    5--1 1  0 3--17  7--0 5 1 2               BY      JCO DSOFR=B IBPCD
16    1    4--1 1  0 3--17  7--0 5 1 6               BZ      JCO DVDC=B IBPCD
17    1    3--1 1  0 3--17 17--0 5 0 0               CA      JCO DBPCR=AC
20    1    2--1 1  0 3--17 17--0 5 0 3               CB      JCO DMKR=AC
21    1    1--1 1  0 3--17  7--0 5 1 1               CC      JCO DSCAN=B IBPCD
22    0   12--0 1  0 3--17  6--0 4 0 1               CO      JCN H DAC=SCAN&B OBPCO
23    1  167--1 1 17 3--17 17--0 0 1 0               BR      JBV DAC=BPCR+1
24    0  170--0 1  0 3--17  3--0 4 0 5               BS1     JBX H DAC=T&B OMDR
25    1  171--1 1 17 3--17 17--0 1 1 0               BT      JBZ DAC=BPCR-1
26    1  172--1 1 17 3--17 17--0 1 1 5               BU      JCB DAC=T-1
27    1  174--1 1  0 3-- 1  7--0 5 1 5               BP      JBR QB1 DT=B IBPCD
30    1  175--1 1  0 3-- 1  7--0 5 1 5               BQ      JBT QB1 DT=B IBPCD
31    1  176--1 1  0 3-- 2  6--0 7 1 0               BO      JBP IBPCAD QB2
32    0    1--1 1 15 2--17  6--0 7 1 0               BM      JBN H IBPCAD SSELB
33    0  176--1 1  0 3-- 3  6--0 7 1 0               BN      JBO H IBPCAD QB3
34    1    2--1 1 17 3--17  3--0 0 1 2               CN      JAC ITSTB DAC=SOFR+1
                                                     *
                                                     *
                                                     *        MAIN LOOP
35    1    1--1 1 17 3--17  3--0 0 1 2               AB      JAC DAC=SOFR+1 ITSTB
36    0    2--1 1 14 0--11 17--1 1 1 1               AC      JAD H DAC=SCAN-AC QB9 CCE
37    0  173--1 1 14 0--17 17--0 7 1 0               BL      JBM H CCE
40    0    1--0 1 13 2--17  4--0 7 0 0               AD      JAE H DB=AC ORAMP SSELA
41    0    3--0 1 14 2--17  7--0 4 0 7               AE      JAG H DAC=REF&B OMAR SCE
42    1    1--1 1 12 3--17 17--0 3 0 6               AJ      JAF DAC=VDC/2047&B
43    1    3--1 1  0 3--10 17--0 5 0 5               AF      JAH DNEGPK=AC QB8
44    0    1--1 1 17 3--17  6--0 0 1 7               AG      JAI H DAC=REF+1 IBPCAD
45    0  170--1 1 17 0-- 0 17--0 5 0 7               AI      JAB H DREF=AC QB0 CHOLD
46    0    1--1 1  0 3--17 17--0 2 1 5               AH      JAK H  DAC=NEGPK*0
47    0    1--1 1  0 3--17 17--0 5 0 4               AK      JDI H DPOSPK=AC
50    0  125--1 1  0 3--17  4--0 7 1 0               DI      JXA H ITSTA
51    1    1--1 1 12 0--17 17--0 4 0 6               DJ      JAM DAC=VDC&B CFLGC
52    0  167--1 1  0 3--17 17--0 7 1 0               AM      JAE H
53    1    1--1 1 17 2--11 17--0 4 1 2               AN      JAO DAC=SOFR QB9 SHOLD
54    1   44--0 1 12 0--17 17--1 1 1 1               AO      JAQ DAC=SCAN-AC OCRSEN CFLGC
                                                     *
                                                     *
                                                     *        SCAN STOP ROUTINE
55    0   57--0 1 13 2-- 6 13--0 7 1 0               CQ      JCS H OFLGTC SSELA OHSRS
56    1  177--1 1 14 0--17  4--0 7 1 0               CP      JCQ ITSTA CCE
                                                     *
                                                     *
                                                     *        DIGITAL PEAK INPUT ROUTINE
57    1   24--1 1  0 3--17  4--0 7 1 0               EM      JEN ITSTA
```

```
 60   0   1--0 1  0 3-- 5 17--0 7 1 0   JT    JJU H QB5 OCRSEN
 61   0   1--1 1 11 0--17  4--0 7 1 0   JU    JJX H ITSTA CFLGB
 62   0  14--1 1 13 2--17 17--0 4 0 6   JX    JJY H DAC=VDC&B SSELA
 63   1  16--1 1 15 0-- 3 17--0 4 1 0   JV    JJW DAC=SC QFLGTA CSELB
 64   1   6--1 1  0 3--17 17--1 1 1 5   EB    JED DAC=NEGPK-AC
 65   1   1--1 1  0 3--17 17--1 1 1 4   EA    JEC DAC=POSPK-AC
 66   1   1--1 1 10 2--16 17--0 7 1 0   EC    JEE QPOS SFLGA
 67   1   1--1 1  0 3--17 17--0 4 1 0   EE    JEH DAC=SC
 70   1  32--1 1  0 3--17 17--0 5 0 4   EH    JEK DPOSPK=AC
 71   1 177--1 1  0 3--17 17--0 4 1 4   EG    JEO DAC=POSPK JEH
 72   1   1--1 1 10 0--16 17--0 7 1 0   ED    JEF QPOS CFLGA
 73   1   1--1 1  0 3--17 17--0 4 1 0   EF    JEI DAC=SC
 74   1   1--1 1  0 3--17 17--0 4 1 5   EI    JEJ DAC=NEGPK
 75   1  25--1 1  0 3--17 17--0 5 0 5   EJ    JEK DNEGPK=AC
 76   1   1--1 1 15 0-- 3 17--0 4 0 6   JY    JJZ DAC=VDC&B QB3 CSELB
 77   1   1--1 1  0 3-- 3 17--0 4 1 0   JZ    JEL DAC=SC QB3
100   0  22--1 1 17 2--17 17--0 5 0 4   EL    JEK H DPOSPK=AC SHOLD
101   0 163--1 1 13 2--17 17--0 7 1 0   JW    JEB H SSELA
102   0 133--0 1 15 2-- 0 16--0 7 1 0   AA    JAB H QB0 OSRSEN SSELB
103   1   1--1 1  0 3-- 3 17--0 7 1 0   EN    QFLGTA
104   0   1--1 1  0 3--17 17--0 4 1 0   EO    H DAC=SC
105   1   7--1 1  0 3--17 17--1 1 1 5   ER    JES DAC=NEGPK-AC
106   1   1--1 1  0 3--17 17--1 1 1 4   EP    DAC=POSPK-AC
107   0   1--1 1  0 3--16 17--0 7 1 0   EQ    H QPOS
110   0   1--1 1 15 2--17  3--0 4 1 0   ET    H DAC=SC SSELB ITSTB
111   1   2--1 1 13 0--11 17--0 5 0 4   EX    JEZ DPOSPK=AC CSELA QB9
112   1 177--1 1  0 3--17  3--0 4 1 4   EV    JEX DAC=POSPK ITSTB
113   0  17--1 1 10 0--17 17--0 5 0 0   EZ    JZB H DSC=AC CFLGA
114   1   1--1 1  0 3--16 17--0 7 1 0   ES    QPOS
115   1   1--1 1  0 3--17 17--0 4 1 0   EU    DAC=SC
116   1   1--1 1  0 3--17 17--0 4 1 5   EW    JEY DAC=NEGPK
117   1   5--1 1  0 3--17 17--0 5 0 5   EY    JFA DNEGPK=AC
120   1  15--0 1 11 2--17  4--0 7 0 0   AQ    JAS DB=AC ORAMP SFLGB
121   0  33--0 1 17 0--17  4--0 7 0 0   AP    JAU H DB=AC ORAMP CHOLD
122   0   1--1 1 17 2--17 17--0 5 0 0   EK    H DSC=AC SHOLD
123   1  62--1 1  0 3--17 17--0 4 0 6   GB    JGD DAC=VDC&B
124   0  30--0 1  0 3--17 10--0 5 0 0   FA    JAU H DSC=AC OSTT
125   1   4--1 1  0 3--17  4--0 7 1 0   JP    JJN ITSTA
126   0 131--1 1 17 0--17 17--0 4 0 6   JS    JEN H DAC=VDC&B CHOLD
127   1   1--1 1 17 2--17  4--0 7 1 0   JQ    JJR ITSTA SHOLD
130   0 176--1 1  0 3-- 4  0--0 5 1 0   JR    JJS H DSC=B IADC QFLGTB
131   0 176--1 1 14 0-- 2 17--0 5 0 7   JN    JJQ H DREF=AC QB2 CCE
132   0 124--1 1  0 3--17 17--0 7 1 0   ZB    JCP H
133   1  67--1 1 15 2--17 17--0 4 0 6   FB    JJF DAC=VDC&B SSELB
134   0  16--1 1 15 2--17 17--0 4 0 6   CS    JCU H DAC=VDC&B SSELB
                                        *
                                        *
                                        *
                                        *      FAST SCAN LOOP
135   0   3--1 1 17 0--17 17--0 5 0 0   AS    JAY H CHOLD DSC=AC
136   0 120--1 1 10 2--17 17--0 7 1 0   BK    JCP H SFLGA
137   0   1--1 1  0 3-- 0 17--0 7 1 0   AW    H QB0
140   0   1--1 1  0 3--17  6--0 7 1 0   AY    H IBPCAD
141   0   2--0 1 14 2-- 0  7--0 4 0 7   BA    JBC H DAC=REF&B ONAR SCE QB0
142   0  15--1 1 17 0--17  4--0 7 1 0   DP    JDN1 H ITSTA  CHOLD
143   0   1--1 1 17 3--17  3--0 0 1 7   BC    H DAC=REF+1 ITSTB
144   0   2--1 1  0 3--11 17--0 5 0 7   BE    JBG H DREF=AC QB9
145   0 111--1 1 10 2--17 17--0 5 0 7   BJ    JCP H DREF=AC SFLGA
146   1 170--1 1 14 0--17  4--0 7 1 0   BG    JBK ITSTA CCE
                                        *
                                        *
                                        *      DIGITAL PEAK LOOP
147   0  13--1 1 11 0-- 7 17--0 5 0 7   AZ    JBB H DREF=AC QB7 CFLGB
150   0 106--1 1 10 2--17 17--0 5 0 7   BI    JCP H DREF=AC SFLGA
151   0   3--1 1  0 3-- 0 17--0 7 1 0   AT    JAU H QB0
152   0  63--1 1 12 2--11 17--0 7 1 0   CU    JJM H SFLGC QB9
153   1 127--1 1  0 3--17  6--0 7 1 0   CT    JAA IBPCAD
154   0   1--1 1 11 2--17  6--0 7 1 0   AU    IBPCAD H SFLGB
155   0   4--0 1 14 2-- 0  7--0 4 0 7   AV    JAX H QB0 DAC=REF&B ONAR SCE
156   0   1--1 1 17 0--17  4--0 7 1 0   DN    JDN1 H ITSTA CHOLD
157   1   1--1 1  0 3-- 4 17--0 4 0 6   DN1   JDQ DAC=VDC&B QFLGTB
160   0  27--0 1 17 3-- 5 16--0 0 1 1   DQ    JDR H DAC=SCAN+1 QB5 OSRSEN
161   0 166--1 1 17 3--17  4--0 0 1 7   AX    JAZ H ITSTA DAC=REF+1
162   1  51--1 1 14 0--17  3--0 7 1 0   BB    JDE CCE ITSTB
163   1 165--1 1  0 3--17  4--0 7 1 0   BF    JBI ITSTA
                                        *
                                        *
                                        *
                                        *      FAST INPUT ROUTINE
164   0   1--1 1  0 3--17 17--0 4 0 6   FF    JFH H DAC=VDC&B
165   1   2--1 1  0 3-- 5  4--0 7 1 0   FH    JDF ITSTA QB5
166   0  51--1 1 10 2--17 17--0 7 1 0   FG    JIV H SFLGA
167   0   1--1 1  0 3-- 2 17--0 7 1 0   DF    JFI H QB2
170   1   3--1 1 17 2--17  4--0 7 1 0   FI    JXX ITSTA SHOLD
171   1   4--1 1 17 2--17  4--0 7 1 0   FP    JFR ITSTA SHOLD
172   1   6--1 1  0 3--17 17--0 4 1 4   FK    JFT DAC=POSPK
173   1 177--1 1  0 3--17  0--0 5 1 4   XX    JFK DPOSPK=B IADC
174   0 174--1 1  0 3-- 2 17--0 7 1 0   FJ    JFI H QB2
175   0   2--1 1  0 3-- 3  0--0 5 1 0   FR    JFS1 H DSC=B IADC QFLGTA
176   0 173--1 1  0 3-- 2 17--0 7 1 0   FO    JFP H QB2
177   0   1--1 1 17 0--17  3--0 4 1 0   FS1   JFT H DAC=SC ITSTB CHOLD
200   1 135--1 1  0 3--17 17--0 7 1 0   FT    JAS
201   1 134--1 1 15 0--17 17--0 5 0 4   FW    JAS DPOSPK=AC CSELB
202   0 162--1 1  0 3--11 17--0 7 1 0   FD    JFF H QB9
203   0 161--1 1  0 3--11 17--0 5 0 4   FE    JFF H QB9 DPOSPK=AC
204   0 121--1 1 17 3--17 17--0 0 1 7   JO    JJP H DAC=REF+1
                                        *
                                        *
                                        *      INPUT SET UP ROUTINE
205   0  64--1 1 11 3-- 2 17--0 0 1 1   GD    JGF H DAC=SCAN+1024 QB2
206   1  32--1 1  0 3-- 2 17--0 4 0 6   CE1   JBH DAC=VDC&B QB2
207   0   2--1 1  0 3--17  4--0 7 1 0   DR    JDT H ITSTA
210   0   1--1 1  0 3--17  4--0 4 1 1   DQ1   JDT H DAC=SCAN ITSTA
211   0  12--1 1  0 3--17 17--0 4 0 6   DT    JDW H DAC=VDC&B
212   1   1--1 1  0 3-- 1 17--0 7 0 0   DM    JDS DB=AC QB1
213   0   1--1 1 15 2-- 0 17--0 7 1 0   DS    H QB0 SSELB
```

```
214   1   4--1 1 13 2--17 17--0 4 0 6   DU    JJC DAC=VDC&B SSELA
215   0   1--1 1  0 3--17 17--0 7 1 0   DV    H
216   1   4--1 1 13 0--17 17--0 4 0 6   JB    JJF DAC=VDC&B CSELA
217   1   2--1 1 13 2--17 17--0 4 0 6   JA    JJE DAC=VDC&B SSELA
220   0  15--1 1 10 2--11 17--0 7 1 0   JC    JJM H QB9 SFLGA
221   0  14--1 1 10 2--11 17--0 7 1 0   JE    JJM H QB9 SFLGA
222   0  13--1 1 10 0--11 17--0 7 1 0   JF    JJM H QB9 CFLGA
223   0   1--1 1 10 2-- 4 17--0 4 0 6   DW    H DAC=VDC&B QB4 SFLGA
224   0   1--1 1 15 0-- 3 17--0 7 1 0   DZ    H QB3 CSELB
225   0   4--1 1 13 0--17 17--0 7 1 0   JG    JJI H CSELA
226   1   1--1 1 13 0--17 17--0 4 0 6   JH    DAC=VDC&B CSELA
227   0   6--1 1  0 3--11 17--0 7 1 0   JL    JJM H QB9
230   0   5--1 1 10 2--11 17--0 7 1 0   JK    JJM H QB9 SFLGA
231   1 171--1 1 15 2--17 17--0 4 0 6   JI    JJF DAC=VDC&B SSELB
232   1 176--1 1 13 2--17 17--0 4 0 6   JJ    JJK DAC=VDC&B SSELA
233   0 177--1 1 15 0--17 17--0 7 1 0   DE    JJJ H CSELB
234   0 127--1 1  0 3--11 17--0 7 1 0   BD    JBF H QB9
235   0 150--1 1 17 2--17 17--0 4 0 6   JM    JGD DAC=VDC&B H SHOLD
                                        *
                                        *
                                        *      MARKER CHECK ROUTINE
236   0   1--1 1 12 2--17 17--0 7 1 0   ZA    JIV H SFLGC
237   0 145--0 1 14 2--17  7--0 4 0 7   IV    JJO H DAC=REF&B OMAR SCE
240   0   1--1 1 12 0-- 0 17--0 7 1 0   BH    JCV H QB0 CFLGC
241   1   3--1 1  1 3--17 17--0 0 1 1   CV    JCX DAC=SCAN+1032
242   1   1--1 1  0 3--17 17--0 4 0 6   CW    JCZ DAC=VDC&B
243   1   4--1 1  0 3-- 1 17--0 7 1 0   CZ    JDA QB1
244   0   4--1 1  2 3--17 17--0 0 1 1   CX    JDC1 H DAC=SCAN+8
245   0   3--1 1 12 2--17 17--0 7 1 0   CY    JDC1 H SFLGC
246   0   2--1 1  2 3--17 17--0 0 1 1   DB    JDC1 H DAC=SCAN+8
247   1 176--1 1  1 3--17 17--0 0 1 1   DA    JCY DAC=SCAN+1032
250   0   1--0 1 14 2--17  7--0 7 0 0   DC1   JDD H DB=AC OMAR SCE
251   0   1--1 1  2 3--17 17--0 0 1 1   DD    JDL H DAC=SCAN+8
252   0   1--1 1  0 3--17 17--1 1 1 3   DL    JZD H DAC=MKR-AC
253   1   1--1 1  0 3--16 17--0 7 1 0   ZD    JZE QPOS
254   0   2--1 1 14 0--17  1--0 5 1 0   ZE    JFM1 H DSC=B IMEM CCE
255   0  10--1 0  0 3--17  3--0 7 1 0   FM    JFN H W ITSTB
256   0   7--1 1  0 3--17  3--0 7 1 0   FM1   JFN H ITSTB
257   1   1--1 1 13 3--17  4--0 3 1 0   DO    JDX DAC=SC/2048 ITSTA
260   1   1--0 1  0 3-- 6  3--0 7 0 0   DX    JDY DB=AC OMDR QFLGTC
261   1   1--1 1  0 3--17 17--0 7 1 0   DY    JFU
262   0   2--1 1  2 3--17 17--0 0 1 1   FU    JFL H DAC=SCAN+8
263   0   1--1 1  1 3--17 17--0 0 1 1   FV    JFL H DAC=SCAN+1032
264   0 171--0 0 14 2--17  7--0 7 0 0   FL    JFM H W DB=AC OMAR SCE
265   0   1--1 0 12 0--11 17--0 7 1 0   FN    JFO H W CFLGC QB9
266   0 150--1 0 14 0--17 17--0 7 1 0   FO    JZA H W CCE
                                        *
                                        *
                                        *      WRITE ROUTINE
267   1 113--0 1  0 3--17 13--0 2 0 6   IU    JFD DAC=VDC*0&B OMSRS
270   1 112--1 1  0 3--17 17--0 2 0 6   FC    JFD DAC=VDC*0&B
271   0   1--1 1  0 3--17 17--0 7 1 0   GF    JGG H
272   0   2--0 1 14 2--17  7--0 4 0 1   GG    JGI H DAC=SCAN&B OMAR SCE
273   0   1--0 1 14 2--17  7--0 7 0 0   GH    JGI H DB=AC OMAR SCE
274   0   1--1 1 17 3--17 17--0 1 1 2   GI    JGJ H DAC=SOFR-1
275   0   1--1 1  0 3--17  4--1 1 1 1   GJ    JGK H DAC=SCAN-AC ITSTA
276   1   1--0 1  0 3-- 4  4--0 7 0 0   GK    JGL DB=AC ORAMP QFLGTB
277   0   1--1 1 14 0--17  1--0 5 1 5   GL    JGM H DT=B IMEM CCE
300   0   2--1 1  0 3--17 17--0 4 0 5   GM    JGN H DAC=T&B
301   0  72--1 1 11 0--17 17--0 4 1 1   GE    JIR H DAC=SCAN CFLGB
302   1   1--1 1  0 3--12 17--0 4 0 6   GN    JGD DAC=VDC&B QB10
303   1   1--1 1 10 3-- 2 17--0 2 1 5   GO    JGP DAC=T*1023 QB2
304   1   2--1 1  0 3--17 17--0 7 1 0   GP    JGR
305   1   1--1 1 14 3--17 17--0 3 1 5   GQ    JGR DAC=T/3072
306   0   2--1 1  0 3--17 17--0 5 0 5   GR    JGS H DT=AC
307   0  27--1 1  0 3--17 17--0 5 0 5   HL    JHN H DT=AC
310   1   1--1 1  0 3--17 17--0 4 0 6   GS    JGT DAC=VDC&B
311   0   1--1 1  0 3-- 1 17--0 4 1 5   GT    JGU H DAC=T QB1
312   0   2--1 1  0 3--17 17--1 1 1 4   GU    JGV H DAC=POSPK-AC
313   1  55--1 1 17 3--17 17--0 0 1 1   IP    JIQ DAC=SCAN+1
314   1   2--1 1  0 3--17 17--0 4 0 6   GV    JGW DAC=VDC&B
315   1  11--1 1  0 3--16 17--0 7 1 0   HD    JHE QPOS
316   1   1--0 1  0 3-- 0  3--0 4 0 0   GW    JGX DAC=SC&B OMDR QB0
317   0   1--1 1 11 3--17 17--0 0 1 1   GX    JGY H DAC=SCAN+1024
320   0   2--0 0 14 2--17  7--0 4 0 1   GY    JHA H W DAC=SCAN&B OMAR SCE
321   0   1--0 0 14 2--17  7--0 7 0 0   GZ    JHA H W DB=AC OMAR SCE
322   0   1--1 0  0 3--17 17--0 7 1 0   HA    JHB H W
323   1   1--1 0 12 3--17 17--0 3 0 6   HB    JHC W DAC=VDC/2047&B
324   1 167--1 0 14 0--11 17--0 5 0 5   HC    JIP W CCE DNEGPK=AC QB9
325   0 142--1 1  0 3-- 3 17--0 7 1 0   IT    JIU H QFLGTA
326   0   1--0 1  0 3--17  3--0 4 0 5   HE    JHG H DAC=T&B OMDR
327   0   2--0 0 14 2--17  7--0 4 0 1   HG    JHH H W DAC=SCAN&B OMAR SCE
330   0 177--0 1  0 3--17  3--0 4 0 4   HF    JHG H DAC=POSPK&B OMDR
331   0   1--1 0 12 3--17 17--0 3 0 6   HH    JHI H W DAC=VDC/2047&B
332   0   1--1 0  0 3-- 0 17--0 5 0 5   HI    JHJ W DNEGPK=AC QB0 H
333   1   1--1 0 14 0--17 17--0 4 0 6   HJ    JIN W DAC=VDC&B CCE
334   1 157--1 1  0 3--11 17--0 7 1 0   IN    JIP QB9
335   0 157--1 1  0 3--17 17--0 7 1 0   GC    JGV H
336   1   1--1 1  0 3--17 17--0 4 0 6   HN    JHO DAC=VDC&B
337   1   1--1 1  0 3-- 1 17--0 4 1 5   HO    JHP DAC=T QB1
340   0   1--1 1  0 3--17 17--1 1 1 0   HP    JHQ H DAC=SC-AC
341   0   2--1 1  0 3--17 17--0 4 1 5   HQ    JHR H DAC=T
342   0  14--1 1  0 3--17 17--0 5 0 0   IB    JIC H DSC=AC
343   1   1--1 1  0 3--17 17--1 1 1 4   HR    JHS DAC=POSPK-AC
344   1   1--1 1  0 3--16 17--0 7 1 0   HS    JHT QPOS
345   1   1--0 1  0 3--17  3--0 4 0 5   HT    JHV DAC=T&B OMDR
346   0   2--1 1 11 3--17 17--0 0 1 1   HV    JHW H DAC=SCAN+1024
347   1 177--0 1  0 3--17  3--0 4 0 4   HU    JHV DAC=POSPK&B OMDR
350   0   1--0 0 14 2--17  7--0 7 0 0   HW    JHX H W DB=AC OMAR SCE
351   0   1--1 0 12 3--17 17--0 3 0 6   HX    JHY H W DAC=VDC/2047&B
352   0   1--1 0  0 3-- 0 17--0 5 0 5   HY    JHZ H W DNEGPK=AC QB0
353   1   1--1 0 14 0--17 17--0 4 0 6   HZ    JIO W DAC=VDC&B CCE
354   1 137--1 1  0 3--11 17--0 7 1 0   IO    JIP QB9
355   0 143--0 1  0 3--17  3--0 4 0 0   IA    JGY H DAC=SC&B OMDR
```

```
356    0   1--0 1 14 2--12  7--0 4 0 1    IC      JID H DAC=SCAN&B OMAR SCE QB10
357    0   1--1 1  0 3--17 17--0 4 0 6    ID      JIE H DAC=VDC&B
360    0   2--1 1 10 3-- 0 17--0 2 1 0    IE      JIF H DAC=SC*1023 QB0
361    0   1--1 1 14 3-- 0 17--0 3 1 0    IE1     JIF H DAC=SC/3072 QB0
362    1   1--1 1  0 3--17 17--0 5 0 4    IF      JIJ DPOSPK=AC
363    0   4--1 1 14 0--17  1--0 5 1 5    IJ      JIM H DT=B IMEM CCE
364    0 134--0 1 14 0--17  3--0 4 0 4    IH      JGY H DAC=POSPK&B OMDR CCE
365    1   1--1 1  0 3--12 17--0 7 1 0    IK      JIL QB10
366    1 116--1 1 10 3--17 17--0 2 1 5    IL      JGP DAC=T*1023
367    1 176--1 1  0 3--17 17--0 4 0 5    IM      JIK DAC=T&B
370    0   3--1 1  0 3--17 17--0 5 0 1    IQ      JIR H DSCAN=AC
371    1   1--1 1  0 3--17 17--0 5 0 1    XB      JXC DSCAN=AC
372    0   1--1 1 17 3--17 17--0 1 1 1    XC      JIR H DAC=SCAN-1
373    0   1--1 1  0 3--17 17--1 1 1 3    IR      JIS H DAC=MKR-AC
374    0 131--1 1  0 3--16  4--0 7 1 0    IS      JIT H ITSTA QPOS
                                          *
375    0  54--1 1  0 3-- 0 17--0 7 1 0    XA      JDJ H QB0
                                          *
                                          *
                                          *
                                          *END OF MAIN PROGRAM*****************************************************
                                          *
                                          *
                                          *
                                          *
                                          *START OF  INTERRUPT PROGRAM*****************************
                                          *
                                          *
                                          *
                                          *
                                                  ADRS 256                                \DISPLAY BLOCK
                                          *
400    1   1--1 1 14 0--17 17--0 5 0 6    REFCTL DSAVEA=AC CCE                            \REFRESH CONTROL
401    1   1--1 1  0 3--17  3--0 2 1 0           DAC=SCR*0 ITSTB
402    1   1--1 1  5 0-- 2 17--0 5 0 0           DSCR=AC CLLGBLANK QB2
403    1   1--1 1  0 2--17  3--0 6 1 0           DAC=%SCR SLRDMEN ITSTB
404    1   2--0 1 16 0-- 5 11--0 5 0 5           J+2 DMA=AC CDOTEN QB5 ORSTD              \FS MODE ENABLED
405    1   2--1 1 16 0-- 0 17--0 5 0 5           J+2 DMA=AC CDOTEN QB0                    \FS MODE OFF
406    1  12--1 1  2 0--17  2--0 7 1 0           JIFS IRTN CBLINK                         \INITIATE FAST SCAN
407    1   1--1 1  3 0--17  2--0 7 1 0           IRTN CFS                                 \TIMER DONE?
410    0  55--0 1  2 0--17 15--0 4 1 6           JCORT DAC=SAVEA ODRTIMER H CBLINK        \YES START DISP REF
411    0 167--1 1  2 0--17 17--0 4 1 6           JREFCTL DAC=SAVEA H CBLINK               \NO WAIT FOR TIMER
412    1   1--1 1  0 3--17 17--0 5 0 6    FSTSCN DSAVEA=AC
413    1   1--1 1  0 3--17  3--0 5 1 7           ITSTB DCHR=B
414    1   2--1 1  6 3-- 2 17--0 2 1 7           J+2 DAC=CHR*97 QB2
415    1   2--1 1  0 3--17  2--0 7 1 0           J+2 IRTN                                 \1:FSEN 2,3:AC=0
416    1 177--1 1  0 3--14 17--0 2 1 7           J-1 DAC=CHR*0 QZERO                      \1:FS DISB 2,3:AC#0
417    0  46--0 1  3 0--17 15--0 4 1 6           JCORT CFS ODRTIMER DAC=SAVEA H           \AC=0 REF DISPLAY
420    0 172--1 1  3 2--17 17--0 4 1 6    IFS    JFSTSCN H DAC=SAVEA SFS                  \GO TO FAST SCAN
421    0 157--1 1  0 3--17 17--0 4 1 6           JREFCTL H DAC=SAVEA                      \WAIT FOR RETRACE
                                          *
422    1   1--1 1  1 0--17 17--0 5 0 6    GRAPH  DSAVEA=AC CCHAR                          \BEGIN GRAPH MODE
423    1   2--1 1 12 3--17 17--0 2 1 0           J+2 DAC=SCR*2047                         \POSITIVE DATA
424    1   1--1 1  0 3--17 17--0 4 1 0           DAC=SCR                                  \NEGATIVE DATA
425    1   1--1 1  0 3--17 17--1 1 1 3           DAC=THRESH-AC                            \COMPARE DATA
426    1   1--1 1 17 3--16 17--0 0 1 5           DAC=MA+1 QPOS                            \       TO THRESH
427    1   1--0 1  0 3--17  7--0 5 0 5           DMA=AC OMAR
430    1   2--1 1  0 3--17 17--0 4 0 0           J+2 DAC=SCR&B                            \DATA>THRESH
431    1   1--1 1  0 3--17 17--0 4 0 3           DAC=THRESH&B                             \DATA>=THRESH
432    1   1--1 1  0 3--12 17--0 5 0 0           DSCR=AC QB10
433    1   1--1 1 13 3--17  3--0 2 1 0           DAC=SCR*2048 ITSTB
434    1   2--0 1  0 3-- 4  2--0 4 0 0           J+2 DAC=SCR&B OLGY QB4                   \POS DATA TO Y LG
435    1   1--0 1  0 3-- 4  2--0 5 0 0           DSCR=AC OLGY QB4                         \ZERO TO Y LINE GEN
436    1   1--1 1 14 2--13 17--0 4 0 7           DAC=DELTAY&B SCE QB11
437    1   2--1 1 10 3--12 17--0 2 1 2           J+2 DAC=Y*1023 QB10
440    1   2--1 1 10 3--17 17--0 2 1 2           J+2 DAC=Y*1023                           \FIRST PT
441    1   5--1 1  5 2--17 17--1 1 1 0           JOLDDY DAC=SCR-AC SLLGBLANK              \BLANK BIT OFF
442    1   2--1 1  5 0--17 17--1 1 1 0           J+2 DAC=SCR-AC CLLGBLANK                 \BLANK BIT SET
443    1   1--1 1  5 0--17 17--1 1 1 0           DAC=SCR-AC CLLGBLANK                     \BLANK BIT SET
444    1   4--1 1  0 3--17 17--0 5 0 7           J+4 DDELTAY=AC
445    1   3--1 1  0 3--17 17--0 5 0 7           J+3 DDELTAY=AC
446    1   3--1 1  0 3--16 17--0 5 0 7    OLDDY  J+3 DDELTAY=AC QPOS                      \OLD DELTAY>=0
447    1   1--1 1  0 3--16 17--0 5 0 7           DDELTAY=AC QPOS                          \OLD DELTAY<0
450    1   3--1 1 17 3--17 17--0 0 1 1           J+3 DAC=X+1
451    1   1--1 1 17 3--17 17--0 0 1 1           DAC=X+1
452    1   3--0 1 16 2--17  1--0 5 0 1           J+3 DX=AC OLGX SDOTEN                    \DELTAY SIGN CHANGED
453    1   2--0 1 16 0--17  1--0 5 0 1           J+2 DX=AC OLGX CDOTEN                    \DYSGN UNCHGD OR BLNK
454    1   1--0 1 16 2--17  1--0 5 0 1           DX=AC OLGX     SDOTEN                    \DELTAY SIGN CHANGED
455    1   1--1 1  0 3--17 17--0 4 1 0           DAC=SCR
456    1   1--1 1 14 0--17  1--0 5 1 0           IMEM DSCR=B CCE                          \READ NEXT MEM WORD
457    1   1--1 1  7 0--13 17--0 5 0 2           DY=AC QB11 CFSTPT                        \CLEAR FIRST PT FF
460    1   1--1 1  0 3--17 17--0 4 0 0           DAC=SCR&B
461    1   1--1 1  0 3--12 17--0 7 1 0           QB10
462    1  37--1 1  0 3--17  2--0 4 0 0    TOGRPH JGRLINK IRTN DAC=SCR&B
                                          *
463    0 115--1 1  0 3--17 17--0 4 1 6    RCLINK JREFCTL DAC=SAVEA H                      \GO TO REF CONTROL
464    0 114--1 1  0 3--17 17--0 4 1 6           JREFCTL H DAC=SAVEA                      \GO TO REF CONTROL
                                          *
465    1   1--1 1  1 0--17 17--0 5 0 6    CORT   DSAVEA=AC CCHAR                          \CONTROL OR THRESH
466    1   1--1 1  5 0--17 17--0 4 0 0           DAC=SCR&B CLLGBLANK
467    1   1--1 1  3 0--11 17--1 0 0 0           DAC=SCR+AC&B QB9 CFS
470    1   1--1 1  0 3-- 5 17--1 0 1 0           DAC=SCR+AC QB5
471    1   2--1 1 10 3--17 17--0 3 1 5           J+2 DAC=MA/1023
472    1  14--1 1  0 3--17 17--1 0 1 0           JNEWTH DAC=SCR+AC                        \GO TO NEW THRESHOLD
473    1   2--1 1  4 0--17 17--0 4 0 0           J+2 DAC=SCR&B CBRIGHT                    \BRIGHT OFF
474    1 177--1 1  0 3--17 17--0 5 0 5           J-1 DMA=AC                               \SKIP PAGE
475    1   1--1 1 17 3-- 3 17--0 0 1 5           DAC=MA+1 QB3
476    1   1--0 1 14 2--17  7--0 5 0 5           DMA=AC OMAR SCE
477    1   2--1 1  6 0--17 17--0 4 0 0           J+2 DAC=SCR&B CDIM                       \DIM OFF
500    1   1--1 1  6 2--17 17--0 4 0 0           DAC=SCR&B SDIM                           \DIM ON
501    1   1--1 1 16 0-- 4 17--0 5 0 4           DDC=AC CDOTEN QB4
502    1   1--0 1  0 3--17  5--0 2 0 4           DAC=DC*0&B OLGEXP                        \EXPAND BITS TO LG
503    1   2--1 1  7 2-- 7 17--0 7 1 0           J+2 QB7 SFSTPT                           \SET FIRST PT FF
504    1   1--0 1  7 2-- 7  1--0 5 0 1           DX=AC OLGX QB7 SFSTPT                    \CLEAR X POSITION
505    1  20--1 1 14 0--17  1--0 5 1 0           JDCMODE IMEM DSCR=B CCE                  \READ NEXT MEM WORD
506    1   2--1 1  0 3--17 17--0 5 0 3    NEWTH  J+2 DTHRESH=AC                           \NEW THRESHOLD
507    1   1--1 1  0 3--17 17--0 5 0 3           DTHRESH=AC
```

```
510   1    1--1 1 17 3--12 17--0 0 1 5          DAC=MA+1 QB10
511   1    1--0 1 14 2--17  7--0 5 0 5          DMA=AC OMAR SCE
512   1    2--1 1 12 3--17 17--0 2 1 3          J+2 DAC=THRESH*2047             \POSITIVE THRESH
513   1    1--1 1  0 3--17 17--0 4 1 3          DAC=THRESH                      \NEGATIVE THRESH
514   1    1--1 1 16 0--17 17--0 5 0 3          DTHRESH=AC CDOTEN               \EXTEND SIGN
515   1    1--1 1  0 3--17 17--0 7 1 0          J+1
516   1    7--1 1 14 0--17  1--0 5 1 0          JDCMODE IMEM DSCR=B CCE         \READ NEXT MEM WORD
517   1    3--1 1  0 3--17  2--0 7 1 0   CLNEXT JCLLINK IRTN
520   1    3--1 1  0 3--17  2--0 4 0 4          J+3 DAC=DC&B IRTN
521   0 101--1 1  0 3--12 17--0 4 1 6   GRLINK JGRAPH H DAC=SAVEA QB10      \NEXT: GRAPH PT
522   0 143--1 1  0 3--17 17--0 4 1 6   CLLINK JCORT H DAC=SAVEA            \NEXT: CNTL WORD
523   0 142--1 1  0 3--17 17--0 4 1 6          JCORT H DAC=SAVEA
524   0  62--1 1  0 3-- 3 17--0 4 1 6          JJUMP H DAC=SAVEA QB3           \NEXT: JUMP
525   1    2--0 1  0 3--13 14--0 4 0 4   DCMODE J+2 DAC=DC&B QB11 OCLRSA
526   1    1--0 1  4 2--13 14--0 4 0 4          DAC=DC&B QB11 SBRIGHT OCLRSA    \BRIGHT ON
527   1    1--0 1  0 0-- 2  7--0 4 0 0          DAC=SCR&B QB2 OMAR CLROMEN      \NEXT MAY BE A CHAR
530   1    2--1 1  0 3--12 17--0 4 0 4          J+2 DAC=DC&B QB10
531   1    1--1 1  0 3--17 17--0 4 0 4          DAC=DC&B
532   1    2--1 1  0 3-- 1 17--0 2 0 4          J+2 DAC=DC*0&B QB1
533   1 130--1 1  0 2--17  2--0 7 1 0          JRCLINK IRTN SLROMEN            \GO TO REF CONT LINK
534   1    2--1 1  0 3-- 0 17--0 7 1 0          J+2 QB0
535   1 162--1 1  0 2-- 0 17--0 7 1 0          JCLNEXT QB0 SLROMEN             \NEXT: CORT OR JUMP
536   1    4--1 1  0 3--17 17--0 5 0 7          J+4 DDELTAY=AC
537   1    1--1 1  0 2--17  2--0 4 0 4          DAC=DC&B SLROMEN IRTN
540   0   11--1 1  0 3--17 17--0 4 1 6          JVECTOR H DAC=SAVEA             \GO TO VECTOR
541   0   45--1 1  0 3-- 3 17--0 4 1 6          JJUMP H DAC=SAVEA QB3           \GO TO JUMP
542   1    2--1 1 17 3--17 17--0 1 1 1          J+2 DAC=X-1
543   1   36--1 1  0 2--17  1--0 5 1 7          JTOCHR1 IMEM DCHR=B SLROMEN     \READ 1ST STROKE
544   1 116--1 1  0 2--17 17--0 5 0 1          JTOGRPH DX=AC SLROMEN           \NO X INCR ON 1ST PT
                                         *
545   0    4--1 1  0 3--17 17--0 4 1 6   VLINK  JVECTOR H DAC=SAVEA             \GO TO VECTOR
546   0 117--1 1  0 3--17 17--0 4 1 6   FROMSC JCORT H DAC=SAVEA               \GO TO CORT
547   0   54--1 1  0 3--17 17--0 4 1 6   SCLINK JSTCNTL H DAC=SAVEA             \GO TO: SKIP TO CNTL
550   0   53--1 1  0 3--17 17--0 4 1 6          JSTCNTL H DAC=SAVEA             \GO TO: SKIP TO CNTL
                                         *
551   1    1--1 1  1 0--17 17--0 5 0 6   VECTOR DSAVEA=AC CCHAR                 \VECTOR MODE
552   1    1--1 1 17 3--17 17--0 0 1 5          DAC=MA+1
553   1    1--0 1 14 2--17  7--0 5 0 5          DMA=AC OMAR SCE
554   1    1--1 1  0 3--17 17--0 4 0 0          DAC=SCR&B
555   1    1--1 1 17 3--13 17--0 0 1 5          DAC=MA+1 QB11
556   1    1--0 1  0 3--17  7--0 5 0 3          DMA=AC OMAR
557   1    3--1 1  0 3--17 17--0 4 0 0          J+3 DAC=SCR&B                   \ABSOLUTE VECTOR
560   1    1--1 1  0 3--17 17--0 4 1 1          DAC=X                           \INCREMENTAL VECTOR
561   1    1--1 1  0 3--17 17--1 0 0 0          DAC=SCR+AC&B
562   1    1--0 1 16 0--13  1--0 5 0 1          DX=AC OLGX QB11 CDOTEN          \SEND X TO LG
563   1    1--1 1 14 0--17  1--0 5 1 0          IMEM DSCR=B CCE
564   1    3--1 1 14 2--13 17--0 7 1 0          J+3 SCE QB11                    \ABSOLUTE VECTOR
565   1    1--1 1 14 2--13 17--0 4 1 2          DAC=Y QB11 SCE                  \INCREMENTAL VECTOR
566   1    2--1 1  0 3--17 17--1 0 0 0          J+2 DAC=SCR+AC&B
567   1    1--1 1  0 3--17 17--0 4 0 0          J+1 DAC=SCR&B
570   1    2--0 1  5 2--12  2--0 5 0 2          J+2 DY=AC OLGY SLLGBLANK QB10   \Y TO LG & UNBLANK
571   1    1--0 1  5 0--17  2--0 5 0 2          DY=AC OLGY CLLGBLANK            \Y TO LG & BLANK
572   1    1--1 1 17 3--17 17--0 1 1 5          DAC=MA-1
573   1    2--1 1 14 0--17  1--0 5 1 0          J+2 IMEM DSCR=B CCE
574   1 152--1 1 14 0--17  2--0 5 0 5          JFROMSC DMA=AC IRTN CCE         \NEXT: CONTROL WORD
575   1    1--1 1  0 3--13 17--0 7 1 0          QB11
576   1    1--1 1  0 3--17 17--0 4 0 0          DAC=SCR&B
577   1    1--1 1  0 3--12 17--0 7 1 0          QB10
600   1 145--1 1  0 3--17  2--0 7 1 0          JVLINK IRTN
                                         *
601   1   50--1 1  3 3--17 17--0 2 1 7   TOCHR1 JTOCHR2 DAC=CHR*15              \GOING TO CHAR MODE
                                         *
602   1    3--1 1 17 3--11 17--0 1 1 5   SCCONT J+3 DAC=MA-1 QB9
603   1    1--1 1  0 3--11 17--0 4 1 5   CTLTST DAC=MA QB9
604   1 143--1 1  0 3--17  2--0 7 1 0          JSCLINK IRTN                    \GO TO: SKIP TO CNTL
605   1 141--1 1  0 3--17  2--0 5 0 5          JFROMSC IRTN DMA=AC
                                         *
606   1    3--1 1  0 3--17 17--0 5 0 6   JUMP   JSTC1 DSAVEA=AC                 \JUMP ROUTINES
607   1   10--1 1  0 3--17 17--0 4 1 5   JSB    JSAVERA DAC=MA
610   1   15--0 1 14 2--17  7--0 5 0 5   STC2   JSTC3 DMA=AC OMAR SCE
611   1 177--1 1  0 3--17 17--0 4 1 5   STC1   J-1 DAC=MA
612   1    1--1 1  0 3--17 17--0 4 0 4          DAC=DC&B
613   1    1--1 1  0 3-- 7 17--0 4 0 4          DAC=DC&B QB7
614   1    1--1 1  0 3-- 6 17--0 7 1 0          QB6
615   1    3--1 1  2 3--17 17--0 1 1 3          JJMP DAC=THRESH-4
616   1 171--1 1 17 3--17 17--0 0 1 7          JJSB DAC=RA+1
617   1    1--1 1  0 3--17 17--0 5 0 7   SAVERA DRA=AC                          \SAVE RTN ADRS
620   1 170--1 1  0 3--17 17--0 4 1 0   JMP    JSTC2 DAC=SCR
621   1    1--1 1  0 3--14 17--0 5 0 3   DSZ    DTHRESH=AC QZERO
622   1 166--1 1  1 3--17 17--0 0 1 5          JSTC2 DAC=MA+2
623   1    1--1 1  0 3--17 17--0 5 0 6   STCNTL DSAVEA=AC
624   1 164--1 1 17 3--17 17--0 0 1 5          JSTC2 DAC=MA+1
625   1    1--1 1  0 3--17 17--0 7 1 0   STC3   J+1
626   1    1--1 1  5 0--17 17--0 7 1 0          CLLGBLANK                       \BLANK
627   1    1--1 1 17 3--17 17--0 0 1 5          DAC=MA+1
630   1    1--1 1 14 0--17  1--0 5 1 0          IMEM DSCR=B CCE                 \READ NEXT WORD
631   1    1--0 1 14 2--13  7--0 5 0 5          DMA=AC OMAR SCE QB11
632   1    1--1 1 16 0--17 17--0 4 0 0          DAC=SCR&B CDOTEN                \DOT OFF
633   1    2--1 1  0 3--12 17--0 7 1 0          J+2 QB10
634   1    1--1 1  0 3--17 17--0 7 1 0          J+1
635   1    1--1 1 17 3--17 17--0 0 1 5          DAC=MA+1
636   1    2--1 1 14 0--17  1--0 5 1 0          J+2 IMEM DSCR=B CCE             \READ NEXT WORD
637   1 143--1 1 14 0--17 17--0 4 0 0          JSCCORT DAC=SCR&B CCE           \MAY BE A CNTL WORD
640   1    1--0 1 14 2--13  7--0 5 0 5          DMA=AC OMAR SCE QB11
641   1    1--1 1  0 3--17 17--0 4 0 0          DAC=SCR&B
642   1    2--1 1  0 3--12 17--0 7 1 0          J+2 QB10
643   1    1--1 1  0 3--17 17--0 7 1 0          J+1
644   1    1--1 1  0 3--17 17--0 7 1 0          J+1
645   1    2--1 1 14 0--17  1--0 5 1 0          J+2 IMEM DSCR=B CCE             \READ NEXT WORD
646   1 134--1 1 14 0--17 17--0 4 0 0          JSCCORT DAC=SCR&B CCE           \MAY BE A CNTL WORD
647   1    1--1 1  0 3--13 17--0 4 0 0          DAC=SCR&B QB11
650   1 133--1 1  0 3--12 17--0 4 0 0          JCTLTST DAC=SCR&B QB10
                                         *
651   1   45--1 1  0 3--14 17--0 4 1 1   TOCHR2 JTOCHR3 DAC=X QZERO             \GOING TO CHAR MODE
                                         *
```

```
652   1     1--0 1  0 3--17 12--0 5 0 6   CHARAC DSAVEA=AC DINCRSA                  \CHARACTER MODE
653   1     1--0 1  0 0--17  7--0 4 0 0          DAC=SCR&B OMAR CLROMEN
654   1     1--1 1  0 3--17 17--0 4 0 7          DAC=CHR&B
655   1     1--1 1  1 0-- 7 17--0 7 1 0          CCHAR QB7
656   1     1--1 1 17 3--17 17--0 0 1 5          DAC=MA+1
657   1     2--1 1  5 2--17 17--0 7 1 0          J+2 SLLGBLANK                      \UNBLANK STROKE
660   1     1--1 1  5 0--17 17--0 7 1 0          CLLGBLANK                          \BLANK STROKE
661   1     1--1 1  0 2--17  1--0 5 1 4          IMEM DDC=B SLROMEN                 \READ NEXT STROKE
662   1     1--0 1 14 2--17  7--0 5 0 5          DMA=AC OMAR SCE
663   1     1--1 1  7 3--17 17--0 2 1 4          DAC=DC*255
664   1     1--0 1  0 3--14  1--0 4 0 1          DAC=X&B OLGX QZERO                 \X POSITION TO LG
665   1     1--0 1  1 2--17  0--0 4 0 7          DAC=CHR&B OLGCHAR SCHAR            \CHAR STROKE TO LG
666   1    14--0 1 16 0--17 14--0 7 1 0          JCHREND DCLRSA CDOTEN              \GO TO END OF CHAR
667   1     1--1 1 17 3--17  3--0 1 1 5          DAC=MA-1 ITSTB                     \CONTINUE CHAR
670   1     1--1 1 14 0--13 17--0 5 0 5          DMA=AC CCE QB11                    \RESTORE MEM ADRS
671   1     1--1 1 16 0--17 17--0 4 1 4          DAC=DC CDOTEN                      \DOT OFF
672   1    26--1 1  0 3--17  2--0 5 0 7          JGDCHAR DCHR=AC IRTN               \GO DO NEXT STROKE
673   1     1--0 1  0 3--17  7--0 5 0 0          DSCR=AC OMAR                       \LINK TO NXT STROKE
674   1     1--0 1  0 0--17 14--0 7 1 0          OCLRSA CLROMEN
675   1     1--1 1  0 3--17 17--0 7 1 0          J+1
676   1     1--1 1  0 3--17 17--0 7 1 0          J+1
677   1     1--1 1  0 3--17 17--0 7 1 0          J+1
700   1     1--1 1  0 3--17  2--0 4 1 6          DAC=SAVEA IRTN
701   0   151--1 1  0 2--17  1--0 5 1 7          JCHARAC H IMEM DCHR=B SLROMEN      \GO DO NXT STROKE
702   1     1--1 1 14 0--17  1--0 5 1 0   CHREND IMEM CCE DSCR=B                    \GET NXT CHAR CODE
703   1     1--0 1  0 0--13  7--0 4 0 0          DAC=SCR&B OMAR CLROMEN QB11
704   1     1--1 1 17 3--12 17--0 0 1 4          DAC=DC+1 QB10                      \RESTORE DC REG
705   1     3--1 1  0 3--17 17--0 5 0 4          J+3 DDC=AC
706   1     1--1 1  0 3--17 17--0 5 0 4          DDC=AC
707   1     3--1 1  0 3--17 17--0 7 1 0          J+3
710   1     2--1 1  0 3--17 17--0 7 1 0          J+2
711   1    66--1 1  0 2--17  2--0 7 1 0          JFROMCH IRTN SLROMEN               \GO TO CORT
712   1     1--1 1  0 3--17 17--0 7 1 0          J+1
713   1     1--1 1  0 2--17  1--0 5 1 7          IMEM DCHR=B SLROMEN                \GET 1ST STROKE
714   1     1--1 1  3 3--17 17--0 2 1 7          DAC=CHR*15
715   1     1--1 1  4 3--14 17--0 0 1 1          DAC=X+16 QZERO                     \X TO NXT CHR POSN
716   1     1--1 1  0 3--17  2--0 5 0 1   TOCHR3 DX=AC IRTN
717   0     2--1 1  0 3--17 17--0 4 1 6   CHLINK JSPCHAR H DAC=SAVEA                \GO TO SPEC CHAR
720   0   132--1 1  0 3--17 17--0 4 1 6   GOCHAR JCHARAC H DAC=SAVEA                \GO TO CHARACTER
                                          *
721   1     1--1 1  1 0--17 17--0 5 0 6   SPCHAR DSAVEA=AC CCHAR                    \SPEC CHAR MODE
722   1     1--1 1 17 3--17 17--0 0 1 5          DAC=MA+1
723   1     1--0 1 14 2--17  7--0 7 0 0          DB=AC SCE OMAR
724   1     1--1 1  0 3--17 17--0 4 0 7          DAC=CHR&B
725   1     1--0 1  0 3-- 7 14--0 4 0 7          DAC=CHR&B OCLRSA QB7
726   1     1--1 1 15 3-- 6 17--0 3 0 7          DAC=CHR/4032&B QB6
727   1    13--1 1  0 3-- 5 17--0 4 0 7          JCHR6A0 DAC=CHR&B QB5              \CHR(7)=0
730   1     1--1 1  0 3--17 17--1 3 1 5          DAC=MA/AC                          \CHR(7)=1
731   1     7--1 1 14 0--17  1--0 5 1 0          JFMFD IMEM DSCR=B CCE
732   1     1--1 1 14 0--17 17--1 1 1 5   SKIP   DAC=MA-AC CCE                      \SKIP 32 OR 64
733   1     1--0 1 14 2--17  7--0 5 0 5          DMA=AC OMAR SCE
734   1     1--1 1 17 3--17 17--0 1 1 5          DAC=MA-1
735   1     1--1 1  0 3--17 17--0 5 0 5          DMA=AC
736   1     1--1 1  0 3--17 17--0 7 1 0          J+1
737   1    16--1 1 14 0--17  1--0 5 1 0        . JCHR5A1 IMEM CCE DSCR=B            \READ NEXT WORD
740   1     1--0 1  0 3--17  7--0 2 0 0   FMFD   DAC=SCR*0&B OMAR                   \CLEAR X AND Y POSN
741   1    21--0 1  0 0--13  2--0 5 0 2          JSCHARX DY=AC OLGY CLROMEN QB11
742   1    12--1 1 14 0-- 4  1--0 5 1 0   CHR6A0 JCHR5A0 IMEM DSCR=B CCE QB4        \CHR(6)=0
743   1     1--1 1 14 0-- 4  1--0 5 1 0          IMEM DSCR=B CCE QB4                \CHR(6)=1
744   1     5--0 1  0 0--17  7--0 4 0 0          JNBLINK DAC=SCR&B OMAR CLROMEN     \CHR(5)=0
745   1     1--0 1  0 0--17  7--0 4 0 0          DAC=SCR&B OMAR CLROMEN             \CHR(5)=1
746   1     2--1 1  5 3--13 17--0 0 1 2   VTAB   JSCHARY DAC=Y+32 QB11              \VERTICAL TAB
747   1     1--1 1  5 3--13 17--0 1 1 2   LNFD   DAC=Y-32 QB11                      \LINE FEED
750   1    13--0 1  0 3--17  2--0 5 0 2   SCHARY JSCHARD DY=AC OLGY                 \Y POSN TO LG
751   1     2--1 1  2 0--13 17--0 7 1 0   NBLINK JSCHARN CBLINK QB11                \BLINK OFF
752   1     1--1 1  2 2--13 17--0 7 1 0          JSCHARN SBLINK QB11                \BLINK ON
753   1    10--1 1  0 3--17 17--0 7 1 0   SCHARN JSCHARD
754   1     4--0 1  0 0--17  7--0 4 0 0   CHR5A0 JSPACE DAC=SCR&B OMAR CLROMEN      \CHR(5)=0
755   1     1--0 1  0 0--17  7--0 4 0 0   CHR5A1 DAC=SCH&B OMAR CLROMEN             \CHR(5)=1
756   1   175--1 1  0 3--13 17--0 7 1 0   NULL   JSCHARN QB11                       \NULL CHARACTER
757   1     3--1 1  0 3--13 17--0 2 1 0   CR     JSCHARX DAC=SCR*0 QB11             \CARRIAGE RETURN
760   1     2--1 1  4 3--13 17--0 0 1 1   SPACE  JSCHARX DAC=X+16 QB11              \SPACE
761   1     1--1 1  4 3--13 17--0 1 1 1   BS     JSCHARX DAC=X-16 QB11              \BACKSPACE
762   1     1--0 1  0 3--17  1--0 5 0 1   SCHARX DX=AC OLGX                         \X POSN TO LG
763   1     3--1 1 16 0--17 17--0 4 0 0   SCHARD J+3 DAC=SCR&B CDOTEN               \DOT OFF
764   1     1--1 1 16 0--17 17--0 7 1 0          CDOTEN                             \DOT OFF
765   1     2--1 1 17 3--17 17--0 0 1 5          J+2 DAC=MA+1
766   1     1--1 1 17 3--12 17--0 0 1 5          DAC=MA+1 QB10
767   1     1--1 1  0 2--17  1--0 5 1 7          IMEM DCHR=B SLROMEN                \GET NXT 1ST STRK
770   1     2--1 1  3 3--17 17--0 2 1 7          J+2 DAC=CHR*15
771   1     6--1 1  5 0--17  2--0 5 0 5          JFROMCH DMA=AC CLLGBLANK IRTN      \GO TO CORT
772   1     1--1 1 17 3--14 17--0 0 1 5          DAC=MA+1 QZERO
773   1   124--1 1  5 0--17  2--0 5 0 5          JCHLINK IRTN DMA=AC CLLGBLANK      \END OF SP CHAR
                                                 ADRS 511
777   0    66--1 1  0 3--17 17--0 4 1 6   FROMCH JCORT H DAC=SAVEA                  \GO TO CORT
                                                  END
```

NO ERRORS ???

| | | | | | | | |
|---|---|---|---|---|---|---|---|
| 0 | 0 | 1 | 17 | 1023 | 10 | 1024 | 11 |
| 1032 | 1 | 15 | 3 | 16 | 4 | 2 | 1 |
| 2047 | 12 | 2048 | 13 | 255 | 7 | 3072 | 14 |
| 32 | 5 | 4 | 2 | 4032 | 15 | 4095 | 16 |
| 8 | 2 | 97 | 6 | AA | 102 | AB | 35 |
| AC | 36 | AD | 40 | ADC | 0 | AE | 41 |
| AF | 43 | AG | 44 | AH | 46 | AI | 45 |
| AJ | 42 | AK | 47 | AM | 52 | AN | 53 |
| AO | 54 | AP | 121 | AQ | 120 | AS | 135 |
| AT | 151 | AU | 154 | AV | 155 | AW | 137 |
| AX | 161 | AY | 140 | AZ | 147 | B0 | 0 |
| B1 | 1 | B10 | 12 | B11 | 13 | B2 | 2 |
| B3 | 3 | B4 | 4 | B5 | 5 | B6 | 6 |
| B7 | 7 | B8 | 10 | B9 | 11 | BA | 141 |
| BB | 162 | BC | 143 | BD | 234 | BE | 144 |

| | | | | | | | |
|---|---|---|---|---|---|---|---|
| BF | 163 | BG | 146 | BH | 240 | BI | 150 |
| BJ | 145 | BK | 136 | BL | 37 | BLINK | 2 |
| BM | 32 | BN | 33 | BO | 31 | BP | 27 |
| BPCAD | 6 | BPCD | 7 | BPCO | 6 | BPCR | 0 |
| BQ | 30 | BR | 23 | BRIGHT | 4 | BS | 761 |
| BS1 | 24 | BT | 25 | BU | 26 | BV | 12 |
| BW | 13 | BX | 14 | BY | 15 | BZ | 16 |
| CA | 17 | CB | 20 | CC | 21 | CD | 6 |
| CE | 14 | CE1 | 206 | CF | 1 | CG | 7 |
| CH | 2 | CHAR | 1 | CHARAC | 652 | CHLINK | 717 |
| CHR | 7 | CHRSA0 | 754 | CHRSA1 | 755 | CHR6AD | 742 |
| CHREND | 702 | CI | 10 | CJ | 3 | CK | 11 |
| CL | 4 | CLLINK | 522 | CLNEXT | 517 | CLRSA | 14 |
| CM | 5 | CN | 34 | CO | 22 | CORT | 465 |
| CP | 56 | CQ | 55 | CR | 757 | CRSEN | 17 |
| CS | 134 | CT | 153 | CTLTST | 603 | CU | 152 |
| CV | 241 | CW | 242 | CX | 244 | CY | 245 |
| CZ | 243 | DA | 247 | DB | 246 | DC | 4 |
| DC1 | 250 | DCMODE | 525 | DD | 251 | DE | 233 |
| DELTAY | 7 | DF | 167 | DI | 50 | DIM | 6 |
| DJ | 51 | DL | 252 | DM | 212 | DN | 156 |
| DN1 | 157 | DO | 257 | DOTEN | 16 | DP | 142 |
| DQ | 160 | DQ1 | 210 | DR | 207 | DRTIMER | 15 |
| DS | 213 | DSZ | 621 | DT | 211 | DU | 214 |
| DV | 215 | DW | 223 | DX | 260 | DY | 261 |
| DZ | 224 | EA | 65 | EB | 64 | EC | 66 |
| ED | 72 | EE | 67 | EF | 73 | EG | 71 |
| EH | 70 | EI | 74 | EJ | 75 | EK | 122 |
| EL | 100 | EM | 57 | EN | 103 | EO | 104 |
| EP | 106 | EQ | 107 | ER | 105 | ES | 114 |
| ET | 110 | EU | 115 | EV | 112 | EW | 116 |
| EX | 111 | EY | 117 | EZ | 113 | FA | 124 |
| FB | 133 | FC | 270 | FD | 202 | FE | 203 |
| FF | 164 | FG | 166 | FH | 165 | FI | 170 |
| FJ | 174 | FK | 172 | FL | 264 | FLGA | 10 |
| FLGB | 11 | FLGC | 12 | FLGTA | 3 | FLGTB | 4 |
| FLGTC | 6 | FM | 255 | FM1 | 256 | FMFD | 740 |
| FN | 265 | FO | 266 | FP | 171 | FQ | 176 |
| FR | 175 | FROMCH | 777 | FROMSC | 546 | FS | 3 |
| FS1 | 177 | FSTPT | 7 | FSTSCN | 412 | FT | 200 |
| FU | 262 | FV | 263 | FW | 201 | GB | 123 |
| GC | 335 | GD | 205 | GE | 301 | GF | 271 |
| GG | 272 | GH | 273 | GI | 274 | GJ | 275 |
| GK | 276 | GL | 277 | GM | 300 | GN | 302 |
| GO | 303 | GOCHAR | 720 | GP | 304 | GQ | 305 |
| GR | 306 | GRAPH | 422 | GRLINK | 521 | GS | 310 |
| GT | 311 | GU | 312 | GV | 314 | GW | 316 |
| GX | 317 | GY | 320 | GZ | 321 | HA | 322 |
| HB | 323 | HC | 324 | HD | 315 | HE | 326 |
| HF | 330 | HG | 327 | HH | 331 | HI | 332 |
| HJ | 333 | HK | 0 | HL | 307 | HN | 336 |
| HO | 337 | HOLD | 17 | HP | 340 | HQ | 341 |
| HR | 343 | HS | 344 | HSRS | 13 | HT | 345 |
| HU | 347 | HV | 346 | HW | 350 | HX | 351 |
| HY | 352 | HZ | 353 | IA | 355 | IB | 342 |
| IC | 356 | ID | 357 | IE | 360 | IE1 | 361 |
| IF | 362 | IFS | 420 | IH | 364 | IJ | 363 |
| IK | 365 | IL | 366 | IM | 367 | IN | 334 |
| INCRSA | 12 | IO | 354 | IP | 313 | IQ | 370 |
| IR | 373 | IS | 374 | IT | 325 | IU | 267 |
| IV | 237 | JA | 217 | JB | 216 | JC | 220 |
| JE | 221 | JF | 222 | JG | 225 | JH | 226 |
| JI | 231 | JJ | 232 | JK | 230 | JL | 227 |
| JM | 235 | JMP | 620 | JN | 131 | JO | 204 |
| JP | 125 | JQ | 127 | JR | 130 | JS | 126 |
| JSB | 607 | JT | 60 | JU | 61 | JUMP | 606 |
| JV | 63 | JW | 101 | JX | 62 | JY | 76 |
| JZ | 77 | LGCHAR | 0 | LGEXP | 5 | LGX | 1 |
| LGY | 2 | LLGBLANK | 5 | LNFD | 747 | LROMEN | 0 |
| MA | 5 | MAR | 7 | MDR | 3 | MEM | 1 |
| MKR | 3 | NBLINK | 751 | NEGPK | 5 | NEWTH | 506 |
| NULL | 756 | OLDDY | 446 | POS | 16 | POSPK | 4 |
| RA | 7 | RAMP | 4 | RCLINK | 463 | REF | 7 |
| REFCTL | 400 | RSTO | 11 | RTN | 2 | SAVEA | 6 |
| SAVERA | 617 | SC | 0 | SCAN | 1 | SCCORT | 602 |
| SCHARD | 763 | SCHARN | 753 | SCHARX | 762 | SCHARY | 750 |
| SCLINK | 547 | SCR | 0 | SELA | 13 | SELB | 15 |
| SKIP | 732 | SOFR | 2 | SPACE | 760 | SPCHAR | 721 |
| SRSEN | 16 | STC1 | 611 | STC2 | 610 | STC3 | 625 |
| STCNTL | 623 | STT | 10 | T | 5 | THRESH | 3 |
| TOCHR1 | 601 | TOCHR2 | 651 | TOCHR3 | 716 | TOGRPH | 462 |
| TSTA | 4 | TSTB | 3 | VDC | 6 | VECTOR | 551 |
| VLINK | 545 | VTAB | 746 | X | 1 | XA | 375 |
| XB | 371 | XC | 372 | XX | 173 | Y | 2 |
| ZA | 236 | ZB | 132 | ZD | 253 | ZE | 254 |
| ZERO | 14 | | | | | | |

KSPMAX=7 MSPMAX=42 NSPMAX=45 SSPMAX=1850 ASPMAX=0 BSPMAX=0
DSPMAX=401

ROM 1

| | | | | | | | | | | | | | | | |
|---|---|---|---|---|---|---|---|---|---|---|---|---|---|---|---|
| 2 | 1 | 1 | 201 | 201 | 27 | 173 | 1 | 201 | 175 | 174 | 173 | 173 | 205 | 204 | 203 |
| 202 | 201 | 12 | 367 | 170 | 371 | 372 | 374 | 375 | 376 | 1 | 176 | 202 | 201 | 2 | 173 |
| 1 | 3 | 201 | 203 | 1 | 170 | 1 | 1 | 125 | 201 | 167 | 201 | 244 | 57 | 377 | 224 |
| 1 | 1 | 14 | 216 | 206 | 201 | 201 | 201 | 232 | 377 | 201 | 201 | 201 | 225 | 201 | 201 |
| 22 | 163 | 133 | 201 | 1 | 207 | 201 | 1 | 1 | 202 | 377 | 17 | 201 | 201 | 201 | 205 |
| 215 | 33 | 1 | 262 | 30 | 204 | 131 | 201 | 176 | 176 | 124 | 267 | 16 | 3 | 120 | 1 |
| 1 | 2 | 15 | 1 | 2 | 111 | 370 | 13 | 106 | 3 | 63 | 327 | 1 | 4 | 1 | 201 |
| 27 | 166 | 251 | 365 | 1 | 202 | 51 | 1 | 203 | 204 | 206 | 377 | 174 | 2 | 173 | 1 |
| 335 | 334 | 162 | 161 | 121 | 64 | 232 | 2 | 1 | 12 | 201 | 1 | 204 | 1 | 204 | 202 |
| 15 | 14 | 13 | 1 | 1 | 4 | 201 | 6 | 5 | 371 | 376 | 177 | 127 | 150 | 1 | 145 |
| 1 | 203 | 201 | 204 | 4 | 3 | 2 | 376 | 1 | 1 | 1 | 201 | 2 | 10 | 7 | 201 |
| 201 | 201 | 2 | 1 | 171 | 1 | 150 | 313 | 312 | 1 | 2 | 1 | 1 | 1 | 201 | 1 |
| 2 | 72 | 201 | 201 | 202 | 201 | 2 | 27 | 201 | 1 | 2 | 255 | 202 | 211 | 201 | 1 |
| 2 | 1 | 1 | 201 | 367 | 142 | 1 | 2 | 177 | 1 | 1 | 201 | 357 | 157 | 201 | 201 |
| 1 | 2 | 14 | 201 | 201 | 201 | 2 | 377 | 1 | 1 | 1 | 201 | 337 | 143 | 1 | 1 |

| | | | | | | | | | | | | | | | |
|---|---|---|---|---|---|---|---|---|---|---|---|---|---|---|---|
| 2 | 1 | 201 | 4 | 134 | 201 | 316 | 376 | 3 | 201 | 1 | 1 | 131 | 54 | 377 | 377 |
| 201 | 201 | 201 | 201 | 202 | 202 | 212 | 201 | 55 | 167 | 201 | 201 | 202 | 202 | 377 | 46 |
| 172 | 157 | 201 | 202 | 201 | 201 | 201 | 201 | 202 | 201 | 201 | 201 | 202 | 201 | 201 | 202 |
| 202 | 205 | 202 | 201 | 204 | 203 | 203 | 201 | 203 | 201 | 203 | 202 | 201 | 201 | 201 | 201 |
| 201 | 201 | 237 | 115 | 114 | 201 | 201 | 201 | 201 | 202 | 214 | 202 | 377 | 201 | 201 | 202 |
| 201 | 201 | 201 | 202 | 201 | 220 | 202 | 201 | 201 | 201 | 202 | 201 | 201 | 201 | 207 | 203 |
| 203 | 101 | 143 | 142 | 62 | 202 | 201 | 201 | 202 | 201 | 202 | 330 | 202 | 362 | 204 | 201 |
| 11 | 45 | 202 | 236 | 316 | 4 | 117 | 54 | 53 | 201 | 201 | 201 | 201 | 201 | 201 | 203 |
| 201 | 201 | 201 | 201 | 203 | 201 | 202 | 201 | 202 | 201 | 201 | 202 | 352 | 201 | 201 | 201 |
| 345 | 250 | 203 | 201 | 343 | 341 | 203 | 210 | 215 | 377 | 201 | 201 | 201 | 203 | 371 | 201 |
| 370 | 201 | 366 | 201 | 364 | 201 | 201 | 201 | 201 | 201 | 201 | 202 | 201 | 201 | 202 | 343 |
| 201 | 201 | 202 | 201 | 201 | 202 | 334 | 201 | 333 | 245 | 201 | 201 | 201 | 201 | 201 | 202 |
| 201 | 201 | 201 | 201 | 201 | 201 | 214 | 201 | 201 | 201 | 226 | 201 | 201 | 201 | 201 | 201 |
| 201 | 151 | 201 | 201 | 201 | 203 | 201 | 203 | 202 | 266 | 201 | 201 | 201 | 201 | 201 | 2 |
| 132 | 201 | 201 | 201 | 201 | 201 | 201 | 213 | 201 | 207 | 201 | 201 | 201 | 201 | 201 | 216 |
| 201 | 221 | 212 | 201 | 205 | 201 | 202 | 201 | 213 | 202 | 201 | 210 | 204 | 201 | 375 | 203 |
| 202 | 201 | 201 | 203 | 201 | 202 | 201 | 201 | 202 | 206 | 201 | 324 | 377 | 377 | 377 | 66 |

ROM 2

| | | | | | | | | | | | | | | | |
|---|---|---|---|---|---|---|---|---|---|---|---|---|---|---|---|
| 303 | 303 | 302 | 103 | 360 | 156 | 162 | 277 | 203 | 260 | 303 | 303 | 62 | 303 | 303 | 303 |
| 303 | 303 | 103 | 377 | 103 | 377 | 377 | 303 | 303 | 303 | 366 | 303 | 377 | 377 | 360 | 360 |
| 156 | 162 | 353 | 303 | 377 | 374 | 303 | 303 | 303 | 350 | 303 | 376 | 150 | 156 | 360 | 303 |
| 103 | 344 | 356 | 364 | 303 | 303 | 342 | 303 | 303 | 303 | 340 | 303 | 303 | 303 | 364 | 303 |
| 376 | 356 | 166 | 303 | 303 | 303 | 303 | 303 | 366 | 354 | 303 | 340 | 303 | 303 | 303 | 303 |
| 146 | 174 | 376 | 303 | 103 | 303 | 374 | 376 | 303 | 360 | 303 | 366 | 366 | 374 | 342 | 303 |
| 303 | 162 | 374 | 377 | 303 | 342 | 360 | 344 | 342 | 303 | 352 | 303 | 346 | 162 | 374 | 303 |
| 177 | 377 | 360 | 303 | 303 | 303 | 342 | 303 | 376 | 376 | 303 | 303 | 303 | 303 | 303 | 374 |
| 303 | 364 | 303 | 303 | 377 | 347 | 303 | 303 | 303 | 303 | 303 | 366 | 356 | 303 | 354 | 356 |
| 342 | 342 | 340 | 342 | 364 | 354 | 354 | 303 | 342 | 366 | 356 | 364 | 303 | 376 | 352 | 162 |
| 350 | 307 | 303 | 303 | 313 | 352 | 313 | 307 | 162 | 313 | 303 | 303 | 360 | 203 | 303 | 357 |
| 103 | 303 | 313 | 307 | 62 | 250 | 260 | 103 | 303 | 303 | 162 | 162 | 377 | 303 | 103 | 360 |
| 303 | 344 | 303 | 343 | 303 | 363 | 303 | 303 | 303 | 303 | 303 | 377 | 303 | 303 | 103 | 347 |
| 62 | 62 | 203 | 253 | 260 | 303 | 103 | 62 | 103 | 253 | 203 | 260 | 303 | 303 | 303 | 303 |
| 303 | 303 | 303 | 303 | 303 | 103 | 347 | 103 | 62 | 253 | 203 | 260 | 303 | 103 | 162 | 303 |
| 343 | 363 | 303 | 360 | 160 | 303 | 343 | 303 | 303 | 303 | 377 | 303 | 303 | 303 | 377 | 377 |
| 360 | 303 | 324 | 302 | 170 | 370 | 310 | 314 | 110 | 310 | 303 | 303 | 333 | 303 | 303 | 114 |
| 316 | 303 | 304 | 353 | 303 | 303 | 377 | 103 | 303 | 303 | 303 | 357 | 103 | 103 | 362 | 343 |
| 343 | 326 | 324 | 324 | 303 | 303 | 303 | 303 | 377 | 377 | 172 | 170 | 172 | 303 | 360 | 334 |
| 303 | 303 | 303 | 303 | 303 | 304 | 324 | 314 | 303 | 343 | 303 | 320 | 303 | 377 | 162 | 330 |
| 332 | 370 | 103 | 336 | 136 | 360 | 303 | 303 | 377 | 162 | 353 | 303 | 370 | 303 | 360 | 303 |
| 303 | 303 | 303 | 303 | 303 | 103 | 122 | 100 | 303 | 303 | 303 | 302 | 303 | 302 | 303 | 302 |
| 303 | 303 | 377 | 302 | 302 | 303 | 303 | 303 | 303 | 304 | 377 | 162 | 303 | 377 | 103 | 303 |
| 303 | 303 | 170 | 360 | 362 | 362 | 303 | 303 | 126 | 124 | 377 | 360 | 360 | 303 | 303 | 303 |
| 303 | 317 | 377 | 303 | 303 | 303 | 303 | 303 | 162 | 303 | 303 | 303 | 303 | 313 | 377 | 303 |
| 303 | 303 | 307 | 303 | 377 | 303 | 324 | 377 | 360 | 162 | 370 | 303 | 303 | 377 | 360 | 360 |
| 162 | 303 | 303 | 303 | 303 | 360 | 360 | 303 | 303 | 303 | 103 | 100 | 303 | 304 | 377 | 326 |
| 324 | 302 | 162 | 337 | 103 | 106 | 170 | 377 | 360 | 370 | 303 | 103 | 100 | 303 | 303 | 303 |
| 303 | 302 | 360 | 100 | 377 | 303 | 303 | 303 | 303 | 302 | 303 | 302 | 317 | 323 | 303 | 303 |
| 303 | 304 | 377 | 162 | 303 | 103 | 367 | 303 | 303 | 360 | 360 | 162 | 377 | 303 | 303 | 360 |
| 103 | 100 | 360 | 360 | 100 | 100 | 327 | 327 | 103 | 310 | 312 | 303 | 100 | 100 | 303 | 303 |
| 323 | 323 | 103 | 370 | 370 | 377 | 377 | 302 | 317 | 324 | 377 | 324 | 377 | 377 | 377 | 303 |

ROM 3

| | | | | | | | | | | | | | | | |
|---|---|---|---|---|---|---|---|---|---|---|---|---|---|---|---|
| 377 | 377 | 377 | 373 | 361 | 366 | 367 | 377 | 377 | 377 | 367 | 377 | 367 | 367 | 367 | 377 |
| 377 | 367 | 366 | 377 | 363 | 377 | 377 | 27 | 27 | 46 | 366 | 66 | 363 | 363 | 237 | 377 |
| 364 | 367 | 377 | 217 | 366 | 17 | 377 | 377 | 364 | 377 | 377 | 237 | 377 | 153 | 364 | 364 |
| 137 | 364 | 377 | 77 | 377 | 377 | 357 | 377 | 377 | 377 | 357 | 377 | 377 | 377 | 77 | 77 |
| 377 | 377 | 16 | 77 | 377 | 377 | 377 | 357 | 363 | 237 | 363 | 377 | 357 | 377 | 377 | 377 |
| 364 | 364 | 377 | 377 | 370 | 364 | 377 | 364 | 100 | 57 | 377 | 377 | 377 | 377 | 377 | 17 |
| 366 | 7 | 364 | 363 | 237 | 377 | 364 | 177 | 377 | 17 | 237 | 366 | 366 | 7 | 364 | 117 |
| 136 | 364 | 363 | 364 | 377 | 124 | 377 | 57 | 364 | 364 | 377 | 360 | 57 | 60 | 57 | 363 |
| 377 | 377 | 237 | 237 | 377 | 57 | 57 | 364 | 364 | 377 | 37 | 17 | 377 | 377 | 377 | 377 |
| 237 | 237 | 237 | 117 | 77 | 377 | 377 | 237 | 237 | 377 | 377 | 377 | 237 | 377 | 377 | 367 |
| 17 | 377 | 377 | 37 | 377 | 377 | 377 | 377 | 367 | 377 | 377 | 357 | 361 | 363 | 363 | 364 |
| 143 | 377 | 377 | 377 | 367 | 237 | 377 | 373 | 377 | 377 | 367 | 367 | 377 | 364 | 104 | 361 |
| 377 | 377 | 257 | 57 | 377 | 377 | 377 | 377 | 377 | 37 | 377 | 377 | 377 | 357 | 3 | 377 |
| 367 | 367 | 377 | 377 | 237 | 77 | 363 | 367 | 363 | 377 | 17 | 377 | 237 | 377 | 377 | 37 |
| 377 | 377 | 377 | 377 | 357 | 363 | 377 | 363 | 367 | 377 | 17 | 377 | 237 | 363 | 247 | 377 |
| 17 | 17 | 377 | 361 | 363 | 257 | 377 | 377 | 377 | 377 | 377 | 377 | 344 | 17 | 377 | 377 |
| 377 | 363 | 57 | 363 | 131 | 17 | 362 | 362 | 375 | 377 | 377 | 363 | 57 | 362 | 317 | 375 |
| 377 | 377 | 377 | 377 | 377 | 377 | 357 | 367 | 377 | 377 | 257 | 363 | 102 | 102 | 277 | 257 |
| 377 | 377 | 377 | 377 | 377 | 377 | 357 | 357 | 377 | 377 | 361 | 361 | 361 | 377 | 361 | 277 |
| 377 | 257 | 362 | 377 | 377 | 377 | 377 | 237 | 137 | 377 | 377 | 377 | 377 | 77 | 367 | 377 |
| 377 | 117 | 365 | 177 | 161 | 361 | 377 | 377 | 257 | 367 | 377 | 377 | 377 | 377 | 361 | 362 |
| 362 | 257 | 377 | 377 | 77 | 274 | 274 | 47 | 257 | 377 | 37 | 362 | 17 | 17 | 377 | 362 |
| 377 | 77 | 377 | 361 | 377 | 377 | 377 | 377 | 377 | 377 | 377 | 367 | 377 | 277 | 367 | 377 |
| 377 | 377 | 261 | 361 | 277 | 277 | 377 | 377 | 242 | 362 | 377 | 361 | 362 | 277 | 377 | 257 |
| 362 | 377 | 237 | 237 | 362 | 362 | 377 | 377 | 367 | 377 | 377 | 177 | 157 | 377 | 377 | 377 |
| 377 | 317 | 377 | 377 | 377 | 377 | 377 | 377 | 361 | 267 | 377 | 257 | 377 | 377 | 361 | 377 |
| 267 | 377 | 257 | 377 | 377 | 361 | 377 | 277 | 257 | 317 | 372 | 367 | 377 | 177 | 377 | 377 |
| 377 | 361 | 367 | 377 | 301 | 360 | 374 | 363 | 277 | 377 | 362 | 367 | 374 | 377 | 377 | 377 |
| 362 | 361 | 361 | 267 | 257 | 377 | 377 | 377 | 377 | 362 | 377 | 361 | 377 | 317 | 362 | 377 |
| 377 | 377 | 377 | 367 | 377 | 174 | 157 | 137 | 377 | 361 | 377 | 367 | 377 | 377 | 377 | 361 |
| 367 | 262 | 101 | 101 | 367 | 367 | 277 | 277 | 362 | 277 | 277 | 377 | 367 | 367 | 277 | 277 |
| 277 | 277 | 361 | 377 | 377 | 377 | 257 | 361 | 377 | 362 | 317 | 362 | 377 | 377 | 377 | 377 |

ROM 4

| | | | | | | | | | | | | | | | |
|---|---|---|---|---|---|---|---|---|---|---|---|---|---|---|---|
| 56 | 116 | 126 | 170 | 135 | 105 | 100 | 10 | 120 | 170 | 130 | 120 | 100 | 132 | 136 | 120 |
| 123 | 131 | 101 | 10 | 105 | 30 | 35 | 135 | 135 | 170 | 170 | 170 | 12 | 12 | 231 | 170 |
| 160 | 107 | 66 | 125 | 17 | 127 | 55 | 124 | 170 | 106 | 170 | 112 | 231 | 170 | 170 | 170 |
| 170 | 170 | 106 | 110 | 235 | 234 | 170 | 110 | 124 | 114 | 170 | 110 | 115 | 125 | 106 | 110 |
| 124 | 170 | 170 | 170 | 110 | 235 | 234 | 170 | 110 | 124 | 114 | 120 | 170 | 110 | 115 | 125 |
| 160 | 160 | 120 | 106 | 120 | 170 | 106 | 170 | 130 | 127 | 170 | 106 | 106 | 120 | 170 | 170 |
| 170 | 107 | 170 | 17 | 127 | 127 | 170 | 127 | 127 | 170 | 170 | 170 | 170 | 107 | 170 | 106 |
| 11 | 17 | 170 | 170 | 106 | 170 | 170 | 170 | 170 | 170 | 114 | 134 | 170 | 130 | 170 | 110 |
| 170 | 124 | 170 | 124 | 17 | 11 | 106 | 170 | 111 | 106 | 160 | 170 | 106 | 170 | 106 | 106 |
| 170 | 170 | 170 | 106 | 170 | 170 | 106 | 170 | 170 | 106 | 106 | 170 | 170 | 106 | 170 | 107 |
| 170 | 11 | 106 | 170 | 11 | 170 | 11 | 11 | 160 | 11 | 233 | 170 | 130 | 170 | 170 | 70 |
| 160 | 170 | 11 | 11 | 160 | 170 | 170 | 46 | 46 | 170 | 101 | 160 | 32 | 231 | 160 | 135 |
| 105 | 111 | 106 | 55 | 170 | 75 | 125 | 125 | 106 | 115 | 234 | 11 | 106 | 170 | 100 | 11 |
| 101 | 160 | 170 | 66 | 125 | 170 | 105 | 101 | 104 | 66 | 125 | 106 | 170 | 170 | 106 | 115 |

| | | | | | | | | | | | | | | | |
|---|---|---|---|---|---|---|---|---|---|---|---|---|---|---|---|
| 230 | 115 | 120 | 234 | 170 | 105 | 11 | 104 | 160 | 66 | 125 | 106 | 170 | 100 | 101 | 106 |
| 50 | 70 | 124 | 135 | 104 | 170 | 55 | 105 | 121 | 121 | 31 | 233 | 170 | 170 | 377 | 377 |
| 126 | 50 | 120 | 150 | 125 | 125 | 170 | 170 | 116 | 116 | 126 | 137 | 57 | 170 | 57 | 116 |
| 116 | 116 | 126 | 50 | 110 | 233 | 15 | 125 | 100 | 103 | 120 | 50 | 100 | 120 | 107 | 52 |
| 52 | 230 | 230 | 230 | 127 | 127 | 127 | 127 | 11 | 11 | 121 | 121 | 121 | 110 | 130 | 122 |
| 100 | 170 | 100 | 116 | 116 | 126 | 100 | 200 | 210 | 75 | 210 | 100 | 125 | 15 | 125 | 100 |
| 100 | 124 | 44 | 170 | 121 | 130 | 123 | 123 | 15 | 125 | 53 | 113 | 123 | 170 | 130 | 170 |
| 104 | 116 | 116 | 116 | 116 | 104 | 104 | 100 | 104 | 104 | 44 | 170 | 170 | 170 | 127 | 104 |
| 116 | 116 | 31 | 137 | 121 | 116 | 116 | 116 | 116 | 126 | 15 | 125 | 100 | 15 | 125 | 100 |
| 111 | 200 | 121 | 130 | 170 | 112 | 200 | 100 | 122 | 122 | 35 | 130 | 125 | 170 | 100 | 170 |
| 170 | 57 | 35 | 115 | 170 | 125 | 126 | 115 | 125 | 115 | 104 | 104 | 170 | 33 | 17 | 127 |
| 110 | 123 | 15 | 126 | 15 | 170 | 170 | 15 | 130 | 125 | 100 | 170 | 170 | 15 | 130 | 100 |
| 125 | 100 | 170 | 170 | 170 | 130 | 100 | 100 | 100 | 111 | 126 | 100 | 107 | 170 | 15 | 170 |
| 170 | 134 | 125 | 54 | 101 | 107 | 170 | 35 | 125 | 114 | 127 | 120 | 170 | 170 | 170 | 170 |
| 116 | 137 | 130 | 100 | 14 | 124 | 124 | 170 | 170 | 170 | 170 | 137 | 57 | 11 | 121 | 116 |
| 116 | 126 | 15 | 160 | 107 | 107 | 67 | 107 | 275 | 130 | 235 | 125 | 35 | 125 | 170 | 130 |
| 40 | 122 | 130 | 130 | 100 | 100 | 12 | 32 | 122 | 170 | 170 | 170 | 100 | 100 | 170 | 50 |
| 11 | 31 | 121 | 100 | 170 | 15 | 15 | 137 | 57 | 125 | 15 | 125 | 377 | 377 | 377 | 116 |

APPENDIX C-2

```
                                                   MICRA 2/4/77
                                                   *       DIGITAL STORAGE TEST PROGRAM
                                                   *
                                                   *       REGISTERS
                                                           DECLARE R0=0,R1=1,R2=2,R3=3,R4=4,R5=5,R6=6,R7=7
                                                           DECLARE A0=0,A1=1,A2=2,A3=3,A4=4,A5=5,A6=6,A7=7
                                                           DECLARE SCR=0,X=1,Y=2,THRESH=3,DC=4,MA=5
                                                           DECLARE SAVEA=6,CHR=7,DELTAY=7,RA=7
                                                   *
                                                   *
                                                   *       FLAGS
                                                           DECLARE LROMEN=0,CHAR=1,BLINK=2,FS=3,BRIGHT=4
                                                           DECLARE LLGBLANK=5,DIM=6,FSTPT=7,FLGA=8,FLGB=9
                                                           DECLARE FLGC=10,SELA=11,CE=12,SELB=13,DOTEN=14
                                                           DECLARE HOLD=15
                                                           DECLARE FLGTA=3,FLGTB=4,FLGTC=6
                                                   *
                                                   *
                                                   *       I/O PORTS
                                                           DECLARE ADC=0,MEM=1,RTN=2,TSTB=3,TSTA=4
                                                           DECLARE BPCAD=6,BPCD=7
                                                           DECLARE LGCHAR=0,LGX=1,LGY=2,MDR=3,RAMP=4
                                                           DECLARE LGEXP=5,BPCO=6,MAR=7,STT=8,RSTO=9
                                                           DECLARE INCRSA=10,HSRS=11,CLRSA=12,DRTIMER=13
                                                           DECLARE SRSEN=14,CRSEN=15
                                                   *
                                                   *
                                                   *       CONSTANTS
                                                           DECLARE 0=0,1=15,8=2,15=3,16=4,32=7,97=6,100=3
                                                           DECLARE 255=7,1023=8,1024=9,2047=10,2048=11
                                                           DECLARE 3072=12,4032=13,4095=14,1032=1,2148=4
                                                           DECLARE 2730=5,1365=6,500=13
                                                           DECLARE 2=1,4=2
                                                   *
                                                   *
                                                   *       QUALIFIERS
                                                           DECLARE B0=0,B1=1,B2=2,B3=3,B4=4,B5=5,B6=6
                                                           DECLARE B7=7,B8=8,B9=9,B10=10,B11=11,ZERO=12
                                                           DECLARE POS=14,TEST=13
                                                   *
                                                   *       STIMULUS SOFTWARE
                                                   *
                                                   *
                                                           ADRS 0
  0    0    5--1 1  0 3--17 17--0 2 0 4    AC      JAD H DAC=A4+0&B              \0000 0110 0011
  1    1  113--0 1  0 3--17  6--0 2 1 1    FA      JRTN7 DAC=R1+0 OBPCO
  2    0  176--1 1 10 2--14 17--0 5 0 4    AB      JAC H DA4=AC QZERO SFLGA      \0000 0000 0010\C
  3    0  177--1 1 17 3--15 17--0 3 0 0    AA      JAB H DAC=A0/1&B QTEST
  4    0   41--1 1  1 3--17 17--0 0 0 0    BH      JBI H DAC=A0+1032&B
  5    0    2--1 1 10 2--14 17--0 5 0 0    AD      JAE H DA0=AC QZERO SFLGA      \0000 0110 0011
  6    0   24--0 1  2 0--17  5--0 5 0 2    BA      JBB H DA2=AC OLGEXP CBLINK
  7    0   10--1 1 17 3--10 17--0 1 0 0    AE      JAF H DAC=A0-1&B QB8          \0000 0000 0000\C
 10    0    2--1 1  5 3--13 17--0 3 0 2    AO      JAP H DAC=A2/2730&B QB11      \0001 0101 0101\C
 11    0   24--1 1  5 3--12 17--0 2 0 5    AQ      JAR H DAC=A5*2730&B QB10      \1011 1111 1111\C
 12    0  177--1 1  2 0-- 5 17--0 5 0 5    AP      JAQ H DA5=AC QB5 CBLINK       \0001 0101 0101\C
 13    0   21--1 1  0 3-- 1 17--0 4 0 0    AS      JAT H DAC=A0&B QB1            \1010 1010 1010
 14    0   17--1 1  6 3-- 3 17--0 3 0 3    AW      JAX H DAC=A3/1365&B QB3       \0000 0000 0111\C
 15    0    3--1 1  0 3--15 17--0 6 0 0    AY      JAZ H DAC=%A0&B QTEST         \1111 1111 1111
 16    0  172--1 1  5 2--17 17--0 5 0 2    AN      JAO H DA2=AC SLLGBLANK        \0101 0101 0101
 17    0   20--1 1 14 0--16 17--0 5 0 4    AF      JAG H DA4=AC QPOS CCE         \0000 0000 0000
 20    0    3--1 1  2 2-- 5 17--0 5 0 0    AZ      JZA H DA0=AC QB5 SBLINK       \1010 1010 1010
 21    0    3--1 1  6 3-- 2 17--0 1 0 0    ZC      JZD H DAC=A0-1365&B QB2       \0101 0101 0101
 22    0  172--1 1 16 0--13 17--0 5 0 2    AV      JAW H DA2=AC QB11 CDOTEN      \1011 1111 1111
 23    0    3--1 1  0 3--11 17--0 4 0 0    ZA      JZB H DAC=A0&B QB9            \0101 0101 0101\C
 24    0    1--1 1  0 2-- 0 17--0 5 0 4    ZD      JZE H DA4=AC QB0 SLROMEN      \0101 0101 0101
 25    0    4--1 1 12 3-- 0 17--0 2 0 4    ZE      JZF H DAC=A4*2047&B QB0       \0000 0000 0000\C
 26    0  173--1 1  4 0-- 6 17--0 7 0 0    ZB      JZC H DB=AC QB6 CBRIGHT       \0101 0101 0101
 27    0  173--1 1  1 3-- 4 17--0 0 0 5    AU      JAV H DAC=A5+1032&B QB4       \1010 1010 1010\C
 30    0  152--1 1  5 3-- 1 17--0 2 0 2    ZG      JAB H DAC=A2*2730&B QB1       \0000 0000 0000\C
 31    1  177--1 1 10 0-- 2 17--0 7 0 0    ZF      JZG   DB=AC QB2 CFLGA         \0000 0000 0000\C
 32    0    6--1 1  3 2--17 17--0 6 0 2    BB      JBC H DAC=%A2&B SFS
 33    0  162--1 1  5 0-- 6 17--0 5 0 1    AX      JAY H DA1=AC QB6 CLLGBLANK    \1010 1010 1010\C
 34    0  173--1 1  0 3-- 3 17--0 5 0 7    AT      JAU H DA7=AC QB3              \1010 1010 1010
 35    0  156--1 1 16 2-- 4 17--0 5 0 3    AR      JAS H DA3=AC QB4 SDOTEN       \1011 1111 1111
 36    0  160--1 1 10 3--11 17--0 2 0 6    AM      JAN H DAC=A6*1023&B QB9       \1010 1010 1010
 37    0   41--1 1  5 3-- 7 17--0 1 0 4    AG      JAM H DAC=A4-2730&B QB7       \1111 1111 1111
 40    0    1--1 1  0 2--17 17--0 5 0 2    BC          H DA2=AC SLROMEN
 41    0    1--1 1 17 3--17 17--0 1 0 2    BD          H DAC=A2-1&B
 42    0    1--1 1  5 0--17 17--0 7 0 0    BE          H DB=AC CLLGBLANK
 43    0    1--1 1  0 3--15 17--0 2 0 4    BF          H DAC=A4*0&B QTEST
 44    0   27--1 1  4 2--17 17--0 5 0 0    BG      JCA H DA0=AC SBRIGHT
 45    0    1--0 1  0 2--17  3--0 5 0 7    BI          H DA7=AC SLROMEN OMDR
 46    0    1--0 1  2 3--17  4--0 1 0 0    BJ          H DAC=A0-8&B ORAMP        \UPDATE RAMP
 47    0    1--0 1 14 2--17  7--0 5 0 1    BK          H DA1=AC SCE   OMAR
 50    0    1--0 0 10 3--17  3--0 1 0 7    BL          H DAC=A7-1023&B W OMDR    \WRITE TO MEMORY
```

```
51    0    1--0 0  7 0--17  6--0 5 0 6   BN        H DA6=AC W DBPCO CFSTPT      \UPDATE BPCO
52    0    1--1 0 14 0--17 17--0 4 0 0   BN        H DAC=A0&B CCE W             \INTERRUPT SYNCHRONIZE
53    1    0--1 1  0 3--13 17--0 7 0 0   BO   JBO    DB=AC QB11
54    0    0--0 1 13 3--17  5--0 0 0 6   BP   JBP H DAC=A6+2048&B OLGEXP
55    0    1--1 1  1 2--17 17--0 5 0 5   BQ        H DA5=AC SCHAR
56    0    1--0 1 11 3--17  0--0 1 0 3   BR        H DAC=A3-1024&B OLGCHAR      \UPDATE LGCHAR
57    0    1--1 1  1 0--17 17--0 5 0 4   BS1       H DA4=AC CCHAR
60    0    1--1 1  6 0--17 17--0 6 0 5   BT        H DAC=%A5&B CDIM
61    0    1--1 1  2 2--17 17--0 7 0 0   BU        H DB=AC SBLINK
62    0    1--1 1 17 3--17 17--0 0 0 1   BV        H DAC=A1+1&B
63    0   13--1 1  3 0--17 17--0 5 0 3   BW   JYC H DA3=AC CFS
64    0    1--1 1 12 3--17 17--0 3 1 3   BX        H DAC=A3/2047
65    0    1--1 1  4 0--17 17--0 7 0 0   BY        H DB=AC CBRIGHT
66    0    1--1 1 17 3--15 17--0 0 0 0   BZ        H DAC=A0+1&B QTEST
67    0    1--1 1  0 3--16 17--0 5 0 0   YA        H DA0=AC QPDS
70    0 113--1 1 10 2--17 17--0 4 0 4   YB   JAA H DAC=A4&B SFLGA          \CYCLE BACK(DM CHECK)
71    0   10--0 1 14 2--17  7--0 4 0 3   DA   JDB H DAC=A3&B OMAR SCE
72    0 114--1 1 17 0--17  3--0 4 1 0   XJ   JBA H DAC=A0 ITSTB CHOLD       \READ TEST B
73    0 111--1 1 10 0--17 17--0 7 0 0   CA   JBH H DB=AC CFLGA
74    0   45--1 1  3 0-- 3 17--1 3 0 3   CB   JCC H DAC=A3/AC&B QB3  CFS
75    0 107--1 1 10 2--17  7--0 4 1 0   KD   JBH H DAC=A0 IBPCD SFLGA       \READ BPC DATA
76    0 166--1 1  0 3--17 17--0 6 0 2   YC   JBX H DAC=%A2&B
                                              ADRS 63
77    0 137--1 1  4 2--10 17--0 5 0 0   AL   JAM H DA0=AC QBB SBRIGHT       \0101 0101 0101
100   0   77--1 1  0 3--12 17--0 5 0 1   AH   JAI H DA1=AC QB10              \1111 1111 1111
101   0    2--1 1 12 0--17 17--1 0 0 3   DB   JDD H DAC=A3+AC&B CFLGC
102   0    1--1 1 11 0--17 17--1 1 0 3   DC1       H DAC=A3-AC&B CFLGB
103   0    1--1 1  6 2--17 17--0 7 0 0   DD        H DB=AC SDIM
104   0    1--1 1  2 3--17 17--0 2 0 2   DE        H DAC=A2+B&B
105   0    1--1 1 14 0--17  1--1 2 1 2   DF        H DAC=A2+AC CCE IMEM         \READ MEMORY
106   0    1--0 1  0 3--17 14--0 5 0 4   DG        H DA4=AC OCLRSA
107   0    1--0 1  0 0--17  7--0 4 0 5   DH        H DAC=A5&B OMAR CLROMEN
110   0    1--0 1  0 3--17 17--0 4 0 4   DI        H DAC=A4&B OCRSEN
111   0    1--1 1 13 0--17 17--1 0 0 4   DJ        H DAC=A4+AC&B CSELA
112   0    1--1 1 15 2--17 17--0 5 0 4   DK        H DA4=AC SSELB
113   0    1--1 1  0 3--13 17--0 6 0 2   DL        H DAC=%A2&B QB11
114   0    1--1 1  0 3--17  1--0 4 1 0   DM        H DAC=A0 IMEM                \READ CHAR ROM
115   0 172--0 1  0 3--17 12--0 4 0 6   DO   JDH H DAC=A6&B DINCRSA
116   0    1--1 1  0 2--17  6--0 4 1 0   DN        H DAC=A0 IBPCAD SLROMEN      \READ BPC ADDRESS
117   0    1--0 1  0 3--14  6--0 4 0 6   DP        H DAC=A6&B DBPCO QZERO
120   0    1--1 1  0 3--17 17--0 4 0 2   DQ        H DAC=A2&B
121   0    2--1 1  0 3--17  3--0 6 1 2        JDR H DAC=%A2 ITSTB             \READ TEST B
122   0 153--0 1  0 3--17  6--0 4 0 6        JXD H DAC=A6&B DBPCO
123   0    1--0 1  6 0--17 15--0 4 0 2   DR        H DAC=A2&B DDRTIMER CDIM
124   0    1--1 1  7 2--17  4--0 4 1 2             H DAC=A2 ITSTA SFSTPT        \READ TEST A
125   0    2--0 1 17 2--17 10--0 4 0 2        JDS H DAC=A2&B DSTT SHOLD
126   0   11--0 1  0 3--17 12--0 4 0 2   XA   JXB H DAC=A2&B DINCRSA
127   0    1--0 1 12 2--17  4--0 5 0 4   DS        H DA4=AC   SFLGC DRAMP
130   0    1--1 1 11 2--17 17--0 4 0 2   DT        H DAC=A2&B SFLGB
131   0    1--1 1  0 3--17  0--0 4 1 2   DU        H DAC=A2 IADC                \READ ADC
132   0    1--0 1  0 3--17 13--0 4 0 2   DV        H DAC=A2&B DHSRS
133   0    1--1 1  0 3--17  7--0 4 1 2   DW        H DAC=A2  IBPCD
134   0    1--1 1  0 3--17 17--0 4 0 4   DX        H DAC=A4&B
135   0    1--1 1  0 3--14 17--1 0 0 4   DY        H DAC=A4+AC&B QZERO
136   0 170--1 1 10 0--17 17--0 5 0 4   DZ   JXA H DA4=AC CFLGA
137   0    1--1 1  0 3--17  4--0 4 1 0   XB        H DAC=A0 ITSTA               \READ TEST A
140   0 132--0 1  0 3--17 11--0 4 0 2   XI   JXJ H DAC=A2&B ORSTO
141   0    1--1 1 17 3-- 2 17--0 0 0 3   CC        H DAC=A3+1&B QB2
142   0    2--1 1 15 0-- 1 17--0 5 0 3   CD   JCF H DA3=AC CSELB QB1
143   0    1--1 1 15 2-- 1 17--0 5 0 3             H DA3=AC SSELB QB1
144   0    2--1 1 13 0-- 4 17--0 4 0 3   CF   JCH H DAC=A3&B CSELA QB4
145   0    1--1 1 13 2-- 4 17--0 4 0 3   CG        H DAC=A3&B SSELA QB4
146   0    2--0 1  0 3--14 16--0 4 0 2   CH   JCJ H DAC=A2&B QZERO OSRSEN
147   0    1--0 1  0 3--14 17--0 4 0 2   CI        H DAC=A2&B QZERO OCRSEN
150   0    2--1 1 12 3--15 17--0 2 0 3   CJ   JCL H DAC=A3+2047&B QTEST
151   0    1--1 1 10 0--15 17--0 4 0 2   CK        H DAC=A2&B QTEST CFLGA
152   0    2--1 1 10 2--17 17--0 7 0 0   CL   JCN H DB=AC SFLGA
153   0    1--1 1 12 3--17 17--0 2 0 3   CM        H DAC=A3+2047&B
154   0    2--1 1 17 2--17 17--0 7 0 0   CN   JCP H DB=AC SHOLD
155   0    3--1 1 17 2--17 17--0 7 0 0   CO   JCQ H DB=AC SHOLD
156   1    0--1 1  2 2--13 17--0 7 0 0   CP   JCP    DB=AC QB11 SBLINK       \INTERRUPT SYNCHRONIZE
157   0 114--1 1  0 3--17 17--0 6 0 3   CR1  JCA H DAC=%A3&B
160   1    0--1 1  4 0--13 17--0 7 0 0   CQ   JCQ    DB=AC QB11 CBRIGHT
161   0 112--1 1 17 0--17 17--0 4 0 3   CS   JCA H DAC=A3&B CHOLD
                                              ADRS 126
176   0 101--1 1  0 3-- 7 17--0 6 0 1   AK   JAL H DAC=%A1&B QB7            \0101 0101 0101\C
177   0   77--1 1  6 3-- 5 17--0 0 0 0   AI   JAJ H DAC=A0+1365&B QB5        \0101 0101 0101\C
                                              ADRS 190
276   0 100--1 1  3 0--16 17--0 5 0 6   AJ   JAK H DA6=AC QPDS CFS          \0000 0000 0000\C
                                         *
                                         *
                                         *
                                         *
                                         *
                                         * SELF BOOT SOFTWARE
                                         *
                                              ADRS 114
162   1    6--1 1 11 3--17 17--0 0 1 1   LB2  JLB4 DAC=R1+1024              \MEMORY CLEAR
163   0    1--1 1  0 3--17 17--0 5 0 0   LB3  DR0=AC H
164   0    1--0 0 14 2--17  7--0 4 0 0        DAC=R0&B OMAR  SCE H W
165   0    1--1 0 17 3--17 17--0 1 0 0        DAC=R0-1&B  W H
166   1    1--1 0  0 3--14 17--0 7 1 0        QZERO  W
167   1 173--1 0 14 0--17 17--0 7 1 0        JLB2 CCE W
                                         *
                                         *
170   1    1--1 1 10 0--17 17--0 5 0 6   LB4  DR6=AC         CFLGA           \REGISTER SET UPS
171   1    1--1 1 17 3--17 17--0 0 1 0        DAC=R0+1
172   1    1--1 1 11 0--17 17--1 0 1 6        DAC=R6+AC      CFLGB
173   1    1--1 1 12 0--17 17--0 5 0 2        DR2=AC         CFLGC
174   1    1--1 1  1 3--17 17--0 0 1 1        DAC=R1+1032
175   1    3--1 1 13 0--17 17--0 5 0 4        JZ1 DR4=AC     CSELA
                                              ADRS 128
200   1    1--1 1  2 3--17 17--0 0 1 4   Z1   DAC=R4+8
201   1    1--1 1 15 0--17 17--0 5 0 4        DR4=AC         CSELB
202   1    1--1 1 17 3--17 17--0 0 1 0        DAC=R0+1
203   1    1--1 1 17 0--17 17--1 0 1 2        DAC=R2+AC      CHOLD
204   1    1--1 1  0 3--17 17--0 5 0 3        DR3=AC
```

```
205   1    1--1 1  7 3--17 17--0 0 1 6          DAC=R6+32
206   1    1--0 1  0 3--17 16--0 5 0 5          DR5=AC        OSRSEN
207   1    1--1 1  7 3--17 17--0 0 1 5          DAC=R5+32
210   1    1--1 1  2 0--17 17--0 5 0 6          DR6=AC        CBLINK
211   1    1--1 1 17 3--17 17--0 0 1 6          DAC=R6+1
212   1    1--1 1  0 3--17 17--0 5 0 6          DR6=AC
                                          *
                                          *
213   0    1--0 1  0 3--17  3--0 4 0 4          DAC=R4&B OMDR H                  \ DIAGNAL GRAPH SET UP
214   0    2--0 0 14 2--17  7--0 4 0 1    LB5   JLB6 DAC=R1&B OMAR SCE H W
215   1    5--1 1  0 3--17 17--0 2 1 0          JLB7 DAC=R0+0
216   0    1--1 0  0 3--17 17--0 7 1 0    LB6   W H
217   0    1--1 0 17 3--17 17--0 0 0 1          DAC=R1+1&B H W
220   1    1--1 0 14 0--12 17--0 5 0 1          DR1=AC QBID  W CCE
221   0  173--0 0  0 3--17  3--0 4 0 1          JLB5 DAC=R1&B OMDR H W
                                          *
222   1    1--1 1  0 3--17 17--0 5 0 1    LB7   DR1=AC                          \GRATICLE GENERATION
223   1    1--1 1  0 3--17 17--0 5 0 4          DR4=AC
224   1    1--1 1  1 3--17 17--0 0 1 4          DAC=R4+1032
225   1    1--1 1  0 3--17 17--0 5 0 0          DR0=AC
226   1    1--1 1  7 3--17 17--0 1 1 0          DAC=R0-32
227   1    1--1 1  0 3--17 17--0 5 0 0          DR0=AC
230   0    1--0 1  0 3--17  3--0 4 0 2          DAC=R2&B OMDR H
231   0    1--0 0 14 2--17  7--0 4 0 0          DAC=R0&B OMAR SCE H W
232   0    1--1 0  0 3--17 17--0 5 0 2          DR2=AC H W
233   0    1--1 0 17 3--17 17--0 0 1 0          DAC=R0+1 H W
234   0    1--1 0 10 2--17 17--0 5 0 0          DR0=AC H W  SFLGA
235   0    1--1 0 13 3--17 17--0 0 1 4          DAC=R4+2048 H W
236   1   26--1 0 14 0--17 17--0 5 0 5          JSUB1 DR5=AC W CCE
                                          *
                                          *
237   1   25--1 1 10 2--17 17--0 5 0 5    LNK0  JSUB1 DR5=AC SFLGA   \HORZ GRATICULE LOOP
240   1    1--1 1 11 2--17 17--0 5 0 5    LNK1  DR5=AC SFLGB
241   1    1--1 1  0 3--17 17--0 4 1 2          DAC=R2
242   1   22--1 1  0 3--17 17--0 5 0 4          JSUB1 DR4=AC
243   1    1--1 1 12 2--17 17--1 1 1 5    LNK3  DAC=R5-AC SFLGC
244   1    1--1 1 10 0--16 17--0 7 1 0          QPOS CFLGA
245   1    1--1 1  4 3--17 17--0 0 1 5          DAC=R5+2148
246   1   16--1 1 12 0--17 17--0 5 0 5          JSUB1 DR5=AC CFLGC
247   1    1--1 1 13 3--17 17--0 0 1 5    Z2    DAC=R5+2048
250   1   14--1 1  0 3--17 17--0 5 0 5          JSUB1 DR5=AC
251   1    1--1 1  0 3--17 17--0 5 0 5    LNK2  DR5=AC
252   1    1--1 1 11 0--17 17--0 4 1 1          DAC=R1 CFLGB
253   1   11--1 1  0 3--17 17--0 5 0 4          JSUB1 DR4=AC
                                          *
                                          *
254   1  107--0 1  0 2--17  3--0 4 0 1    Z4    JLB3 DAC=R1&B OMDR SLROMEN
                                          *
255   1    7--1 1  0 3--17 17--0 5 0 5    LNK6  JSUB1 DR5=AC        \VERT GRATICULE LOOP
256   1    1--1 1 11 0--16 17--0 5 0 4    LNK7  DR4=AC QPOS CFLGB
257   1    1--1 1 13 3--17 17--0 0 1 1          DAC=R1+2048
260   0   36--0 1  0 3--17  3--0 4 0 6          JLB8 DAC=R6&B OMDR H
261   1    3--1 1  0 3--17 17--0 5 0 5          JSUB1 DR5=AC
262   1    2--1 1 10 0--17 17--0 5 0 5    LNK5  JSUB1 DR5=AC CFLGA
263   1  164--1 1 11 2--17 17--0 5 0 4    LNK4  JZ2  DR4=AC SFLGB
                                          *
                                          *
264   0    1--0 1  0 3--17  3--0 4 0 4    SUB1  DAC=R4&B OMDR H
265   0    1--0 0 14 2--17  7--0 4 0 0          DAC=R0&B OMAR W H SCE
266   0    1--1 0 17 3--17 17--0 0 1 0          DAC=R0+1 W H
267   1    1--1 0  0 3--17 17--0 5 0 0          DR0=AC W
270   1    1--1 0 14 0--17 17--0 7 1 0          W CCE
271   0    1--0 0  0 3--17  3--0 4 0 5          DAC=R5&B OMDR W H
272   0    1--0 0 14 2--17  7--0 4 0 0          DAC=R0&B OMAR W H SCE
273   0    4--1 0 17 3--17  4--0 0 1 0          JZ3 DAC=R0+1 ITSTA W H
                                          *
274   1  143--1 1  4 3--17 17--0 0 1 5    RTN0  JLNK0 DAC=R5+2148
275   1  143--1 1 13 3--17 17--0 1 1 5    RTN1  JLNK1 DAC=R5-2048
                                          *
                                                ADRS 191
277   0    1--1 0  0 3-- 6  4--0 7 1 0    Z3    ITSTA QFLGTC  W H
300   0    1--1 0 14 0-- 4  4--0 7 1 0          QFLGTB ITSTA W H CCE
301   1    2--1 1  0 3-- 3 17--0 5 0 0          JPRTN1 QFLGTA DR0=AC
302   1    3--1 1  0 3-- 3 17--0 5 0 0          JPRTN3 QFLGTA DR0=AC
                                          *
303   1  171--1 1  0 3--17 17--0 7 1 0    PRTN1 JRTN0
304   1    3--1 1  0 3--17 17--0 7 1 0    PRTN2 JRTN2
305   1    4--1 1  0 3--17 17--0 7 1 0    PRTN3 JRTN4
306   1    5--1 1  0 3--17 17--0 7 1 0    PRTN4 JRTN6
                                          *
307   1  142--1 1 13 3--17 17--0 1 1 5    RTN2  JLNK2 DAC=R5-2048
310   0  133--1 1  2 3--17 17--0 1 1 2    RTN3  JLNK3 DAC=R2-8 H
311   1  152--1 1  3 3--17 17--0 1 1 4    RTN4  JLNK4 DAC=R4-100
312   1  150--1 1  0 3--17 17--0 4 1 2    RTN5  JLNK5 DAC=R2
313   1  142--1 1 10 2--17 17--0 4 1 1    RTN6  JLNK6 DAC=R1 SFLGA
314   1  142--1 1  3 3--17 17--0 1 1 4    RTN7  JLNK7 DAC=R4-100
                                          *
                                          *
315   1  137--0 1 14 0--17 13--0 5 0 1    LB1   JZ4 DR1=AC OHSRS CCE
                                          *
                                          *
316   0    1--0 0 14 2--17  7--0 4 0 0    LB8   DAC=R0&B OMAR W H SCE  \CONTROL ASCII
317   0    1--1 0 17 3--17 17--0 0 1 0          DAC=R0+1 W H
320   1    1--1 0  0 3--17 17--0 5 0 0          DR0=AC W
321   1    1--1 0  7 3--17 17--0 0 1 1          DAC=R1+32 W
                                          *
                                          *
322   1    1--1 0 14 0--17 17--0 5 0 4          DR4=AC W CCE    \ASCII CHARACTER LOOP
323   1    1--1 1  7 3--17 17--0 0 1 4          DAC=R4+32
324   1    1--1 1  0 3--17 17--0 5 0 6          DR6=AC
325   1    1--1 1  0 3--17 17--0 5 0 5          DR5=AC
326   0    2--0 1  0 3--17  3--0 4 0 5    LB9   JLB10 DAC=R5&B H OMDR
327   0    6--1 1 12 3--17 17--0 0 1 1          JLB11 DAC=R1+2047 H
330   0    1--0 0 14 2--17  7--0 4 0 0    LB10  DAC=R0&B OMAR W H SCE
331   0    1--1 0 17 3--17 17--0 0 1 5          DAC=R5+1 W H
```

```
332   0    1--1 0  0 3--17 17--0 5 0 5          DR5=AC W H
333   0    1--1 0 17 3-- 7 17--0 0 1 0          DHC=RO+1 QB7 W H
334   1  172--1 0 14 0--17 17--0 5 0 0          JLB9 DRO=AC W CCE
                                         *
335   0    1--0 1  0 3--17  3--0 7 0 0   LB11   DB=AC OMDR H
336   0    1--0 0 14 2--17  7--0 4 0 0          DAC=RO&B OMAR W H SCE
337   0    1--1 0 17 3--17 17--0 0 1 0          DAC=RO+1 W H
340   1    1--1 0 13 0--17 17--0 5 0 0          DRO=AC W CSELA
341   0    1--0 1 14 0--17  3--0 4 0 3          DAC=R3&B OMDR H CCE
342   0    1--0 0 14 2--17  7--0 4 0 0          DAC=RO&B OMAR W H SCE
343   0    1--1 0  0 3--17 17--0 4 1 1          DAC=R1 W H
344   0    1--1 0  0 3--17 17--0 5 0 0          DRO=AC W H
                                         *
                                         *
345   0    1--1 0 15 3--17 17--0 0 1 1   LB12   DAC=R1+500 W H
346   1    1--1 0 14 0--17 17--0 5 0 5          DR5=AC W CCE
347   1    1--1 1  7 3--17 17--0 1 1 5          DAC=R5-32
350   1    1--1 1 15 2--17 17--0 5 0 4          DR4=AC SSELB
351   1    1--1 1  7 3--17 17--0 0 1 5          DAC=R5+32
352   1    1--1 1 10 0--17 17--0 5 0 6          DR6=AC CFLGA
353   0    1--0 1  0 3--17  3--0 4 0 0          DAC=RO&B OMDR H
354   0    3--0 0 11 0--17  7--0 4 0 6          JSUB2 DAC=R6&B OMAR W H CFLGB
355   0    2--0 0 10 2--17  7--0 4 0 4   LNO    JSUB2 DAC=R4&B OMAR W H SFLGA
356   0    1--0 0 11 2--17  7--0 4 0 5   LN1    JSUB2 DAC=R5&B OMAR W H SFLGB
                                         *
                                         *
357   0    1--1 0 14 2--17 17--0 7 1 0   SUB2   SCE W H
360   0    1--1 0 12 2--17 17--0 7 1 0          W H SFLGC
361   1    1--1 0 17 3--17 17--0 0 1 7          DAC=R7+1 W
362   0    1--1 0 14 0--17 17--0 5 0 7          DR7=AC H W CCE
363   0    1--0 1  0 3--17  7--0 4 0 7          DAC=R7&B OMAR H
364   0    1--1 1 14 2--17 17--0 7 1 0          H SCE
365   0    1--1 1  0 3--17  4--0 7 1 0          ITSTA H
366   0    1--1 1  0 3-- 6 17--0 7 1 0          QFLGTC H
367   1    1--1 1 17 2--17  4--0 7 1 0   LB13   ITSTA SHOLD
370   0    2--1 1 14 0-- 4  0--0 5 1 0          JLB14 DRO=B IADC QFLGTB H CCE
371   0  176--1 1 14 0-- 2 17--0 7 1 0          JLB13 QB2 H CCE
372   1    1--1 1 17 0--17  4--0 7 1 0   LB14   ITSTA CHOLD
373   1    2--1 1  0 3-- 3 17--0 7 1 0          JLB15 QFLGTA
374   0  151--0 1 13 0--17  3--0 4 0 0   RT3    JLB12 DAC=RO&B OMDR H CSELA
375   0    1--1 1  0 3--17 17--0 7 1 0   LB15   H
376   0  157--0 1 15 0--17  3--0 4 0 0   RTO    JLNO DAC=RO&B OMDR H CSELB
377   0  157--0 1 13 2--17  3--0 4 0 0   RT1    JLN1 DAC=RO&B OMDR H SSELA
                                         *
                                         *
                                                ADRS          256                   \BEGIN INTERRUPT
                                                                                    \TURN ON LOCATION
400   0    2--1 1  0 3--17 17--0 2 0 0   MA1    JMB H DAC=AO+0&B
401   0    3--1 1  0 3--15  2--0 5 0 1   ME     JMF H DA1=AC QTEST IRTN
402   0   31--1 1  0 3--14  2--0 5 0 0   MB     JMC H DAO=AC QZERO IRTN             \0000 0000 0111
403   0  176--1 1 10 0--17 17--0 5 0 0   MD     JME H DAO=AC CFLGA
404   0   30--1 1  0 3--17 17--0 5 0 7   MF     JMA H DA7=AC
405   0   27--1 1  5 2--17 17--0 7 0 0   MW     JMA H DB=AC SLLGBLANK
406   0  177--1 1 13 3--17  2--0 3 0 0   MV     JMW H DAC=AO/2048&B IRTN
407   0    1--1 1 15 3--17 17--0 0 0 0   MB         H DAC=AO+4032&B
410   0    1--0 1 14 2--17  7--0 5 0 1              H DA1=AC OMAR SCE
411   0    1--1 1 12 3--17 17--0 1 0 1              H DAC=A1-2047&B
412   0    1--1 1 16 2--17 17--0 5 0 2              H DA2=AC SDOTEN
413   0    1--1 1 10 3--17 17--0 0 0 2              H DAC=A2+1023&B
414   0    1--1 1 14 0--17 17--0 5 0 3              H DA3=AC CCE
415   0    1--1 1  0 3--17 17--0 1 0 3              H DAC=A3-0&B
416   0    1--0 1 16 0--17  1--0 5 0 5              H DA5=AC OLGX CDOTEN
417   0    1--0 1  7 3--17  3--0 0 0 5              H DAC=A5+255&B OMDR
420   0    1--0 1 14 2--17  7--0 5 0 4              H DA4=AC OMAR SCE
421   0    1--0 1  6 3--17  2--0 0 0 4              H DAC=A4+97&B OLGY
422   0    1--1 1  5 0--17 17--0 5 0 6              H DA6=AC CLLGBLANK
423   0    1--1 1  7 3--17 17--0 0 0 6              H DAC=A6+32&B
424   0    1--1 1 14 0--17 17--0 5 0 7              H DA7=AC CCE
425   0    1--1 1  4 3--17 17--0 3 0 7              H DAC=A7/16&B
426   0    1--1 1 14 2--17 17--0 7 0 0              H DB=AC SCE
427   0    1--1 1  3 3--17 17--0 1 0 6              H DAC=A6-15&B
430   0    1--1 1  1 0--17 17--0 5 0 5              H DA5=AC CCHAR
431   0    1--1 1 17 3--17 17--0 1 0 5              H DAC=A5-1&B
432   0  154--1 1 14 0--17 17--0 5 0 4   MU     JMV H DA4=AC CCE
433   0  147--1 1  6 3--15 17--0 3 0 0   MC     JMB H DAC=AO/97&B QTEST             \000 000 0010
434   0  153--1 1 16 2--17 17--0 5 0 0   MA     JMB H DAO=AC CDOTEN SDOTEN
435   1    1--1 1  0 3--17 17--0 7 1 0   TA     \BEGIN NORMAL INTERRUPT ROUTINE
                                         *
                                         *
436   0   66--1 1  0 3--17 17--0 7 1 0   GOCORT JCORT H
                                         *
437   1    1--1 1 14 0--17 17--0 5 0 6   REFCTL DSAVEA=AC CCE                       \REFRESH CONTROL
440   1    1--1 1  0 3--17  3--0 2 1 0          DAC=SCR*0 ITSTB
441   1    1--1 1  5 0-- 2 17--0 5 0 0          DSCR=AC CLLGBLANK QB2
442   1    1--1 1  0 2--17  3--0 6 1 0          DAC=XSCR SLROMEN ITSTB
443   1    3--1 1 16 0-- 0 17--0 5 0 5          J+3 DMA=AC CDOTEN QBO              \FS MODE NOT ALLOWED
444   1    2--1 1 16 0-- 0 17--0 5 0 5          J+2 DMA=AC CDOTEN QBO              \FS MODE OFF
445   1   12--1 1  2 0--17  2--0 7 1 0          JIFS IRTN CBLINK                   \INITIATE FAST SCAN
446   1    1--1 1  3 0--17  2--0 7 1 0          IRTN CFS                           \TIMER DONE?
447   0   55--0 1  2 0--17 15--0 4 1 6          JCORT DAC=SAVEA ODRTIMER H CBLINK  \YES START DISP REF
450   0  167--1 1  2 0--17 17--0 4 1 6          JREFCTL DAC=SAVEA H CBLINK         \NO WAIT FOR TIMER
451   1    1--1 1  0 3--17 17--0 5 0 6   FSTSCH DSAVEA=AC
452   1    1--1 1  0 3--17  3--0 5 1 7          ITSTB DCHR=B
453   1    2--1 1  6 3-- 2 17--0 2 1 7          J+2 DAC=CHR*97 QB2                 \1:FSEN 2,3:AC=0
454   1    2--1 1  0 3--17  2--0 7 1 0          J+2 IRTN                           \1:FS DISB 2,3:AC#0
455   1  177--1 1  0 3--14 17--0 2 1 7          J-1 DAC=CHR*D QZERO                \AC=0 REF DISPLAY
456   0   46--0 1  3 0--17 15--0 4 1 6          JCORT CFS ODRTIMER DAC=SAVEA H     \GO TO FAST SCAN
457   0  172--1 1  3 2--17 17--0 4 1 6   IFS    JFSTSCH H DAC=SAVEA SFS            \WAIT FOR RETRACE
460   0  157--1 1  0 3--17 17--0 4 1 6          JREFCTL H DAC=SAVEA
                                         *
461   1    1--1 1  1 0--17 17--0 5 0 6   GRAPH  DSAVEA=AC CCHAR                     \BEGIN GRAPH MODE
462   1    2--1 1 12 3--17 17--0 2 1 0          J+2 DAC=SCR*2047                   \POSITIVE DATA
463   1    1--1 1  0 3--17 17--0 4 1 0          DAC=SCR                            \NEGATIVE DATA
464   1    1--1 1  0 3--17 17--1 1 1 3          DAC=THRESH-AC                      \COMPARE DATA
465   1    1--1 1 17 3--16 17--0 0 1 5          DAC=MA+1 QPOS                      \        TO THRESH
466   1    1--0 1  0 3--17  7--0 5 0 5          DMA=AC OMAR
467   1    2--1 1  0 3--17 17--0 4 0 0          J+2 DAC=SCR&B                      \DATA>THRESH
470   1    1--1 1  0 3--17 17--0 4 0 3          DAC=THRESH&B                       \DATA>=THRESH
```

```
471  1   1--1 1  0 3--12 17--0 5 0 0         DSCR=AC QB10
472  1   1--1 1 13 3--17  3--0 2 1 0         DAC=SCR*2048 ITSTB
473  1   2--0 1  0 3-- 4  2--0 4 0 0         J+2 DAC=SCR&B OLGY QB4            \POS DATA TO Y LG
474  1   1--0 1  0 3-- 4  2--0 5 0 0         DSCR=AC OLGY QB4                  \ZERO TO Y LINE GEN
475  1   1--1 1 14 2--13 17--0 4 0 7         DAC=DELTAY&B SCE QB11
476  1   2--1 1 10 3--12 17--0 2 1 2         J+2 DAC=Y*1023 QB10
477  1   2--1 1 10 3--17 17--0 2 1 2         J+2 DAC=Y*1023                    \FIRST PT
500  1   5--1 1  5 2--17 17--1 1 1 0         JOLDDY DAC=SCR-AC SLLGBLANK       \BLANK BIT OFF
501  1   2--1 1  5 0--17 17--1 1 1 0         J+2 DAC=SCR-AC CLLGBLANK          \BLANK BIT SET
502  1   1--1 1  5 0--17 17--1 1 1 0         DAC=SCR-AC CLLGBLANK              \BLANK BIT SET
503  1   4--1 1  0 3--17 17--0 5 0 7         J+4 DDELTAY=AC
504  1   3--1 1  0 3--17 17--0 5 0 7         J+3 DDELTAY=AC
505  1   3--1 1  0 3--16 17--0 5 0 7  OLDDY  J+3 DDELTAY=AC QPOS               \OLD DELTAY>=0
506  1   1--1 1  0 3--16 17--0 5 0 7         DDELTAY=AC QPOS                   \OLD DELTAY<0
507  1   3--1 1 17 3--17 17--0 0 1 1         J+3 DAC=X+1
510  1   1--1 1 17 3--17 17--0 0 1 1         DAC=X+1
511  1   3--0 1 16 2--17  1--0 5 0 1         J+3 DX=AC OLGX SDOTEN             \DELTAY SIGN CHANGED
512  1   2--0 1 16 0--17  1--0 5 0 1         J+2 DX=AC OLGX CDOTEN             \DYSGN UNCHGD OR BLNK
513  1   1--0 1 16 2--17  1--0 5 0 1         DX=AC OLGX     SDOTEN             \DELTAY SIGN CHANGED
514  1   1--1 1  0 3--17 17--0 4 1 0         DAC=SCR
515  1   1--1 1 14 0--17  1--0 5 1 0         IMEM DSCR=B CCE                   \READ NEXT MEM WORD
516  1   1--1 1  7 0--13 17--0 5 0 2         DY=AC QB11 CFSTPT                 \CLEAR FIRST PT FF
517  1   1--1 1  0 3--17 17--0 4 0 0         DAC=SCR&B
520  1   1--1 1  0 3--12 17--0 7 1 0         QB10
521  1  37--1 1  0 3--17  2--0 4 0 0  TOGRPH JGRLINK IRTH DAC=SCR&B
                                      *
522  0 115--1 1  0 3--17 17--0 4 1 6  RCLINK JREFCTL DAC=SAVEA H           \GO TO REF CONTROL
523  0 114--1 1  0 3--17 17--0 4 1 6         JREFCTL H DAC=SAVEA           \GO TO REF CONTROL
                                      *
524  1   1--1 1  1 0--17 17--0 5 0 6  CORT   DSAVEA=AC CCHAR               \CONTROL OR THRESH
525  1   1--1 1  5 0--17 17--0 4 0 0         DAC=SCR&B CLLGBLANK
526  1   1--1 1  3 0--11 17--1 0 0 0         DAC=SCR+AC&B QB9 CFS
527  1   1--1 1  0 3-- 5 17--1 0 1 0         DAC=SCR+AC QB5
530  1   2--1 1 10 3--17 17--0 3 1 5         J+2 DAC=MA/1023
531  1  14--1 1  0 3--17 17--1 0 1 0         JNEWTH DAC=SCR+AC             \GO TO NEW THRESHOLD
532  1   2--1 1  4 0--17 17--0 4 0 0         J+2 DAC=SCR&B CBRIGHT         \BRIGHT OFF
533  1 177--1 1  0 3--17 17--0 5 0 5         J-1 DMA=AC                    \SKIP PAGE
534  1   1--1 1 17 3-- 3 17--0 0 1 5         DAC=MA+1 QB3
535  1   1--0 1 14 2--17  7--0 5 0 5         DMA=AC OMAR SCE
536  1   2--1 1  6 0--17 17--0 4 0 0         J+2 DAC=SCR&B CDIM            \DIM OFF
537  1   1--1 1  6 2--17 17--0 4 0 0         DAC=SCR&B SDIM                \DIM ON
540  1   1--1 1 16 0-- 4 17--0 5 0 4         DDC=AC CDOTEN QB4
541  1   1--0 1  0 3--17  5--0 2 0 4         DAC=DC+0&B OLGEXP             \EXPAND BITS TO LG
542  1   2--1 1  7 2-- 7 17--0 7 1 0         J+2 QB7 SFSTPT                \SET FIRST PT FF
543  1   1--0 1  7 2-- 7  1--0 5 0 1         DX=AC OLGX QB7 SFSTPT         \CLEAR X POSITION
544  1  20--1 1 14 0--17  1--0 5 1 0         JDCMODE IMEM DSCR=B CCE       \READ NEXT MEM WORD
545  1   2--1 1  0 3--17 17--0 5 0 3  NEWTH  J+2 DTHRESH=AC                \NEW THRESHOLD
546  1   1--1 1  0 3--17 17--0 5 0 3         DTHRESH=AC
547  1   1--1 1 17 3--12 17--0 0 1 5         DAC=MA+1 QB10
550  1   1--0 1 14 2--17  7--0 5 0 5         DMA=AC OMAR SCE
551  1   2--1 1 12 3--17 17--0 2 1 3         J+2 DAC=THRESH*2047           \POSITIVE THRESH
552  1   1--1 1  0 3--17 17--0 4 1 3         DAC=THRESH                    \NEGATIVE THRESH
553  1   1--1 1 16 0--17 17--0 5 0 3         DTHRESH=AC CDOTEN             \EXTEND SIGN
554  1   1--1 1  0 3--17 17--0 7 1 0         J+1
555  1   7--1 1 14 0--17  1--0 5 1 0         JDCMODE IMEM DSCR=B CCE       \READ NEXT MEM WORD
556  1   3--1 1  0 3--17  2--0 7 1 0  CLNEXT JCLLINK IRTH
557  1   3--1 1  0 3--17  2--0 4 0 4         J+3 DAC=DC&B IRTH
560  0 101--1 1  0 3--12 17--0 4 1 6  GRLINK JGRAPH H DAC=SAVEA QB10        \NEXT: GRAPH PT
561  0 143--1 1  0 3--17 17--0 4 1 6  CLLINK JCORT H DAC=SAVEA              \NEXT: CNTL WORD
562  0 142--1 1  0 3--17 17--0 4 1 6         JCORT H DAC=SAVEA
563  0  23--1 1  0 3-- 3 17--0 4 1 6         JVECTOR H DAC=SAVEA QB3       \NEXT: DEFAULT TO VEC
564  1   2--0 1  0 3--13 14--0 4 0 4  DCMODE J+2 DAC=DC&B QB11 OCLRSA
565  1   1--0 1  4 2--13 14--0 4 0 4         DAC=DC&B QB11 SBRIGHT OCLRSA  \BRIGHT ON
566  1   1--0 1  0 0-- 2  7--0 4 0 0         DAC=SCR&B QB2 OMAR CLROMEN    \NEXT MAY BE A CHAR
567  1   2--1 1  0 3--12 17--0 4 0 4         J+2 DAC=DC&B QB10
570  1   1--1 1  0 3--17 17--0 4 0 4         DAC=DC&B
571  1   2--1 1  0 3-- 1 17--0 2 0 4         J+2 DAC=DC+0&B QB1
572  1 130--1 1  0 2--17  2--0 7 1 0         JRCLINK IRTH SLROMEN          \GO TO REF CONT LINK
573  1   2--1 1  0 3-- 0 17--0 7 1 0         J+2 QB0
574  1 162--1 1  0 2-- 0 17--0 7 1 0         JCLNEXT QB0 SLROMEN           \NEXT: CORT OR JUMP
575  1   4--1 1  0 3--17 17--0 5 0 7         J+4 DDELTAY=AC
576  1   1--1 1  0 2--17  2--0 4 0 4         DAC=DC&B SLROMEN IRTH
577  0   7--1 1  0 3--17 17--0 4 1 6         JVECTOR H DAC=SAVEA           \GO TO VECTOR
600  0   6--1 1  0 3-- 3 17--0 4 1 6         JVECTOR H DAC=SAVEA QB3       \DEFAULT TO VECTOR
601  1   2--1 1 17 3--17 17--0 1 1 1         J+2 DAC=X-1
602  1  34--1 1  0 2--17  1--0 5 1 7         JTOCHR1 IMEM DCHR=B SLROMEN   \READ 1ST STROKE
603  1 116--1 1  0 2--17 17--0 5 0 1         JTOGRPH DX=AC SLROMEN         \NO X INCR ON 1ST PT
                                      *
604  0   2--1 1  0 3--17 17--0 4 1 6  VLINK  JVECTOR H DAC=SAVEA           \GO TO VECTOR
605  0 117--1 1  0 3--17 17--0 4 1 6  FROMSC JCORT H DAC=SAVEA             \GO TO CORT
                                      *
606  1   1--1 1  1 0--17 17--0 5 0 6  VECTOR DSAVEA=AC CCHAR               \VECTOR MODE
607  1   1--1 1 17 3--17 17--0 0 1 5         DAC=MA+1
610  1   1--0 1 14 2--17  7--0 5 0 5         DMA=AC OMAR SCE
611  1   1--1 1  0 3--17 17--0 4 0 0         DAC=SCR&B
612  1   1--1 1 17 3--13 17--0 0 1 5         DAC=MA+1 QB11
613  1   1--0 1  0 3--17  7--0 5 0 5         DMA=AC OMAR
614  1   3--1 1  0 3--17 17--0 4 0 0         J+3 DAC=SCR&B                 \ABSOLUTE VECTOR
615  1   1--1 1  0 3--17 17--0 4 1 1         DAC=X                         \INCREMENTAL VECTOR
616  1   1--1 1  0 3--17 17--1 0 0 0         DAC=SCR+AC&B
617  1   1--0 1  0 3--13  1--0 5 0 1         DX=AC OLGX QB11               \SEND X TO LG
620  1   1--1 1 14 0--17  1--0 5 1 0         IMEM DSCR=B CCE
621  1   3--1 1 14 2--13 17--0 7 1 0         J+3 SCE QB11                  \ABSOLUTE VECTOR
622  1   1--1 1 14 2--13 17--0 4 1 2         DAC=Y QB11 SCE                \INCREMENTAL VECTOR
623  1   2--1 1  0 3--17 17--1 0 0 0         J+2 DAC=SCR+AC&B
624  1   1--1 1  0 3--17 17--0 4 0 0         J+1 DAC=SCR&B
625  1   2--0 1  5 2--12  2--0 5 0 2         J+2 DY=AC OLGY SLLGBLANK QB10 \Y TO LG & UNBLANK
626  1   1--0 1  5 0--17  2--0 5 0 2         DY=AC OLGY CLLGBLANK          \Y TO LG & BLANK
627  1   1--1 1 16 0--17 17--0 1 1 5         DAC=MA-1 CDOTEN               \THIS STATE NOT USED
630  1   2--1 1 14 0--17  1--0 5 1 0         J+2 IMEM DSCR=B CCE           \      BY TEST PROG
631  1 154--1 1 14 0--17  2--0 5 0 5         JFROMSC DMA=AC IRTN CCE       \NEXT: CONTROL WORD
632  1   1--1 1  0 3--13 17--0 7 1 0         QB11
633  1   1--1 1  0 3--17 17--0 4 0 0         DAC=SCR&B
634  1   1--1 1  0 3--12 17--0 7 1 0         QB10
635  1 147--1 1  0 3--17  2--0 7 1 0         JVLINK IRTN
                                      *
636  1   1--1 1  3 3--17 17--0 2 1 7  TOCHR1 JTOCHR2 DAC=CHR*15            \GOING TO CHAR MODE
```

```
                                        *
                                        *
637  1  45--1 1  0 3--14 17--0 4 1 1    TOCHR2 JTOCHR3 DAC=X QZERO                \GOING TO CHAR MODE
                                        *
640  1   1--0 1  0 3--17 12--0 5 0 6    CHARAC DSAVEA=AC OINCRSA                  \CHARACTER MODE
641  1   1--0 1  0 0--17  7--0 4 0 0           DAC=SCR&B OMAR CLROMEN
642  1   1--1 1  0 3--17 17--0 4 0 7           DAC=CHR&B
643  1   1--1 1  1 0-- 7 17--0 7 1 0           CCHAR QB7
644  1   1--1 1 17 3--17 17--0 0 1 5           DAC=MA+1                           \BMBLANK STROKE
645  1   2--1 1  5 2--17 17--0 7 1 0           J+2 SLLGBLANK                      \BLANK STROKE
646  1   1--1 1  5 0--17 17--0 7 1 0           CLLGBLANK                          \READ NEXT STROKE
647  1   1--1 1  0 2--17  1--0 5 1 4           INEM DDC=B SLROMEN
650  1   1--0 1 14 2--17  7--0 5 0 5           DMA=AC OMAR SCE
651  1   1--1 1  7 3--17 17--0 2 1 4           DAC=DC*255                         \X POSITION TO LG
652  1   1--0 1  0 3--14  1--0 4 0 1           DAC=X&B OLGX QZERO                 \CHAR STROKE TO LG
653  1   1--0 1  1 2--17  0--0 4 0 7           DAC=CHR&B OLGCHAR SCHAR            \GO TO END OF CHAR
654  1  14--0 1 16 0--17 14--0 7 1 0           JCHREND OCLRSA CDOTEN              \CONTINUE CHAR
655  1   1--1 1 17 3--17  3--0 1 1 5           DAC=MA-1 ITSTB                     \RESTORE MEM ADRS
656  1   1--1 1 14 0--13 17--0 5 0 5           DMA=AC CCE QB11                    \DOT OFF
657  1   1--1 1 16 0--17 17--0 4 1 4           DAC=DC CDOTEN                      \GO DO NEXT STROKE
660  1  26--1 1  0 3--17  2--0 5 0 7           JGOCHAR DCHR=AC IRTN               \LINK TO NXT STROKE
661  1   1--0 1  0 3--17  7--0 5 0 0           DSCR=AC OMAR
662  1   1--0 1  0 0--17 14--0 7 1 0           OCLRSA CLROMEN
663  1   1--1 1  0 3--17 17--0 7 1 0           J+1
664  1   1--1 1  0 3--17 17--0 7 1 0           J+1
665  1   1--1 1  0 3--17 17--0 7 1 0           J+1
666  1   1--1 1  0 3--17  2--0 4 1 6           DAC=SAVEA IRTN
667  0 151--1 1  0 2--17  1--0 5 1 7           JCHARAC H INEM DCHR=B SLROMEN      \GO DO NXT STROKE
670  1   1--1 1 14 0--17  1--0 5 1 0    CHREND INEM CCE DSCR=B                    \GET NXT CHAR CODE
671  1   1--0 1  0 0--13  7--0 4 0 0           DAC=SCR&B OMAR CLROMEN QB11
672  1   1--1 1 17 3--12 17--0 0 1 4           DAC=DC+1 QB10                      \RESTORE DC REG
673  1   3--1 1  0 3--17 17--0 5 0 4           J+3 DDC=AC
674  1   1--1 1  0 3--17 17--0 5 0 4           DDC=AC
675  1   3--1 1  0 3--17 17--0 7 1 0           J+3
676  1   2--1 1  0 3--17 17--0 7 1 0           J+2
677  1  63--1 1  0 2--17 17--0 7 1 0           JFROMCH      SLROMEN               \GO TO CORT
700  1   1--1 1  0 3--17 17--0 7 1 0           J+1
701  1   1--1 1  0 2--17  1--0 5 1 7           INEM DCHR=B SLROMEN                \GET 1ST STROKE
702  1   1--1 1  3 3--17 17--0 2 1 7           DAC=CHR*15
703  1   1--1 1  4 3--14 17--0 0 1 1           DAC=X+16 QZERO                     \X TO NXT CHR POSN
704  1   1--1 1  0 3--17  2--0 5 0 1    TOCHR3 DX=AC IRTN
705  0   2--1 1  0 3--17 17--0 4 1 6    CHLINK JSPCHAR H DAC=SAVEA                \GO TO SPEC CHAR
706  0 132--1 1  0 3--17 17--0 4 1 6    GOCHAR JCHARAC H DAC=SAVEA                \GO TO CHARACTER
                                        *
707  1   1--1 1  1 0--17 17--0 5 0 6    SPCHAR DSAVEA=AC CCHAR                    \SPEC CHAR MODE
710  1   1--1 1 17 3--17 17--0 0 1 5           DAC=MA+1
711  1   1--0 1 14 2--17  7--0 7 0 0           DB=AC SCE OMAR
712  1   1--1 1  0 3--17 17--0 4 0 7           DAC=CHR&B
713  1   1--0 1  0 3-- 7 14--0 4 0 7           DAC=CHR&B OCLRSA QB7
714  1   1--1 1 15 3-- 6 17--0 3 0 7           DAC=CHR/4032&B QB6
715  1  13--1 1  0 3-- 5 17--0 4 0 7           JCHR6A0 DAC=CHR&B QB5              \CHR(7)=0
716  1   1--1 1  0 3--17 17--1 3 1 5           DAC=MA/AC                          \CHR(7)=1
717  1   7--1 1 14 0--17  1--0 5 1 0           JFMFD INEM DSCR=B CCE
720  1   1--1 1 14 0--17 17--1 1 1 5    SKIP   DAC=MA-AC CCE                      \SKIP 32 OR 64
721  1   1--0 1 14 2--17  7--0 5 0 5           DMA=AC OMAR SCE
722  1   1--1 1 17 3--17 17--0 1 1 5           DAC=MA-1
723  1   1--1 1  0 3--17 17--0 5 0 5           DMA=AC
724  1   1--1 1  0 3--17 17--0 7 1 0           J+1
725  1  16--1 1 14 0--17  1--0 5 1 0           JCHR5A1 INEM CCE DSCR=B            \READ NEXT WORD
726  1   1--0 1  0 3--17  7--0 2 0 0    FMFD   DAC=SCR*0&B OMAR                   \CLEAR X AND Y POSN
727  1  21--0 1  0 0--13  2--0 5 0 2           JSCHARX DY=AC OLGY CLROMEN QB11
730  1  12--1 1 14 0-- 4  1--0 5 1 0    CHR6A0 JCHR5A0 INEM DSCR=B CCE QB4        \CHR(6)=0
731  1   1--1 1 14 0-- 4  1--0 5 1 0           INEM DSCR=B CCE QB4                \CHR(6)=1
732  1   5--0 1  0 0--17  7--0 4 0 0           JNBLINK DAC=SCR&B OMAR CLROMEN     \CHR(5)=0
733  1   1--0 1  0 0--17  7--0 4 0 0           DAC=SCR&B OMAR CLROMEN             \CHR(5)=1
734  1   2--1 1  7 3--13 17--0 0 1 2    VTAB   JSCHARY DAC=Y+32 QB11              \VERTICAL TAB
735  1   1--1 1  7 3--13 17--0 1 1 2    LNFD   DAC=Y-32 QB11                      \LINE FEED
736  1  13--0 1  0 3--17  2--0 5 0 2    SCHARY JSCHARD DY=AC OLGY                 \Y POSN TO LG
737  1   2--1 1  2 0--13 17--0 7 1 0    NBLINK JSCHARN CBLINK QB11                \BLINK OFF
740  1   1--1 1  2 2--13 17--0 7 1 0           JSCHARN SBLINK QB11                \BLINK ON
741  1  10--1 1  0 3--17 17--0 7 1 0    SCHARN JSCHARD
742  1   4--0 1  0 0--17  7--0 4 0 0    CHR5A0 JSPACE DAC=SCR&B OMAR CLROMEN      \CHR(5)=0
743  1   1--0 1  0 0--17  7--0 4 0 0    CHR5A1 DAC=SCR&B OMAR CLROMEN             \CHR(5)=1
744  1 175--1 1  0 3--13 17--0 7 1 0    NULL   JSCHARN QB11                       \NULL CHARACTER
745  1   3--1 1  0 3--13 17--0 2 1 0    CR     JSCHARX DAC=SCR*0 QB11             \CARRIAGE RETURN
746  1   2--1 1  4 3--13 17--0 0 1 1    SPACE  JSCHARX DAC=X+16 QB11              \SPACE
747  1   1--1 1  4 3--13 17--0 1 1 1    BS     JSCHARX DAC=X-16 QB11              \BACKSPACE
750  1   1--0 1  0 3--17  1--0 5 0 1    SCHARX DX=AC OLGX                         \X POSN TO LG
751  1   3--1 1 16 0--17 17--0 4 0 0    SCHARD J+3 DAC=SCR&B CDOTEN               \DOT OFF
752  1   1--1 1 16 0--17 17--0 7 1 0           CDOTEN                             \DOT OFF
753  1   2--1 1 17 3--17 17--0 0 1 5           J+2 DAC=MA+1
754  1   1--1 1 17 3--12 17--0 0 1 5           DAC=MA+1 QB10
755  1   1--1 1  0 2--17  1--0 5 1 7           INEM DCHR=B SLROMEN                \GET NXT 1ST STRK
756  1   2--1 1  3 3--17 17--0 2 1 7           J+2 DAC=CHR*15
757  1   3--1 1  5 0--17 17--0 5 0 5           JFROMCH DMA=AC CLLGBLANK           \GO TO CORT
760  1   1--1 1 17 3--14 17--0 0 1 5           DAC=MA+1 QZERO
761  1 124--1 1  5 0--17  2--0 5 0 5           JCHLINK IRTN DMA=AC CLLGBLANK      \END OF SP CHAR
762  1  54--1 1  0 3--17  2--0 4 1 6    FROMCH JGOCORT  DAC=SAVEA  IRTN           \GO TO CORT
                                               END

 NO ERRORS ???
```

| | | | | | | | |
|---|---|---|---|---|---|---|---|
| 0 | 0 | 1 | 17 | 100 | 3 | 1023 | 10 |
| 1024 | 11 | 1032 | 1 | 1365 | 6 | 15 | 3 |
| 16 | 4 | 2 | 1 | 2047 | 12 | 2048 | 13 |
| 2148 | 4 | 255 | 7 | 2730 | 5 | 3072 | 14 |
| 32 | 7 | 4 | 2 | 4032 | 15 | 4095 | 16 |
| 500 | 15 | 8 | 2 | 97 | 6 | A0 | 0 |
| A1 | 1 | A2 | 2 | A3 | 3 | A4 | 4 |
| A5 | 5 | A6 | 6 | A7 | 7 | AA | 3 |
| AB | 2 | AC | 0 | AD | 5 | ADC | 0 |
| AE | 7 | AF | 17 | AG | 37 | AH | 100 |
| AI | 177 | AJ | 276 | AK | 176 | AL | 77 |
| AM | 36 | AN | 16 | AO | 10 | AP | 12 |
| AQ | 11 | AR | 35 | AS | 13 | AT | 34 |
| AU | 27 | AV | 22 | AW | 14 | AX | 33 |
| AY | 15 | AZ | 20 | B0 | 0 | B1 | 1 |

| | | | | | | | |
|---|---|---|---|---|---|---|---|
| B10 | 12 | B11 | 13 | B2 | 2 | B3 | 3 |
| B4 | 4 | B5 | 5 | B6 | 6 | B7 | 7 |
| B8 | 10 | B9 | 11 | BA | 6 | BB | 32 |
| BC | 40 | BD | 41 | BE | 42 | BF | 43 |
| BG | 44 | BH | 4 | BI | 45 | BJ | 46 |
| BK | 47 | BL | 50 | BLINK | 2 | BM | 51 |
| BN | 52 | BO | 53 | BP | 54 | BPCAD | 6 |
| BPCD | 7 | BPCO | 6 | BQ | 55 | BR | 56 |
| BRIGHT | 4 | BS | 747 | BS1 | 57 | BT | 60 |
| BU | 61 | BV | 62 | BW | 63 | BX | 64 |
| BY | 65 | BZ | 66 | CA | 73 | CB | 74 |
| CC | 141 | CD | 142 | CE | 14 | CF | 144 |
| CG | 145 | CH | 146 | CHAR | 1 | CHARAC | 640 |
| CHLINK | 705 | CHR | 7 | CHR5A0 | 742 | CHR5A1 | 743 |
| CHR6A0 | 730 | CHREND | 670 | CI | 147 | CJ | 150 |
| CK | 151 | CL | 152 | CLLINK | 561 | CLNEXT | 556 |
| CLR6A | 14 | CM | 153 | CN | 154 | CO | 155 |
| CORT | 524 | CP | 156 | CQ | 160 | CR | 745 |
| CRI | 157 | CRSEN | 17 | CS | 161 | DO | 115 |
| DA | 71 | DB | 101 | DC | 4 | DC1 | 102 |
| DCMODE | 564 | DD | 103 | DE | 104 | DELTAY | 7 |
| DF | 105 | DG | 106 | DH | 107 | DI | 110 |
| DIM | 6 | DJ | 111 | DK | 112 | DL | 113 |
| DM | 114 | DN | 116 | DOTEN | 16 | DP | 117 |
| DQ | 120 | DR | 123 | DRTIMER | 15 | DS | 127 |
| DT | 130 | DU | 131 | DV | 132 | DW | 133 |
| DX | 134 | DY | 135 | DZ | 136 | FA | 1 |
| FLGA | 10 | FLGB | 11 | FLGC | 12 | FLGTA | 3 |
| FLGTB | 4 | FLGTC | 6 | FMFD | 726 | FROMCH | 762 |
| FROMSC | 605 | FS | 3 | FSTPT | 7 | FSTSCN | 451 |
| GOCHAR | 706 | GOCORT | 436 | GRAPH | 461 | GRLINK | 560 |
| HOLD | 17 | HSRS | 13 | IFS | 457 | INCRSA | 12 |
| LB1 | 315 | LB10 | 330 | LB11 | 335 | LB12 | 345 |
| LB13 | 367 | LB14 | 372 | LB15 | 375 | LB2 | 162 |
| LB3 | 163 | LB4 | 170 | LB5 | 214 | LB6 | 216 |
| LB7 | 222 | LB8 | 316 | LB9 | 326 | LGCHAR | 0 |
| LGEXP | 5 | LGX | 1 | LGY | 2 | LLGBLANK | 5 |
| LN0 | 355 | LN1 | 356 | LNFD | 735 | LNK0 | 237 |
| LNK1 | 240 | LNK2 | 251 | LNK3 | 243 | LNK4 | 263 |
| LNK5 | 262 | LNK6 | 255 | LNK7 | 256 | LROMEN | 0 |
| MA | 5 | MA1 | 400 | MAR | 7 | MB | 402 |
| MC | 433 | MD | 403 | MDR | 3 | ME | 401 |
| MEM | 1 | MF | 404 | NA | 434 | NB | 407 |
| NBLINK | 737 | NEWTH | 545 | NU | 432 | NULL | 744 |
| NV | 406 | NW | 405 | OLDDY | 505 | POS | 16 |
| PRTN1 | 303 | PRTN2 | 304 | PRTN3 | 305 | PRTN4 | 306 |
| R0 | 0 | R1 | 1 | R2 | 2 | R3 | 3 |
| R4 | 4 | R5 | 5 | R6 | 6 | R7 | 7 |
| RA | 7 | RAMP | 4 | RCLINK | 522 | REFCTL | 437 |
| RST0 | 11 | RT0 | 376 | RT1 | 377 | RT3 | 374 |
| RTN | 2 | RTN0 | 274 | RTN1 | 275 | RTN2 | 307 |
| RTN3 | 310 | RTN4 | 311 | RTN5 | 312 | RTN6 | 313 |
| RTN7 | 314 | SAVEA | 6 | SCHARD | 751 | SCHARN | 741 |
| SCHARX | 750 | SCHARY | 736 | SCR | 0 | SELA | 13 |
| SELB | 15 | SKIP | 720 | SPACE | 746 | SPCHAR | 707 |
| SKSEN | 16 | STT | 10 | SUB1 | 264 | SUB2 | 357 |
| TA | 435 | TEST | 15 | THRESH | 3 | TOCHR1 | 636 |
| TOCHR2 | 637 | TOCHR3 | 704 | TOGRPH | 521 | TSTA | 4 |
| TSTB | 3 | VECTOR | 606 | VLINK | 604 | VTAB | 734 |
| X | 1 | XA | 126 | XB | 137 | XD | 75 |
| XI | 140 | XJ | 72 | Y | 2 | YA | 67 |
| YB | 70 | YC | 76 | Z1 | 200 | Z2 | 247 |
| Z3 | 277 | Z4 | 254 | ZA | 23 | ZB | 26 |
| ZC | 21 | ZD | 24 | ZE | 25 | ZERO | 14 |
| ZF | 31 | ZG | 30 | | | | |

KSPMAX=0 NSPMAX=47 HSPMAX=44 SSPMAX=1559 ASPMAX=0 BSPMAX=0
DSPMAX=318

ROM 1

| | | | | | | | | | | | | | | | |
|---|---|---|---|---|---|---|---|---|---|---|---|---|---|---|---|
| 5 | 313 | 176 | 177 | 41 | 2 | 24 | 10 | 2 | 24 | 177 | 21 | 17 | 3 | 172 | 20 |
| 3 | 3 | 172 | 3 | 1 | 4 | 173 | 173 | 152 | 377 | 6 | 162 | 173 | 156 | 160 | 41 |
| 1 | 1 | 1 | 1 | 27 | 1 | 1 | 1 | 1 | 1 | 1 | 200 | 0 | 1 | 1 | 1 |
| 1 | 1 | 1 | 13 | 1 | 1 | 1 | 1 | 113 | 10 | 114 | 111 | 45 | 107 | 166 | 137 |
| 77 | 2 | 1 | 1 | 1 | 1 | 1 | 1 | 1 | 1 | 1 | 1 | 1 | 172 | 1 | 1 |
| 1 | 2 | 153 | 1 | 1 | 2 | 11 | 1 | 1 | 1 | 1 | 1 | 1 | 1 | 170 | 1 |
| 132 | 1 | 2 | 1 | 2 | 1 | 2 | 1 | 2 | 1 | 2 | 1 | 2 | 3 | 200 | 114 |
| 200 | 112 | 206 | 1 | 1 | 1 | 201 | 373 | 201 | 201 | 201 | 201 | 201 | 203 | 101 | 77 |
| 201 | 201 | 201 | 201 | 201 | 201 | 201 | 201 | 201 | 201 | 201 | 1 | 2 | 205 | 1 | 1 |
| 201 | 173 | 201 | 201 | 201 | 201 | 201 | 201 | 1 | 1 | 1 | 1 | 1 | 1 | 226 | 225 |
| 201 | 201 | 222 | 201 | 201 | 201 | 216 | 201 | 214 | 201 | 201 | 211 | 307 | 207 | 201 | 201 |
| 36 | 203 | 202 | 364 | 1 | 1 | 1 | 201 | 201 | 1 | 1 | 4 | 343 | 343 | 100 | 1 |
| 1 | 202 | 203 | 371 | 203 | 204 | 205 | 342 | 133 | 352 | 350 | 342 | 342 | 337 | 1 | 1 |
| 201 | 201 | 201 | 201 | 201 | 201 | 2 | 6 | 1 | 1 | 1 | 1 | 372 | 1 | 1 | 1 |
| 201 | 1 | 1 | 1 | 1 | 1 | 201 | 201 | 201 | 201 | 201 | 1 | 3 | 2 | 1 | 1 |
| 1 | 201 | 1 | 1 | 1 | 1 | 1 | 201 | 2 | 176 | 201 | 202 | 151 | 1 | 157 | 157 |
| 2 | 3 | 31 | 176 | 30 | 27 | 177 | 1 | 1 | 1 | 1 | 1 | 1 | 1 | 1 | 1 |
| 1 | 1 | 1 | 1 | 1 | 1 | 1 | 1 | 1 | 1 | 154 | 147 | 153 | 201 | 66 | 201 |
| 201 | 201 | 201 | 203 | 202 | 212 | 201 | 55 | 167 | 201 | 201 | 202 | 202 | 377 | 46 | 172 |
| 157 | 201 | 202 | 201 | 201 | 201 | 201 | 202 | 201 | 201 | 201 | 202 | 201 | 201 | 202 | 202 |
| 205 | 202 | 201 | 204 | 203 | 203 | 201 | 203 | 201 | 203 | 202 | 201 | 201 | 201 | 201 | 201 |
| 201 | 237 | 115 | 114 | 201 | 201 | 201 | 201 | 202 | 214 | 202 | 377 | 201 | 201 | 202 | 201 |
| 201 | 201 | 202 | 201 | 220 | 202 | 201 | 201 | 201 | 202 | 201 | 201 | 201 | 207 | 203 | 203 |
| 101 | 143 | 142 | 23 | 202 | 201 | 201 | 202 | 201 | 202 | 330 | 202 | 362 | 204 | 201 | 7 |
| 6 | 202 | 234 | 316 | 2 | 117 | 201 | 201 | 201 | 201 | 201 | 201 | 203 | 201 | 201 | 201 |
| 201 | 203 | 201 | 202 | 201 | 202 | 201 | 201 | 202 | 354 | 201 | 201 | 201 | 347 | 201 | 245 |
| 201 | 201 | 201 | 201 | 201 | 202 | 201 | 201 | 201 | 201 | 201 | 201 | 214 | 201 | 201 | 201 |
| 226 | 201 | 201 | 201 | 201 | 201 | 201 | 151 | 201 | 201 | 201 | 203 | 201 | 203 | 202 | 263 |
| 201 | 201 | 201 | 201 | 201 | 2 | 132 | 201 | 201 | 201 | 201 | 201 | 201 | 213 | 201 | 207 |
| 201 | 201 | 201 | 201 | 201 | 216 | 201 | 221 | 212 | 201 | 205 | 201 | 202 | 201 | 213 | 202 |
| 201 | 210 | 204 | 201 | 375 | 203 | 202 | 201 | 201 | 203 | 201 | 202 | 201 | 201 | 202 | 203 |
| 201 | 324 | 254 | 377 | 377 | 377 | 377 | 377 | 377 | 377 | 377 | 377 | 377 | 377 | 377 | 377 |

ROM 2

| | | | | | | | | | | | | | | | |
|---|---|---|---|---|---|---|---|---|---|---|---|---|---|---|---|
| 303 | 103 | 342 | 377 | 307 | 342 | 110 | 377 | 327 | 327 | 310 | 303 | 333 | 303 | 326 | 360 |
| 312 | 353 | 370 | 303 | 302 | 353 | 320 | 307 | 327 | 340 | 316 | 324 | 303 | 372 | 343 | 327 |
| 302 | 377 | 324 | 303 | 322 | 102 | 113 | 162 | 43 | 34 | 260 | 303 | 157 | 306 | 147 | 304 |
| 330 | 312 | 377 | 314 | 353 | 320 | 377 | 303 | 342 | 162 | 374 | 340 | 314 | 342 | 303 | 322 |
| 303 | 350 | 344 | 332 | 313 | 360 | 103 | 100 | 103 | 354 | 366 | 303 | 303 | 103 | 302 | 103 |
| 303 | 303 | 103 | 130 | 336 | 176 | 103 | 152 | 346 | 303 | 103 | 303 | 303 | 303 | 340 | 303 |
| 103 | 377 | 364 | 366 | 354 | 356 | 103 | 103 | 353 | 340 | 342 | 353 | 376 | 376 | 312 | 303 |
| 320 | 374 | 347 | 303 | 62 | 277 | 203 | 260 | 340 | 377 | 344 | 350 | 307 | 354 | 303 | 333 |
| 313 | 364 | 377 | 374 | 303 | 337 | 103 | 337 | 310 | 377 | 303 | 103 | 62 | 303 | 203 | 277 |
| 260 | 3 | 303 | 303 | 307 | 303 | 337 | 303 | 103 | 62 | 203 | 277 | 242 | 257 | 260 | 342 |
| 346 | 303 | 303 | 352 | 340 | 323 | 350 | 357 | 303 | 303 | 344 | 303 | 102 | 303 | 344 | 357 |
| 103 | 303 | 340 | 346 | 103 | 62 | 277 | 203 | 260 | 3 | 62 | 277 | 323 | 357 | 314 | 203 |
| 260 | 303 | 303 | 303 | 303 | 303 | 303 | 357 | 313 | 317 | 303 | 342 | 317 | 160 | 62 | 277 |
| 203 | 237 | 260 | 337 | 303 | 303 | 103 | 353 | 62 | 277 | 203 | 277 | 260 | 103 | 62 | 277 |
| 254 | 160 | 62 | 203 | 203 | 267 | 260 | 337 | 366 | 337 | 340 | 103 | 44 | 42 | 46 | 262 |
| 252 | 277 | 260 | 103 | 362 | 303 | 303 | 376 | 360 | 360 | 374 | 303 | 154 | 303 | 164 | 156 |
| 303 | 303 | 303 | 340 | 303 | 326 | 357 | 367 | 162 | 353 | 372 | 343 | 360 | 303 | 170 | 137 |
| 162 | 133 | 324 | 337 | 360 | 323 | 362 | 317 | 304 | 377 | 360 | 333 | 372 | 303 | 303 | 360 |
| 303 | 324 | 302 | 370 | 370 | 310 | 314 | 110 | 310 | 303 | 303 | 333 | 303 | 303 | 114 | 316 |
| 303 | 304 | 353 | 303 | 303 | 377 | 103 | 303 | 303 | 303 | 357 | 103 | 103 | 362 | 343 | 343 |
| 326 | 324 | 324 | 303 | 303 | 303 | 303 | 377 | 377 | 172 | 170 | 172 | 303 | 360 | 334 | 303 |
| 303 | 303 | 303 | 303 | 304 | 324 | 314 | 303 | 343 | 303 | 320 | 303 | 377 | 162 | 330 | 332 |
| 370 | 103 | 336 | 136 | 360 | 303 | 303 | 377 | 162 | 353 | 303 | 370 | 303 | 360 | 303 | 303 |
| 303 | 303 | 303 | 303 | 103 | 122 | 100 | 303 | 303 | 303 | 302 | 303 | 302 | 303 | 302 | 303 |
| 303 | 377 | 302 | 302 | 303 | 303 | 304 | 377 | 162 | 303 | 377 | 103 | 303 | 303 | 303 | 103 |
| 360 | 362 | 362 | 303 | 303 | 126 | 124 | 370 | 360 | 360 | 303 | 303 | 303 | 303 | 317 | 303 |
| 103 | 100 | 303 | 304 | 377 | 326 | 324 | 302 | 162 | 337 | 103 | 106 | 170 | 377 | 360 | 370 |
| 303 | 103 | 100 | 303 | 303 | 303 | 303 | 302 | 360 | 100 | 377 | 303 | 303 | 303 | 303 | 302 |
| 303 | 302 | 317 | 323 | 303 | 303 | 303 | 304 | 377 | 162 | 303 | 103 | 367 | 303 | 303 | 360 |
| 360 | 162 | 377 | 303 | 303 | 360 | 103 | 100 | 360 | 360 | 100 | 100 | 337 | 337 | 103 | 310 |
| 312 | 303 | 100 | 100 | 303 | 303 | 323 | 323 | 103 | 370 | 370 | 377 | 377 | 302 | 317 | 324 |
| 377 | 324 | 303 | 377 | 377 | 377 | 377 | 377 | 377 | 377 | 377 | 377 | 377 | 377 | 377 | 377 |

ROM 3

| | | | | | | | | | | | | | | | |
|---|---|---|---|---|---|---|---|---|---|---|---|---|---|---|---|
| 377 | 366 | 317 | 337 | 377 | 317 | 365 | 217 | 277 | 257 | 137 | 37 | 77 | 337 | 377 | 357 |
| 137 | 57 | 277 | 237 | 17 | 17 | 157 | 117 | 37 | 57 | 377 | 157 | 77 | 117 | 237 | 177 |
| 377 | 377 | 377 | 337 | 377 | 363 | 364 | 367 | 363 | 366 | 377 | 277 | 365 | 377 | 360 | 377 |
| 277 | 377 | 377 | 377 | 377 | 377 | 337 | 357 | 377 | 367 | 363 | 377 | 77 | 367 | 377 | 217 |
| 257 | 377 | 377 | 377 | 377 | 361 | 374 | 367 | 377 | 377 | 377 | 277 | 361 | 372 | 366 | 306 |
| 377 | 363 | 366 | 375 | 364 | 370 | 372 | 364 | 377 | 360 | 373 | 367 | 377 | 317 | 377 | 364 |
| 371 | 57 | 37 | 37 | 117 | 117 | 316 | 317 | 337 | 337 | 377 | 377 | 377 | 377 | 277 | 377 |
| 277 | 377 | 377 | 377 | 367 | 377 | 317 | 377 | 377 | 377 | 377 | 377 | 377 | 377 | 177 | 137 |
| 377 | 377 | 377 | 377 | 377 | 377 | 376 | 377 | 377 | 377 | 377 | 363 | 367 | 377 | 377 | 377 |
| 257 | 363 | 377 | 377 | 377 | 377 | 377 | 377 | 363 | 367 | 377 | 377 | 377 | 377 | 377 | 377 |
| 377 | 377 | 377 | 377 | 357 | 377 | 377 | 377 | 377 | 377 | 377 | 377 | 363 | 377 | 357 | 377 |
| 363 | 377 | 377 | 377 | 363 | 367 | 377 | 377 | 377 | 363 | 367 | 364 | 377 | 377 | 357 | 144 |
| 104 | 77 | 77 | 377 | 377 | 377 | 377 | 377 | 377 | 377 | 377 | 377 | 377 | 373 | 367 | 377 |
| 377 | 377 | 377 | 377 | 377 | 377 | 363 | 377 | 367 | 377 | 377 | 177 | 377 | 363 | 367 | 377 |
| 377 | 363 | 367 | 377 | 377 | 377 | 377 | 377 | 377 | 377 | 377 | 363 | 367 | 367 | 367 | 377 |
| 377 | 377 | 377 | 367 | 377 | 364 | 157 | 364 | 100 | 57 | 364 | 77 | 363 | 377 | 363 | 363 |
| 377 | 322 | 302 | 377 | 377 | 377 | 362 | 377 | 367 | 377 | 377 | 377 | 377 | 377 | 361 | 363 |
| 367 | 362 | 377 | 377 | 377 | 377 | 377 | 377 | 377 | 377 | 377 | 337 | 377 | 377 | 377 | 377 |
| 363 | 57 | 363 | 17 | 17 | 362 | 362 | 375 | 377 | 377 | 363 | 57 | 362 | 317 | 375 | 377 |
| 377 | 377 | 377 | 377 | 377 | 357 | 367 | 377 | 377 | 257 | 363 | 102 | 102 | 277 | 257 | 377 |
| 377 | 377 | 377 | 377 | 377 | 357 | 357 | 377 | 377 | 361 | 361 | 361 | 377 | 361 | 277 | 377 |
| 257 | 362 | 377 | 377 | 377 | 377 | 237 | 137 | 377 | 377 | 377 | 377 | 77 | 367 | 377 | 377 |
| 117 | 365 | 177 | 161 | 361 | 377 | 377 | 257 | 367 | 377 | 377 | 377 | 377 | 361 | 362 | 362 |
| 257 | 377 | 377 | 77 | 274 | 274 | 47 | 257 | 377 | 37 | 362 | 17 | 17 | 377 | 362 | 377 |
| 77 | 377 | 361 | 377 | 377 | 377 | 377 | 377 | 367 | 377 | 277 | 367 | 377 | 377 | 377 | 261 |
| 361 | 277 | 277 | 377 | 377 | 242 | 362 | 377 | 361 | 362 | 277 | 377 | 257 | 362 | 377 | 317 |
| 372 | 367 | 377 | 177 | 377 | 377 | 377 | 361 | 367 | 377 | 301 | 360 | 374 | 363 | 277 | 377 |
| 362 | 367 | 374 | 377 | 377 | 377 | 362 | 361 | 361 | 267 | 257 | 377 | 377 | 377 | 377 | 377 |
| 377 | 361 | 377 | 317 | 362 | 377 | 377 | 377 | 377 | 367 | 377 | 174 | 157 | 137 | 377 | 361 |
| 377 | 367 | 377 | 377 | 377 | 361 | 367 | 262 | 101 | 101 | 367 | 367 | 277 | 277 | 362 | 277 |
| 277 | 377 | 367 | 367 | 277 | 277 | 277 | 277 | 361 | 377 | 377 | 377 | 257 | 361 | 377 | 377 |
| 317 | 362 | 362 | 377 | 377 | 377 | 377 | 377 | 377 | 377 | 377 | 377 | 377 | 377 | 377 | 377 |

ROM 4

| | | | | | | | | | | | | | | | |
|---|---|---|---|---|---|---|---|---|---|---|---|---|---|---|---|
| 44 | 51 | 124 | 60 | 0 | 120 | 122 | 20 | 62 | 45 | 125 | 100 | 63 | 140 | 122 | 124 |
| 120 | 20 | 122 | 100 | 124 | 44 | 160 | 5 | 42 | 160 | 142 | 121 | 127 | 123 | 46 | 24 |
| 122 | 22 | 160 | 44 | 120 | 122 | 20 | 121 | 22 | 126 | 100 | 160 | 6 | 125 | 23 | 124 |
| 145 | 160 | 1 | 123 | 73 | 160 | 0 | 120 | 104 | 103 | 110 | 160 | 263 | 110 | 142 | 120 |
| 121 | 203 | 223 | 160 | 42 | 252 | 124 | 105 | 104 | 204 | 124 | 142 | 110 | 106 | 110 | 106 |
| 102 | 152 | 106 | 102 | 112 | 102 | 102 | 124 | 102 | 112 | 102 | 112 | 104 | 204 | 124 | 110 |
| 102 | 3 | 123 | 123 | 103 | 103 | 102 | 102 | 43 | 102 | 160 | 45 | 160 | 160 | 160 | 143 |
| 160 | 103 | 11 | 120 | 100 | 20 | 170 | 170 | 126 | 10 | 216 | 122 | 11 | 124 | 141 | 0 |
| 14 | 124 | 10 | 212 | 123 | 16 | 125 | 15 | 126 | 16 | 126 | 104 | 101 | 50 | 170 | 1 |
| 121 | 101 | 121 | 124 | 14 | 120 | 30 | 120 | 102 | 100 | 122 | 10 | 120 | 14 | 125 | 125 |
| 125 | 112 | 124 | 235 | 170 | 15 | 125 | 15 | 125 | 125 | 111 | 124 | 101 | 125 | 124 | 11 |
| 106 | 125 | 125 | 124 | 104 | 100 | 10 | 120 | 170 | 105 | 100 | 10 | 15 | 35 | 126 | 170 |
| 170 | 120 | 120 | 170 | 170 | 170 | 170 | 35 | 32 | 34 | 112 | 111 | 34 | 121 | 100 | 10 |
| 120 | 11 | 124 | 14 | 126 | 125 | 105 | 11 | 100 | 15 | 125 | 10 | 120 | 160 | 100 | 10 |
| 120 | 103 | 100 | 111 | 120 | 11 | 125 | 35 | 124 | 15 | 126 | 100 | 106 | 104 | 105 | 170 |
| 170 | 17 | 127 | 107 | 170 | 170 | 170 | 170 | 130 | 170 | 170 | 170 | 100 | 170 | 100 | 100 |
| 40 | 121 | 120 | 120 | 127 | 160 | 60 | 0 | 121 | 21 | 122 | 2 | 123 | 23 | 125 | 5 |
| 124 | 4 | 126 | 6 | 127 | 67 | 160 | 26 | 125 | 25 | 124 | 60 | 120 | 170 | 170 | 126 |
| 50 | 120 | 150 | 125 | 125 | 170 | 170 | 116 | 116 | 126 | 137 | 57 | 170 | 57 | 116 | 116 |
| 116 | 126 | 50 | 110 | 233 | 15 | 125 | 100 | 103 | 120 | 50 | 100 | 120 | 107 | 52 | 52 |
| 230 | 230 | 230 | 127 | 127 | 127 | 127 | 11 | 11 | 121 | 121 | 121 | 110 | 130 | 122 | 100 |
| 170 | 100 | 116 | 116 | 126 | 100 | 200 | 210 | 75 | 210 | 100 | 125 | 15 | 125 | 100 | 100 |
| 124 | 44 | 170 | 121 | 130 | 123 | 123 | 15 | 125 | 53 | 113 | 123 | 170 | 130 | 170 | 104 |
| 116 | 116 | 116 | 116 | 104 | 104 | 100 | 104 | 104 | 44 | 170 | 170 | 170 | 127 | 104 | 116 |
| 116 | 31 | 137 | 121 | 116 | 116 | 126 | 15 | 125 | 100 | 15 | 125 | 100 | 111 | 200 | 121 |
| 130 | 170 | 112 | 200 | 100 | 122 | 122 | 35 | 130 | 125 | 170 | 100 | 170 | 170 | 57 | 111 |
| 126 | 100 | 107 | 170 | 15 | 170 | 170 | 134 | 125 | 54 | 101 | 107 | 170 | 35 | 125 | 114 |
| 127 | 120 | 170 | 170 | 170 | 170 | 116 | 137 | 130 | 100 | 14 | 124 | 124 | 170 | 170 | 170 |
| 170 | 137 | 57 | 11 | 121 | 116 | 116 | 126 | 15 | 160 | 107 | 107 | 67 | 107 | 275 | 130 |
| 235 | 125 | 35 | 125 | 170 | 130 | 40 | 122 | 130 | 130 | 100 | 100 | 12 | 32 | 122 | 170 |
| 170 | 170 | 100 | 100 | 170 | 50 | 11 | 31 | 121 | 100 | 170 | 15 | 15 | 137 | 57 | 125 |
| 15 | 125 | 116 | 377 | 377 | 377 | 377 | 377 | 377 | 377 | 377 | 377 | 377 | 377 | 377 | 377 |

APPENDIX C-3

MICRO-INSTRUCTION SET DESCRIPTION

| | |
|---|---|
| FORMAT: | Optional label followed by a free field combination of any instructions.<br>Comments begin at the back slash character " ".<br>Comment lines begin with *.<br>All instruction fields are delimited by spaces. |
| LABELS: | A label may be any character string starting in Column 1. The first character must be alphabetic and must not begin with the combination "END". |
| OPERAND NAMES: | A name may be any alpha numeric string. Examples are MAR, B7, 255.<br>All names must appear in a DECLARE statement. |
| DECLARATIONS: | Declarations equate operand names to machine hardware locations. The format is:<br>DECLARE NAME1 = m, NAME2 = n,...<br>m,n...are integers<br>Example: DECLARE MAR = 7, 255 = 13 |
| PROGRAM LOCATION: | The program is located in program memory by use of an ADRS statement.<br>The format is:<br>ADRS n<br>n is an integer such as $0 \leqq n \leqq 511$<br>The program lines following the ADRS statement will be located starting at program memory address n. |
| ASSEMBLER CONTROL: | The beginning of a program file must begin with a MICRA statement.<br>The format is:<br>MICRA comment<br>The end of a program file must end with an END statement.<br>The format is:<br>END comment |
| INSTRUCTIONS: | Instructions may occur in any free field combination.<br>All instruction types are listed below by mnemonic. |

| | |
|---|---|
| J | "Jump instruction" format is:<br>J label or J + n or J − m<br>where $0 < n < 63$ $1 < m < 64$<br>After execution of the present program line, execution will continue at line specified by label or at present address + n− m.<br>If no "J" instruction appears within a line, the default will be J + 1.<br>Special Cases: Let p = present address,<br>If $p < 256$ then $p \pm i$ implies $\{(p \pm i) \bmod 256\}$<br>If $p < 256$ then $p \pm i$ implies $\{(p \pm i) \bmod 256\} + 256$ |
| S or C | "Set or clear instruction" format is:<br>S name or C name<br>Flipflop called "name" will be set or cleared. |
| I or O | "Input or output instruction" format is:<br>I name or O name<br>(1) A control signal will be generated causing "name"to be input or to output from the digital storage bus.<br>or (2) A control signal will be generated causing implementation of the function designated by "name". An example is OINCRSA which implements an increment stroke address. |
| Q | "Qualifier select instruction" format is:<br>Q name<br>After execution of both the present and next program line, execution will continue normally if "name" is a O. If "name" is a 1, execution will continue at the specified line + 1. |
| W | "Write instruction" format is:<br>W<br>Digital storage memory will be set to the write state. The default is the read state. |
| H | "Hold-off instruction" format is:<br>H<br>An interrupt will not be allowed immediately following the next program line. The default allows interrupts. |
| D | "Data manipulator instruction" has several formats:<br>(1) DB = AC<br>the contents of the accumulator are output to the digital storage bus.<br>(2) D name = AC or D name = B<br>The contents of the accumulator or the digital storage bus are transfered to the register "name."<br>(3) DAC = name {&B} or DAC = % name {&B}<br>{&B} indicates &B is optional<br>The contents of the register "name" are transfered to the accumulator. If "name" is preceded by %, the accumulator will recieve the complement of the contents of "name". If followed by &B, "name" will be output to the digital storage bus. |

-continued

APPENDIX C-3

MICRO-INSTRUCTION SET DESCRIPTION (4) DAC = name1 op name2 {&B}
or DAC = name1 op AC {&B}
op is any operand from the set: +, −, * (logical and), / (logical or).
The operation indicated will be made on "name 1" and "name 2" or "name 1" and accumulator. The result will be transferred to the accumulator. If followed by &B, "name 1" will be output to the digital storage bus.

NOTES AND EXCEPTIONS:

(1) Only one I/O onstruction per line is allowed.
Example: J + 1 1 MEM OLGX
This is not allowed.

(2) A "constant" is a data manipulator instruction operand. It may only appear as the second operand of the instruction.
Example: DAC = MA + 1024 is allowed.
DAC = 1024 is not allowed.

(3) A constant may not appear in the same line with a set or clear instruction.
Example: DAC = MA + 1 SCE
This is not allowed.

(4) In order to clarify the effect of a qualifier select instruction, the following example is provided.

```
        JAA     QB4
         .
         .
         .
AA      JBB
         .
         .
         .
BB      JDD
CC      JEE
         .
         .
         .
DD      DAC = X
         .
         .
         .
EE      DAC = Y
         .
         .
         .
```

If qualifier B4 = 0 the sequence of the execution will be AA, BB, DD.
If qualifier B4 = 1 the sequence of the execution will be AA, CC, EE.

We claim:

1. Apparatus for use in the spectrum analysis of an input signal, said apparatus comprising:

input means, having inputs for receiving said input signal and a sampling signal, for providing an intermediate frequency signal in response to said input signal and a sampling signal;

signal processing means coupled to said input means for providing a first digital signal in response to said intermediate frequency signal;

memory means coupled to said signal processing means for storing electrical representations of said digital signal in response to a memory control signal;

memory control means coupled to said memory means for providing said memory control signal;

display means coupled to said memory means for providing a waveform display of amplitude values over a preselected range of frequency values in response to display control signals and said electrical representations of said digital signal;

operator controls for providing operator control signals and for providing an offset signal in response to operator manifestations indicating it is desired to include an offset of a preselected display parameter; and display control means coupled to said memory means, said operator controls and to said display means for providing said display control signals in response to said operator control signals and said offset signal.

2. Apparatus as in claim 1, wherein said display control means includes means for causing said display waveform to represent frequency values which are the sum of the frequency value of said input signal and a value indicated by said offset signal.

3. Apparatus as in claim 2, wherein said display control means comprises means for causing said display means to provide a visual indication of the frequency value represented by said offset signal.

4. Apparatus as in claim 3, wherein said display control means includes means for causing all indications of frequency value displayed on said display means to be offset by the frequency value indicated by said offset signal.

5. Apparatus as in claim 1, wherein said display control means includes means for causing said display waveform to represent amplitude values which are the sum of the amplitude value of said input signal and the value indicated by said offset signal.

6. Apparatus as in claim 5, wherein said display control means includes means for causing said display means to provide a visual indication of the amplitude value represented by said offset signal.

7. Apparatus as in claim 6, wherein said display control means includes means for causing all displays of amplitude values to be offset by an amount equal to the amplitude value represented by said offset signal.

* * * * *